US011744145B2

(12) United States Patent
Song et al.

(10) Patent No.: US 11,744,145 B2
(45) Date of Patent: Aug. 29, 2023

(54) ORGANIC COMPOUND AND ORGANIC ELECTROLUMINESCENT DEVICE COMPRISING THE SAME

(71) Applicants: LG Display Co., Ltd., Seoul (KR); MATERIAL SCIENCE CO., LTD., Seoul (KR)

(72) Inventors: Inbum Song, Seoul (KR); Seunghee Yoon, Seoul (KR); Heejun Park, Paju-si (KR); Seonkeun Yoo, Gunpo-si (KR); Soyoung Jang, Seoul (KR); Sunghoon Kim, Seoul (KR); Seong-Min Park, Seoul (KR); Tae Wan Lee, Seoul (KR); Sunjae Kim, Goyang-si (KR); Dong Hun Lee, Seoul (KR); Jeonghoe Heo, Seoul (KR)

(73) Assignees: LG DISPLAY CO., LTD., Seoul (KR); MATERIAL SCIENCE CO., LTD., Seoul (KR)

( * ) Notice: Subject to any disclaimer, the term of this patent is extended or adjusted under 35 U.S.C. 154(b) by 383 days.

(21) Appl. No.: 16/674,966

(22) Filed: Nov. 5, 2019

(65) Prior Publication Data

US 2020/0144506 A1 May 7, 2020

(30) Foreign Application Priority Data

Nov. 5, 2018 (KR) ........................ 10-2018-0134274
Aug. 1, 2019 (KR) ........................ 10-2019-0093710
Sep. 17, 2019 (KR) ........................ 10-2019-0114335
Oct. 15, 2019 (KR) ........................ 10-2019-0127747

(51) Int. Cl.
*H01L 51/00* (2006.01)
*H10K 85/60* (2023.01)
*H10K 50/15* (2023.01)
*H10K 50/16* (2023.01)
*H10K 50/81* (2023.01)
*H10K 50/82* (2023.01)
*H10K 50/17* (2023.01)

(52) U.S. Cl.
CPC ......... *H10K 85/624* (2023.02); *H10K 85/633* (2023.02); *H10K 85/6572* (2023.02); *H10K 85/6574* (2023.02); *H10K 50/15* (2023.02); *H10K 50/16* (2023.02); *H10K 50/171* (2023.02); *H10K 50/81* (2023.02); *H10K 50/82* (2023.02)

(58) Field of Classification Search
None
See application file for complete search history.

(56) References Cited

U.S. PATENT DOCUMENTS 9,070,893 B2 6/2015 Park et al.
10,263,192 B2 4/2019 Kawamura et al.
10,464,895 B2 11/2019 Kato et al.
2007/0215867 A1 * 9/2007 Kawakami .......... H01L 51/5218 257/40

(Continued)

FOREIGN PATENT DOCUMENTS

CN 101473464 A 7/2009
CN 102449106 A 5/2012

(Continued)

*Primary Examiner* — Robert S Loewe
(74) *Attorney, Agent, or Firm* — Seed IP Law Group LLP

(57) ABSTRACT

Disclosed is an organic electroluminescent device with lowered driving voltage, and enhanced efficiency and lifetime.

21 Claims, 1 Drawing Sheet

10

(56) References Cited

U.S. PATENT DOCUMENTS

2007/0265418 A1* 11/2007 He .................... C07D 495/04
528/226
2012/0138918 A1* 6/2012 Naraoka ............... C09B 57/001
257/E51.026
2014/0246660 A1* 9/2014 Tanaka ................ H01L 51/5016
257/40
2015/0014645 A1* 1/2015 Park .................... H01L 51/5064
257/40
2015/0228899 A1* 8/2015 Kato ................... H01L 51/0072
257/40
2015/0243891 A1* 8/2015 Kato ..................... C07C 255/58
257/40
2015/0279871 A1 10/2015 Morosawa et al.
2016/0322580 A1* 11/2016 Hwang ................. H01L 51/008
2017/0213980 A1* 7/2017 Nakano ............... H01L 51/0058
2017/0229649 A1* 8/2017 Kato ..................... C07C 211/61
2017/0288147 A1* 10/2017 Fujita .................... C07F 7/0816
2017/0373124 A1* 12/2017 Yang ................... H01L 27/3246
2018/0053899 A1* 2/2018 Wu ...................... C07D 313/06
2018/0182814 A1* 6/2018 Kim ...................... H01L 27/322
2018/0184501 A1* 6/2018 Park ....................... H05B 33/10
2020/0091435 A1* 3/2020 Masuda ................ H01L 51/006
2020/0392122 A1* 12/2020 Ito ........................ C07D 405/12

FOREIGN PATENT DOCUMENTS

CN 108137500 A 6/2018
KR 10-2015-0006694 A 1/2015
KR 10-2015-0082236 A 7/2015
KR 10-2017-0088472 A 8/2017
KR 10-2018-0104579 A 9/2018
WO WO 2010110553 A2 9/2010
WO WO 2016126035 A1 8/2016
WO WO-2018164239 A1 * 9/2018 ............. C09K 11/06
WO WO-2018174293 A1 * 9/2018 ............. C09K 11/06

* cited by examiner

ORGANIC COMPOUND AND ORGANIC ELECTROLUMINESCENT DEVICE COMPRISING THE SAME

CROSS-REFERENCE TO RELATED APPLICATIONS

This application claims the priority of Korean Patent Application No. 10-2018-0134274 filed on Nov. 5, 2018, Korean Patent Application No. 10-2019-0093710 filed on Aug. 1, 2019, Korean Patent Application No. 10-2019-0114335 filed on Sep. 17, 2019 and Korean Patent Application No. 10-2019-0127747 filed on Oct. 15, 2019 in the Korean Intellectual Property Office, the disclosures of which are hereby incorporated by reference in their entirety.

BACKGROUND

Technical Field

The present disclosure relates to a novel organic compound and an organic electroluminescent device including the same.

Description of the Related Art

Recently, as a size of a display device increases, interest in a flat panel display device having a small space occupation is increasing. As one of the flat panel display devices, an organic light emitting display device including an organic electroluminescent device (organic light emitting diode: OLED) is rapidly developing.

In the organic light emitting diode, electrons and holes are paired to form excitons when charges are injected into a light emitting layer formed between a first electrode and a second electrode. Thus, energy of the excitons may be converted to light. The organic light emitting diode may be driven at a lower voltage and consume less power than the conventional display technology. The organic light emitting diode may render excellent color. A flexible substrate may be applied to the organic light emitting diode which may have various applications.

BRIEF SUMMARY

One purpose of the present disclosure is to provide an organic electroluminescent device with lowered driving voltage, and enhanced efficiency and lifetime.

Purposes of the present disclosure are not limited to the above-mentioned purpose. Other purposes and advantages of the present disclosure which are not mentioned above may be understood from following descriptions and more clearly understood from embodiments of the present disclosure. Further, it will be readily appreciated that the purposes and advantages of the present disclosure may be realized by features and combinations thereof as disclosed in the claims.

An organic electroluminescent device according to the present disclosure may include an anode, a cathode and at least one organic layer between the anode and the cathode. The at least one organic layer includes a light emitting layer, and an organic layer disposed between the anode and the light emitting layer and containing a compound represented by the following Chemical Formula 1:

Chemical Formula 1

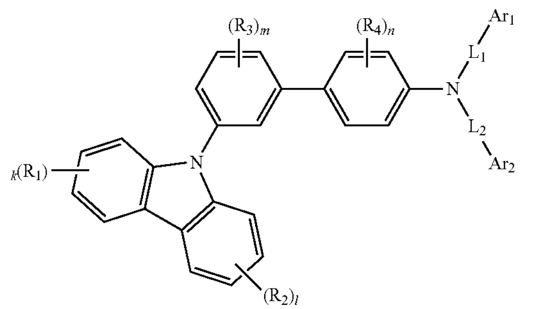

In the Chemical Formula 1, each of $L_1$ and $L_2$ independently represents one selected from the group consisting of a substituted or unsubstituted C6 to C30 arylene group, a substituted or unsubstituted C3 to C30 heteroarylene group, a substituted or unsubstituted C1 to C20 alkylene group, a substituted or unsubstituted C3 to C20 cycloalkylene group, a substituted or unsubstituted C1 to C20 alkenylene group, a substituted or unsubstituted C3 to C20 cycloalkenylene group, a substituted or unsubstituted C1 to C20 heteroalkylene group, a substituted or unsubstituted C3 to C20 heterocycloalkylene group, a substituted or unsubstituted C1 to C20 heteroalkenylene group, and a substituted or unsubstituted C3 to C20 heterocycloalkenylene group.

$Ar_1$ represents a substituted or unsubstituted C7 to C30 arylene group or heteroarylene group, and $Ar_2$ represents a substituted or unsubstituted C8 to C30 condensed polycyclic group.

$R_1$ to $R_4$ are the same as or different from each other. Each of $R_1$ to $R_4$ independently represents one selected from a group consisting of hydrogen, deuterium, a substituted or unsubstituted C1 to C20 alkyl group, a unsubstituted C3 to C30 cycloalkyl group, a substituted or unsubstituted C1 to C20 alkenyl group, a substituted or unsubstituted C1 to C20 alkynyl group, a substituted or unsubstituted C1 to C20 heteroalkyl group, a substituted or unsubstituted C3 to C20 aralkyl group, a substituted or unsubstituted C6 to C30 aryl group, a substituted or unsubstituted C3 to C30 heteroaryl group, and a substituted or unsubstituted C3 to C20 heteroaralkyl group.

Each of k, l, m, and n independently is an integer of 0 to 4.

In addition, an organic electroluminescent device according to the present disclosure includes a first electrode, a second electrode, and at least one organic layer between the first electrode and the second electrode. The at least one organic layer includes a light emitting layer. The at least one organic layer further includes a first organic layer containing a compound represented by the following Chemical Formula 2, and a second organic layer containing a compound represented by the following Chemical Formula 3. The first and second organic layers are disposed between the first electrode and the light emitting layer.

Chemical Formula 2

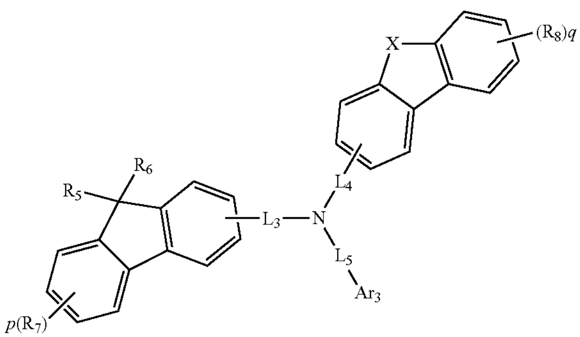

In the Chemical Formula 2, $L_3$ to $L_5$ are the same as or different from each other. Each of $L_3$ to $L_5$ independently represents one selected from the group consisting of a single bond, a substituted or unsubstituted arylene group having 6 to 30 carbon atoms, a substituted or unsubstituted heteroarylene group having 6 to 30 carbon atoms, a substituted or unsubstituted alkylene group having 1 to 10 carbon atoms, a substituted or unsubstituted cycloalkylene group having 3 to 10 carbon atoms, a substituted or unsubstituted alkenylene group having 2 to 10 carbon atoms, a substituted or unsubstituted cycloalkenylene group having 3 to 10 carbon atoms, a substituted or unsubstituted heteroalkylene group having 1 to 10 carbon atoms, a substituted or unsubstituted heterocycloalkylene group having 2 to 10 carbon atoms, a substituted or unsubstituted heteroalkenylene group having 2 to 10 carbon atoms, and a substituted or unsubstituted heterocycloalkenylene group having 2 to 10 carbon atoms.

X represents O, S or $CR_9R_{10}$.

$R_5$ to $R_{10}$ are the same as or different from each other. Each of $R_5$ to $R_{10}$ independently represents one selected from the group consisting of hydrogen, deuterium, a cyano group, a nitro group, a halogen group, a hydroxy group, a substituted or unsubstituted alkyl group having 1 to 30 carbon atoms, a substituted or unsubstituted cycloalkyl group having 3 to 30 carbon atoms, a substituted or unsubstituted alkenyl group having 2 to 30 carbon atoms, a substituted or unsubstituted cycloalkenyl group having 3 to 30 carbon atoms, a substituted or unsubstituted alkynyl group having 2 to 24 carbon atoms, a substituted or unsubstituted heteroalkyl group having 2 to 30 carbon atoms, a substituted or unsubstituted aralkyl group having 7 to 30 carbon atoms, a substituted or unsubstituted aryl group having 6 to 30 carbon atoms, a substituted or unsubstituted heteroaryl group having 2 to 30 carbon atoms, a substituted or unsubstituted heteroaralkyl group having 3 to 30 carbon atoms, a substituted or unsubstituted alkyl silyl group having 1 to 20 carbon atoms, a substituted or unsubstituted alkoxy silyl group having 1 to 20 carbon atoms, a substituted or unsubstituted cycloalkyl silyl group having 3 to 30 carbon atoms, and a substituted or unsubstituted aryl silyl group having 5 to 30 carbon atoms.

Each of $R_5$ to $R_{10}$ may be linked to a substituent adjacent thereto to form an alicyclic or aromatic, monocyclic or polycyclic, saturated or unsaturated ring. The formed alicyclic or aromatic, monocyclic or polycyclic, saturated or unsaturated ring may or may not include at least one heteroatom selected from the group consisting of N, O, S and Si in addition to a carbon atom.

$Ar_3$ represents one selected from the group consisting of a substituted or unsubstituted aryl having 3 to 30 carbon atoms, a substituted or unsubstituted heteroaryl having 5 to 30 carbon atoms, a substituted or unsubstituted aralkyl group having 7 to 30 carbon atoms, a substituted or unsubstituted heteroaralkyl group having 3 to 30 carbon atoms, and a substituted or unsubstituted aryl amino group.

Each of p and q independently denotes an integer of 0 to 4. When p is 2 to 4, each of a plurality of $R_7$ is independently defined as described above, and the plurality of $R_7$ is the same as or different from each other. When q is 2 to 4, each of a plurality of $R_8$ is independently defined as described above and the plurality of $R_8$ is the same as or different from each other.

Chemical Formula 3

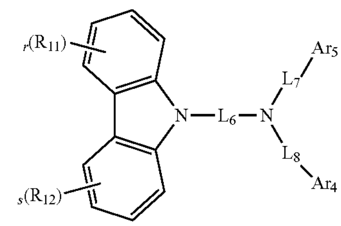

In the Chemical Formula 3, $R_{11}$ and $R_{12}$ are the same as or different from each other. Each of $R_{11}$ and $R_{12}$ independently represents one selected from the group consisting of hydrogen, deuterium, a cyano group, a nitro group, a halogen group, a hydroxy group, a substituted or unsubstituted alkyl group having 1 to 30 carbon atoms, a substituted or unsubstituted cycloalkyl group having 3 to 30 carbon atoms, a substituted or unsubstituted alkenyl group having 2 to 30 carbon atoms, a substituted or unsubstituted cycloalkenyl group having 3 to 30 carbon atoms, a substituted or unsubstituted alkynyl group having 2 to 24 carbon atoms, a substituted or unsubstituted heteroalkyl group having 2 to 30 carbon atoms, a substituted or unsubstituted aralkyl group having 7 to 30 carbon atoms, a substituted or unsubstituted aryl group having 6 to 30 carbon atoms, a substituted or unsubstituted heteroaryl group having 2 to 30 carbon atoms, a substituted or unsubstituted heteroaralkyl group having 3 to 30 carbon atoms, a substituted or unsubstituted alkyl silyl group having 1 to 20 carbon atoms, a substituted or unsubstituted alkoxy silyl group having 1 to 20 carbon atoms, a substituted or unsubstituted cycloalkyl silyl group having 3 to 30 carbon atoms, and a substituted or unsubstituted aryl silyl group having 5 to 30 carbon atoms.

Each of $R_{11}$ and $R_{12}$ may be linked to a substituent adjacent thereto to form an alicyclic or aromatic, monocyclic or polycyclic, saturated or unsaturated ring. The formed alicyclic or aromatic, monocyclic or polycyclic, saturated or unsaturated ring may or may not include at least one heteroatom selected from the group consisting of N, O, S and Si in addition to a carbon atom.

Each of r and s independently denotes an integer of 0 to 4. When r is 2 to 4, each of a plurality of $R_{11}$ is independently defined as described above, and the plurality of $R_{11}$ is the same as or different from each other. When s is 2 to 4, each of a plurality of $R_{12}$ is independently defined as described above and the plurality of $R_{12}$ is the same as or different from each other.

$L_6$ represents one selected from the group consisting of a substituted or unsubstituted arylene group having 6 to 30 carbon atoms, a substituted or unsubstituted heteroarylene group having 6 to 30 carbon atoms, a substituted or unsubstituted alkylene group having 1 to 10 carbon atoms, a substituted or unsubstituted cycloalkylene group having 3 to 10 carbon atoms, a substituted or unsubstituted alkenylene group having 2 to 10 carbon atoms, a substituted or unsubstituted cycloalkenylene group having 3 to 10 carbon atoms, a substituted or unsubstituted heteroalkylene group having 1 to 10 carbon atoms, a substituted or unsubstituted heterocycloalkylene group having 2 to 10 carbon atoms, a substituted or unsubstituted heteroalkenylene group having 2 to 10 carbon atoms, and a substituted or unsubstituted heterocycloalkenylene group having 2 to 10 carbon atoms.

$L_7$ and $L_8$ are the same as or different from each other. Each of $L_7$ and $L_8$ independently represents one selected from the group consisting of a single bond, a substituted or unsubstituted arylene group having 6 to 30 carbon atoms, a substituted or unsubstituted heteroarylene group having 6 to 30 carbon atoms, a substituted or unsubstituted alkylene group having 1 to 10 carbon atoms, a substituted or unsubstituted cycloalkylene group having 3 to 10 carbon atoms, a substituted or unsubstituted alkenylene group having 2 to 10 carbon atoms, a substituted or unsubstituted cycloalkenylene group having 3 to 10 carbon atoms, a substituted or unsubstituted heteroalkylene group having 1 to 10 carbon atoms, a substituted or unsubstituted heterocycloalkylene group having 2 to 10 carbon atoms, a substituted or unsubstituted heteroalkenylene group having 2 to 10 carbon atoms, and a substituted or unsubstituted heterocycloalkenylene group having 2 to 10 carbon atoms.

$Ar_4$ and $Ar_5$ are the same as or different from each other. Each of $Ar_4$ and $Ar_5$ independently represents one selected from the group consisting of a substituted or unsubstituted aryl having 3 to 30 carbon atoms, a substituted or unsubstituted heteroaryl having 5 to 30 carbon atoms, a substituted or unsubstituted aralkyl group having 7 to 30 carbon atoms, a substituted or unsubstituted heteroaralkyl group having 3 to 30 carbon atoms, and a substituted or unsubstituted aryl amino group.

Effects of the present disclosure are as follows but are not limited thereto.

In accordance with the present disclosure, an organic electroluminescent device with lowered driving voltage, and enhanced efficiency and lifetime may be realized.

In addition to the effects as described above, specific effects of the present disclosure are described together with specific details for carrying out the disclosure.

DETAILED DESCRIPTION

Figure 1:
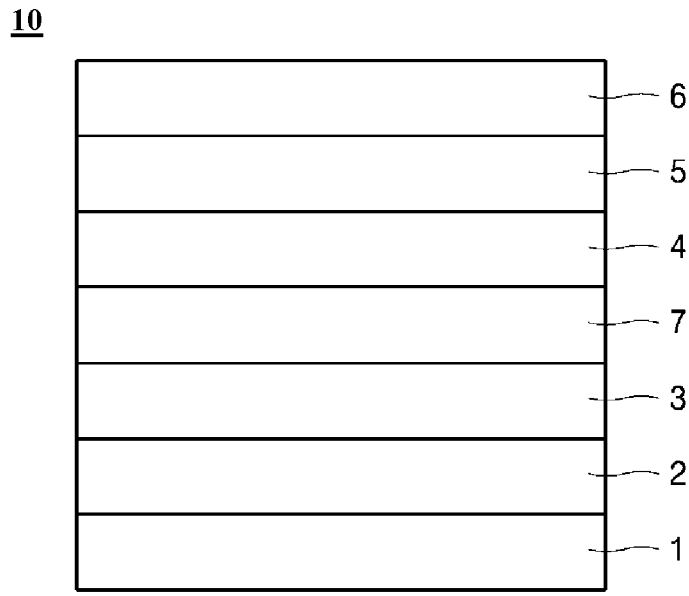
FIG. 1 is a schematic cross-sectional view of an organic electroluminescent device containing a compound represented by Chemical Formula 2 and a compound represented by Chemical Formula 3 according to one embodiment of the present disclosure.

For simplicity and clarity of illustration, elements in the figures are not necessarily drawn to scale. The same reference numbers in different figures denote the same or similar elements, and as such perform similar functionality. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "unsubstituted" means that a hydrogen atom has been substituted. In this case, the hydrogen atom includes protium, deuterium and tritium.

As used herein, a substituent in the term "substituted" may include one selected from the group consisting of, for example, deuterium, an alkyl group of 1 to 20 carbon atoms unsubstituted or substituted with halogen, an alkoxy group having 1 to 20 carbon atoms unsubstituted or substituted with halogen, halogen, a cyano group, a carboxy group, a carbonyl group, an amine group, an alkylamine group having 1 to 20 carbon atoms, a nitro group, an alkylsilyl group having 1 to 20 carbon atoms, an alkoxysilyl group having 1 to 20 carbon atoms, a cycloalkylsilyl group having 3 to 30 carbon atoms, an arylsilyl group having 5 to 30 carbon atoms, an aryl group having 5 to 30 carbon atoms, an arylamine group having 5 to 20 carbon atoms, a heteroaryl group having 4 to 30 carbon atoms, and combinations thereof. However, the present disclosure is not limited thereto.

As used herein, the term "alkyl" means any alkyl including a straight chain alkyl, and branched chain alkyl.

As used herein, the term "hetero" as used in 'hetero aromatic ring', 'heterocycloalkylene group', 'heteroarylene group', 'heteroaryl alkylene group', 'hetero oxy arylene group', 'heterocycloalkyl group, 'heteroaryl group, "heteroaryl alkyl group, 'hetero oxy aryl group', and 'heteroaryl amine group' means that one or more carbon atoms, for example, 1 to 5 carbon atoms among carbon atoms constituting the aromatic or alicyclic ring are substituted with at least one hetero atom selected from the group consisting of N, O, S and combinations thereof.

As used herein, the phase "combinations thereof" as used in the definition of the substituent means that two or more substituents are bonded to each other via a linking group or two or more substituents are bonded to each other via condensation, unless otherwise defined.

Hereinafter, an organic electroluminescent device according to some embodiments of the present disclosure will be described.

In one embodiment of the present disclosure, an organic electroluminescent device includes an anode, a cathode and at least one organic layer between the anode and the cathode, wherein the at least one organic layer includes: a light emitting layer; and an organic layer disposed between the anode and the light emitting layer and containing a compound represented by the following Chemical Formula 1:

Chemical Formula 1

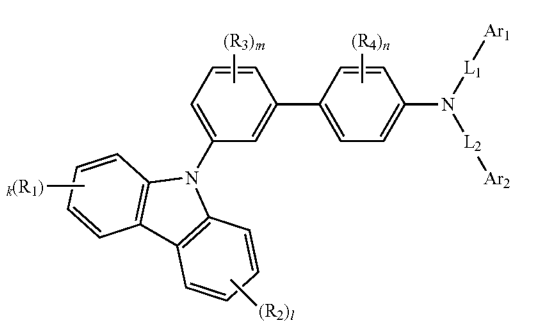

In the Chemical Formula 1, each of $L_1$ and $L_2$ independently represents one selected from the group consisting of a substituted or unsubstituted C6 to C30 arylene group, a substituted or unsubstituted C3 to C30 heteroarylene group, a substituted or unsubstituted C1 to C20 alkylene group, a substituted or unsubstituted C3 to C20 cycloalkylene group, a substituted or unsubstituted C1 to C20 alkenylene group, a substituted or unsubstituted C3 to C20 cycloalkenylene group, a substituted or unsubstituted C1 to C20 heteroalkylene group, a substituted or unsubstituted C3 to C20 heterocycloalkylene group, a substituted or unsubstituted C1 to C20 heteroalkenylene group, and a substituted or unsubstituted C3 to C20 heterocycloalkenylene group.

$Ar_1$ represents a substituted or unsubstituted C7 to C30 arylene group or heteroarylene group, and $Ar_2$ represents a substituted or unsubstituted C8 to C30 condensed polycyclic group.

$R_1$ to $R_4$ are the same as or different from each other, and each of $R_1$ to $R_4$ independently represents one selected from the group consisting of hydrogen, deuterium, a substituted or unsubstituted C1 to C20 alkyl group, a substituted or unsubstituted C3 to C30 cycloalkyl group, a substituted or unsubstituted C1 to C20 alkenyl group, a substituted or unsubstituted C1 to C20 alkynyl group, a substituted or unsubstituted C1 to C20 heteroalkyl group, a substituted or unsubstituted C3 to C20 aralkyl group, a substituted or unsubstituted C6 to C30 aryl group, a substituted or unsubstituted C3 to C30 heteroaryl group, and a substituted or unsubstituted C3 to C20 heteroaralkyl group.

Each of k, l, m, and n independently is an integer of 0 to 4.

Preferably, in the compound represented by Chemical Formula 1, $Ar_1$ represents a substituted or unsubstituted C7 to C15 arylene group or heteroarylene group.

For example, $Ar_1$ may include biphenyl, naphthyl, phenanthrene, dibenzofuran, dibenzothiophene, or fluorene.

Further, preferably, in the compound represented by Chemical Formula 1, each of $L_1$ and $L_2$ may include substituted or unsubstituted phenylene.

Specifically, the compound represented by Chemical Formula 1 may be one of the following compounds 1 to 166. However, the present disclosure is not limited thereto.

1

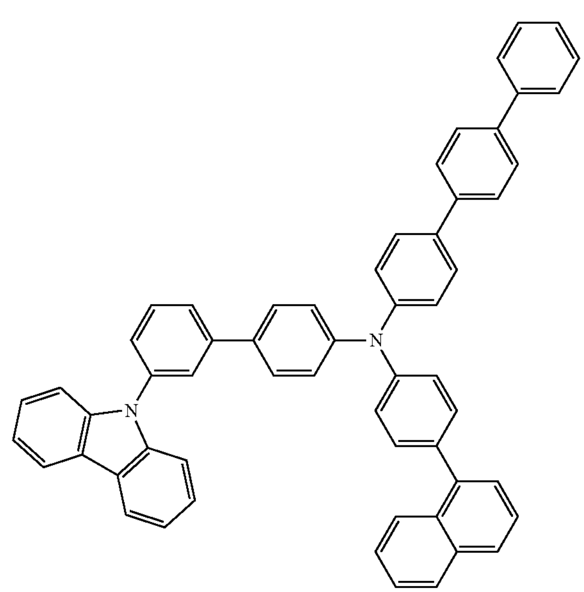

-continued
2
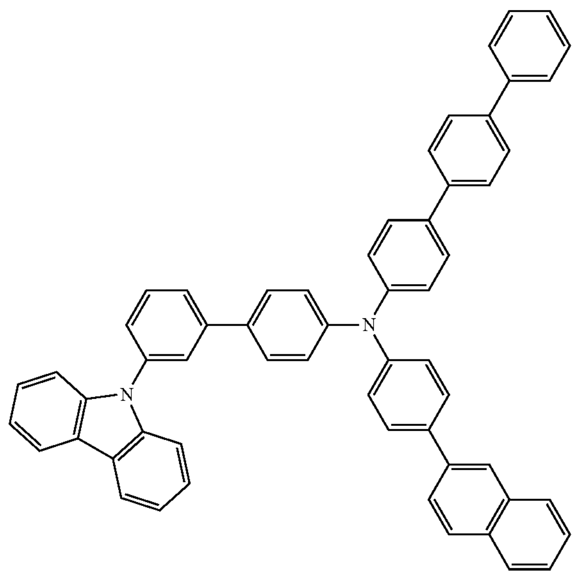
3
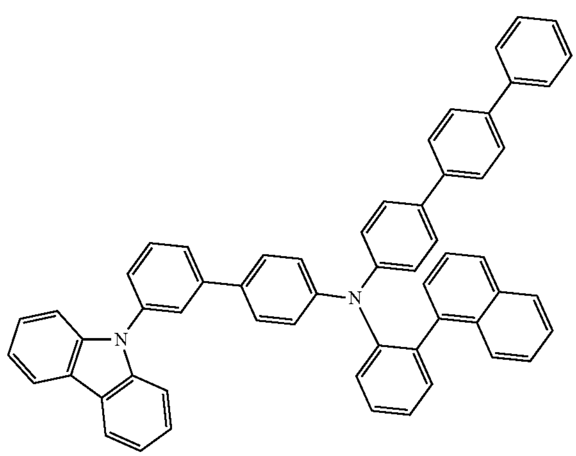
4
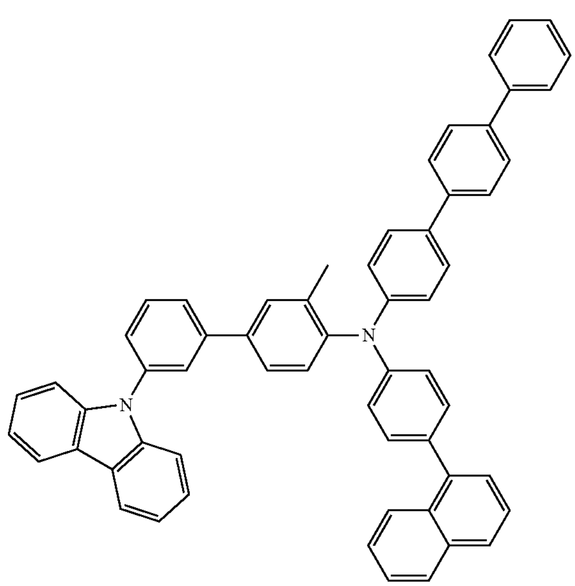
-continued
5
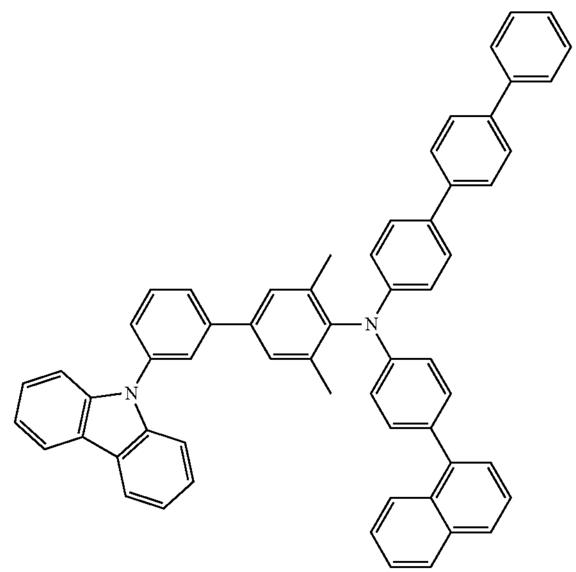
6
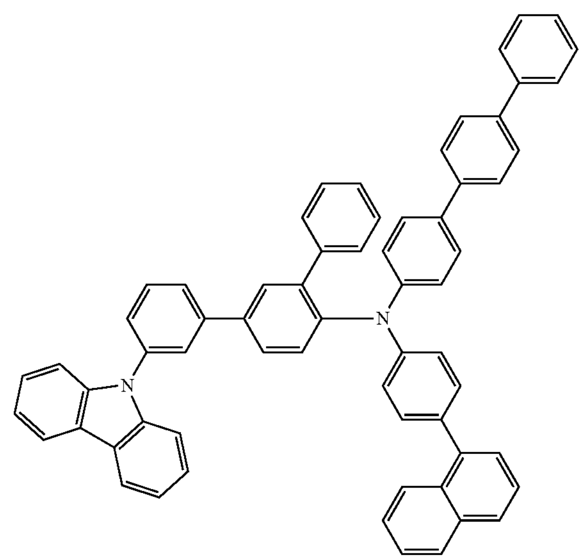
7
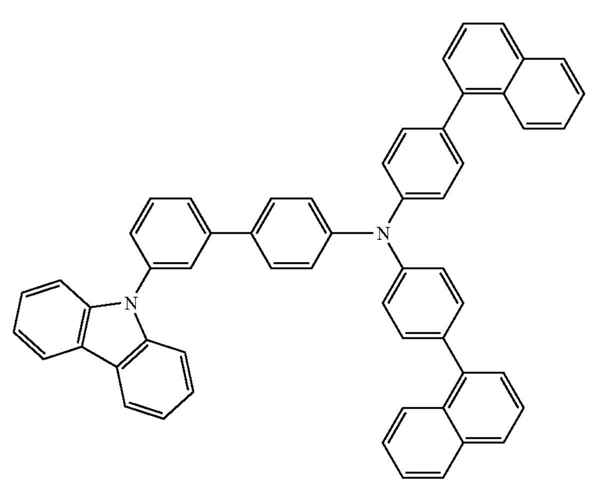

8
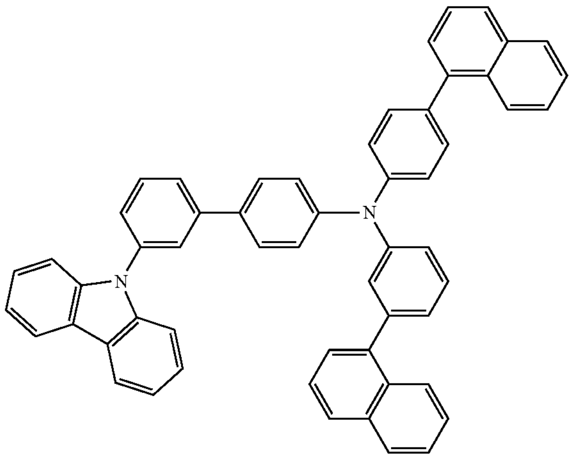
9
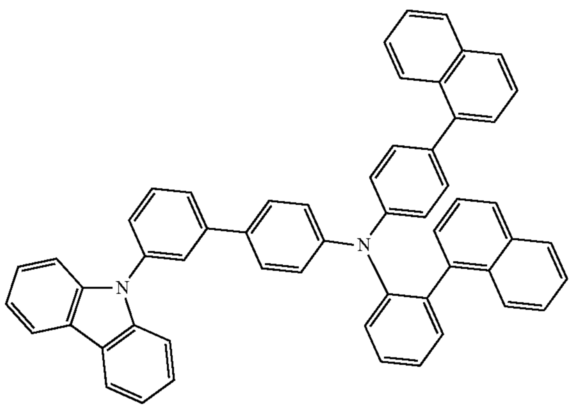
10
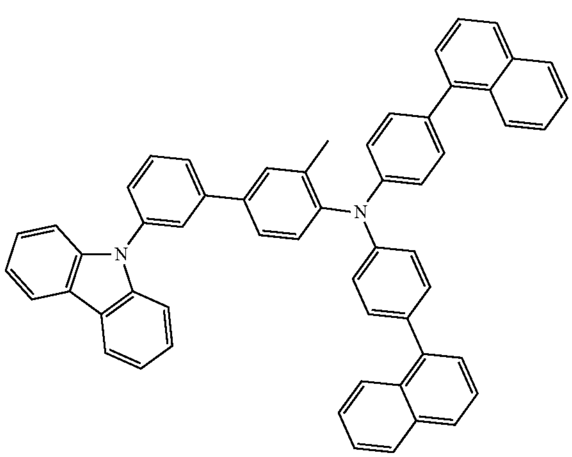
11
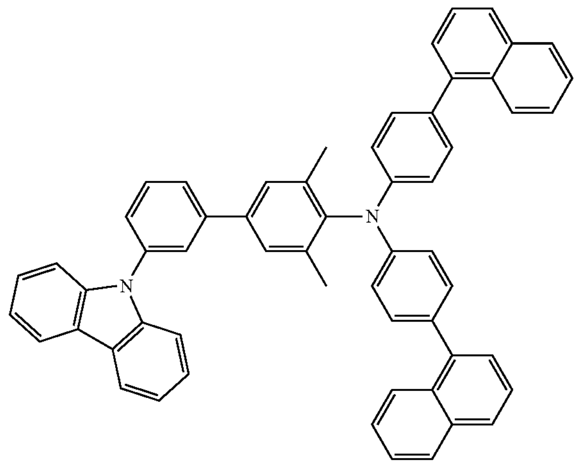
12
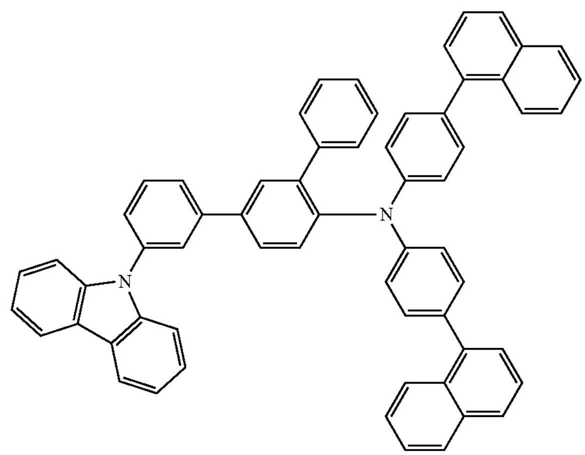
13
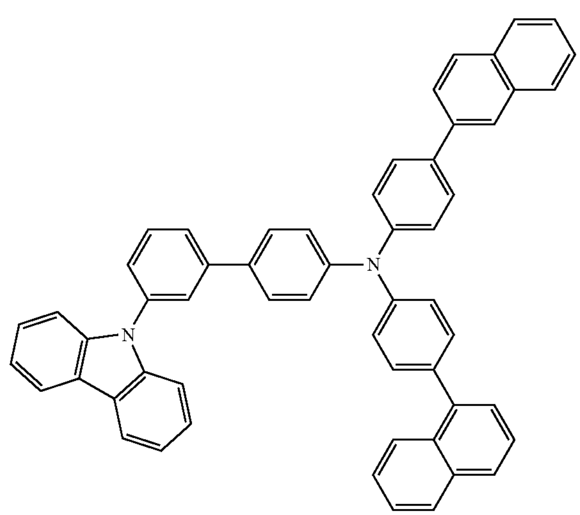

-continued
14
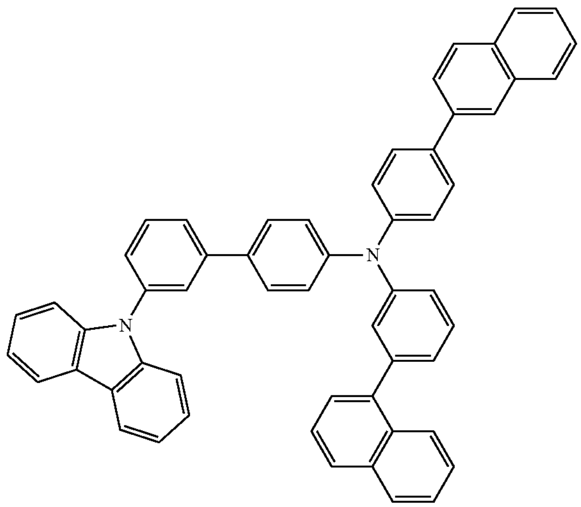
15
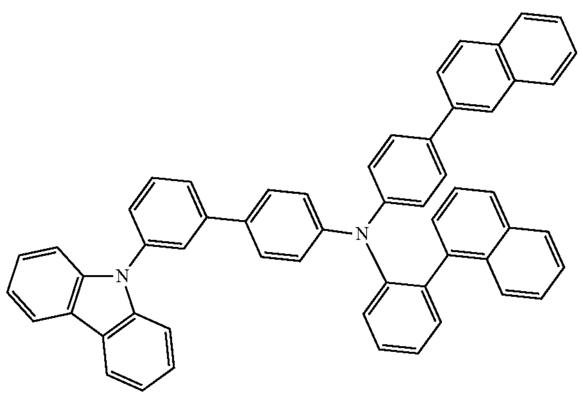
16
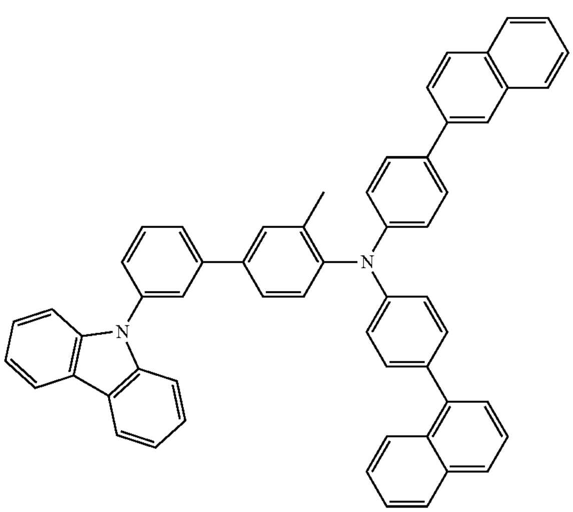
-continued
17
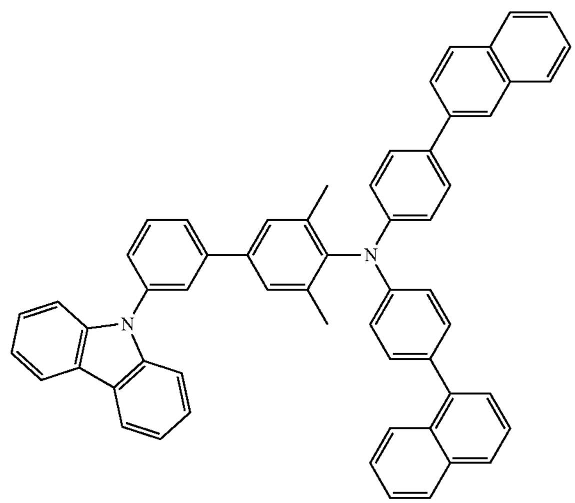
18
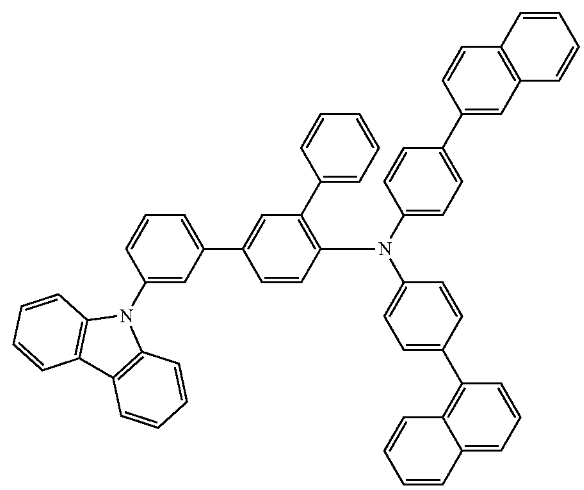
19
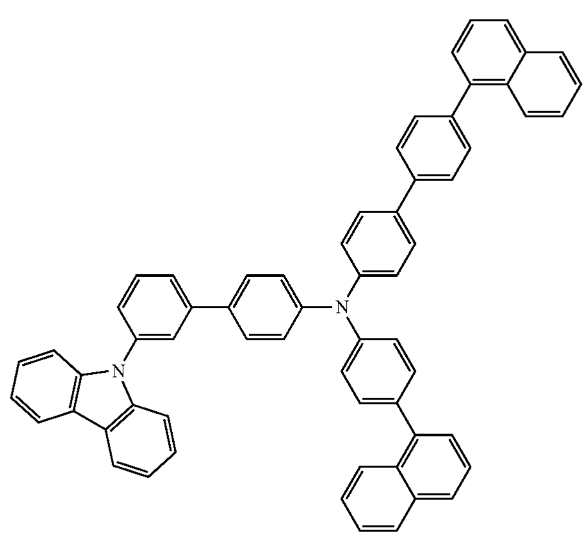

-continued
20
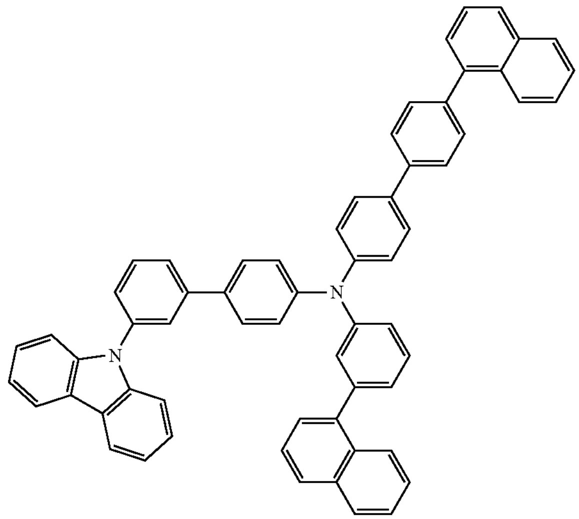
21
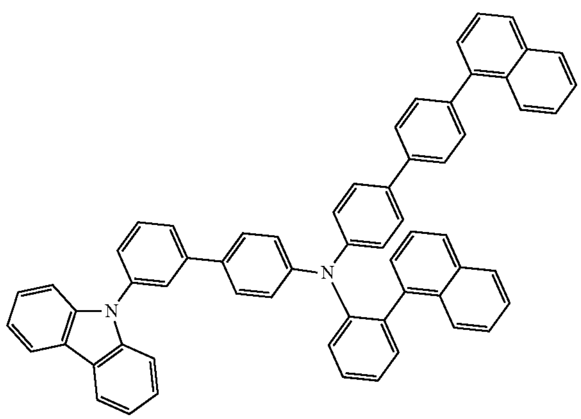
22
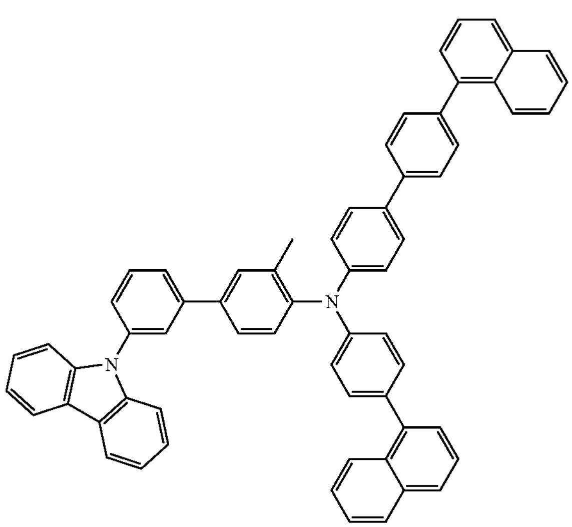
-continued
23
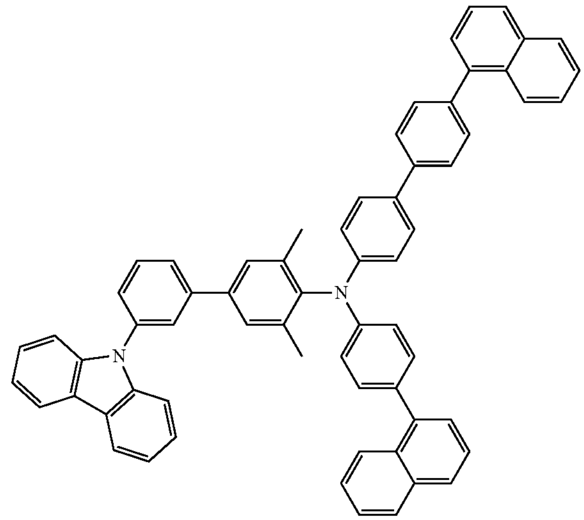
24
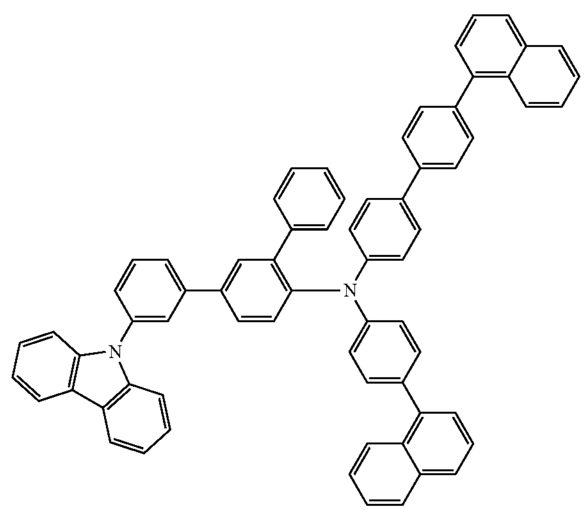
25
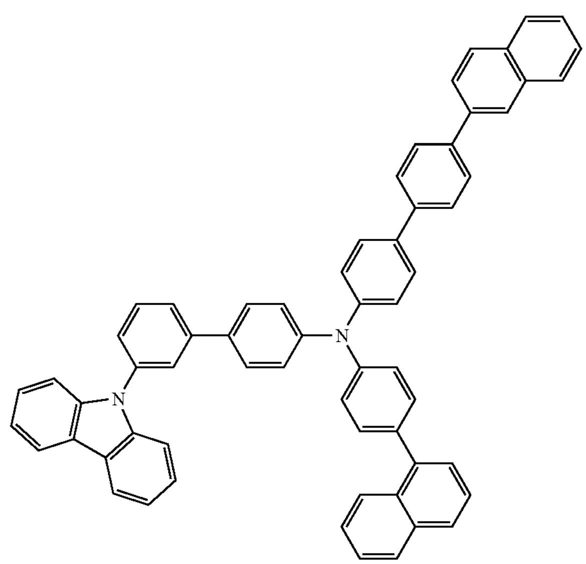

-continued
26
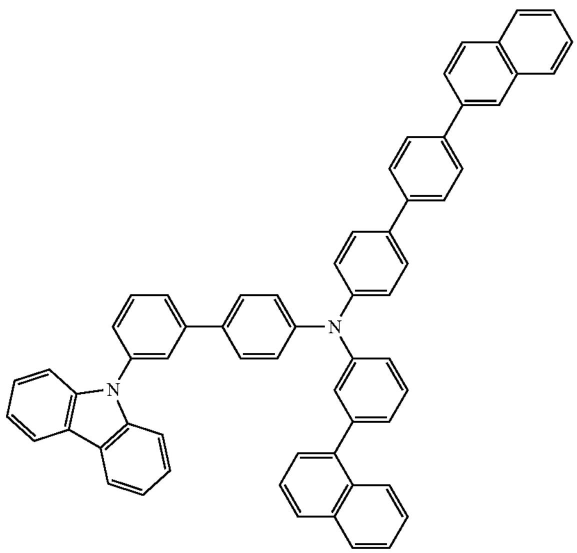
27
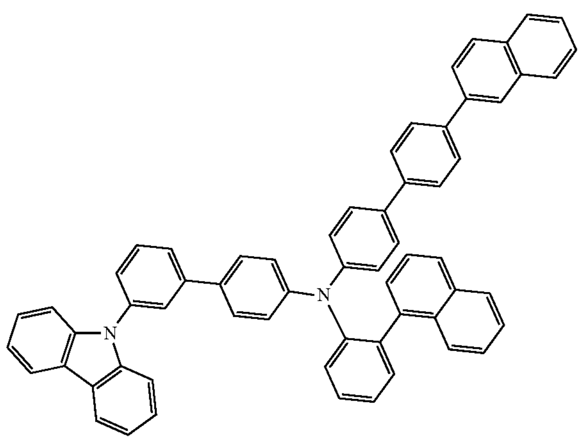
28
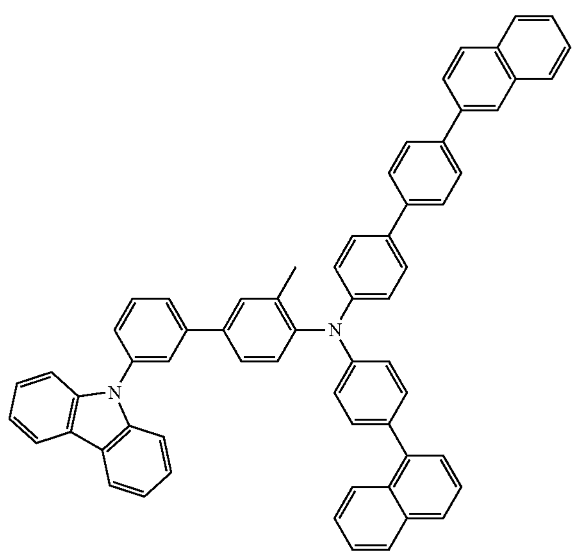
-continued
29
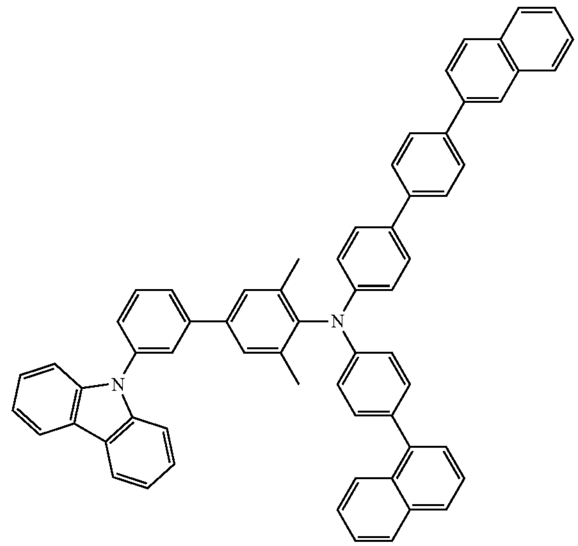
30
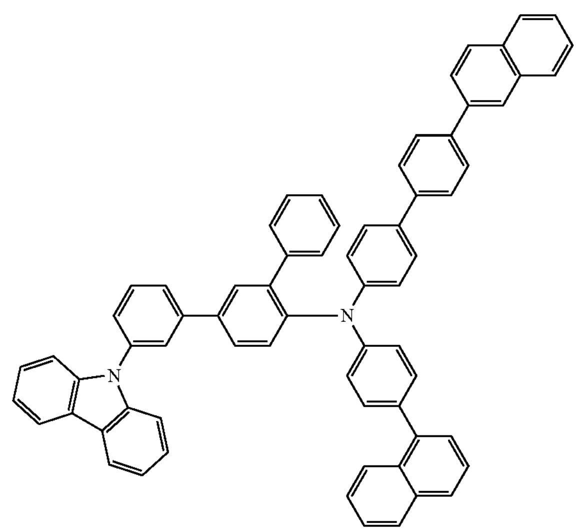
31
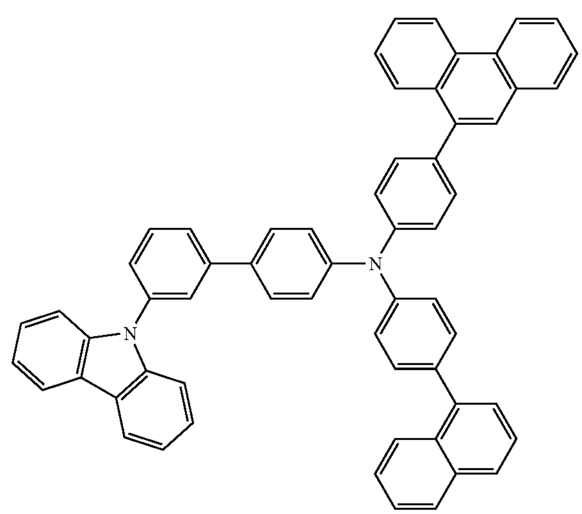

-continued
32
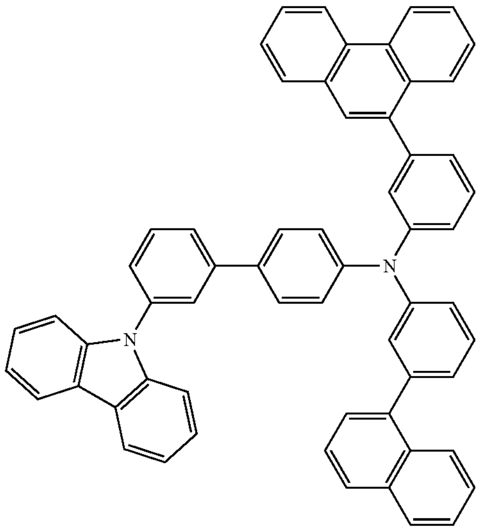
33
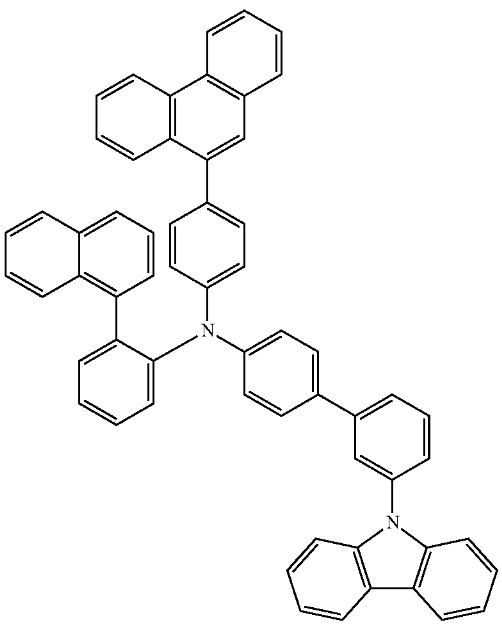
34
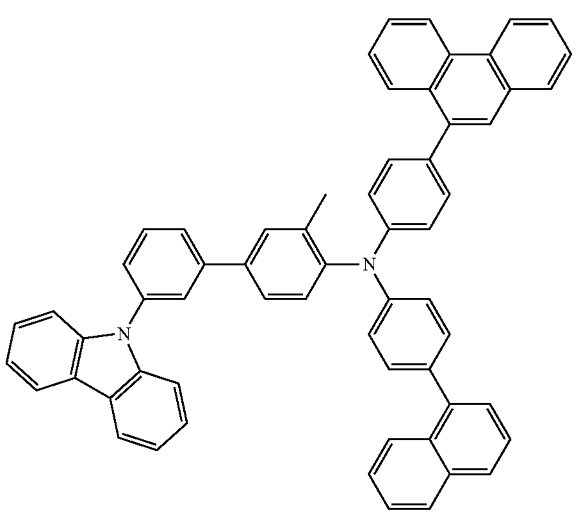
-continued
35
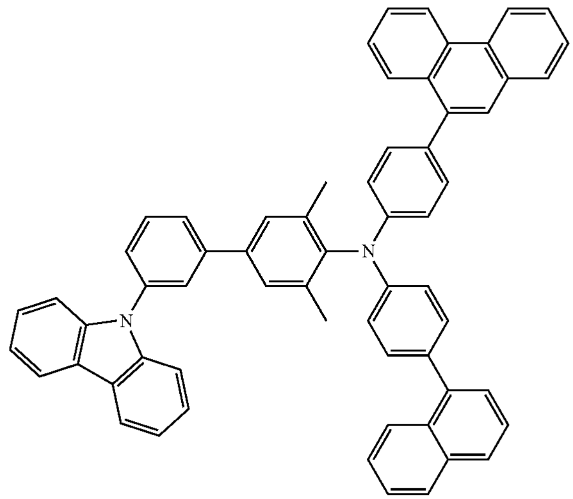
36
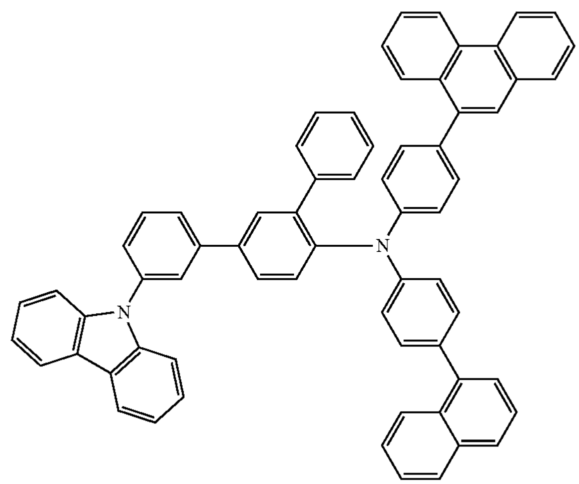
37
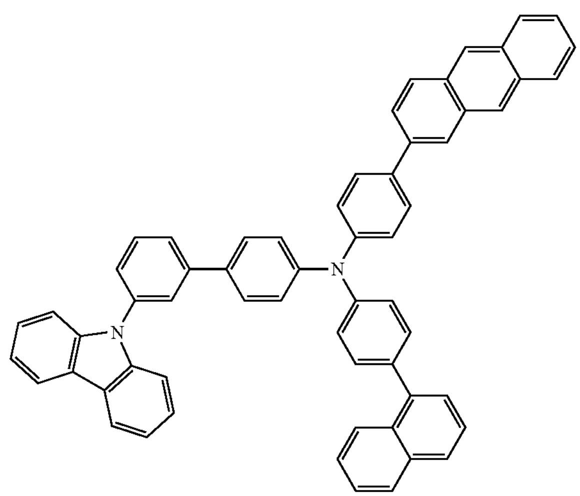

-continued
38
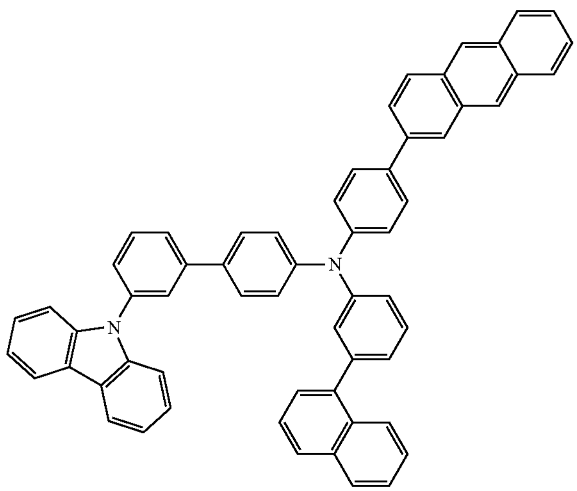
39
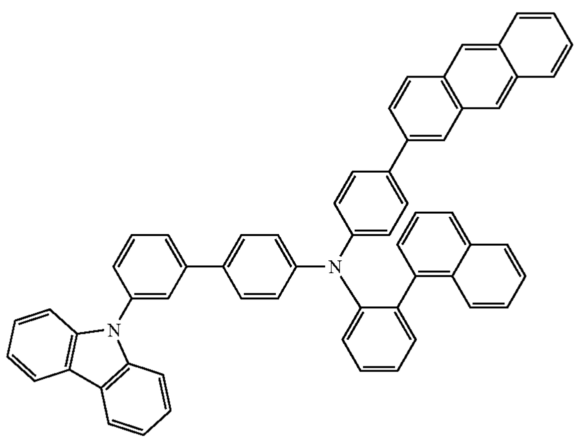
40
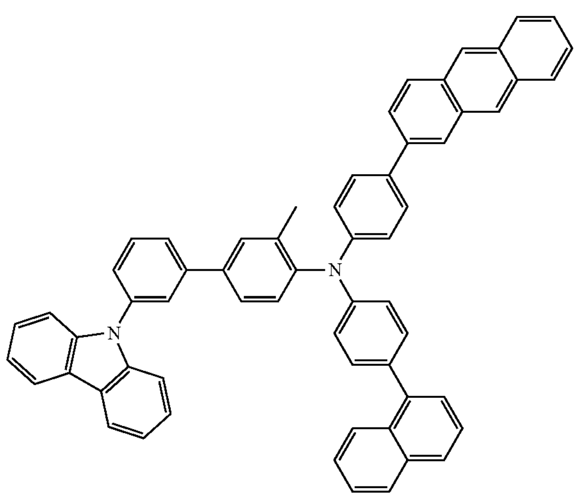
-continued
41
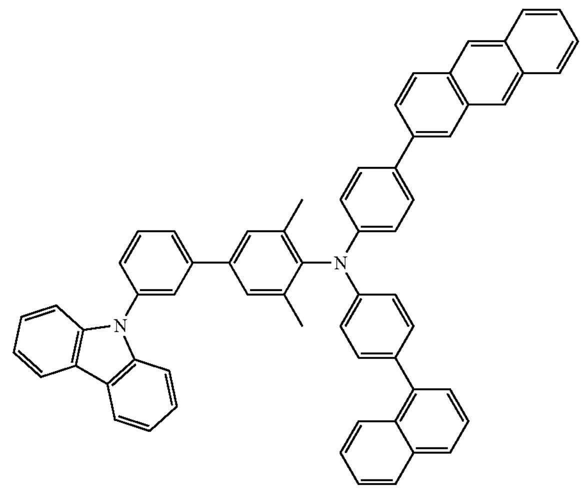
42
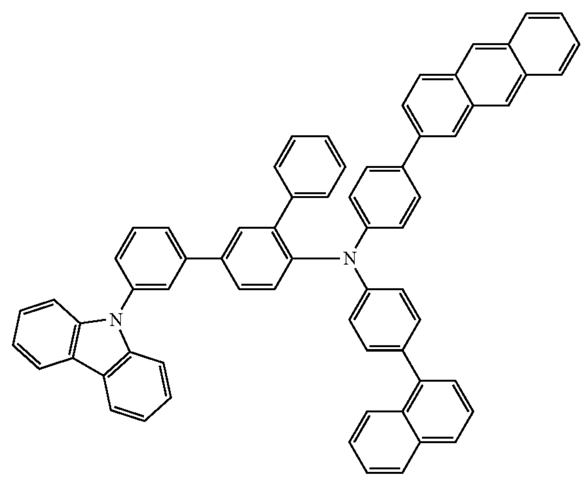
43
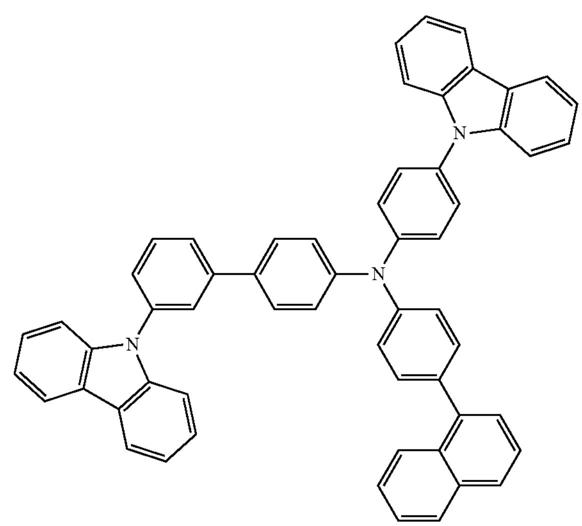

-continued
44
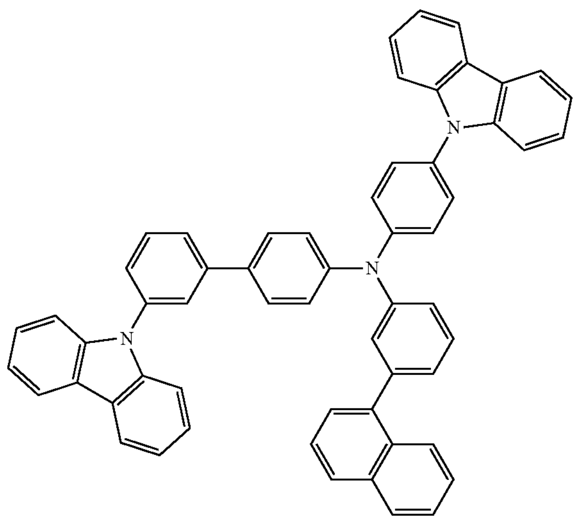
45
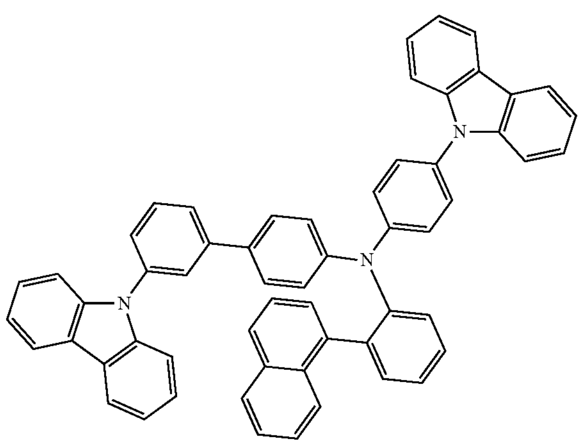
46
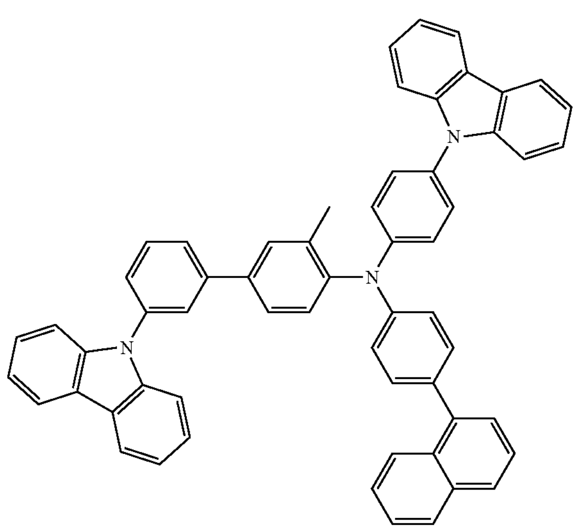
-continued
47
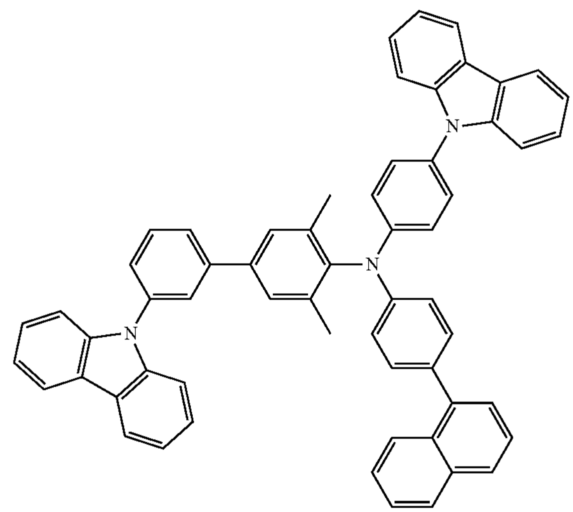
48
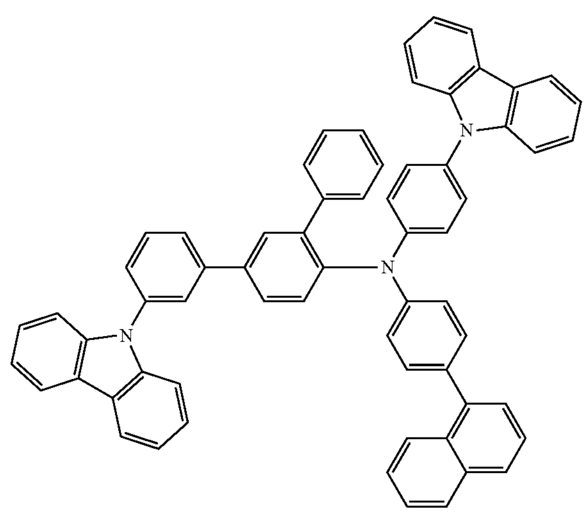
49
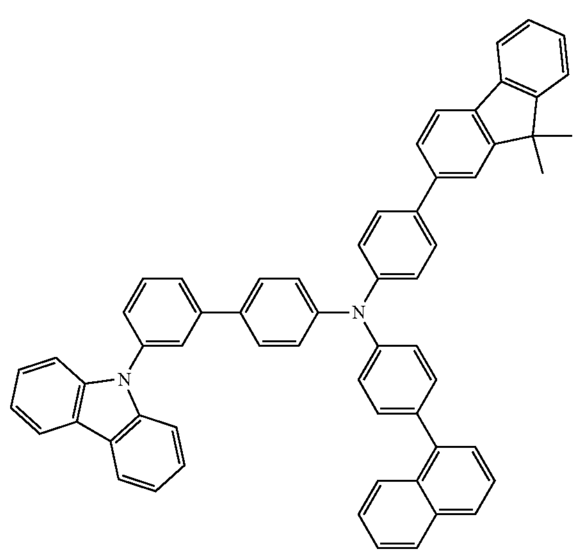

-continued
50
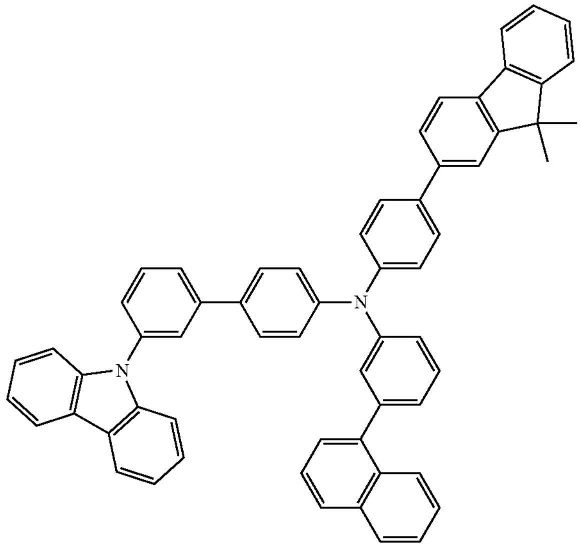
51
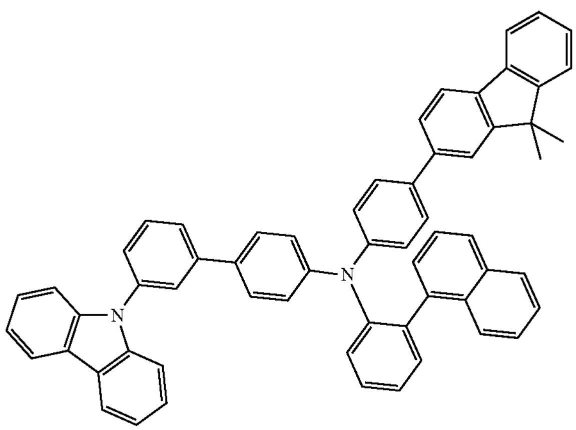
52
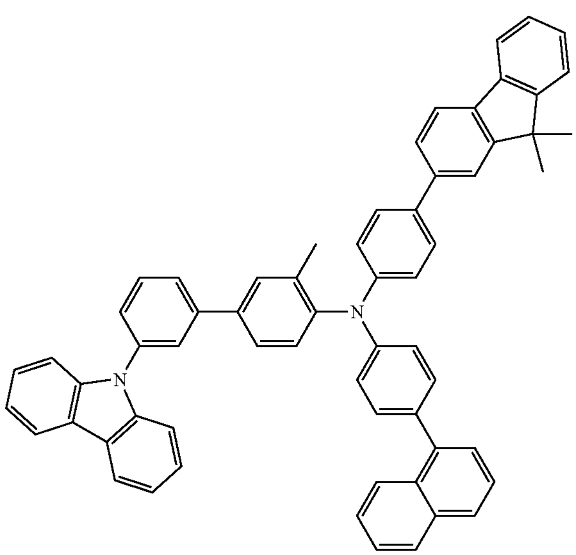
-continued
53
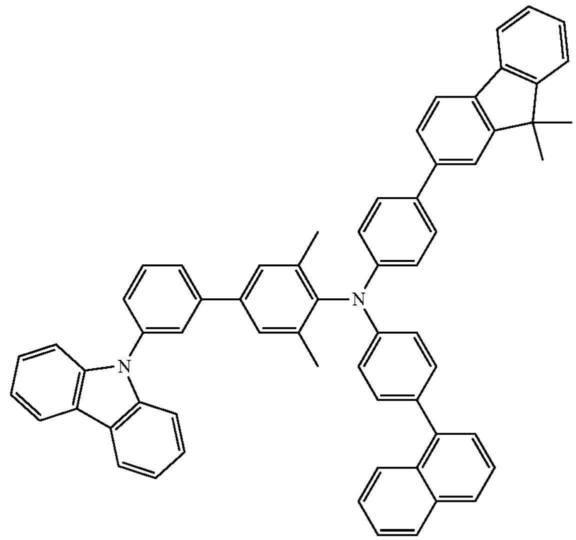
54
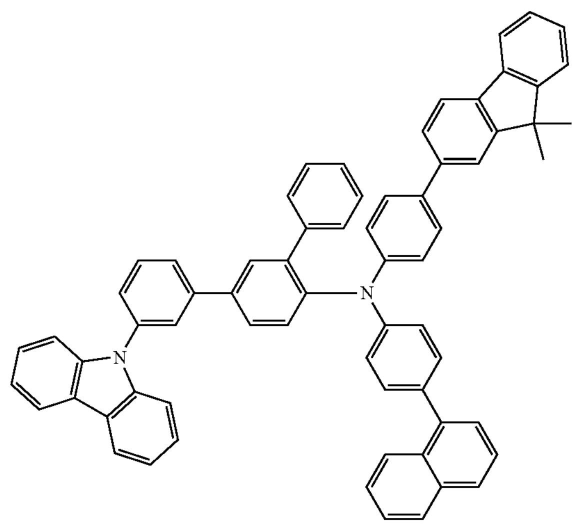
55
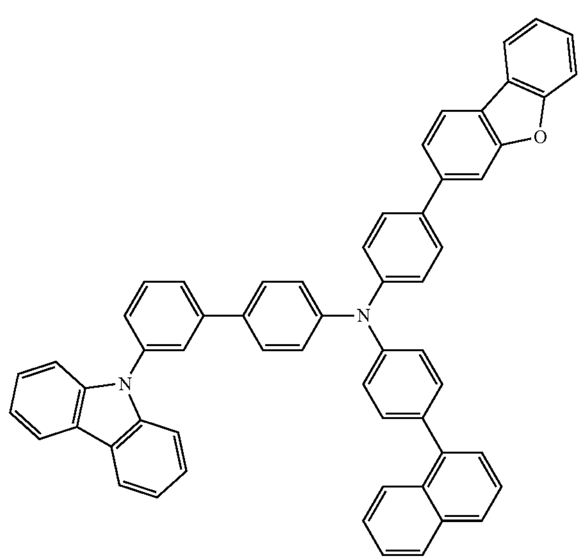

-continued
56
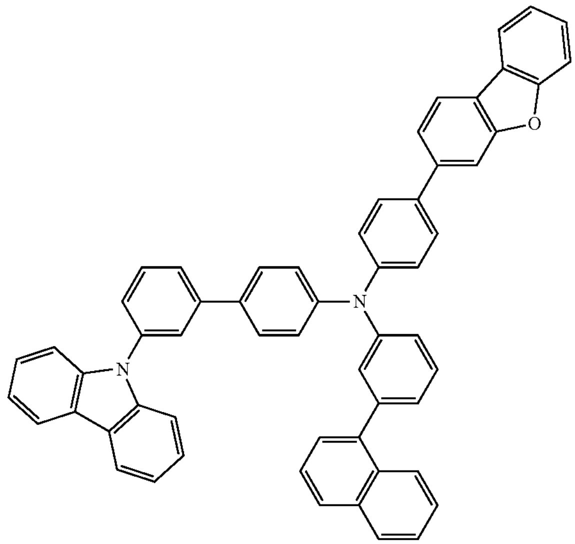
57
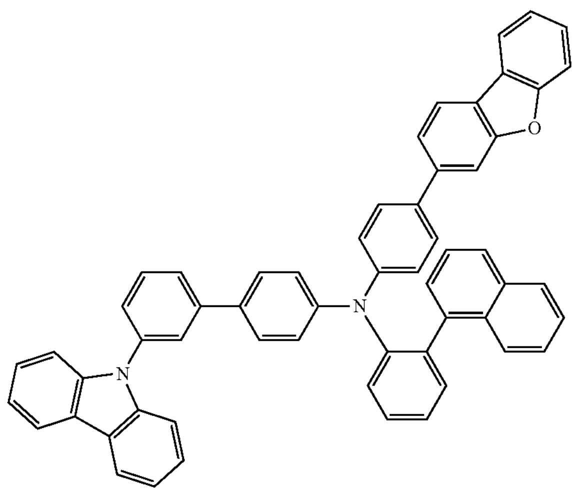
58
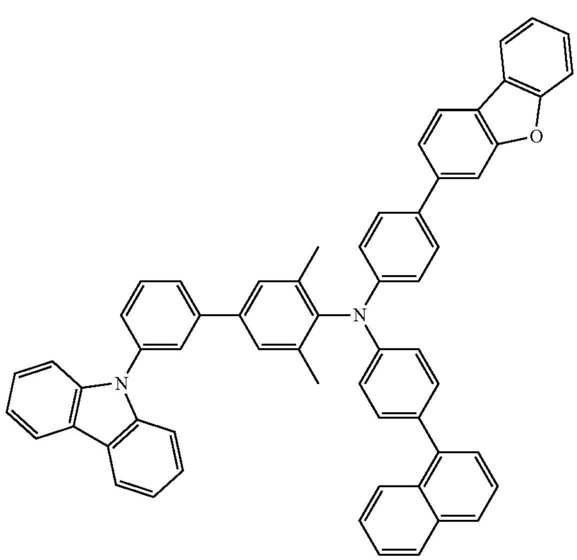
-continued
59
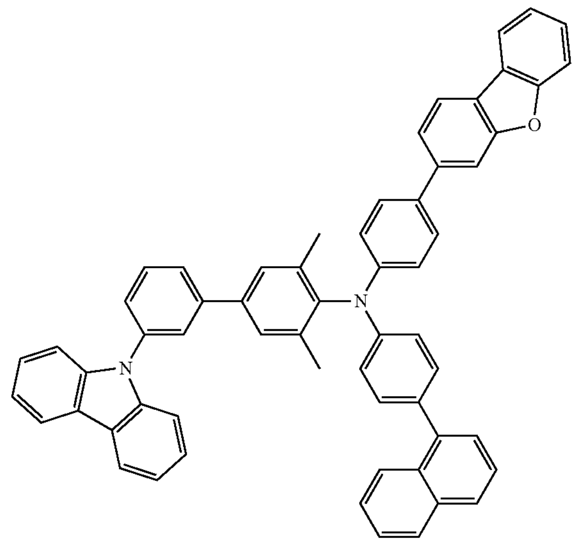
60
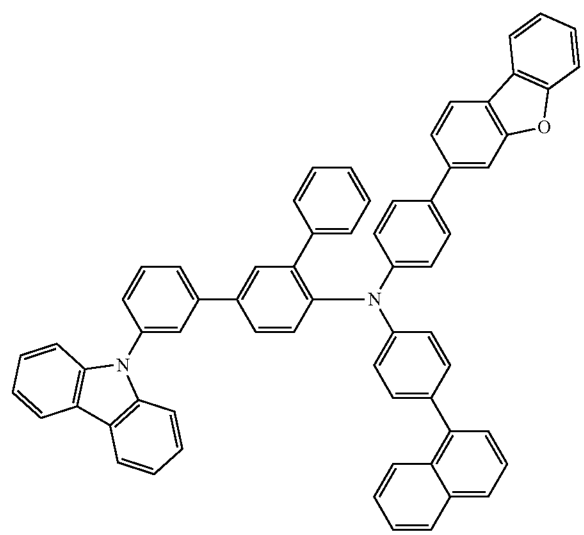
61
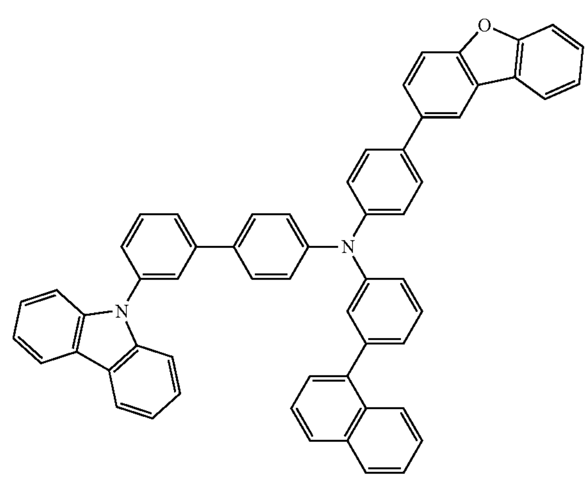

-continued
62
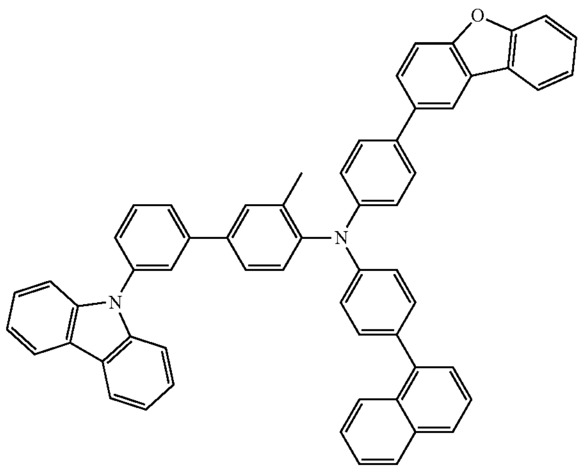
63
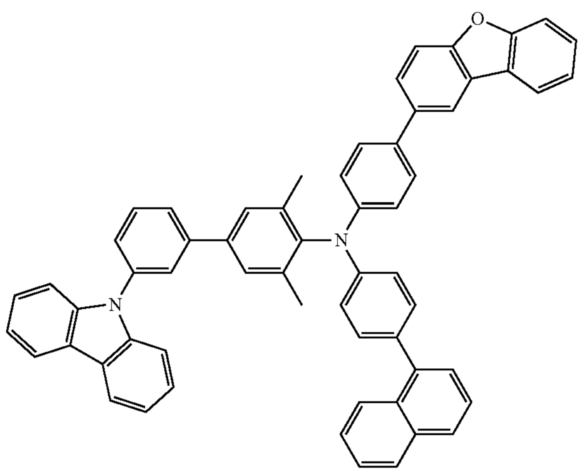
64
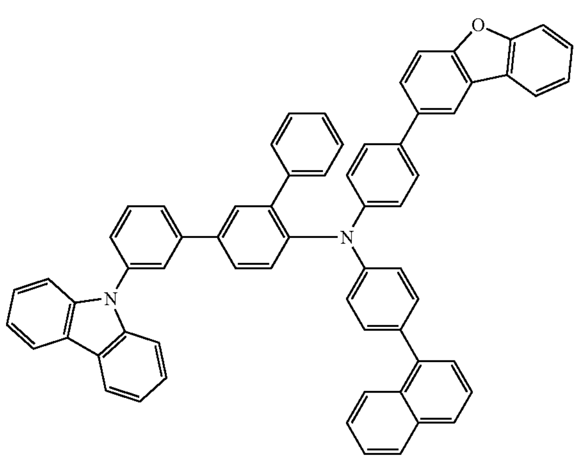
-continued
65
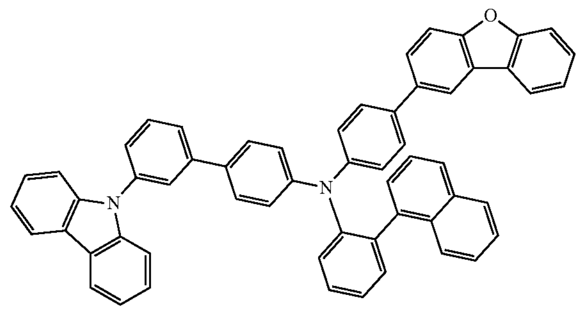
66
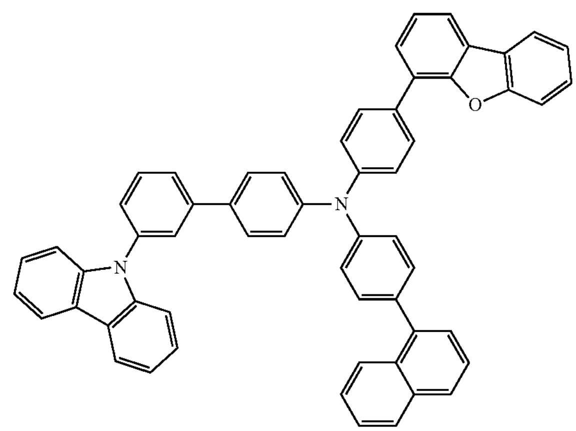
67
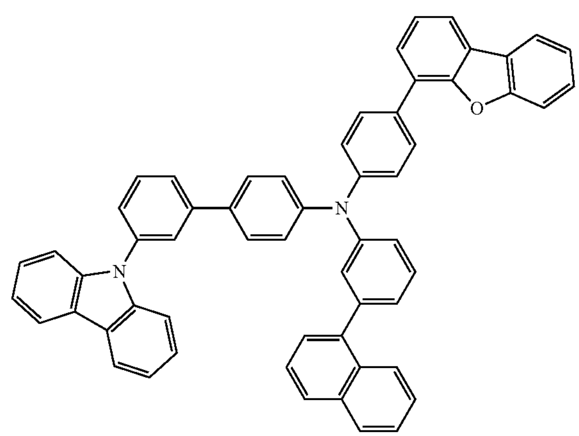

-continued
68
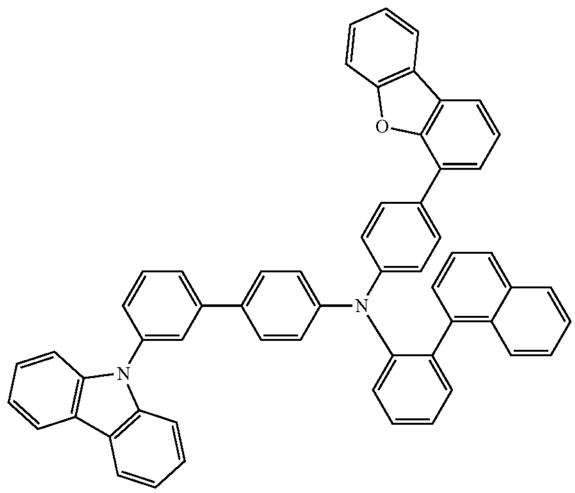
69
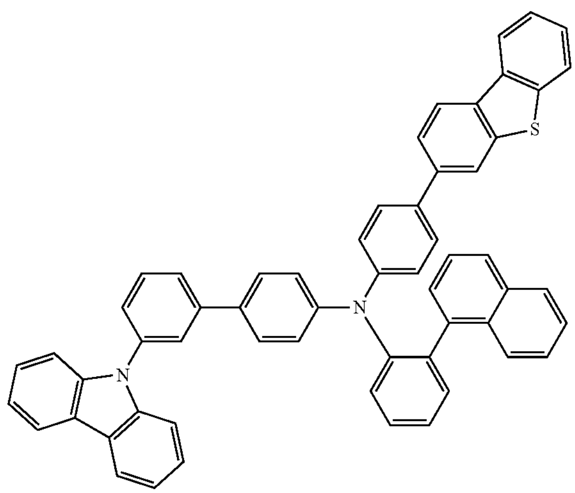
70
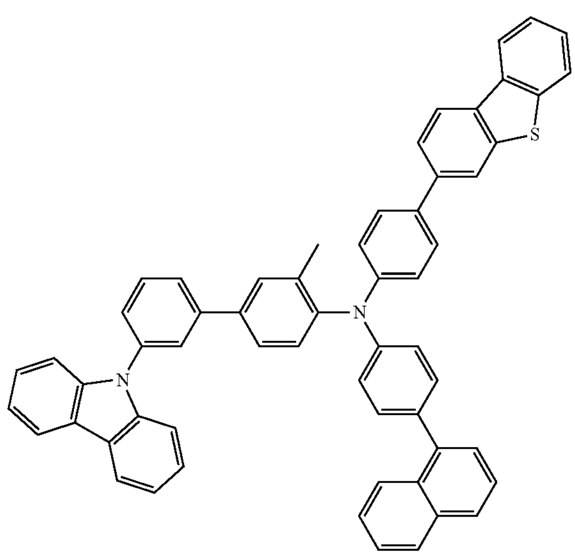
-continued
71
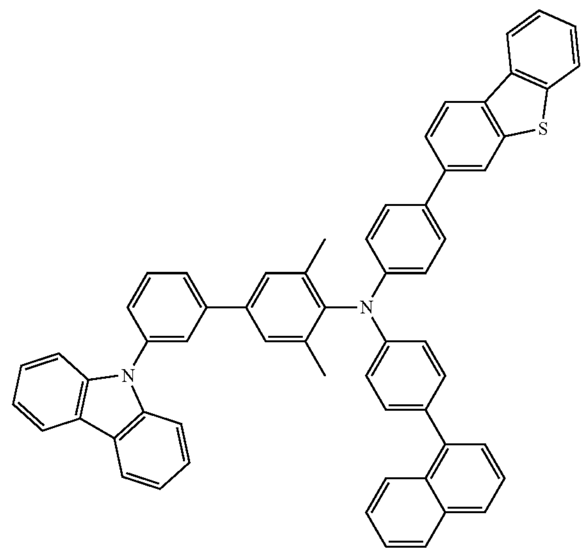
72
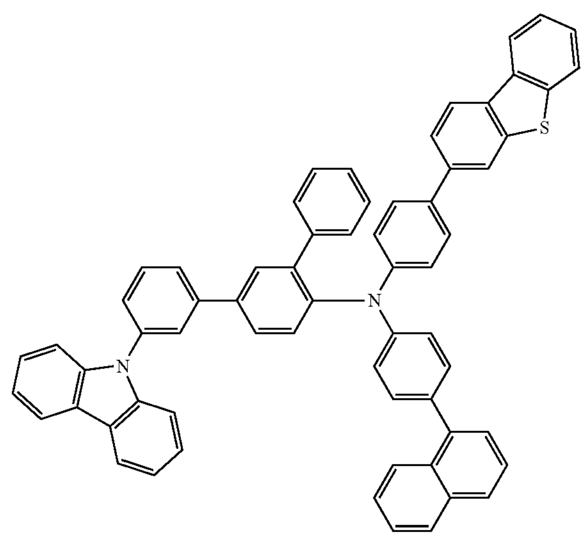
73
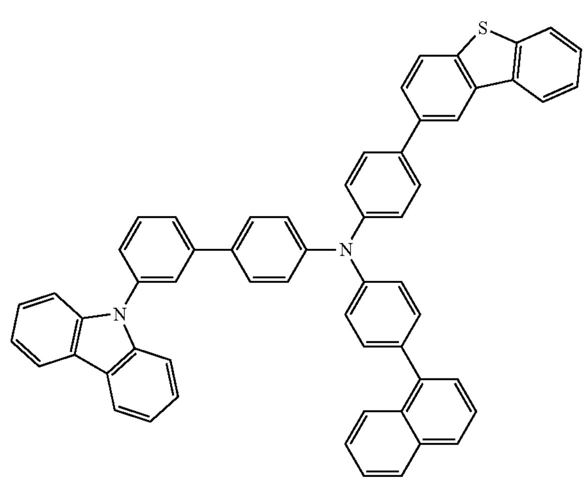

-continued
74
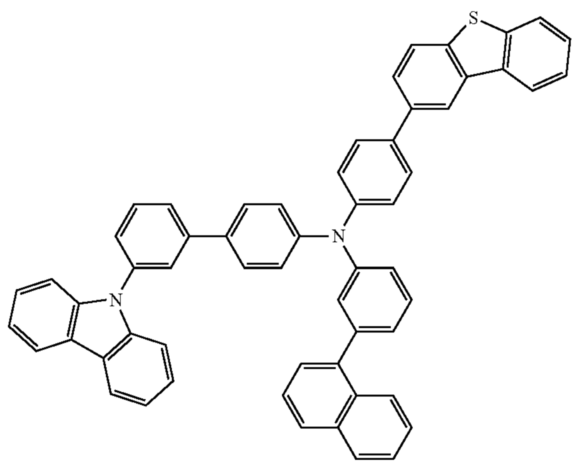
75
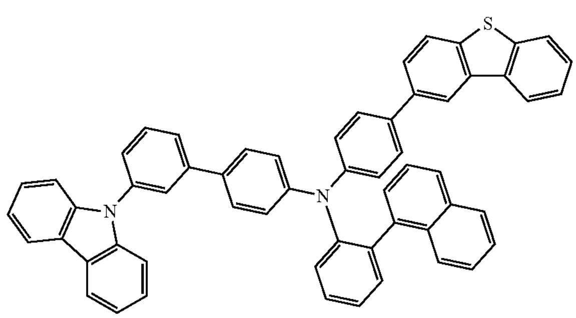
76
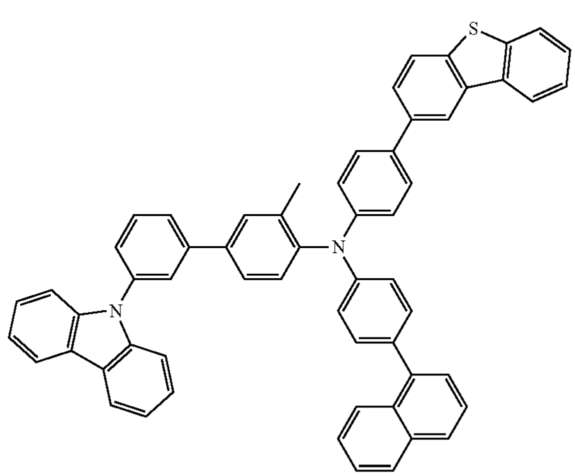
-continued
77
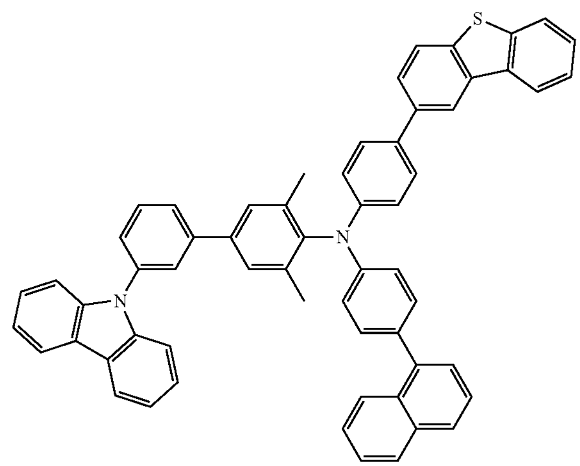
78
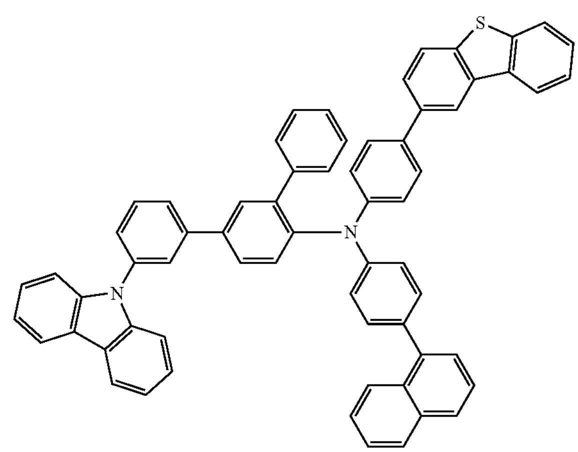
79
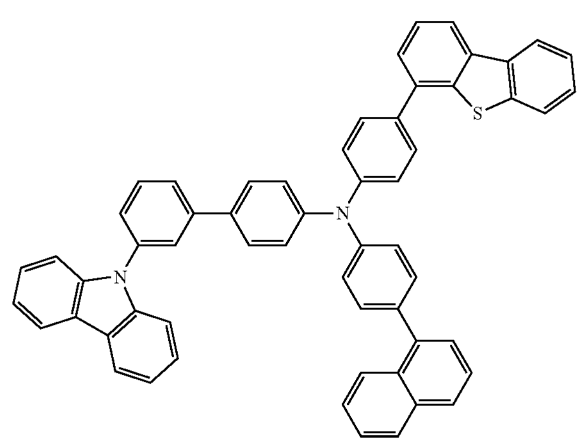

-continued
80
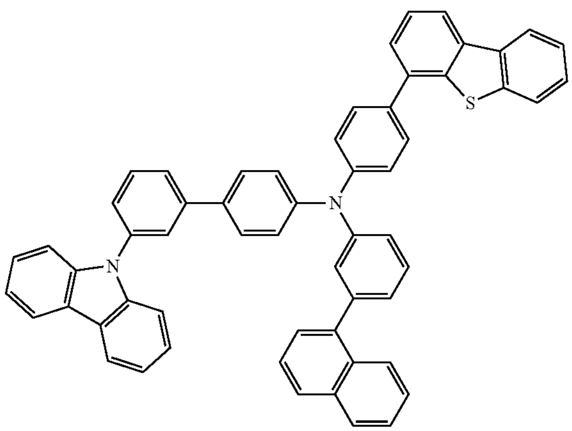
81
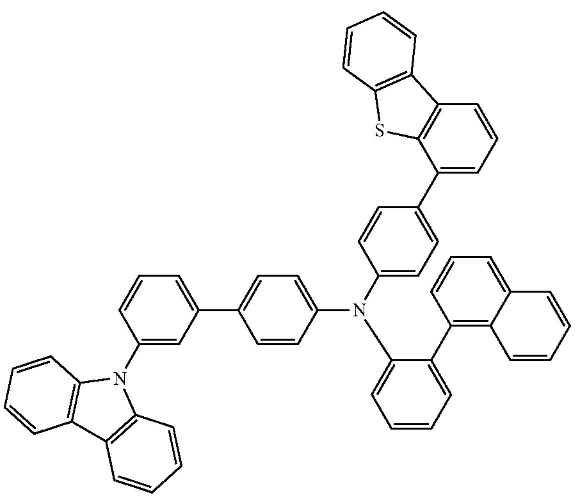
82
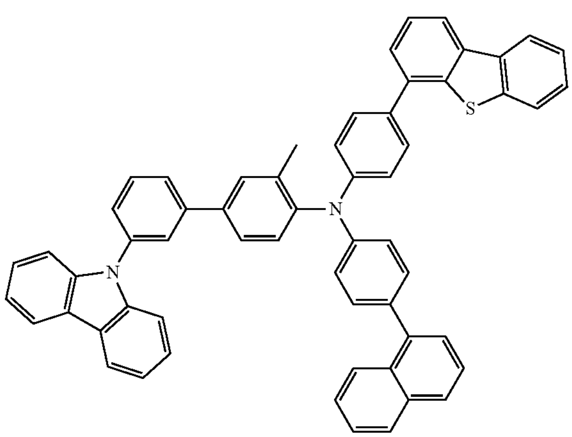
-continued
83
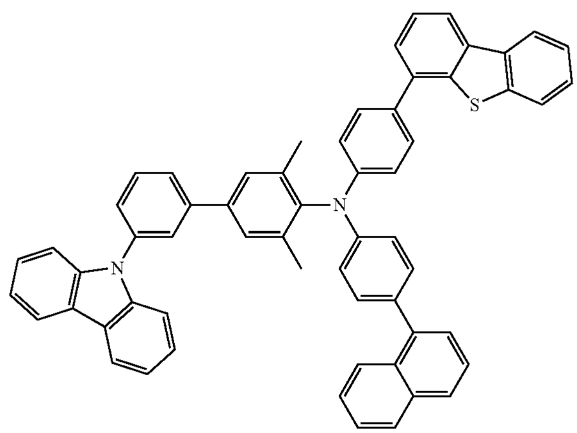
84
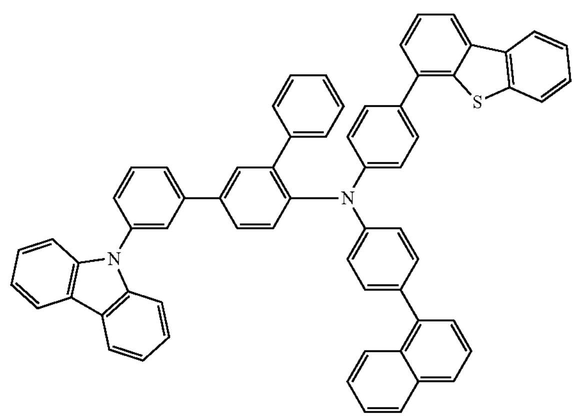
85
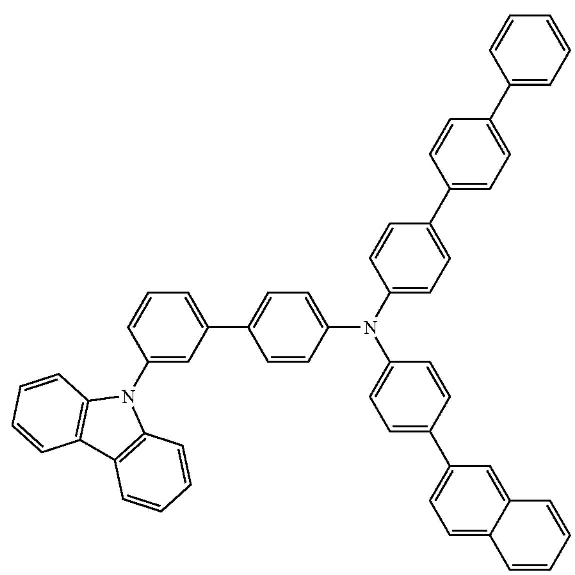

-continued
86
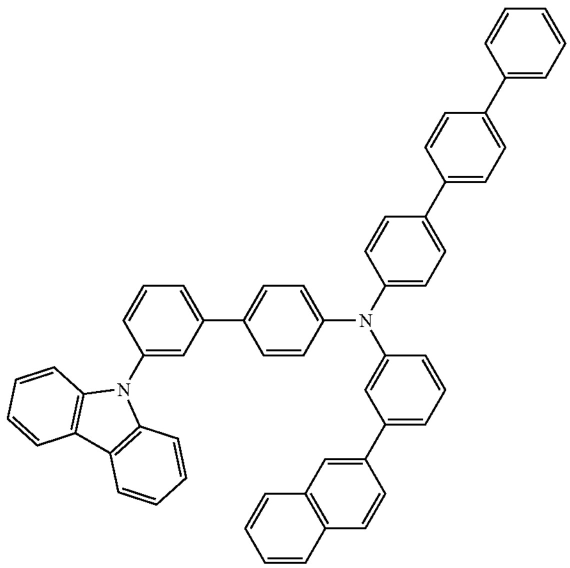
87
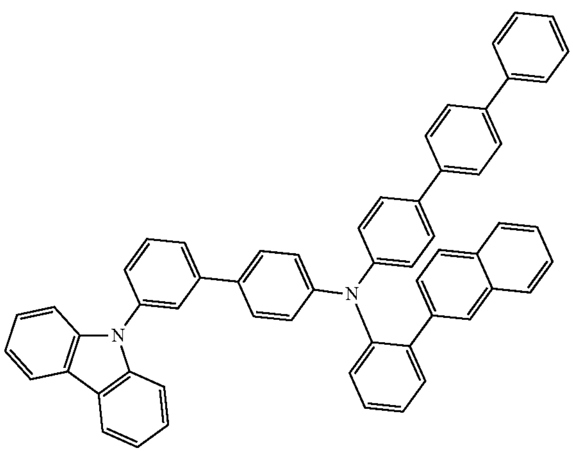
88
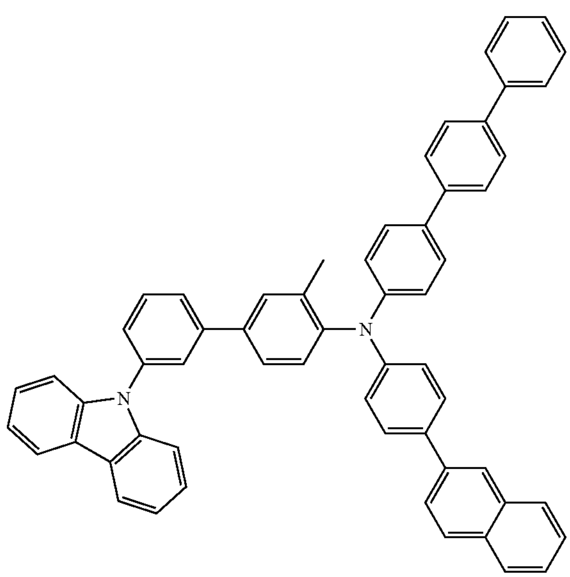
-continued
89
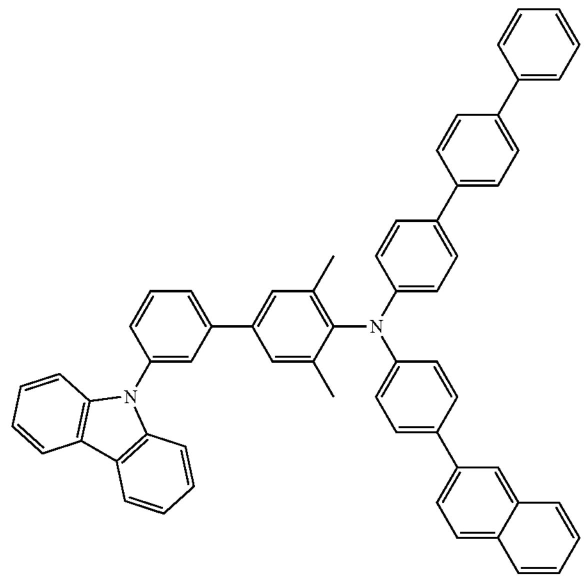
90
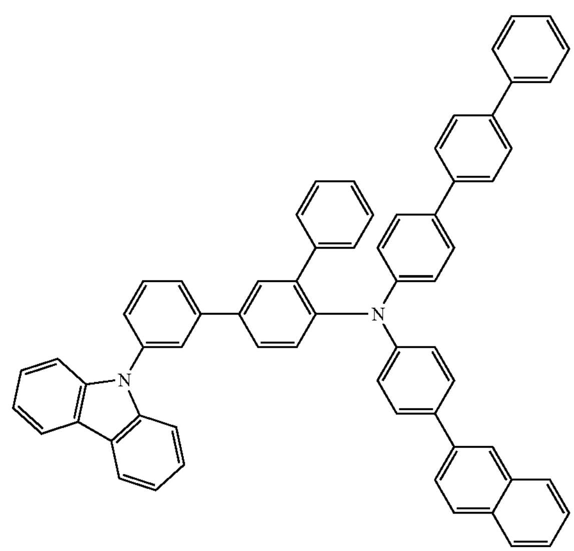

-continued
91
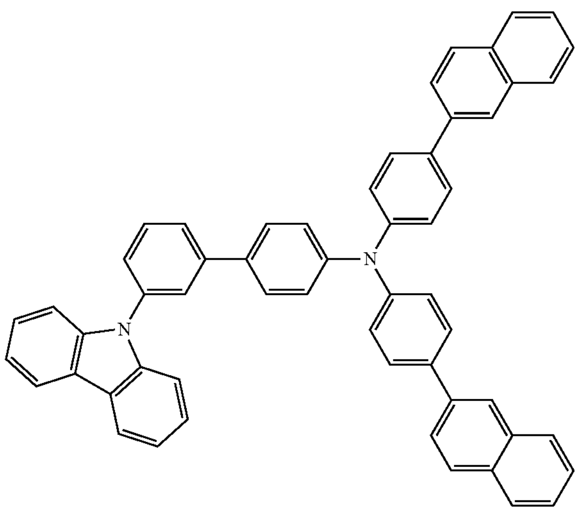
92
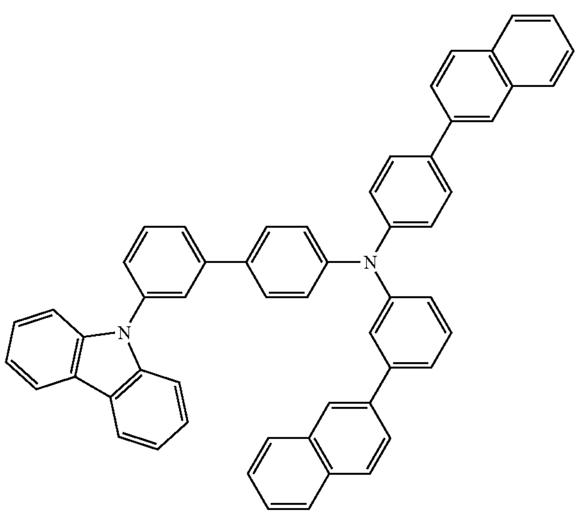
93
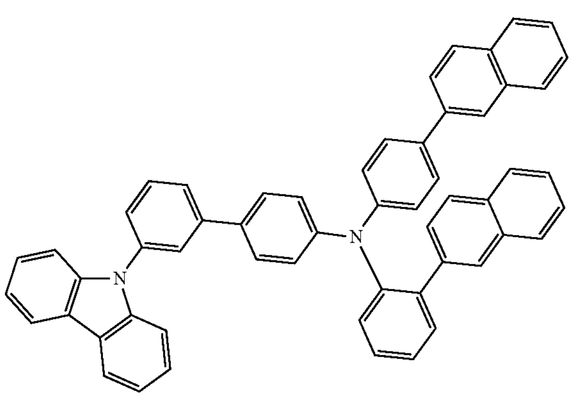
-continued
94
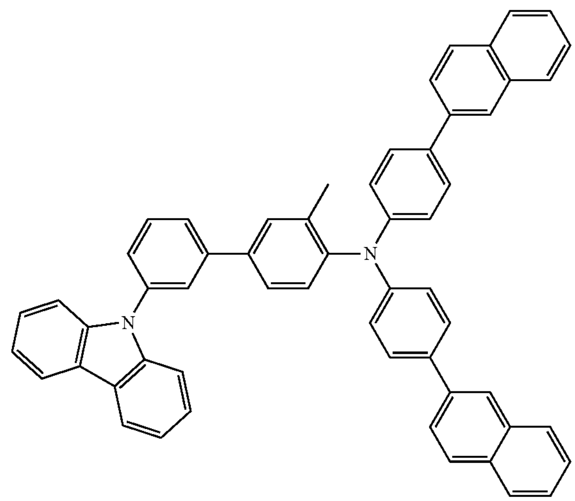
95
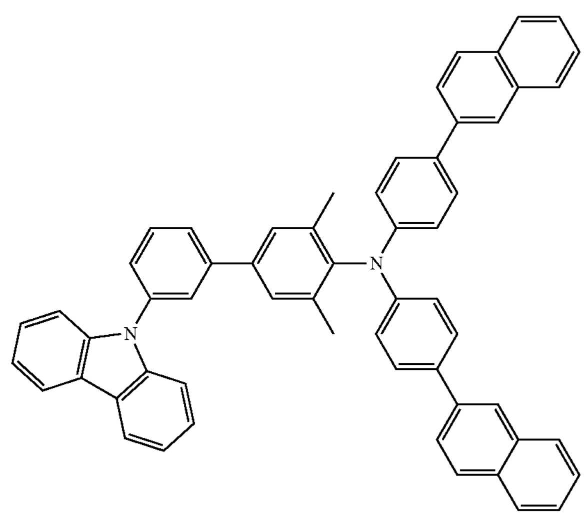
96
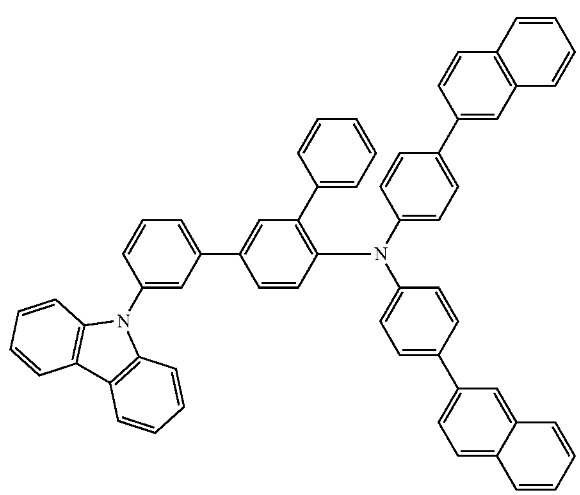

-continued
97
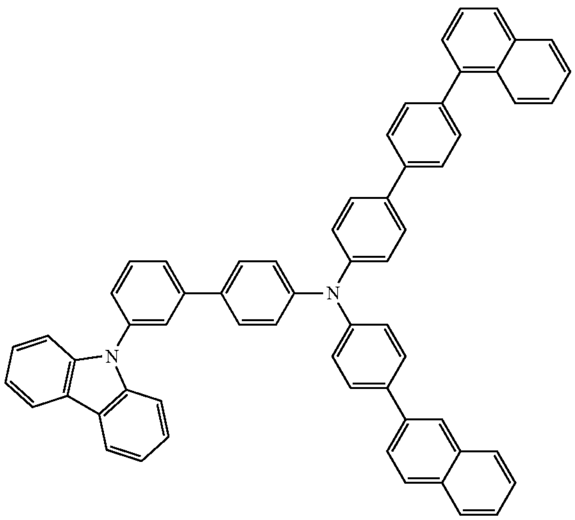
98
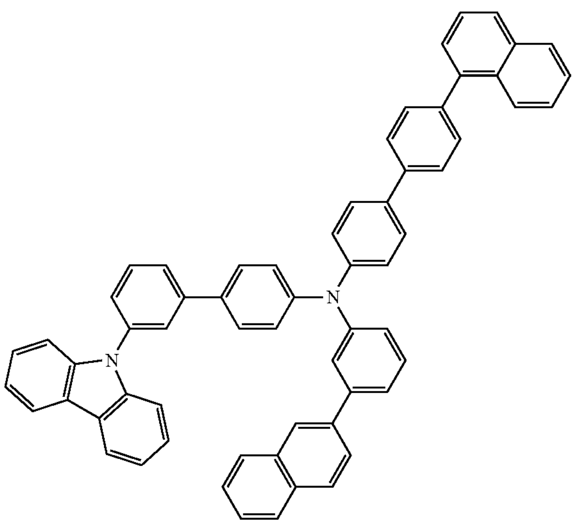
99
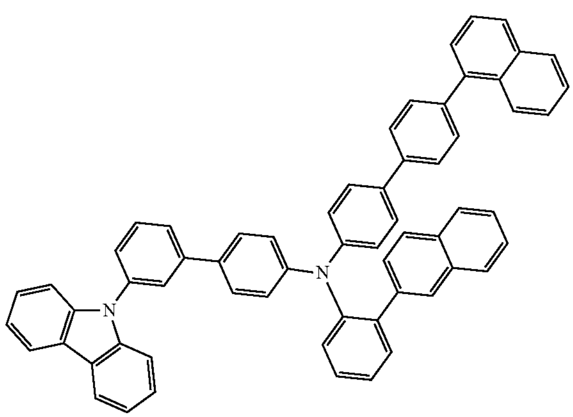
-continued
100
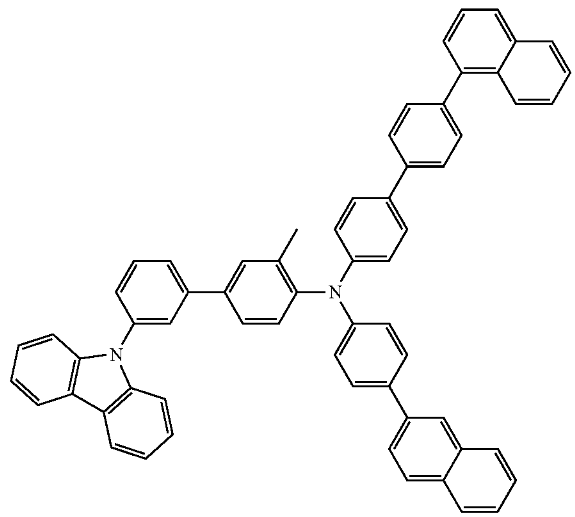
101
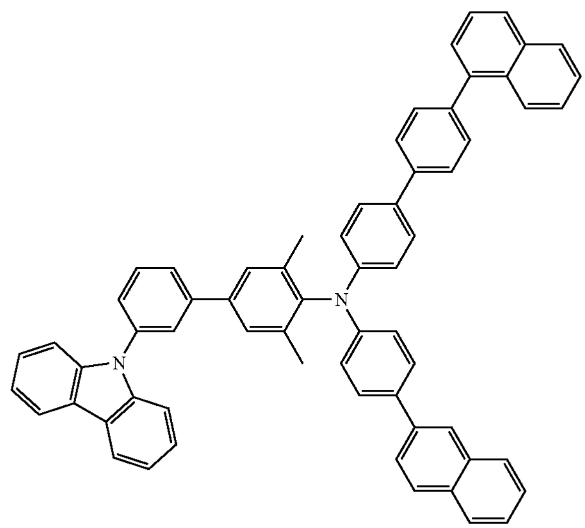
102
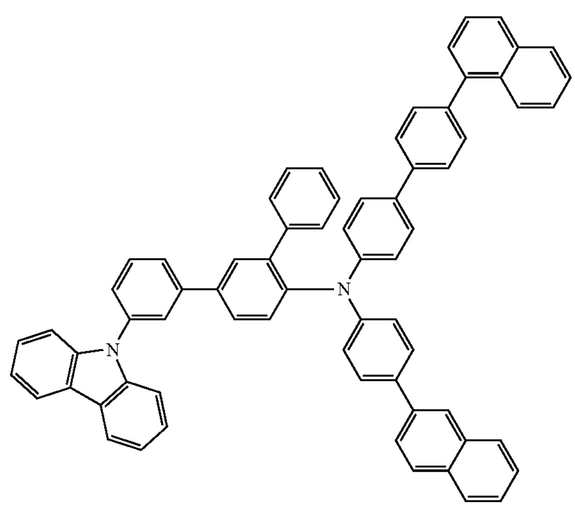

-continued
103
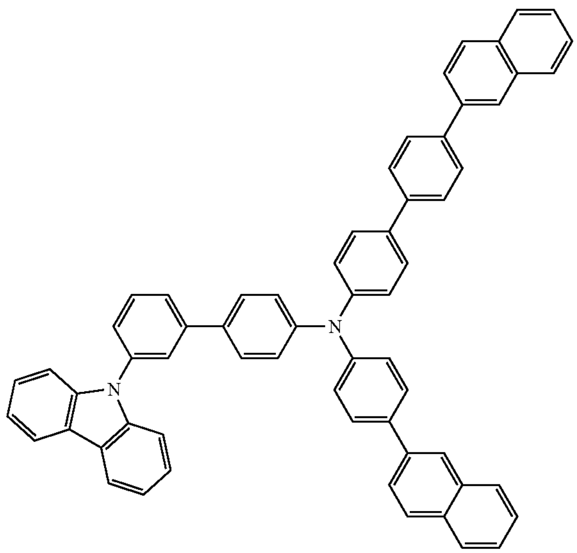
104
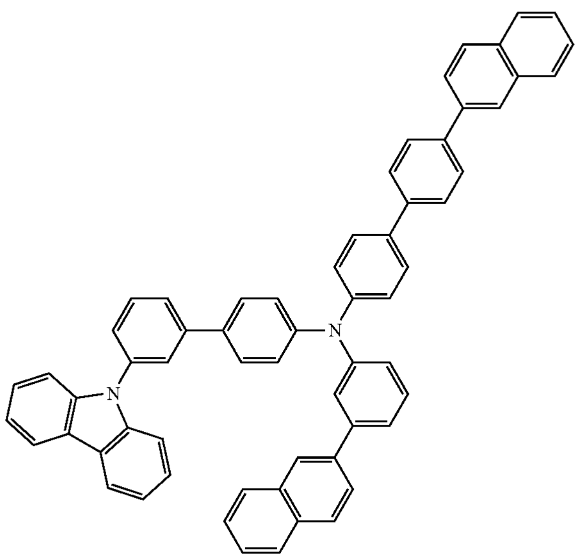
105
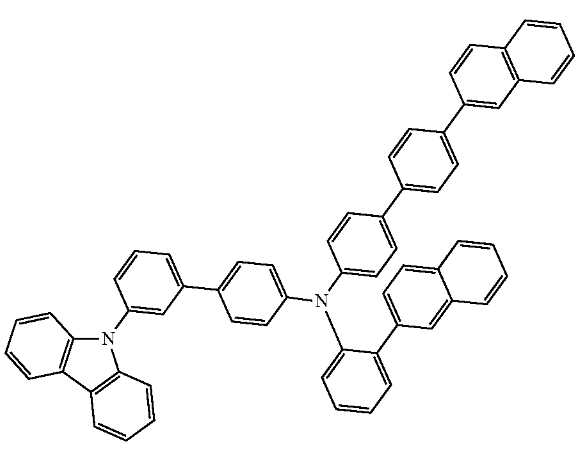
-continued
106
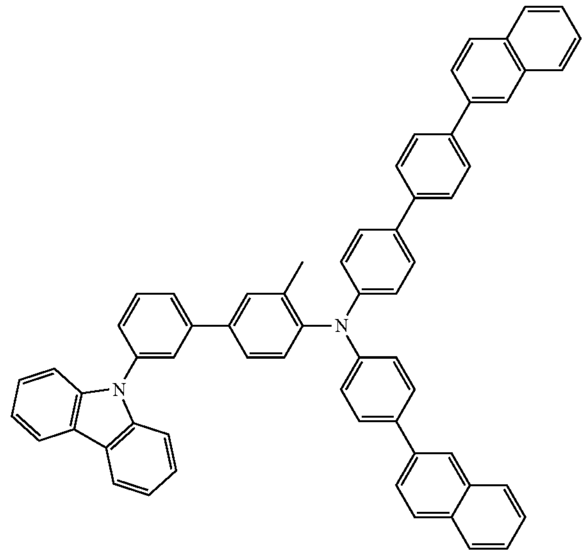
107
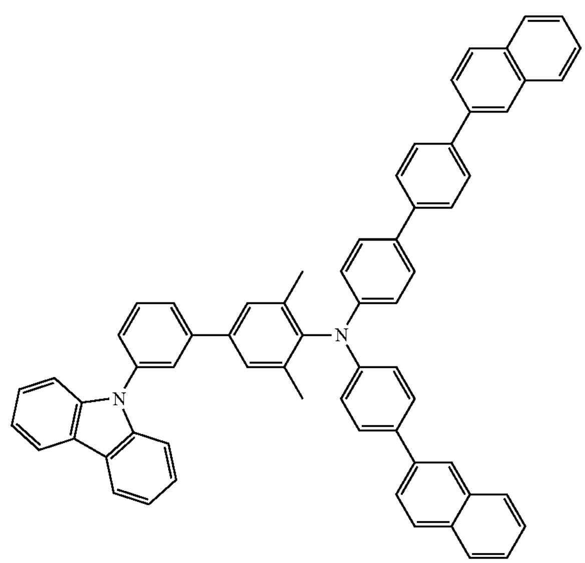

108
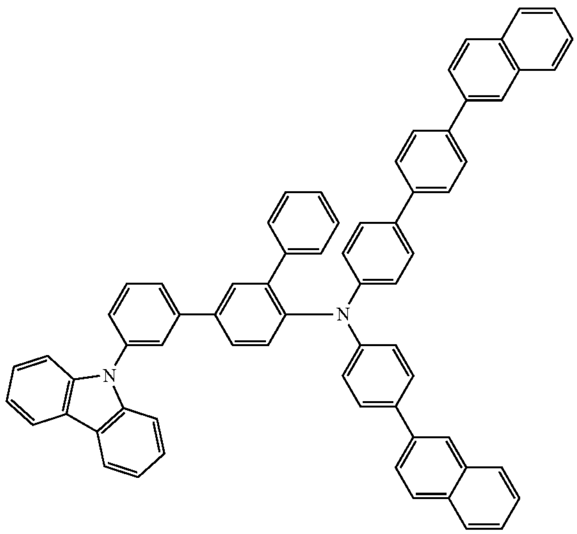
109
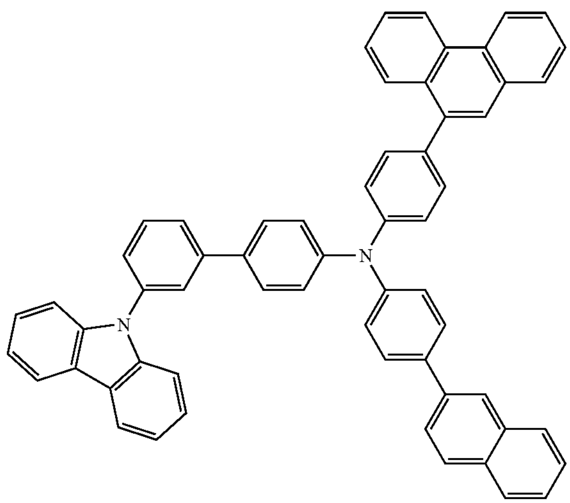
110
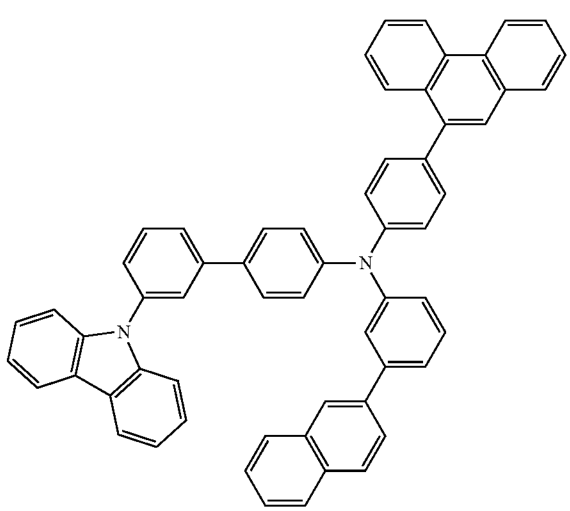
111
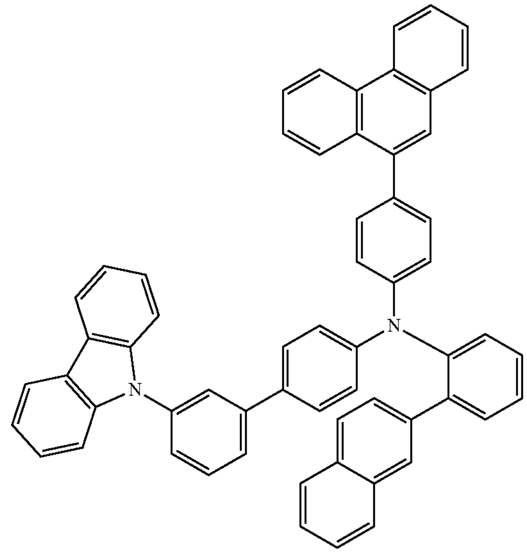
112
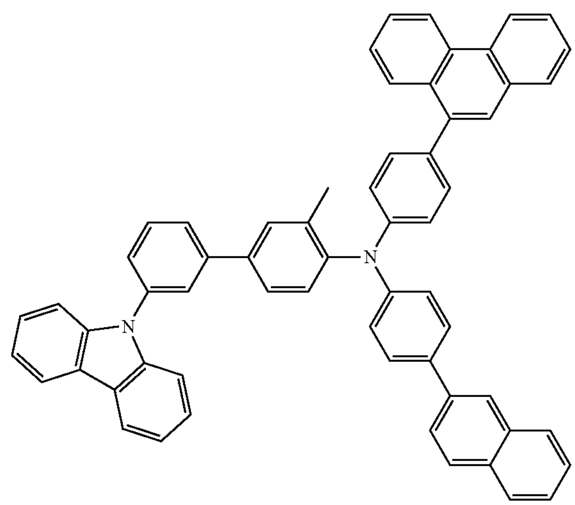
113
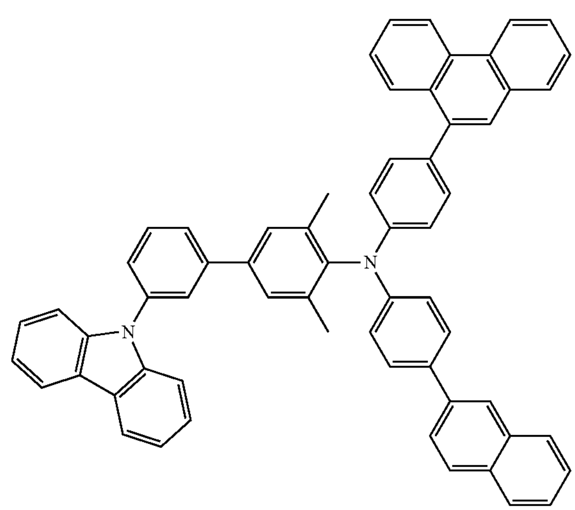

-continued
114
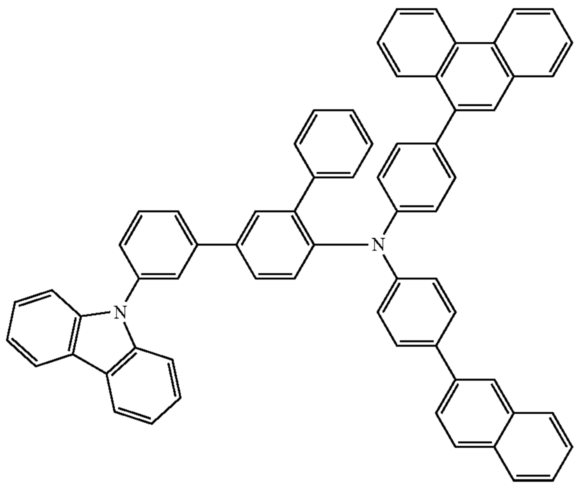
115
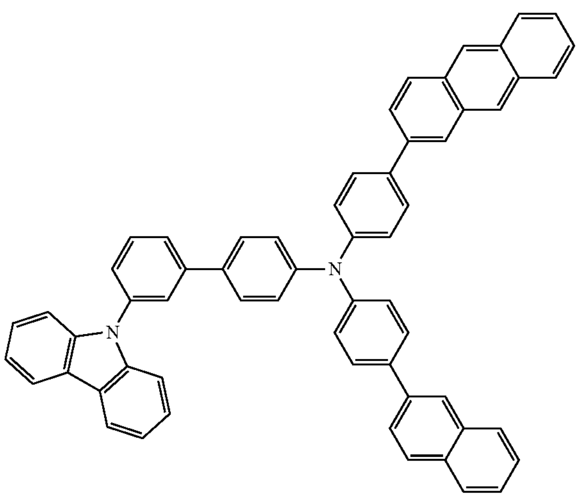
116
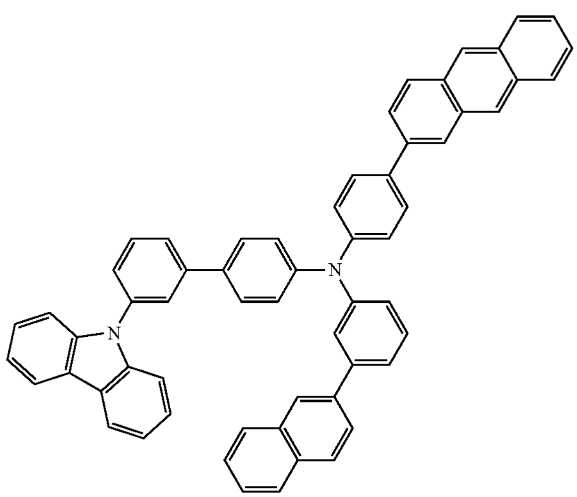
-continued
117
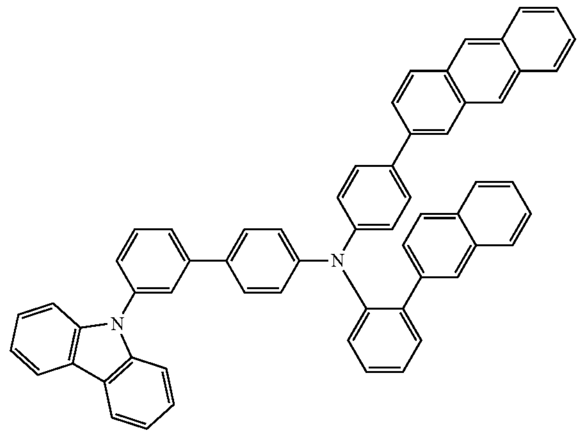
118
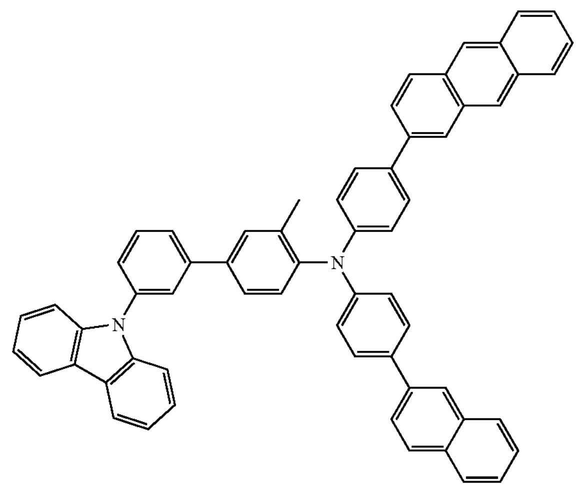
119
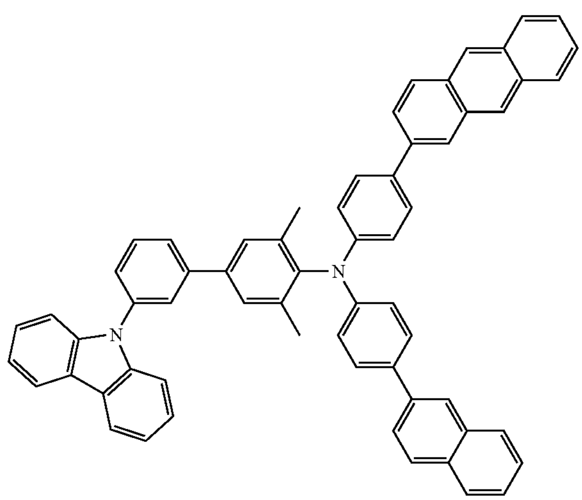

-continued
120
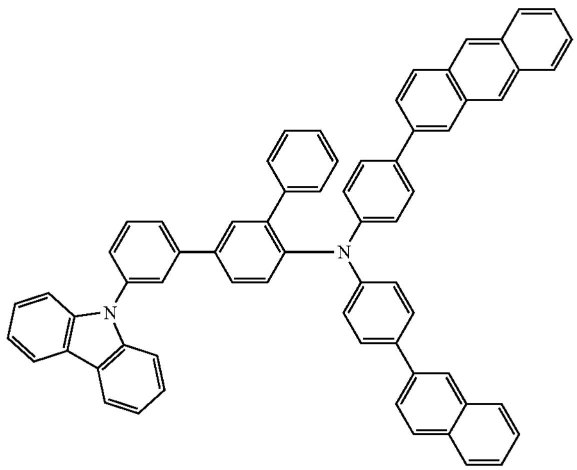
121
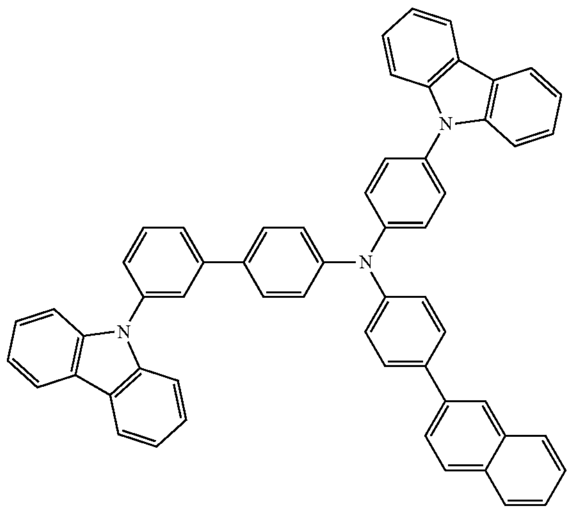
122
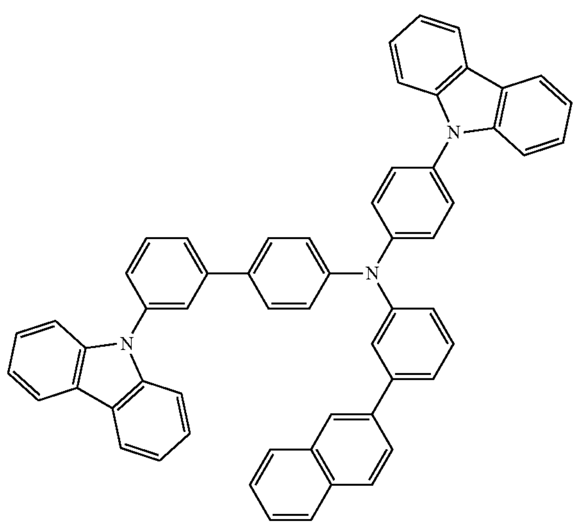
-continued
123
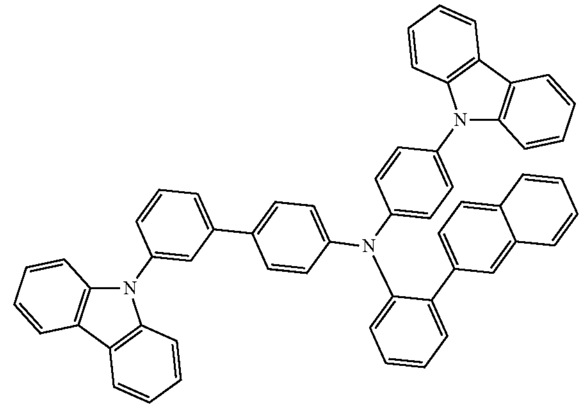
124
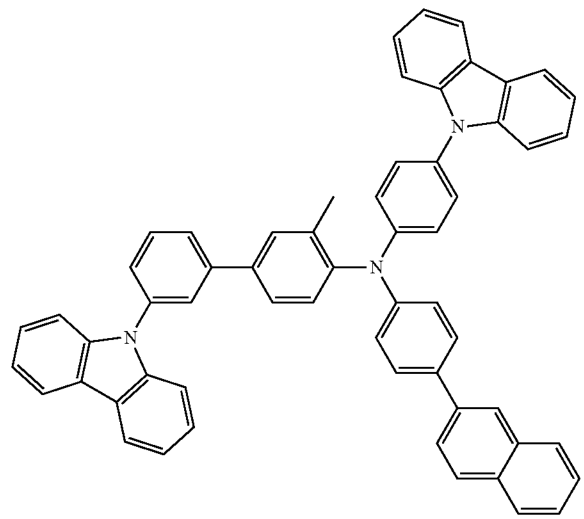
125
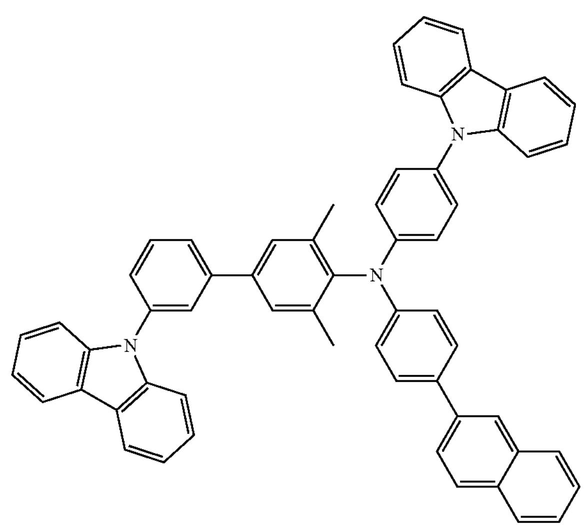

-continued
126
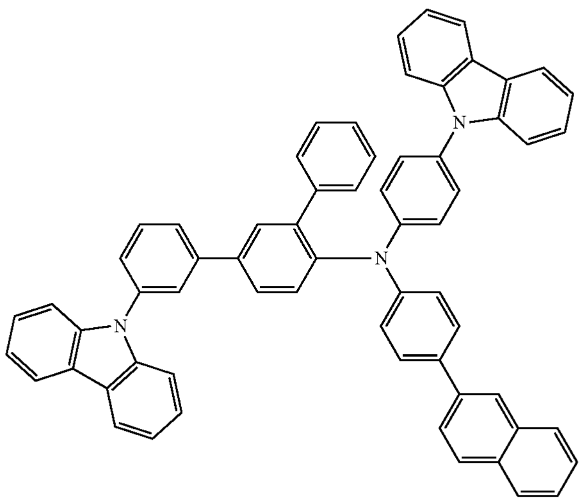
127
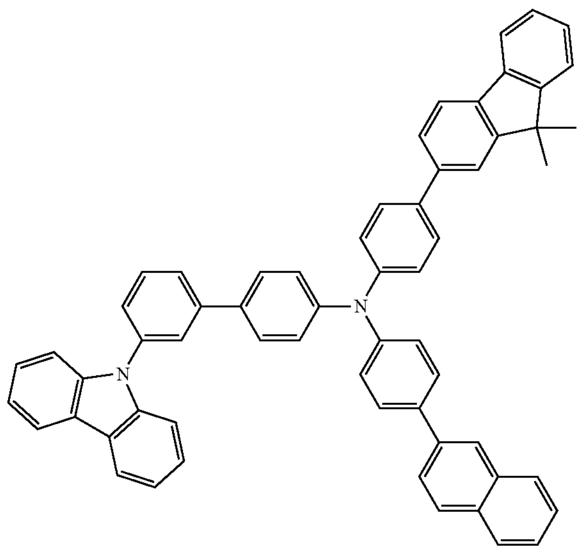
128
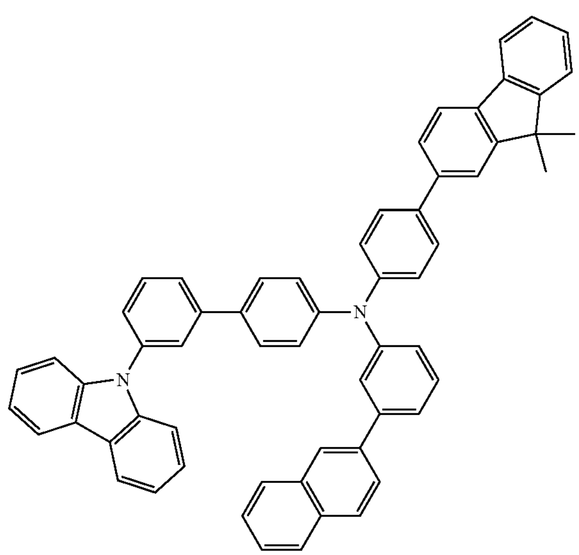
-continued
129
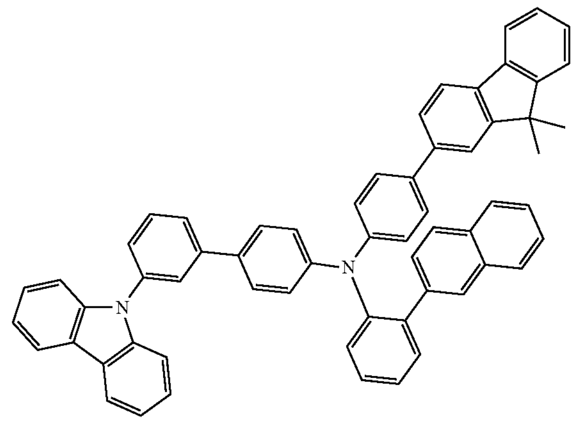
130
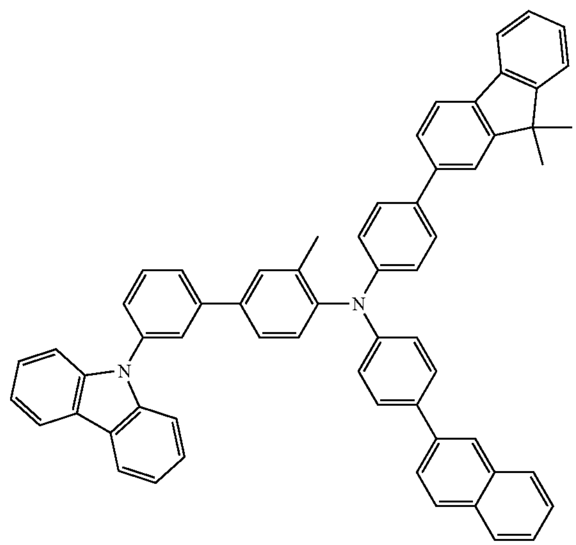
131
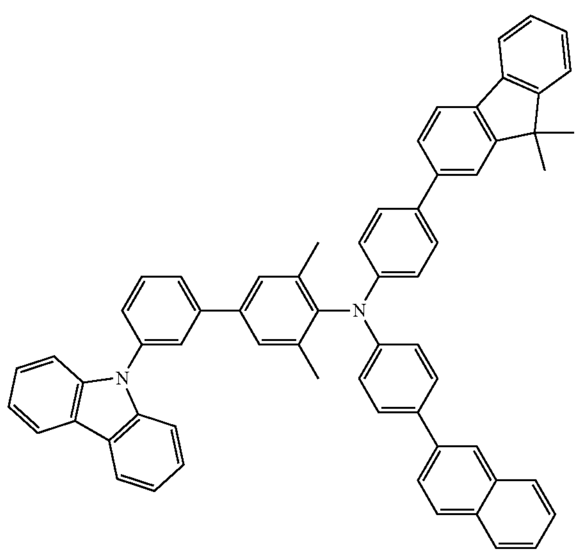

-continued
132
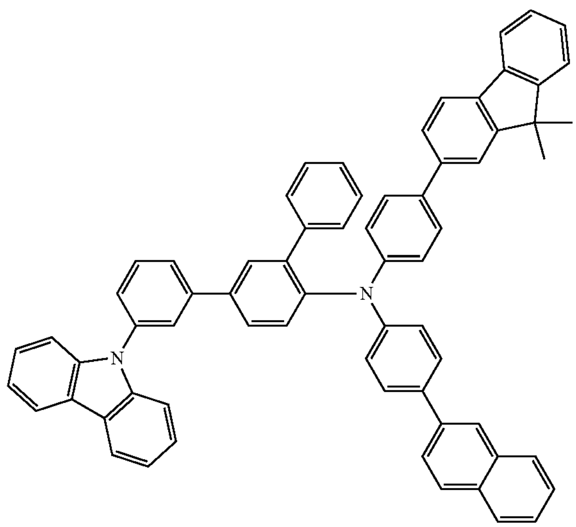
133
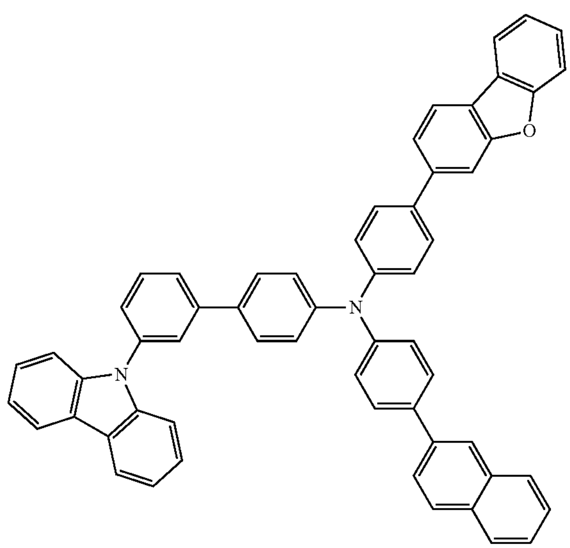
134
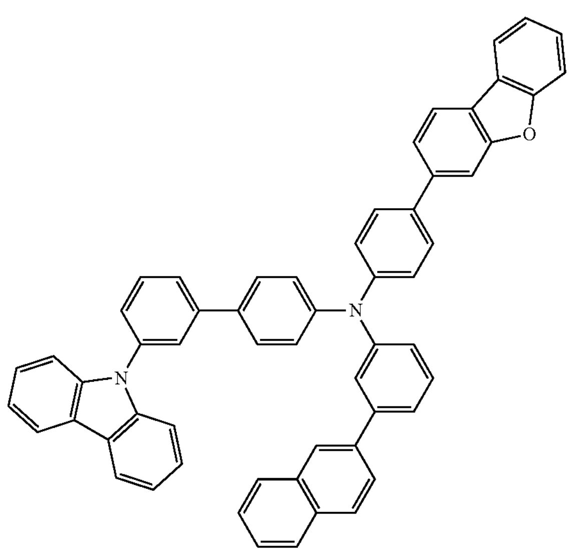
-continued
135
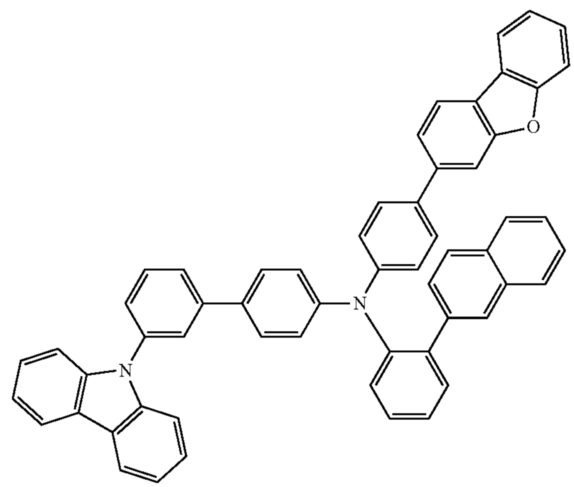
136
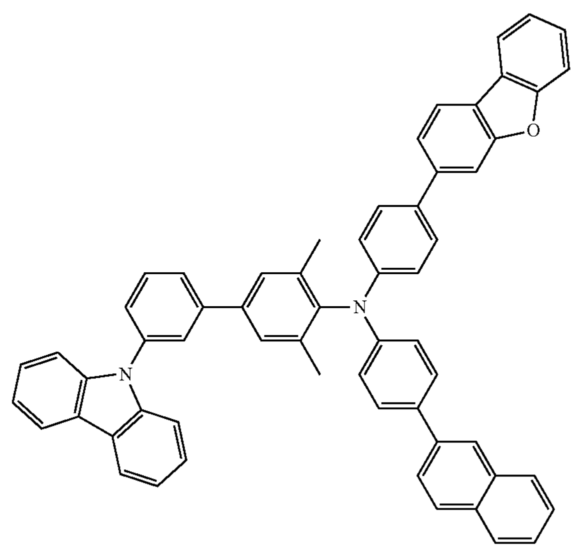
137
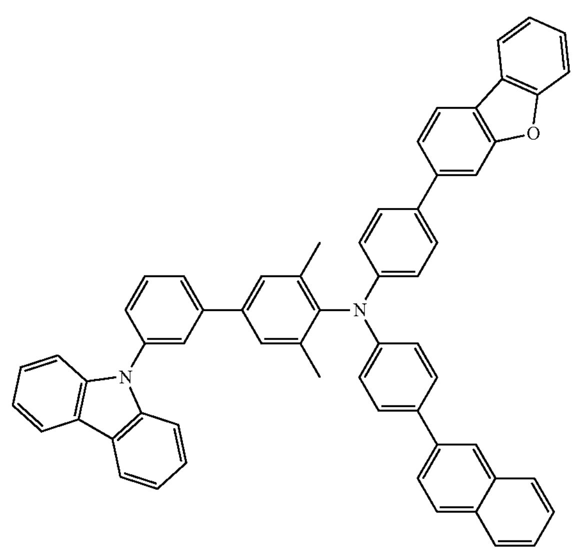

-continued
138
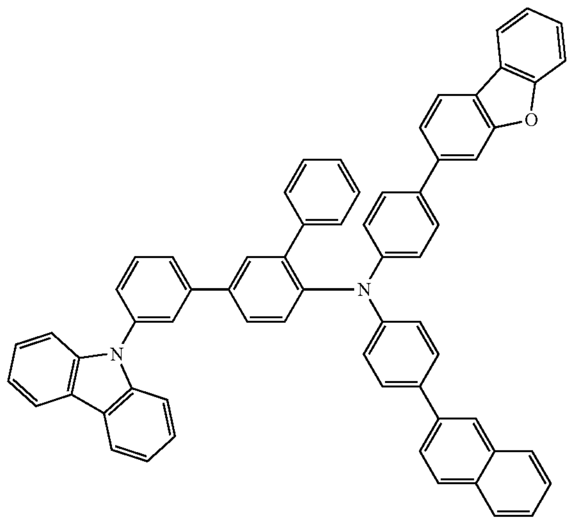
139
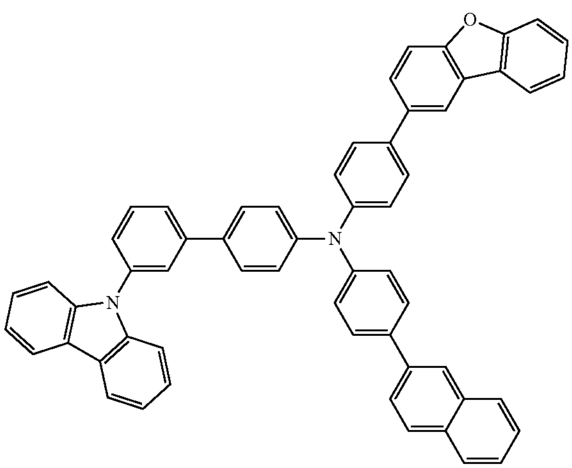
140
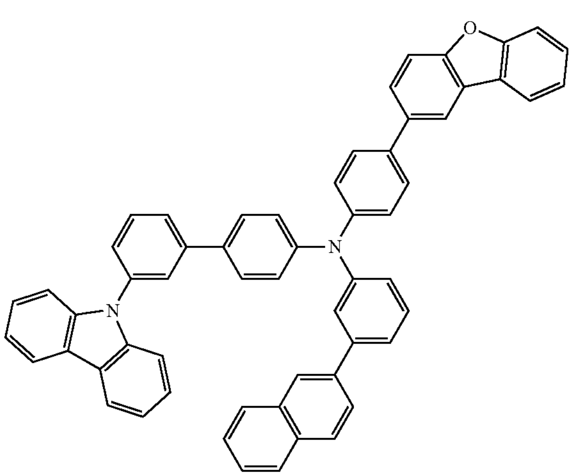
-continued
141
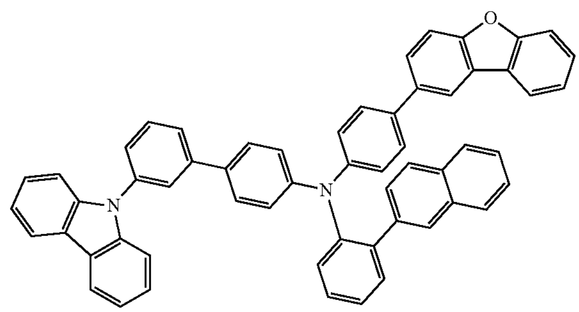
142
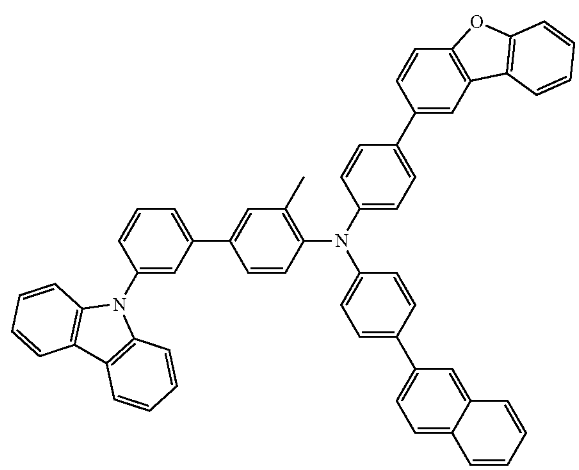
143
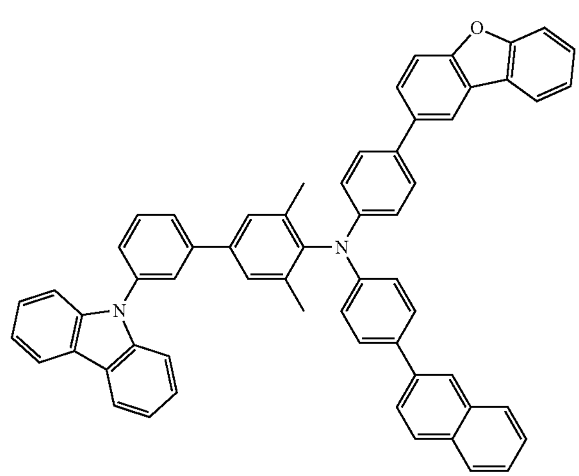

-continued
144
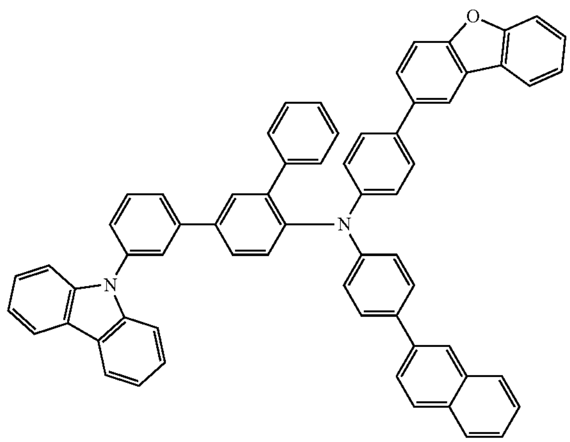
145
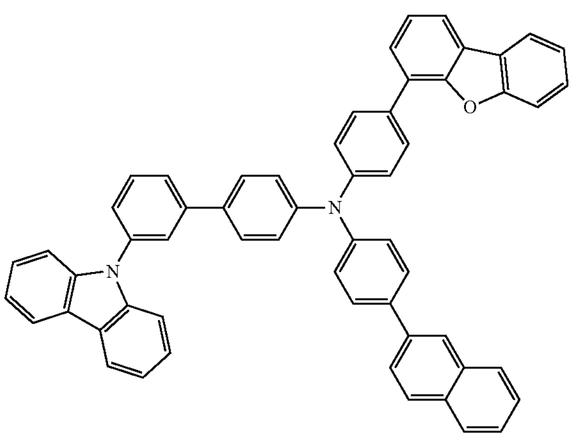
146
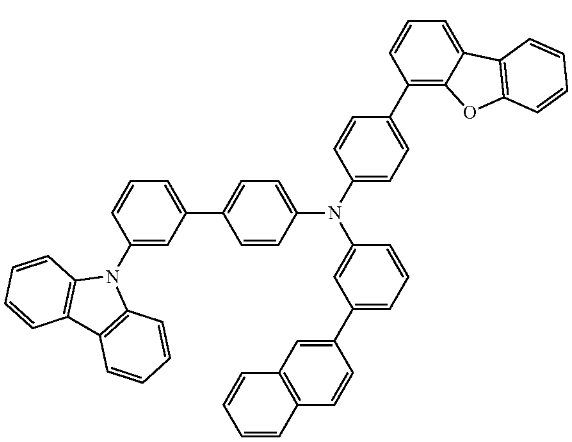
-continued
147
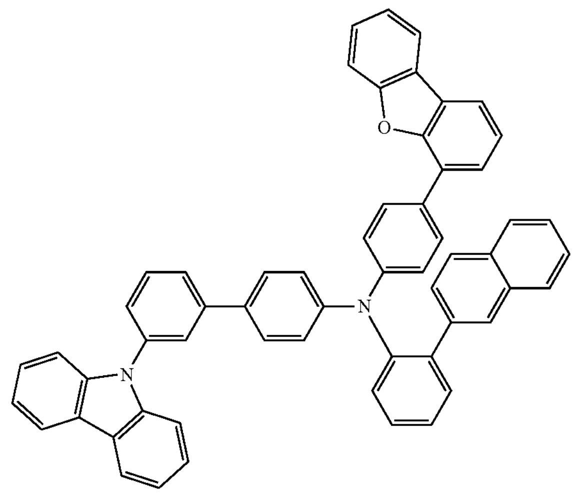
148
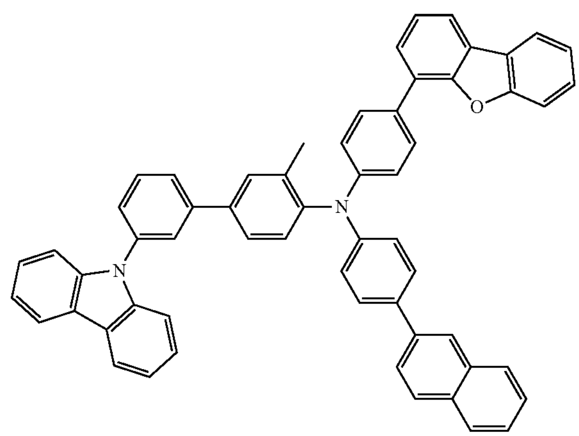
149
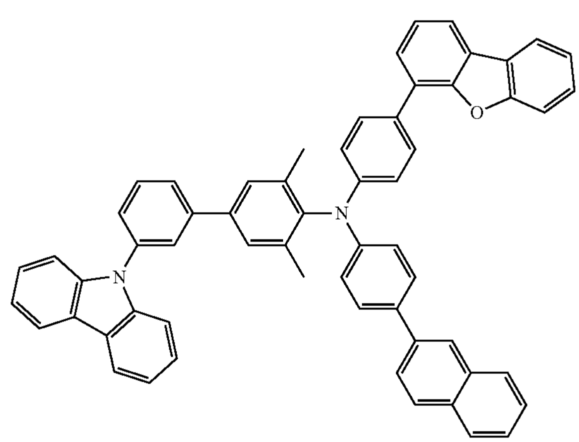

150
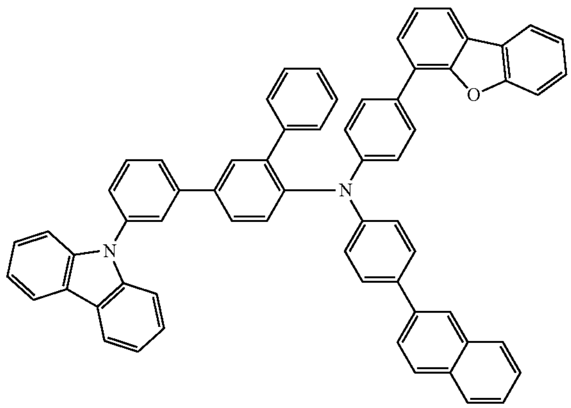
151
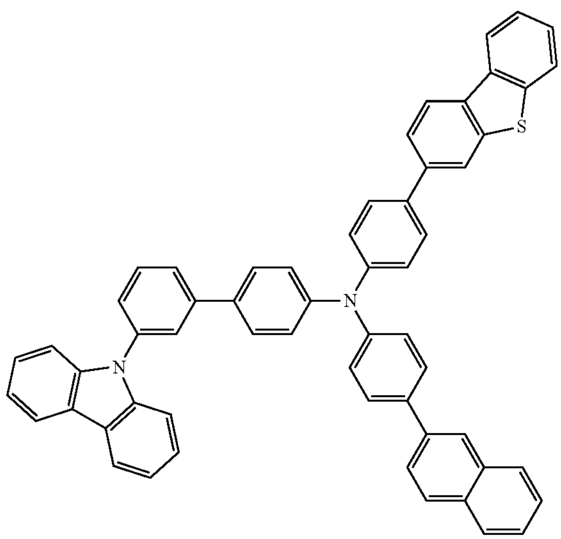
152
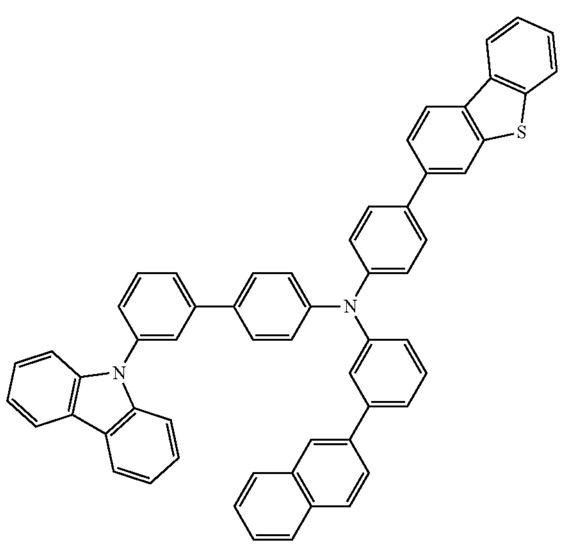
153
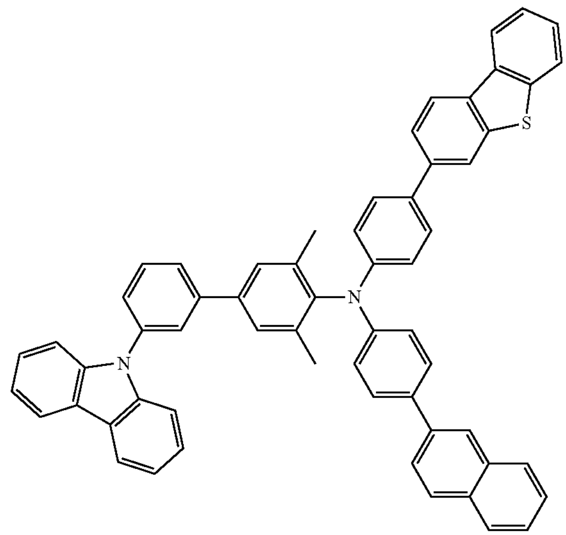
154
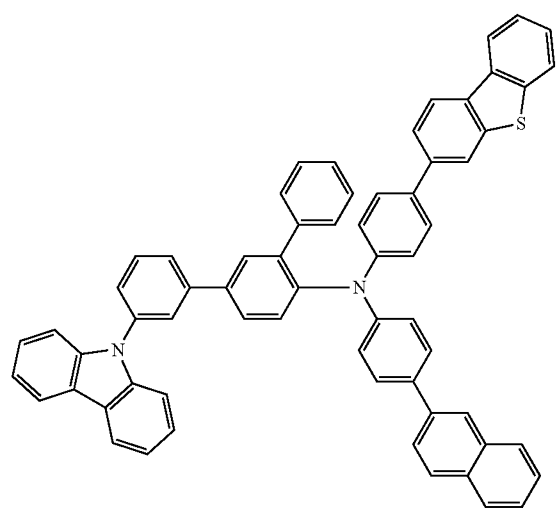
155
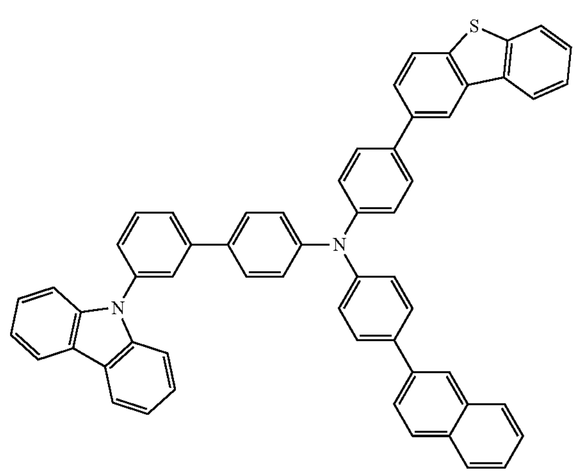

-continued
156
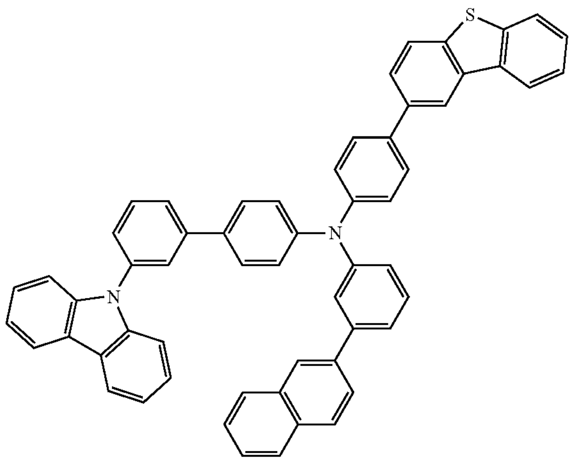
157
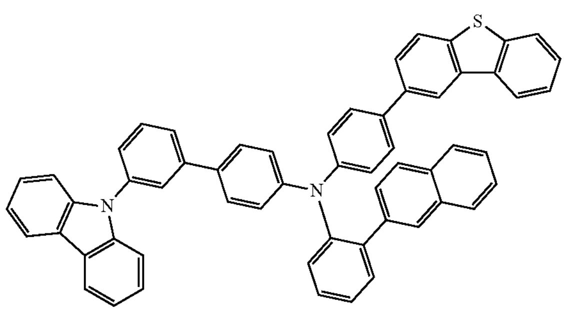
158
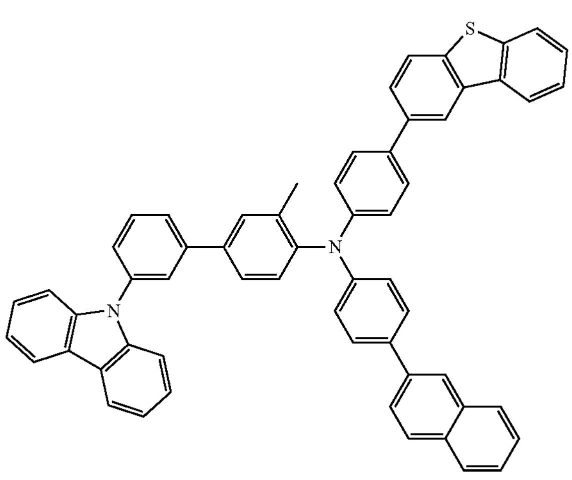
-continued
159
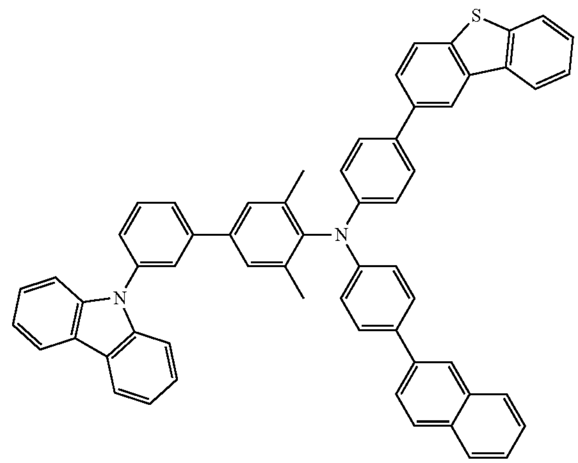
160
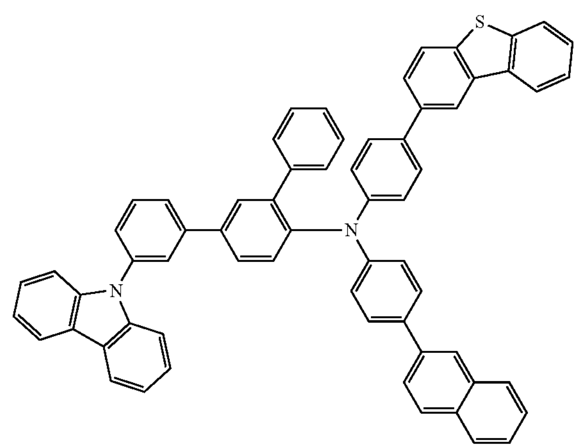
161
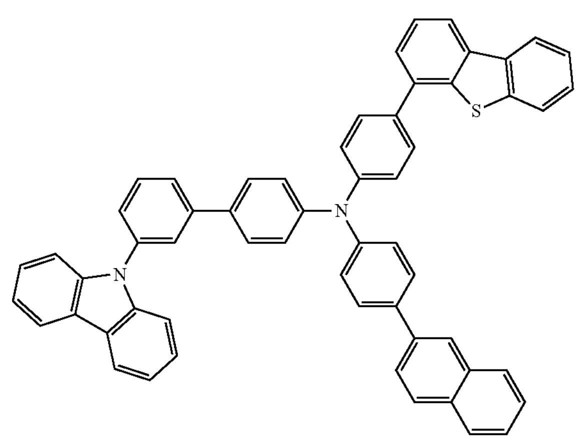

-continued

162

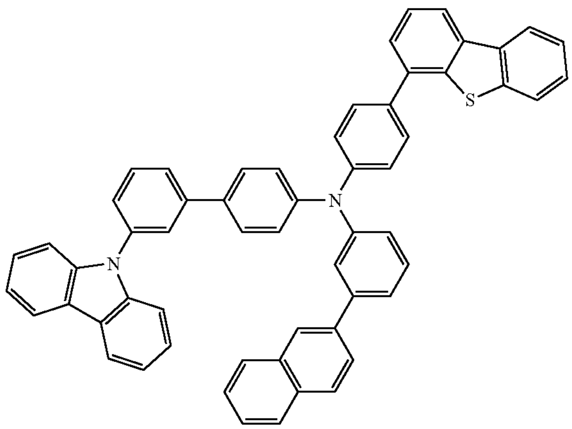

163

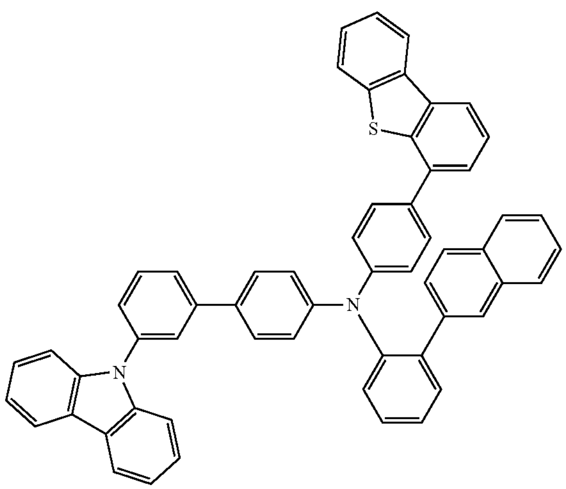

164

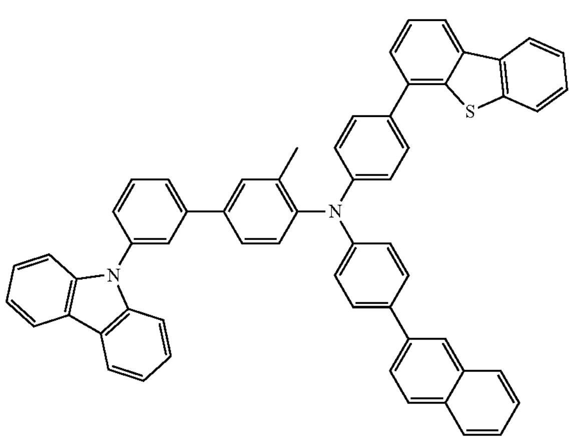

-continued

165

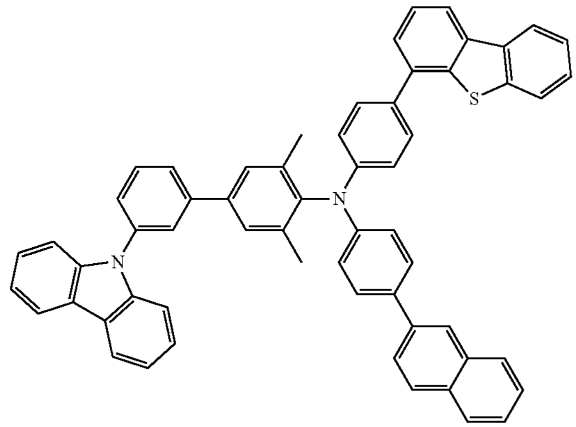

166

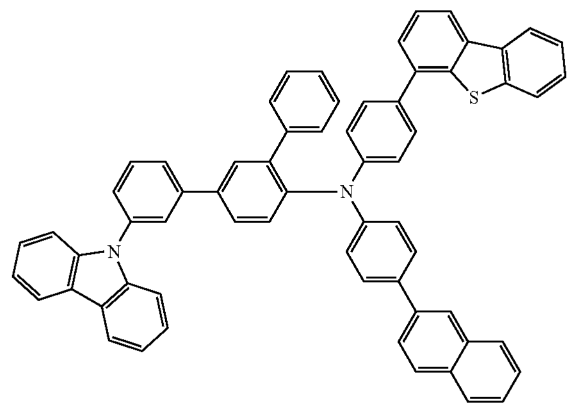

The organic electroluminescent device, as described above, contains a compound represented by Chemical Formula 1.

Specifically, the organic electroluminescent device includes a first electrode, a second electrode, and a light emitting layer formed between the first electrode and the second electrode. The organic electroluminescent device further includes an organic layer including a hole transport layer and a hole transport auxiliary layer between the first electrode and the light emitting layer. The hole transport auxiliary layer may contain a compound represented by Chemical Formula 1.

The hole transport auxiliary layer reduces accumulation of holes at an interface between the light emitting layer and the hole transport auxiliary layer due to the highest occupied molecular orbital (HOMO) energy level difference between the hole transport auxiliary layer and the light emitting layer. For this purpose, it is preferable that the HOMO energy level difference between the light emitting layer and the hole transport auxiliary layer is smaller than the HOMO energy level difference between the hole transport layer and hole transport auxiliary layer. Further, the hole transport auxiliary layer should have a higher lowest unoccupied molecular orbital (LUMO) energy level than that of the light emitting layer to minimize electrons transporting from the light emitting layer to the hole transport auxiliary layer.

For example, the compound that may be contained in the hole transport auxiliary layer is one of the follows.

Compound A

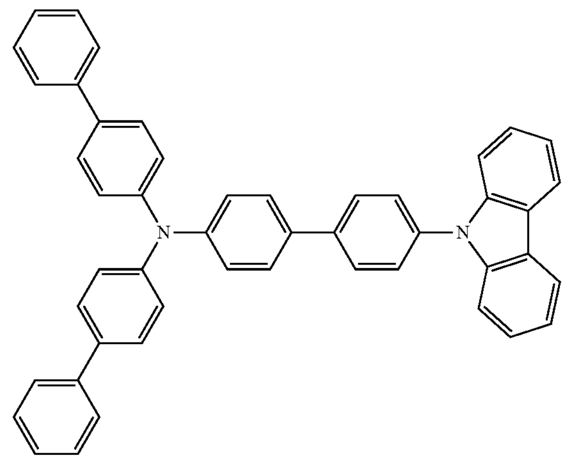

Compound B

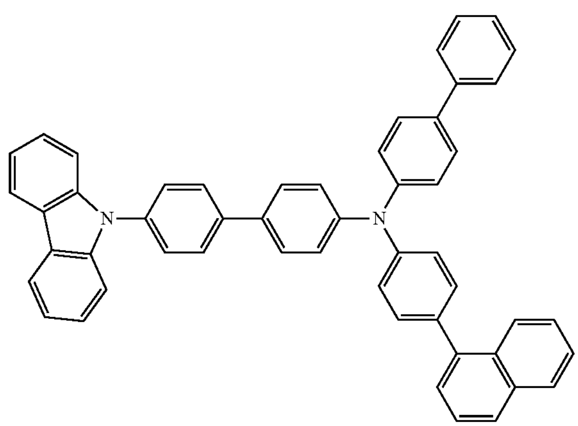

Compound C

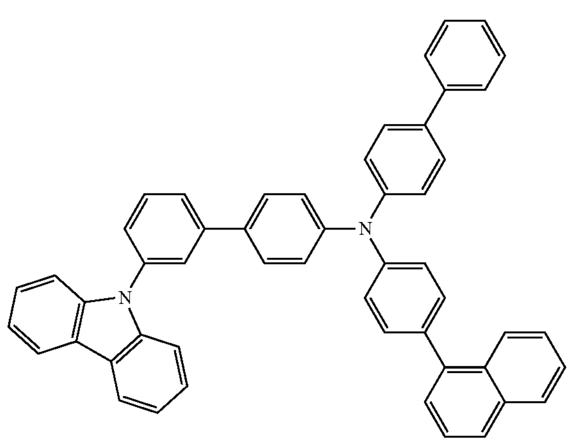

-continued

Compound D

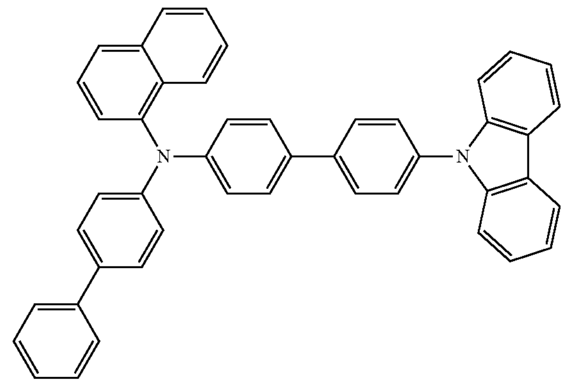

Compound 7

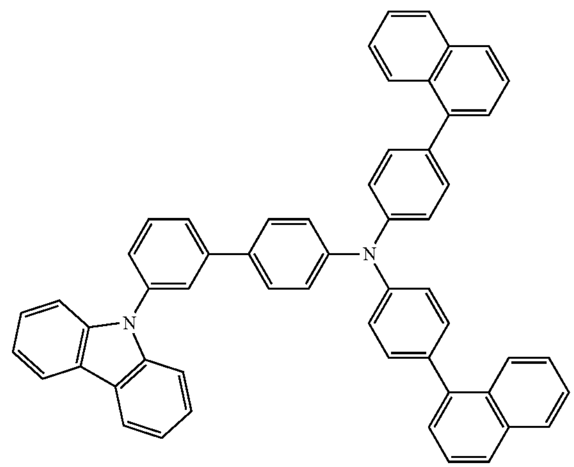

The HOMO and LUMO energy levels of the Compounds A, B, and 7 in the above Compounds are calculated and shown in Table 1 below.

TABLE 1

| | HOMO (calculation) | LUMO (calculation) |
|---|---|---|
| Compound A | −5.00 | −0.88 |
| Compound B | −5.02 | −1.14 |
| Compound 7 | −5.08 | −1.14 |

As can be seen from Table 1, Compound 7 having 9-carbazole bound to a meta position of the phenyl has a lower HOMO energy level than those of Compounds A and B having 9-carbazole bound to a para position of the phenyl. Accordingly, when Compound 7 is used as the hole transport auxiliary layer, the difference in the HOMO energy levels between the light emitting layer and the hole transport auxiliary layer is reduced. That is, Compound 7 having 9-carbazole bound to the meta position of the phenyl may reduce hole accumulation at the interface between the light emitting layer and the hole transport auxiliary layer, thereby improving efficiency and lifespan characteristics of the organic electroluminescent device.

Further, electron density distributions of HOMO and LUMO states of the above Compounds A-D and 7 are shown in Table 2 below.

TABLE 2
| | Structure | HOMO electron density distribution | LUMO electron density distribution |
|---|---|---|---|
| Compound A | 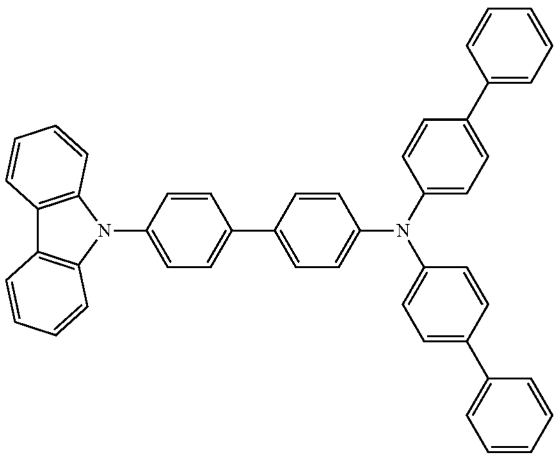 [SMILES: c1ccc(-c2ccc(N(c3ccc(-c4ccccc4)cc3)c3ccc(-c4ccc(-n5c6ccccc6c6ccccc65)cc4)cc3)cc2)cc1] | 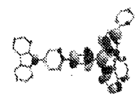 | 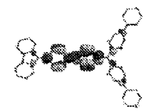 |
| Compound B | 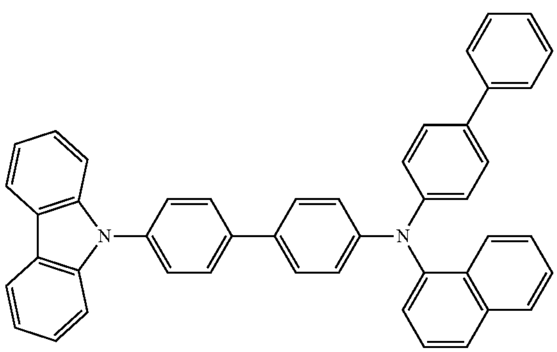 [SMILES: c1ccc(-c2ccc(N(c3ccc(-c4ccc(-n5c6ccccc6c6ccccc65)cc4)cc3)c3cccc4ccccc34)cc2)cc1] | 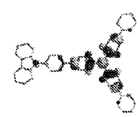 | 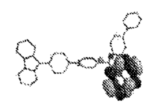 |
| Compound C | 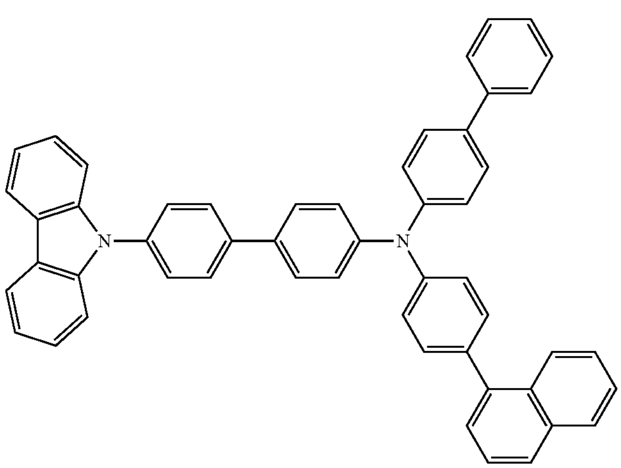 [SMILES: c1ccc(-c2ccc(N(c3ccc(-c4ccc(-n5c6ccccc6c6ccccc65)cc4)cc3)c3ccc(-c4cccc5ccccc45)cc3)cc2)cc1] | 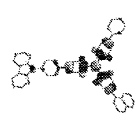 | 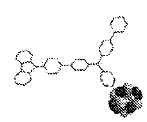 |

TABLE 2-continued

| Structure | | HOMO electron density distribution | LUMO electron density distribution |
|---|---|---|---|
| Compound D | 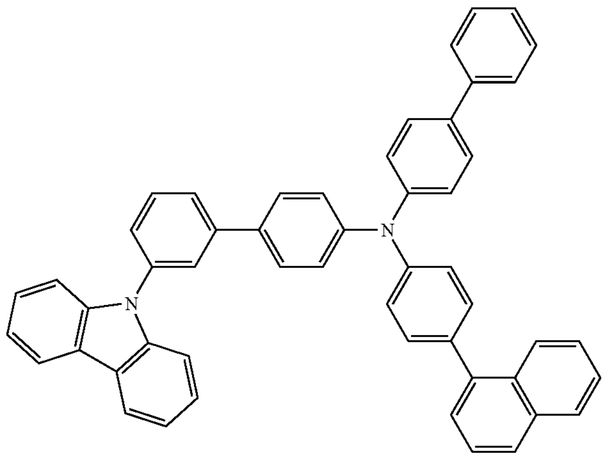 [SMILES: c1ccc(-c2ccc(N(c3ccc(-c4cccc(-n5c6ccccc6c6ccccc65)c4)cc3)c3ccc(-c4cccc5ccccc45)cc3)cc2)cc1] | 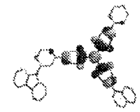 | 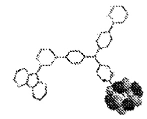 |
| Compound 7 | 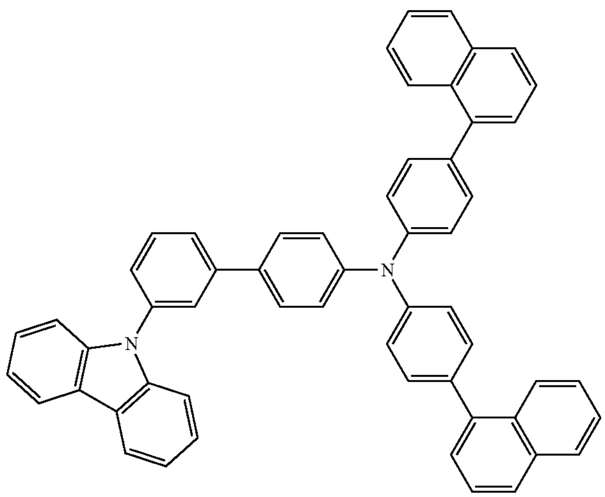 [SMILES: c1cc(-c2ccc(N(c3ccc(-c4cccc5ccccc45)cc3)c3ccc(-c4cccc5ccccc45)cc3)cc2)cc(-n2c3ccccc3c3ccccc32)c1] |  | 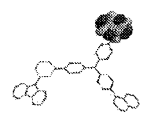 |

As can be seen from Table 2, in each of Compound A having only biphenyl bound to amine and Compound D having naphthyl directly bound to amine, the electron density positions of the HOMO state and the LUMO state overlap each other. In contrast, in each of Compounds B, C, and 7, in which naphthyl or phenanthrene is bonded to amine via a phenyl linker, the electron density of the LUMO state is distributed around naphthyl or phenanthrene (condensation compound) which is far away from amine, such that the electron density positions of the HOMO state and the LUMO state are different from each other. As a result, in Compounds B, C, and 7, electrons coming from the light emitting layer are confined around the naphthyl or phenanthrene such that the hole transport auxiliary layer has a different electron density than that of the hole transport layer, and thus has less influence on the hole transport and shows stable bonds. In this away, the life characteristics of organic electroluminescent devices can be improved.

That is, in the compound represented by Chemical Formula 1 according to the present disclosure, 9-carbazole is bonded to the meta position of the phenyl, thereby reducing hole accumulation at the interface between the light emitting layer and hole transport auxiliary layer, thereby improving efficiency and lifespan characteristics of the organic electroluminescent device.

In another implementation of the present disclosure, an organic electroluminescent device includes an anode, a cathode, and at least one organic layer between the anode and the cathode. The at least one organic layer includes a light emitting layer. The at least one organic layer further includes a first organic layer containing a compound represented by the following Chemical Formula 2, and a second organic layer containing a compound represented by the following Chemical Formula 3. The first and second organic layers are disposed between the anode and the light emitting layer.

Chemical Formula 2

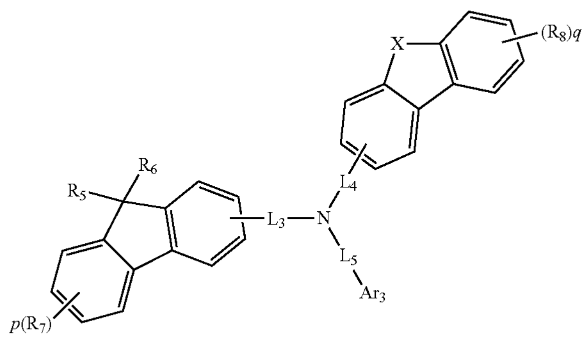

In the Chemical Formula 2, $L_3$ to $L_5$ are the same as or different from each other. Each of $L_3$ to $L_5$ independently represents one selected from the group consisting of a single bond, a substituted or unsubstituted arylene group having 6 to 30 carbon atoms, a substituted or unsubstituted heteroarylene group having 6 to 30 carbon atoms, a substituted or unsubstituted alkylene group having 1 to 10 carbon atoms, a substituted or unsubstituted cycloalkylene group having 3 to 10 carbon atoms, a substituted or unsubstituted alkenylene group having 2 to 10 carbon atoms, a substituted or unsubstituted cycloalkenylene group having 3 to 10 carbon atoms, a substituted or unsubstituted heteroalkylene group having 1 to 10 carbon atoms, a substituted or unsubstituted heterocycloalkylene group having 2 to 10 carbon atoms, a substituted or unsubstituted heteroalkenylene group having 2 to 10 carbon atoms, and a substituted or unsubstituted heterocycloalkenylene group having 2 to 10 carbon atoms.

X represents O, S or $CR_9R_{10}$.

$R_5$ to $R_{10}$ are the same as or different from each other. Each of $R_5$ to $R_{10}$ independently represents one selected from the group consisting of hydrogen, deuterium, a cyano group, a nitro group, a halogen group, a hydroxy group, a substituted or unsubstituted alkyl group having 1 to 30 carbon atoms, a substituted or unsubstituted cycloalkyl group having 3 to 30 carbon atoms, a substituted or unsubstituted alkenyl group having 2 to 30 carbon atoms, a substituted or unsubstituted cycloalkenyl group having 3 to 30 carbon atoms, a substituted or unsubstituted alkynyl group having 2 to 24 carbon atoms, a substituted or unsubstituted heteroalkyl group having 2 to 30 carbon atoms, a substituted or unsubstituted aralkyl group having 7 to 30 carbon atoms, a substituted or unsubstituted aryl group having 6 to 30 carbon atoms, a substituted or unsubstituted heteroaryl group having 2 to 30 carbon atoms, a substituted or unsubstituted heteroaralkyl group having 3 to 30 carbon atoms, a substituted or unsubstituted alkyl silyl group having 1 to 20 carbon atoms, a substituted or unsubstituted alkoxy silyl group having 1 to 20 carbon atoms, a substituted or unsubstituted cycloalkyl silyl group having 3 to 30 carbon atoms, and a substituted or unsubstituted aryl silyl group having 5 to 30 carbon atoms.

Each of $R_5$ to $R_{10}$ may be linked to a substituent adjacent thereto to form an alicyclic or aromatic, monocyclic or polycyclic, saturated or unsaturated ring. The formed alicyclic or aromatic, monocyclic or polycyclic, saturated or unsaturated ring may or may not include at least one heteroatom selected from the group consisting of N, O, S and Si in addition to a carbon atom.

$Ar_3$ represents one selected from the group consisting of a substituted or unsubstituted aryl having 3 to 30 carbon atoms, a substituted or unsubstituted heteroaryl having 5 to 30 carbon atoms, a substituted or unsubstituted aralkyl group having 7 to 30 carbon atoms, a substituted or unsubstituted heteroaralkyl group having 3 to 30 carbon atoms, and a substituted or unsubstituted aryl amino group.

Each of p and q independently denotes an integer of 0 to 4. When p is 2 to 4, each of a plurality of $R_7$ is independently defined as described above, and the plurality of $R_7$ is the same as or different from each other. When q is 2 to 4, each of a plurality of $R_8$ is independently defined as described above and the plurality of $R_8$ is the same as or different from each other.

Chemical Formula 3

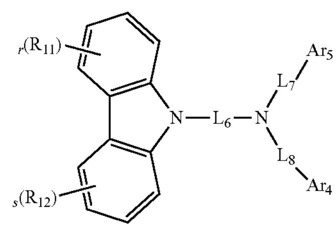

In the Chemical Formula 3, $R_{11}$ and $R_{12}$ are the same as or different from each other. Each of $R_{11}$ and $R_{12}$ independently represents one selected from the group consisting of hydrogen, deuterium, a cyano group, a nitro group, a halogen group, a hydroxy group, a substituted or unsubstituted alkyl group having 1 to 30 carbon atoms, a substituted or unsubstituted cycloalkyl group having 3 to 30 carbon atoms, a substituted or unsubstituted alkenyl group having 2 to 30 carbon atoms, a substituted or unsubstituted cycloalkenyl group having 3 to 30 carbon atoms, a substituted or unsubstituted alkynyl group having 2 to 24 carbon atoms, a substituted or unsubstituted heteroalkyl group having 2 to 30 carbon atoms, a substituted or unsubstituted aralkyl group having 7 to 30 carbon atoms, a substituted or unsubstituted aryl group having 6 to 30 carbon atoms, a substituted or unsubstituted heteroaryl group having 2 to 30 carbon atoms, a substituted or unsubstituted heteroaralkyl group having 3 to 30 carbon atoms, a substituted or unsubstituted alkyl silyl group having 1 to 20 carbon atoms, a substituted or unsubstituted alkoxy silyl group having 1 to 20 carbon atoms, a substituted or unsubstituted cycloalkyl silyl group having 3 to 30 carbon atoms, and a substituted or unsubstituted aryl silyl group having 5 to 30 carbon atoms.

Each of $R_{11}$ and $R_{12}$ may be linked to a substituent adjacent thereto to form an alicyclic or aromatic, monocyclic or polycyclic, saturated or unsaturated ring. The formed alicyclic or aromatic, monocyclic or polycyclic, saturated or unsaturated ring may or may not include at least one heteroatom selected from the group consisting of N, O, S and Si in addition to a carbon atom.

Each of r and s independently denotes an integer of 0 to 4. When r is 2 to 4, each of a plurality of $R_{11}$ is independently defined as described above, and the plurality of $R_{11}$ are the same as or different from each other. When s is 2 to 4, each of a plurality of $R_{12}$ is independently defined as described above and the plurality of $R_{12}$ are the same as or different from each other.

$L_6$ represents one selected from the group consisting of a substituted or unsubstituted arylene group having 6 to 30 carbon atoms, a substituted or unsubstituted heteroarylene group having 6 to 30 carbon atoms, a substituted or unsubstituted alkylene group having 1 to 10 carbon atoms, a substituted or unsubstituted cycloalkylene group having 3 to 10 carbon atoms, a substituted or unsubstituted alkenylene group having 2 to 10 carbon atoms, a substituted or unsubstituted cycloalkenylene group having 3 to 10 carbon atoms, a substituted or unsubstituted heteroalkylene group having 1 to 10 carbon atoms, a substituted or unsubstituted heterocycloalkylene group having 2 to 10 carbon atoms, a substituted or unsubstituted heteroalkenylene group having 2 to 10 carbon atoms, and a substituted or unsubstituted heterocycloalkenylene group having 2 to 10 carbon atoms.

$L_7$ and $L_8$ are the same as or different from each other. Each of $L_7$ and $L_8$ independently represents one selected from the group consisting of a single bond, a substituted or unsubstituted arylene group having 6 to 30 carbon atoms, a substituted or unsubstituted heteroarylene group having 6 to 30 carbon atoms, a substituted or unsubstituted alkylene group having 1 to 10 carbon atoms, a substituted or unsubstituted cycloalkylene group having 3 to 10 carbon atoms, a substituted or unsubstituted alkenylene group having 2 to 10 carbon atoms, a substituted or unsubstituted cycloalkenylene group having 3 to 10 carbon atoms, a substituted or unsubstituted heteroalkylene group having 1 to 10 carbon atoms, a substituted or unsubstituted heterocycloalkylene group having 2 to 10 carbon atoms, a substituted or unsubstituted heteroalkenylene group having 2 to 10 carbon atoms, and a substituted or unsubstituted heterocycloalkenylene group having 2 to 10 carbon atoms.

$Ar_4$ and $Ar_5$ are the same as or different from each other. Each of $Ar_4$ and $Ar_5$ independently represents one selected from the group consisting of a substituted or unsubstituted aryl having 3 to 30 carbon atoms, a substituted or unsubstituted heteroaryl having 5 to 30 carbon atoms, a substituted or unsubstituted aralkyl group having 7 to 30 carbon atoms, a substituted or unsubstituted heteroaralkyl group having 3 to 30 carbon atoms, and a substituted or unsubstituted aryl amino group. Preferably, at least one of $Ar_4$ and $Ar_5$ may represent a substituted or unsubstituted aryl group having 7 to 20 carbon atoms, or a substituted or unsubstituted heteroaryl group having 7 to 20 carbon atoms. More preferably, at least one of $Ar_4$ and $Ar_5$ may represent a substituted or unsubstituted condensed aryl group having 7 to 20 carbon atoms, or a substituted or unsubstituted condensed heteroaryl group having 7 to 20 carbon atoms. When the hole transport material has a high molecular weight, the organic compound is likely to be thermally decomposed due to a high sublimation temperature during the deposition process. Thus, introducing an aryl or hetero aryl group having 20 or smaller carbon atoms to the hole transport or hole transport auxiliary material may allow the hole transport or hole transport auxiliary material to have an appropriate molecular weight range, thereby reducing the thermal decomposition of the organic compound due to the high sublimation temperature during the deposition process and thus improving the thermal stability of the hole transport or hole transport auxiliary material.

Specifically, the compound represented by Chemical Formula 2 may be represented by one of the following compounds. However, the present disclosure is not limited thereto.

2-1

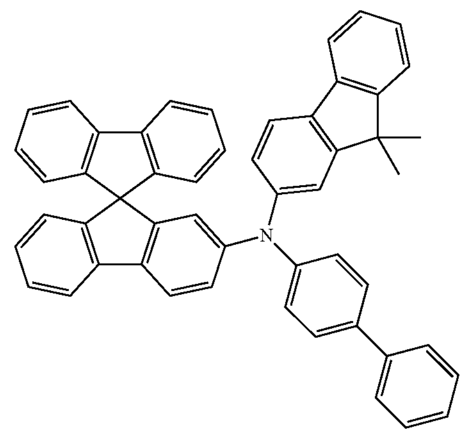

2-2

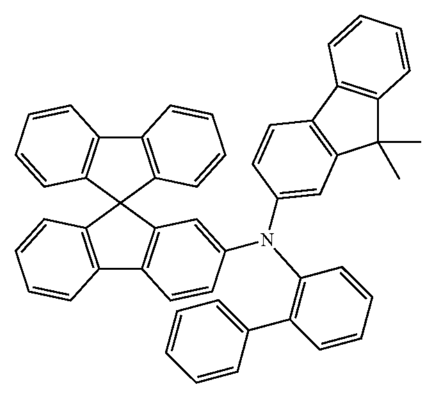

2-3

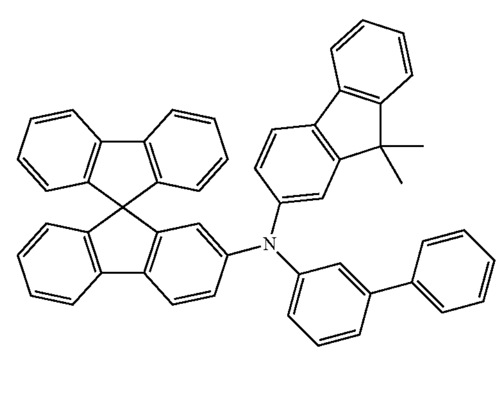

-continued
2-4
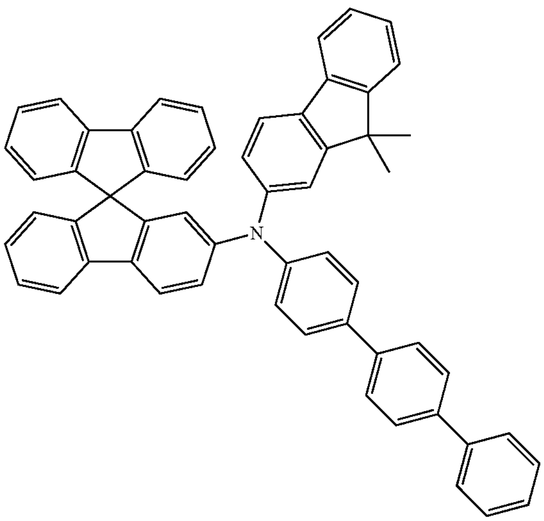
2-5
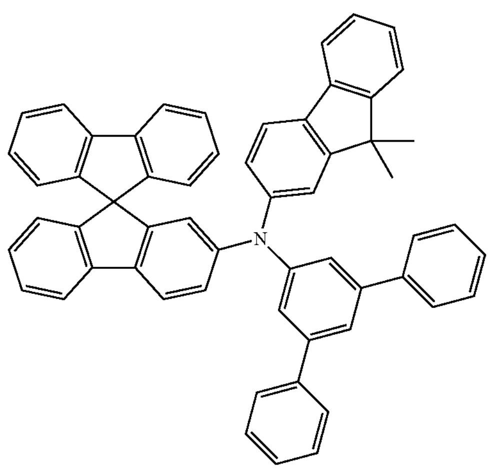
2-6
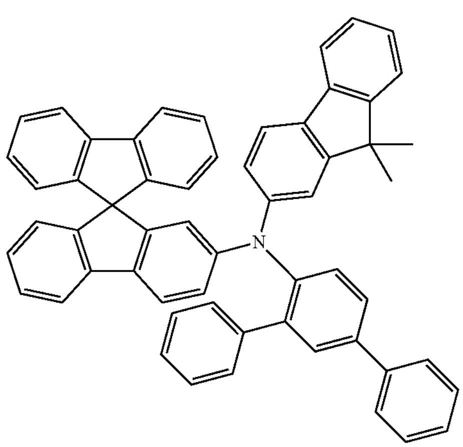
-continued
2-7
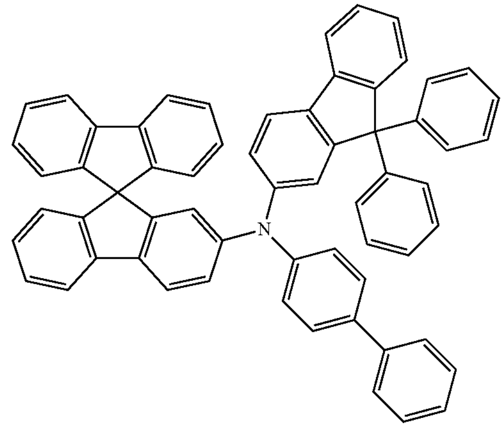
2-8
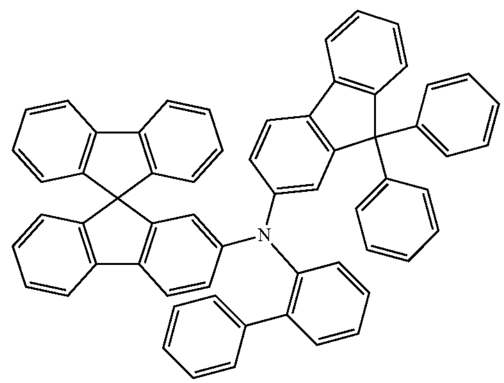
2-9
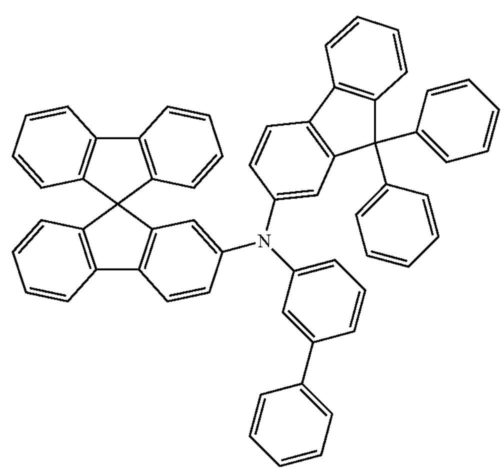

-continued
2-10
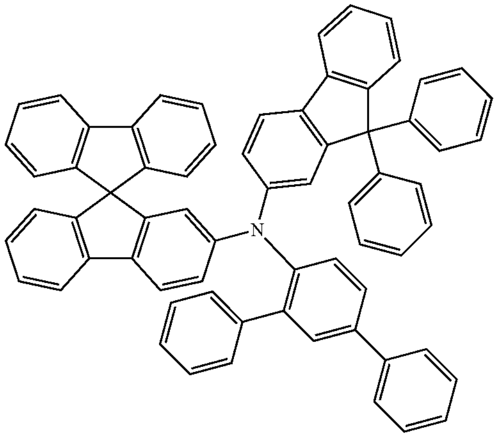
2-11
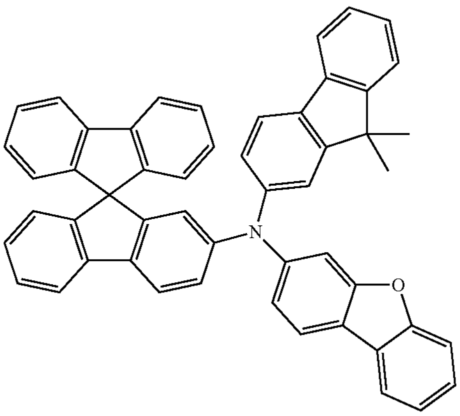
2-12
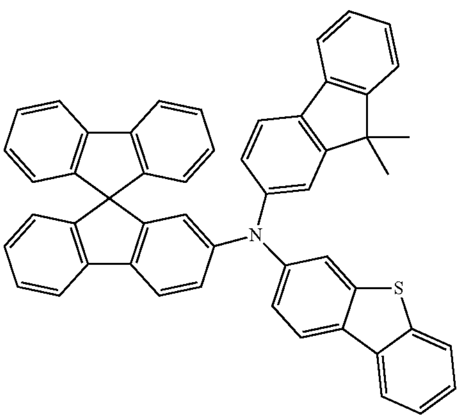
2-13
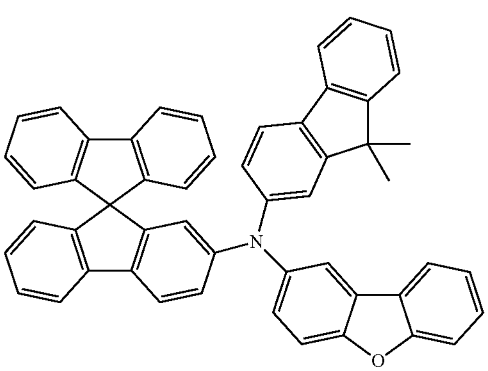
-continued
2-14
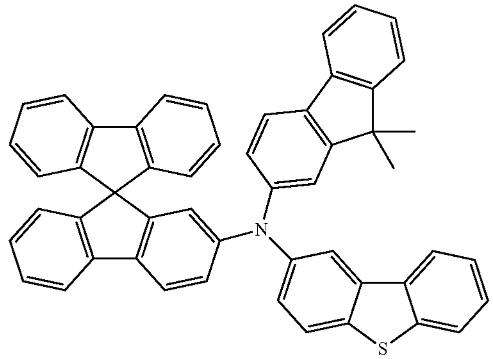
2-15
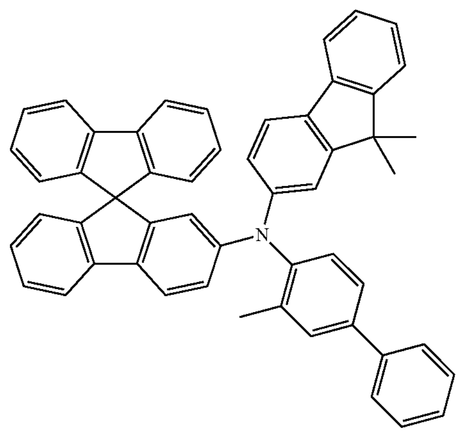
2-16
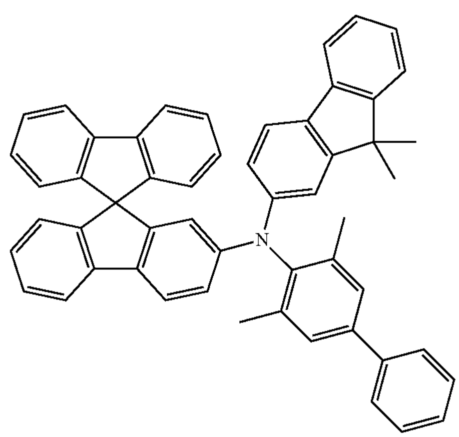

2-17
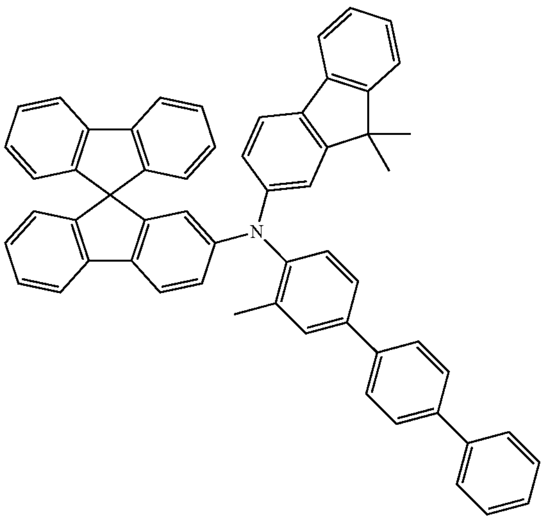
2-18
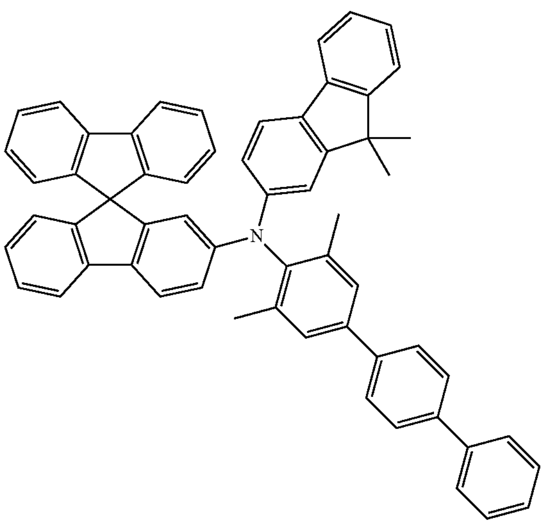
2-19
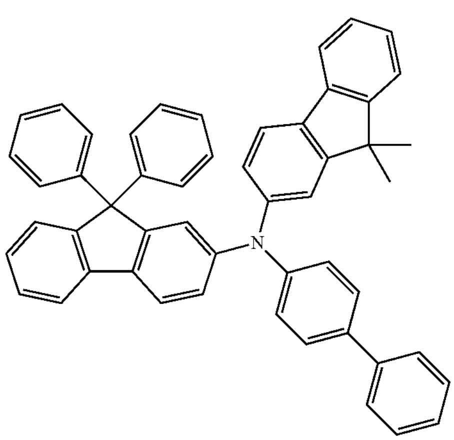
2-20
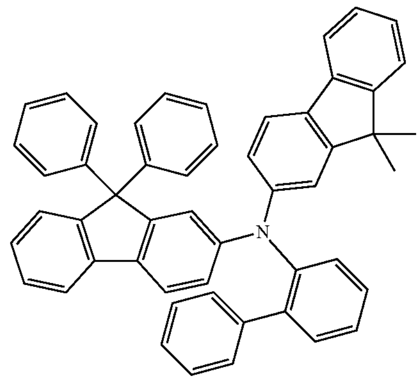
2-21
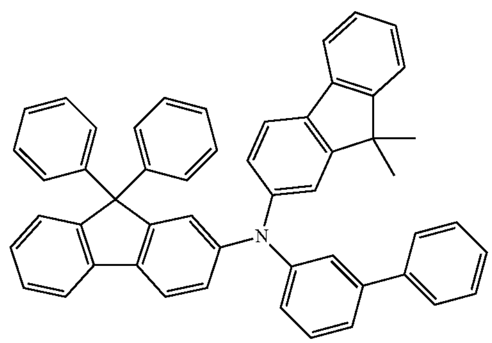
2-22
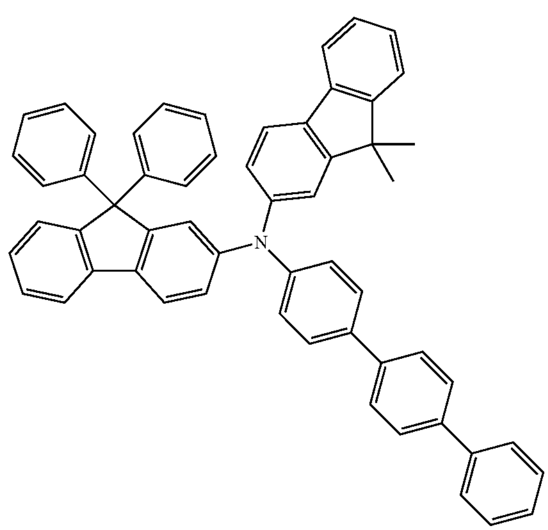

-continued
2-23
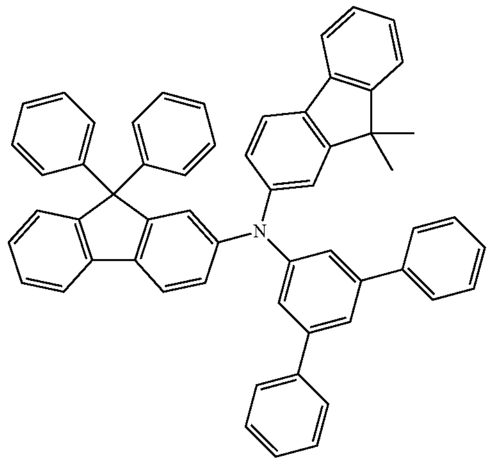
2-24
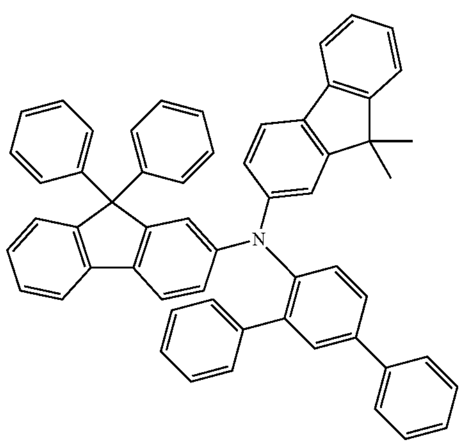
2-25
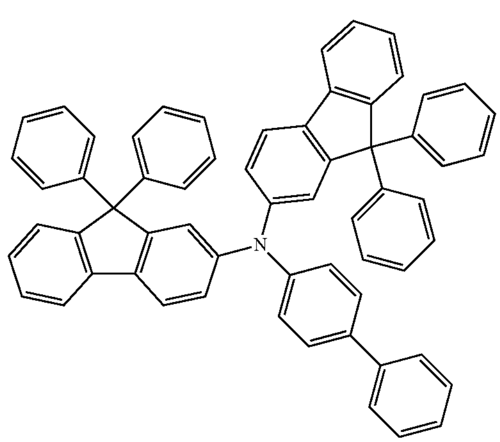
-continued
2-26
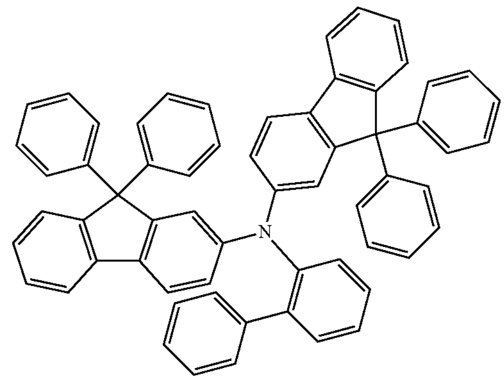
2-27
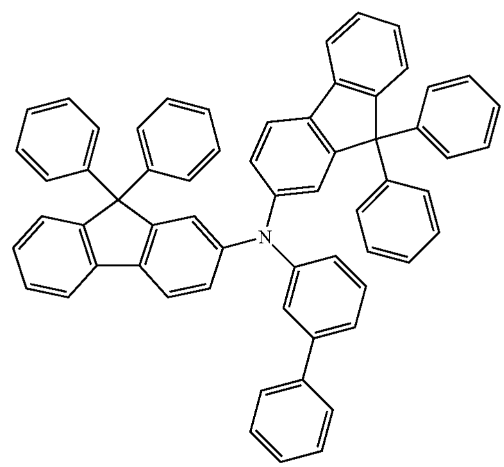
2-28
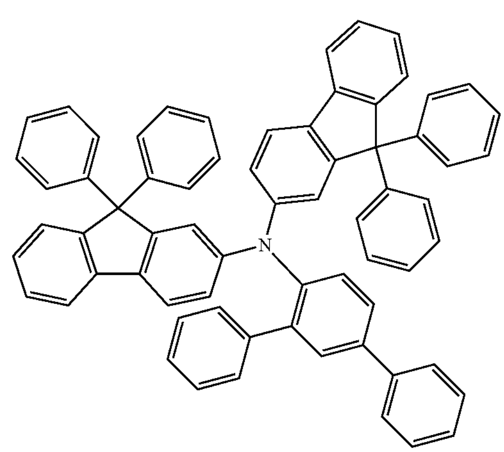

-continued
2-29
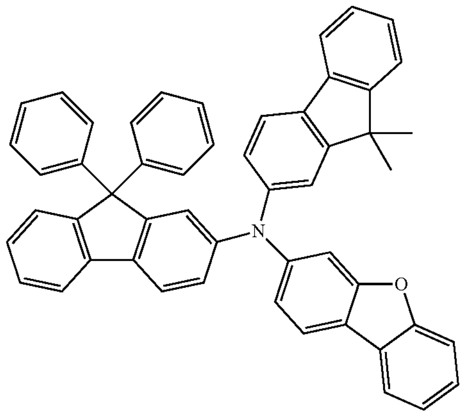
2-30
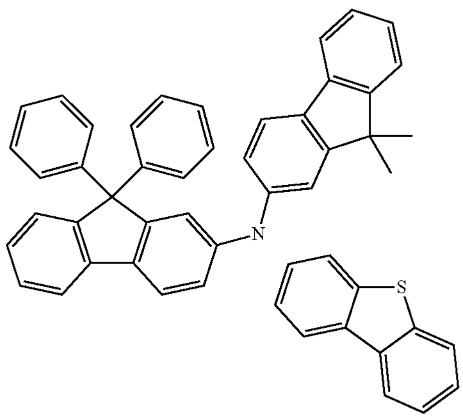
2-31
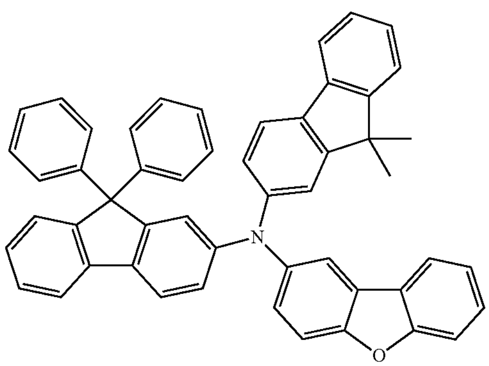
2-32
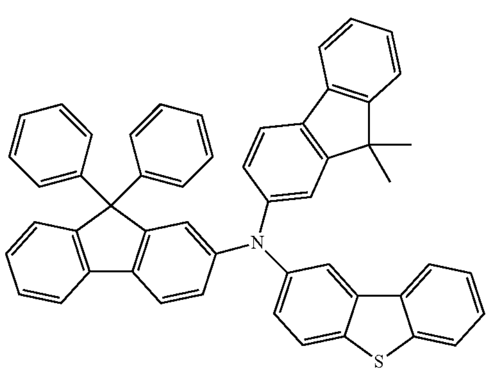
-continued
2-33
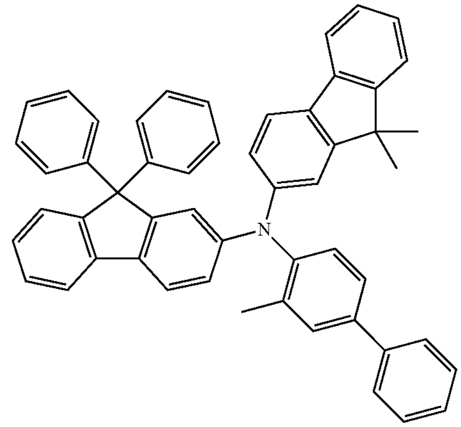
2-34
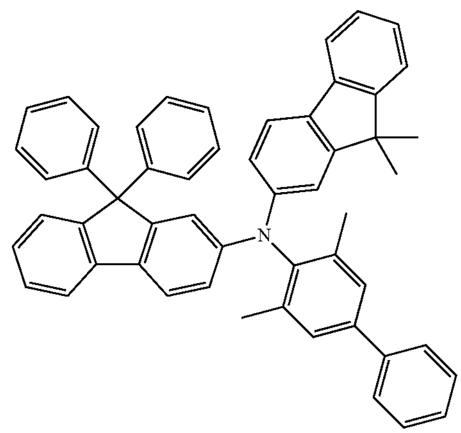
2-35
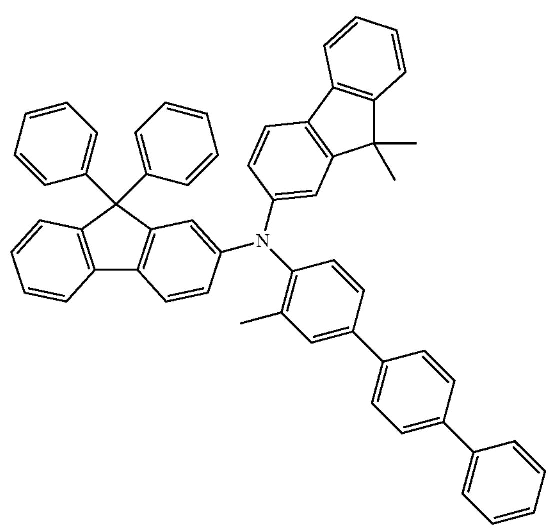

2-36
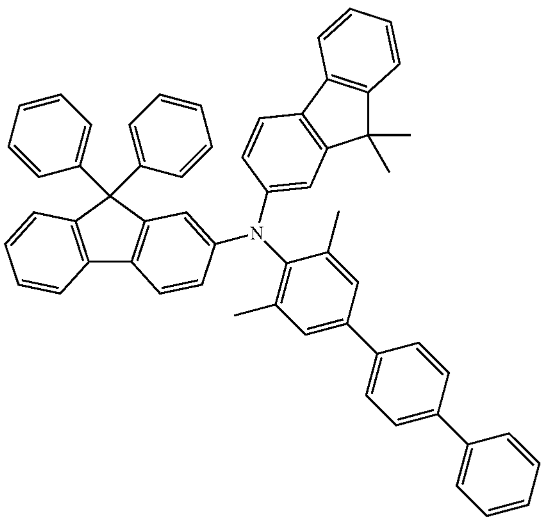
2-37
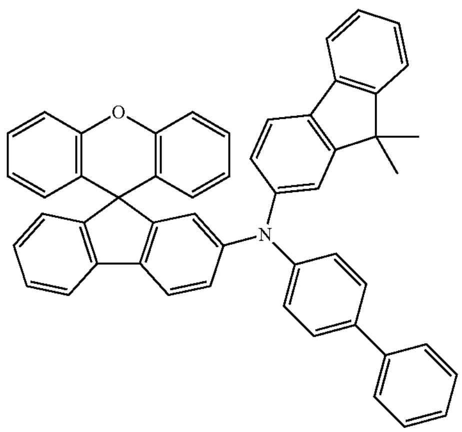
2-38
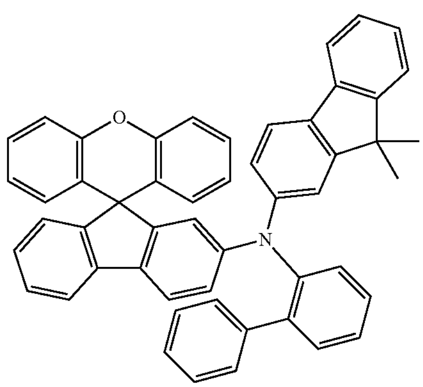
2-39
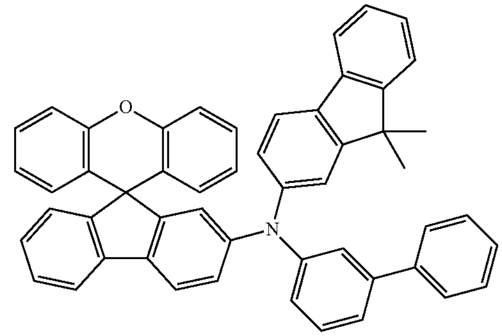
2-40
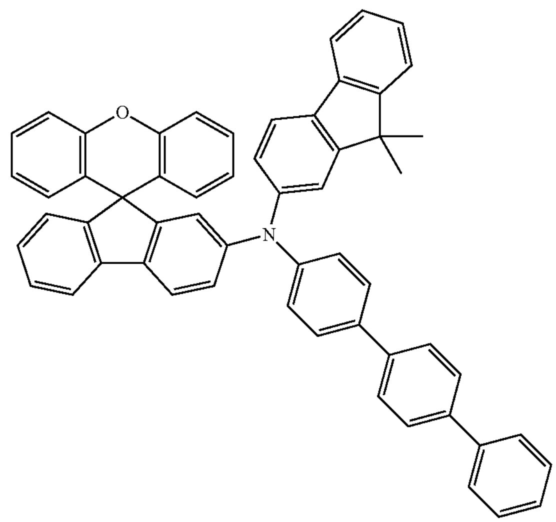
2-41
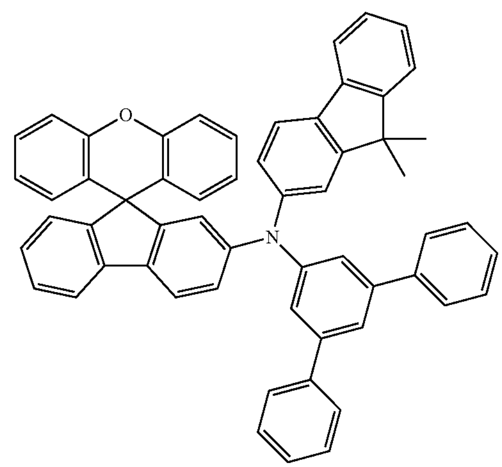

-continued
2-42
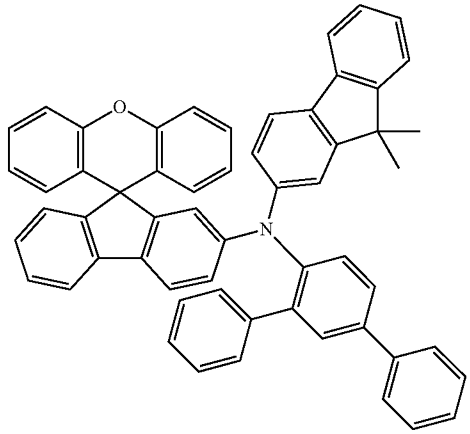
2-43
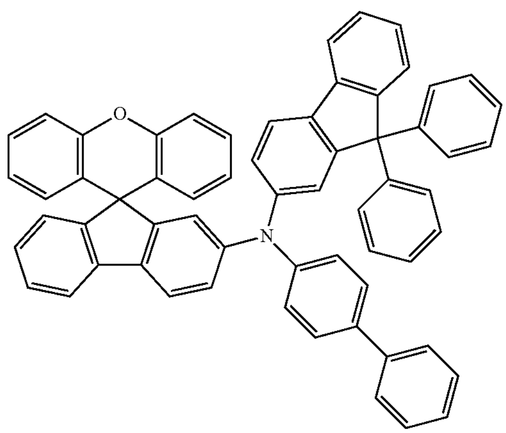
2-44
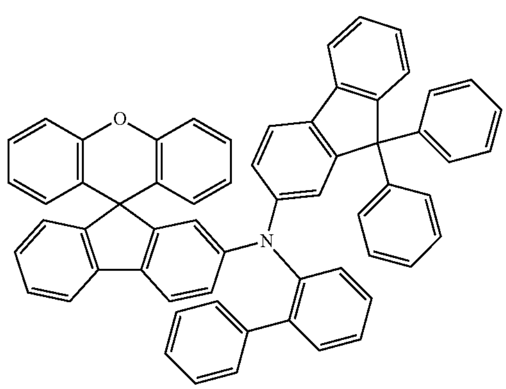
-continued
2-45
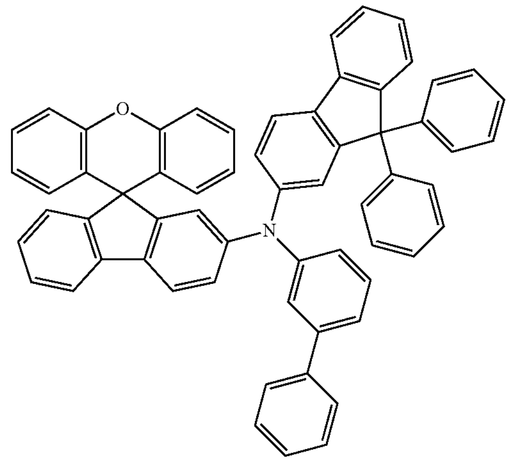
2-46
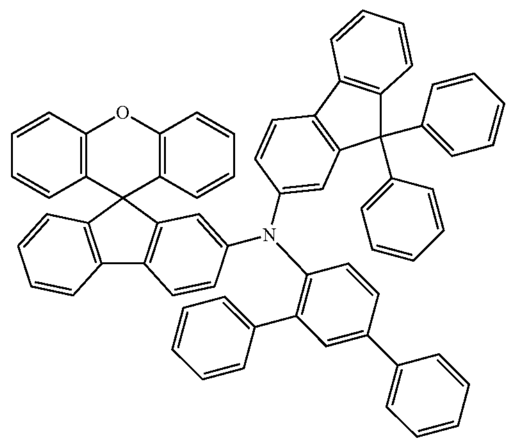
2-47
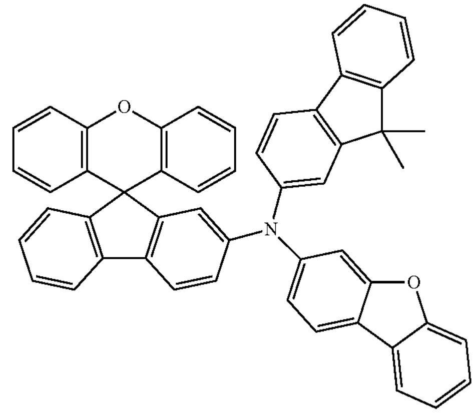

-continued
2-48
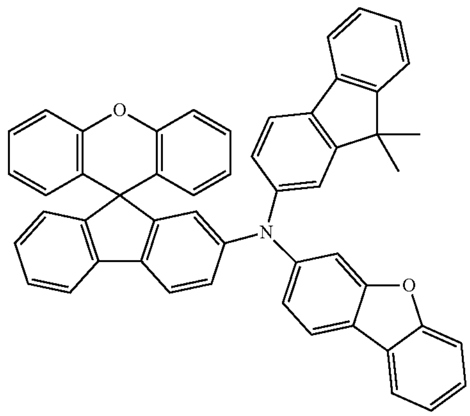
2-49
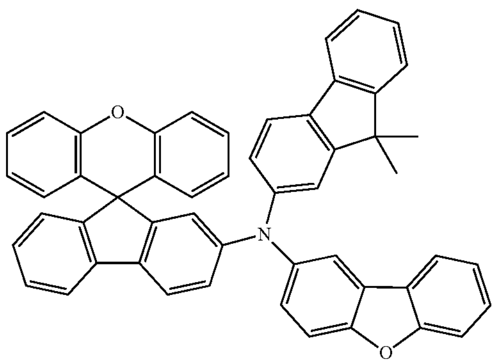
2-50
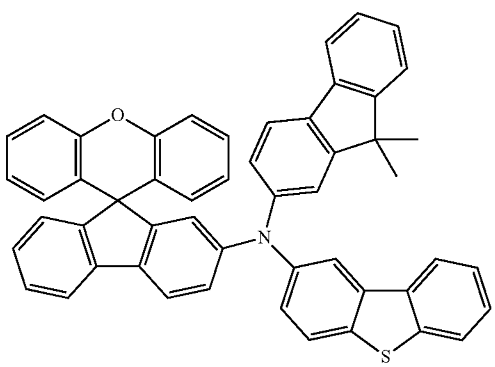
2-51
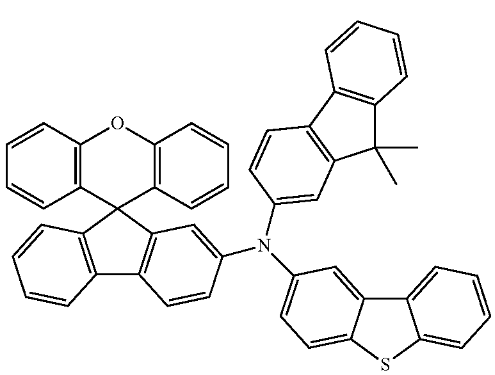
-continued
2-52
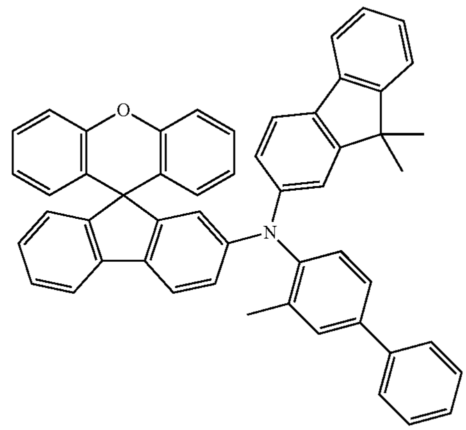
2-53
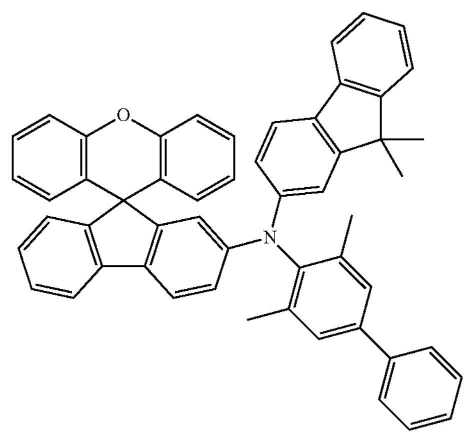
2-54
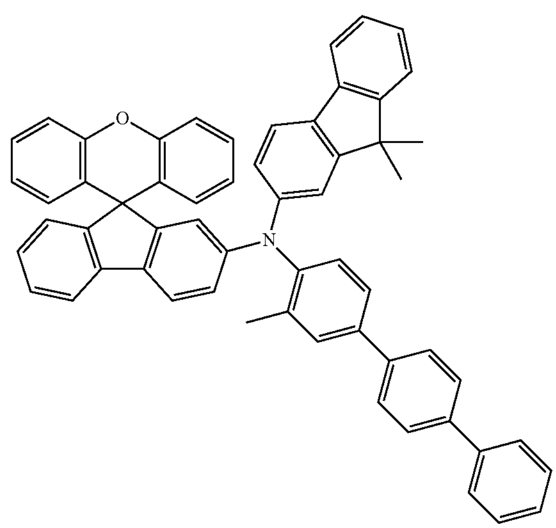

-continued
2-55
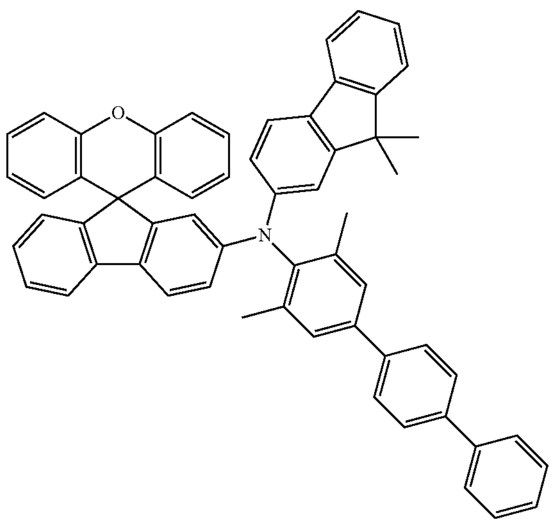
2-56
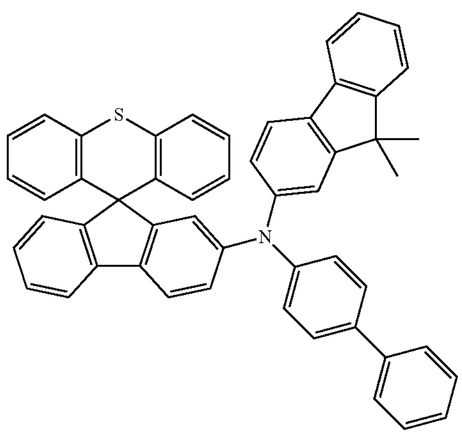
2-57
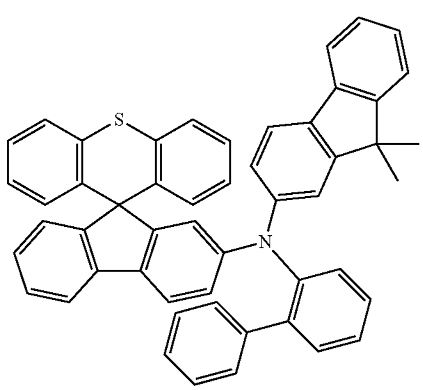
-continued
2-58
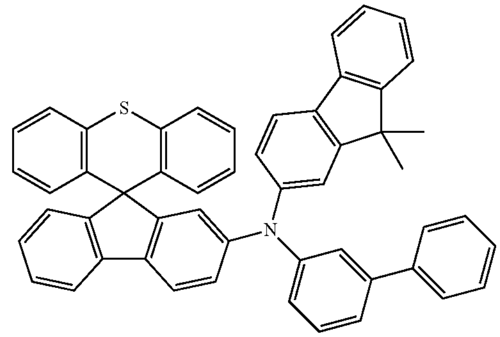
2-59
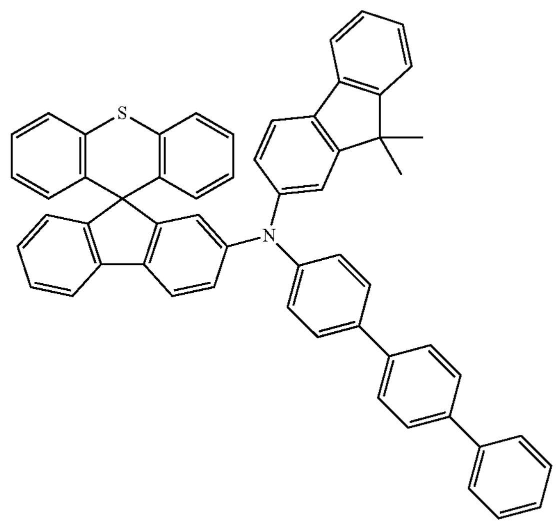
2-60
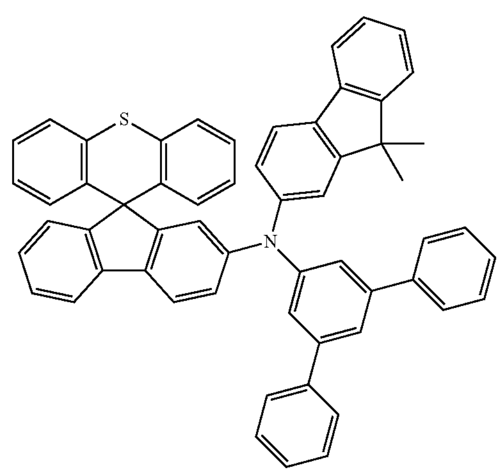

2-61
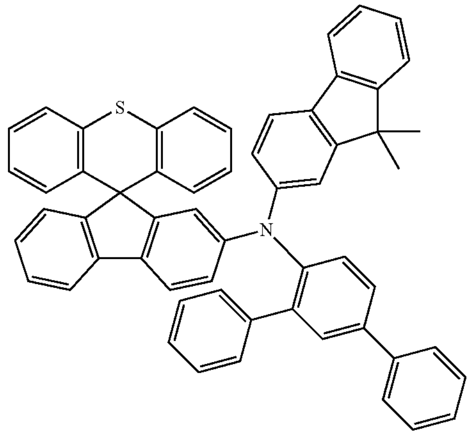
2-62
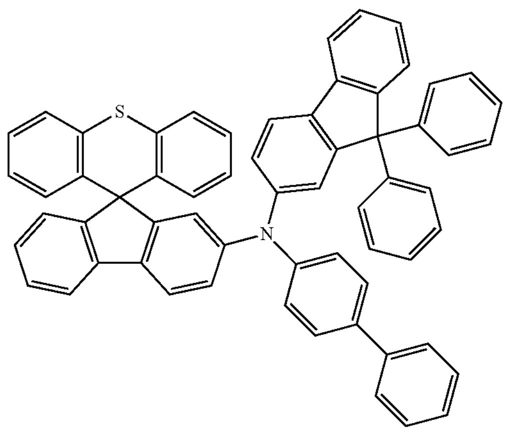
2-63
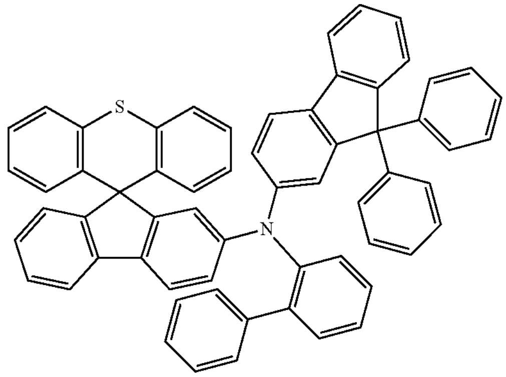
2-64
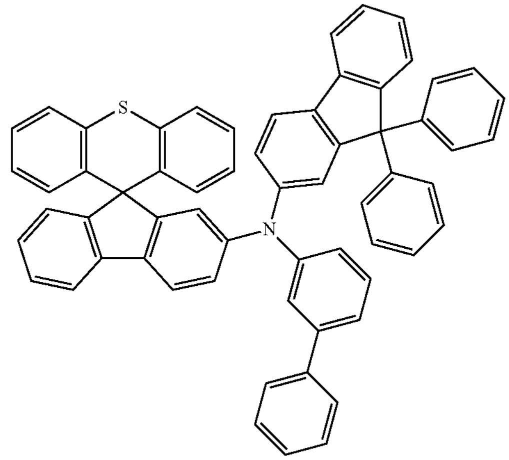
2-65
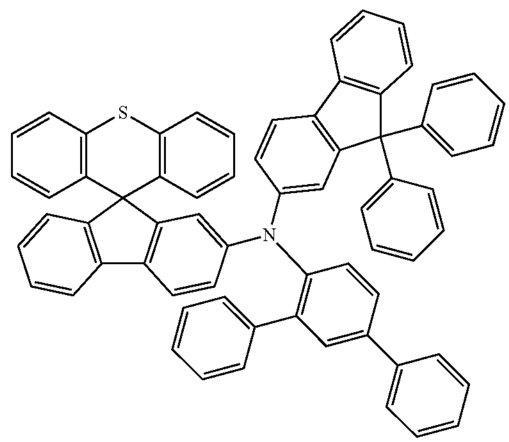
2-66
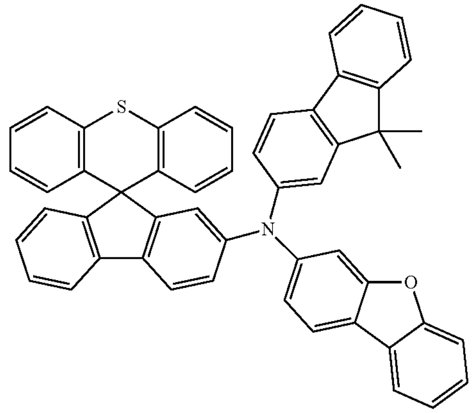

-continued
2-67
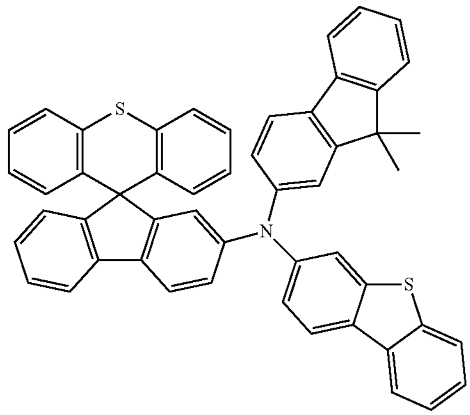
2-68
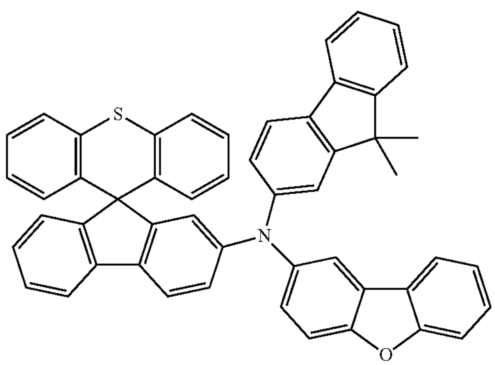
2-69
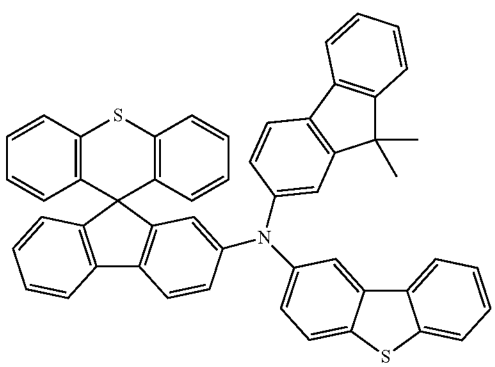
2-70
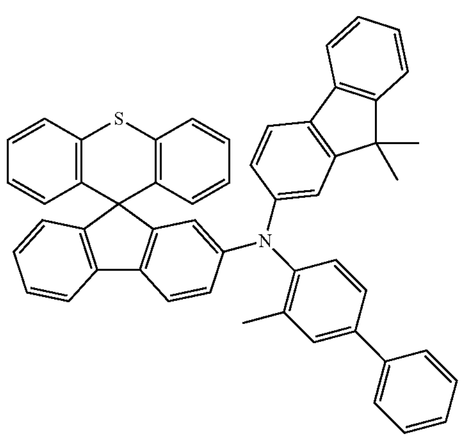
-continued
2-71
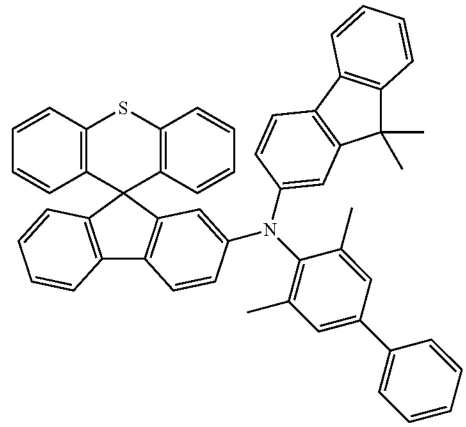
2-72
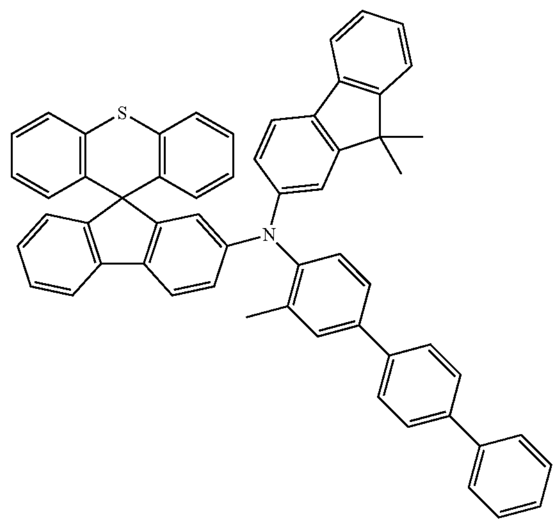
2-73
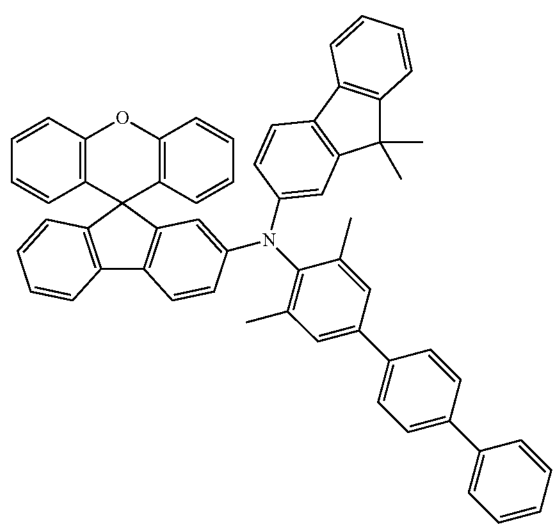

2-74
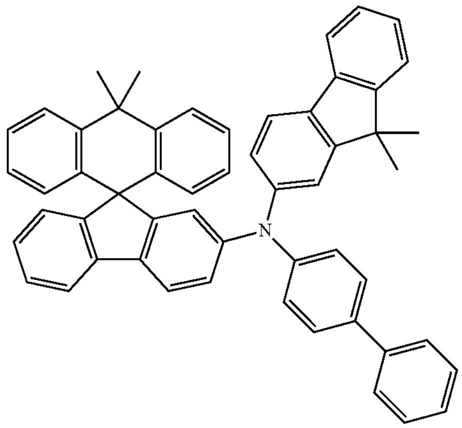
2-75
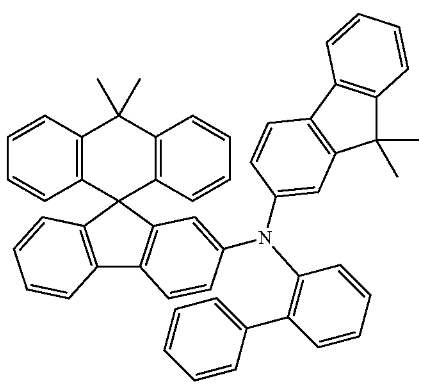
2-76
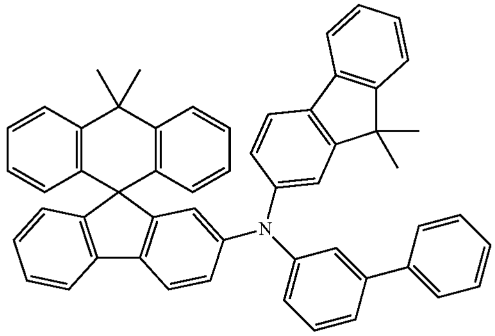
2-77
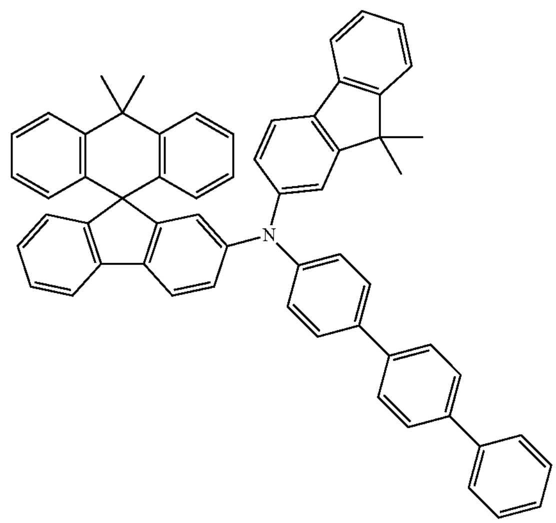
2-78
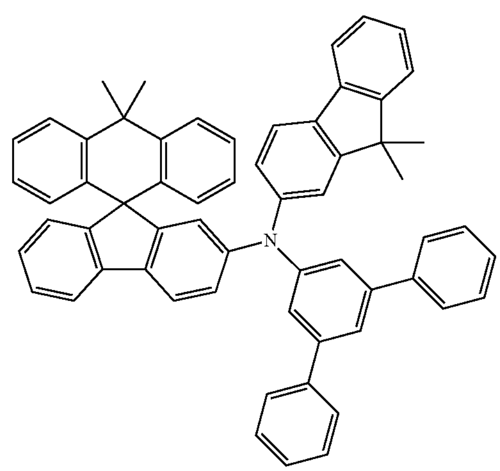
2-79
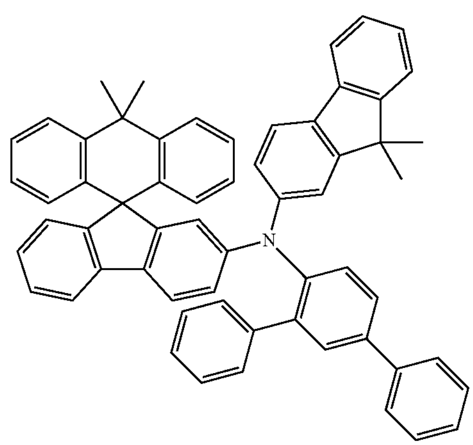

-continued
2-80
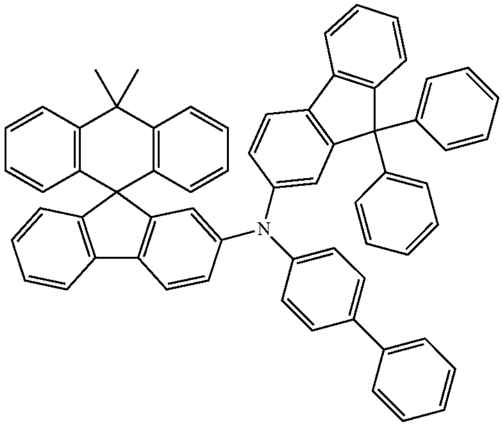
2-81
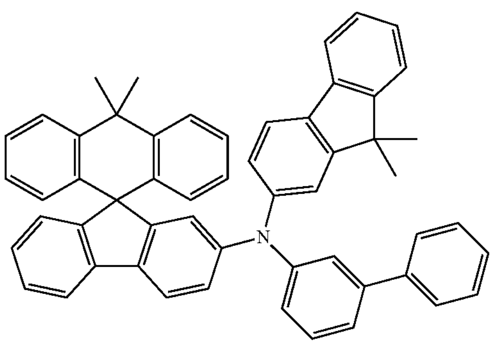
2-82
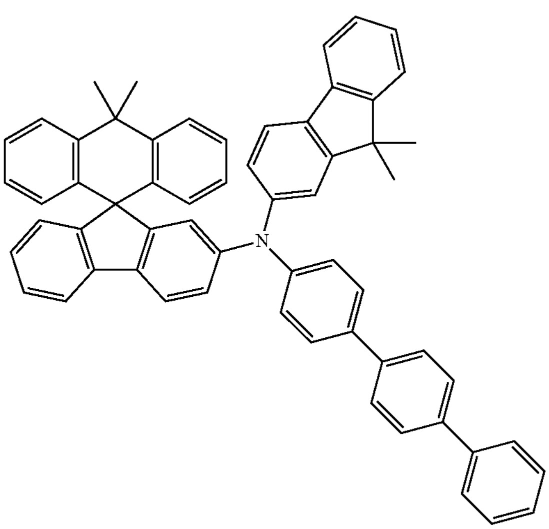
-continued
2-83
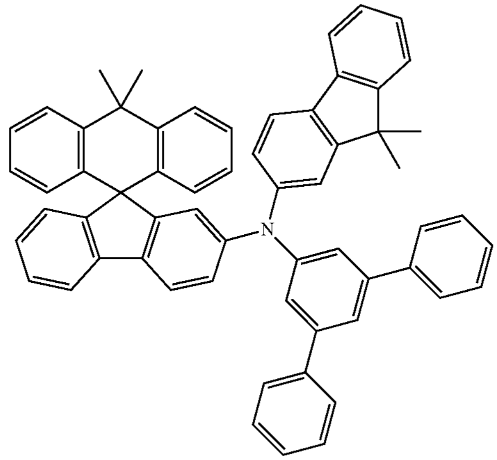
2-84
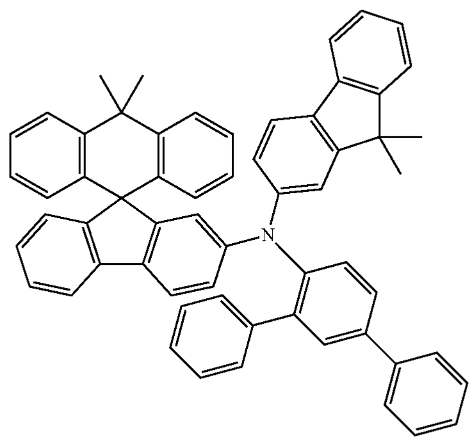
2-85
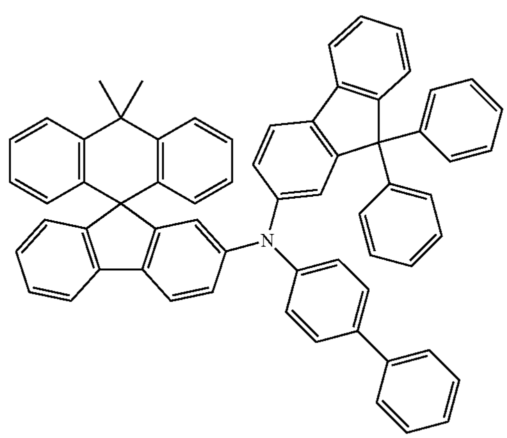

-continued
2-86
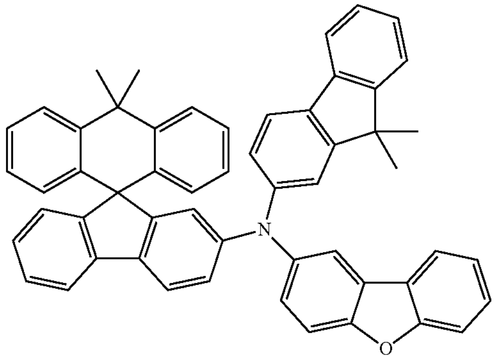
2-87
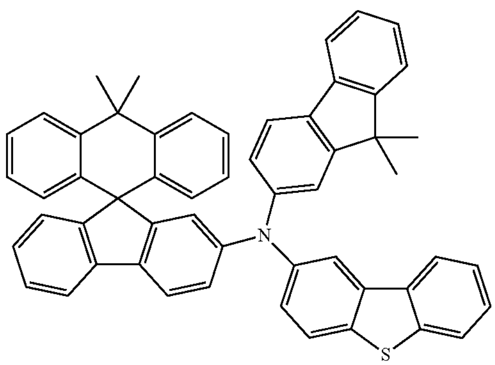
2-88
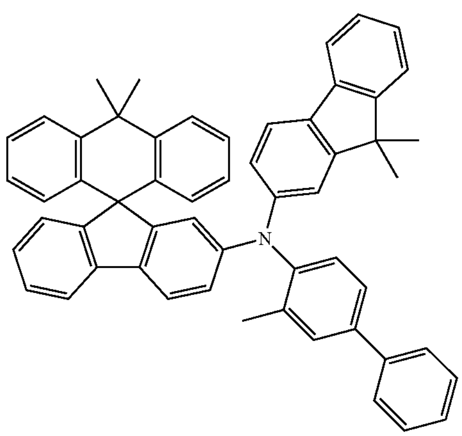
2-89
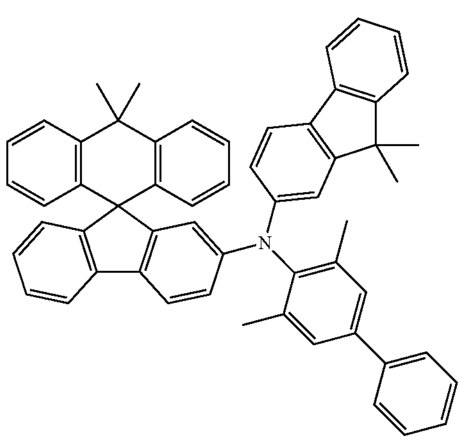
-continued
2-90
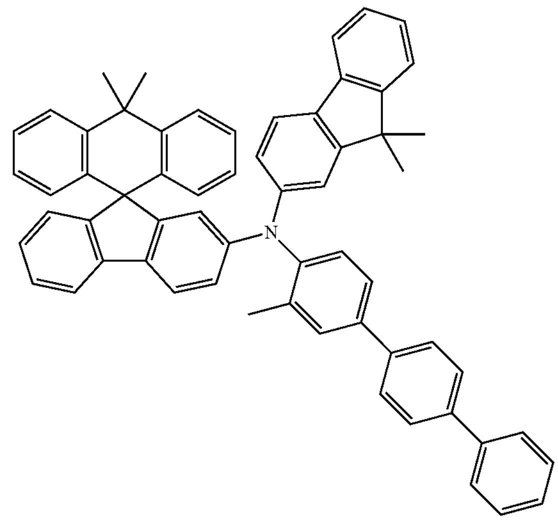
2-91
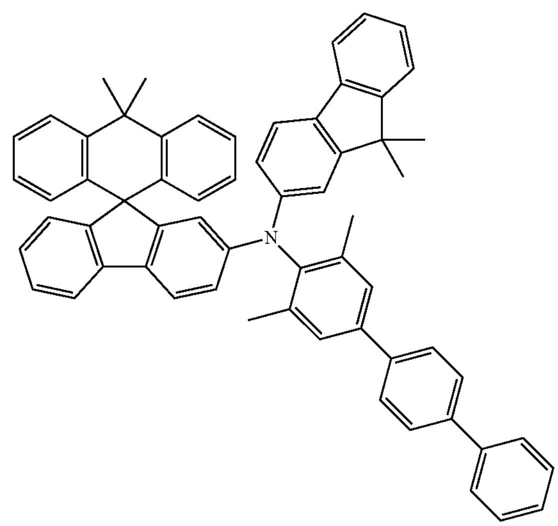
2-92
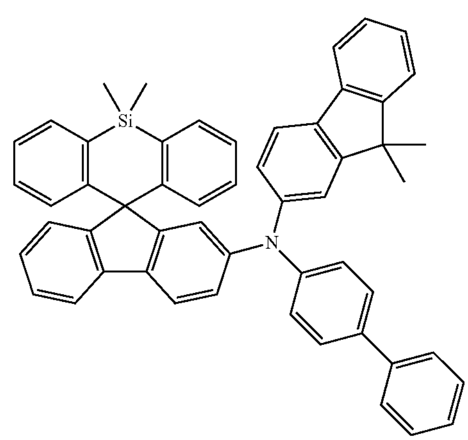

-continued
2-93
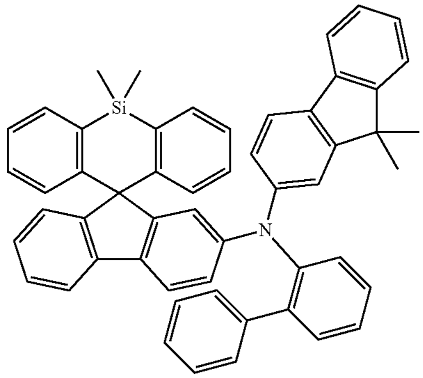
2-94
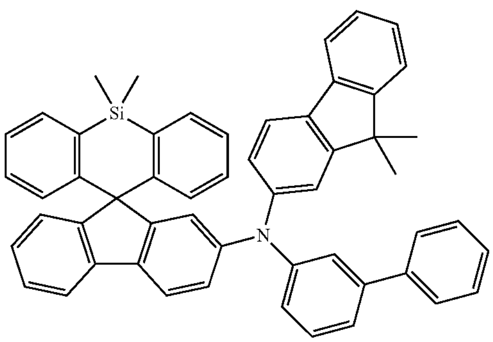
2-95
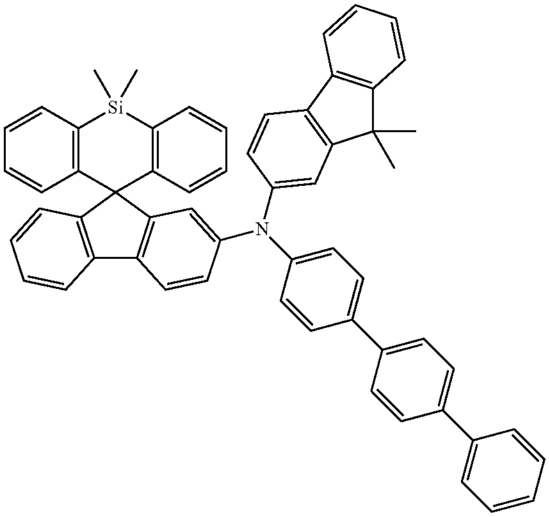
-continued
2-96
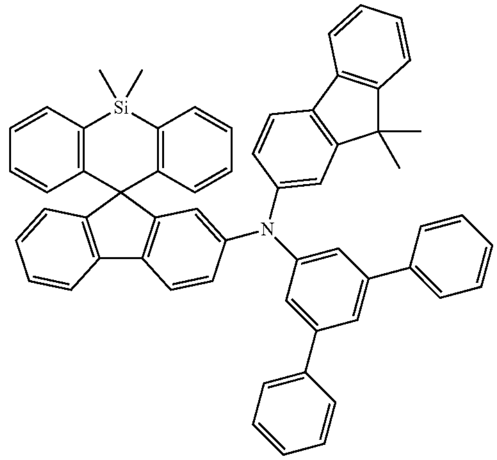
2-97
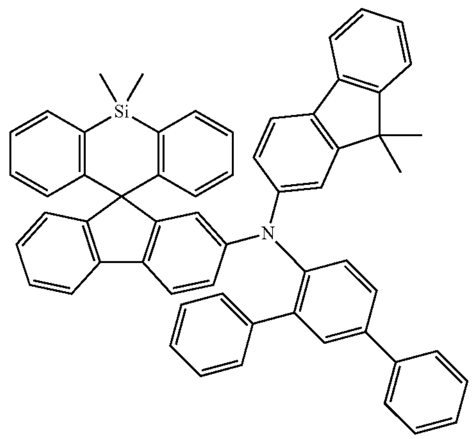
2-98
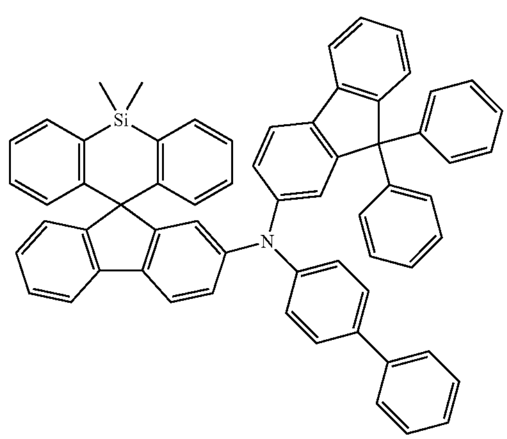

-continued
2-99
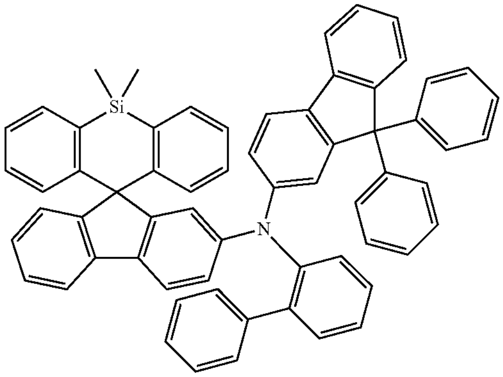
2-100
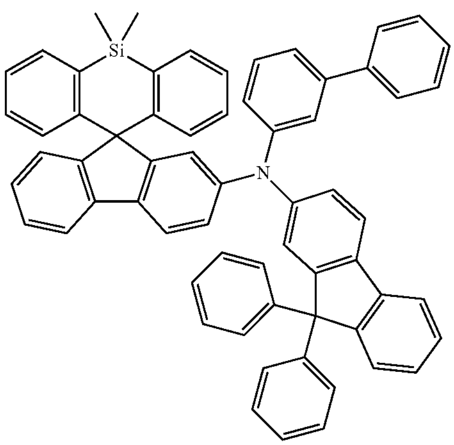
2-101
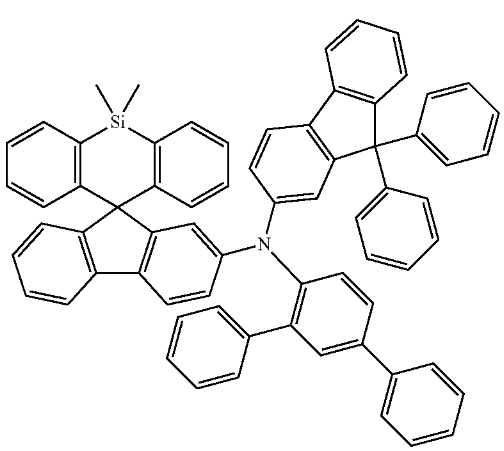
-continued
2-102
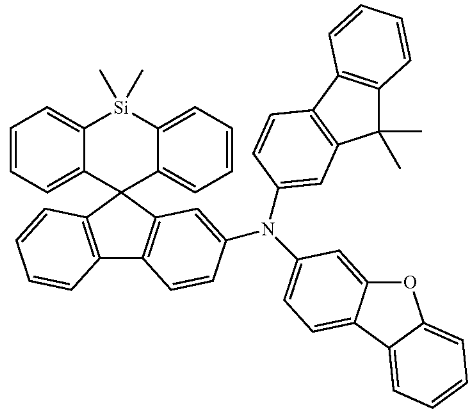
2-103
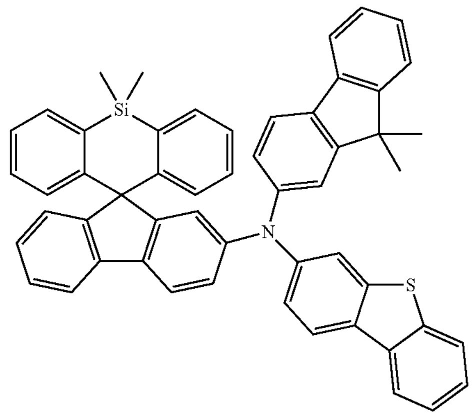
2-104
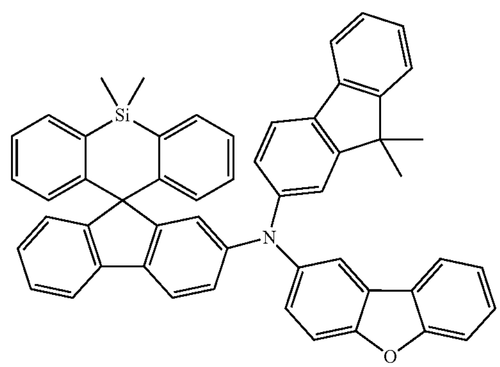
2-105
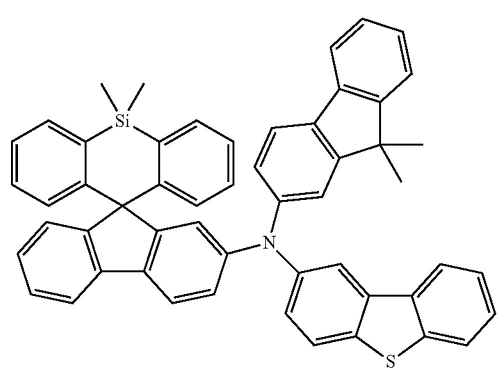

-continued
2-106
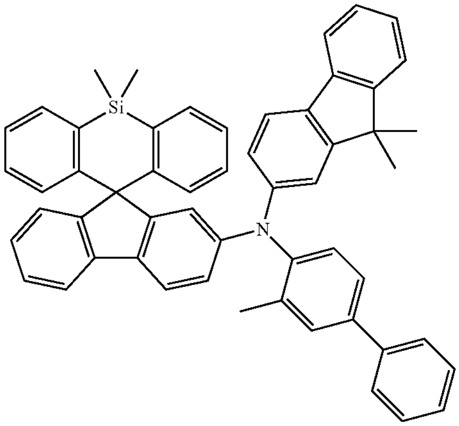
2-107
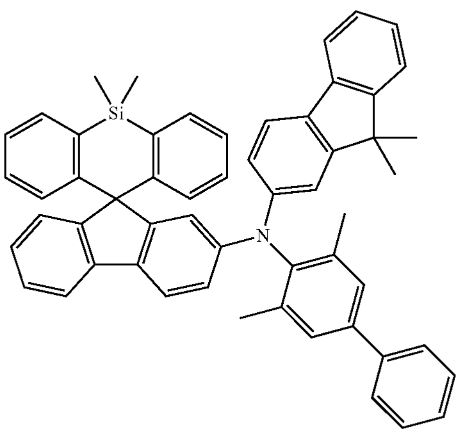
2-108
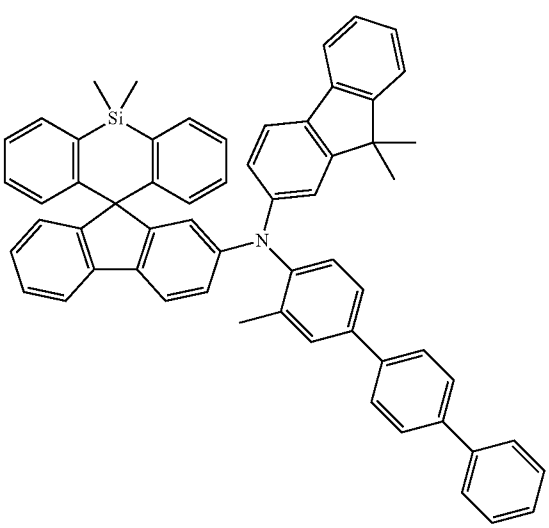
-continued
2-109
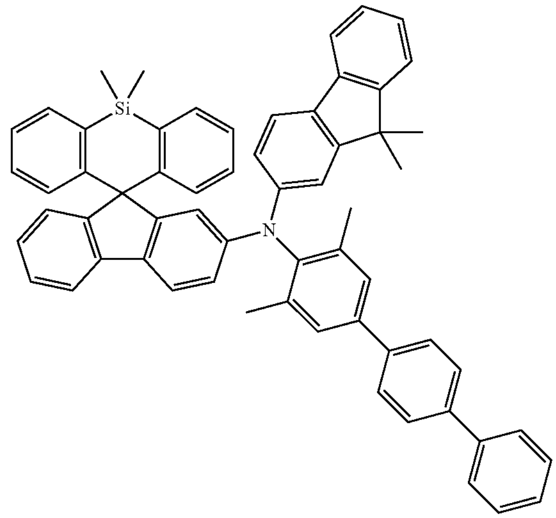
2-110
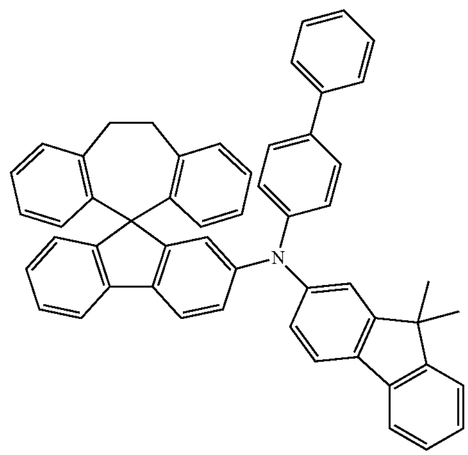
2-111
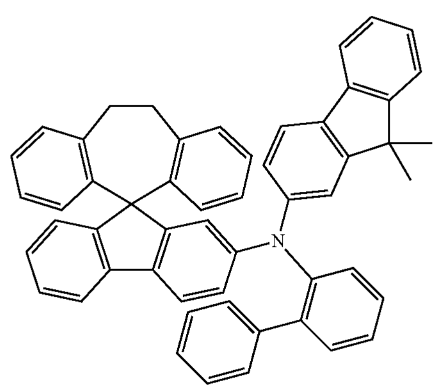

-continued
2-112
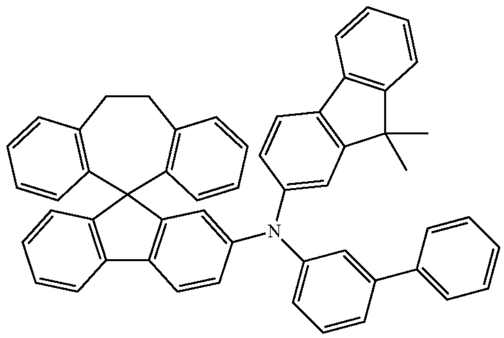
2-113
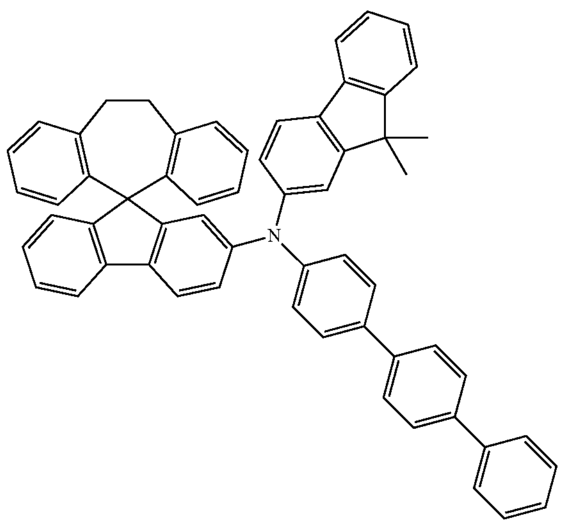
2-114
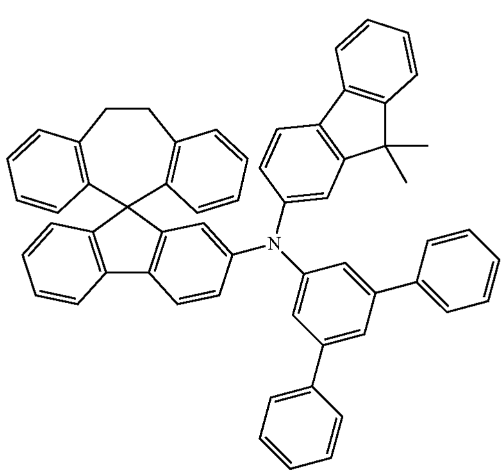
-continued
2-115
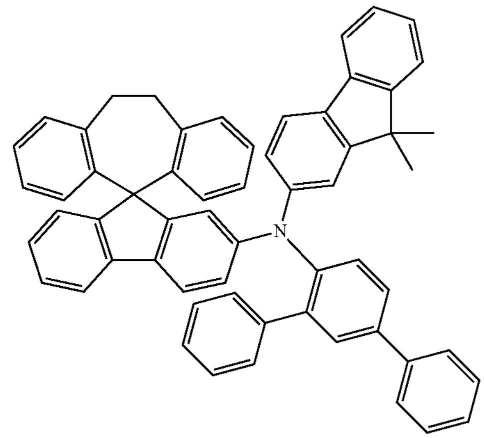
2-116
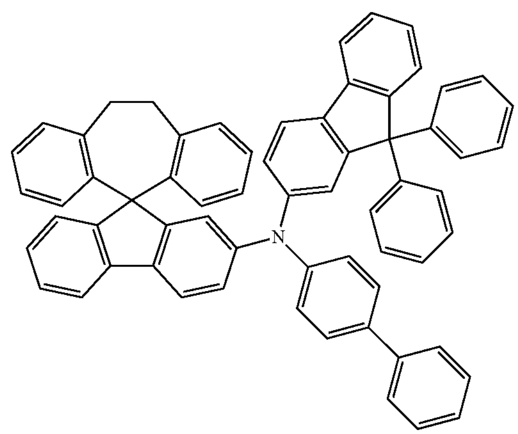
2-117
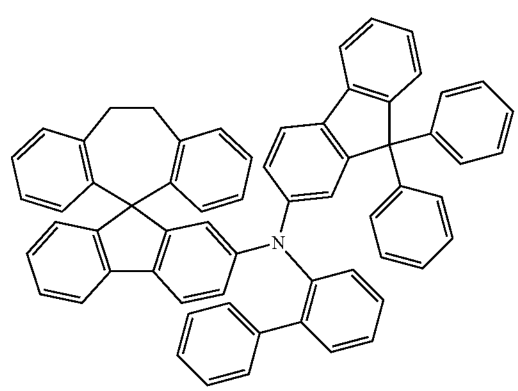

-continued
2-118
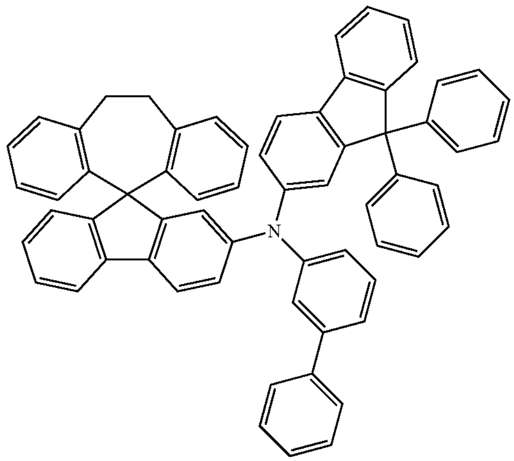
2-119
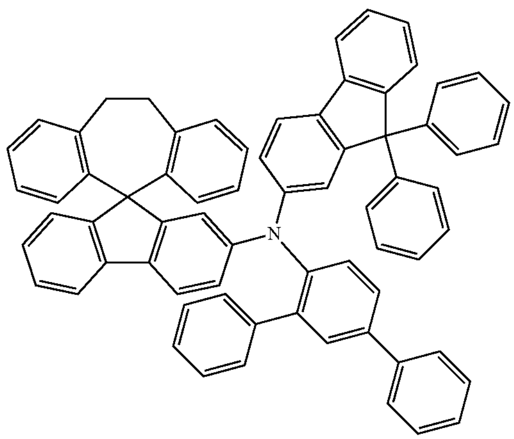
2-120
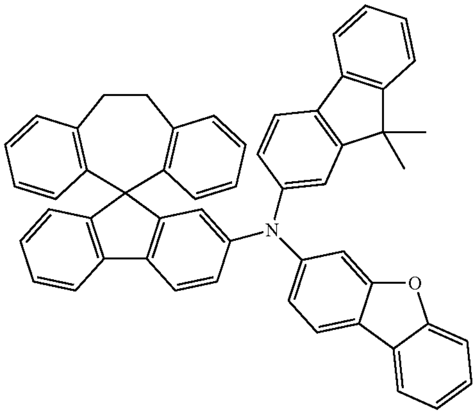
-continued
2-121
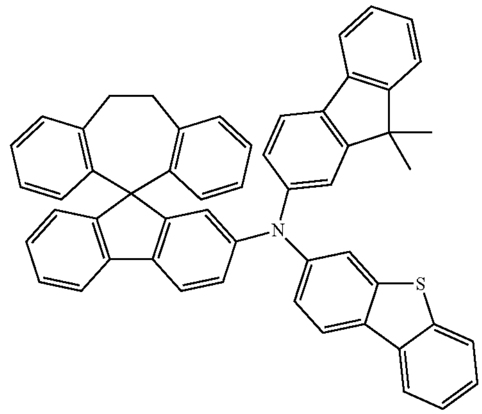
2-122
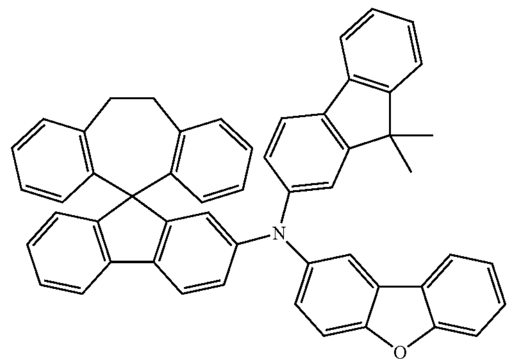
2-123
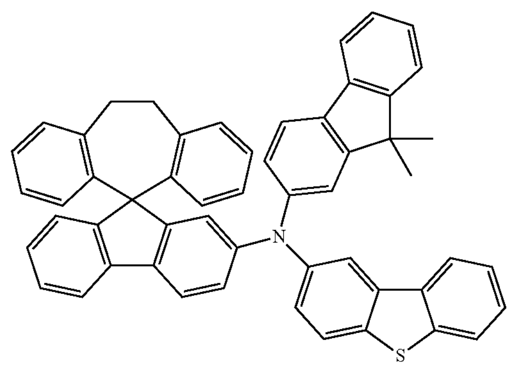
2-124
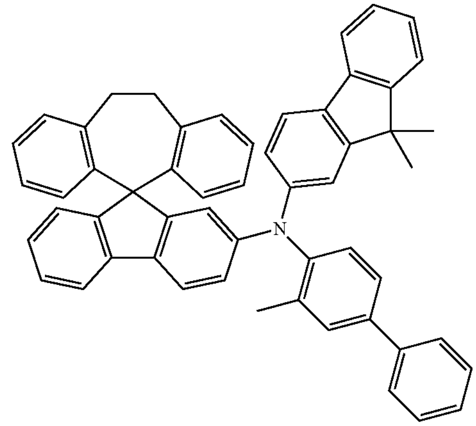

-continued
2-125
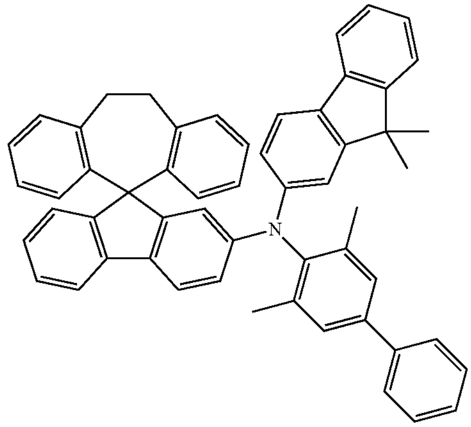
2-126
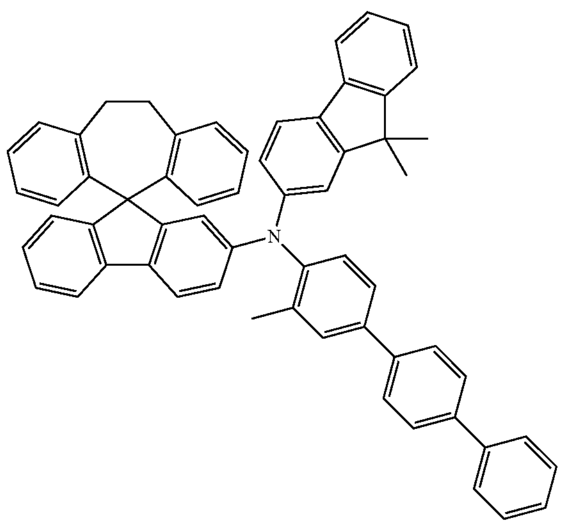
2-127
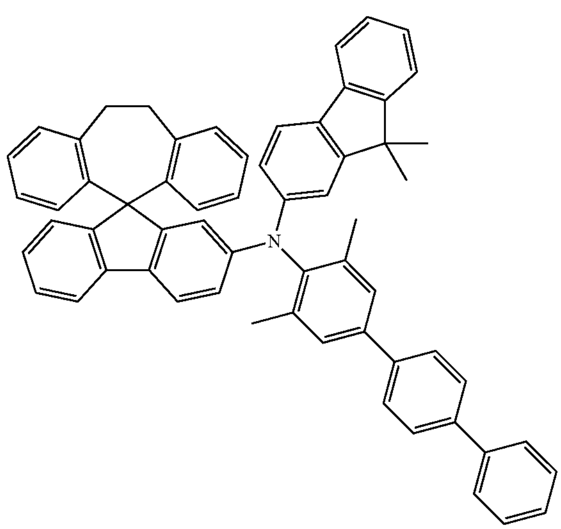
-continued
2-128
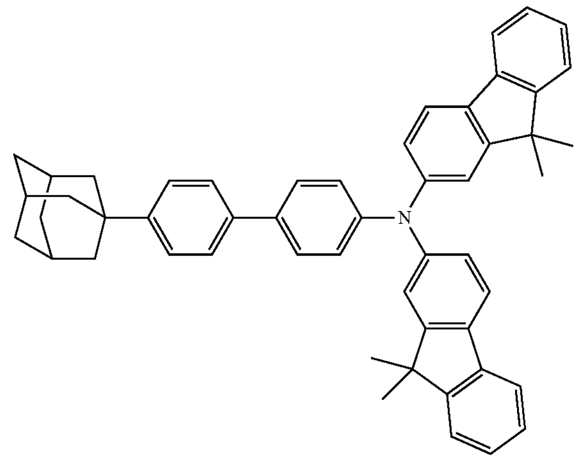
2-129
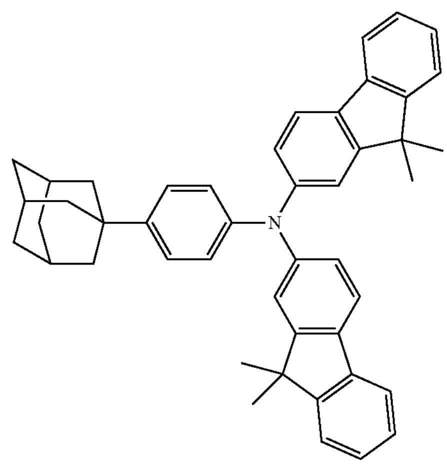
2-130
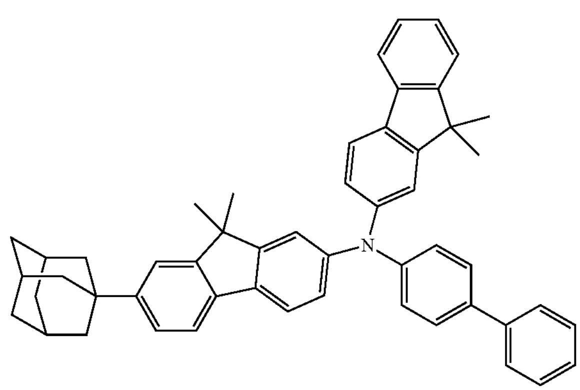

2-131
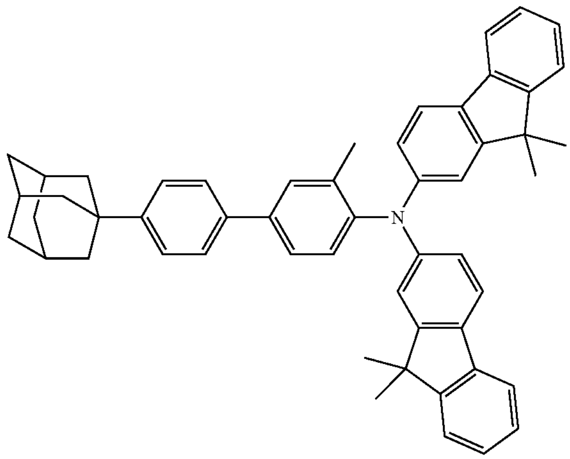
2-132
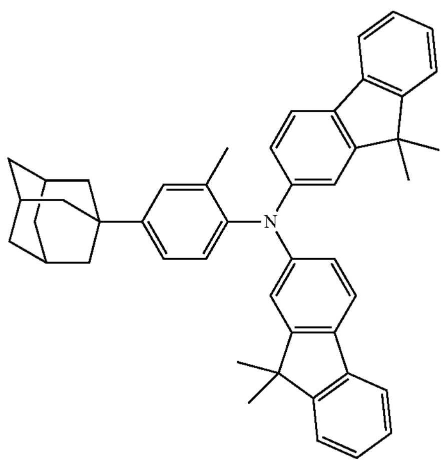
2-133
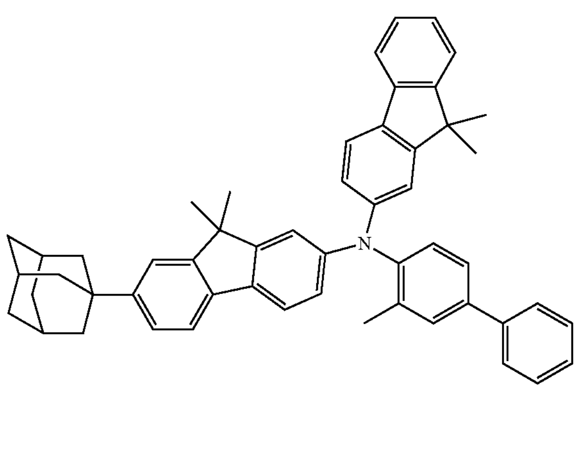
2-134
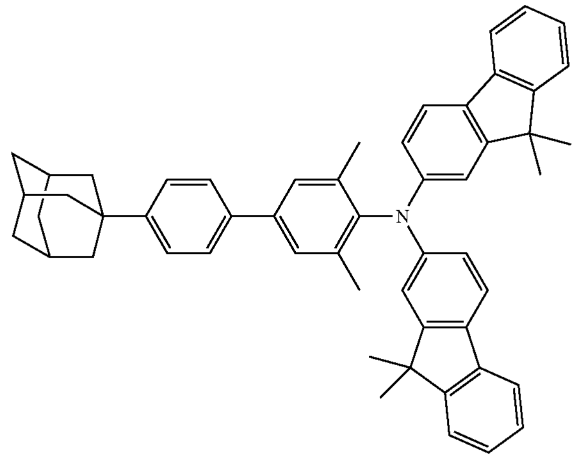
2-135
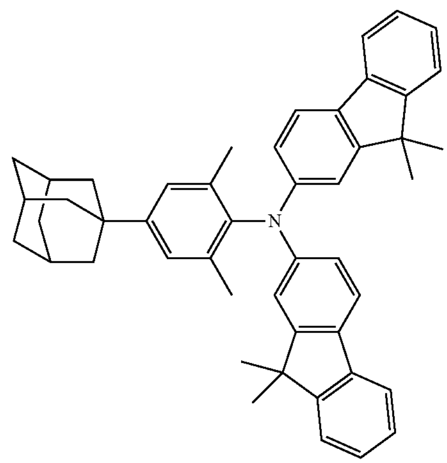
2-136
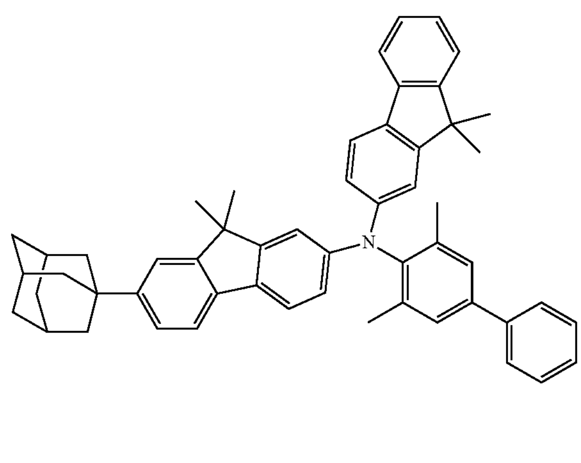

-continued
2-137
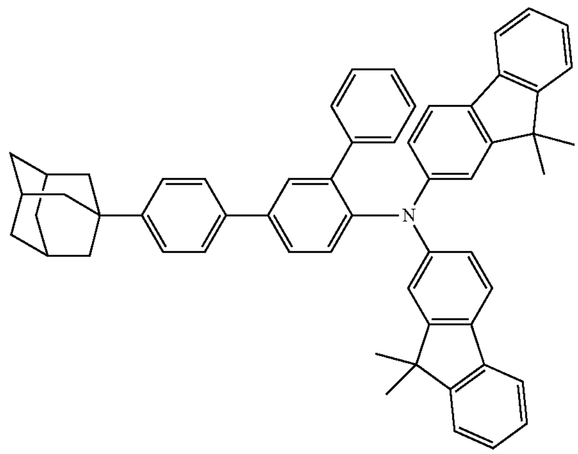
2-138
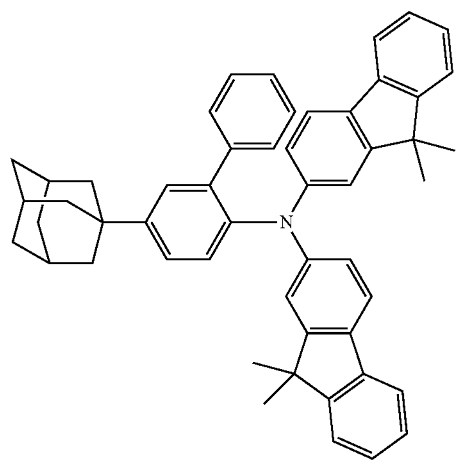
2-139
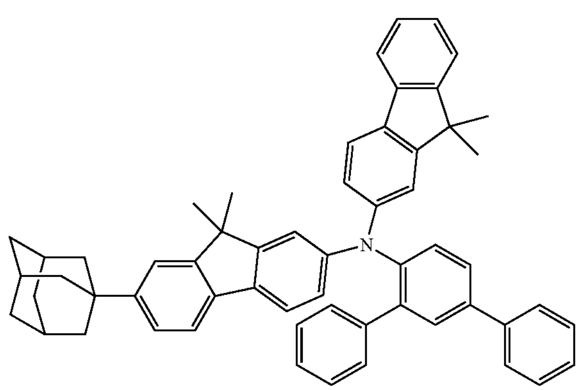
-continued
2-140
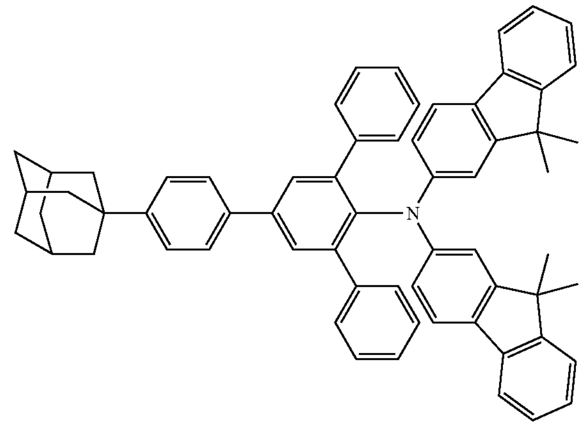
2-141
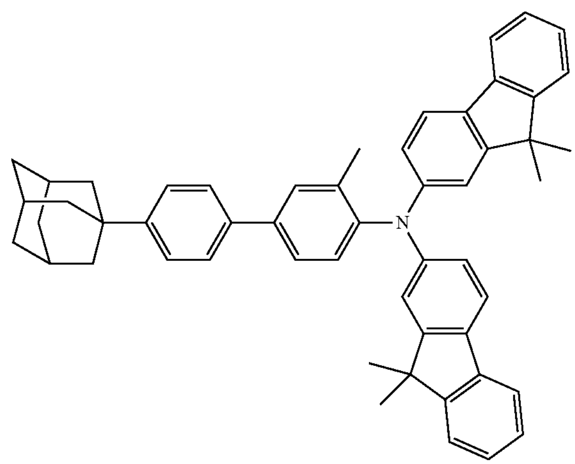
2-142
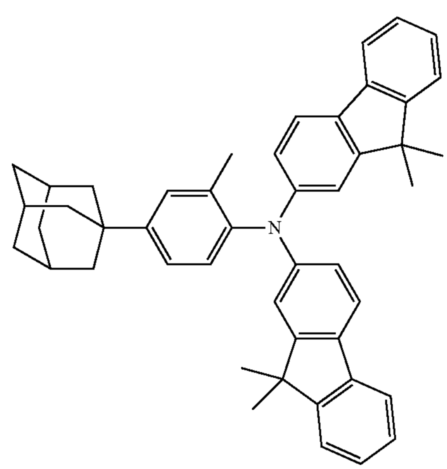

-continued
2-143
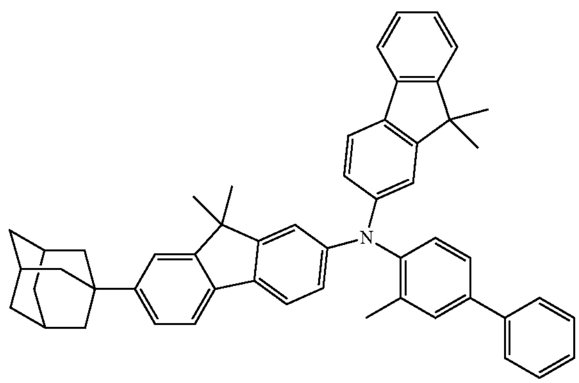
2-144
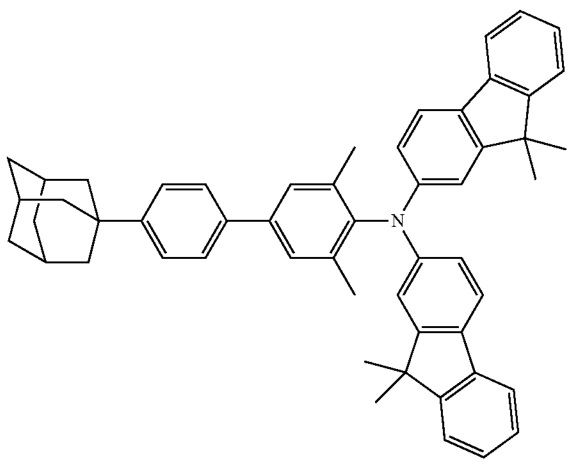
2-145
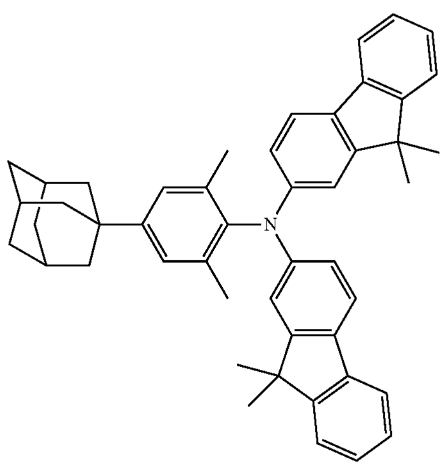
-continued
2-146
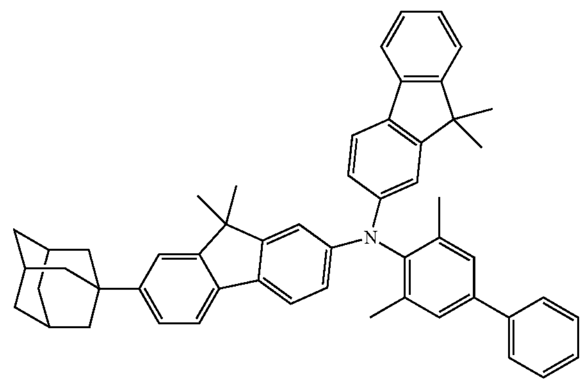
2-147
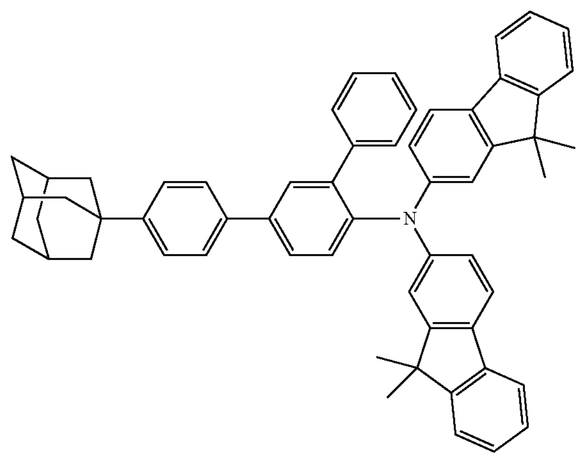
2-148
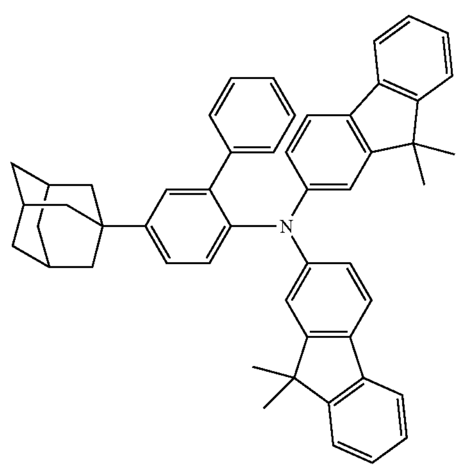

-continued
2-149
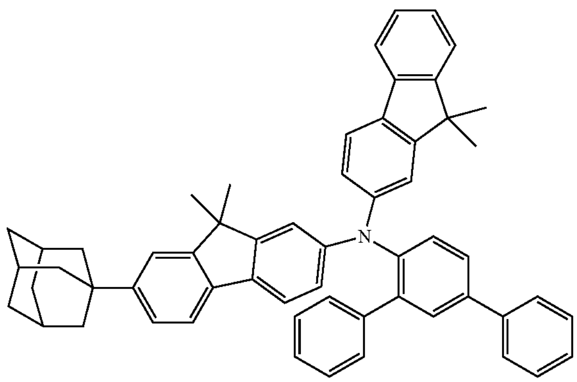
2-150
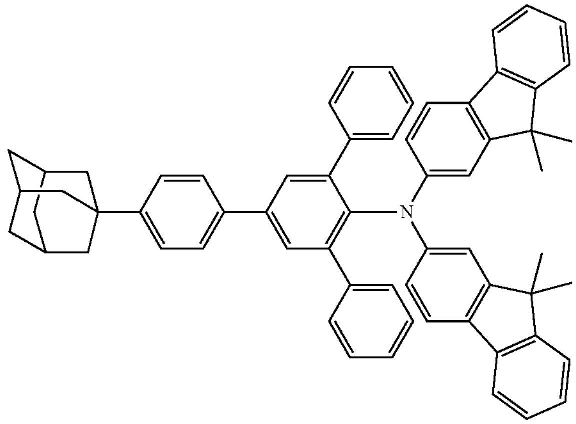
2-151
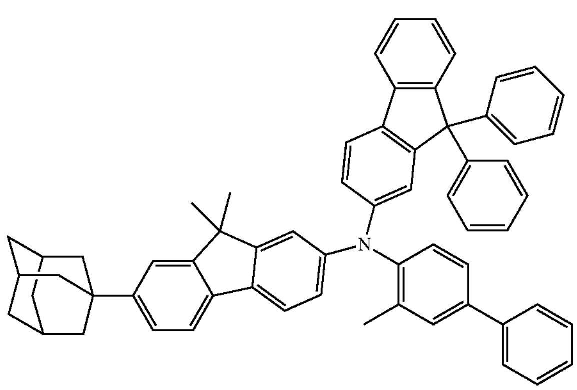
-continued
2-152
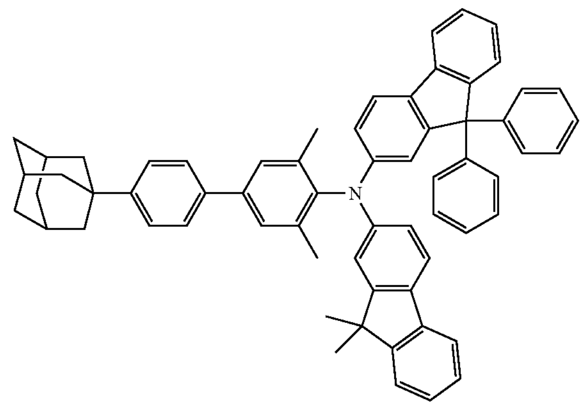
2-153
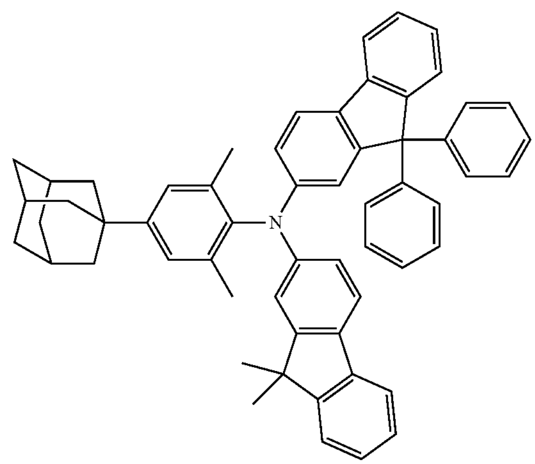
2-154
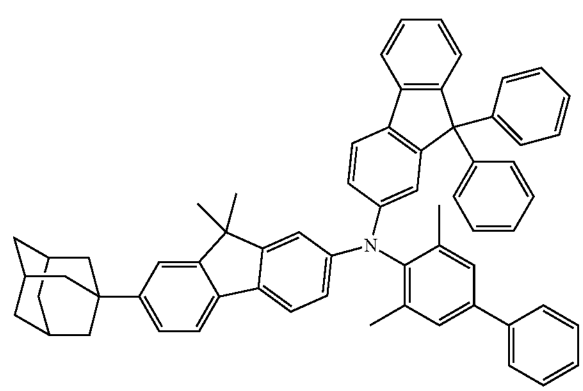

-continued
2-155
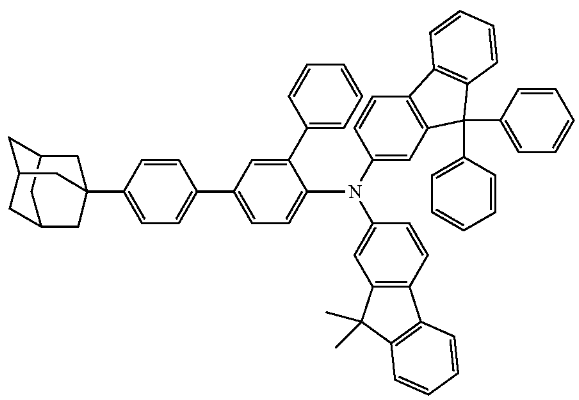
2-156
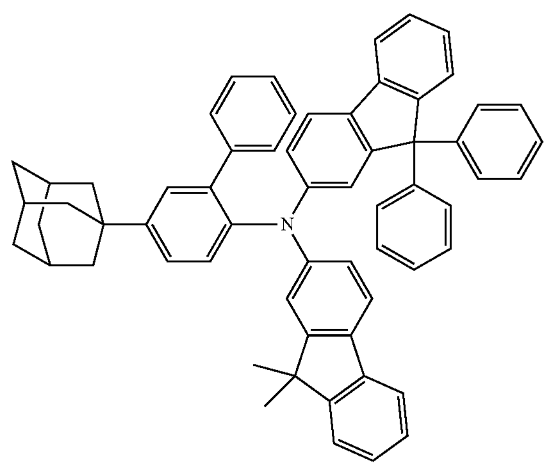
2-157
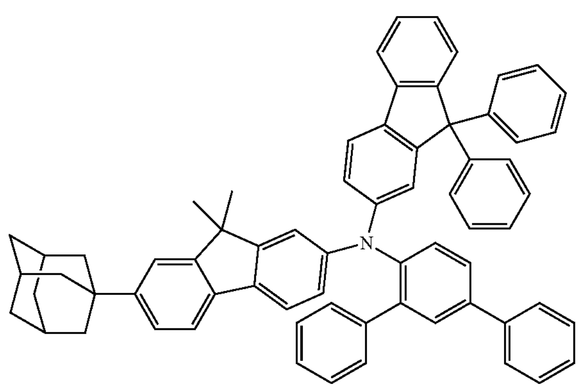
-continued
2-158
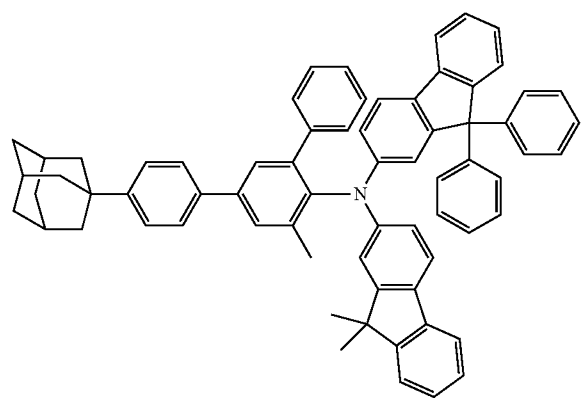
2-159
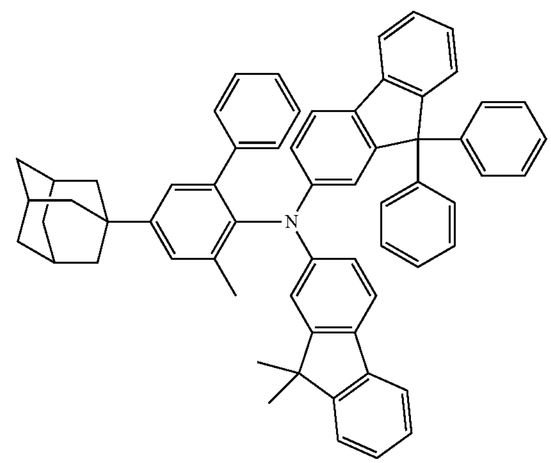
2-160
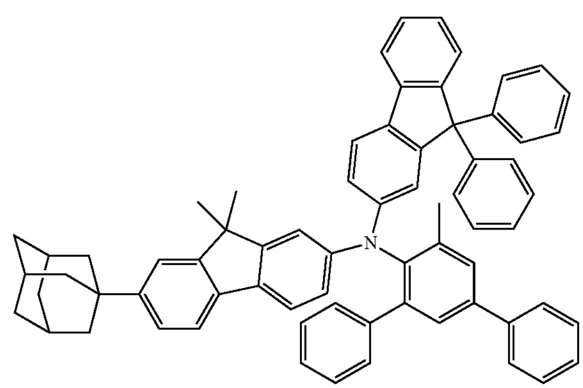

-continued
2-161
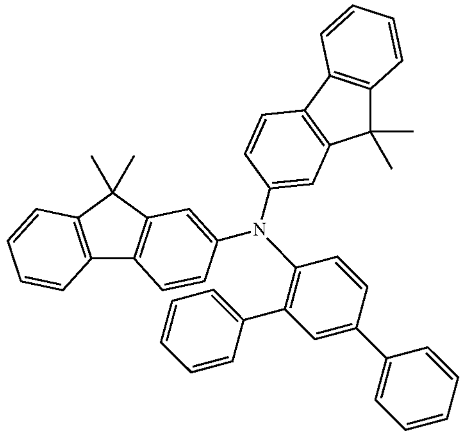
2-162
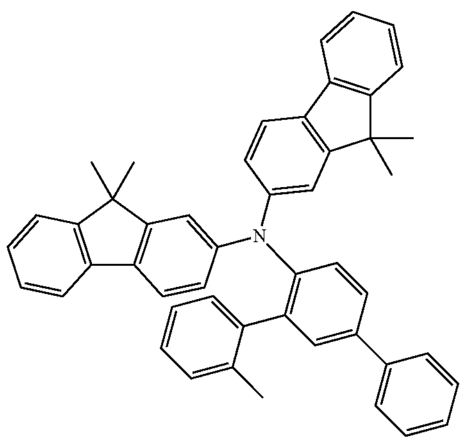
2-163
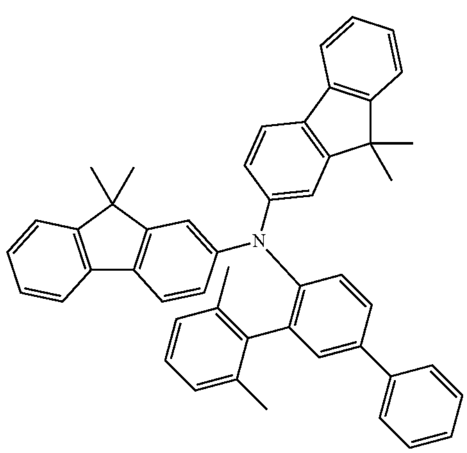
-continued
2-164
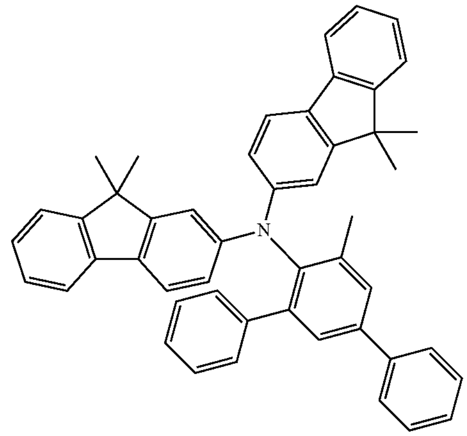
2-165
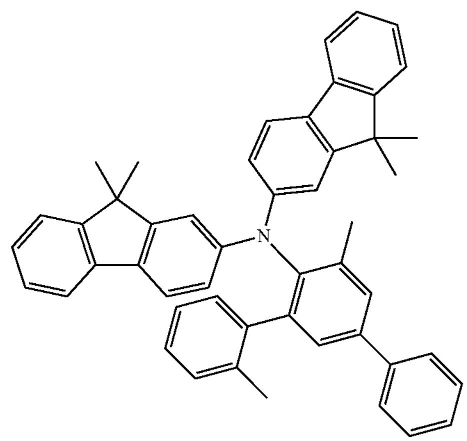
2-166
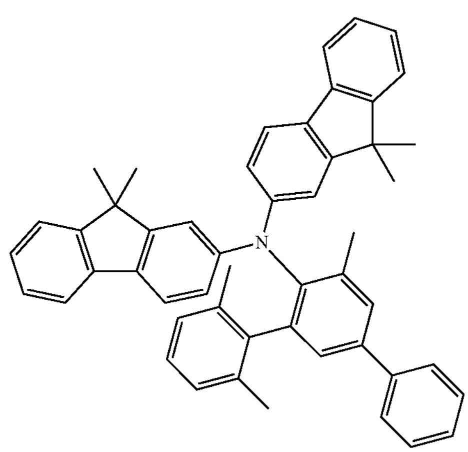

-continued
2-167
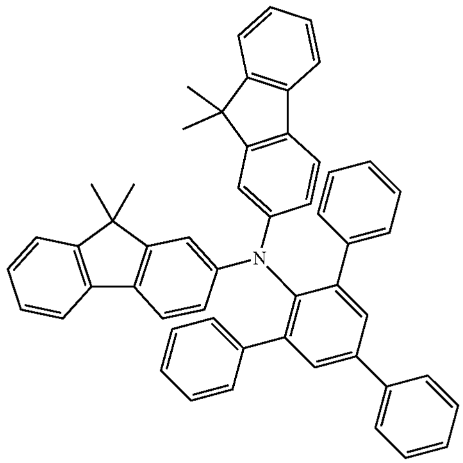
2-168
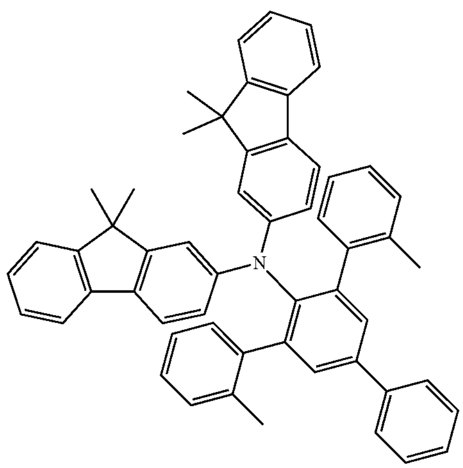
2-169
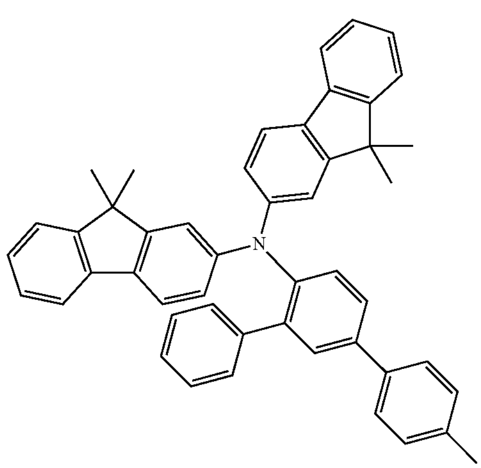
-continued
2-170
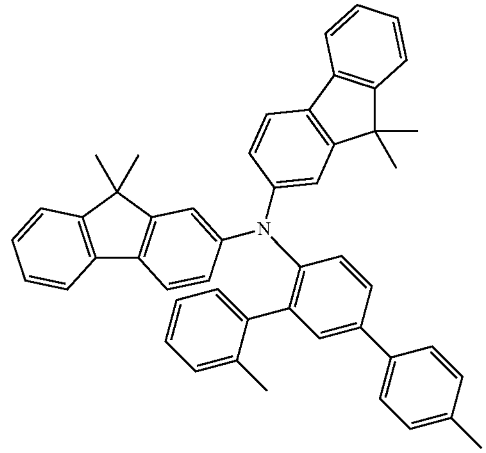
2-171
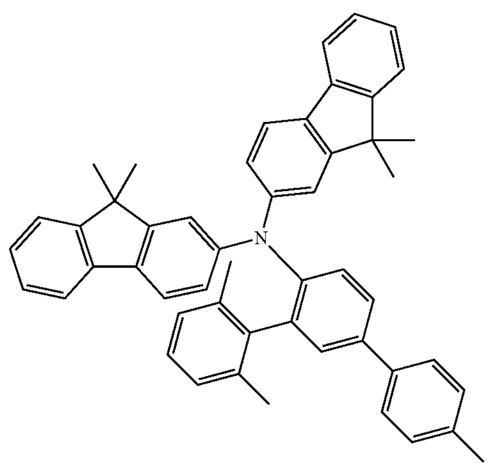
2-172
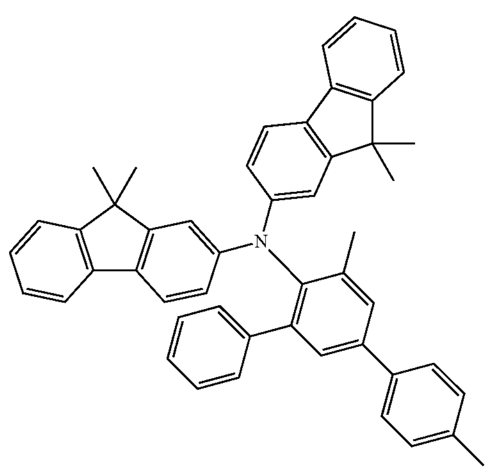

-continued
2-173
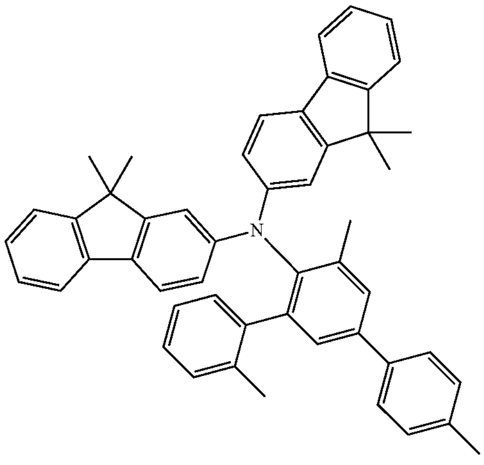
2-174
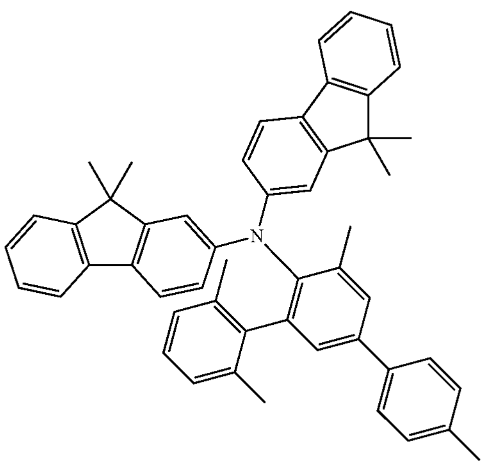
2-175
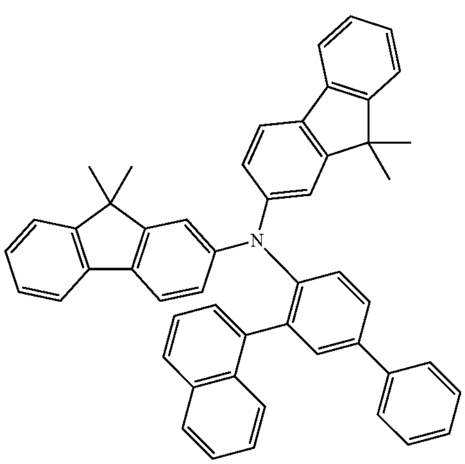
-continued
2-176
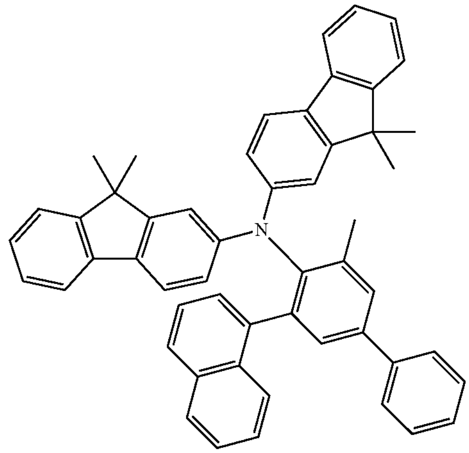
2-177
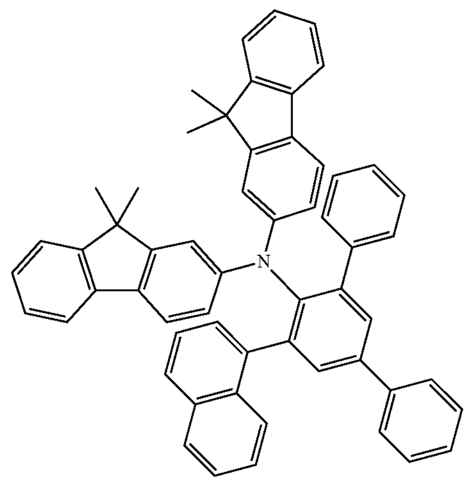
2-178
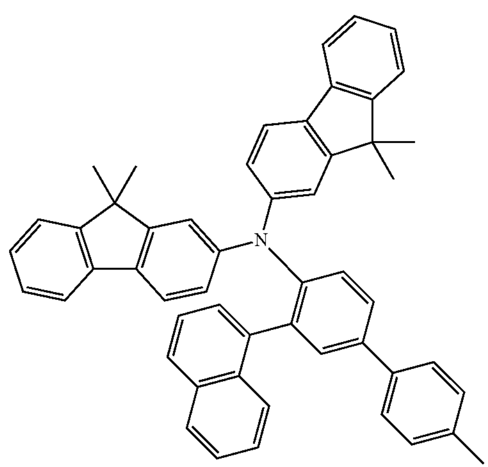

-continued
2-179
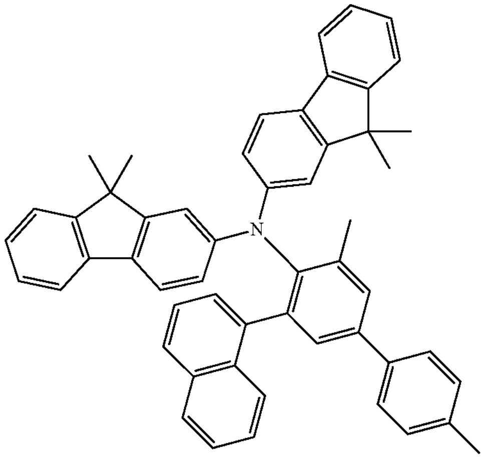
2-180
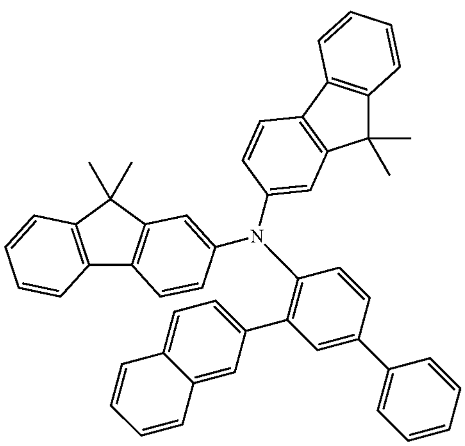
2-181
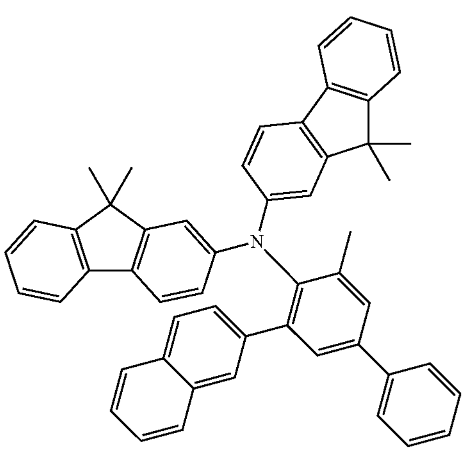
-continued
2-182
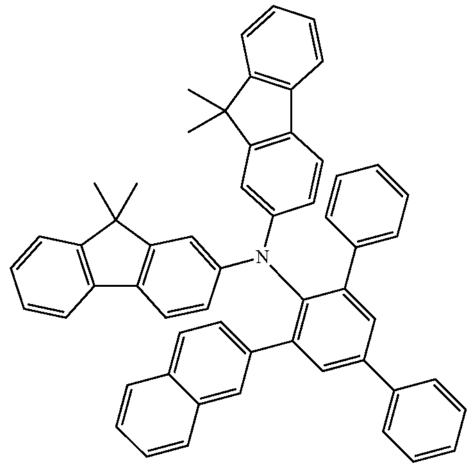
2-183
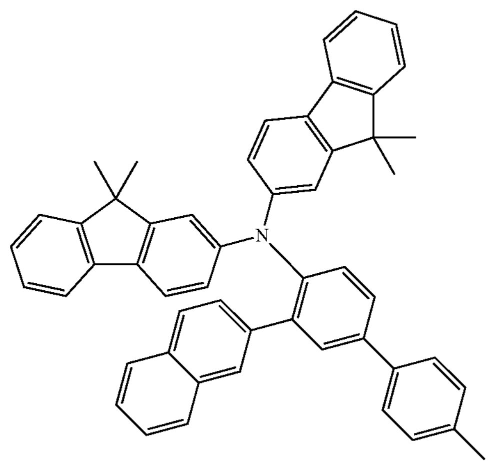
2-184
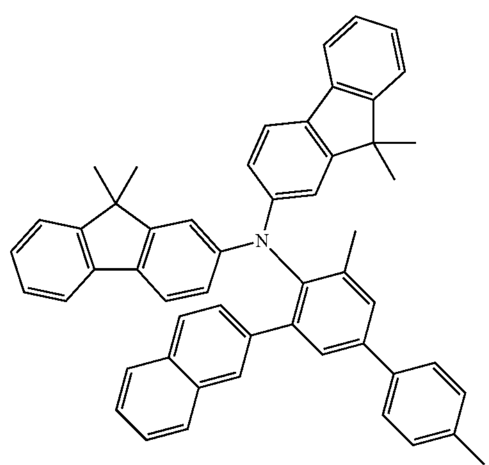

-continued
2-185
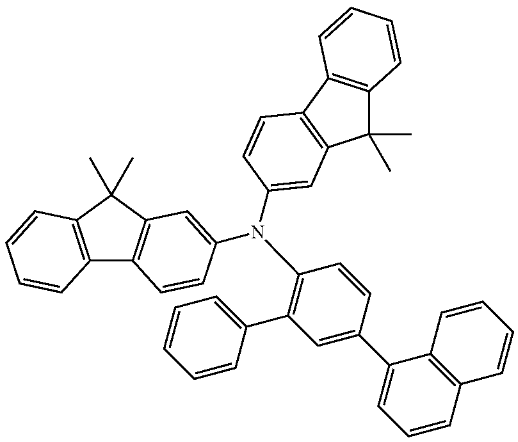
2-186
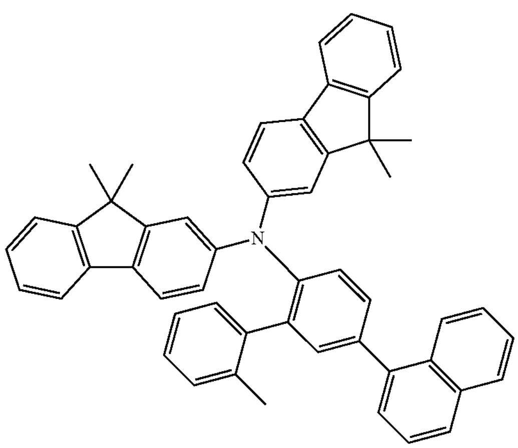
2-187
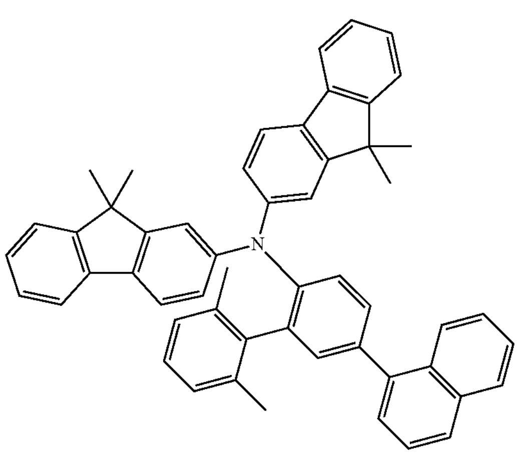
-continued
2-188
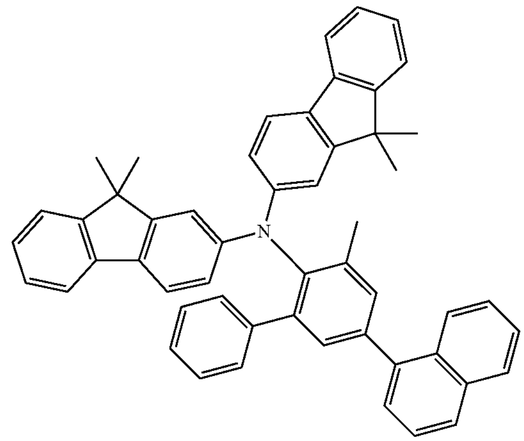
2-189
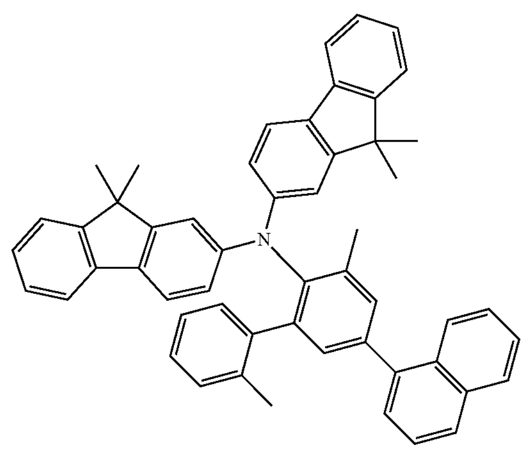
2-190
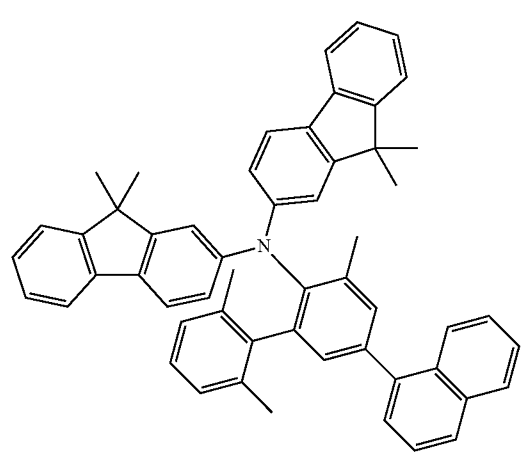

-continued
2-191
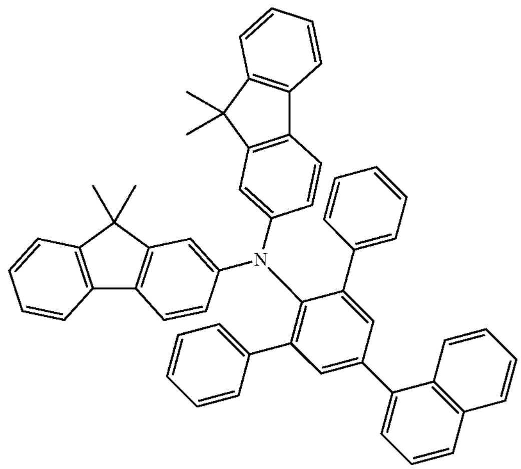
2-192
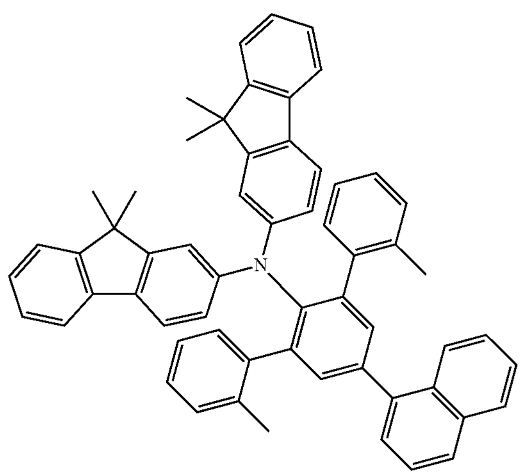
2-193
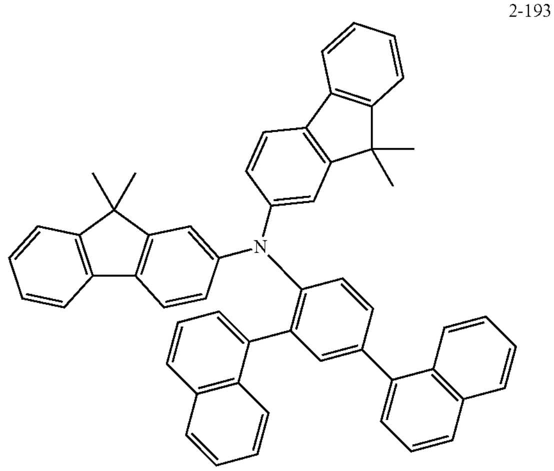
-continued
2-194
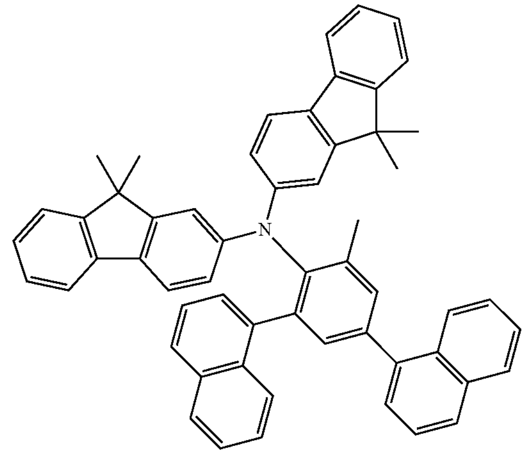
2-195
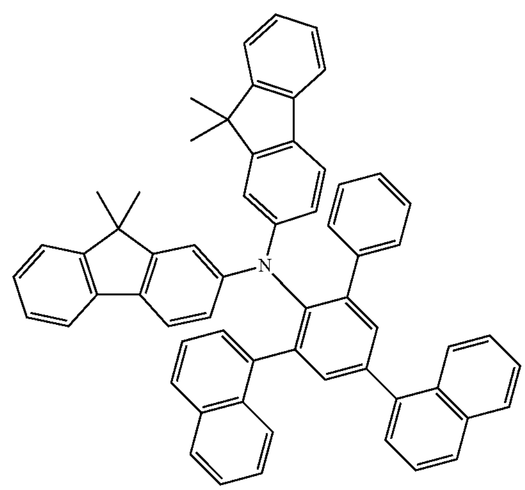
2-196
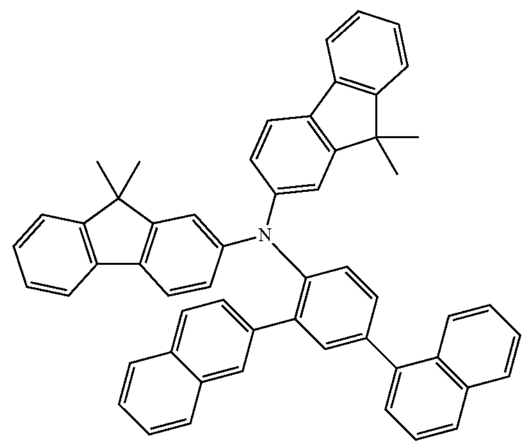

-continued
2-197
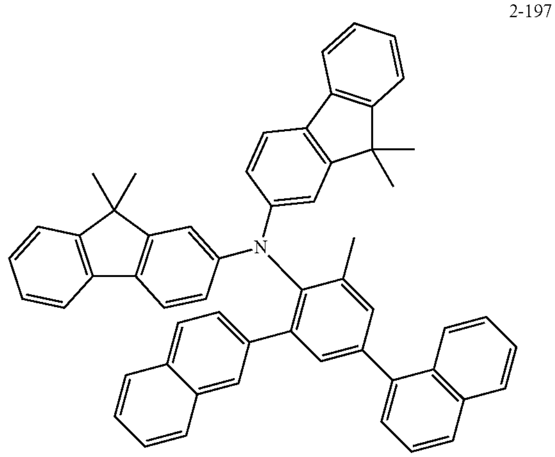
2-198
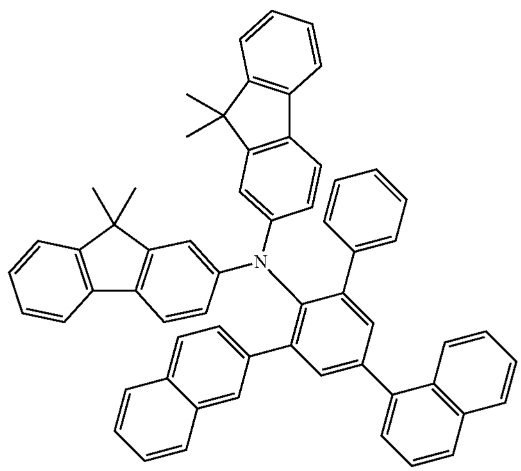
2-199
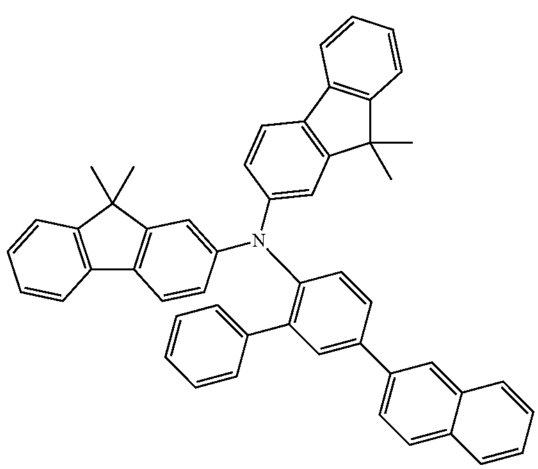
-continued
2-200
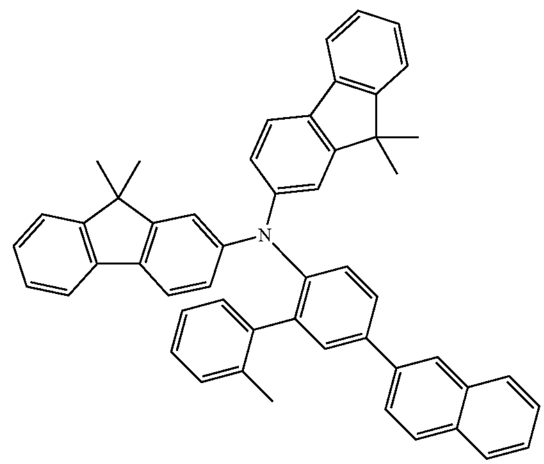
2-201
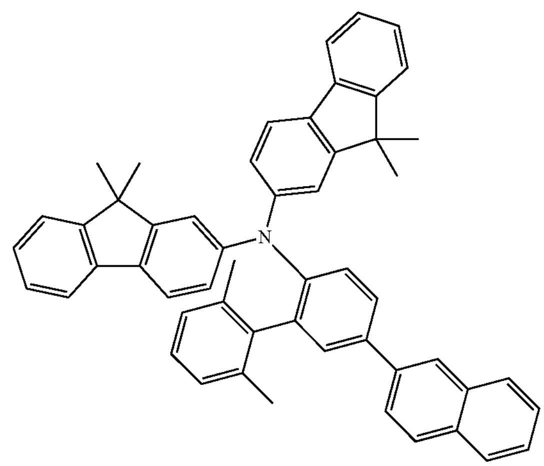
2-202
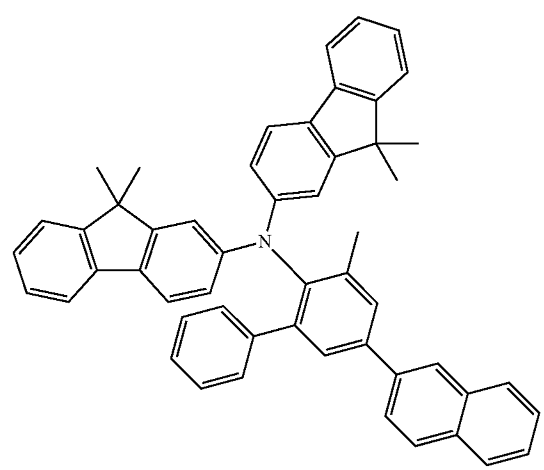

-continued
2-203
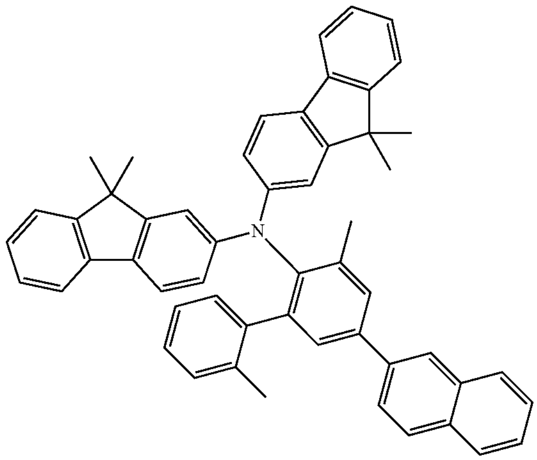
2-204
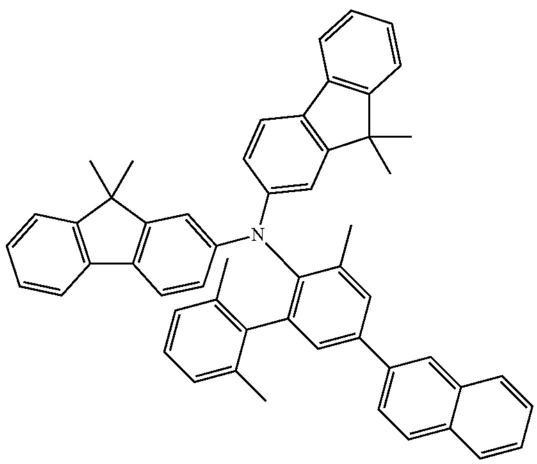
2-205
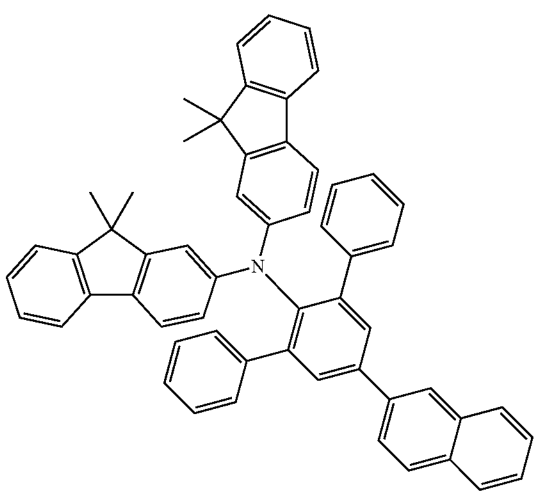
-continued
2-206
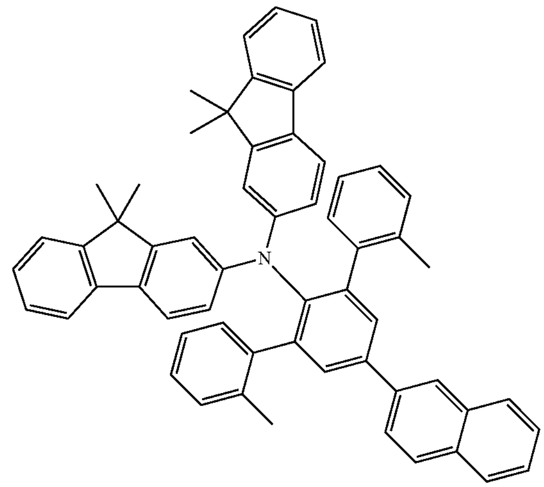
2-207
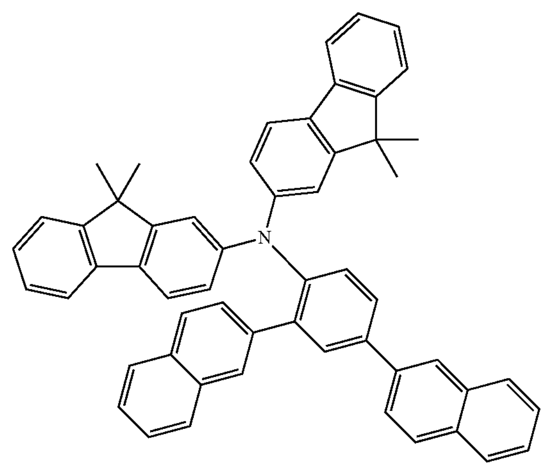
2-208
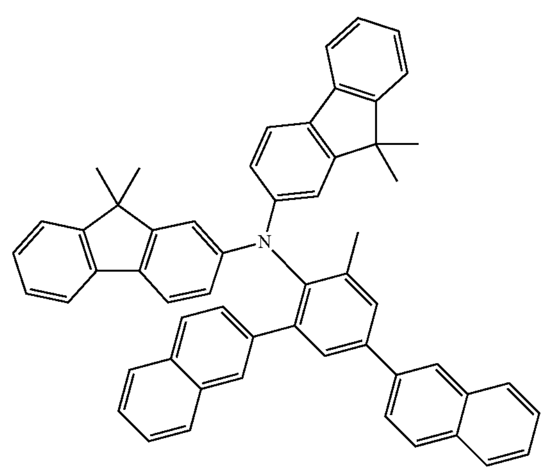

-continued
2-209
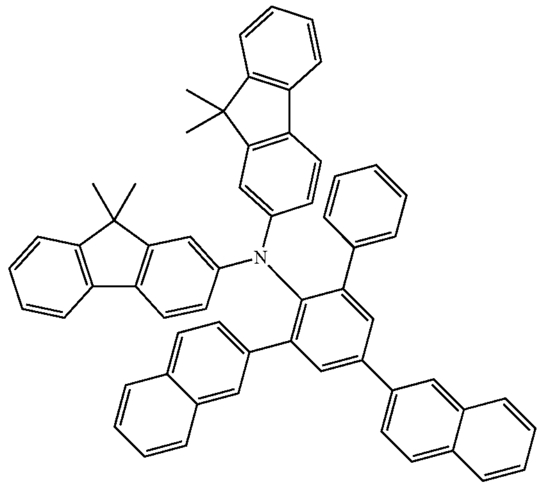
2-210
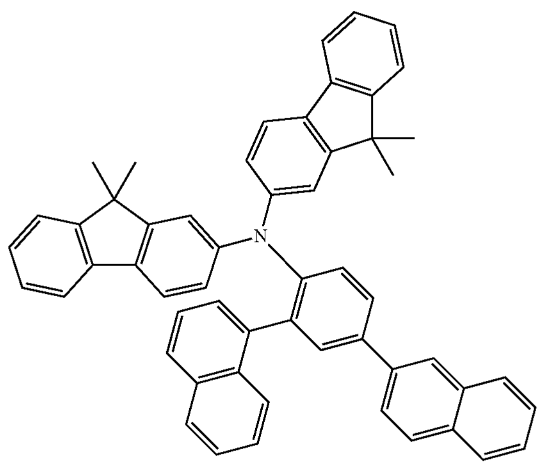
Specifically, the compound represented by Chemical Formula 3 may be represented by one of the following compounds. However, the present disclosure is not limited thereto.
3-1
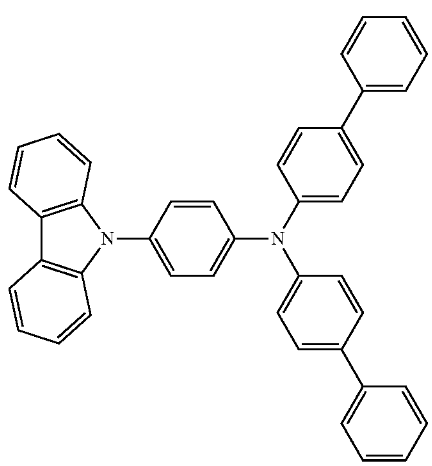
-continued
3-2
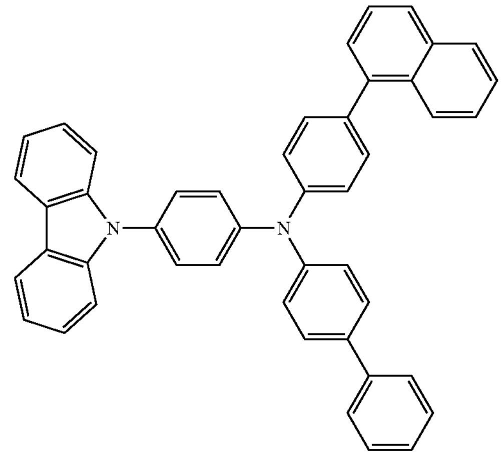
3-3
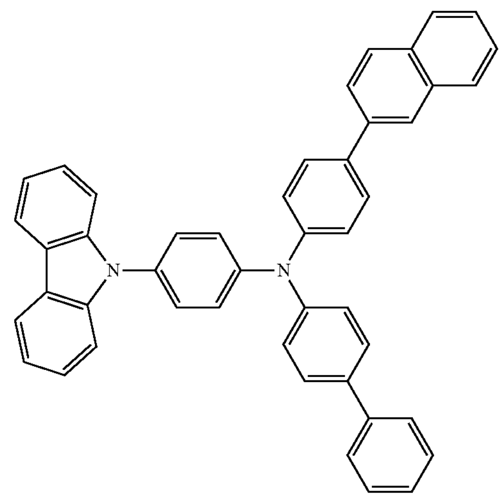
3-4
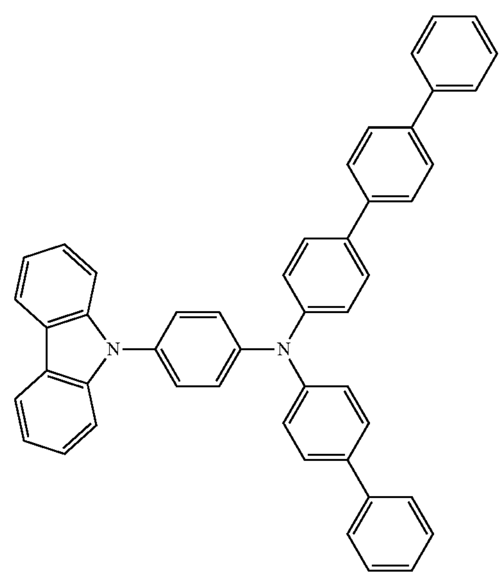

-continued
3-5
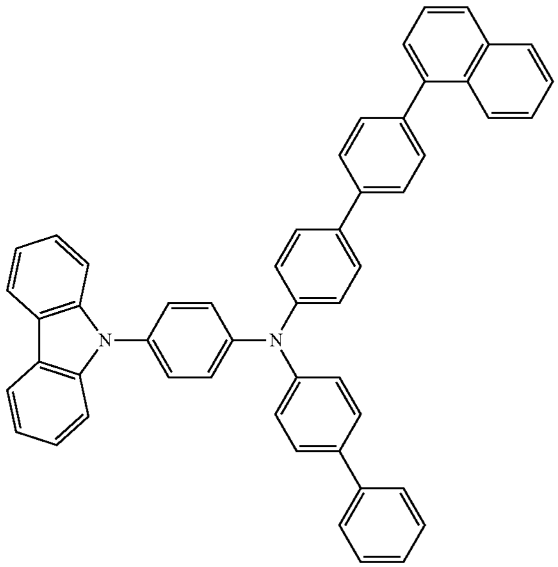
3-6
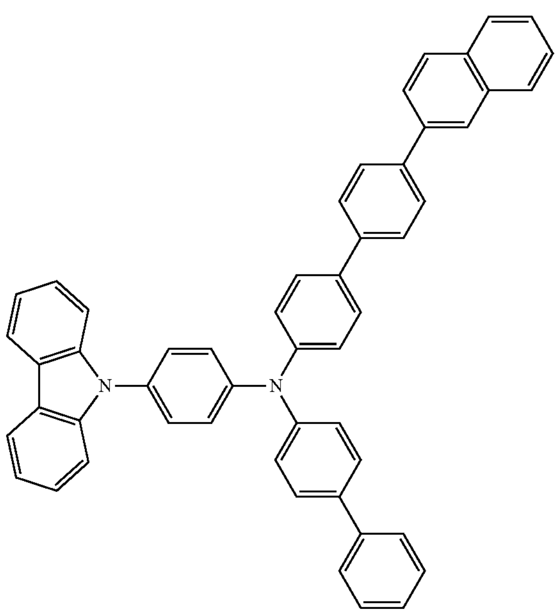
-continued
3-7
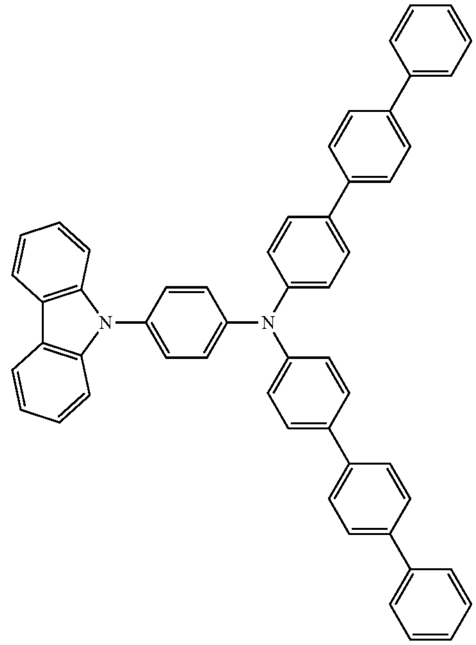
3-8
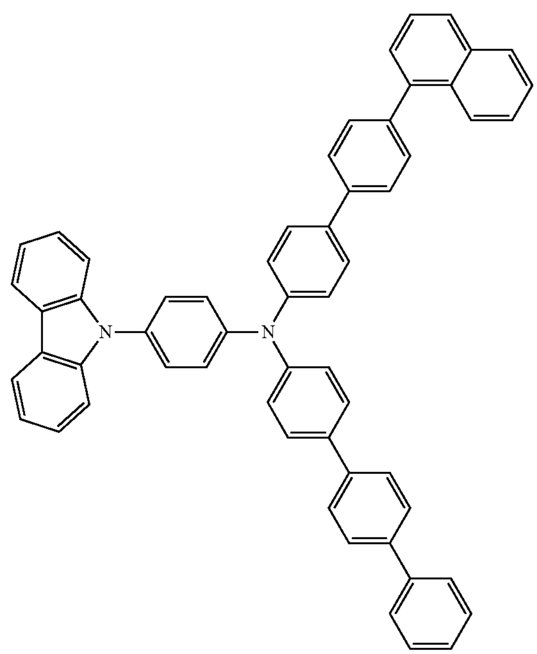

-continued
3-9
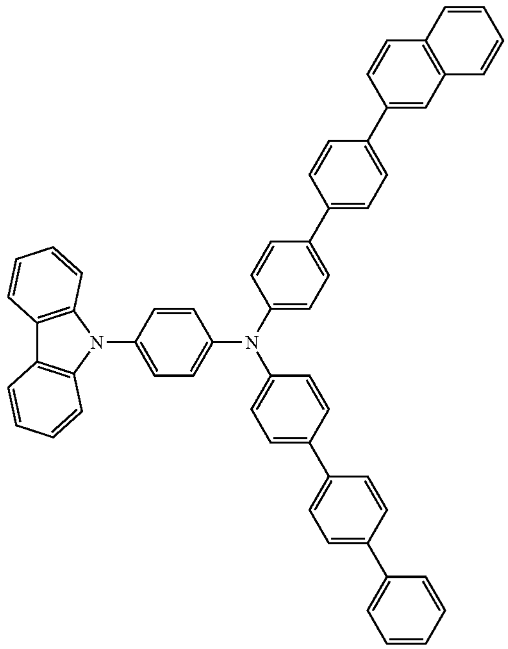
3-10
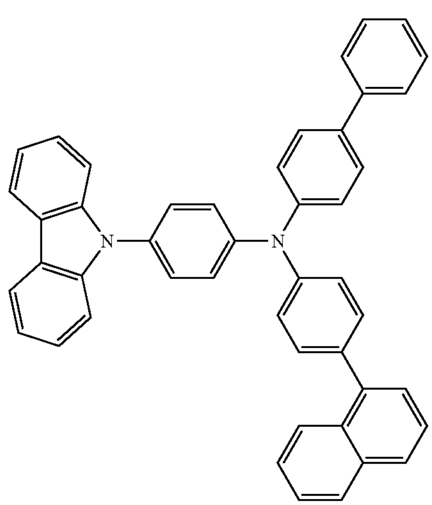
-continued
3-11
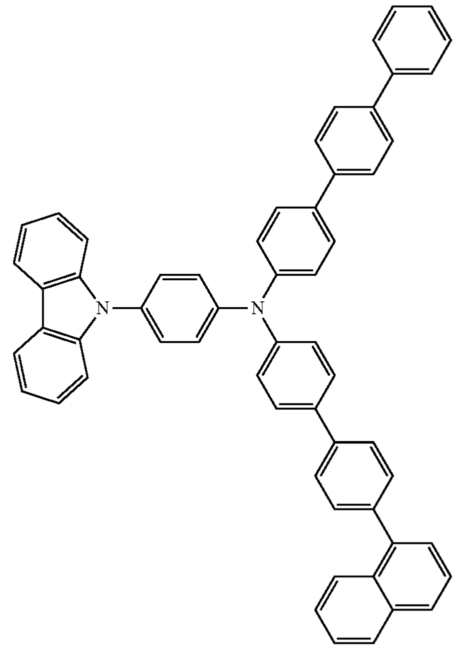
3-12
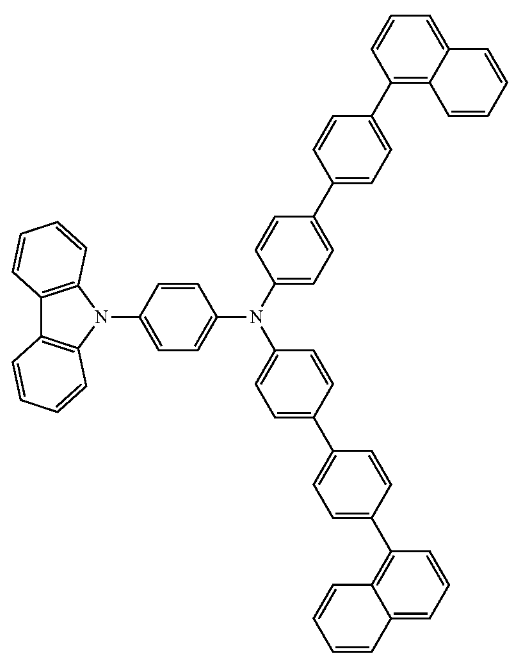

-continued
3-13
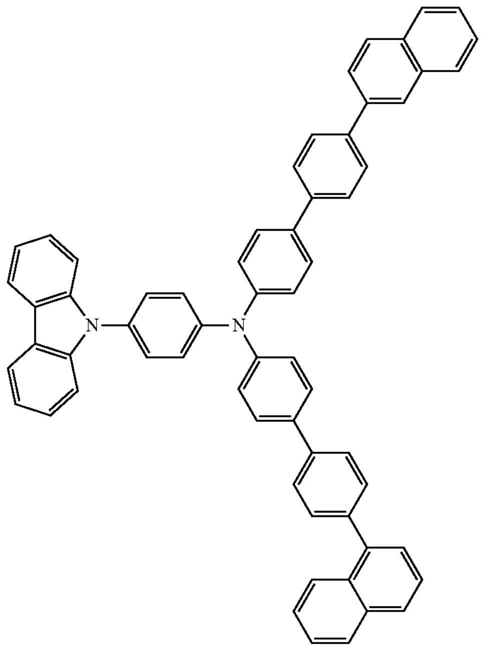
3-14
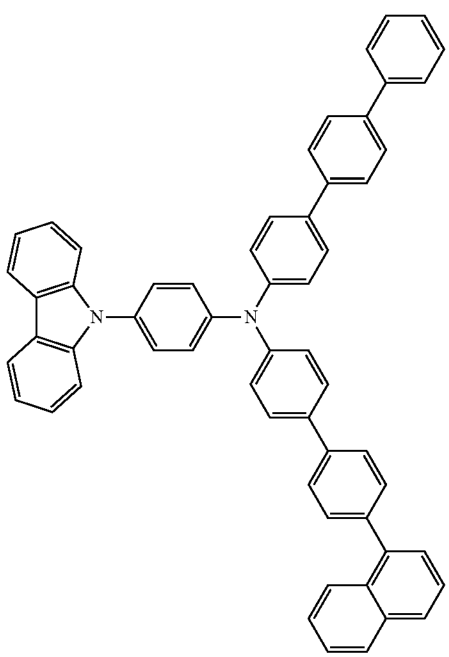
-continued
3-15
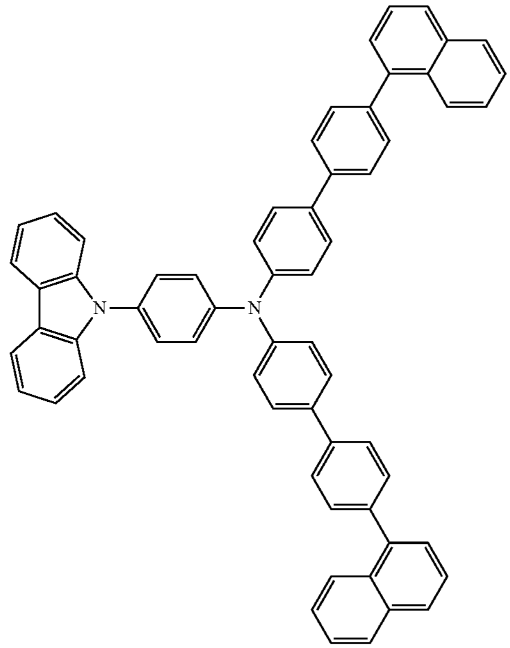
3-16
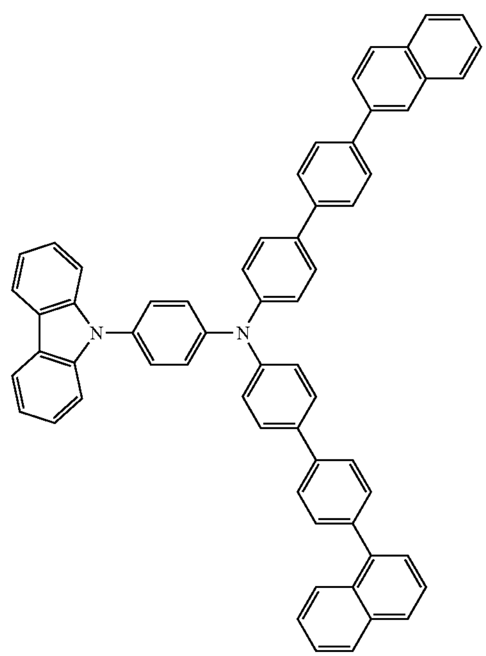

-continued
3-17
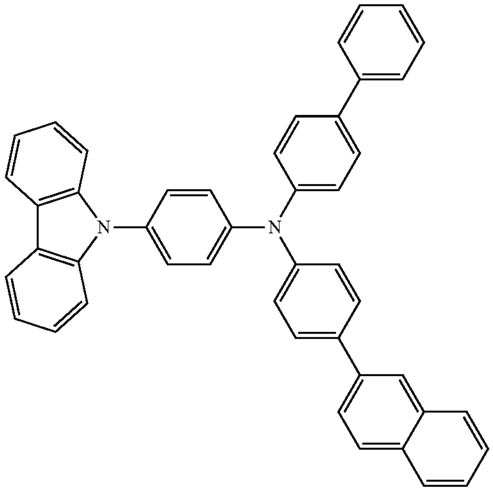
3-18
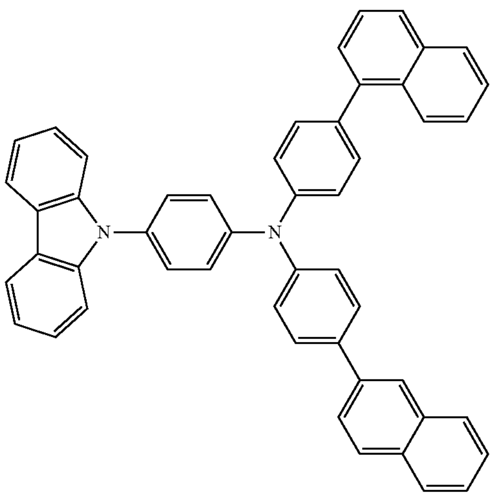
3-19
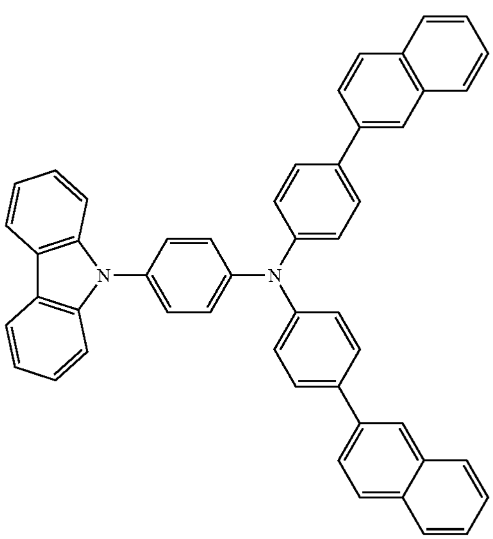
-continued
3-20
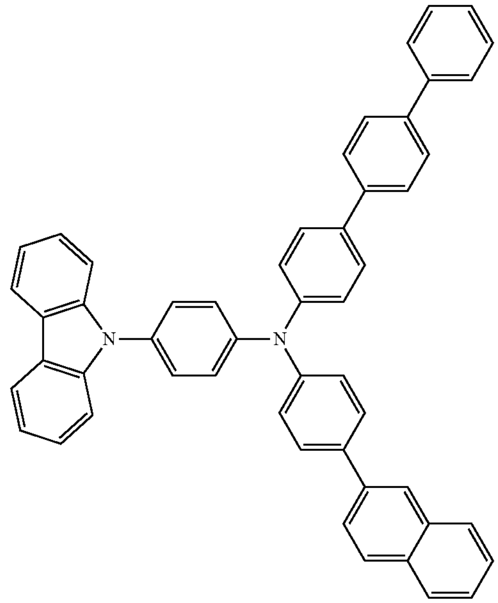
3-21
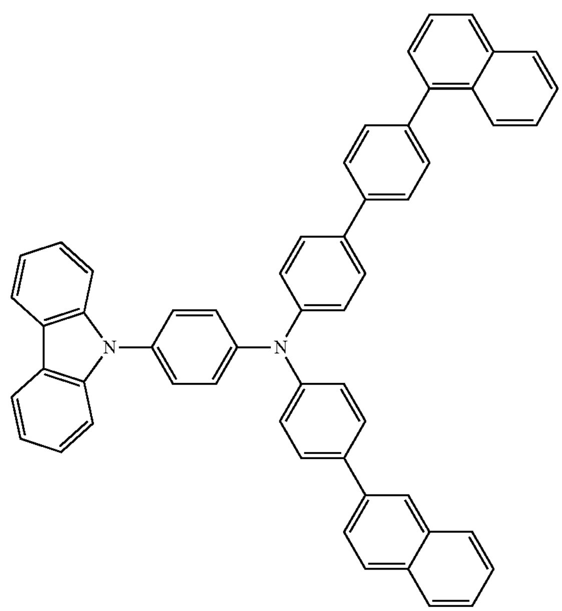

-continued
3-22
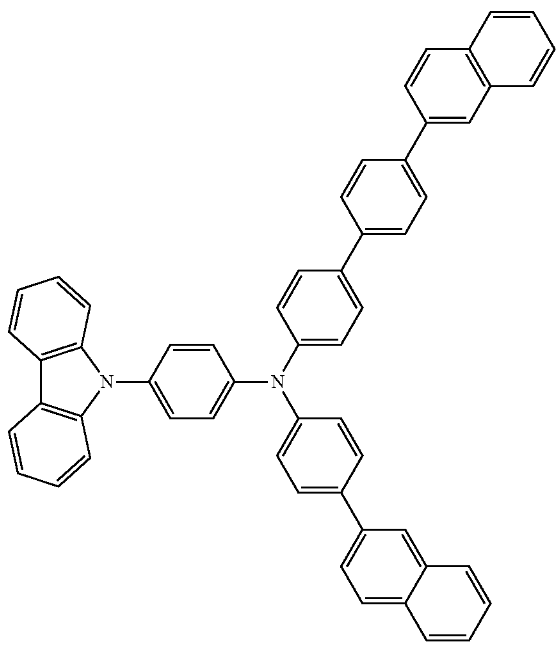
3-23
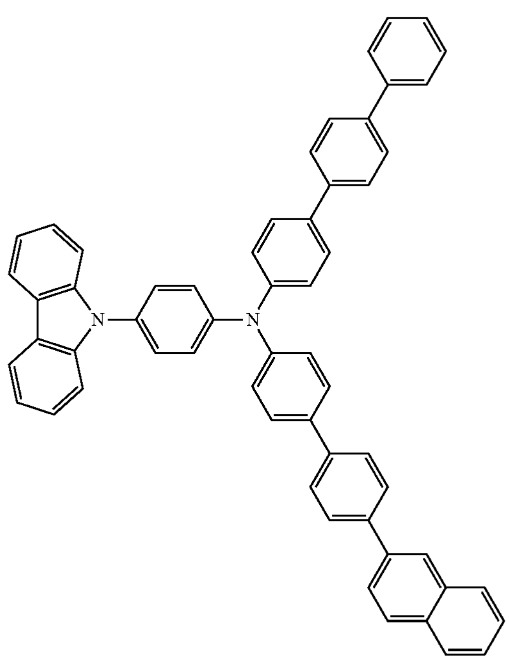
-continued
3-24
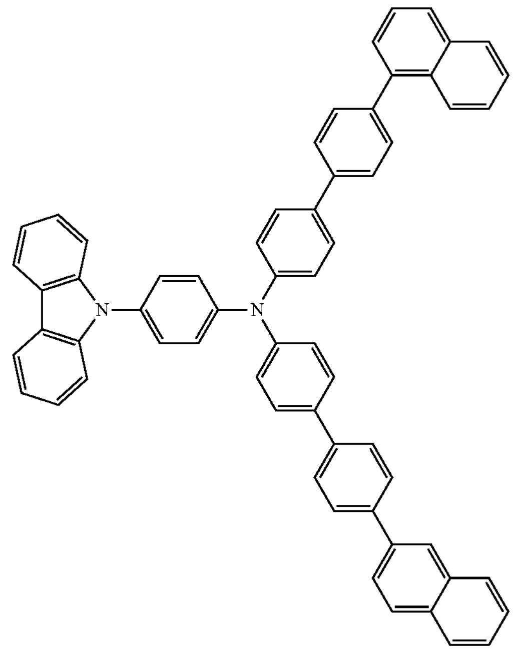
3-25
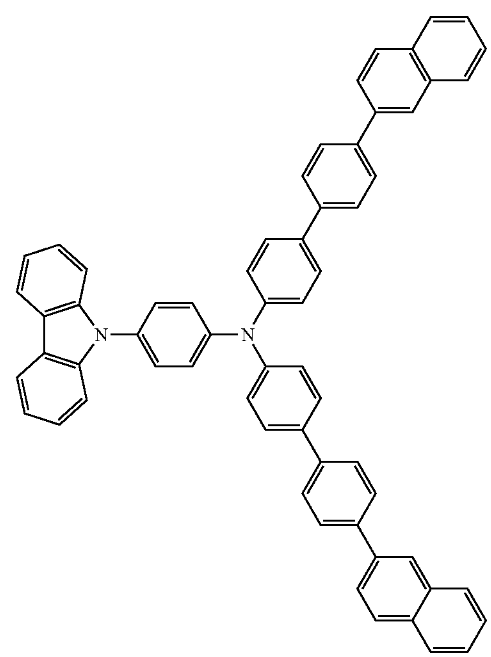

-continued
3-26
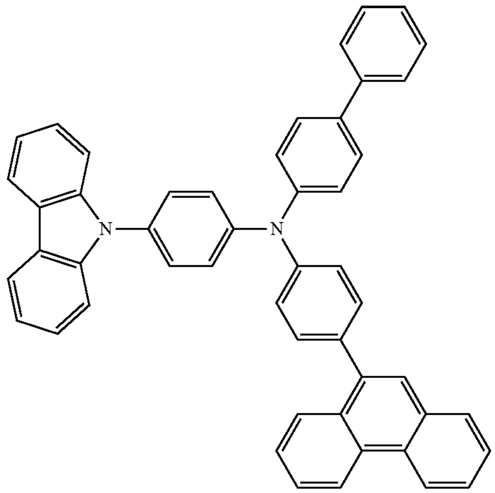
3-27
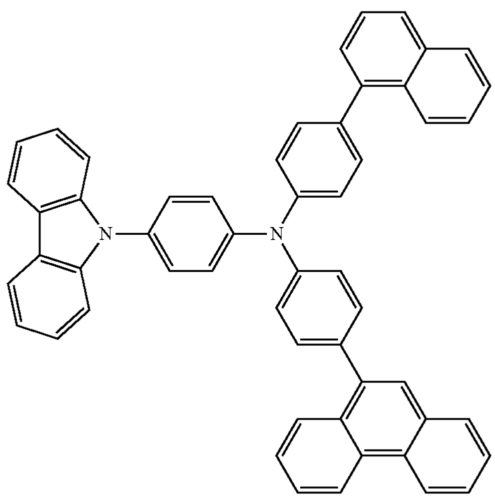
3-28
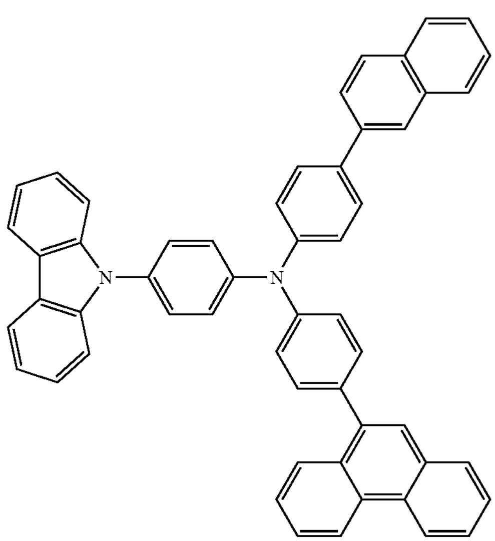
-continued
3-29
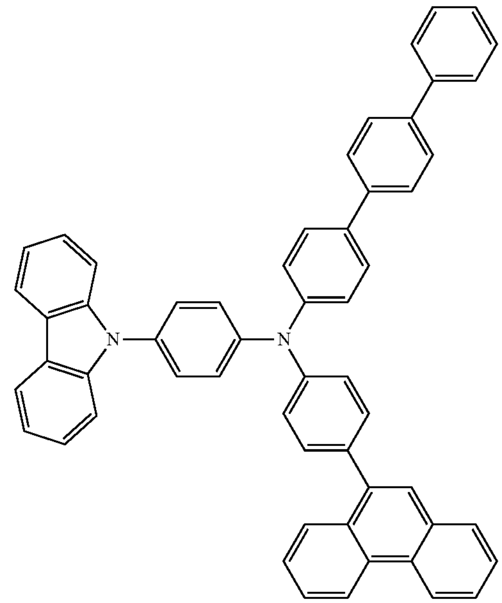
3-30
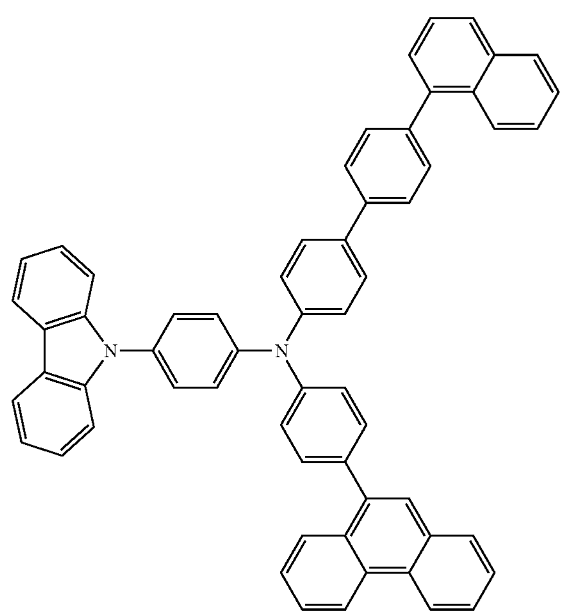

-continued
3-31
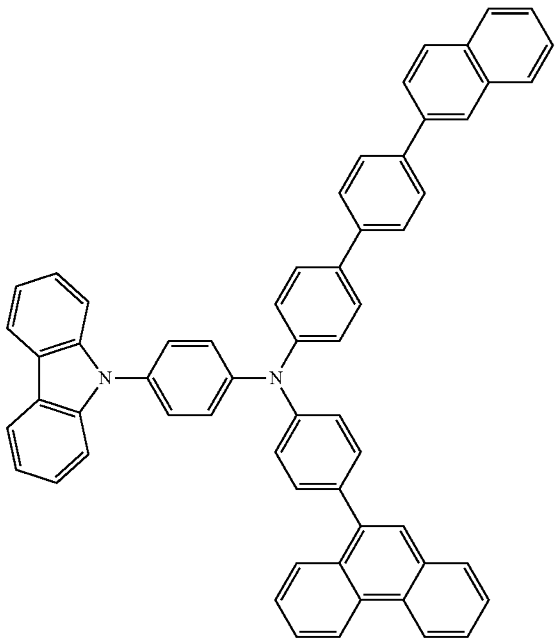
-continued
3-33
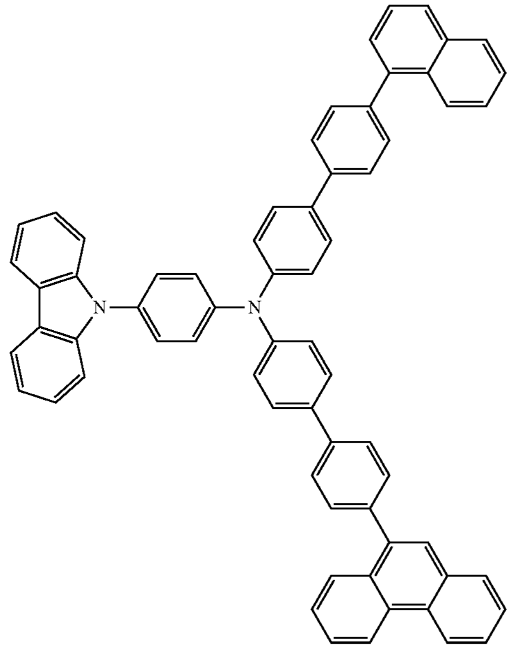
3-32
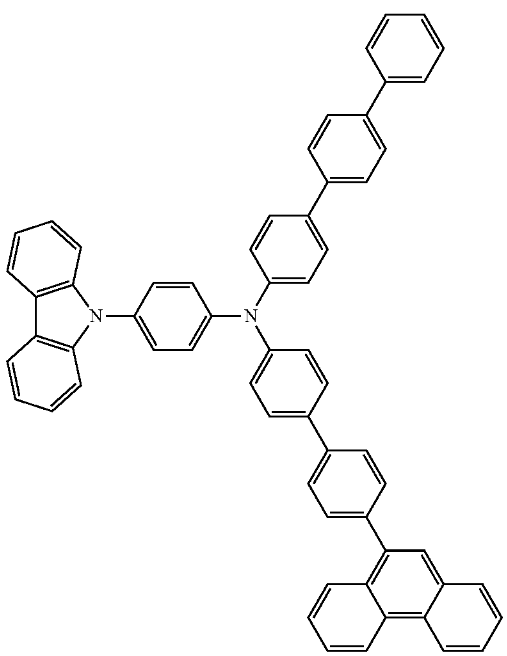
3-34
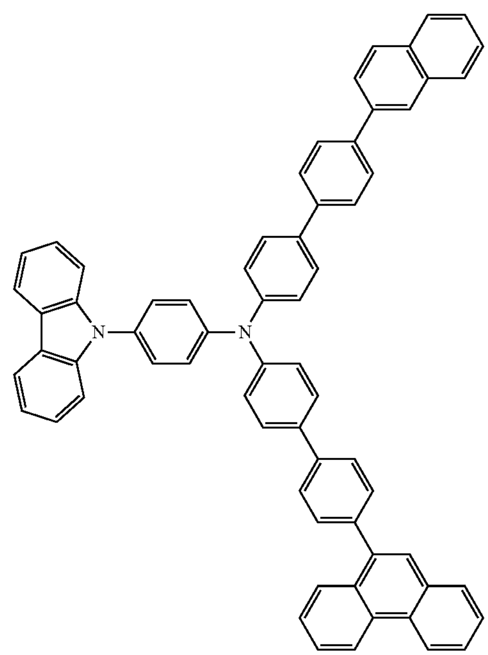

-continued
3-35
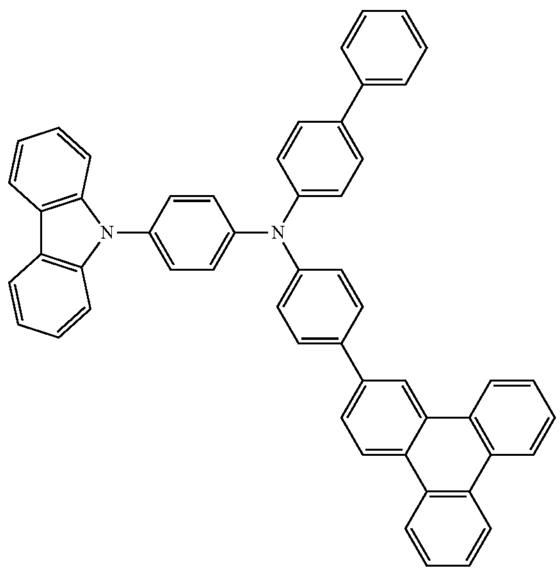
3-36
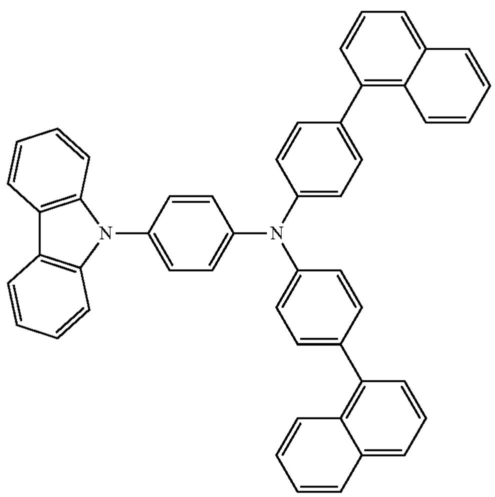
3-37
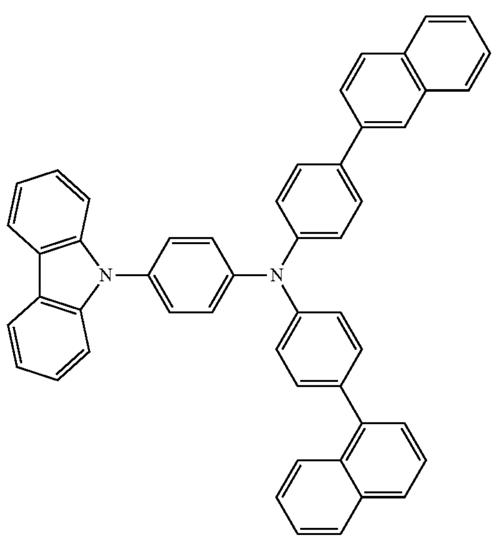
-continued
3-38
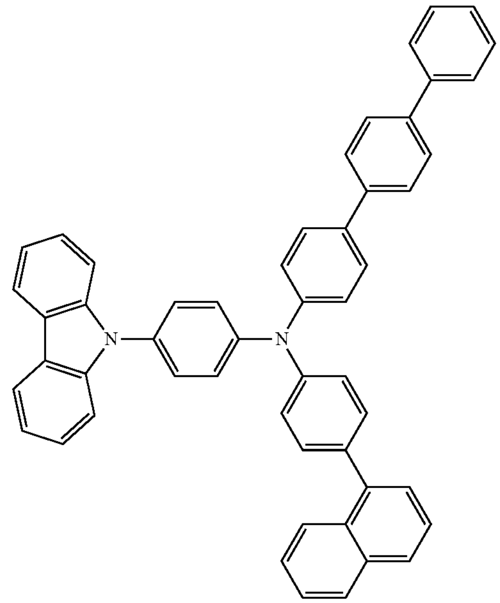
3-39
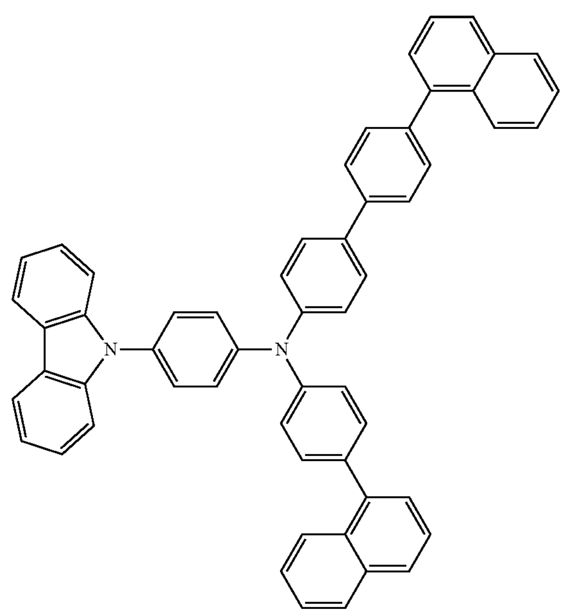

-continued
3-40
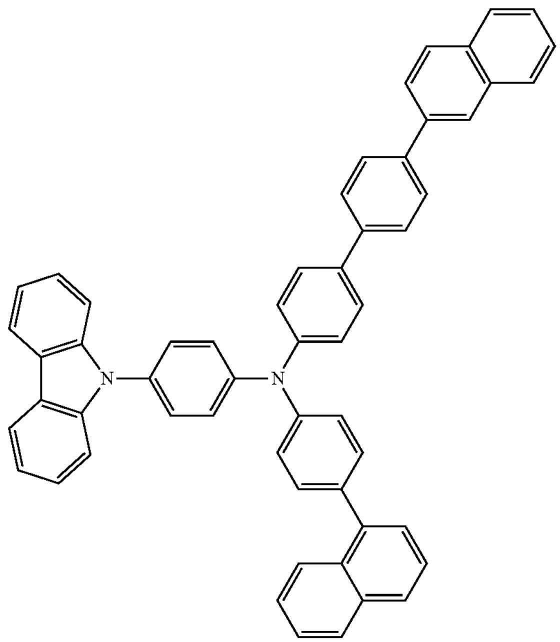
3-41
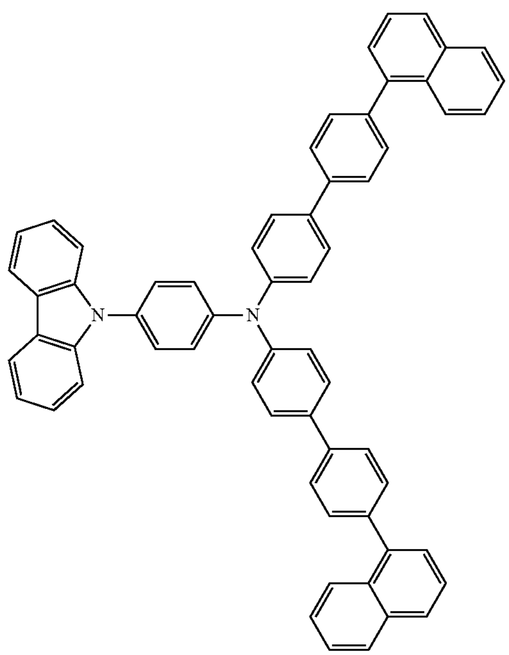
-continued
3-42
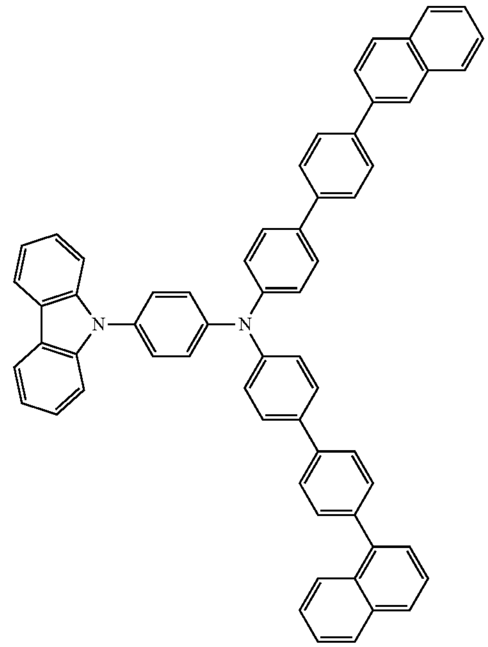
3-43
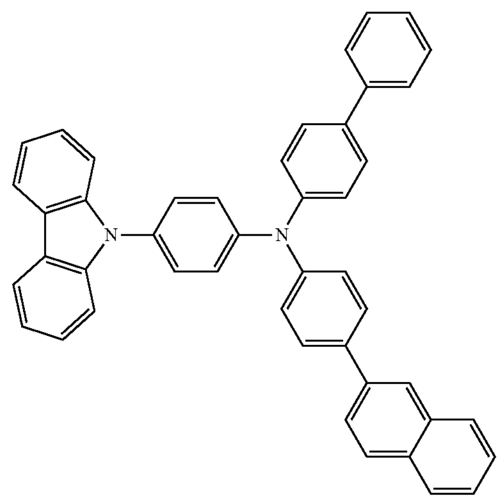
3-44
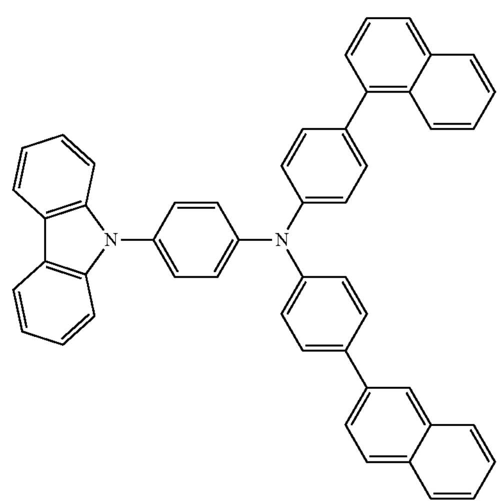

3-45
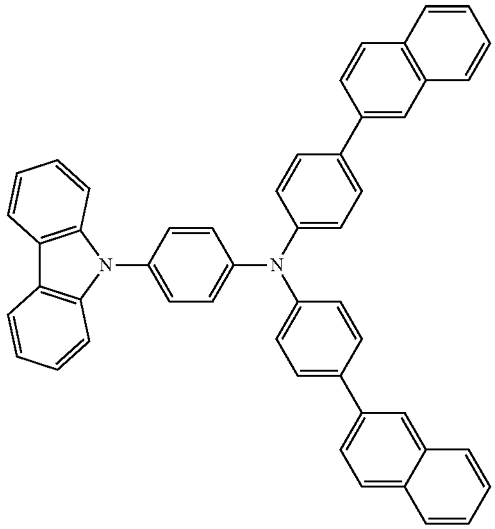
3-46
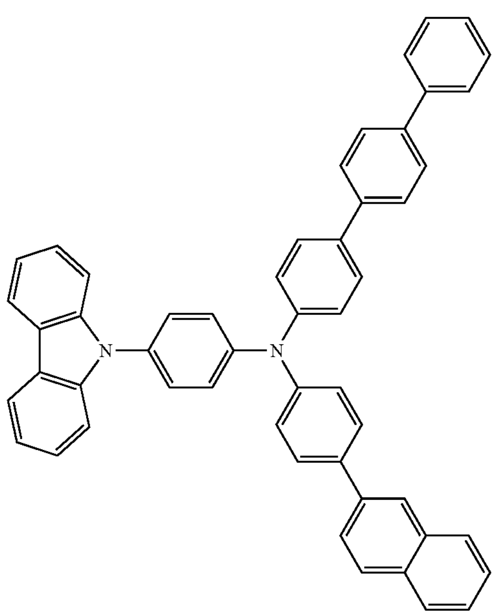
3-47
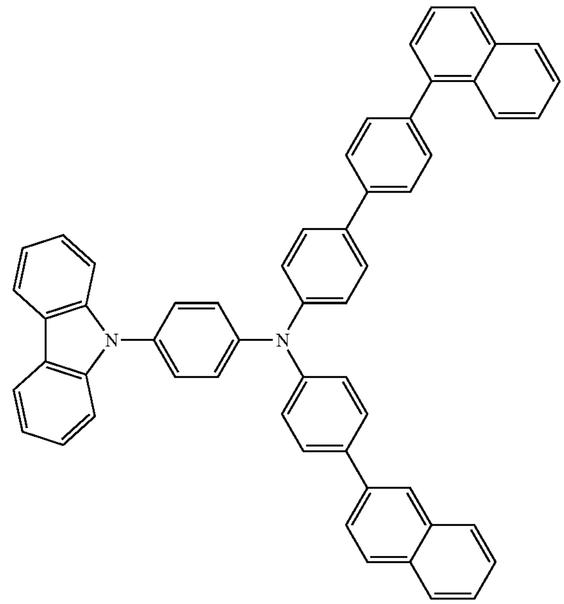
3-48
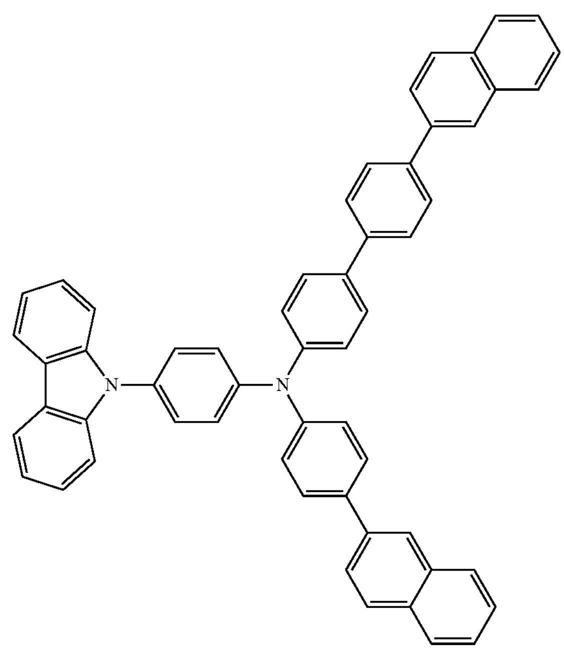

-continued
3-49
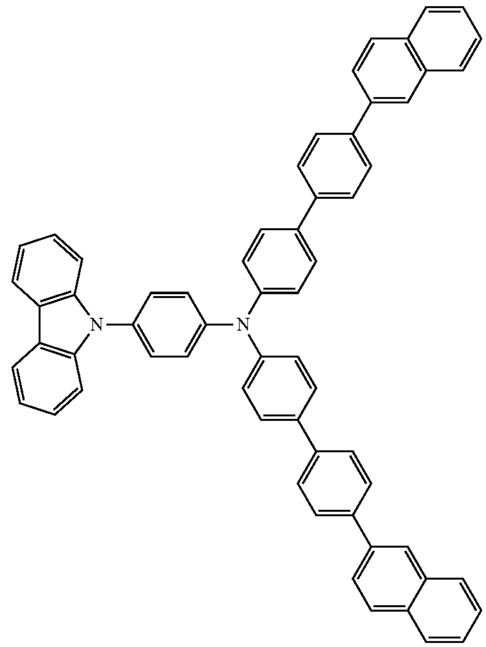
3-50
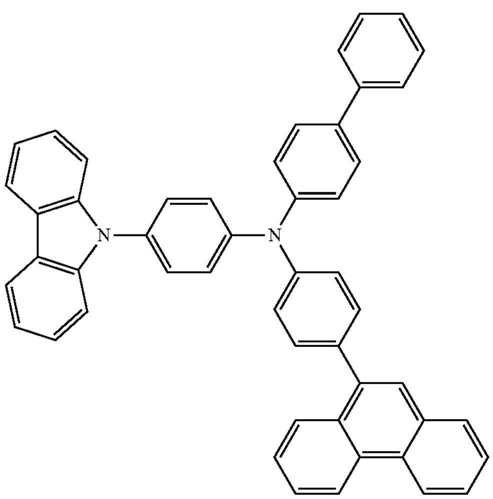
3-51
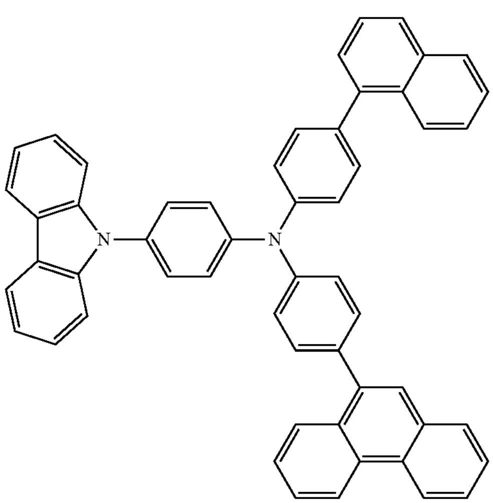
-continued
3-52
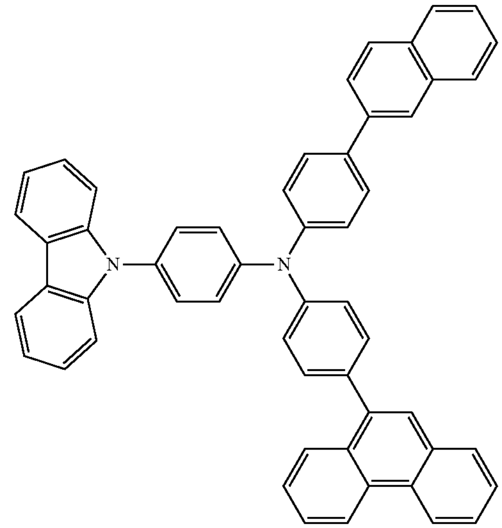
3-53
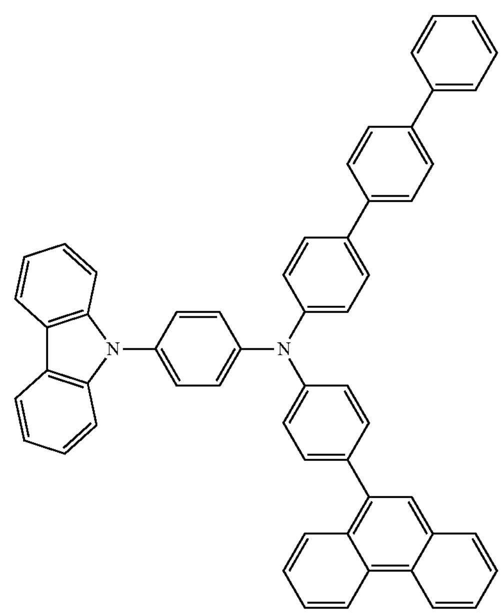

3-54
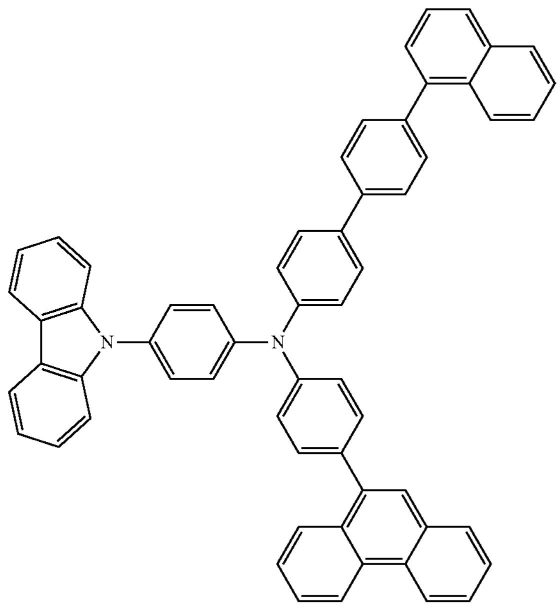
3-55
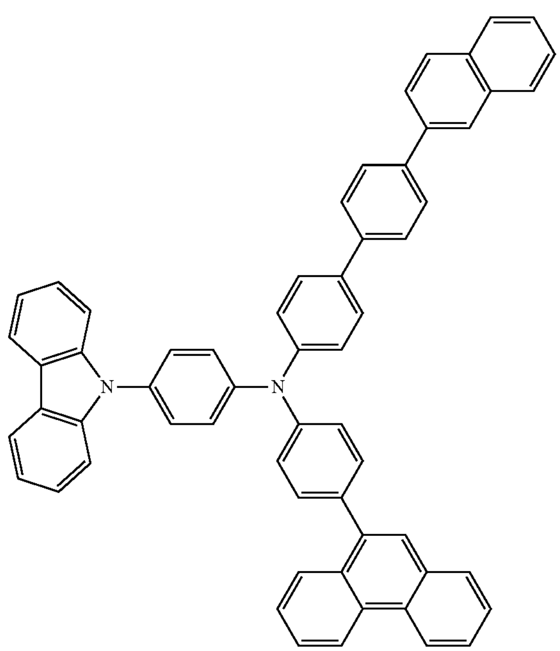
3-56
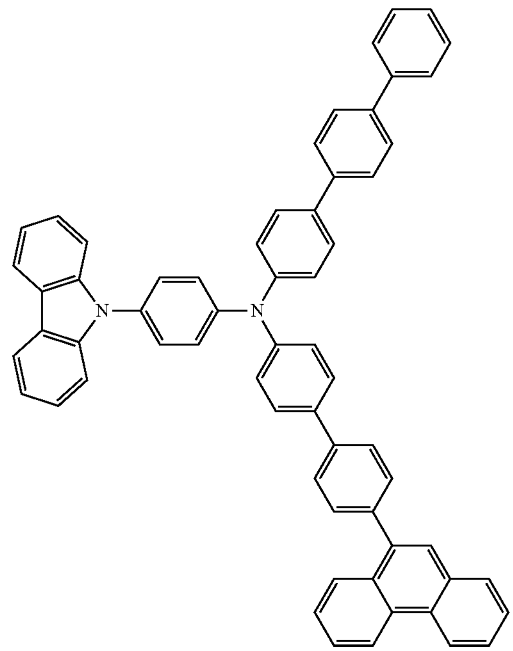
3-57
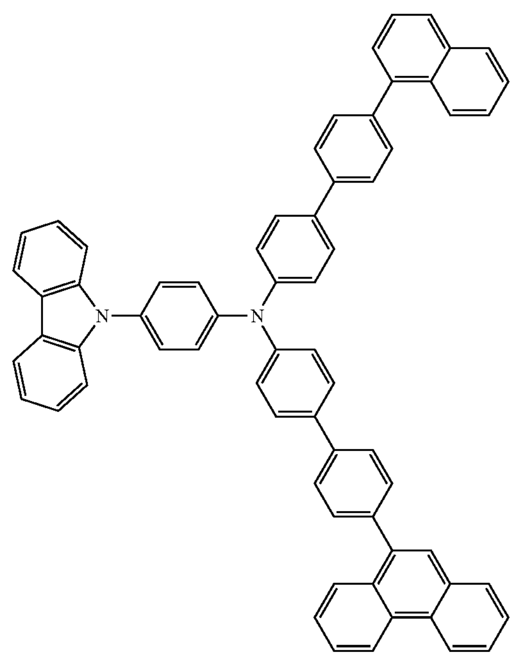

-continued
3-58
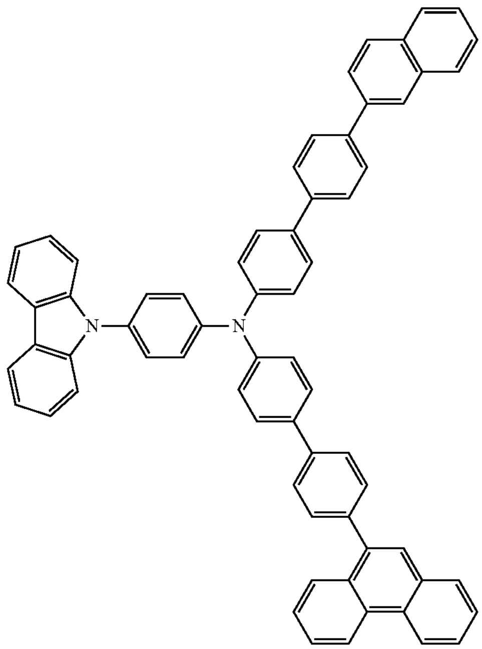
3-59
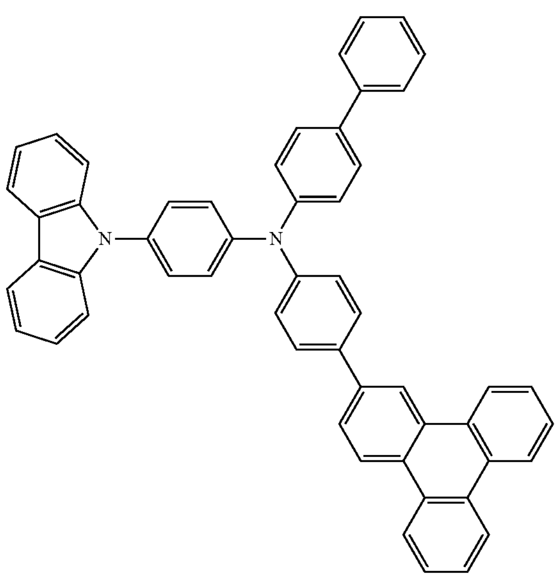
-continued
3-60
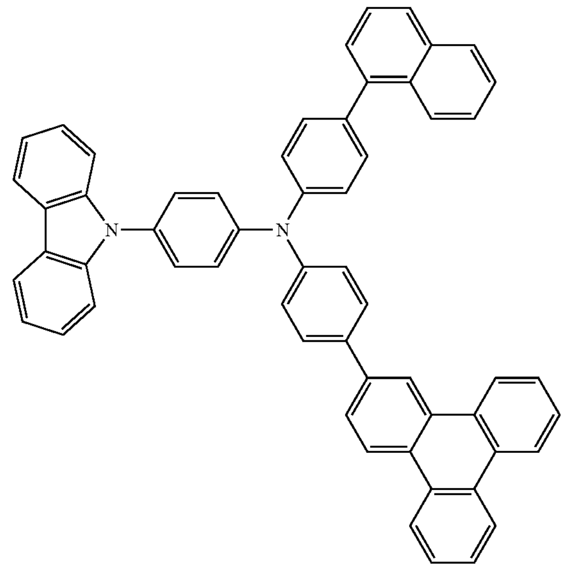
3-61
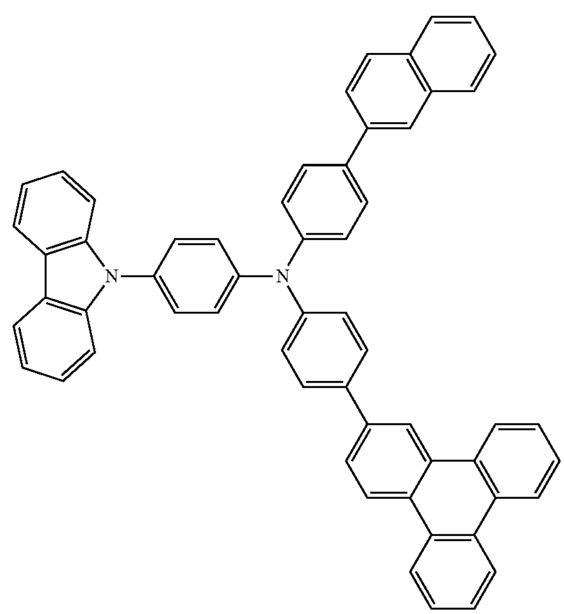

-continued
3-62
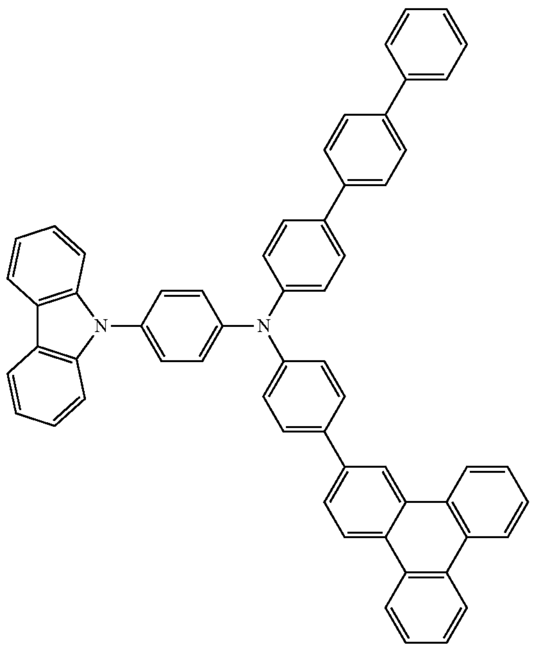
3-63
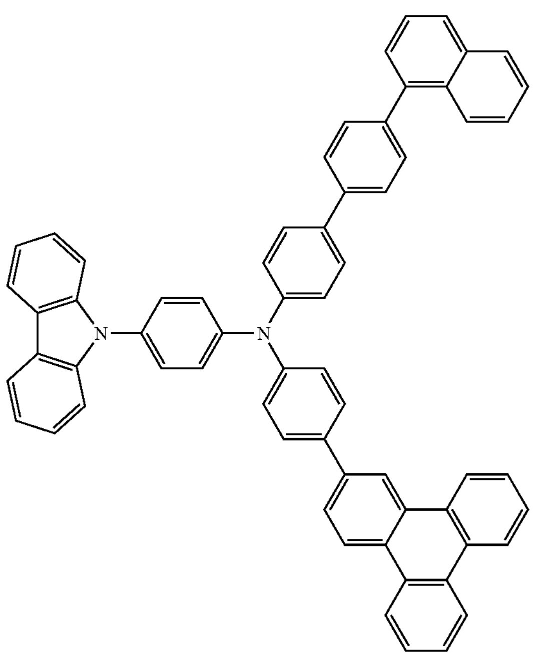
-continued
3-64
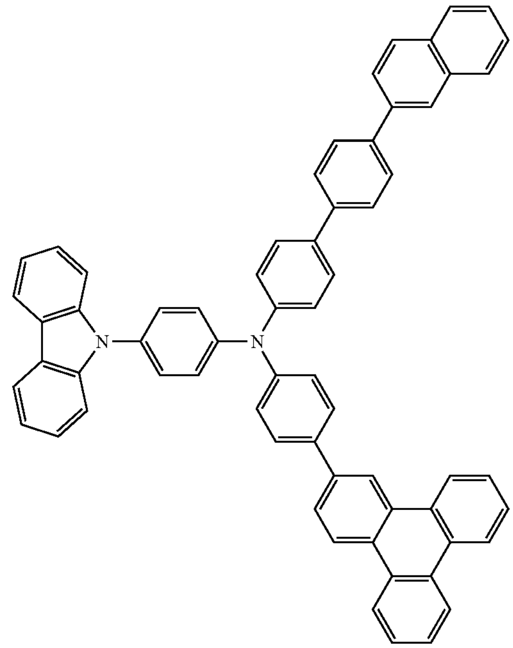
3-65
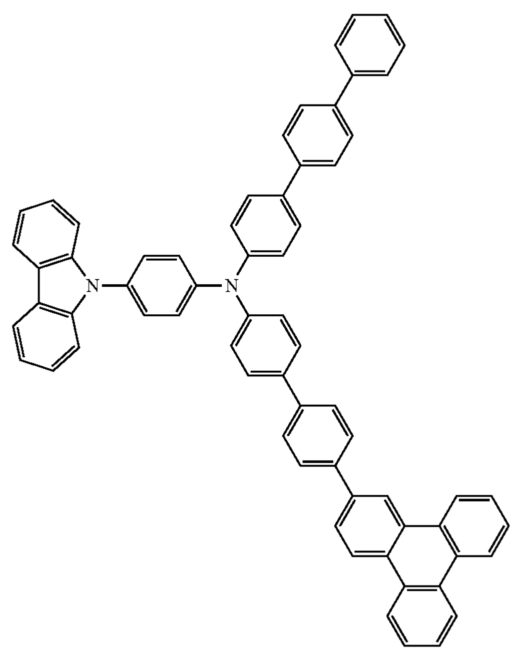

-continued
3-66
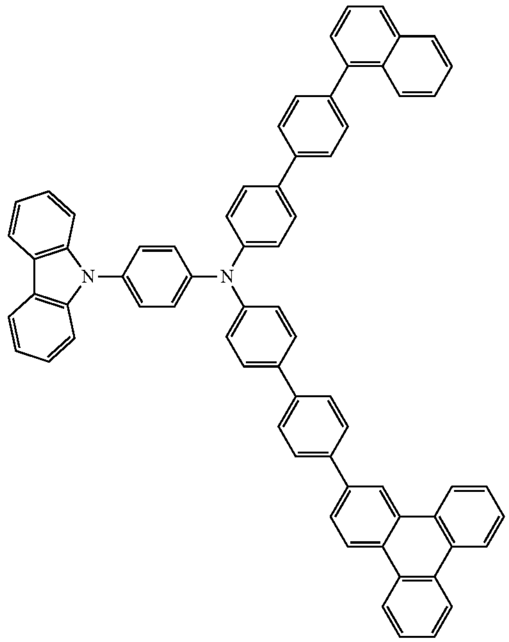
3-67
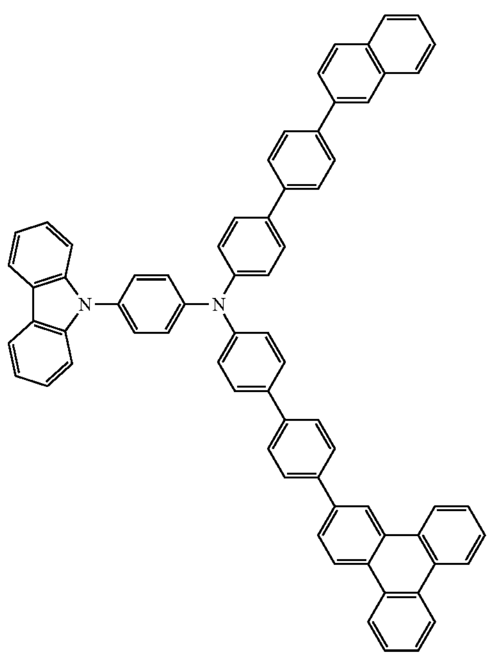
-continued
3-68
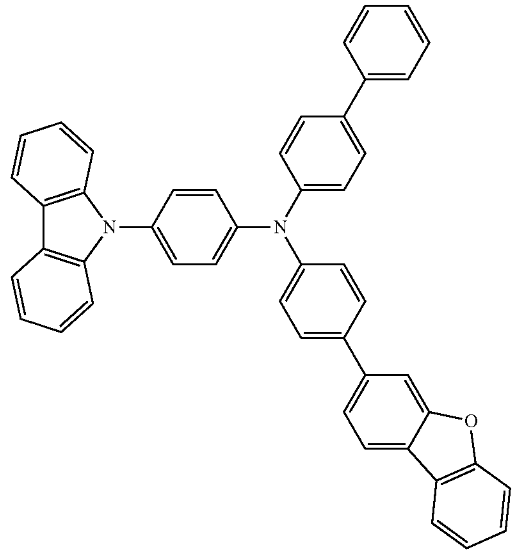
3-69
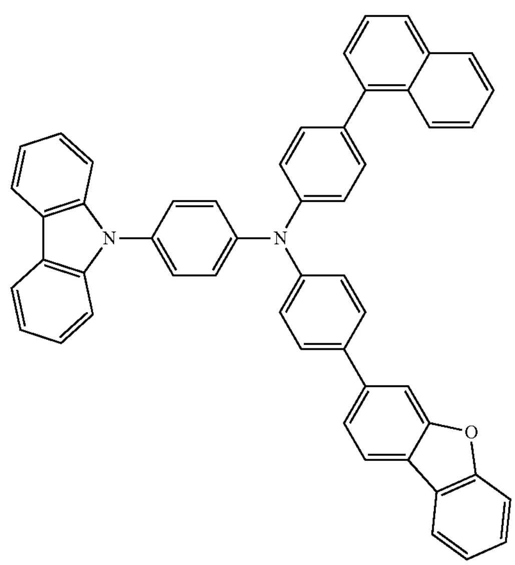

-continued
3-70
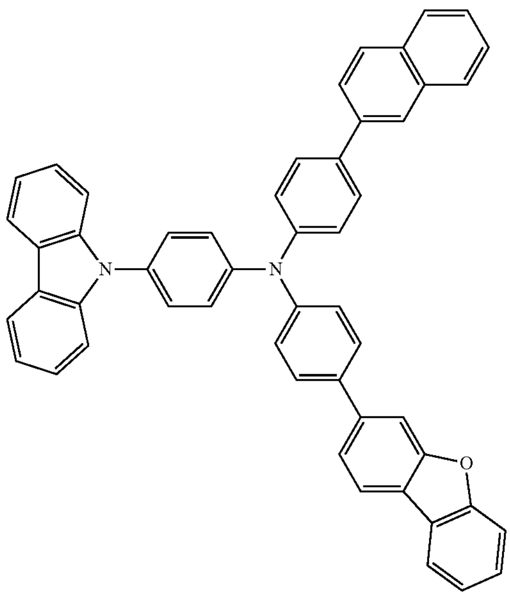
-continued
3-72
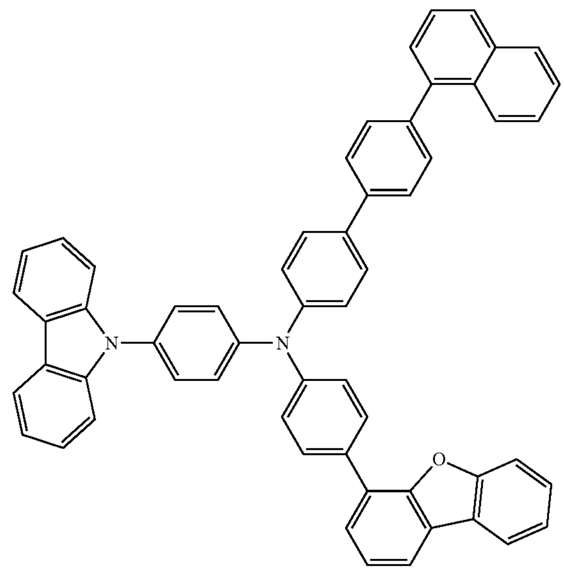
3-71
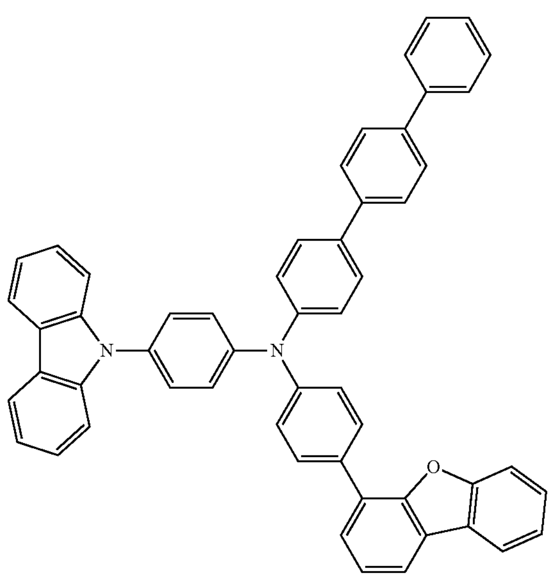
3-73
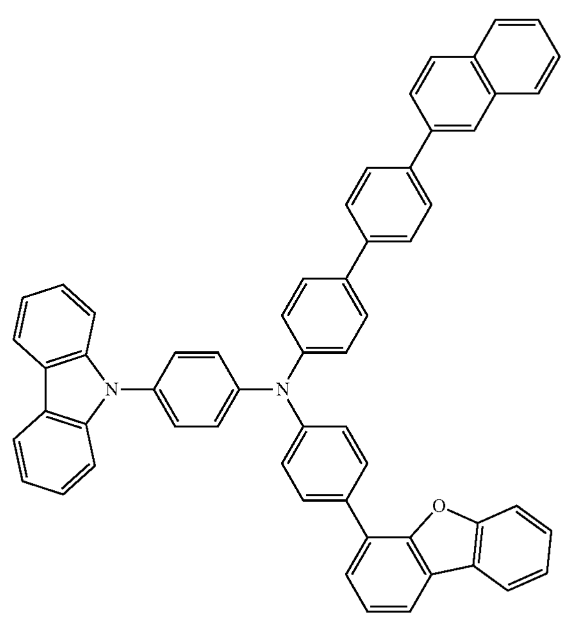

-continued
3-74
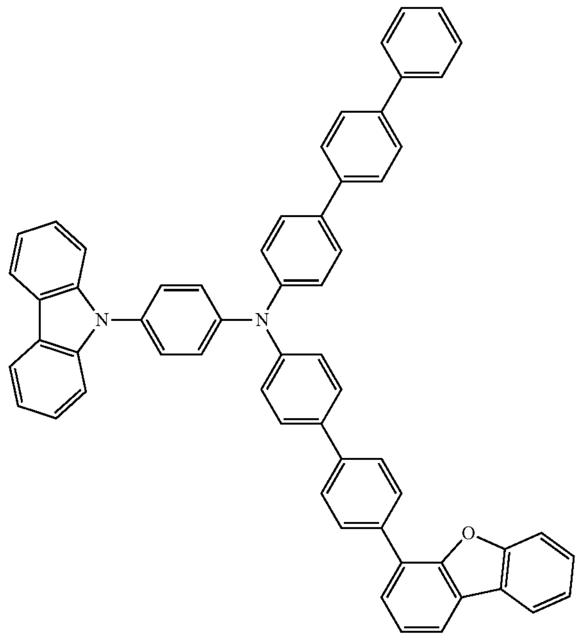
3-75
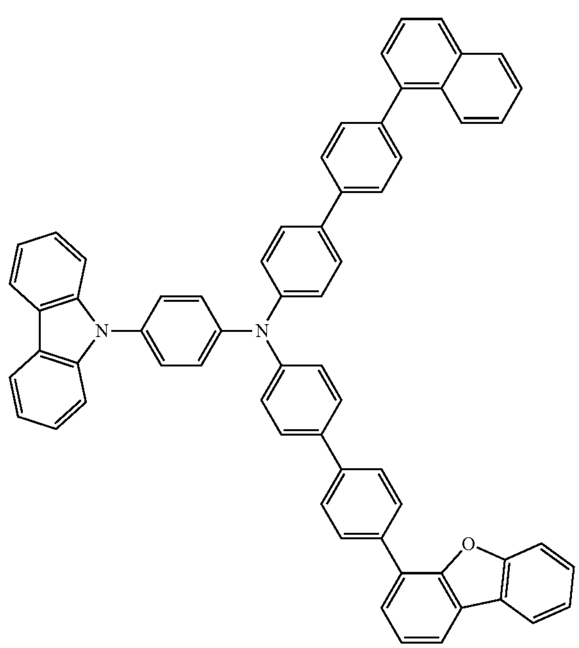
-continued
3-76
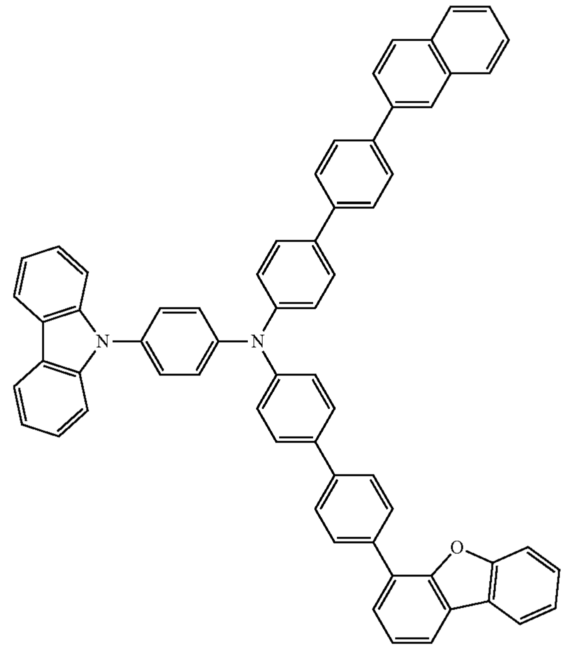
3-77
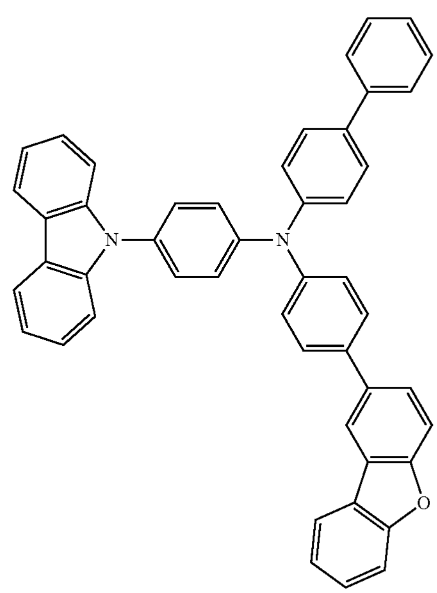

3-78
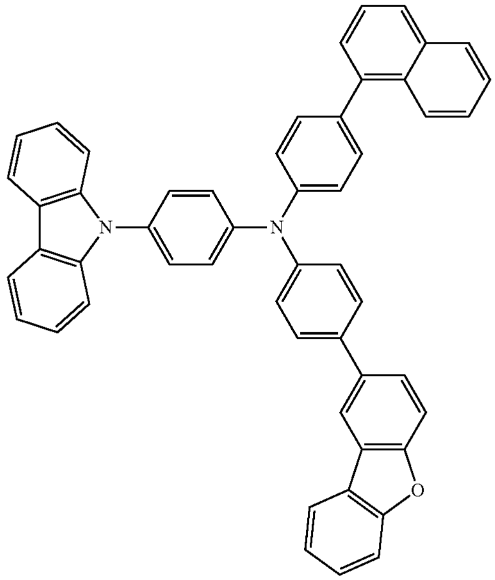
3-79
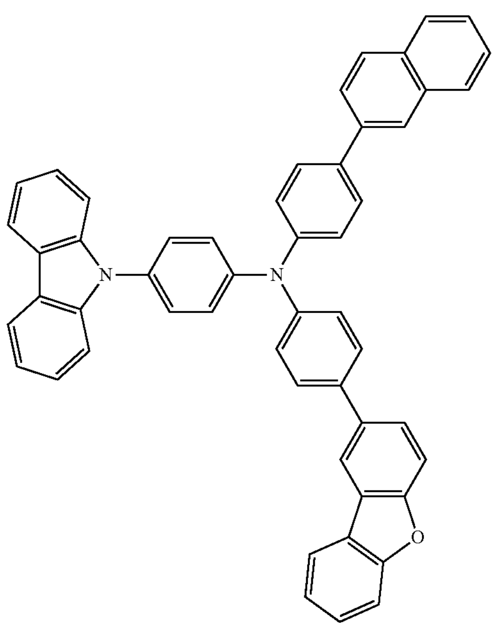
3-80
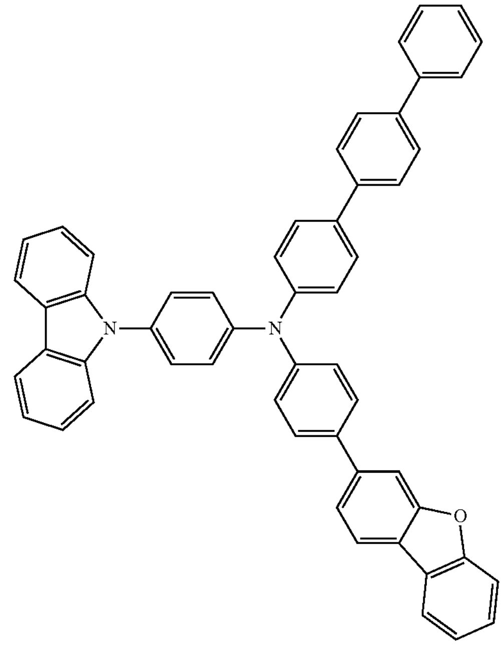
3-81
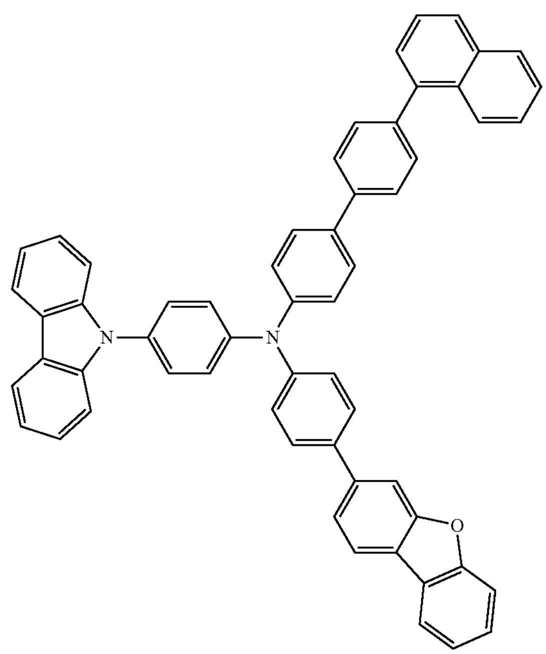

-continued
3-82
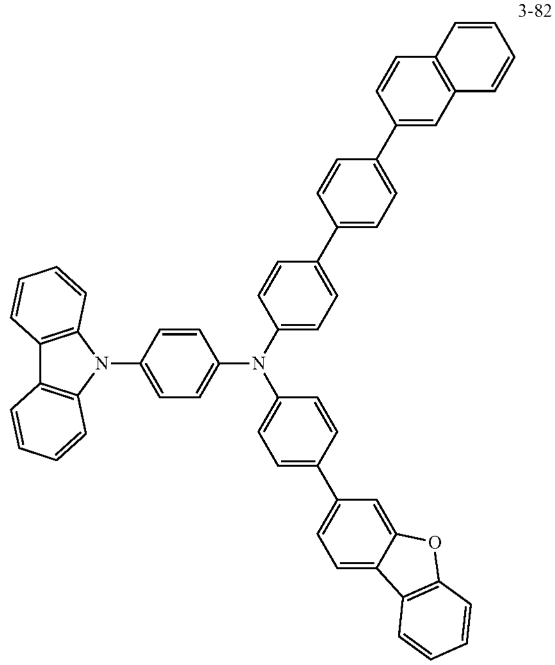
3-83
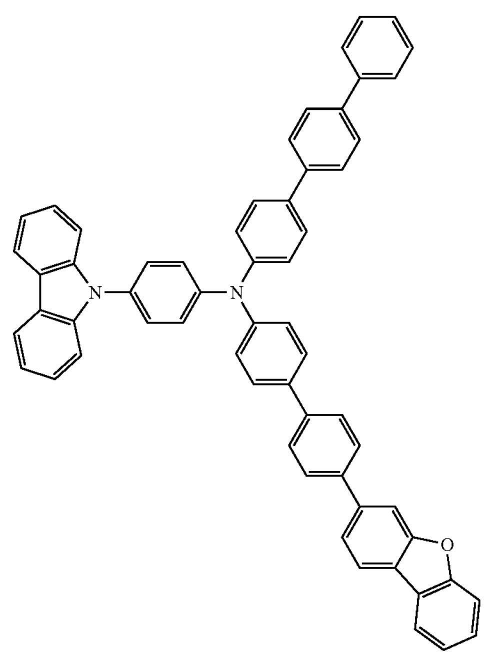
-continued
3-84
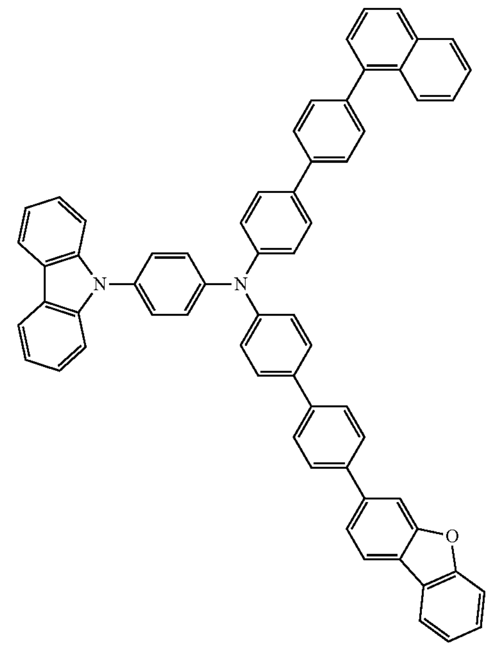
3-85
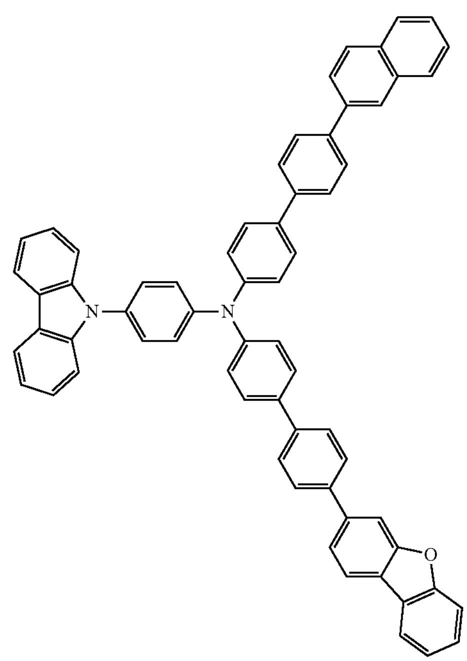

-continued
3-86
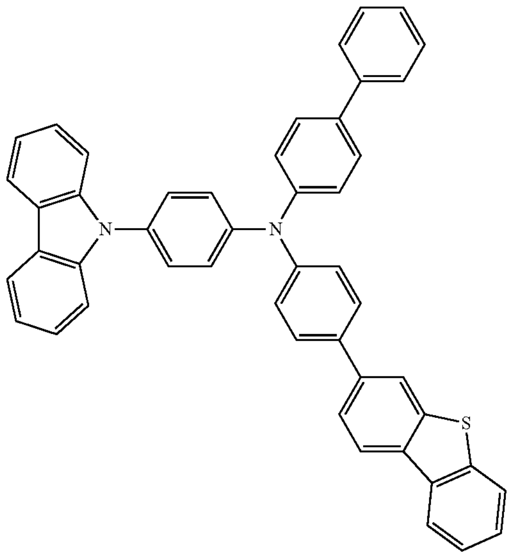
3-87
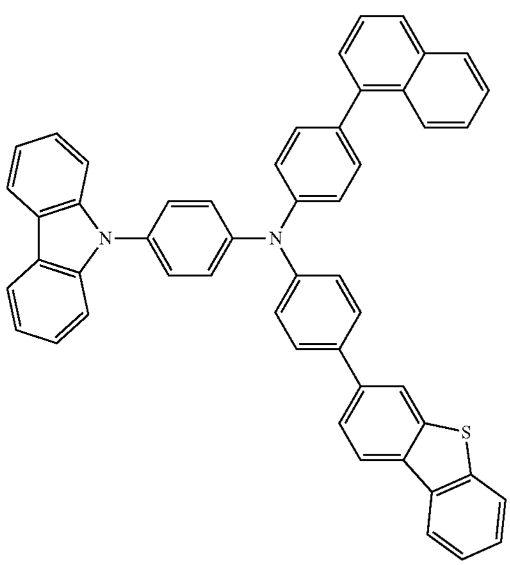
-continued
3-88
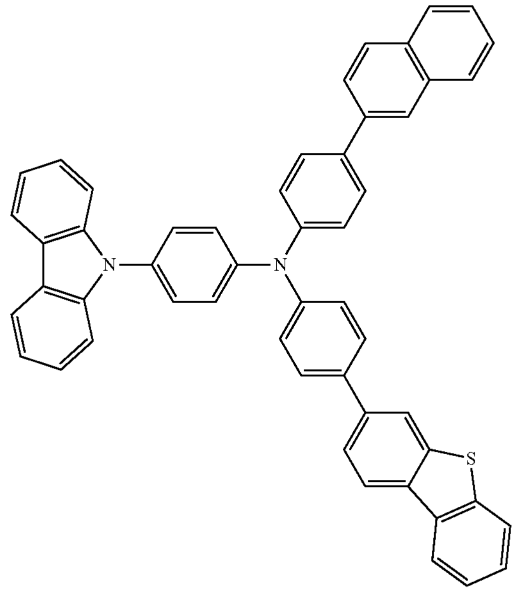
3-89
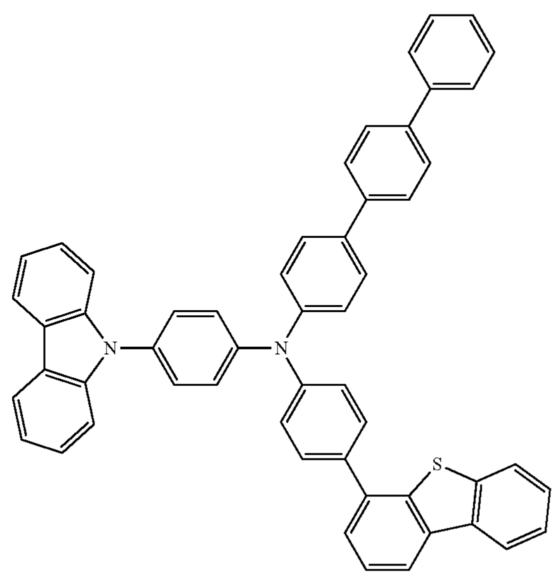

-continued
3-90
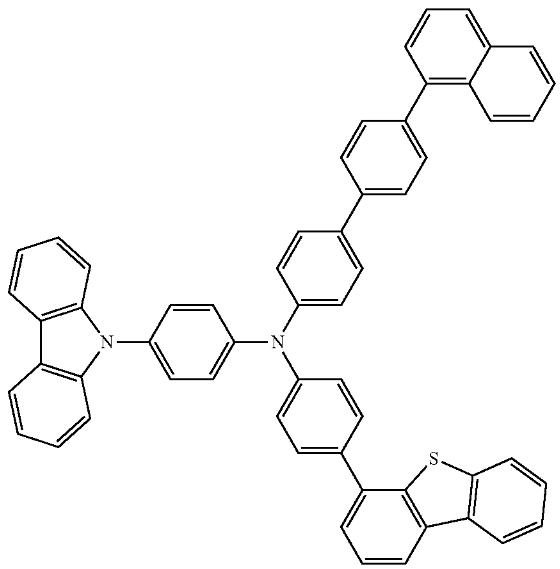
3-91
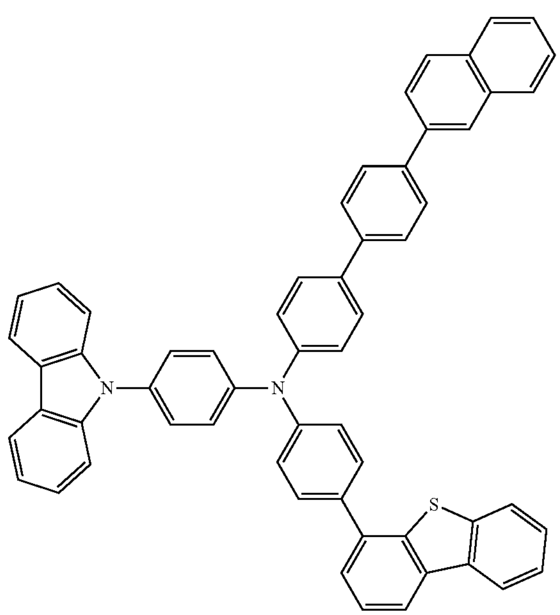
-continued
3-92
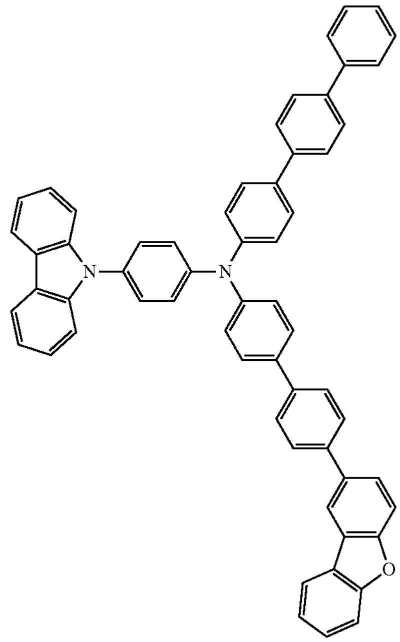
3-93
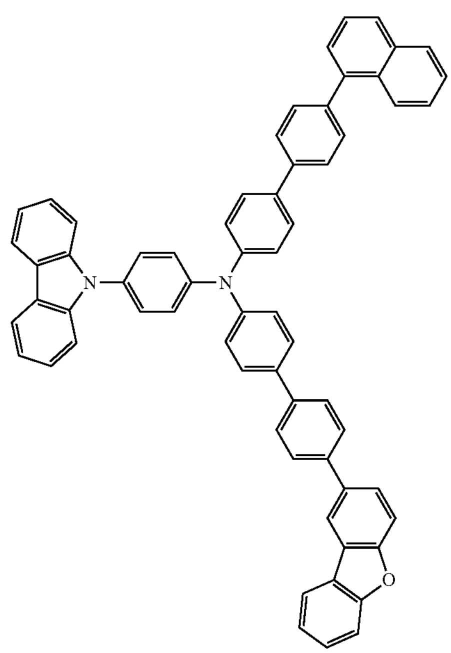

3-94
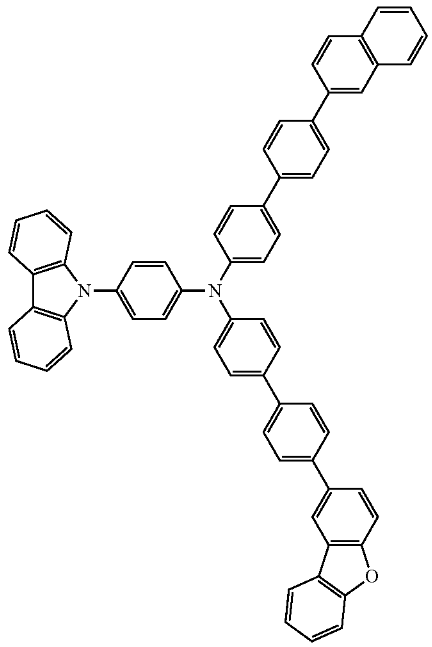
3-95
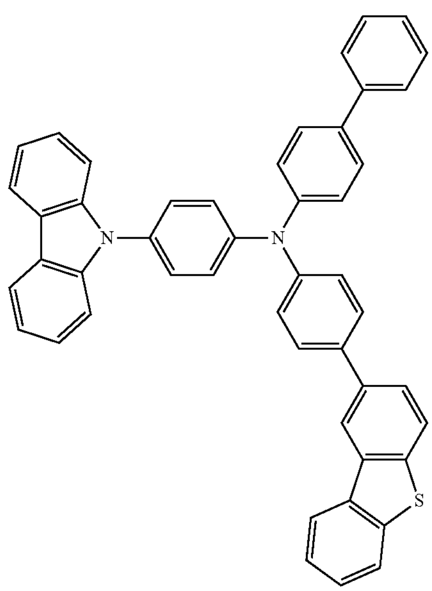
3-96
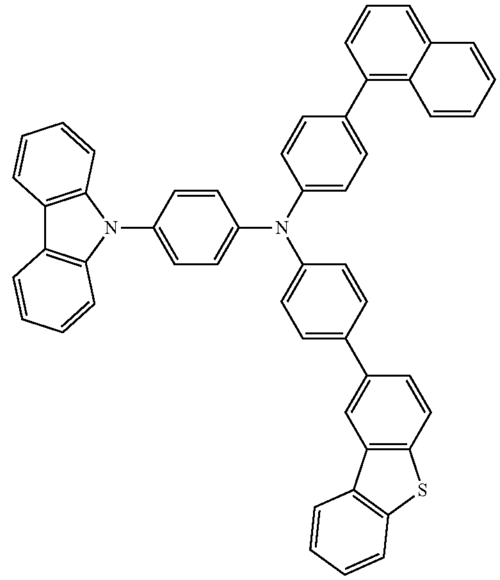
3-97
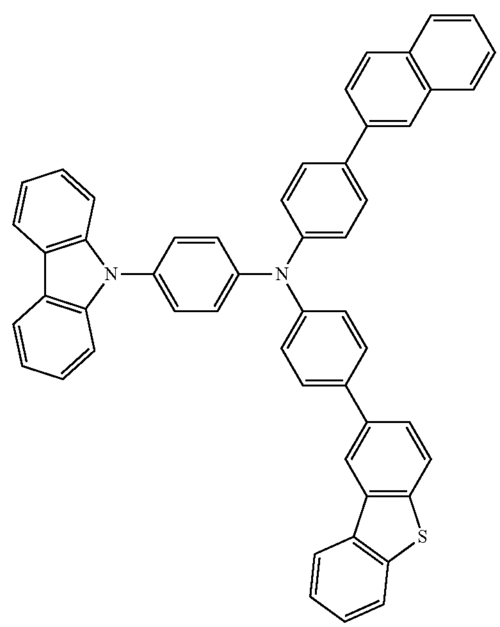

-continued
3-98
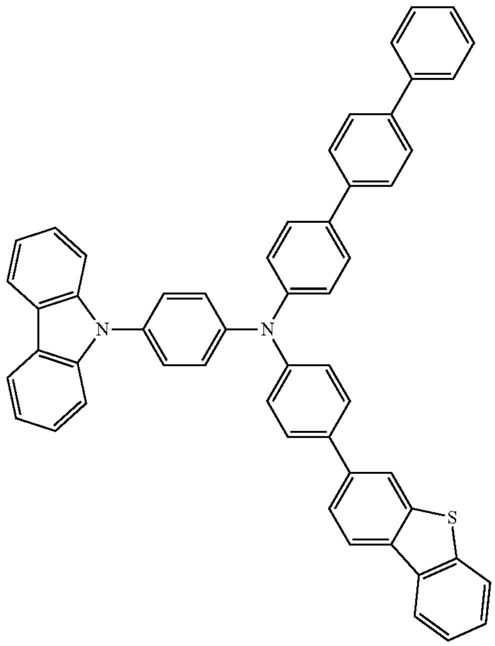
3-99
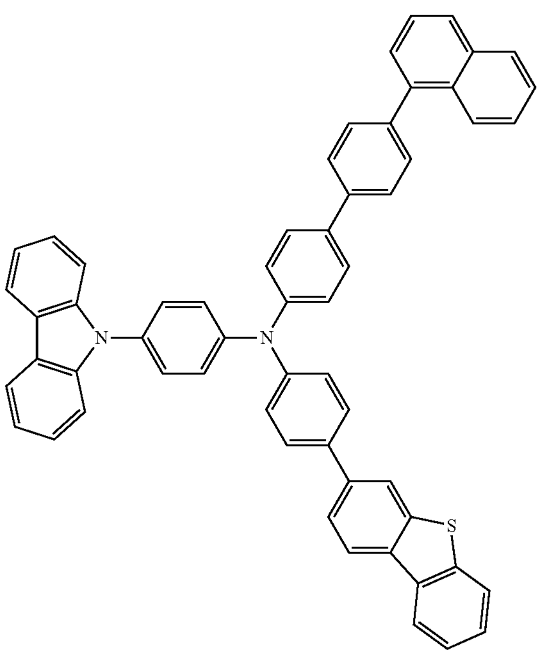
-continued
3-100
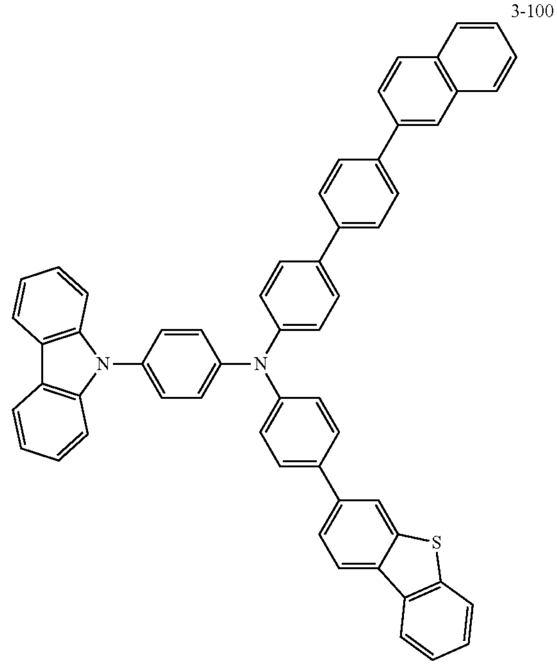
3-101
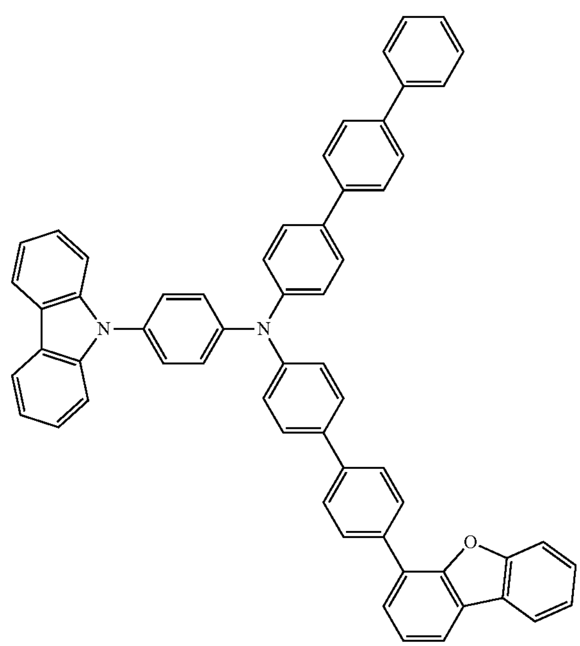

3-102
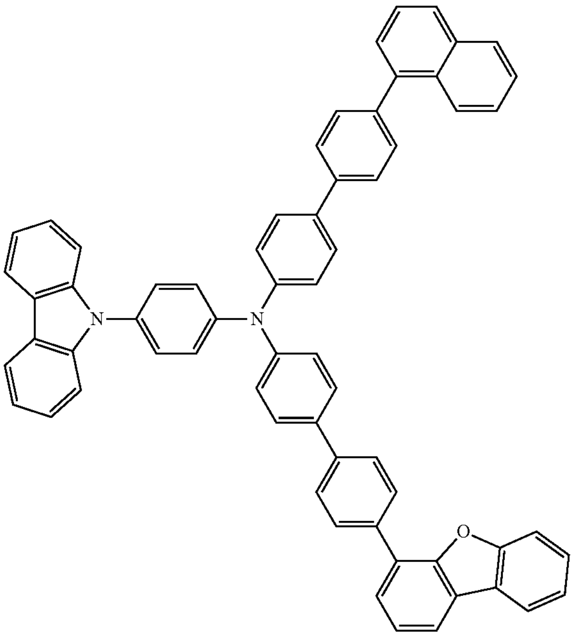
3-103
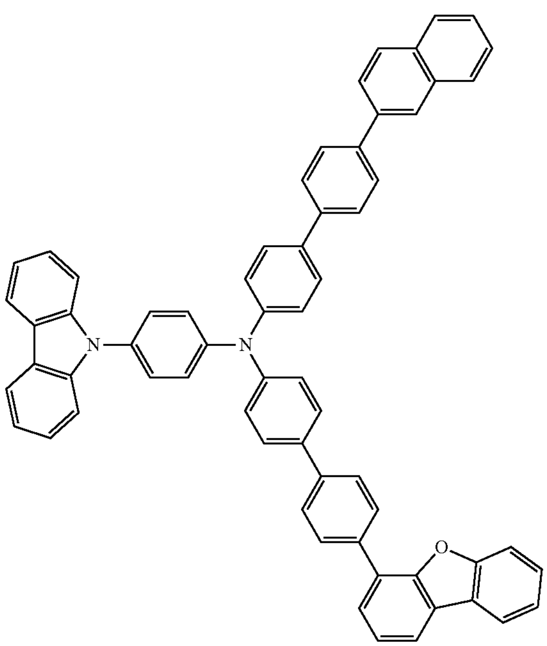
3-104
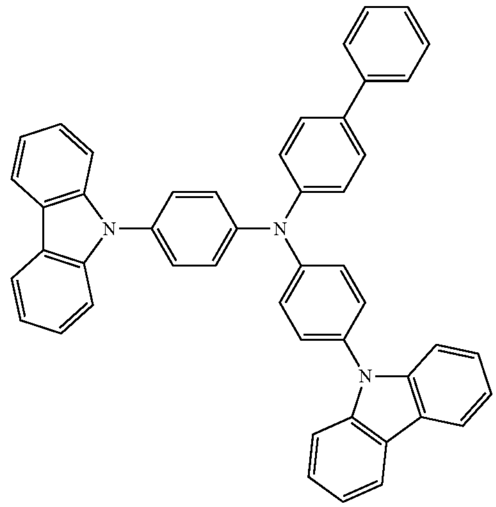
3-105
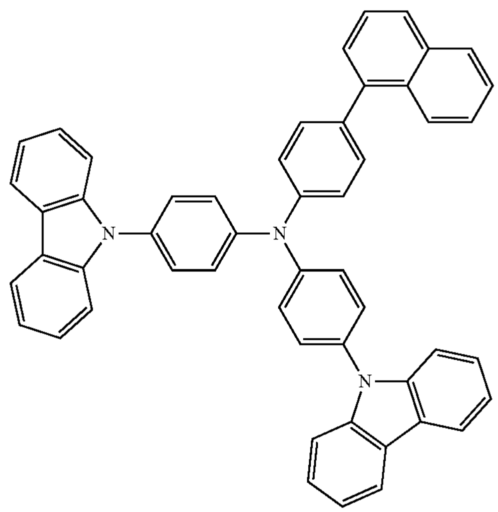
3-106
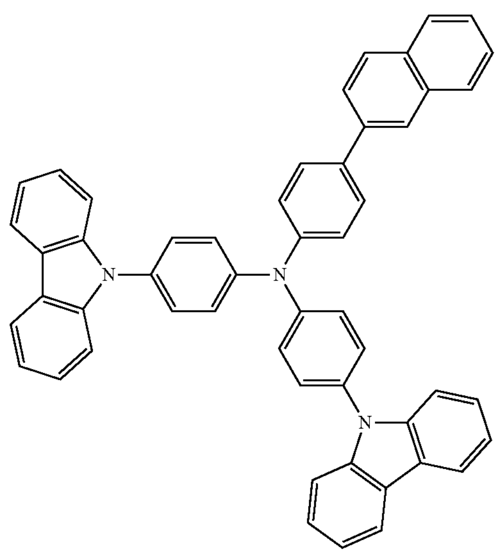

-continued
3-107
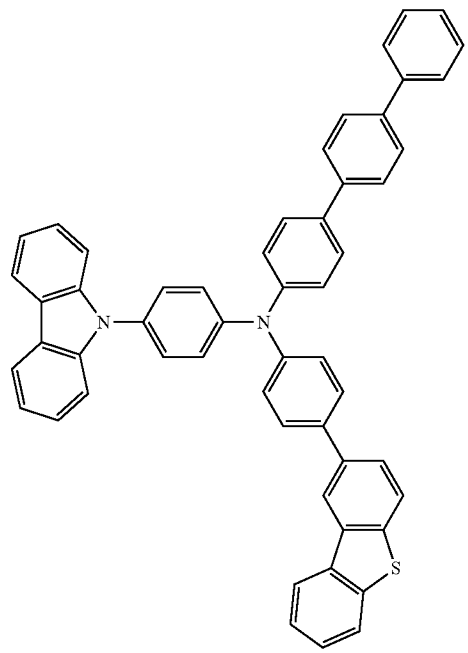
3-108
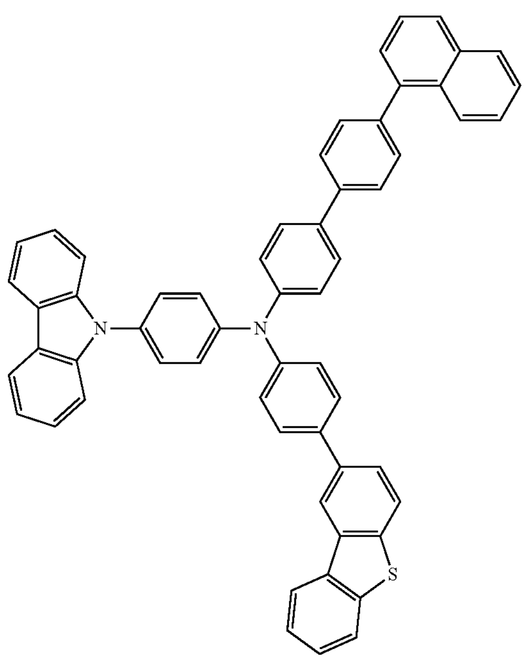
-continued
3-109
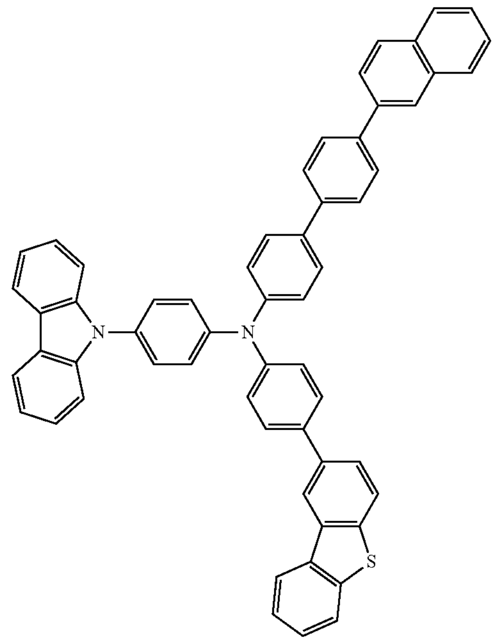
3-110
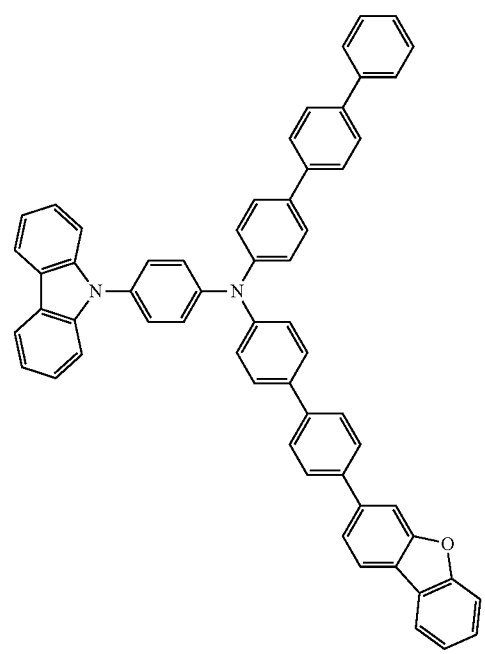

-continued
3-111
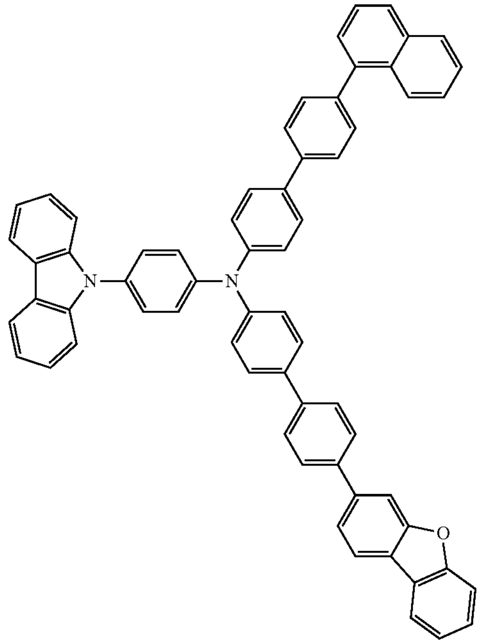
3-112
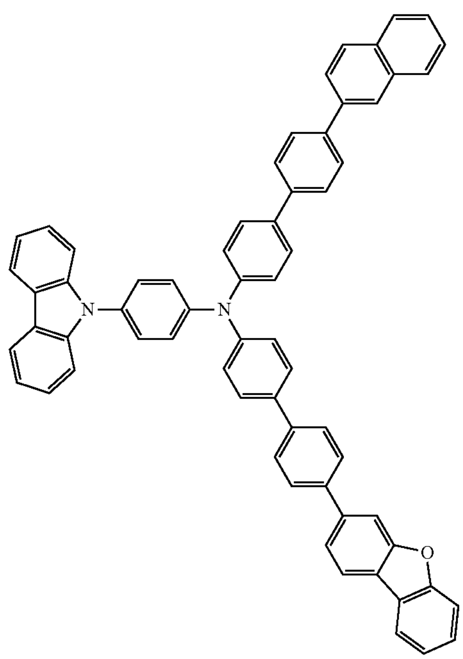
-continued
3-113
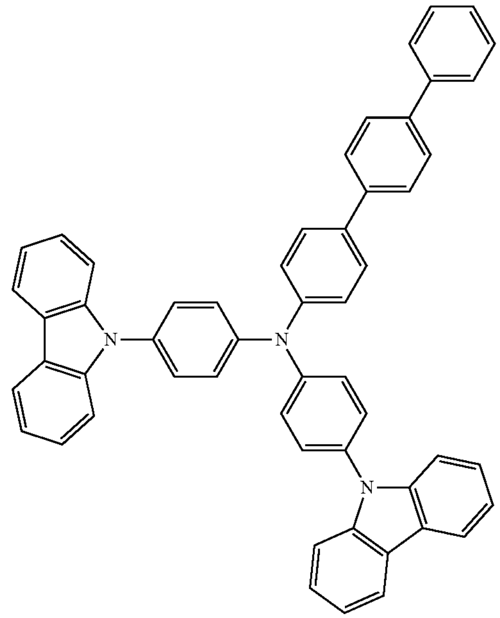
3-114
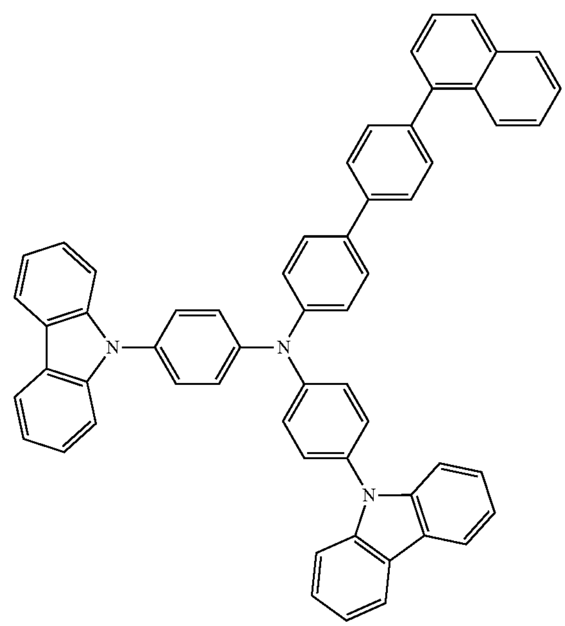

-continued
3-115
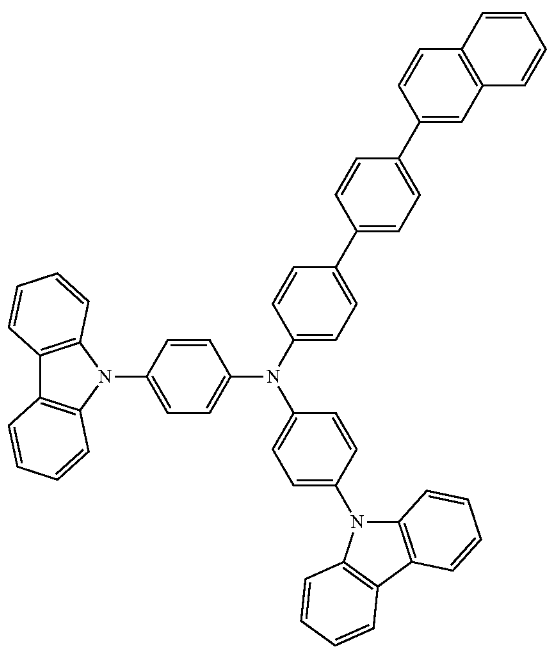
-continued
3-117
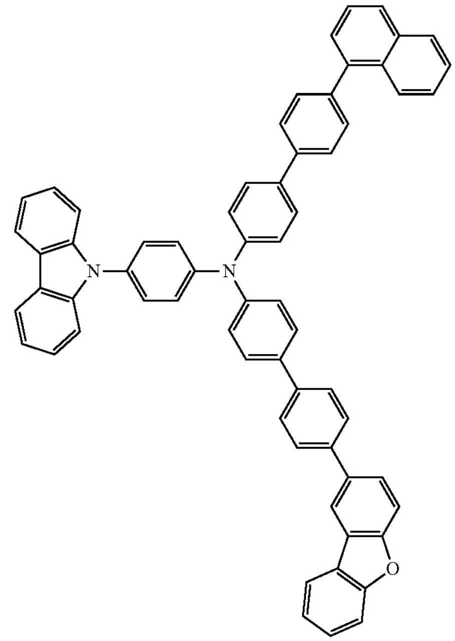
3-116
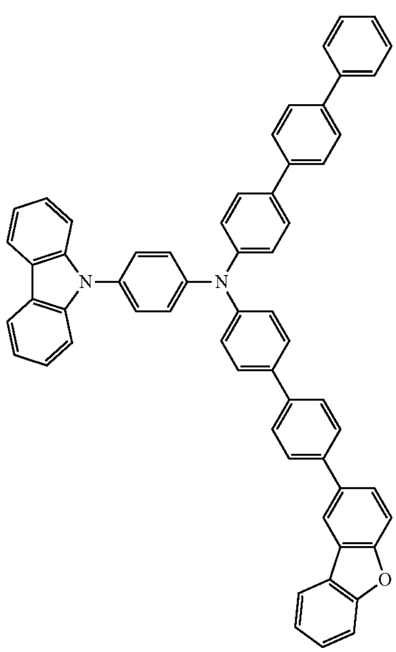
3-118
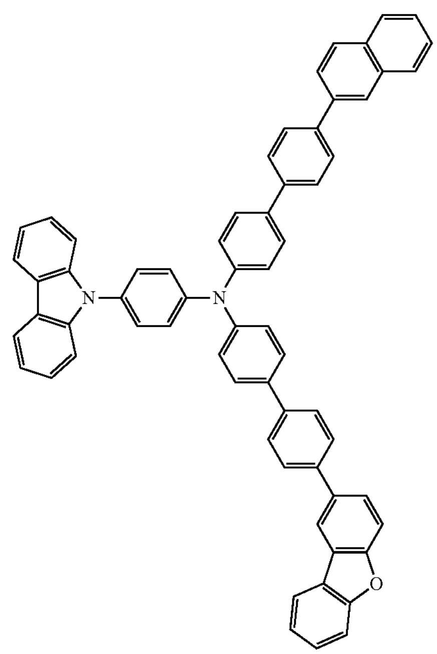

3-119
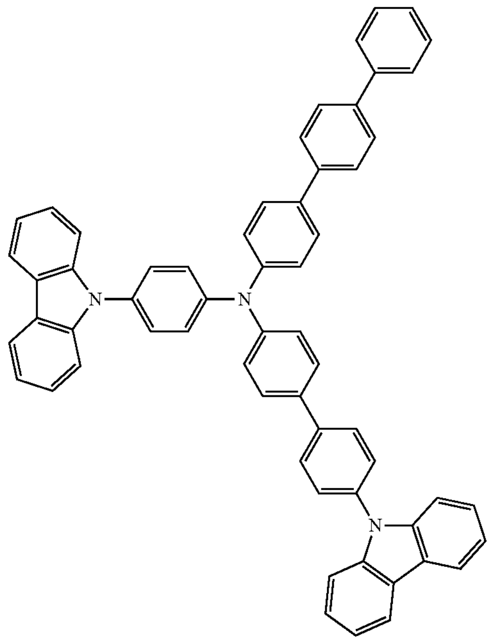
3-120
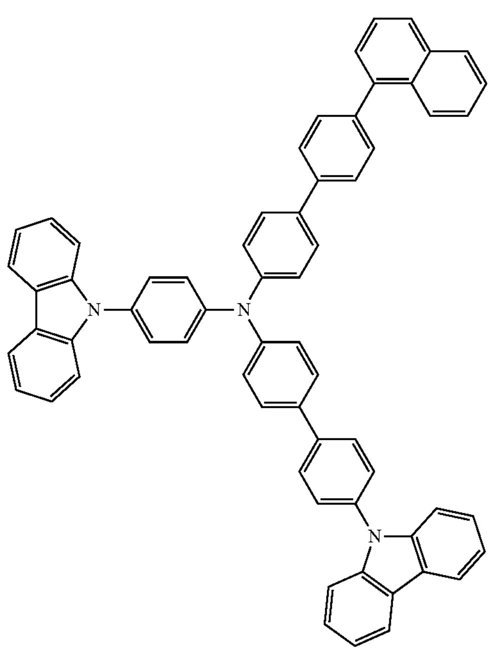
3-121
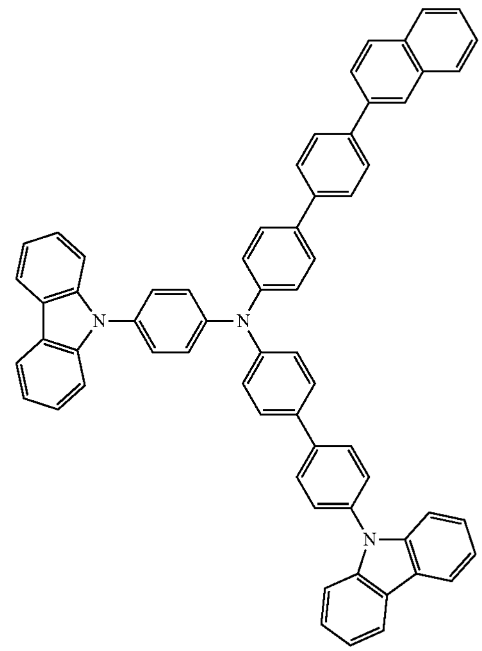
3-122
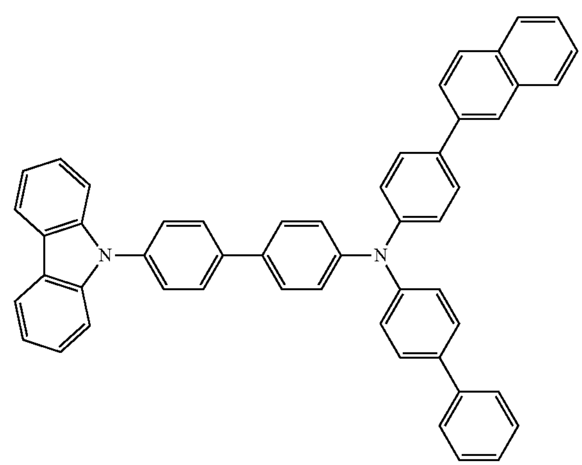

-continued
3-123
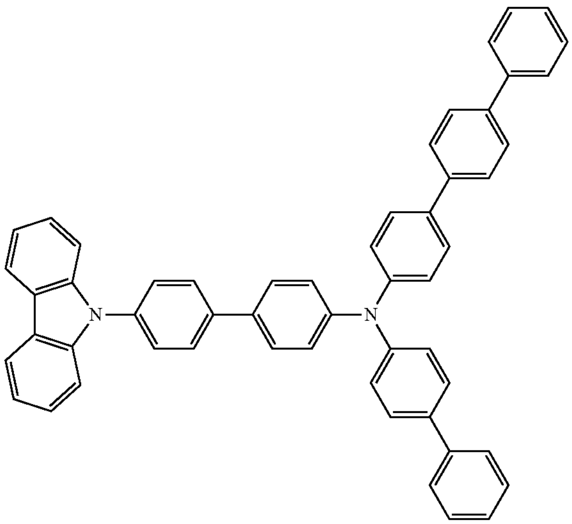
3-124
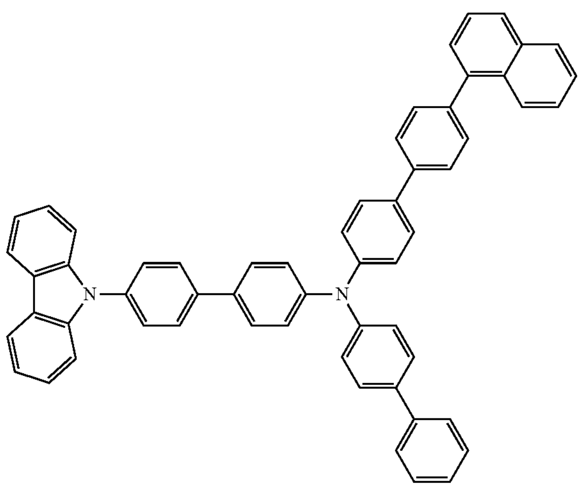
3-125
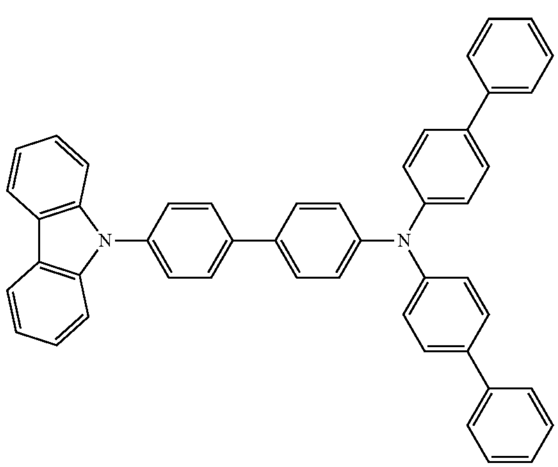
-continued
3-126
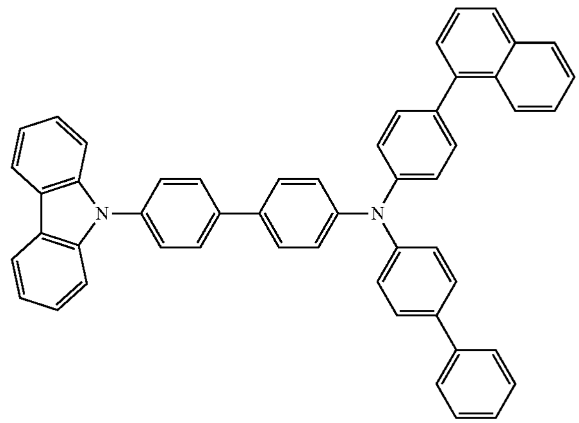
3-127
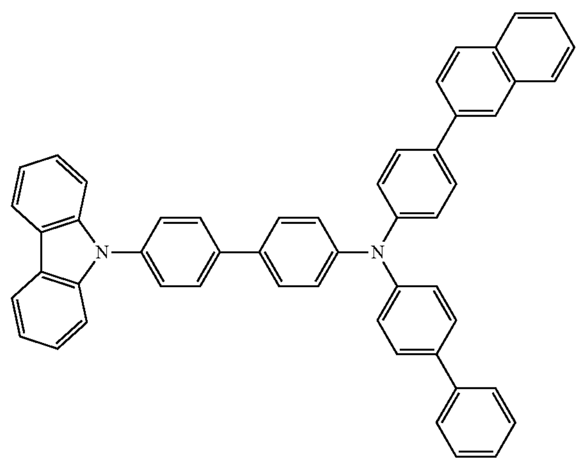
3-128
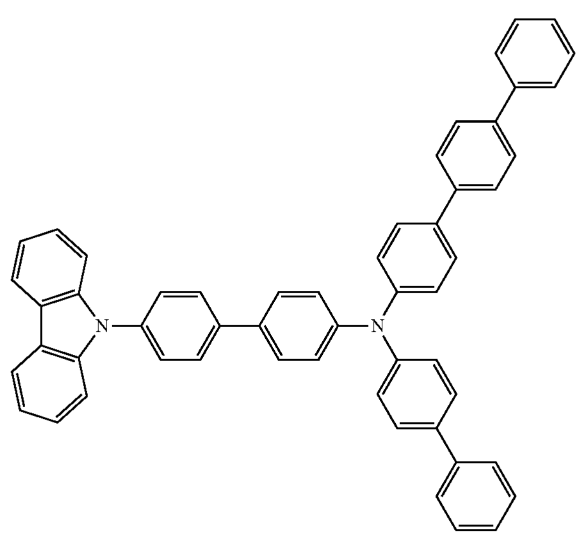

-continued
3-129
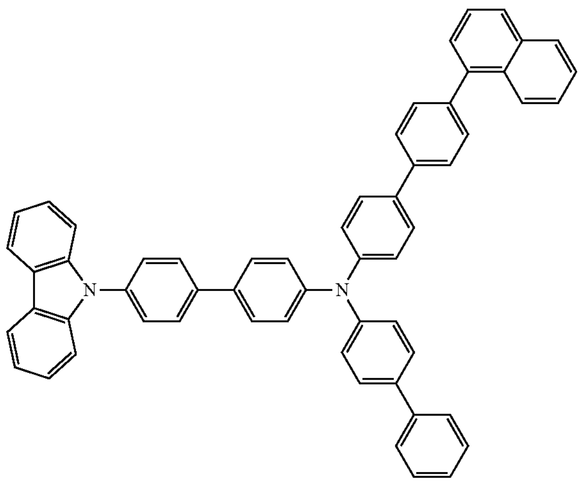
3-130
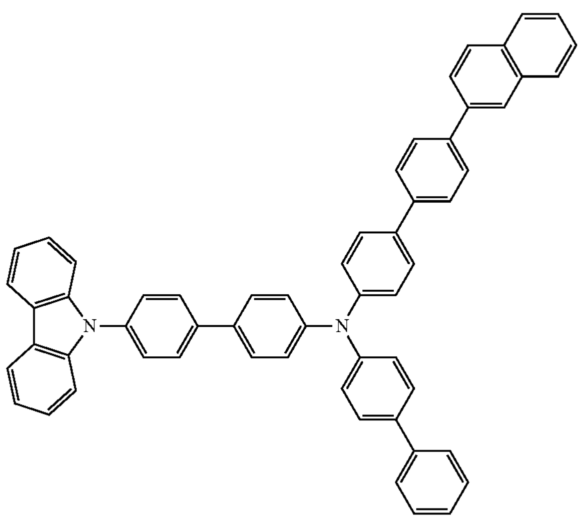
3-131
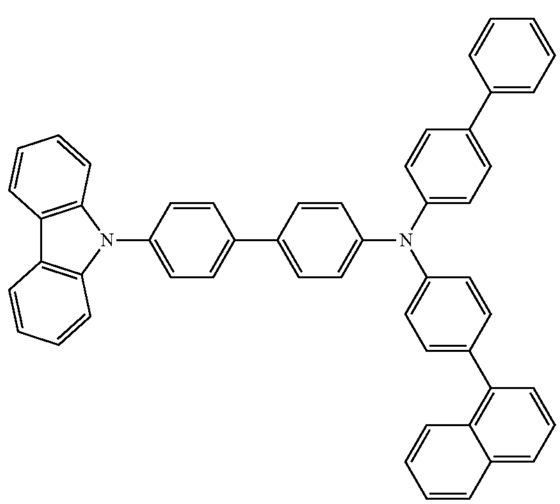
-continued
3-132
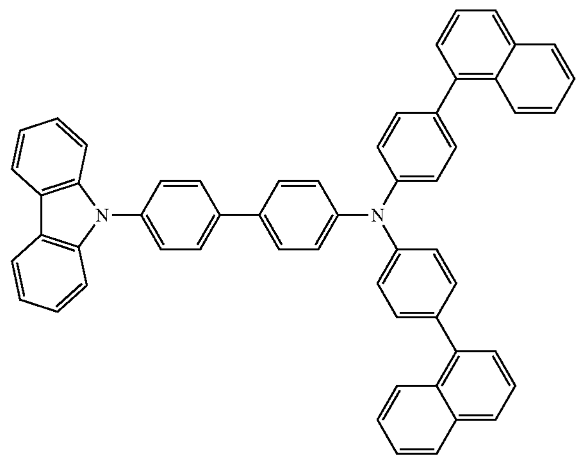
3-133
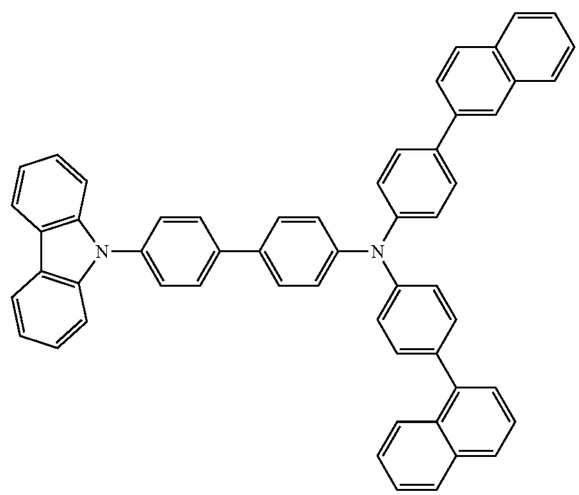
3-134
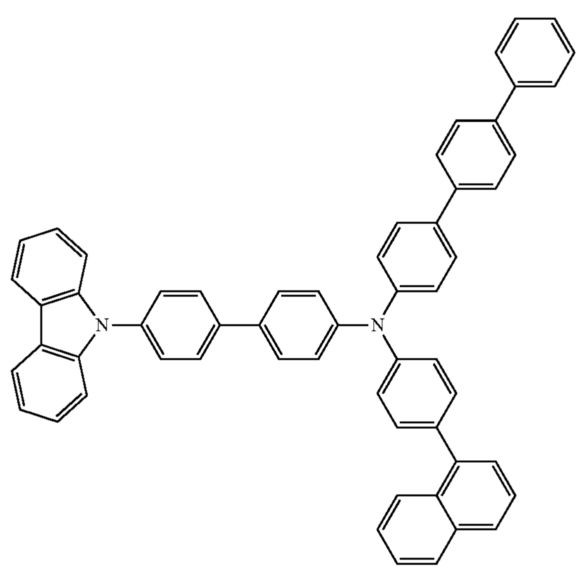

-continued
3-135
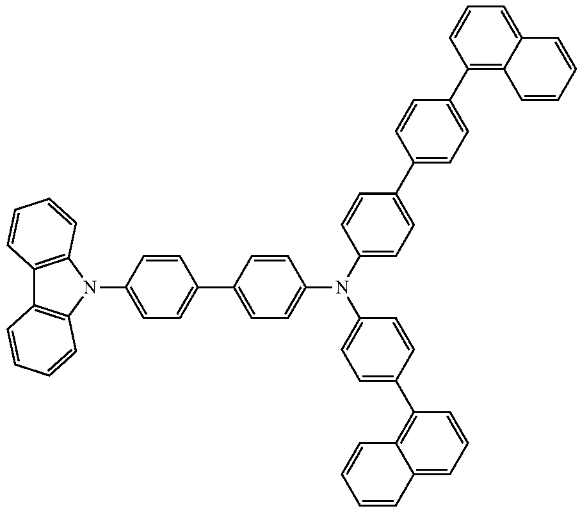
3-136
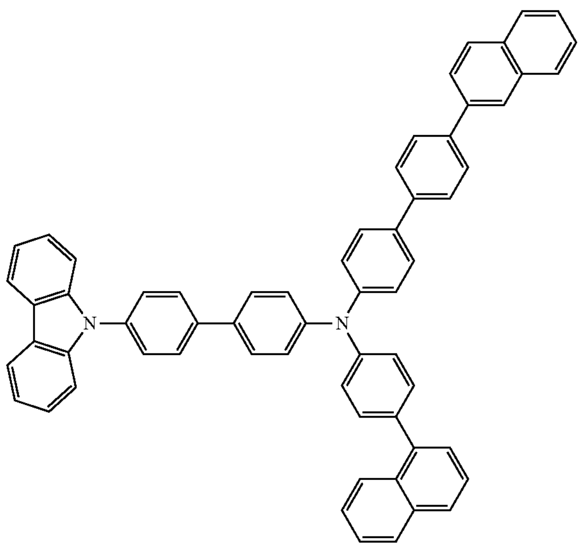
3-137
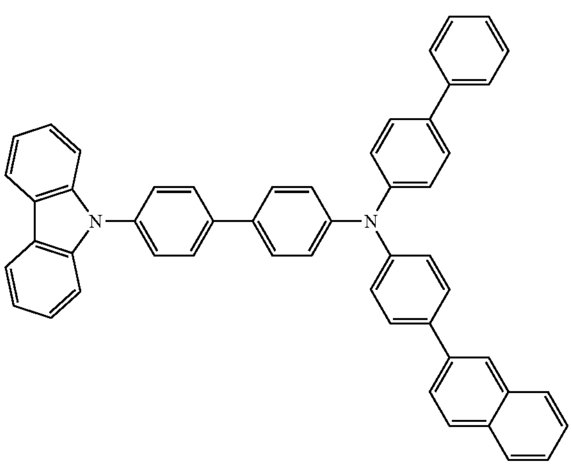
-continued
3-138
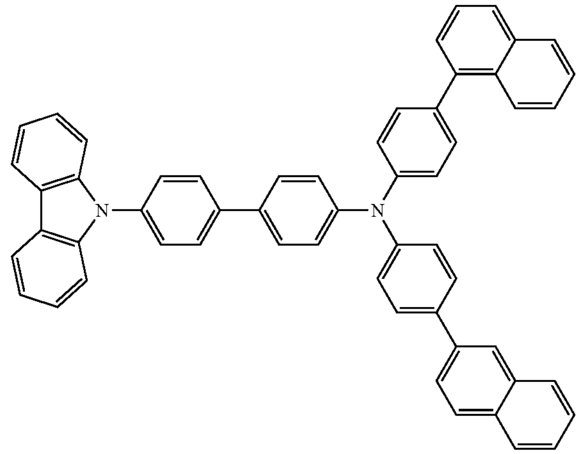
3-139
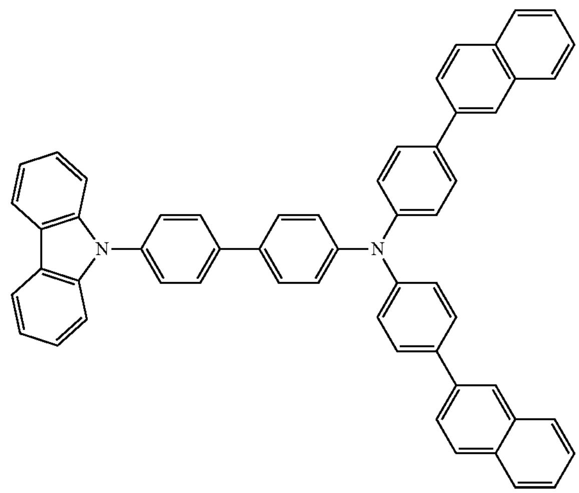
3-140
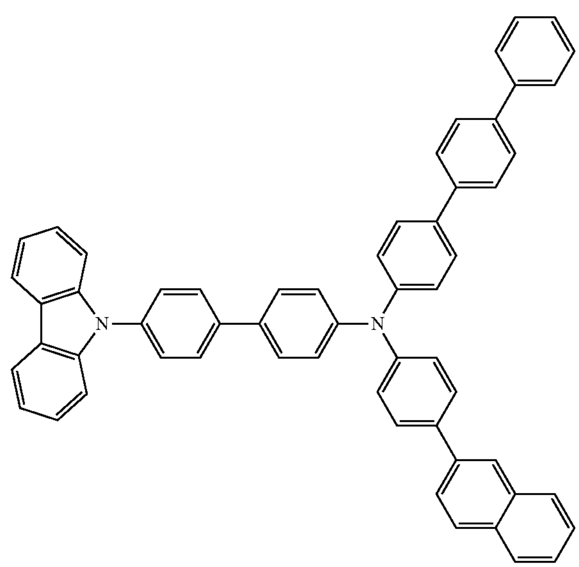

-continued
3-141
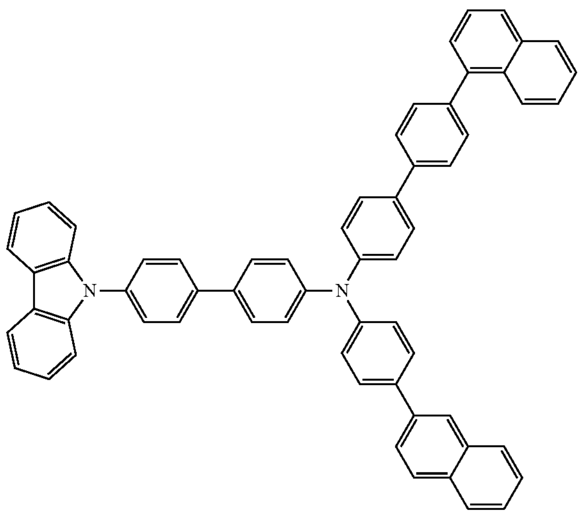
3-142
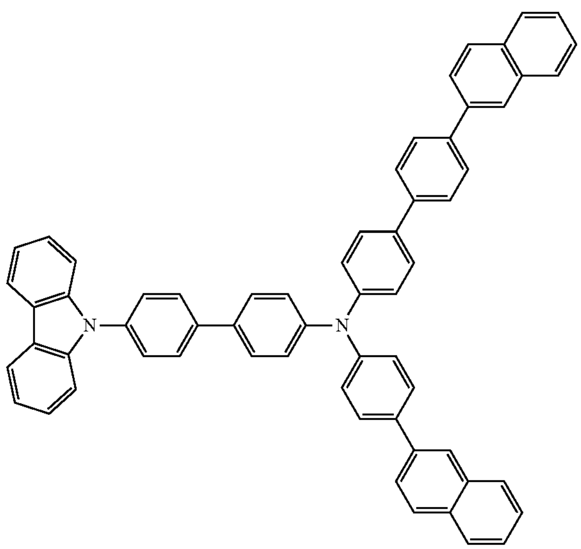
3-143
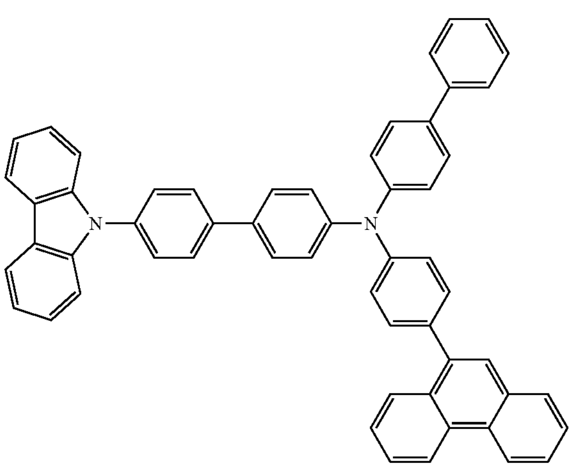
-continued
3-144
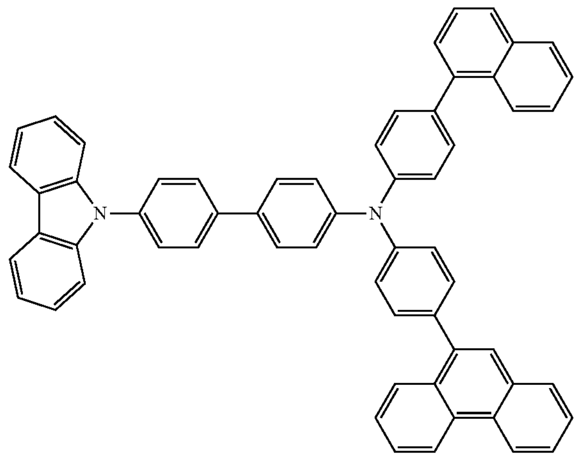
3-145
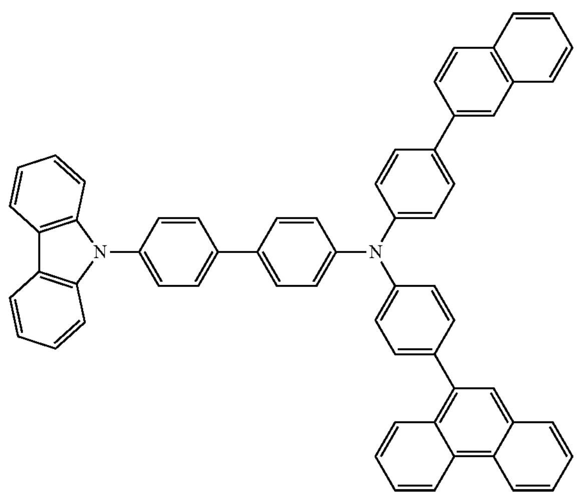
3-146
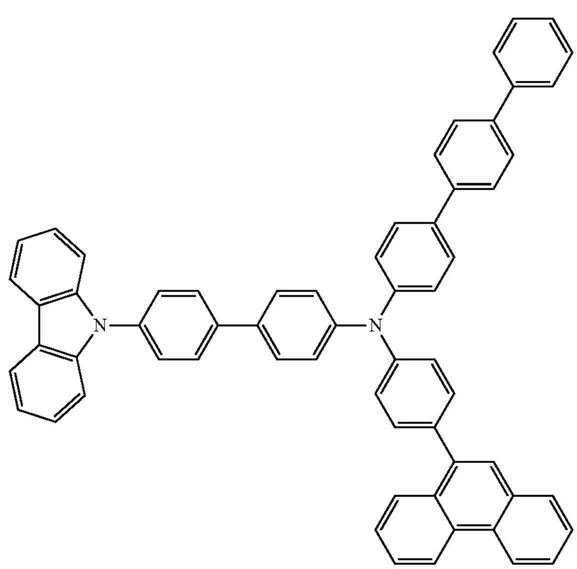

-continued
3-147
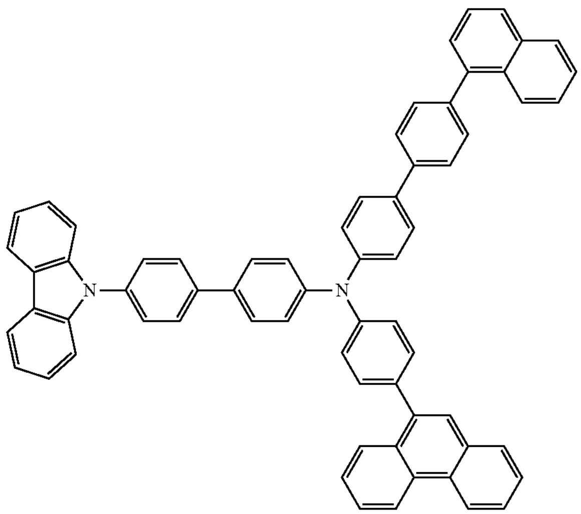
3-148
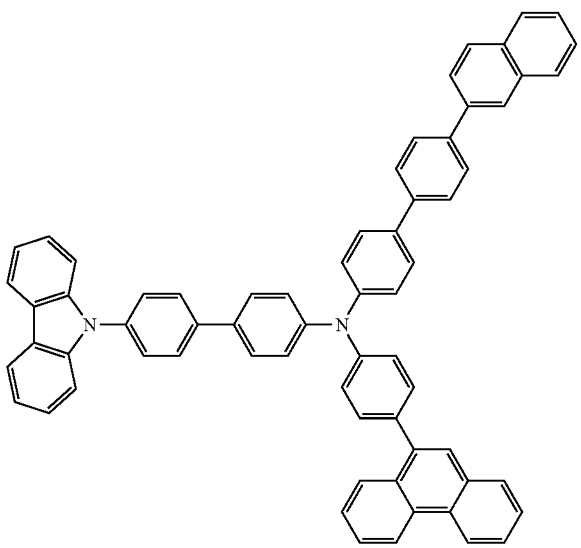
3-149
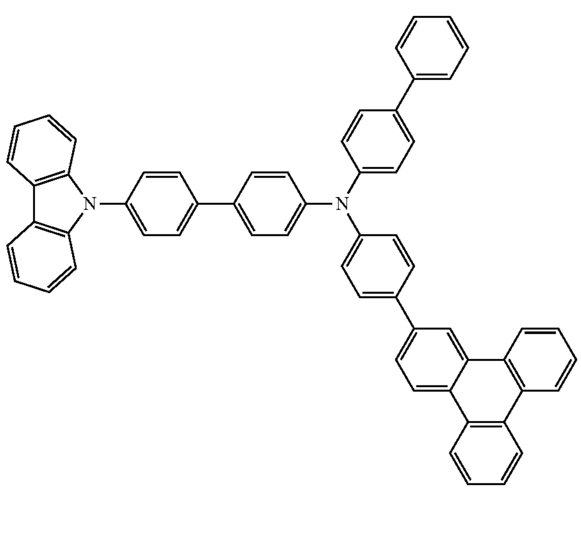
-continued
3-150
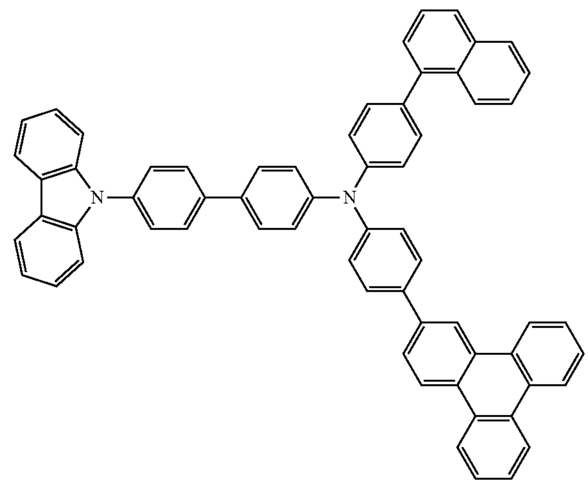
3-151
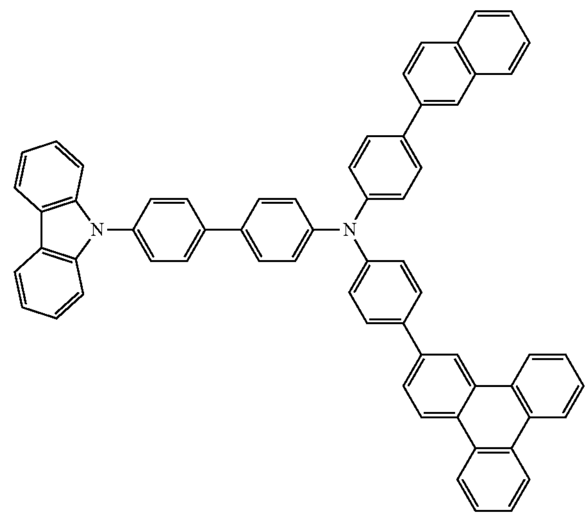
3-152
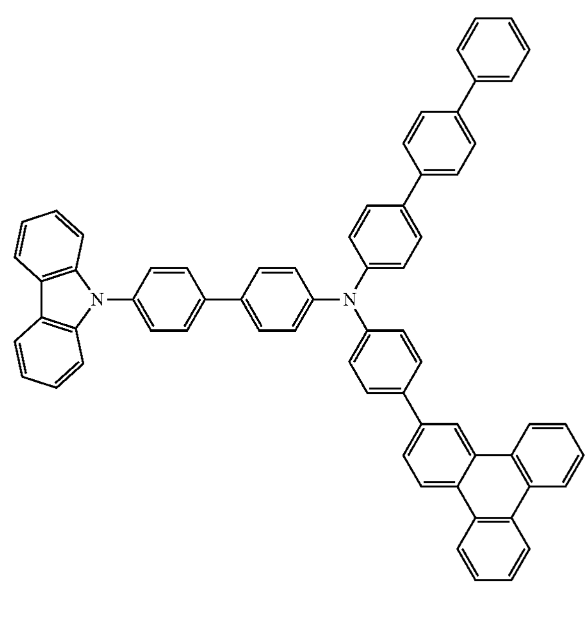

-continued
3-153
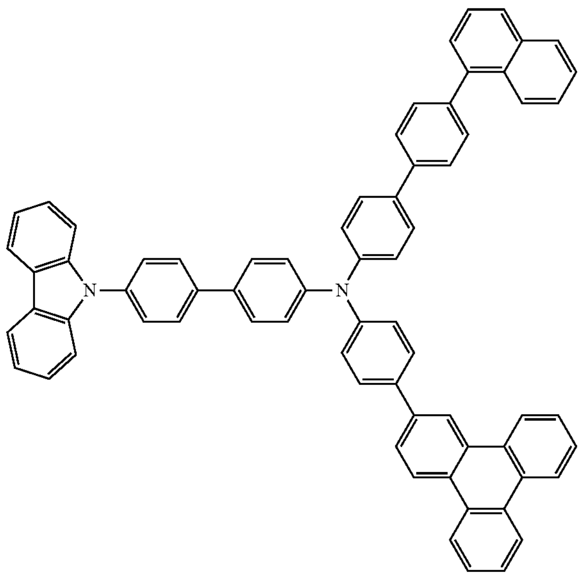
3-154
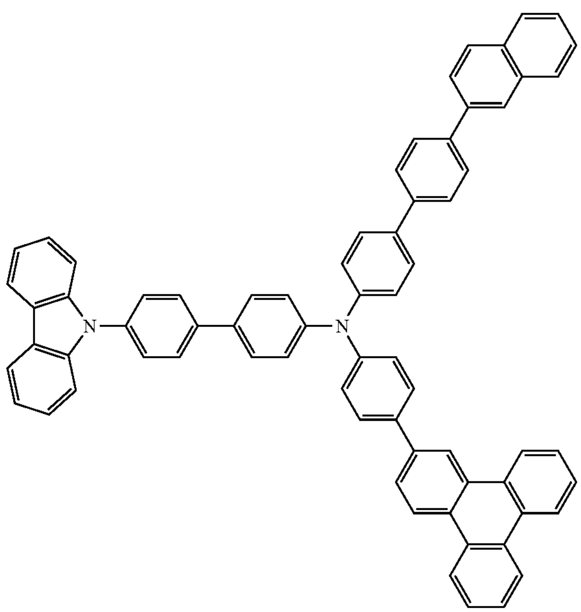
3-155
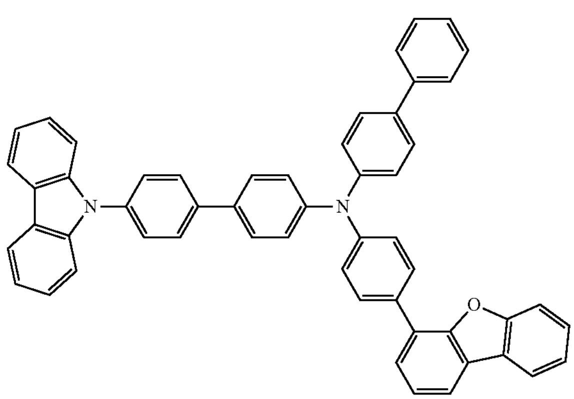
-continued
3-156
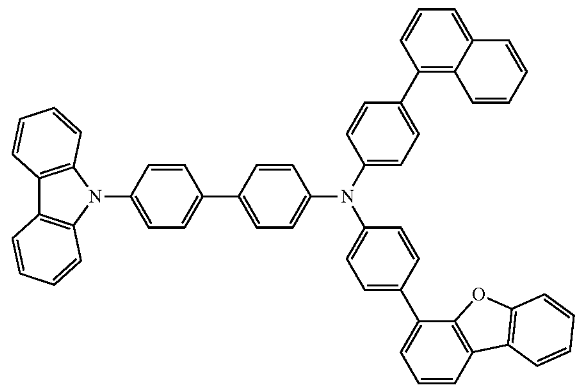
3-157
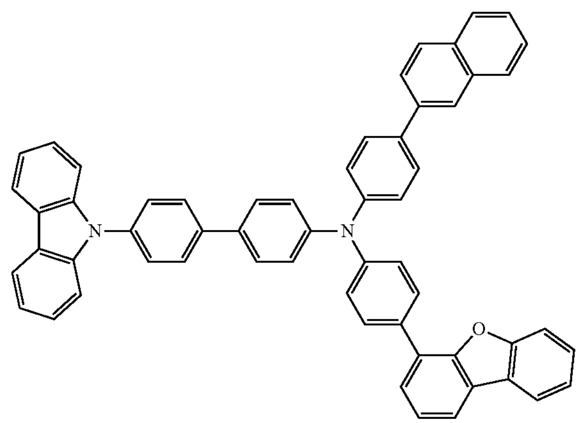
3-158
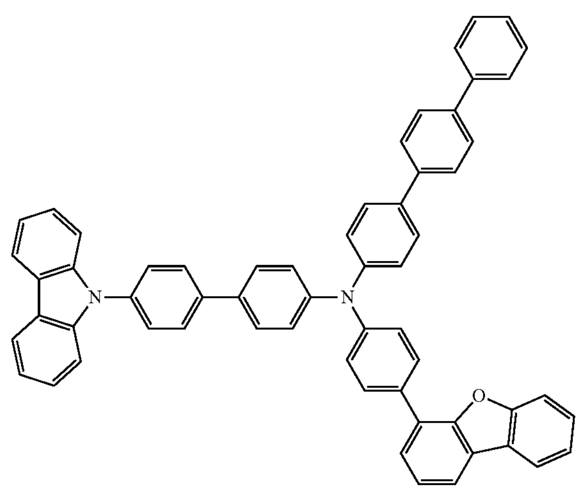

-continued
3-159
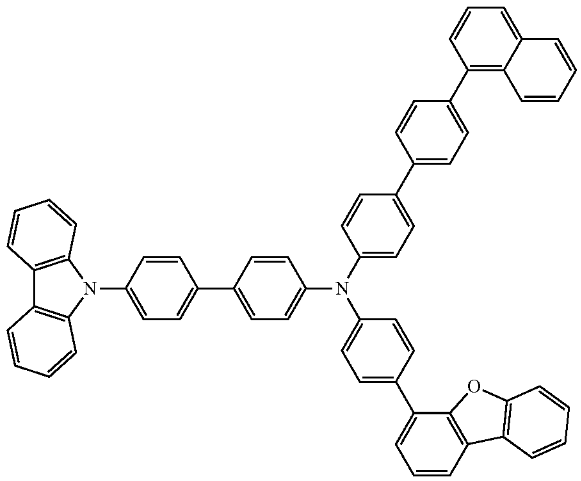
3-160
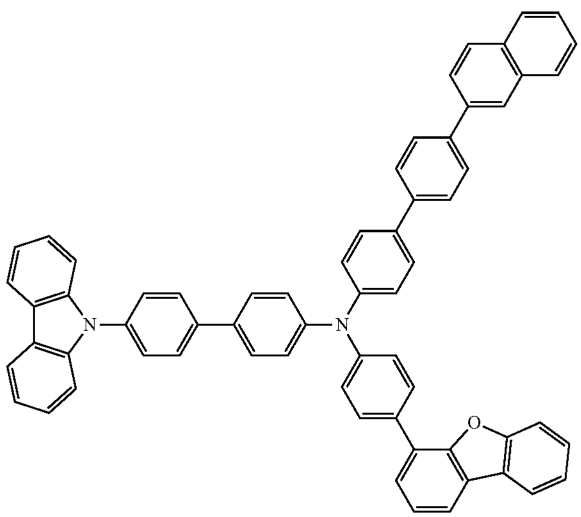
3-161
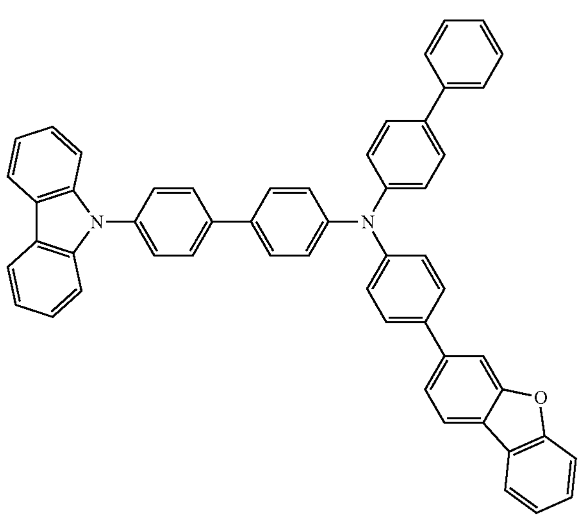
-continued
3-162
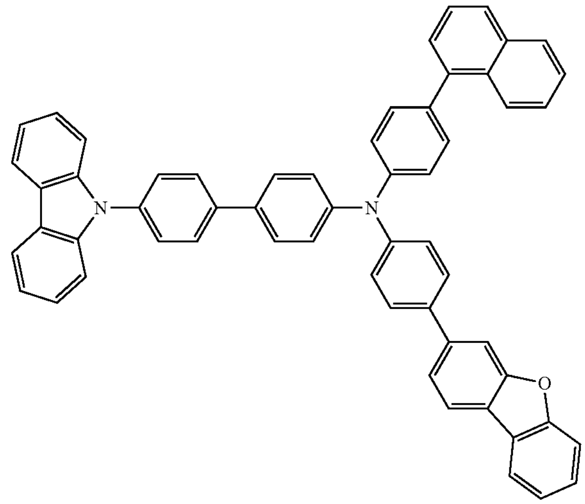
3-163
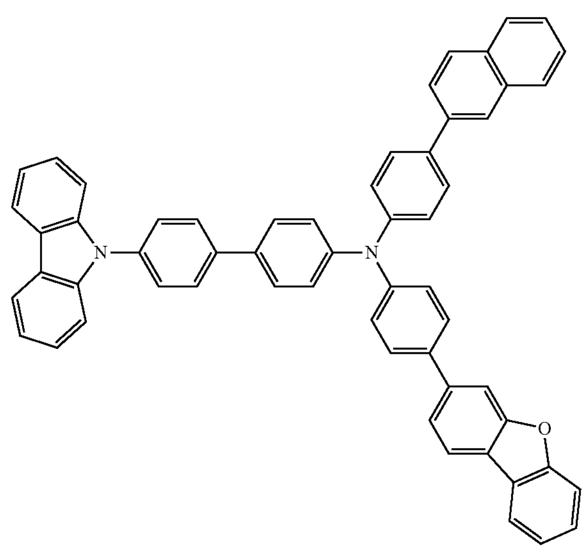

3-164
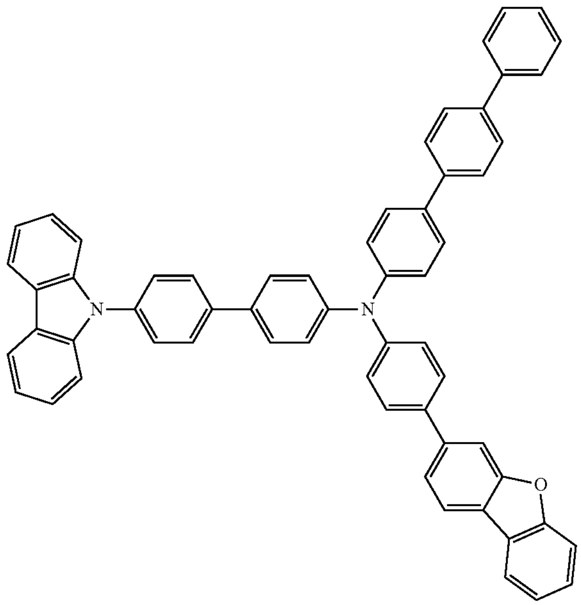
3-166
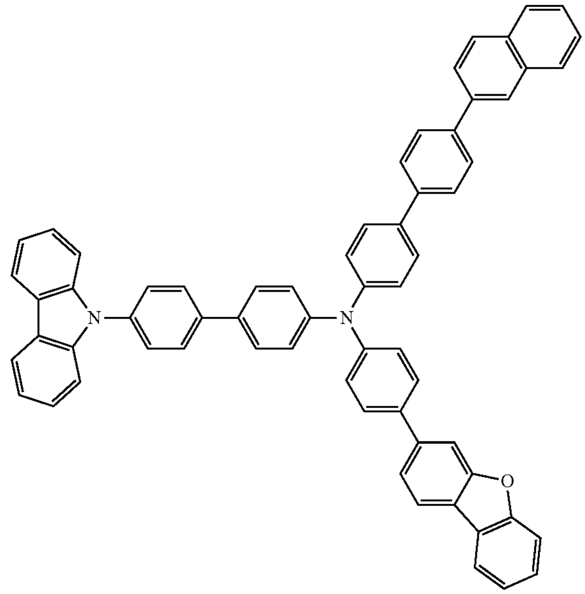
3-165
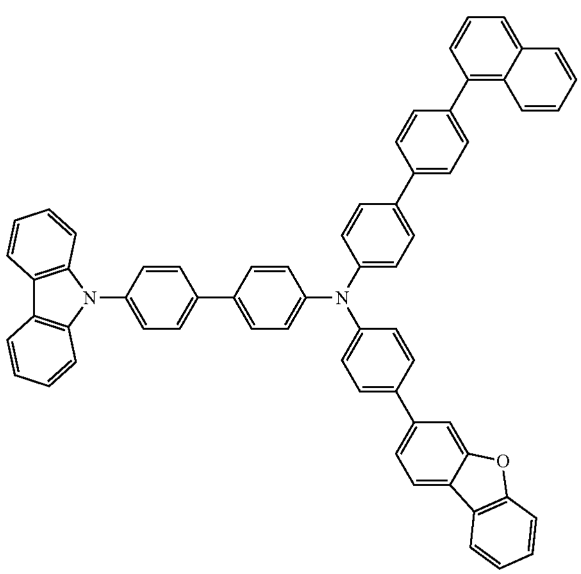
3-167
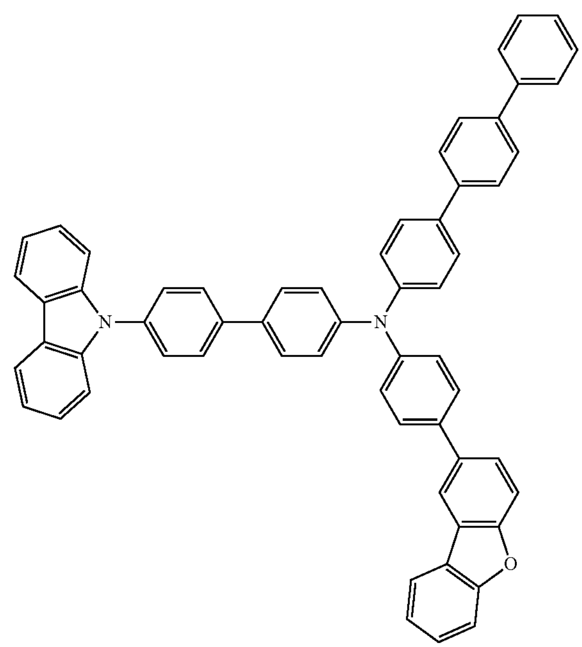

-continued
3-168
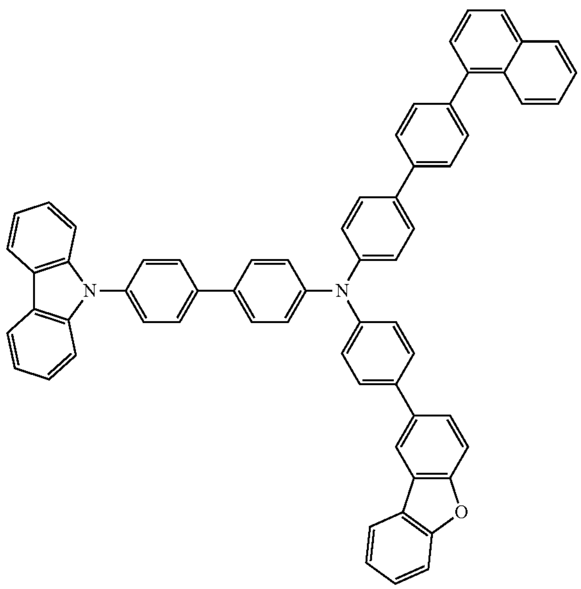
3-169
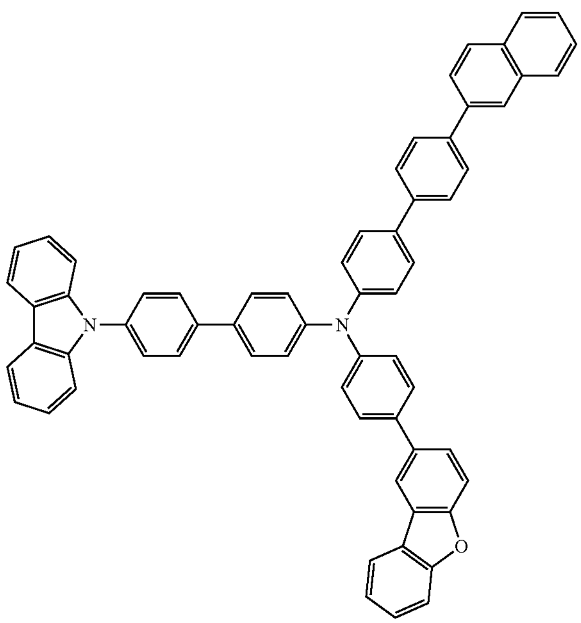
3-170
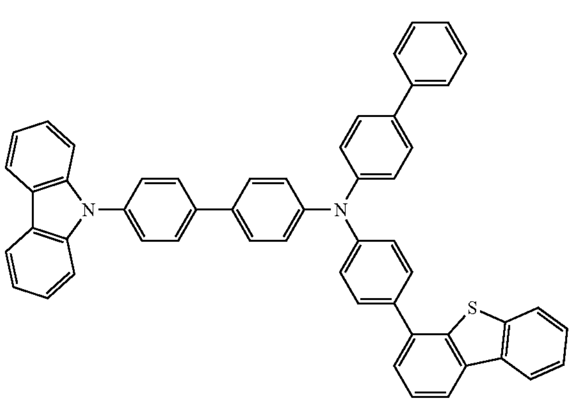
-continued
3-171
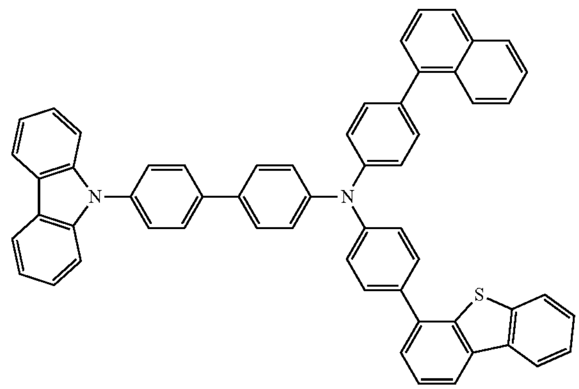
3-172
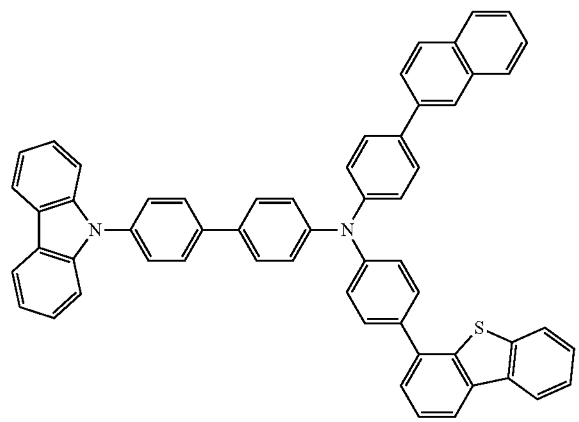
3-173
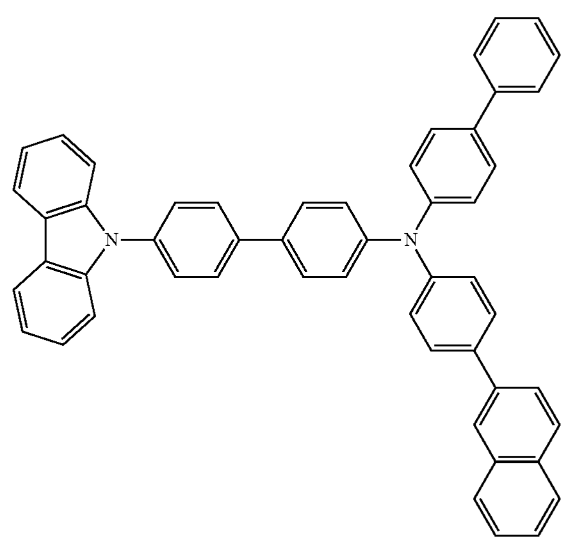

-continued
3-174
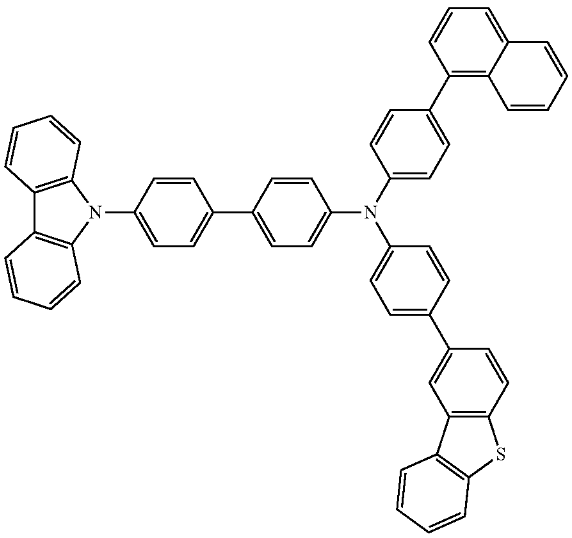
3-175
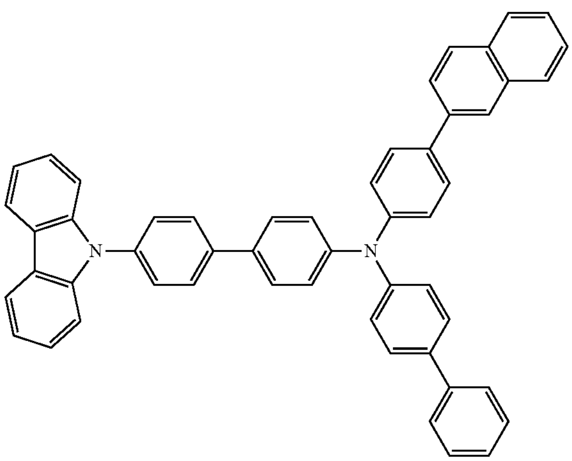
3-176
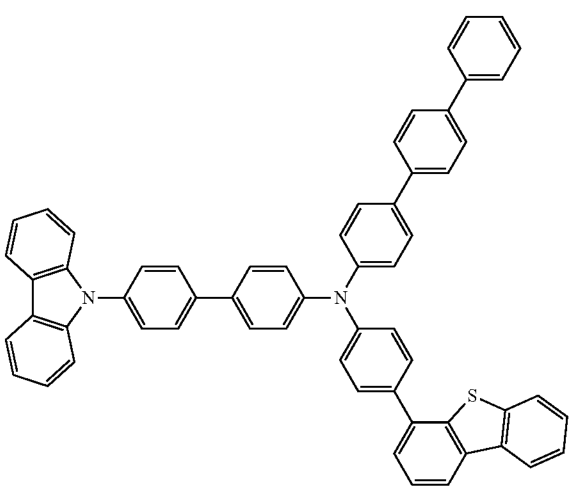
-continued
3-177
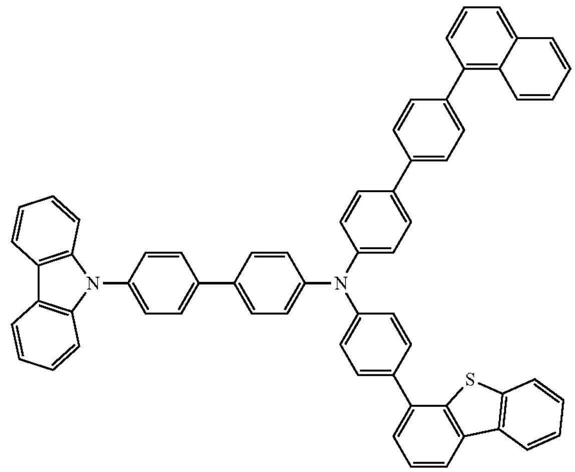
3-178
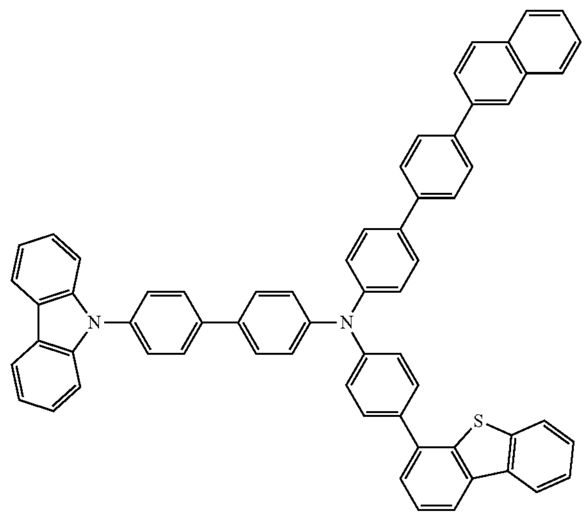
3-179
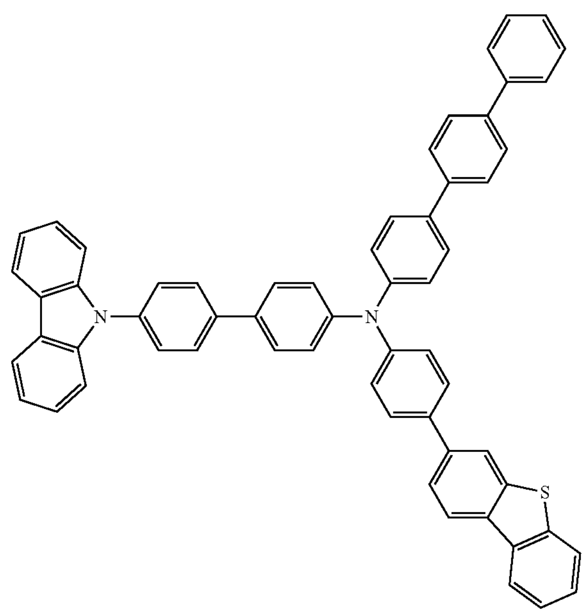

3-180
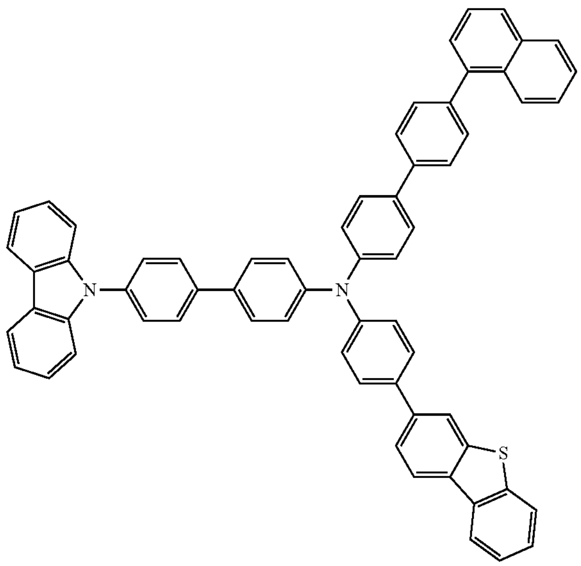
3-181
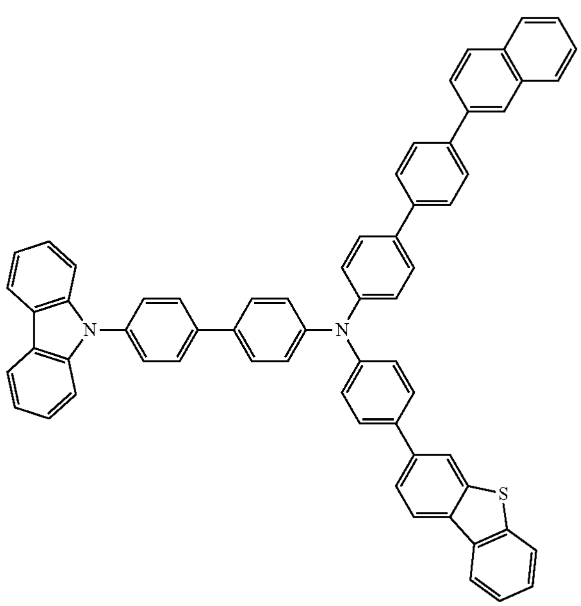
3-182
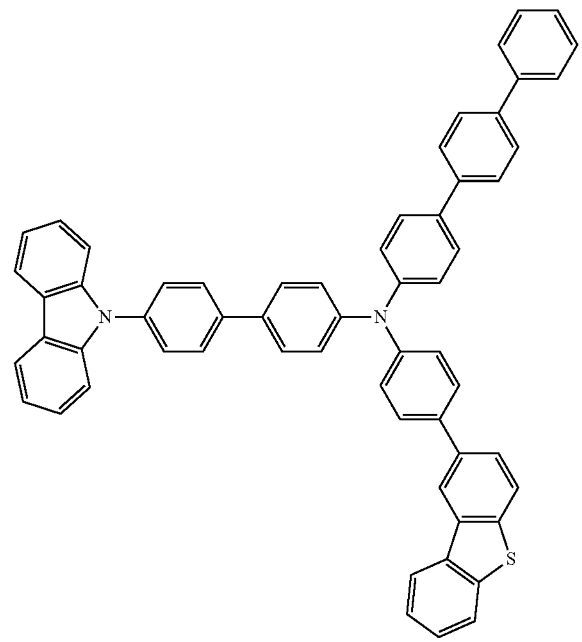
3-183
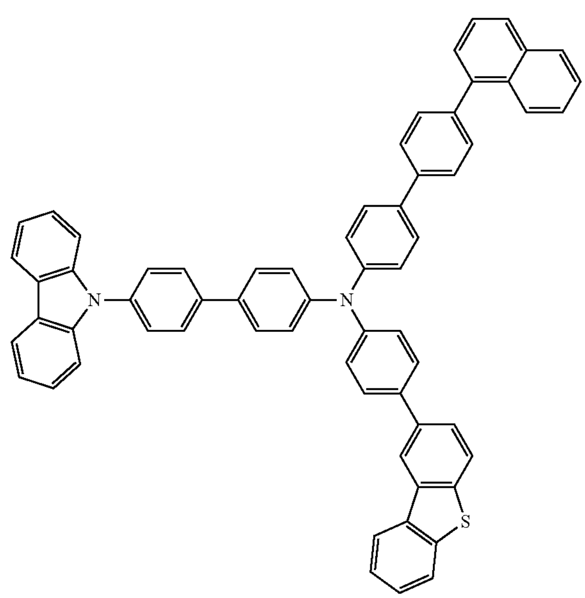

-continued
3-184
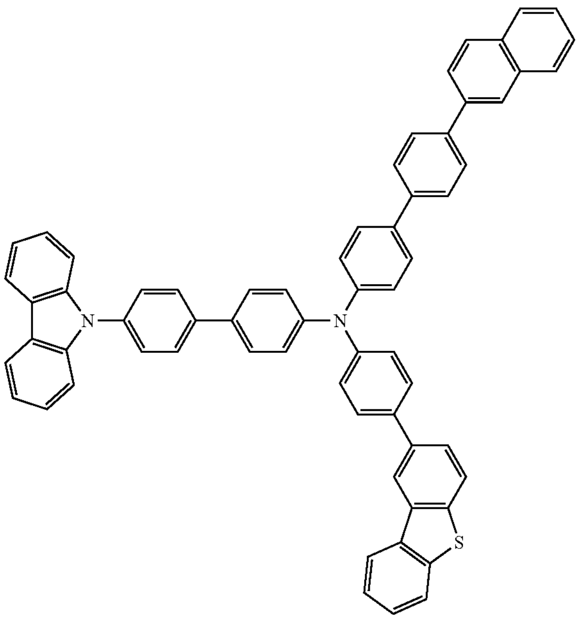
3-185
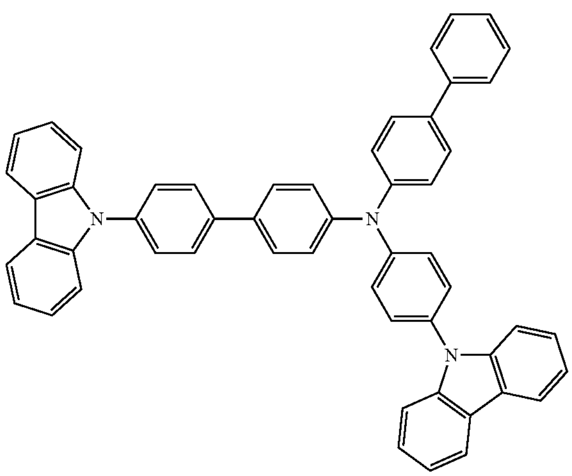
3-186
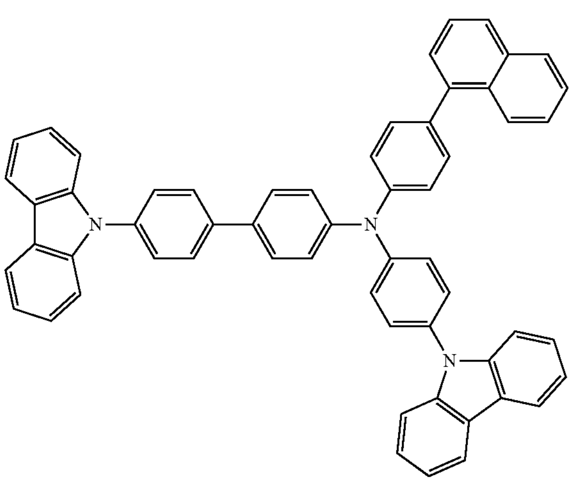
-continued
3-187
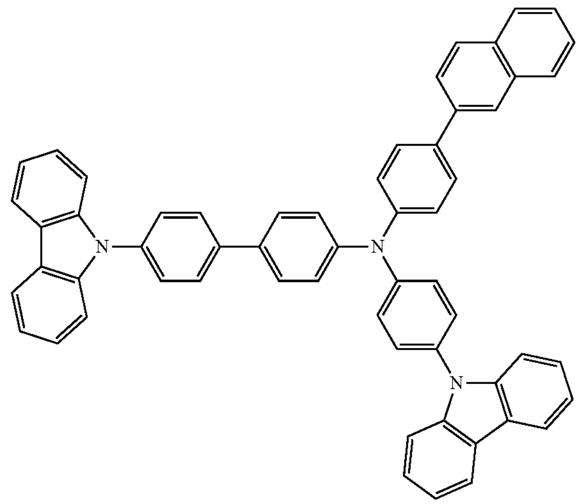
3-188
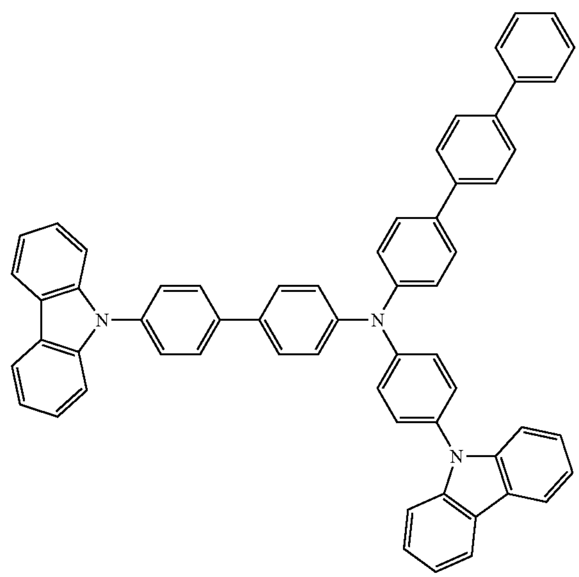
3-189
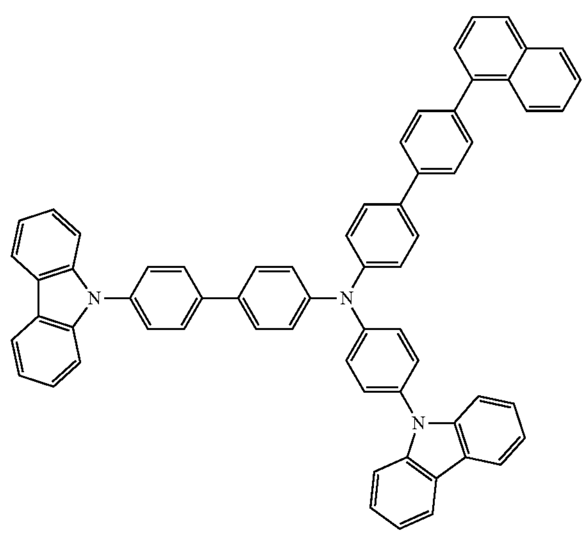

-continued
3-190
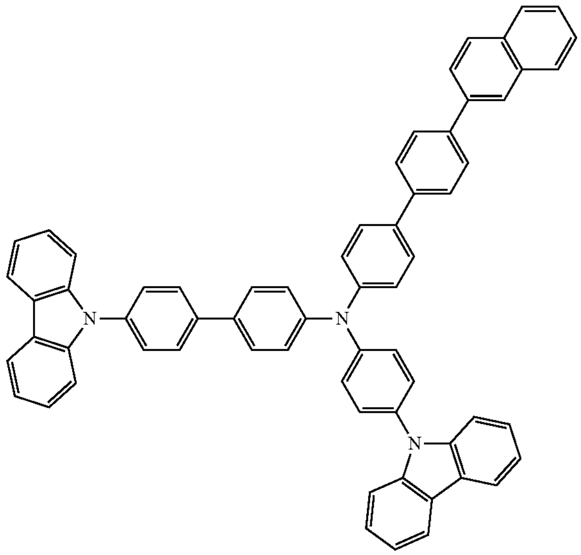
3-191
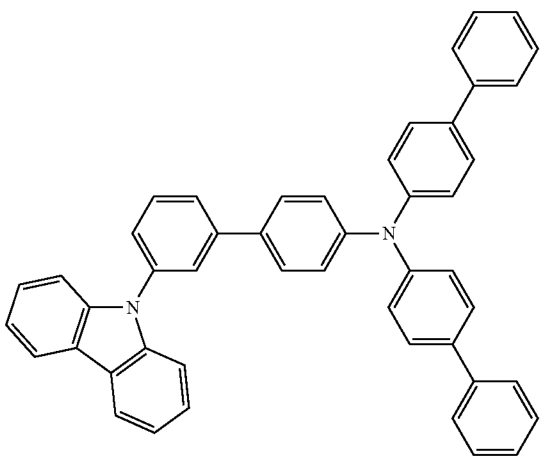
3-192
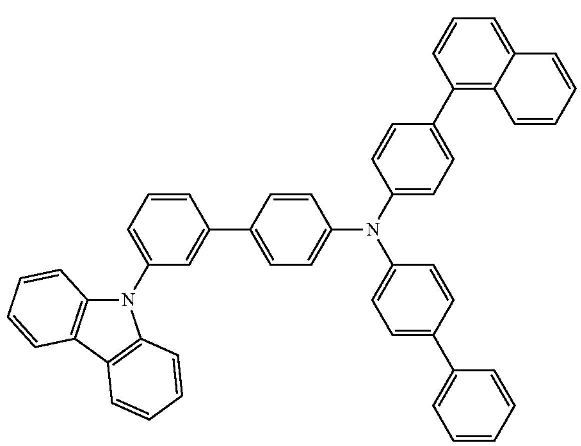
-continued
3-193
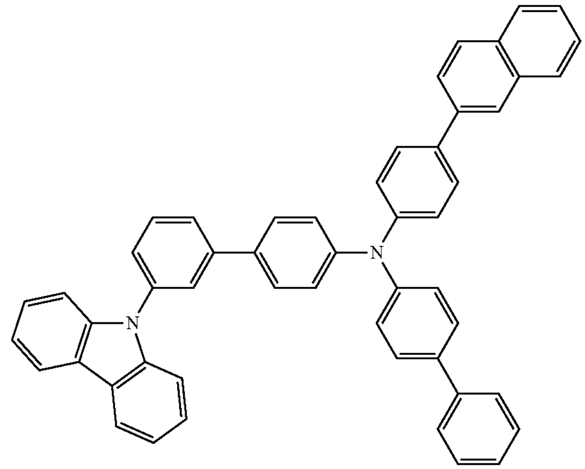
3-194
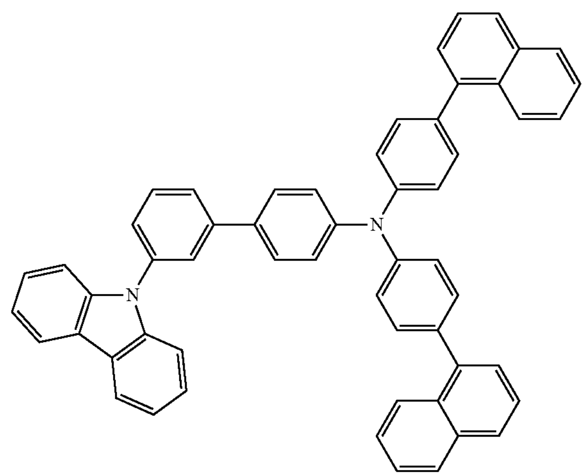
3-195
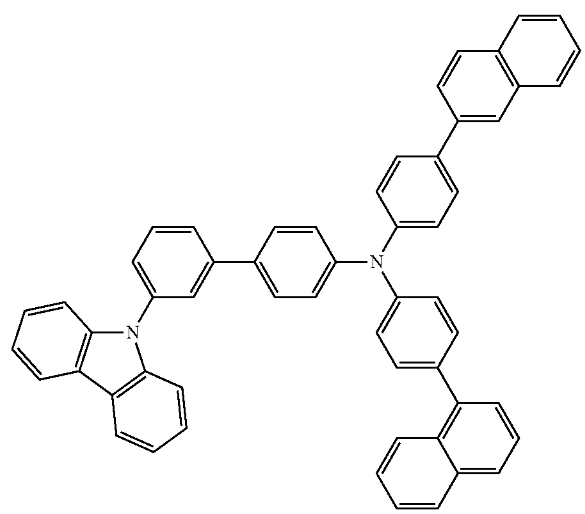

-continued
3-196
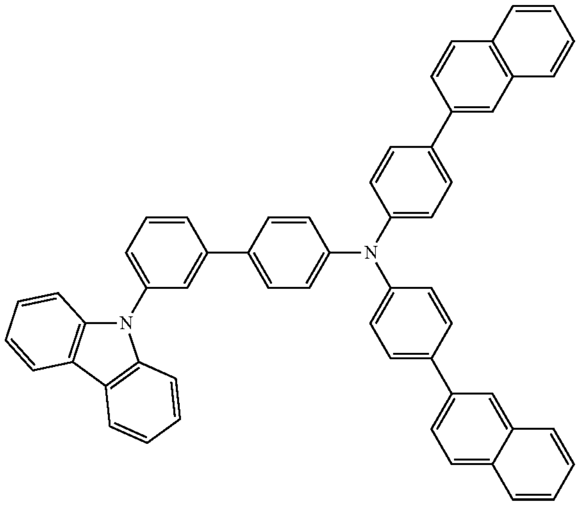
3-197
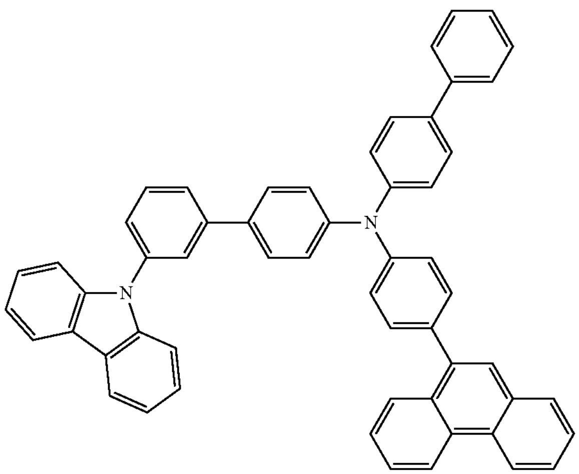
3-198
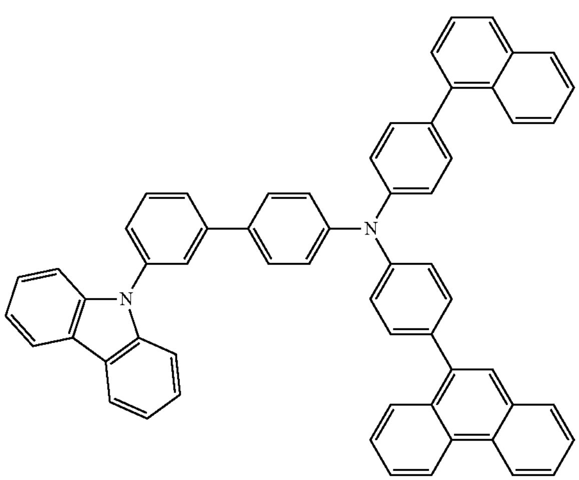
-continued
3-199
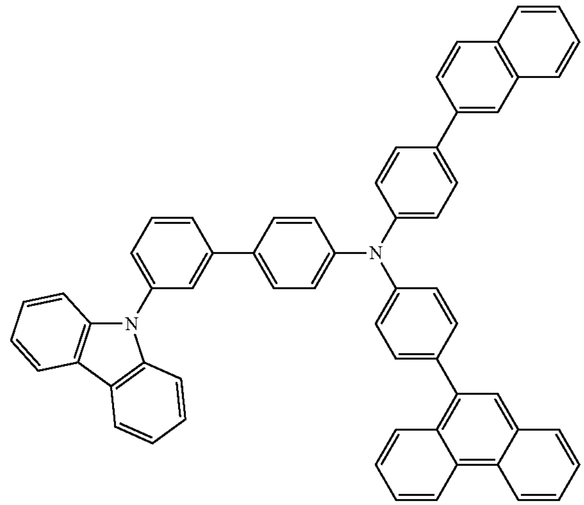
3-200
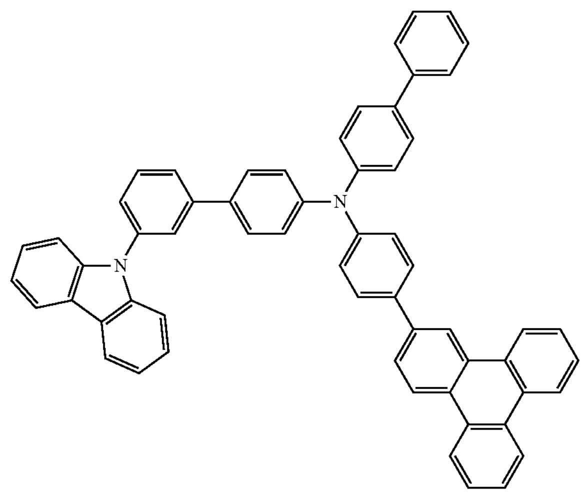
3-201
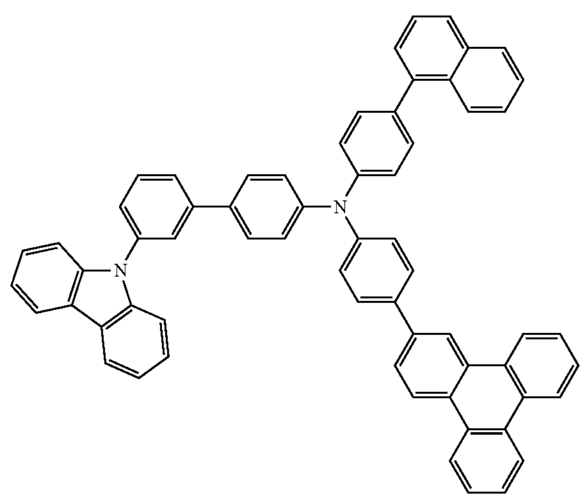

-continued
3-202
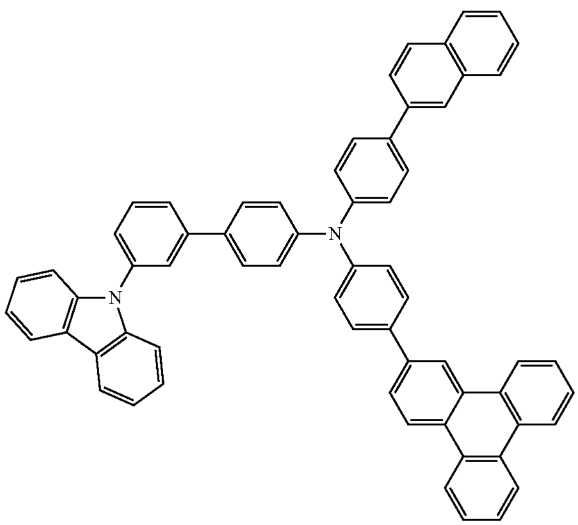
3-203
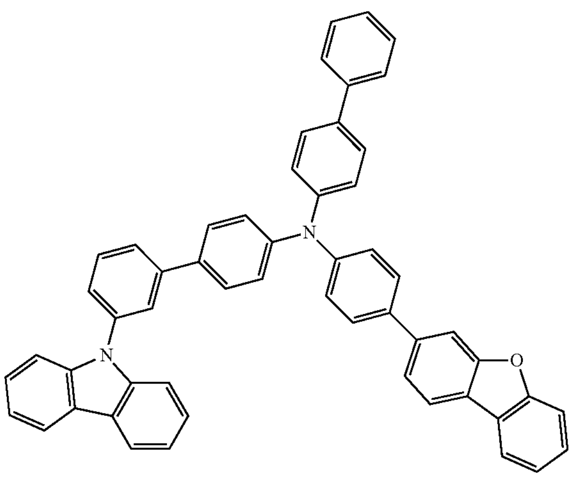
3-204
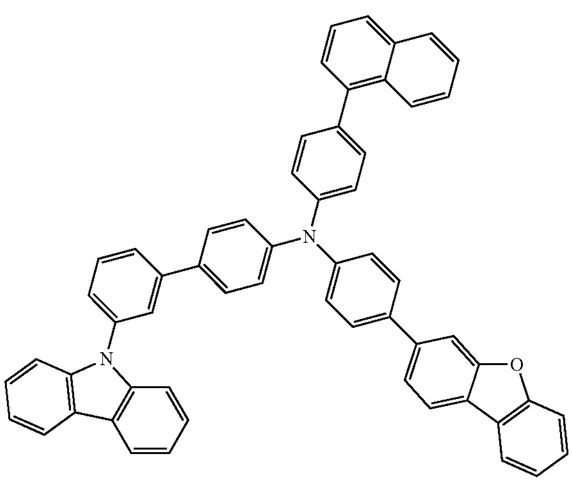
-continued
3-205
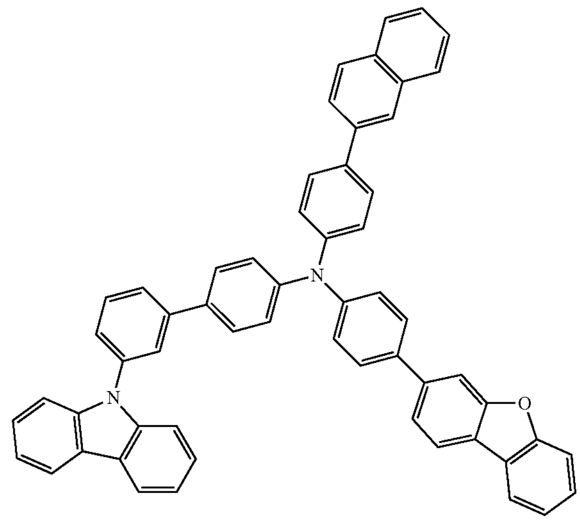
3-206
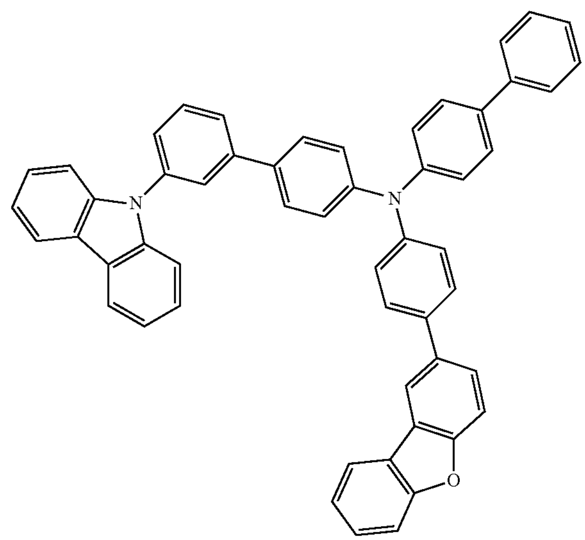
3-207
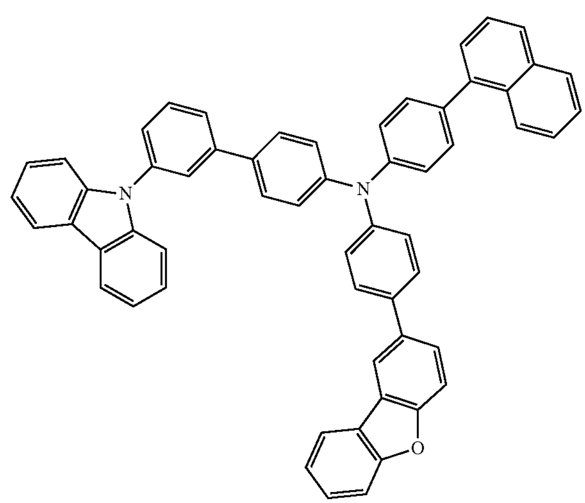

-continued
3-208
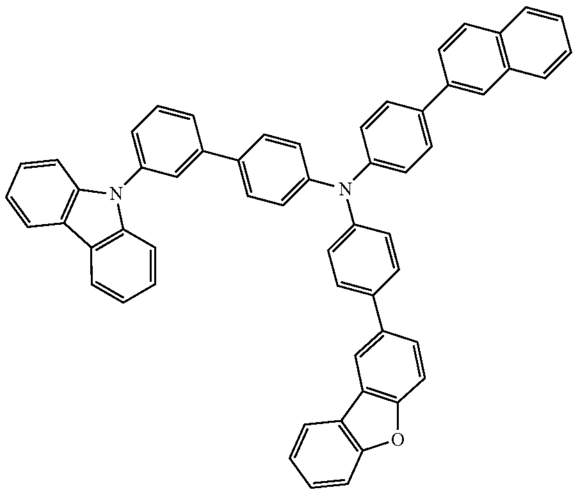
3-209
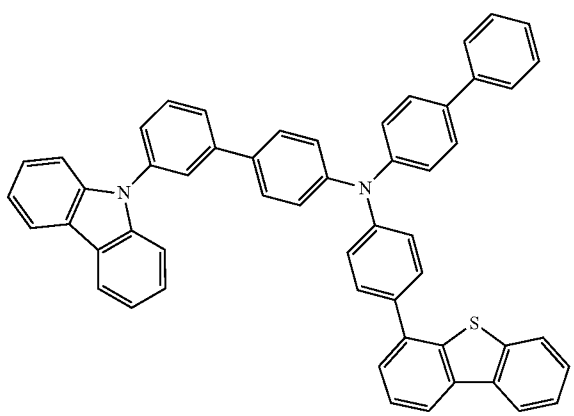
3-210
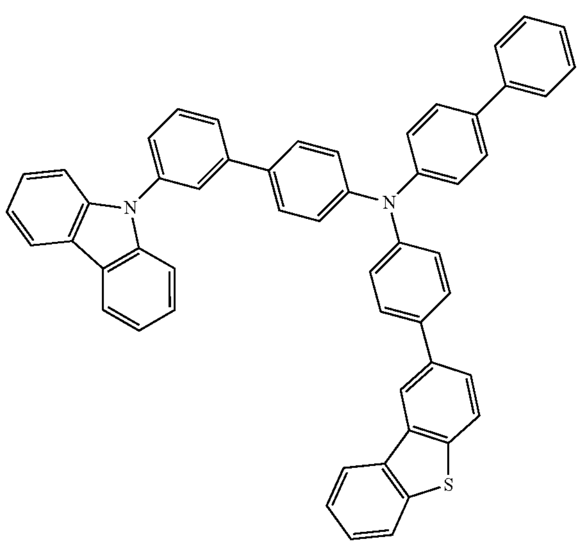
-continued
3-211
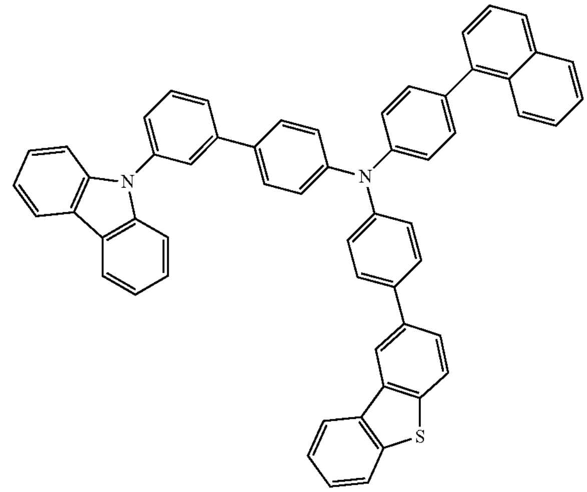
3-212
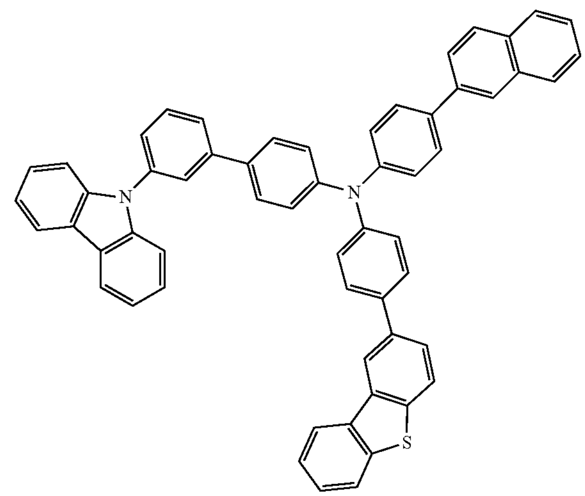
3-213
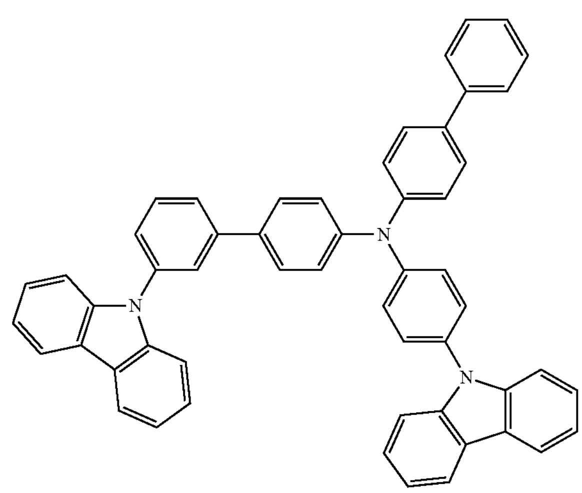

-continued
3-214
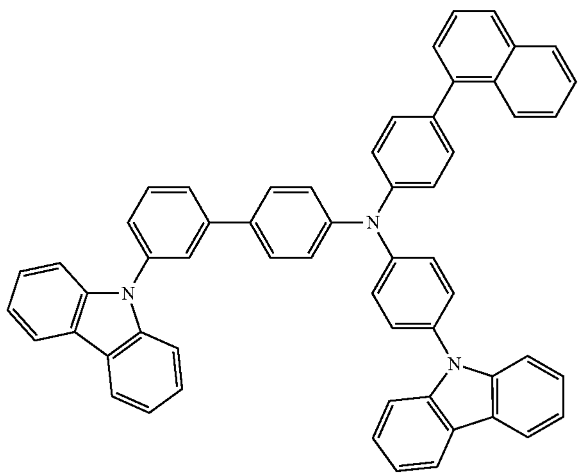
3-215
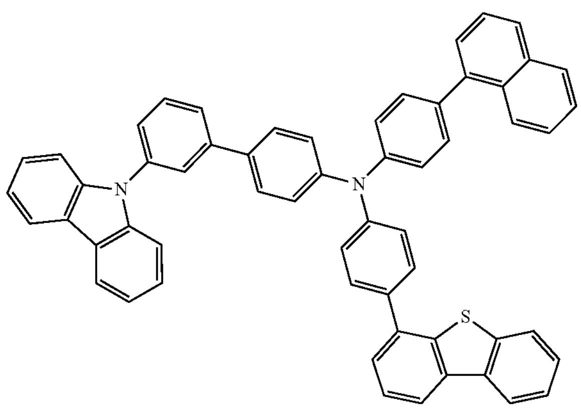
3-216
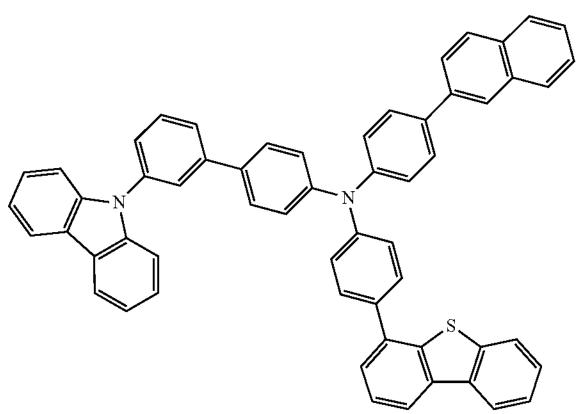
-continued
3-217
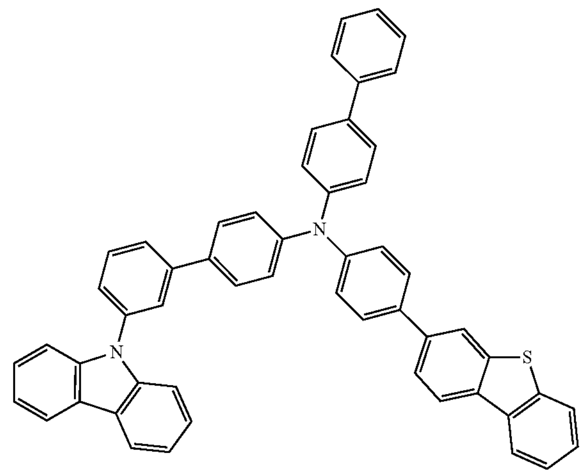
3-218
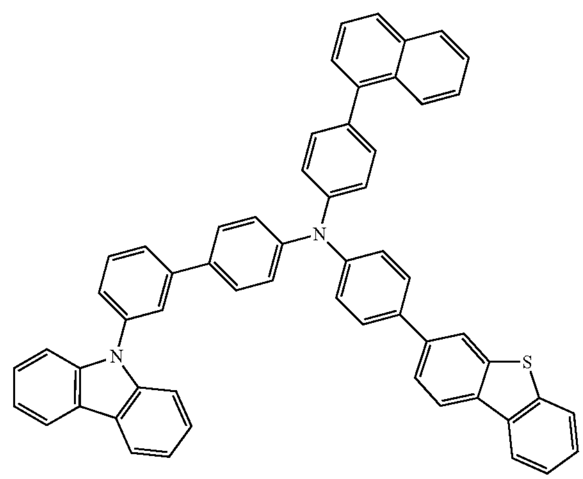
3-219
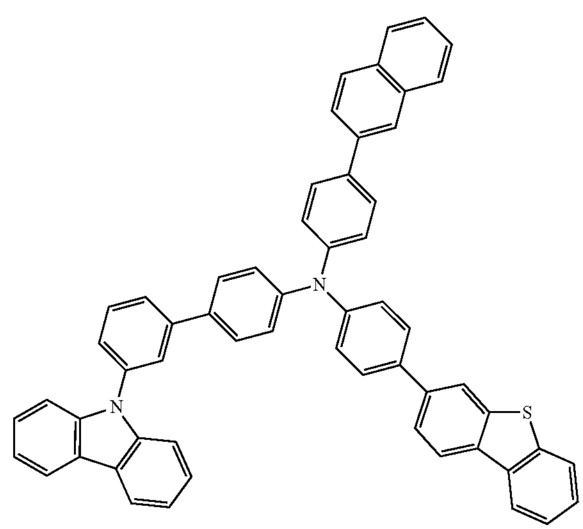

-continued
3-220
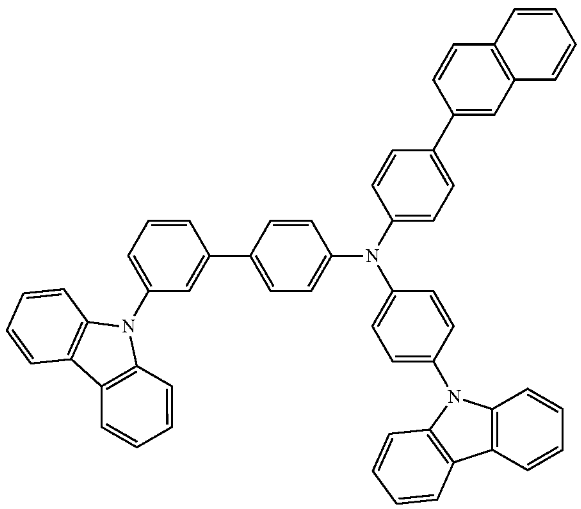
3-221
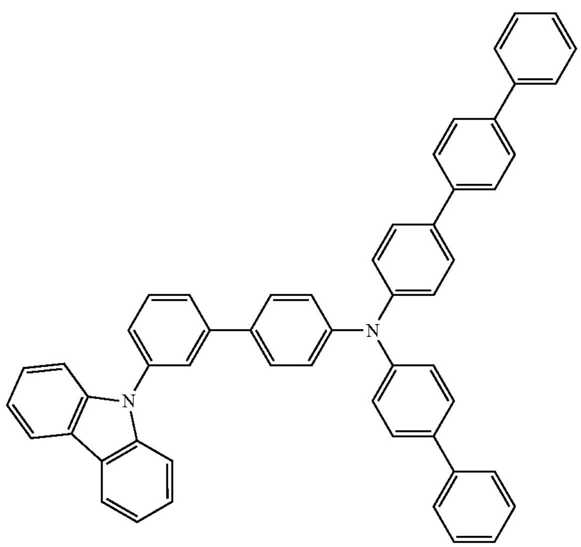
3-222
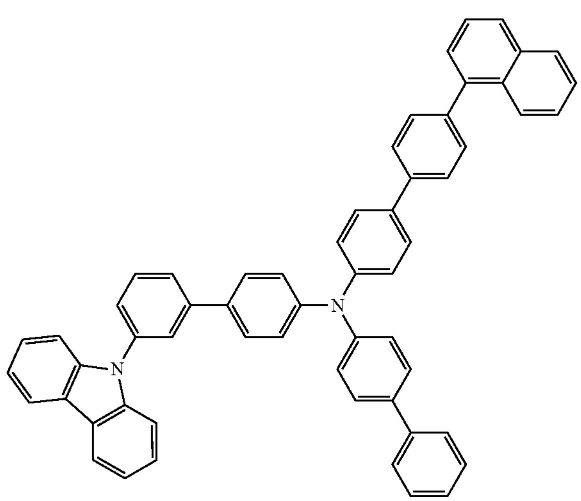
-continued
3-223
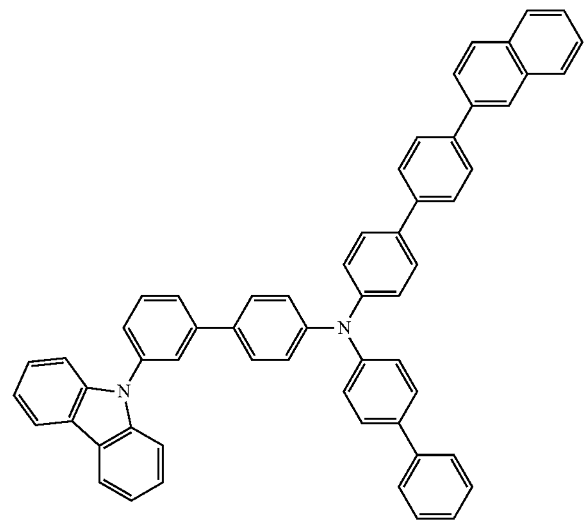
3-224
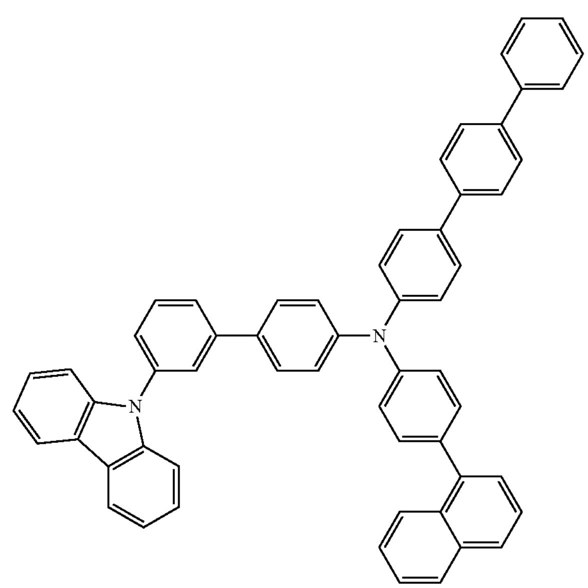

-continued
3-225
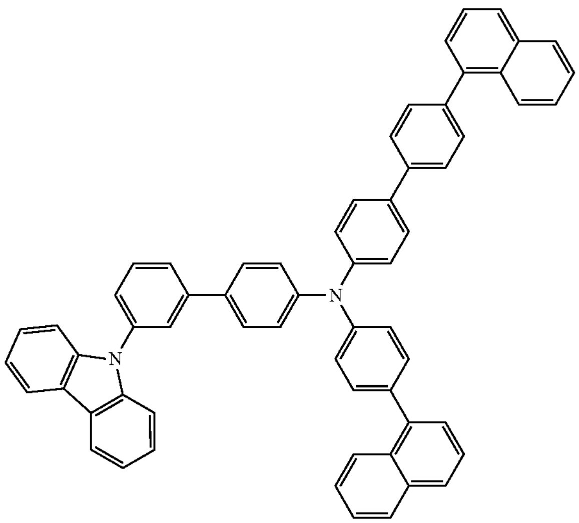
3-226
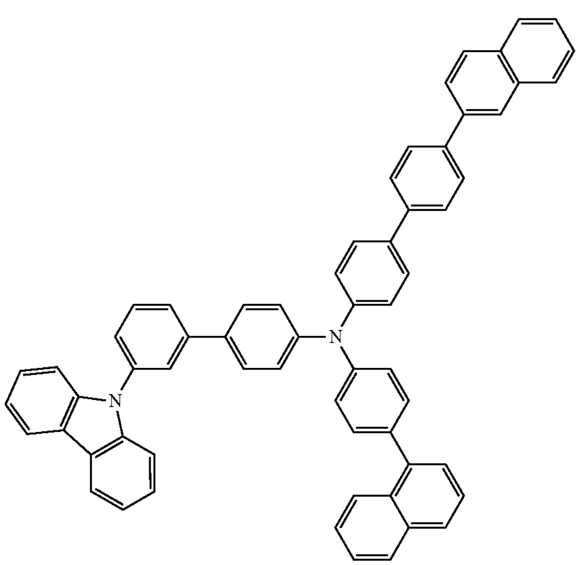
-continued
3-227
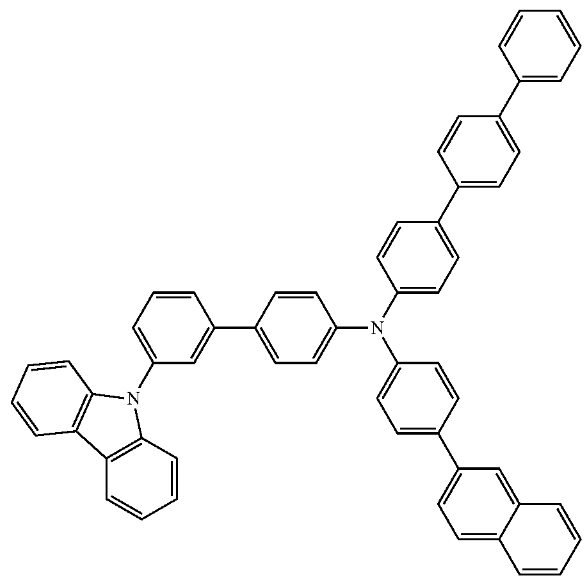
3-228
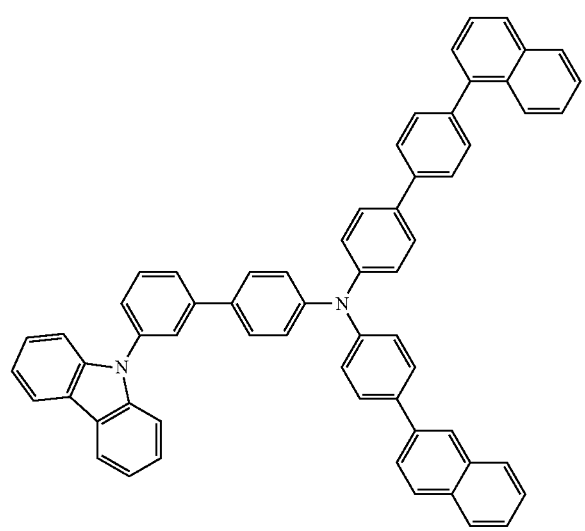

-continued
3-229
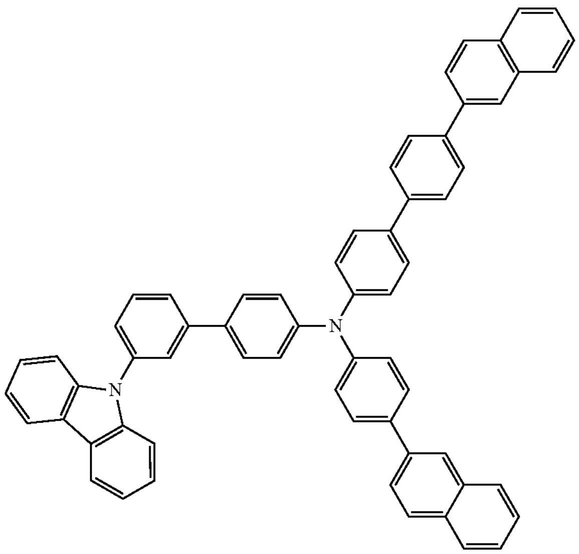
3-230
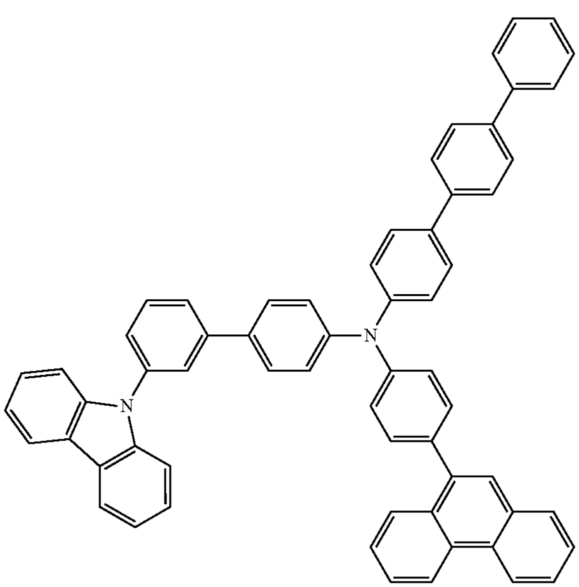
-continued
3-231
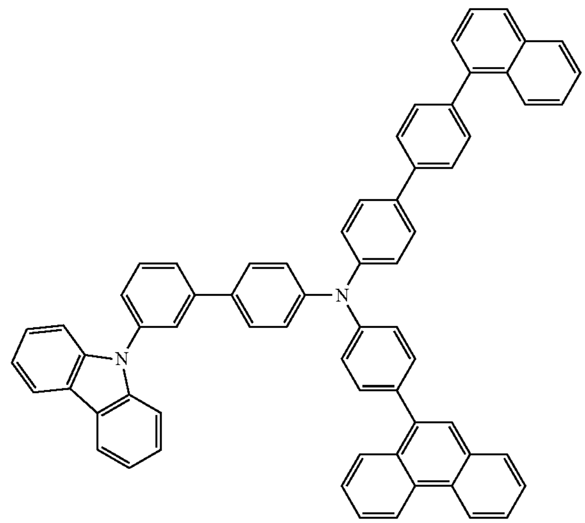
3-232
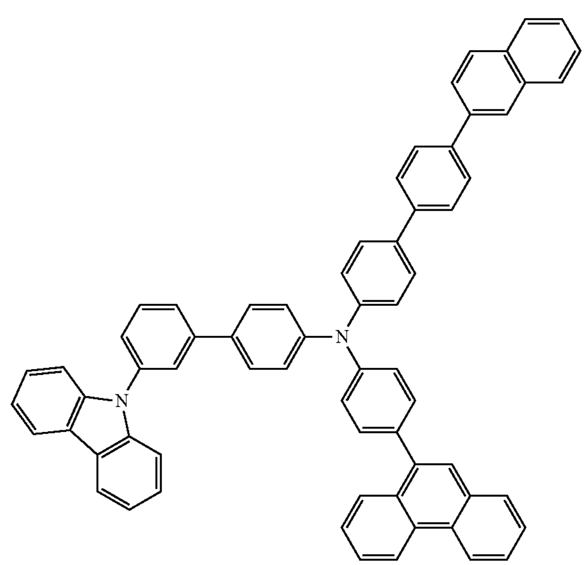

-continued
3-233
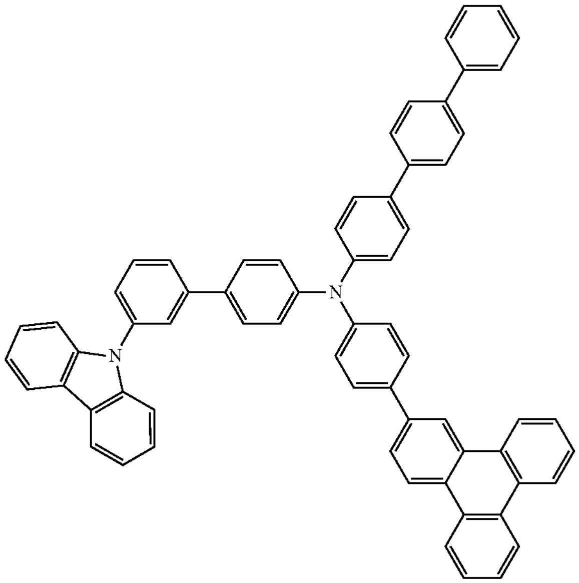
3-234
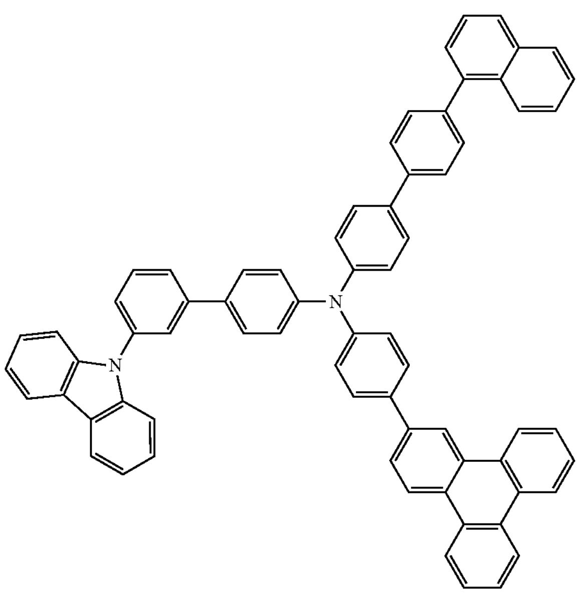
-continued
3-235
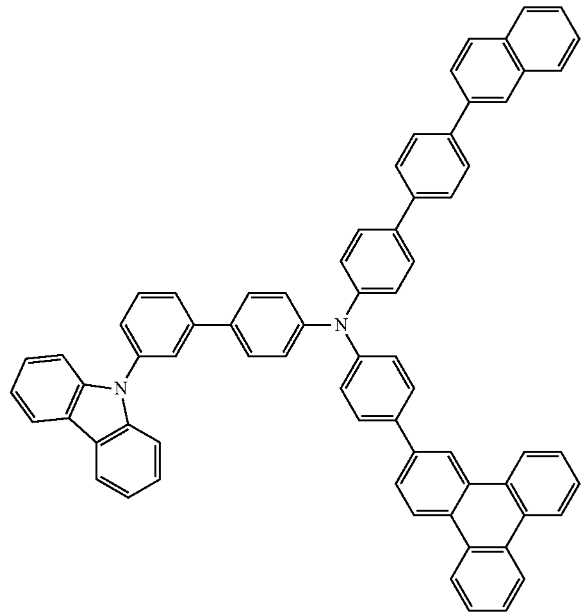
3-236
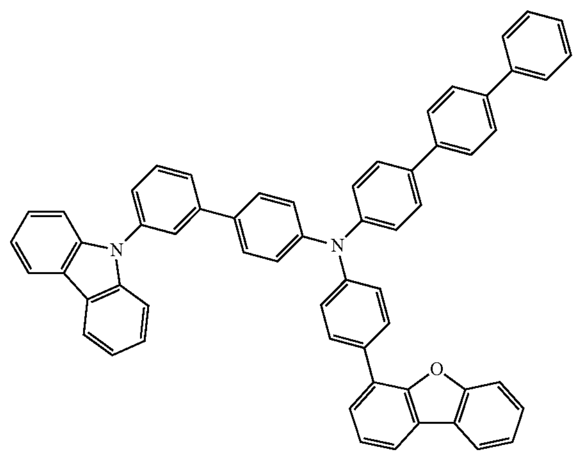
3-237
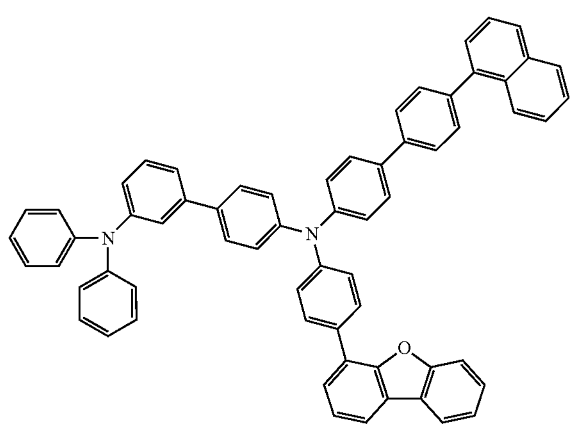

-continued
3-238
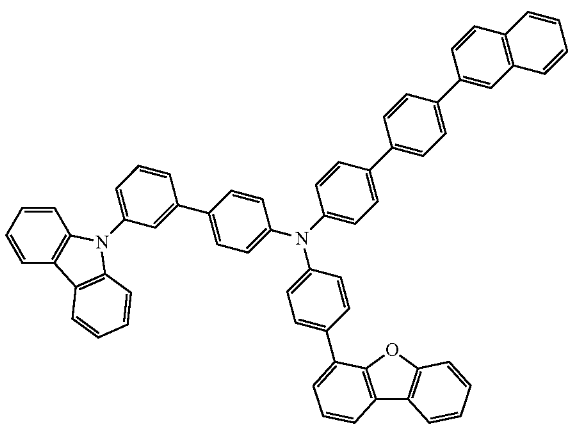
3-239
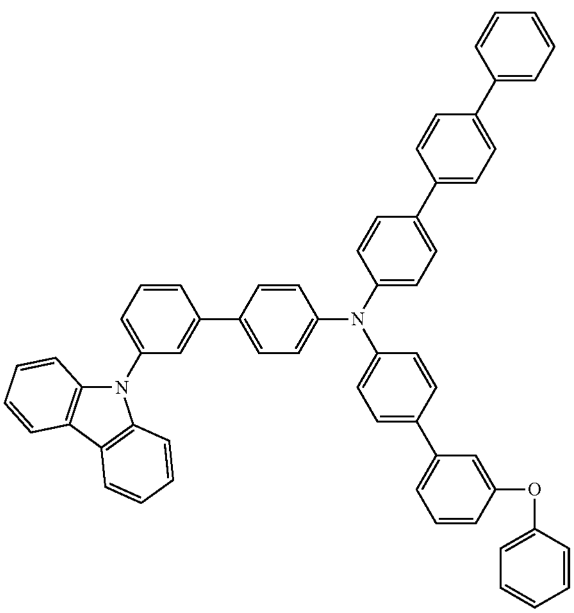
3-240
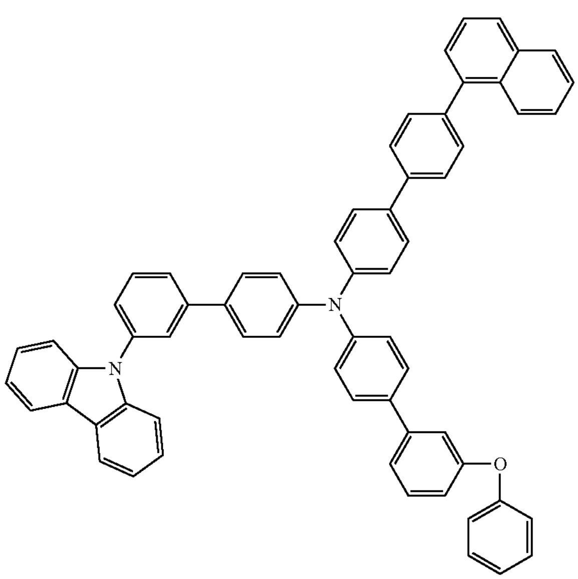
-continued
3-241
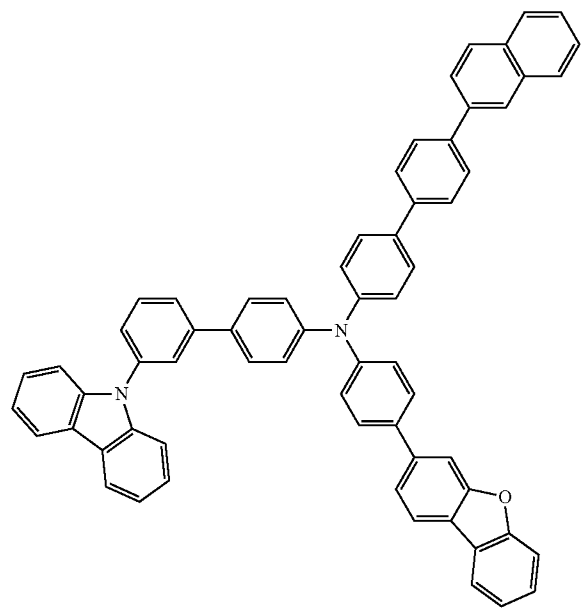
3-242
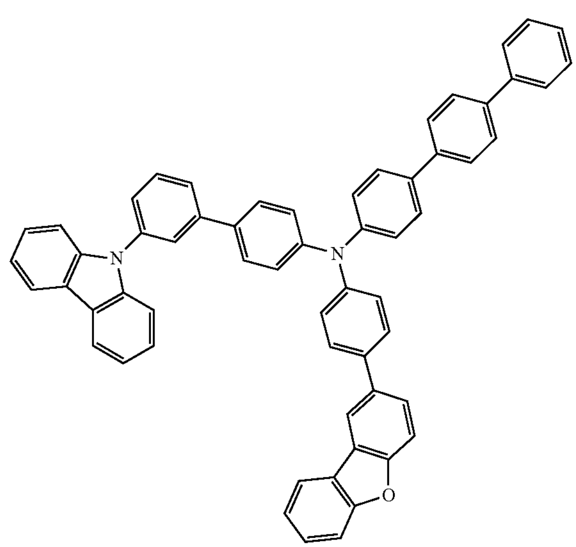

-continued
3-243
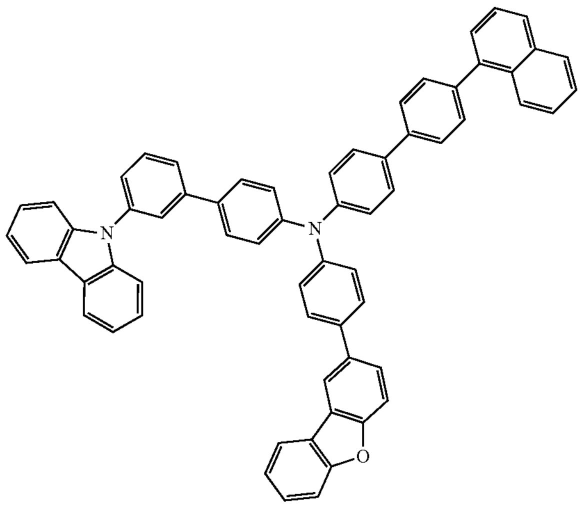
3-244
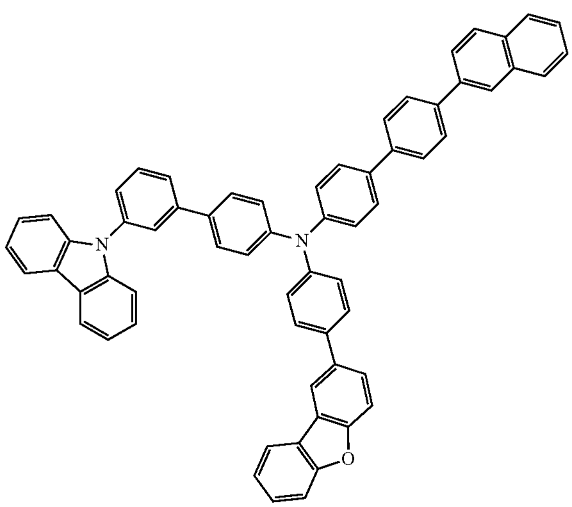
3-245
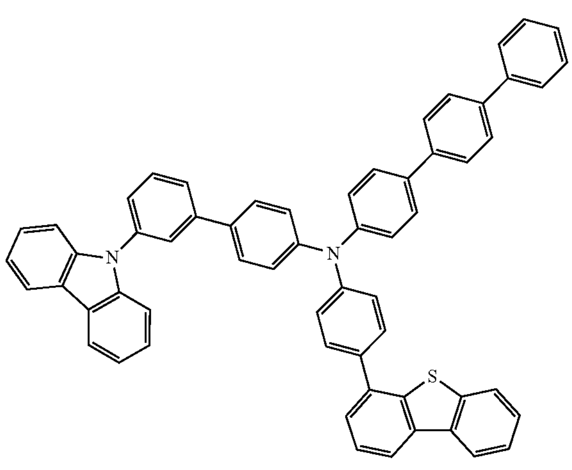
-continued
3-246
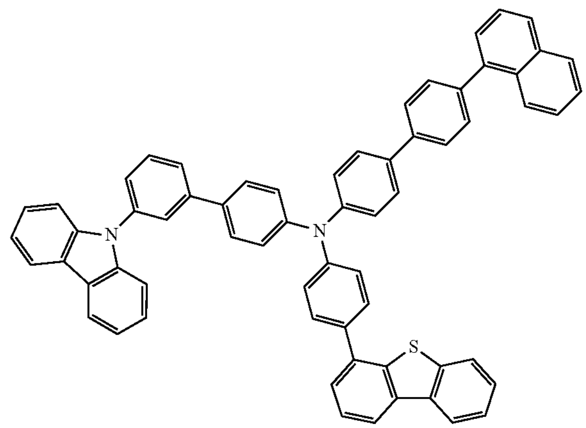
3-247
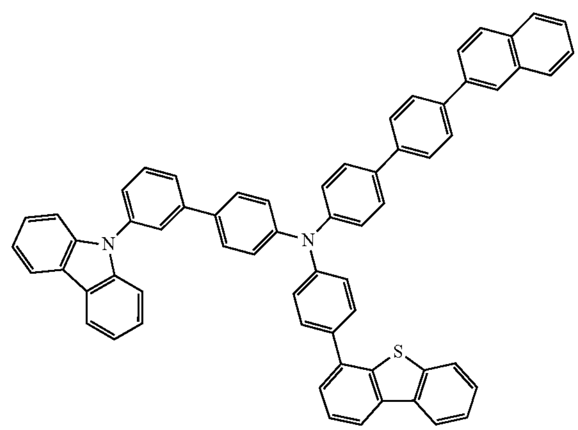
3-248
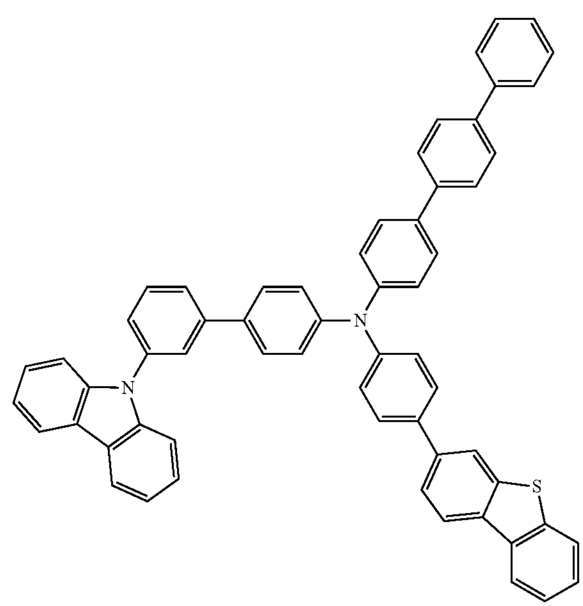

-continued
3-249
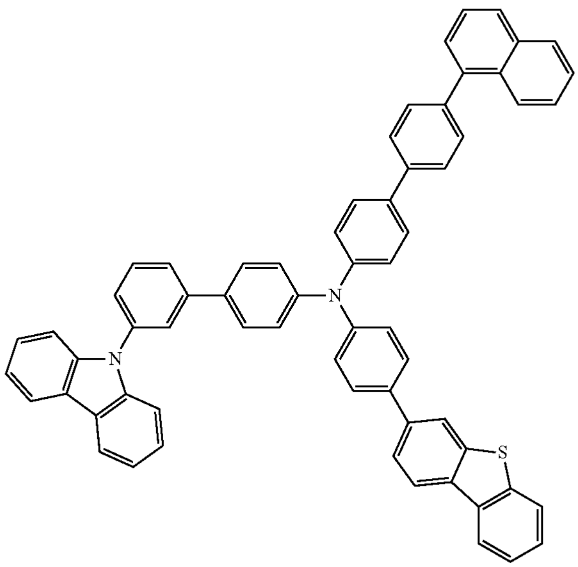
3-250
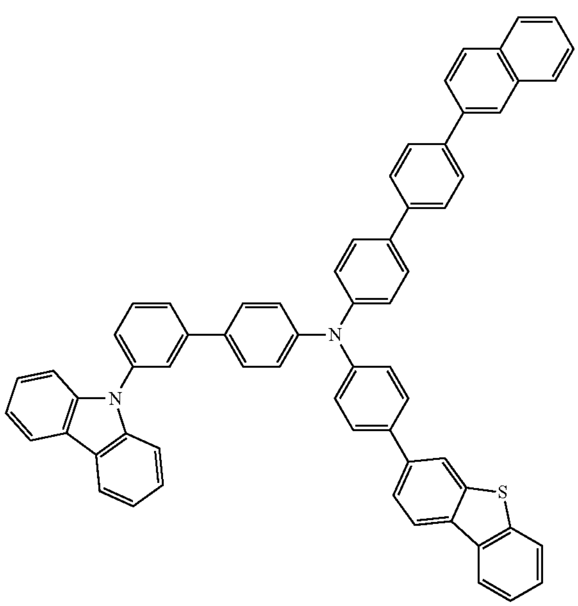
-continued
3-251
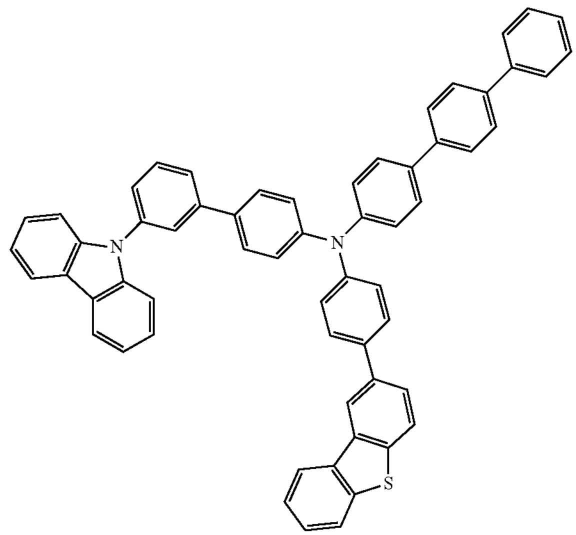
3-252
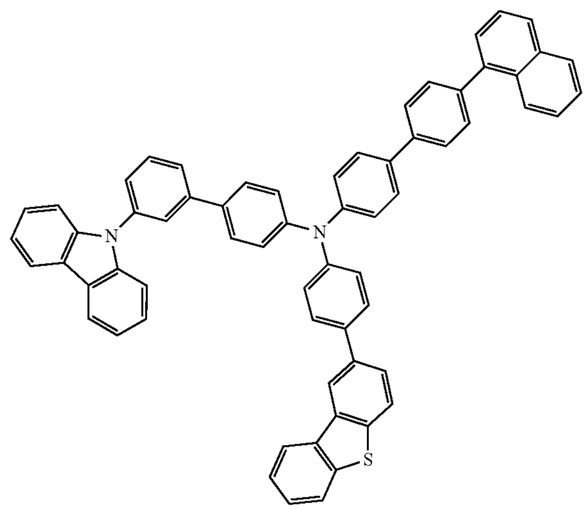
3-253
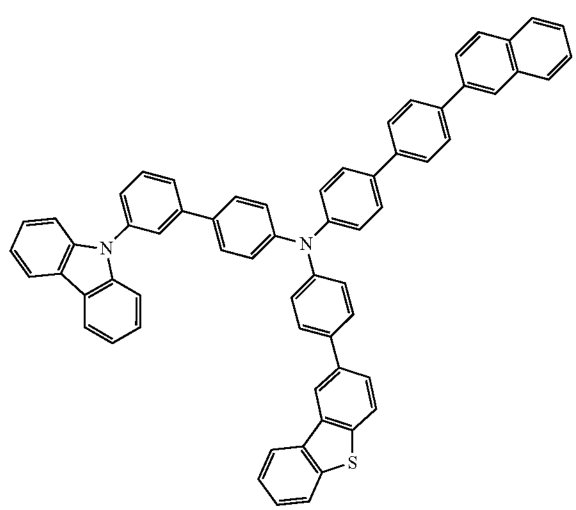

-continued
3-254
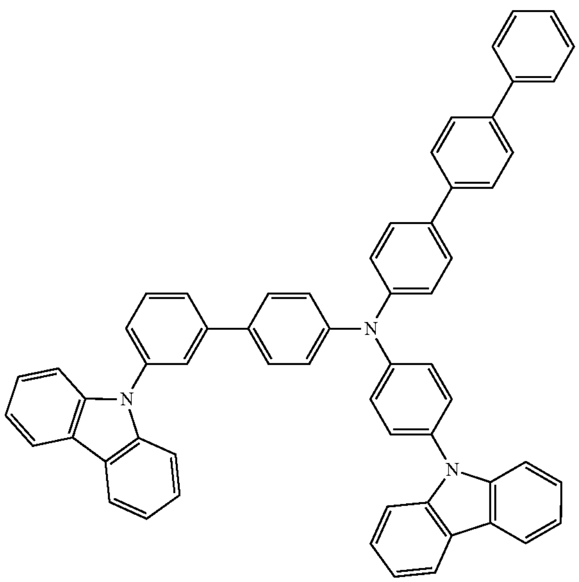
3-255
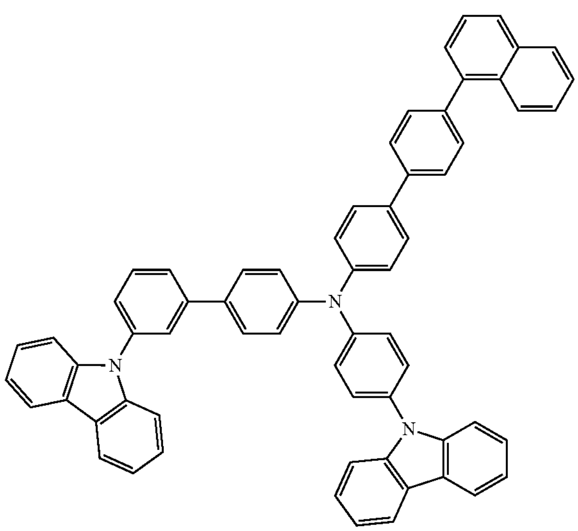
-continued
3-256
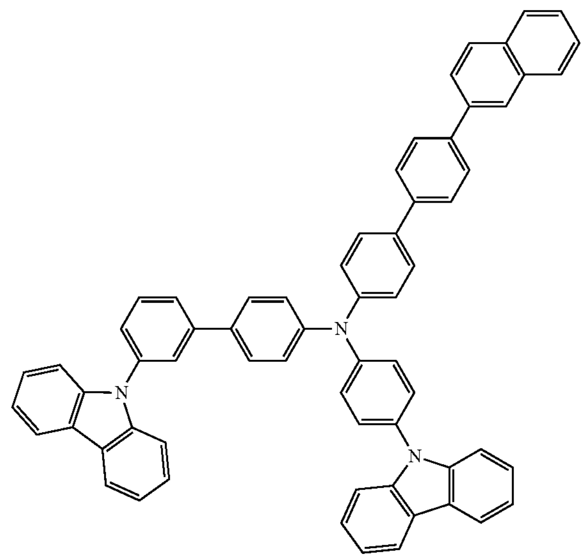
3-257
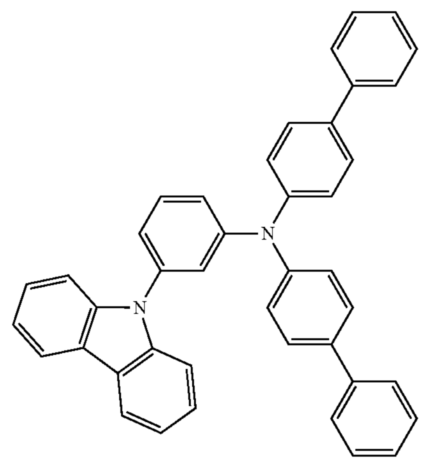
3-258
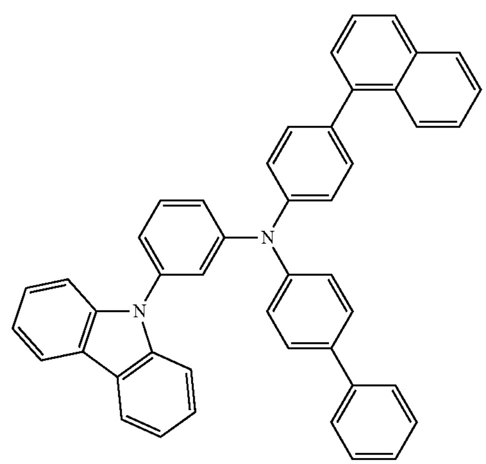

-continued
3-259
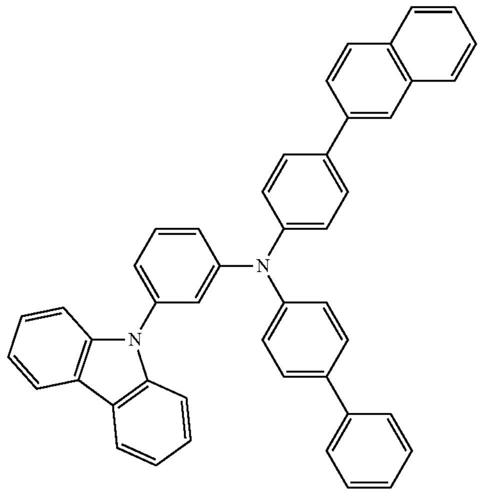
3-260
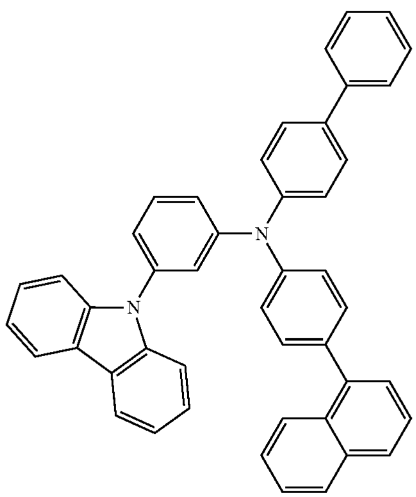
3-261
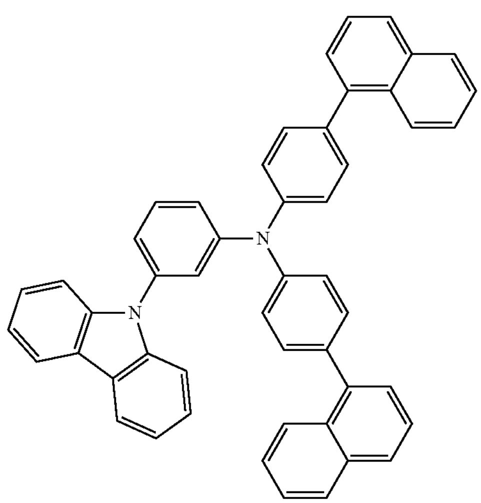
-continued
3-262
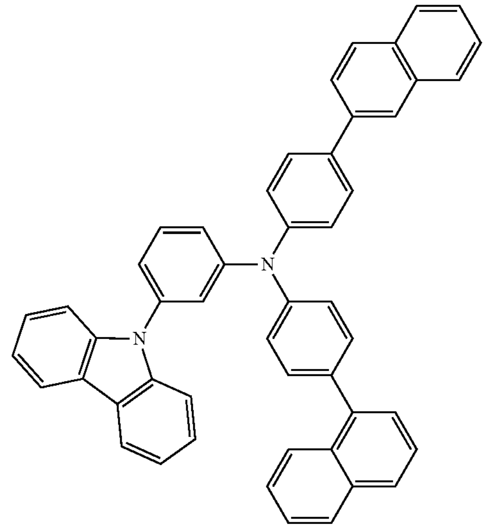
3-263
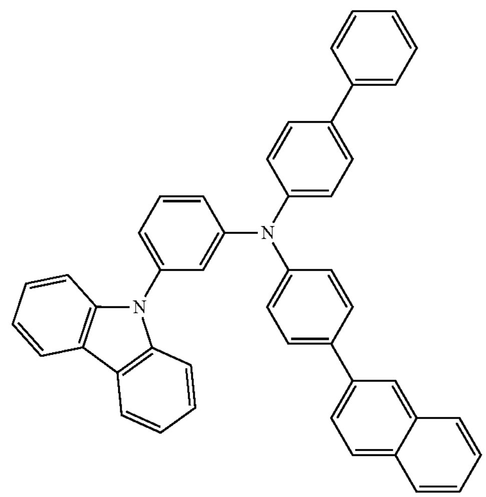
3-264
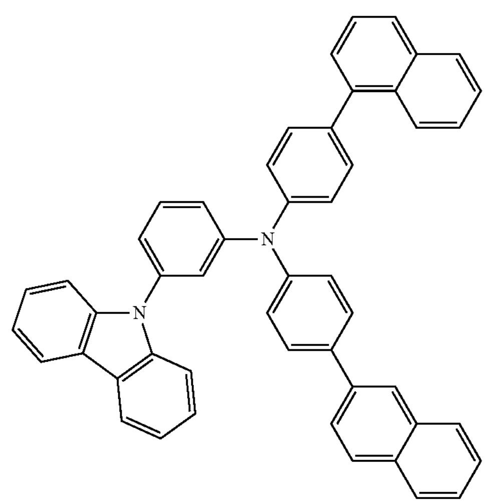

-continued
3-265
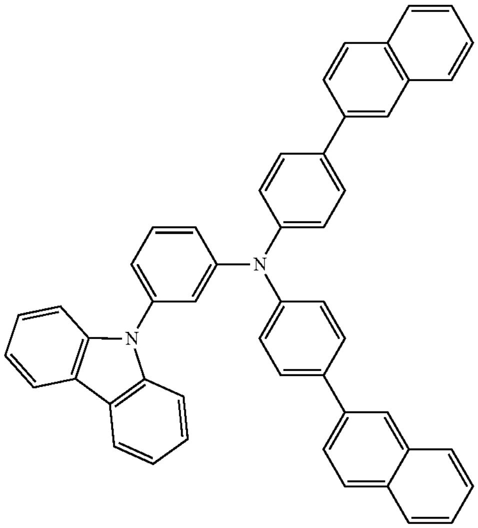
3-266
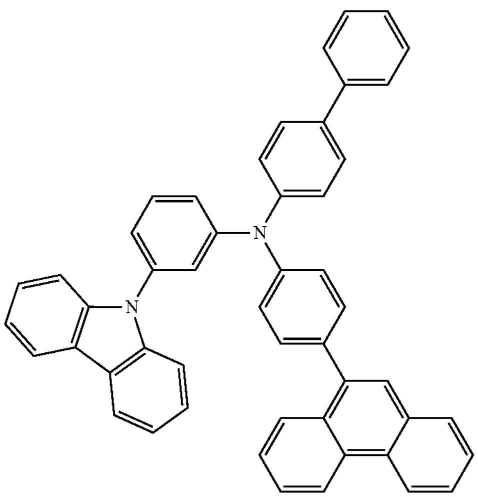
3-267
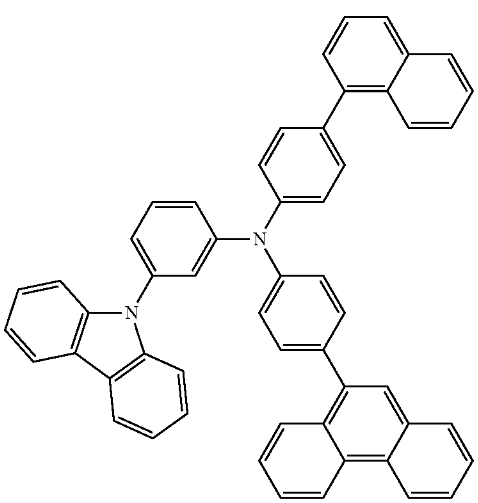
-continued
3-268
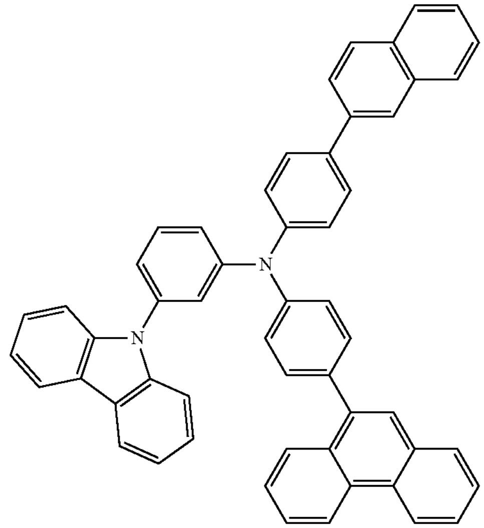
3-269
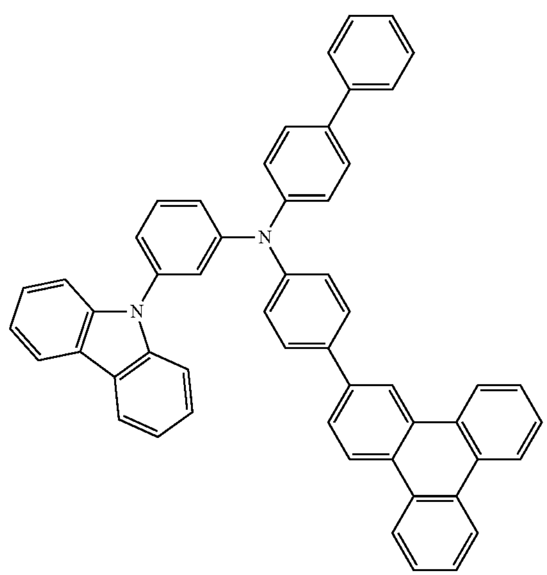

3-270
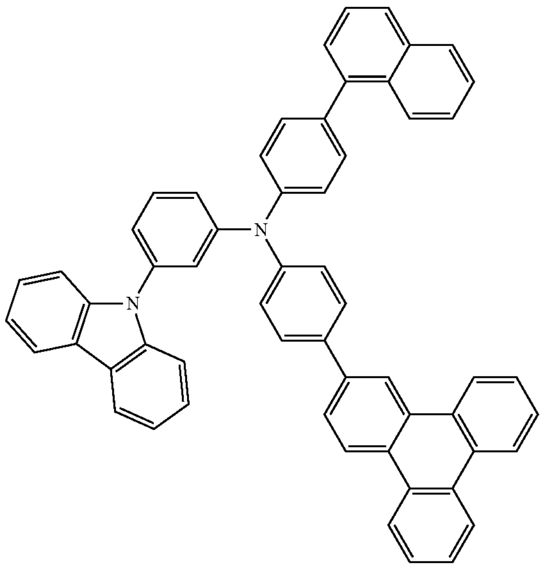
3-271
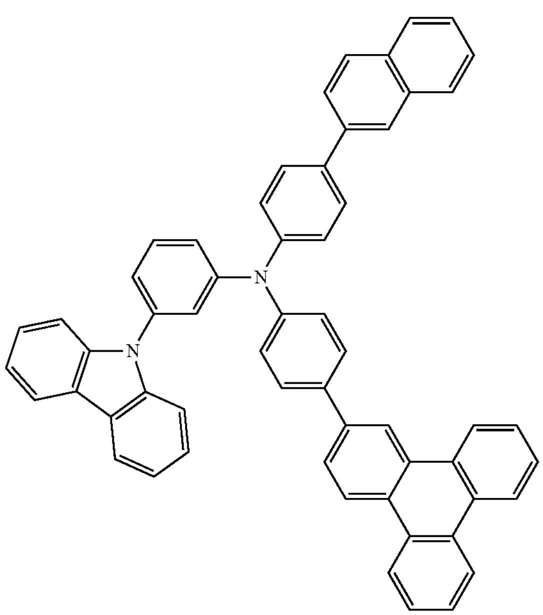
3-272
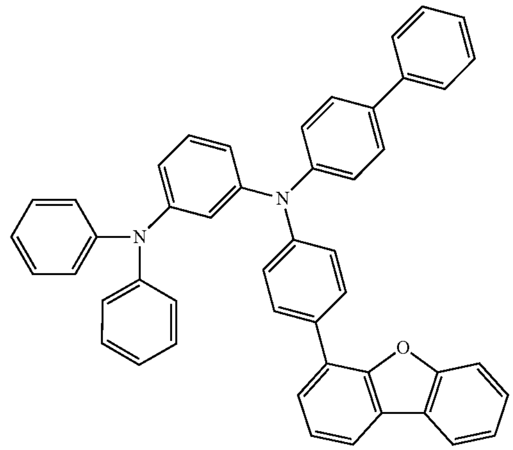
3-273
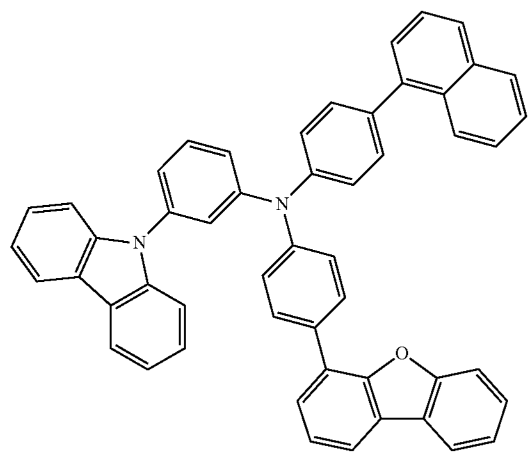
3-274
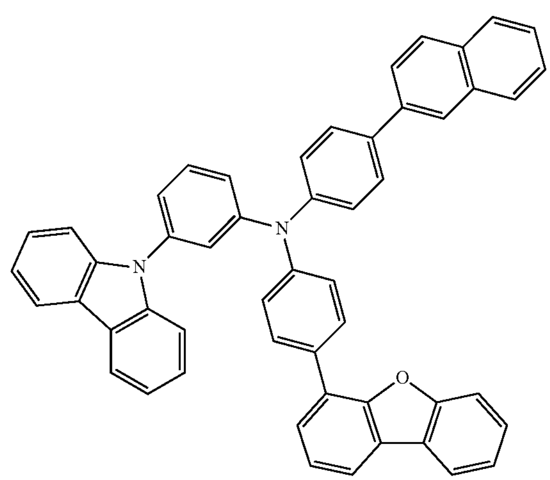

-continued
3-275
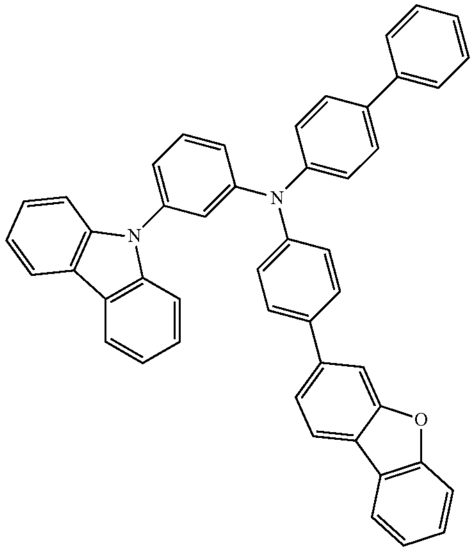
3-276
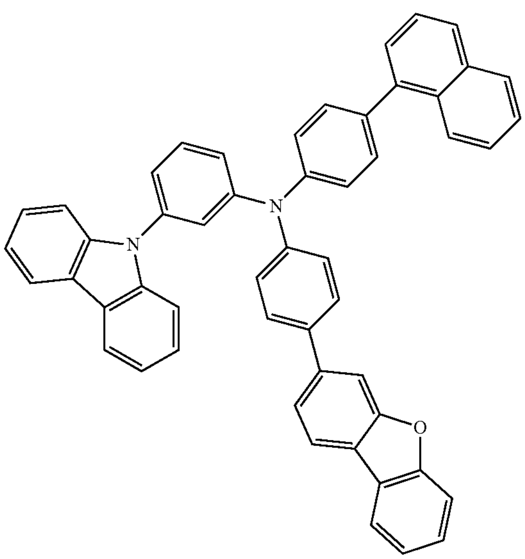
-continued
3-277
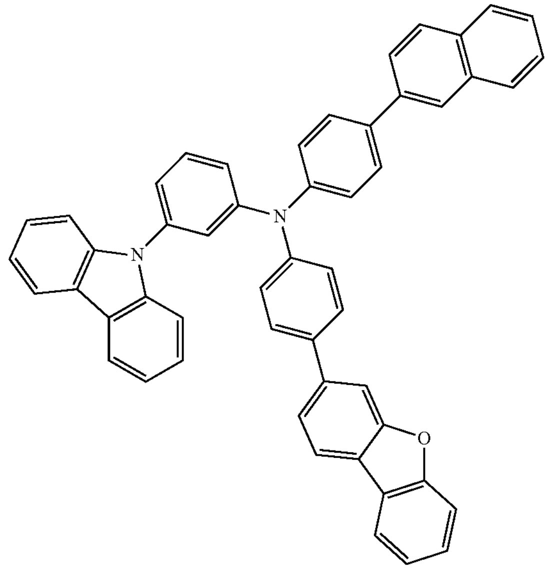
3-278
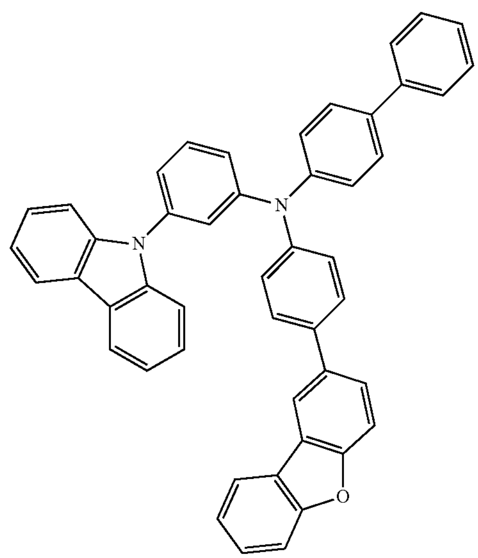

3-279
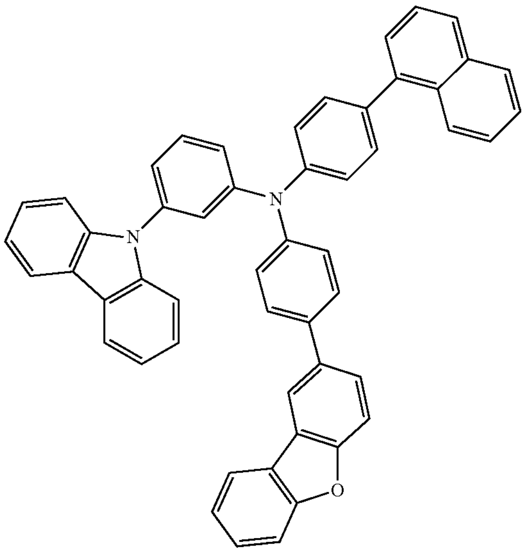
3-280
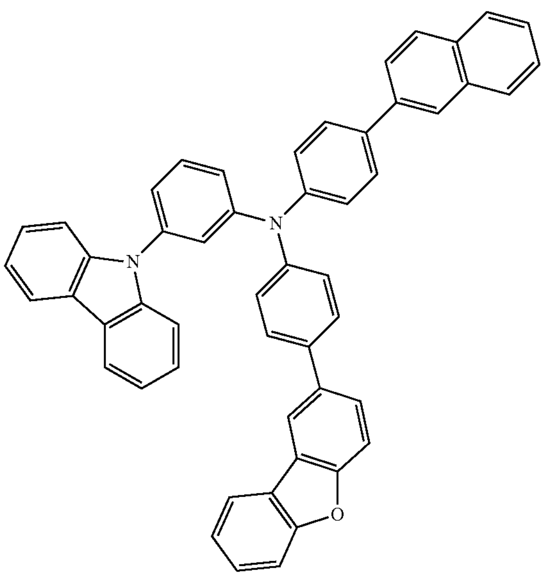
3-281
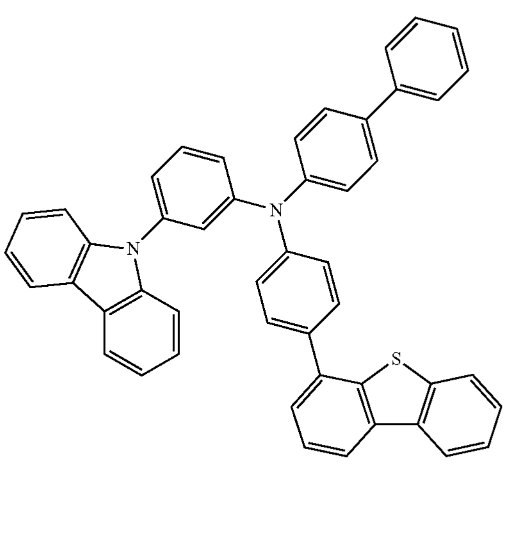
3-282
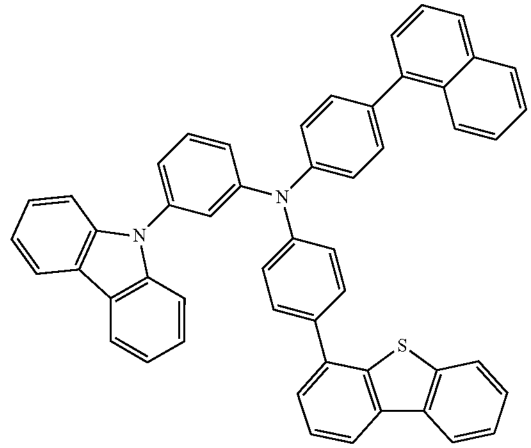
3-283
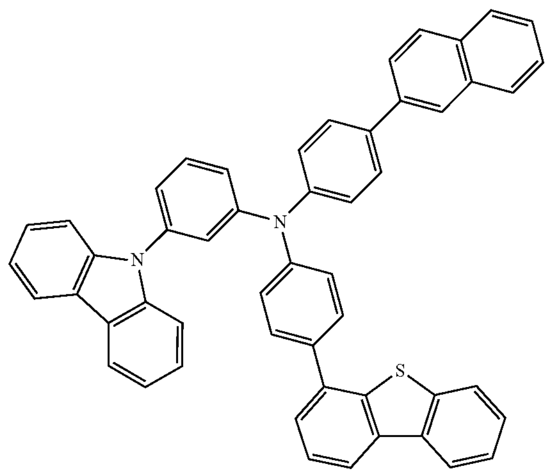
3-284
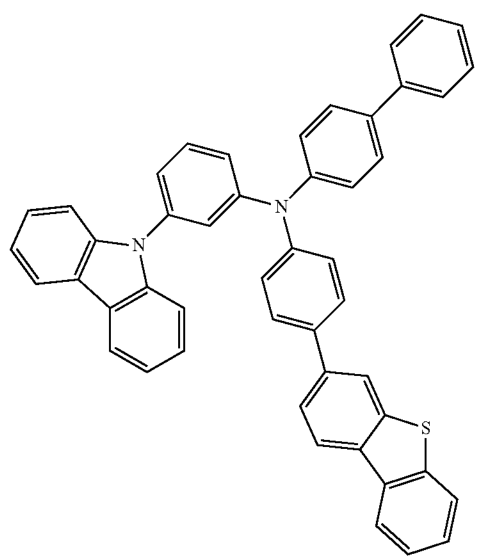

-continued
3-285
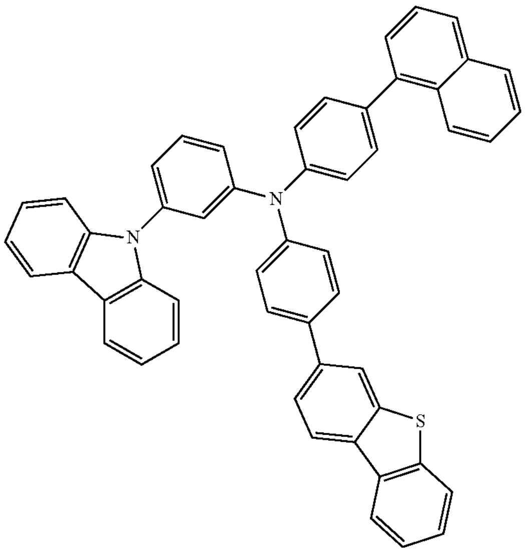
3-286
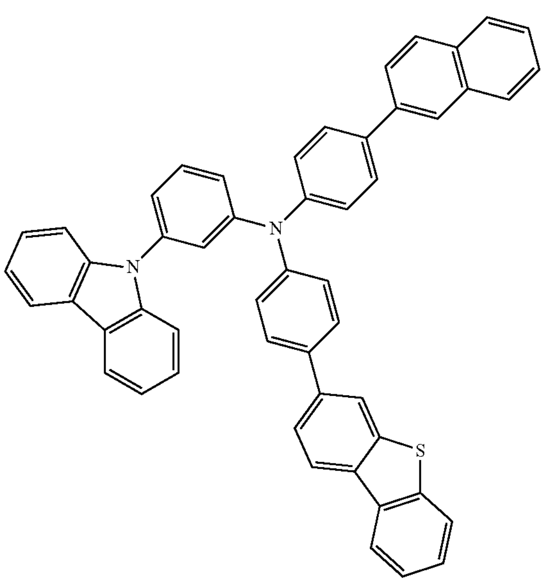
-continued
3-287
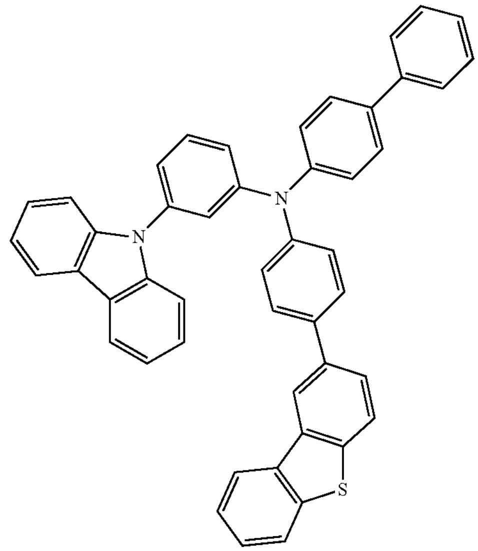
3-288
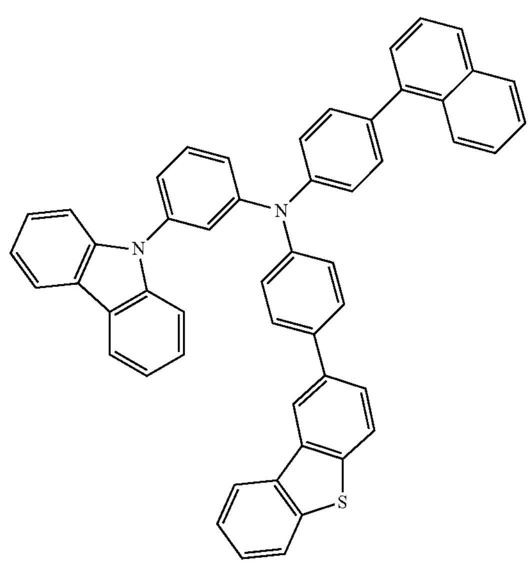

-continued
3-289
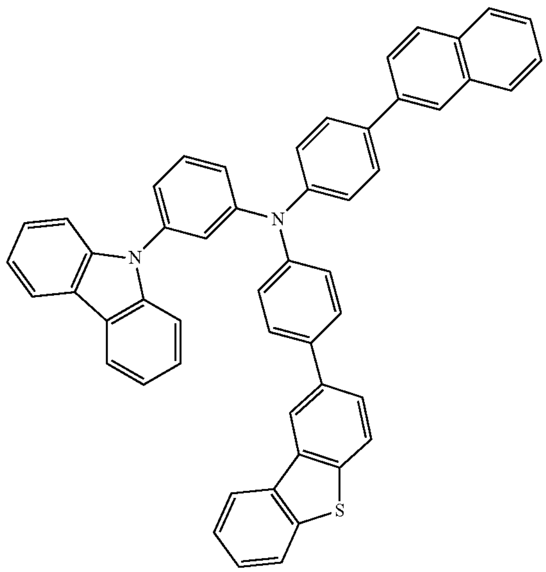
3-290
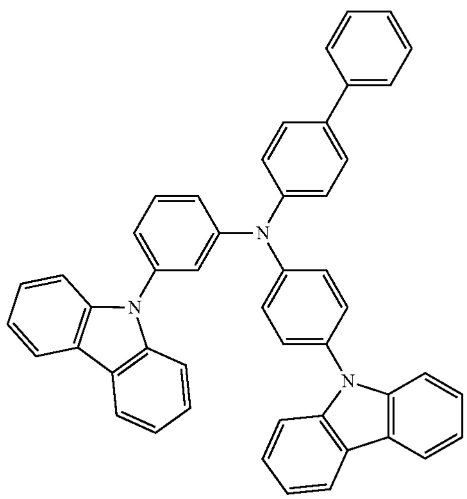
3-291
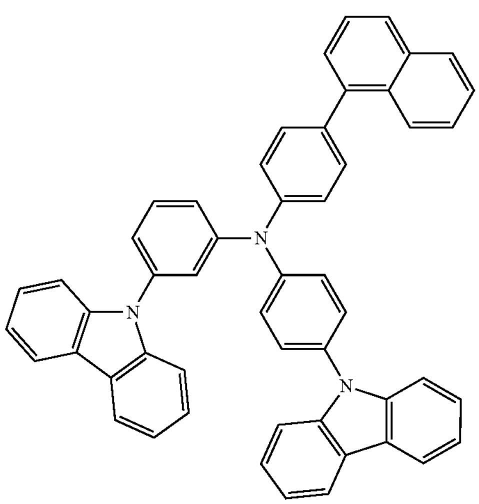
-continued
3-292
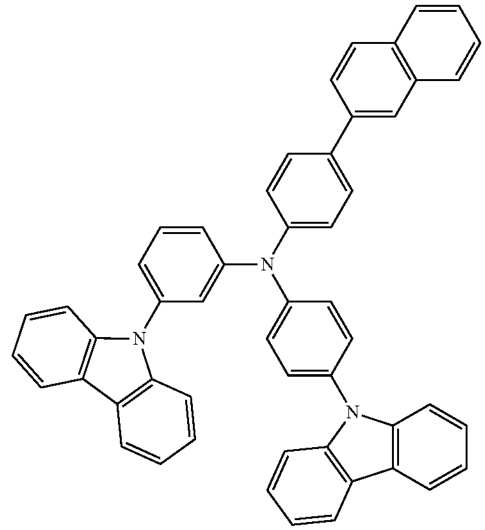
3-293
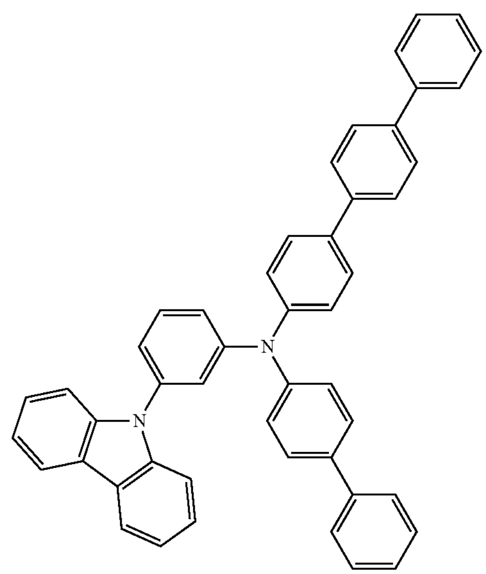

-continued
3-294
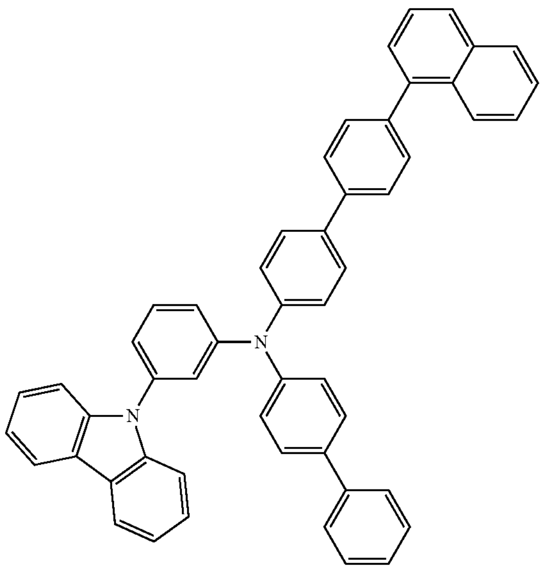
3-295
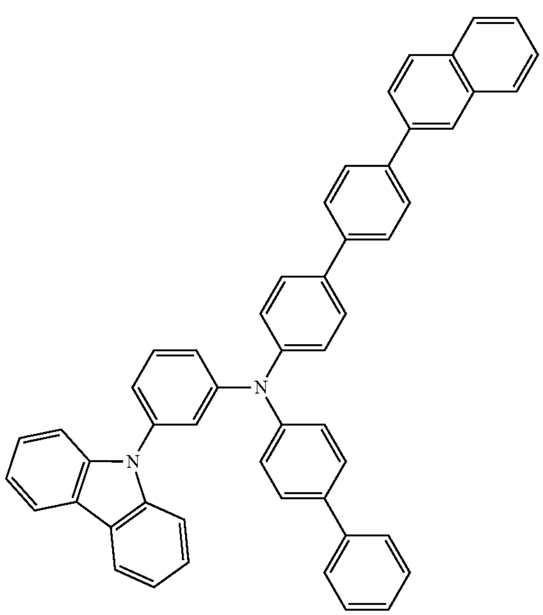
-continued
3-296
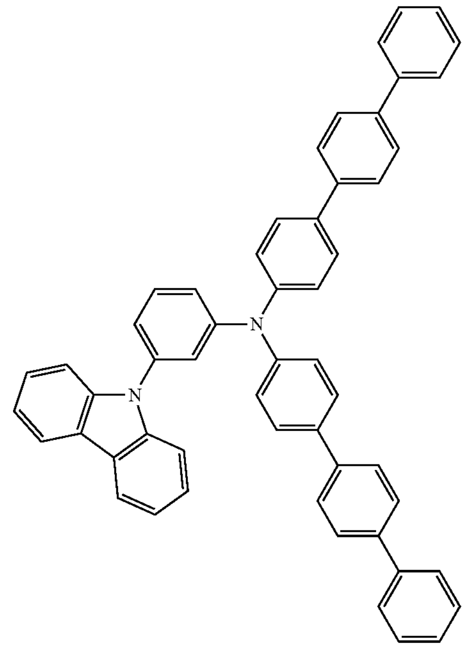
3-297
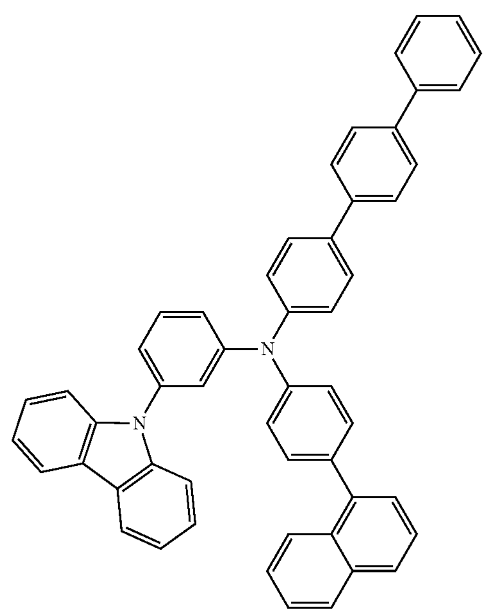

-continued
3-298
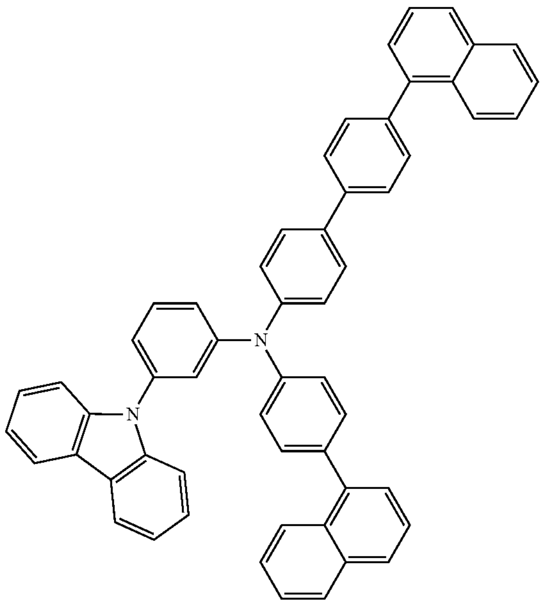
3-299
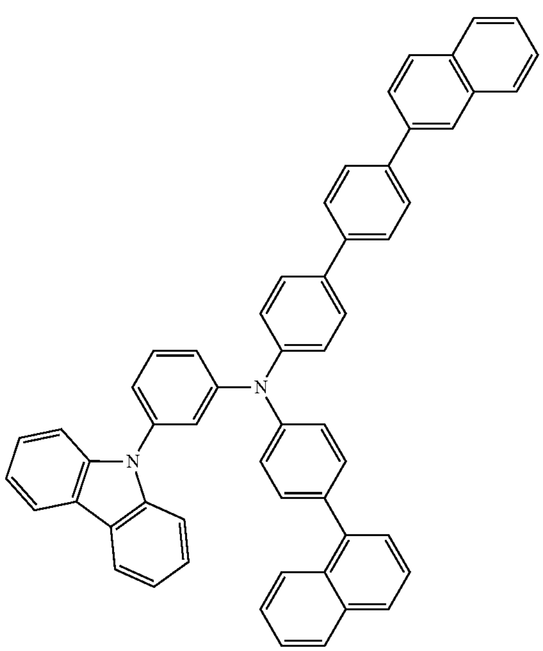
-continued
3-300
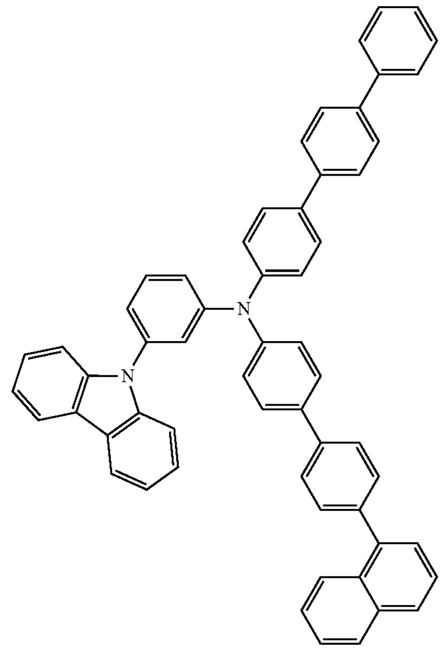
3-301
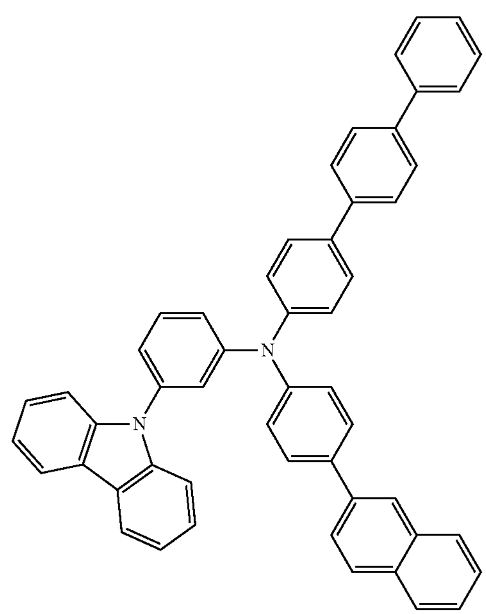

3-302
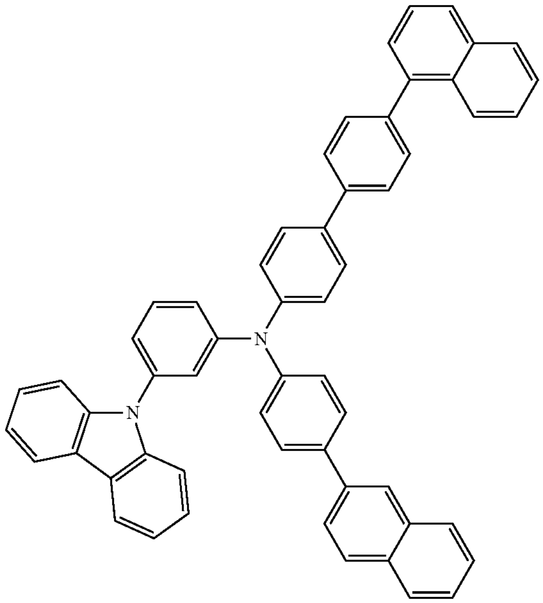
3-303
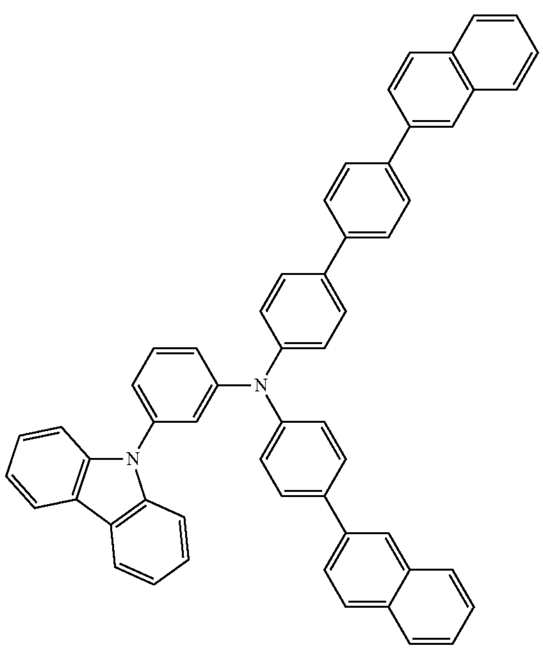
3-304
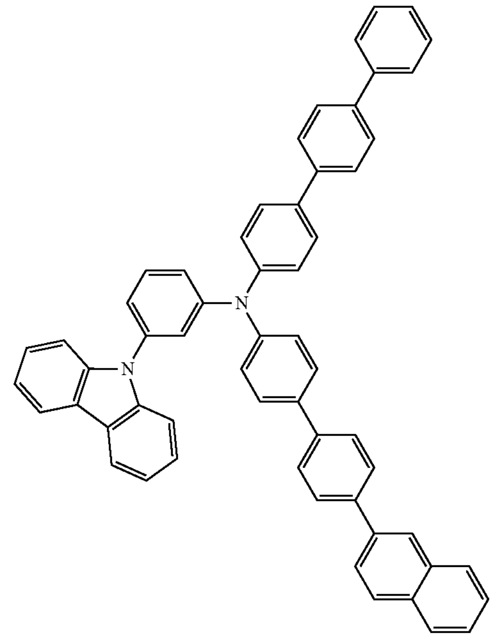
3-305
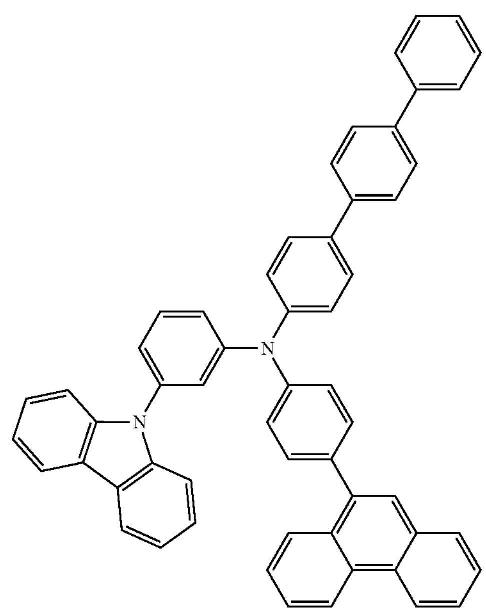

3-306
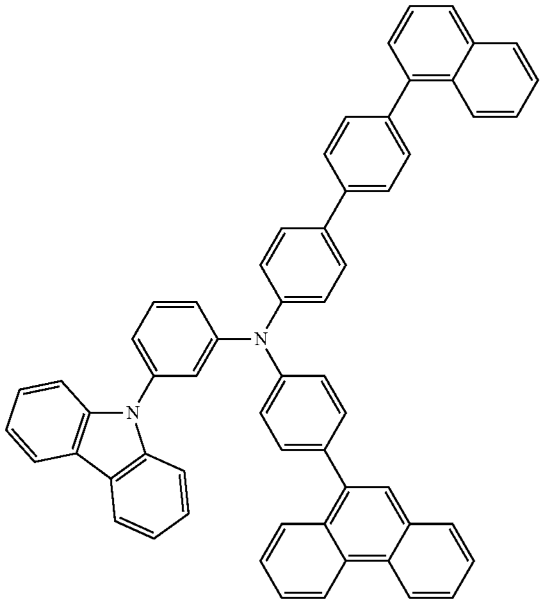
3-307
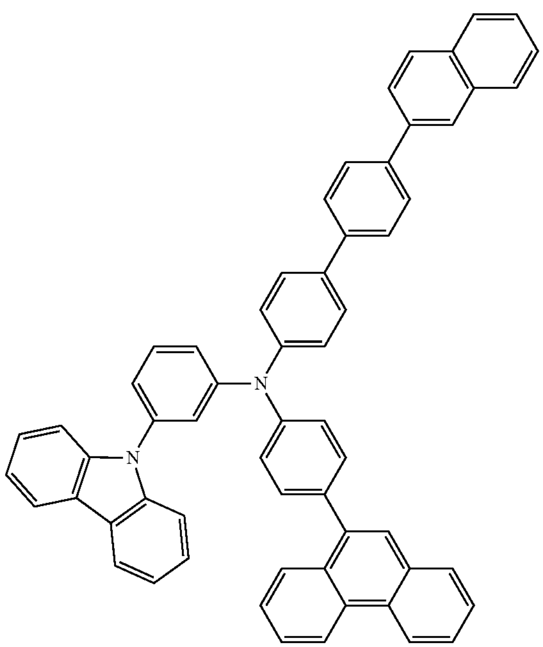
3-308
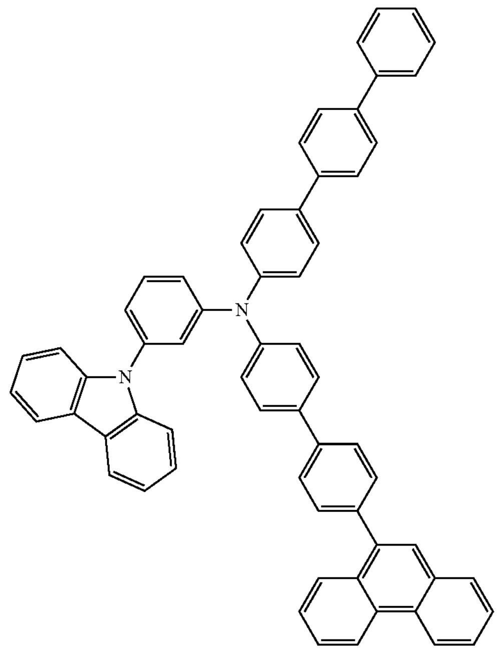
3-309
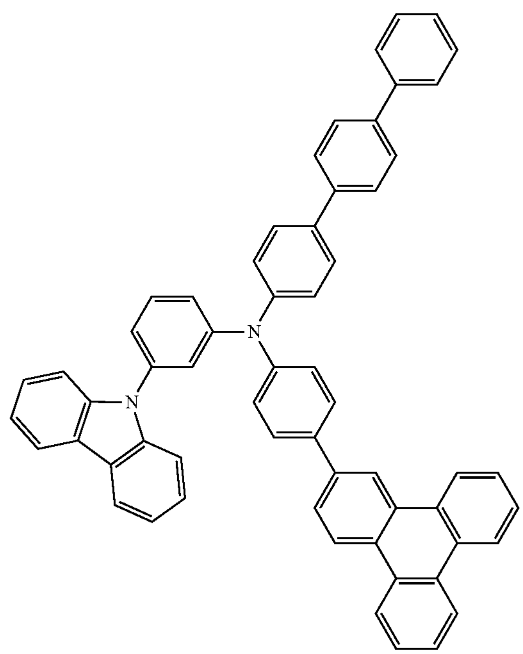

-continued
3-310
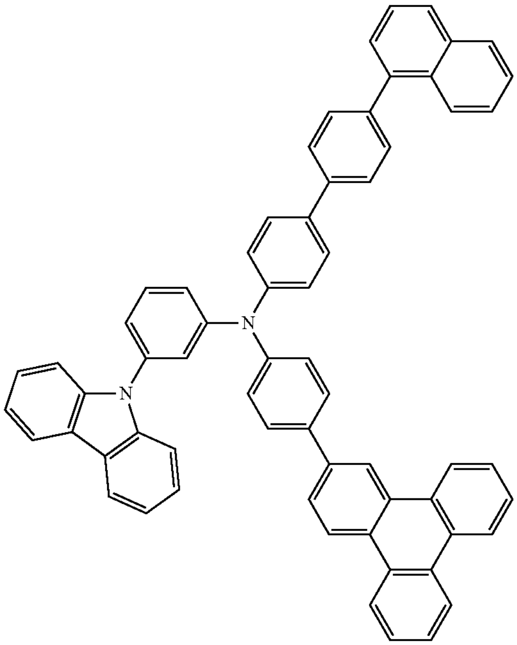
3-311
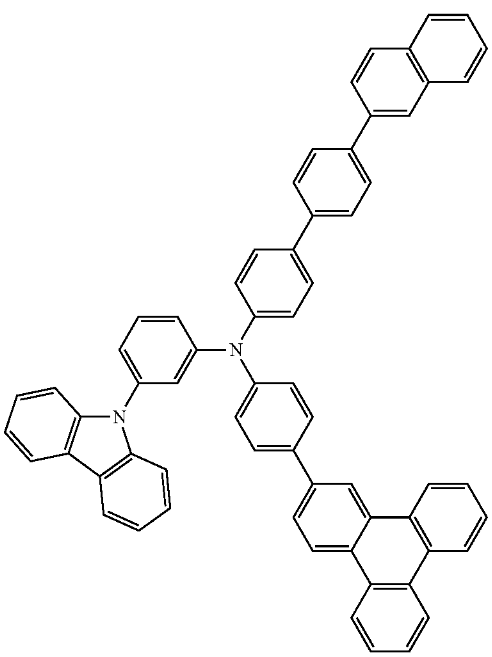
-continued
3-312
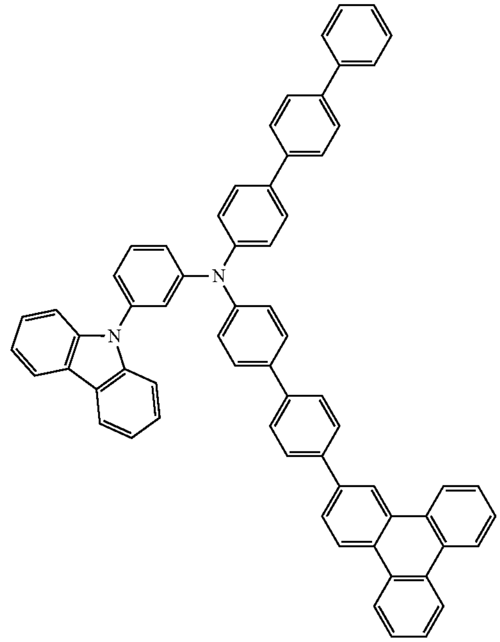
3-313
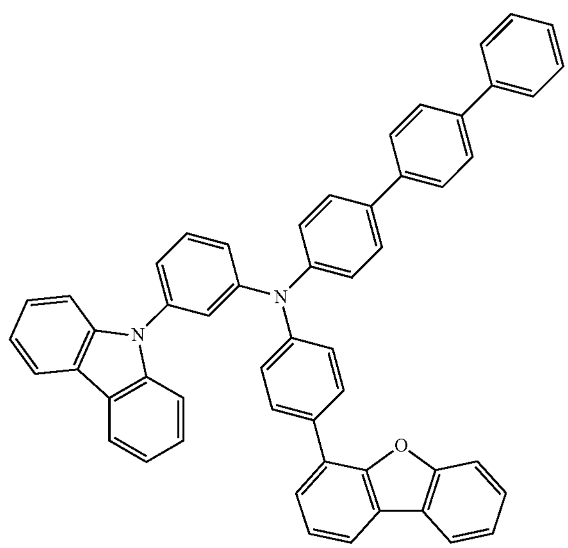

-continued
3-314
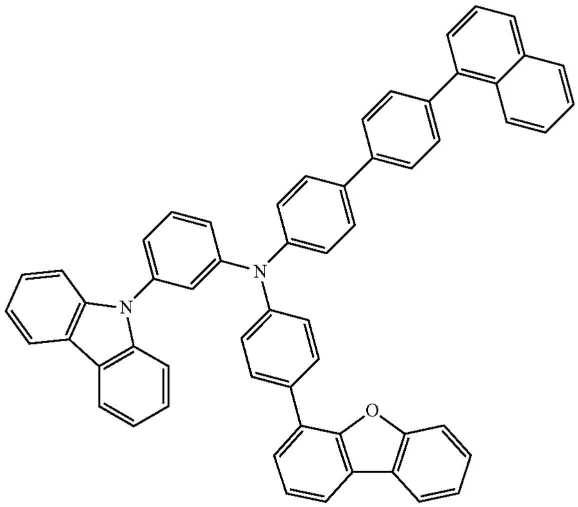
3-315
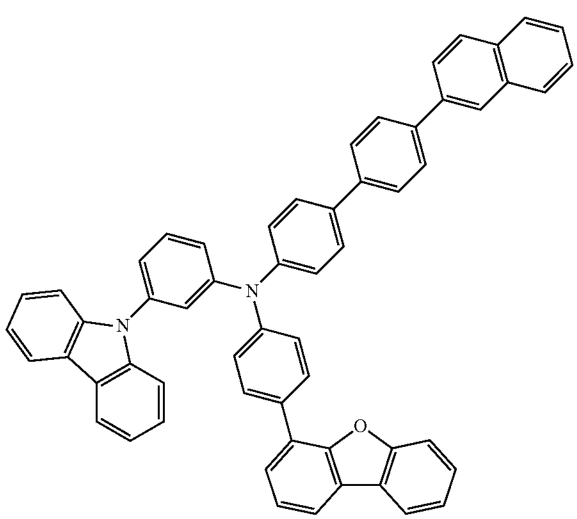
-continued
3-316
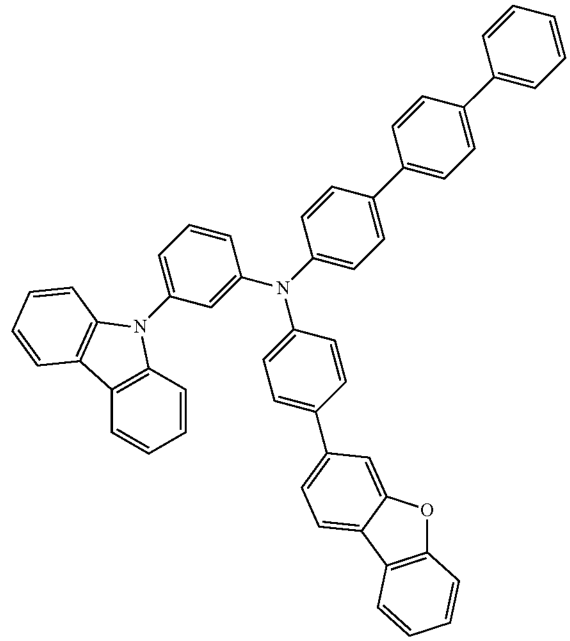
3-317
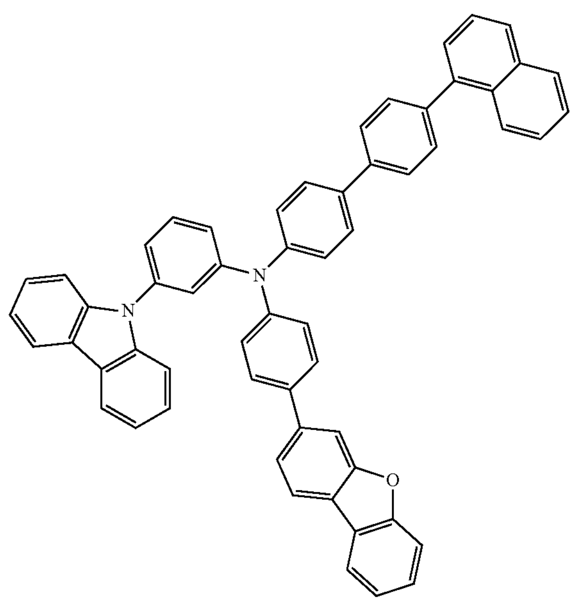

-continued
3-318
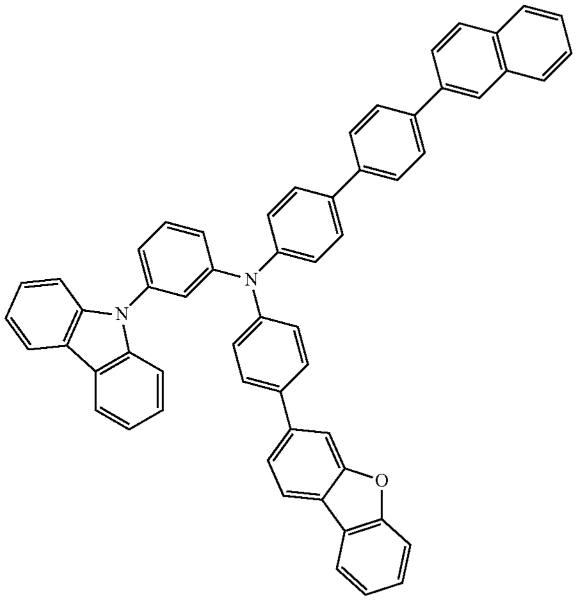
3-319
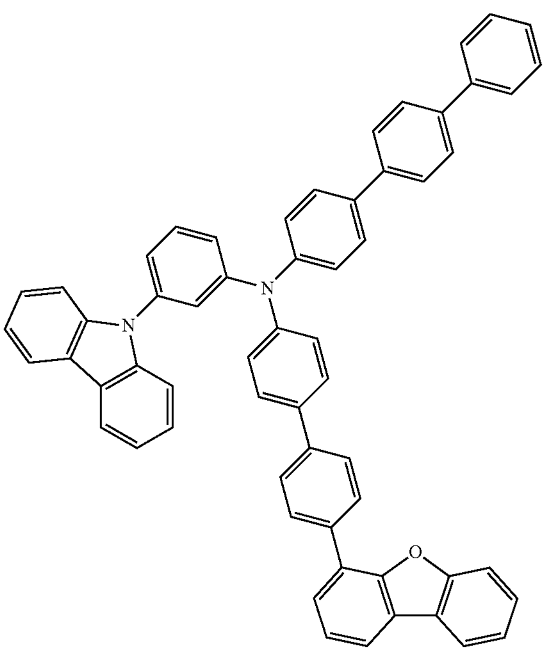
-continued
3-320
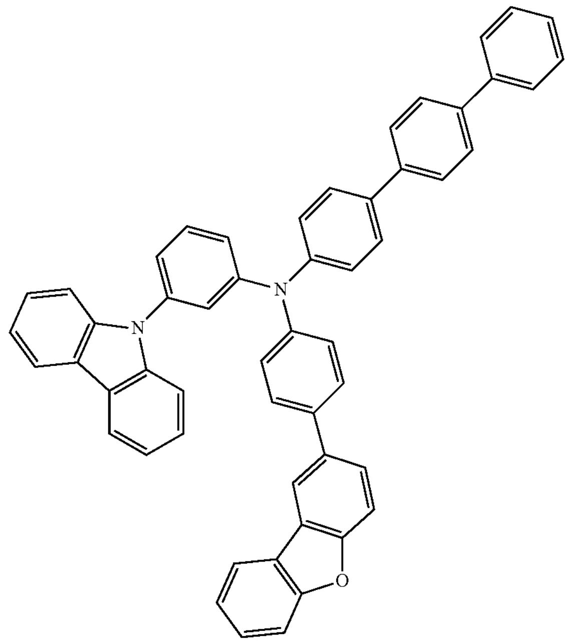
3-321
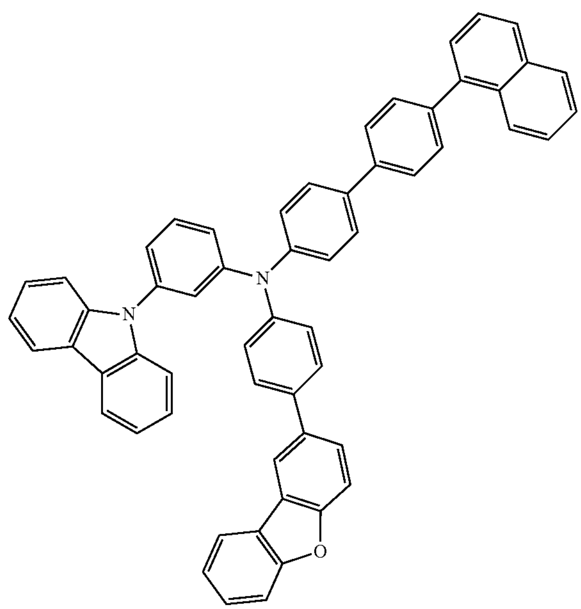

-continued
3-322
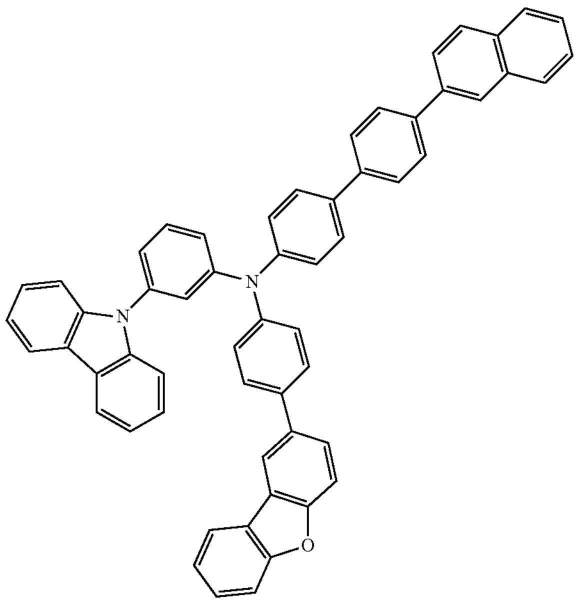
3-323
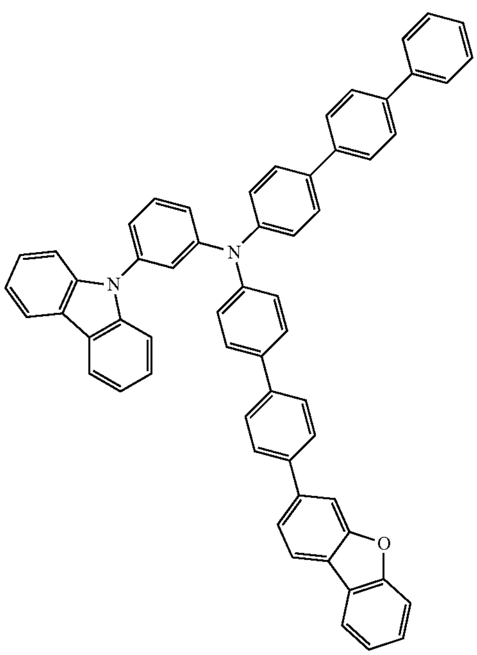
-continued
3-324
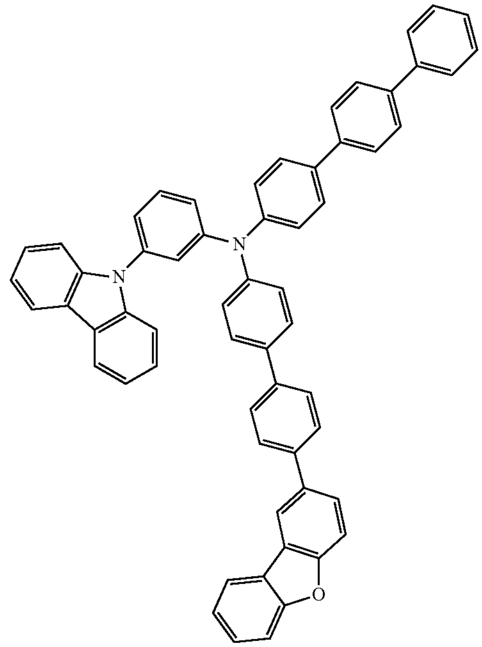
3-325
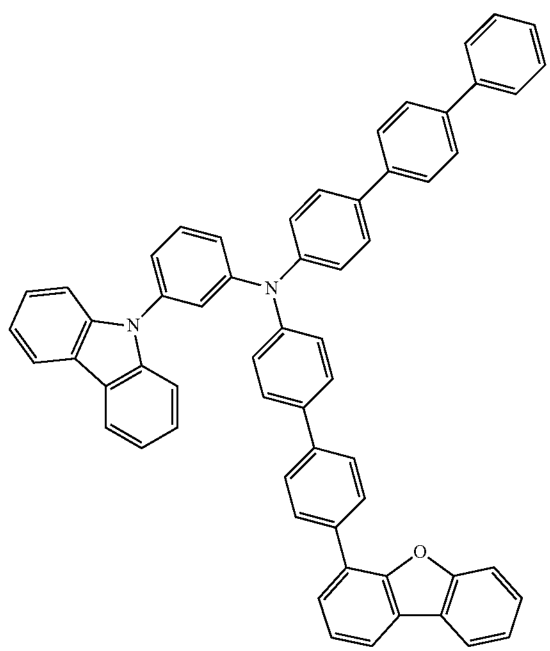

3-326
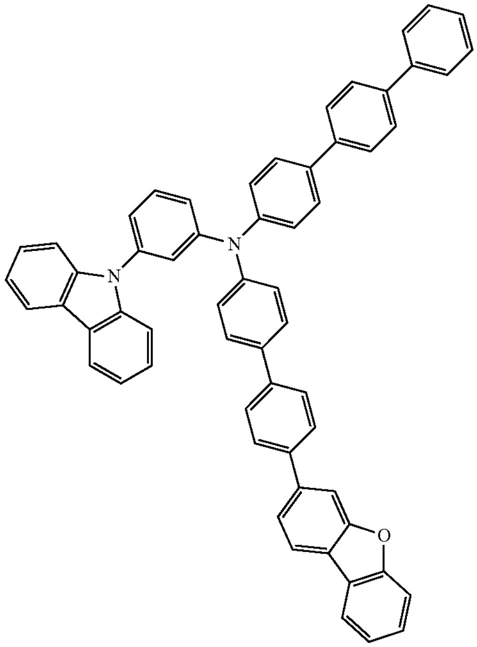
3-327
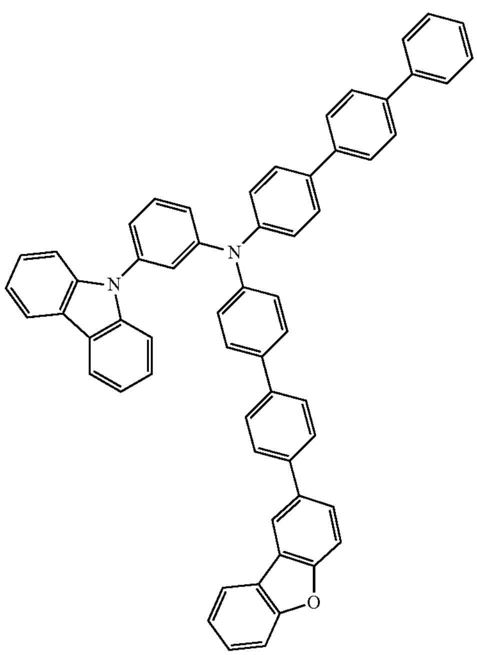
3-328
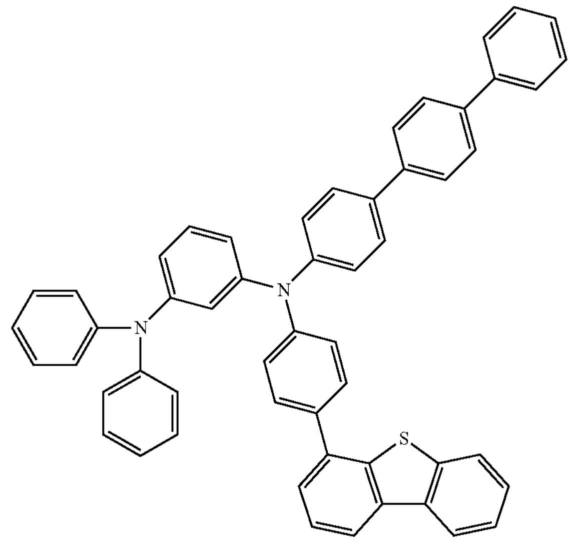
3-329
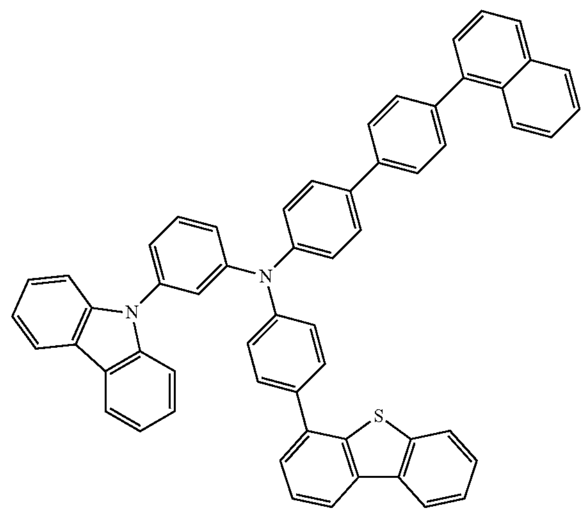
3-330
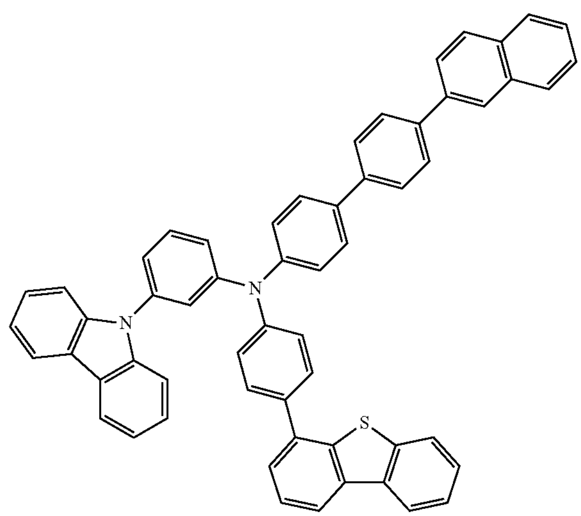

-continued
3-331
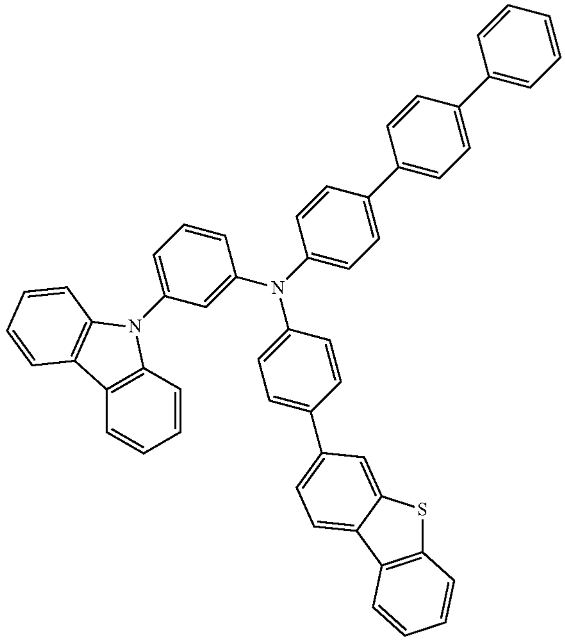
3-332
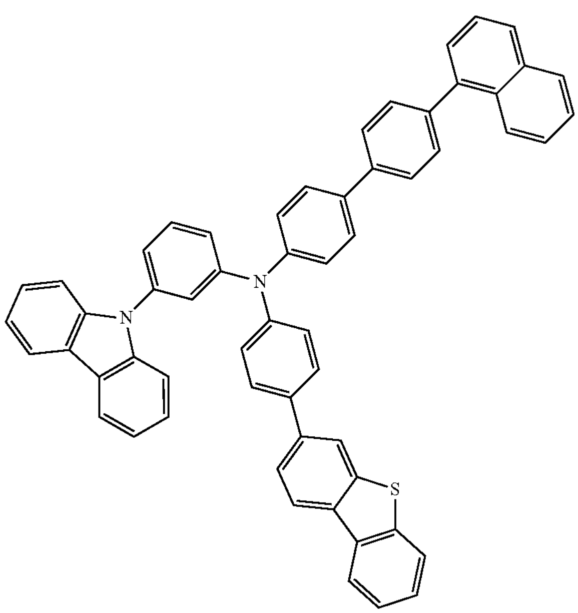
-continued
3-333
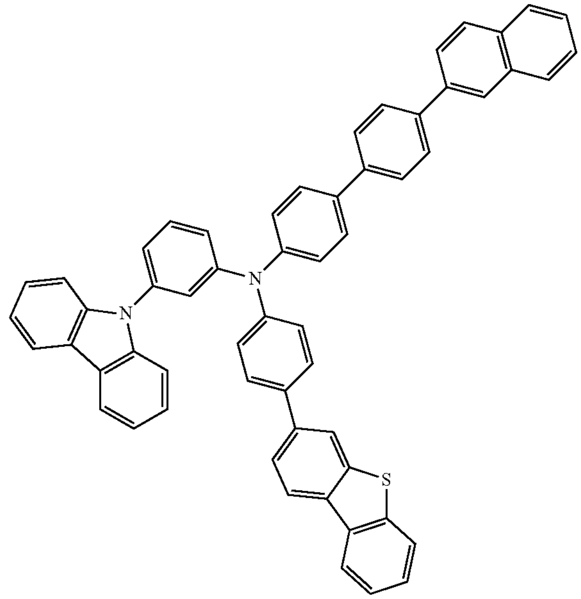
3-334
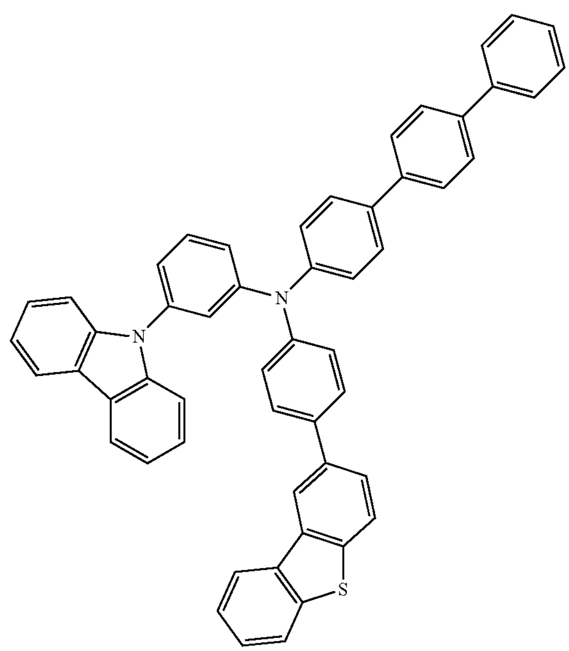

-continued
3-335
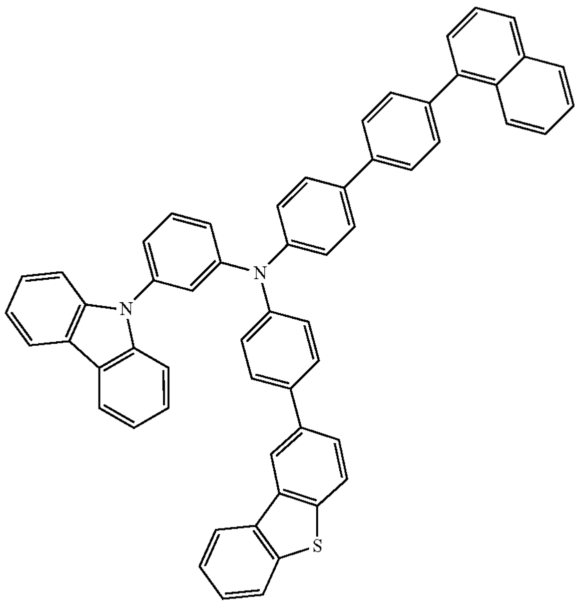
3-336
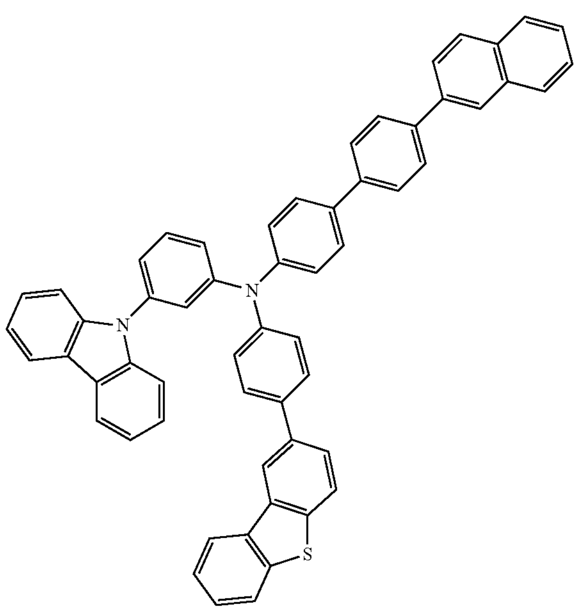
-continued
3-337
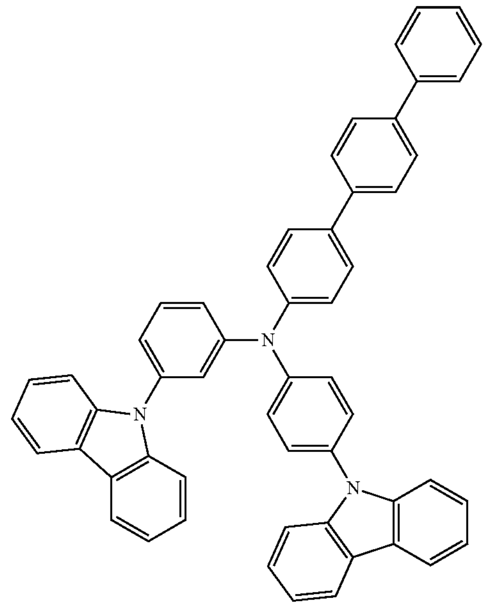
3-338
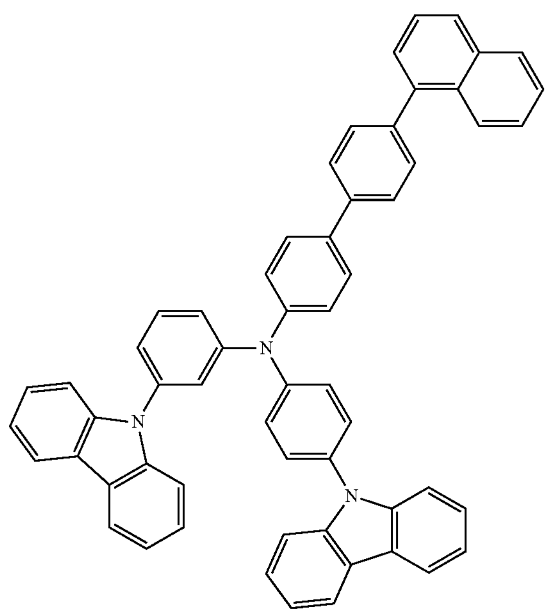

-continued
3-339
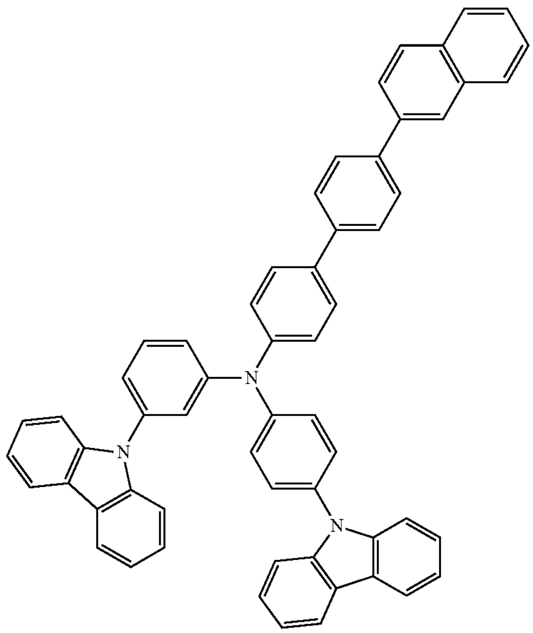
3-340
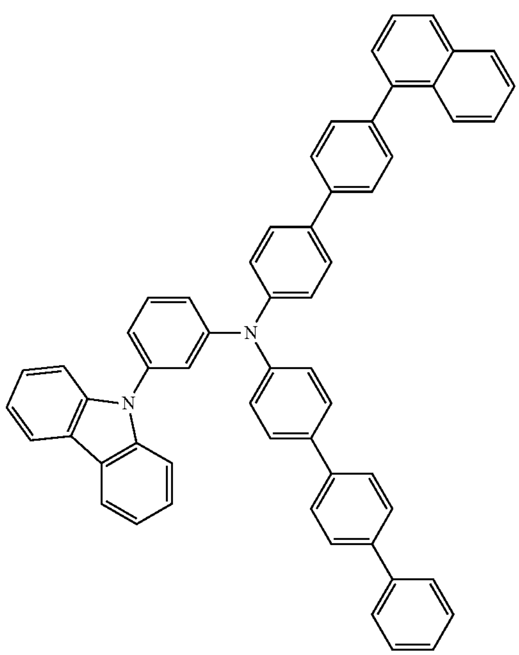
-continued
3-341
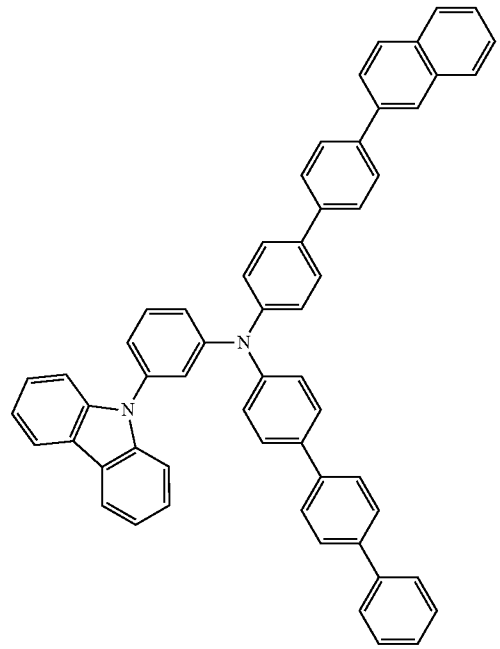
3-342
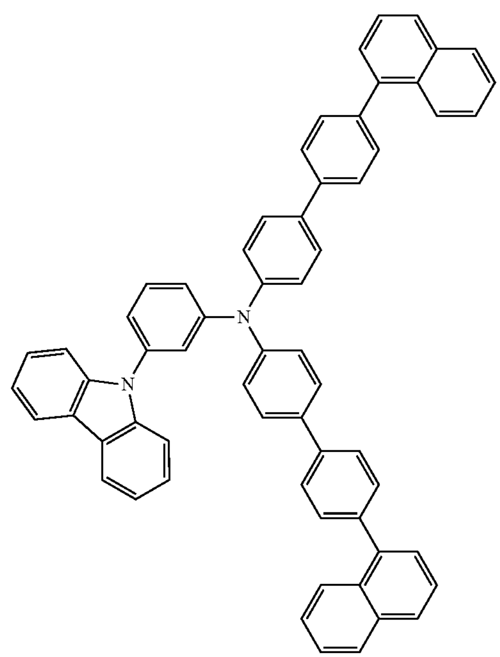

-continued
3-343
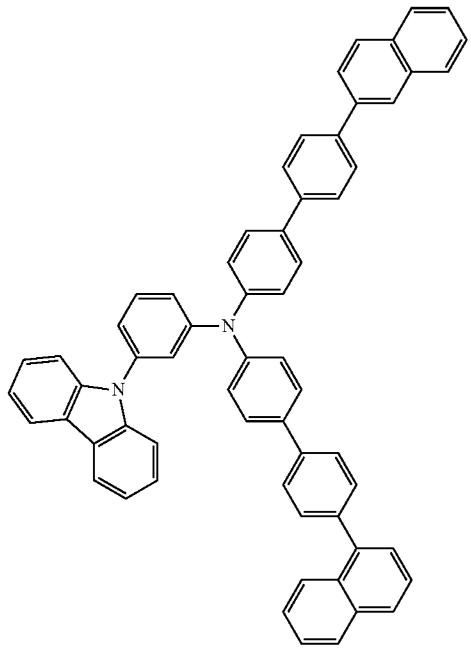
3-344
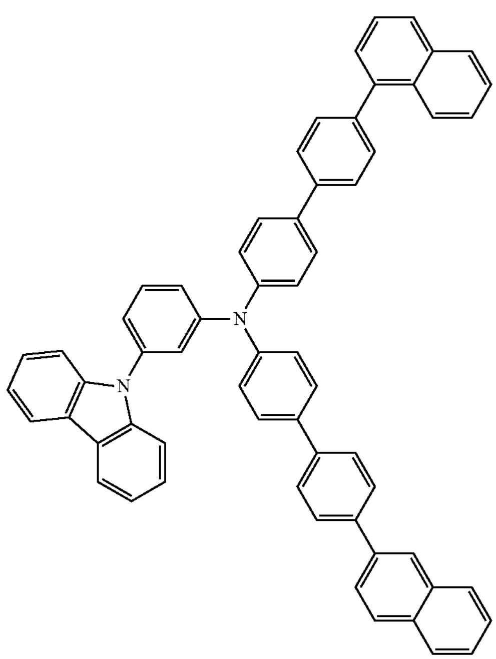
-continued
3-345
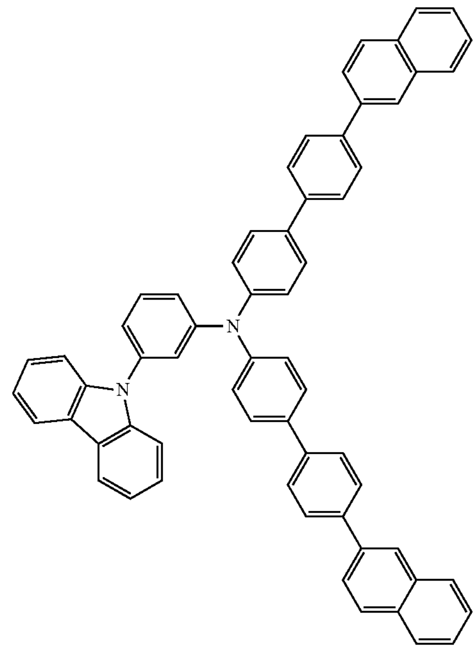
3-346
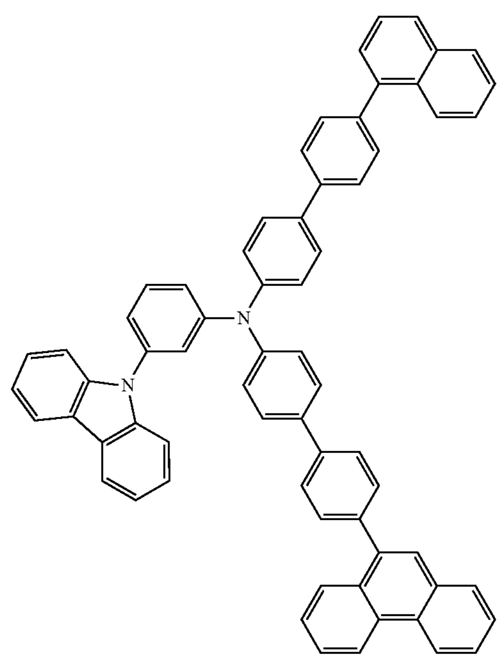

-continued
3-347
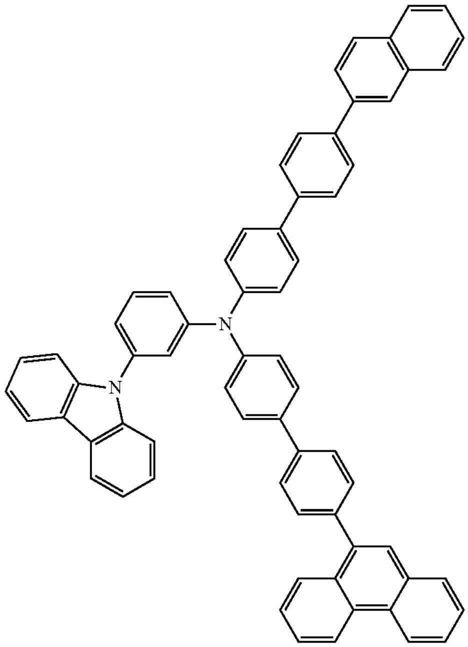
3-348
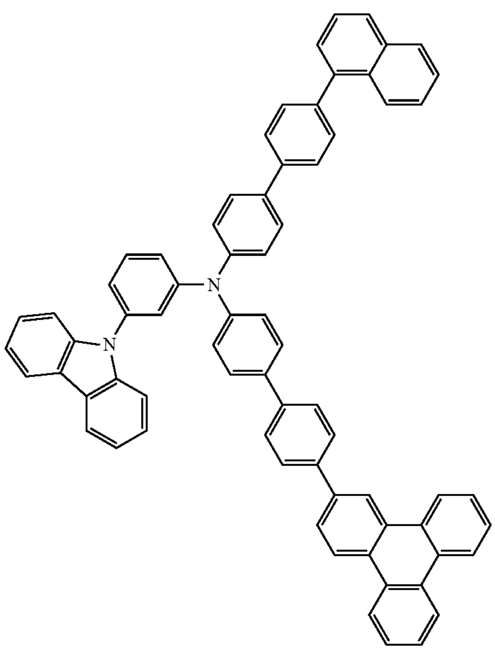
-continued
3-349
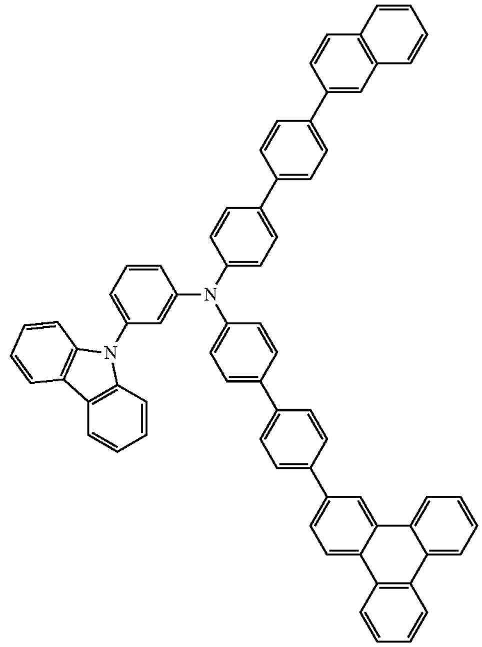
3-350
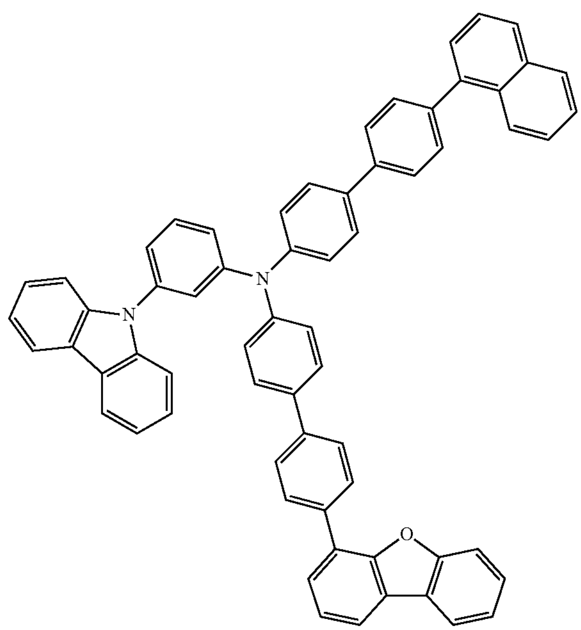

-continued
3-351
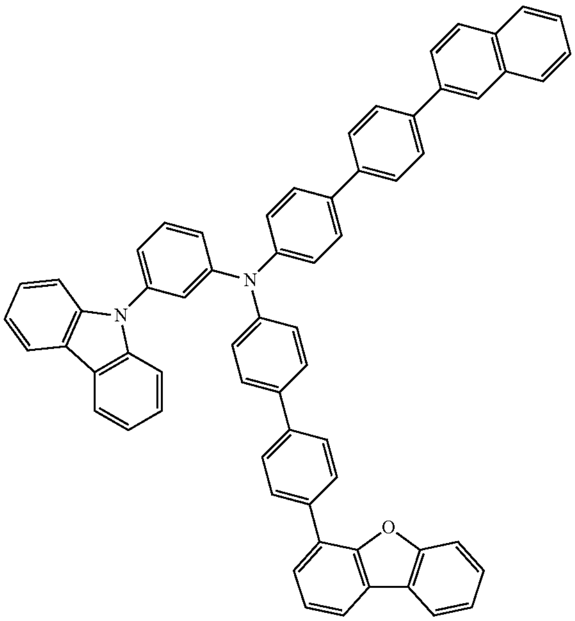
3-352
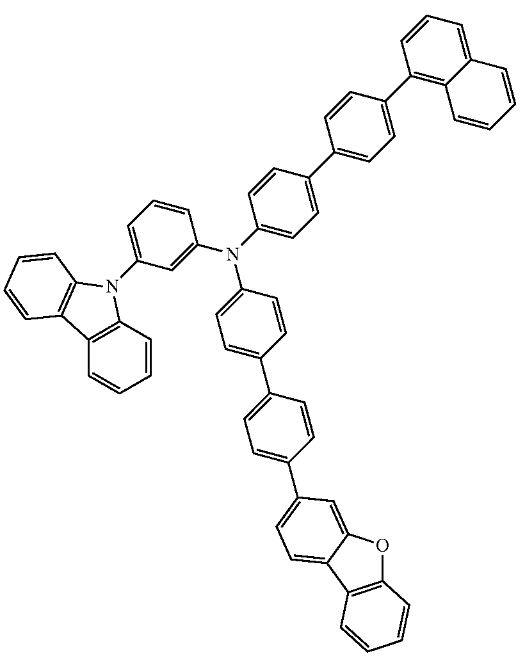
-continued
3-353
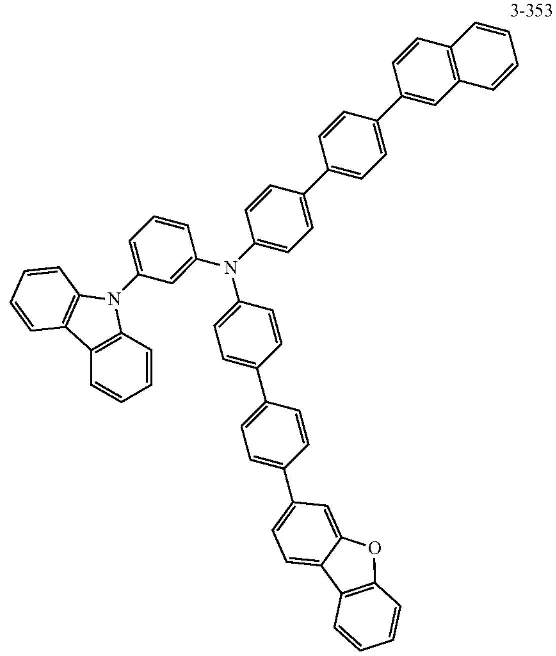
3-354
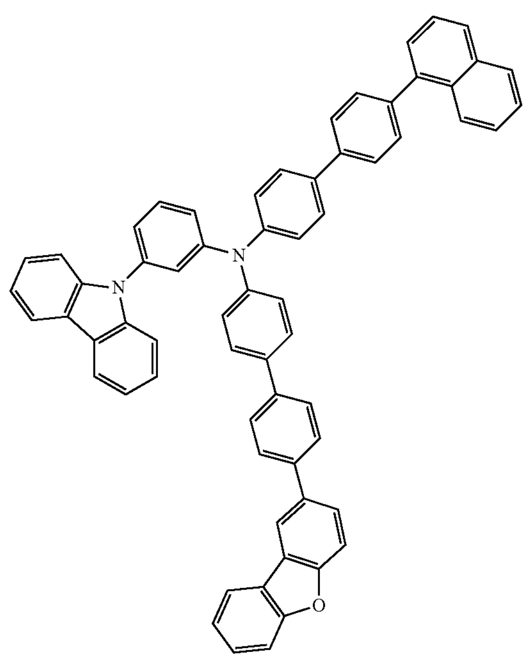

-continued
3-355
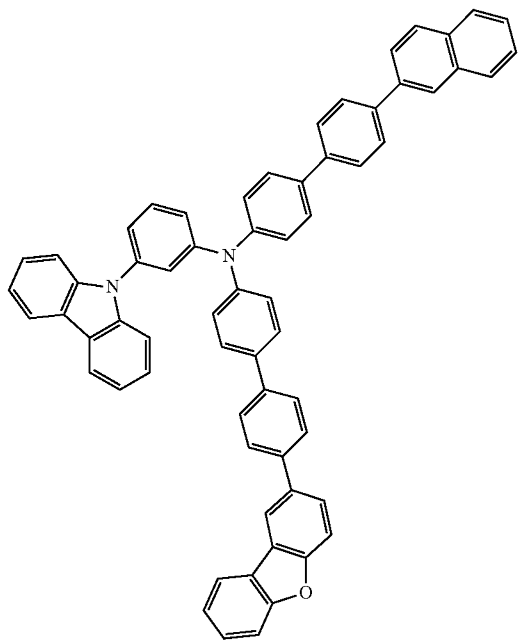
-continued
3-357
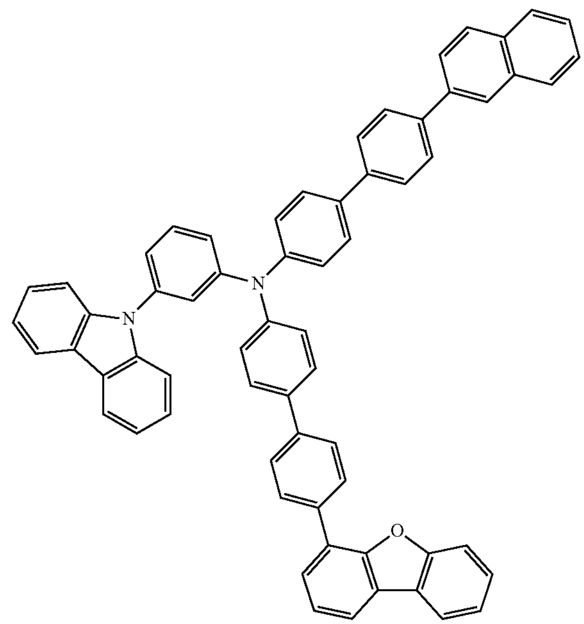
3-356
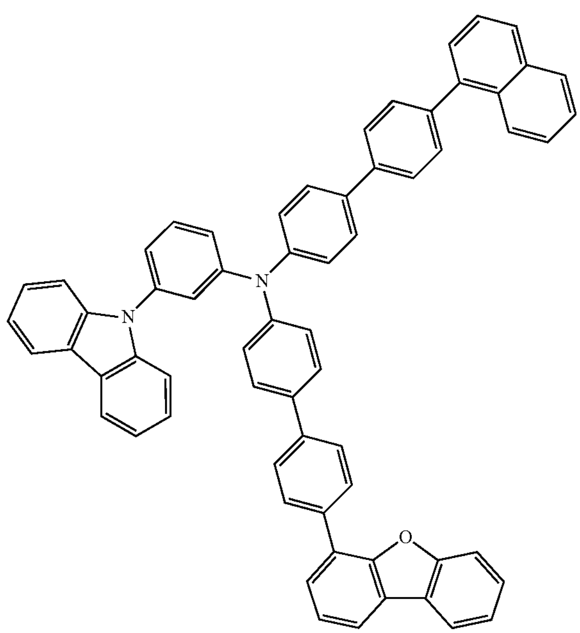
3-358
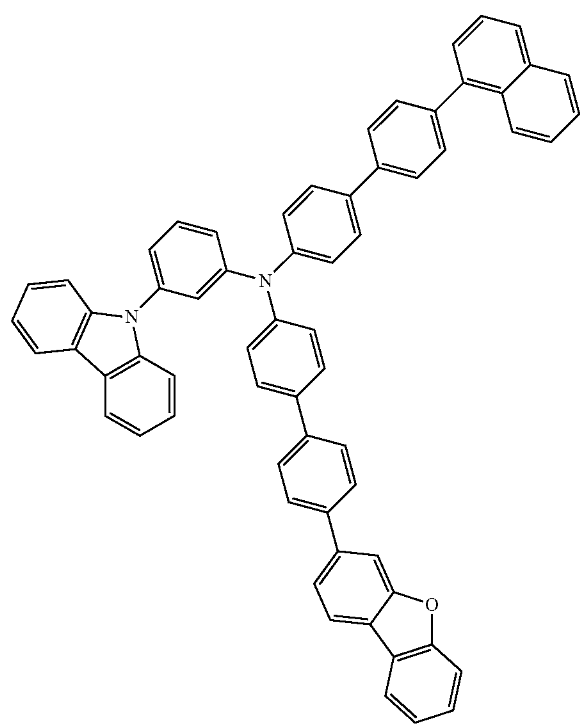

-continued
3-359
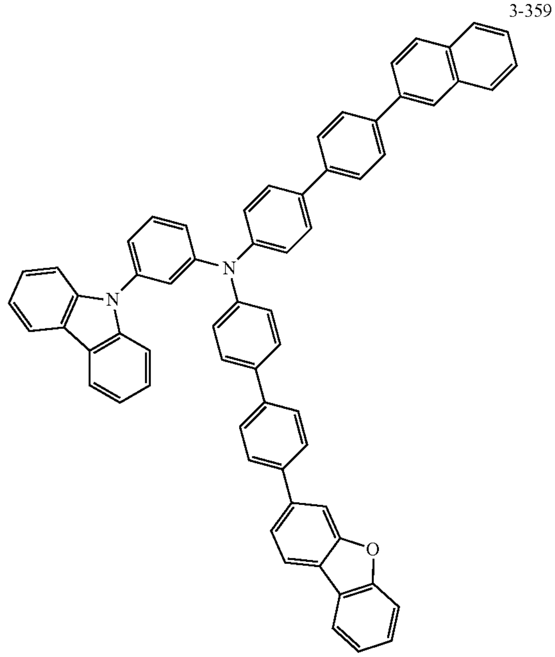
3-360
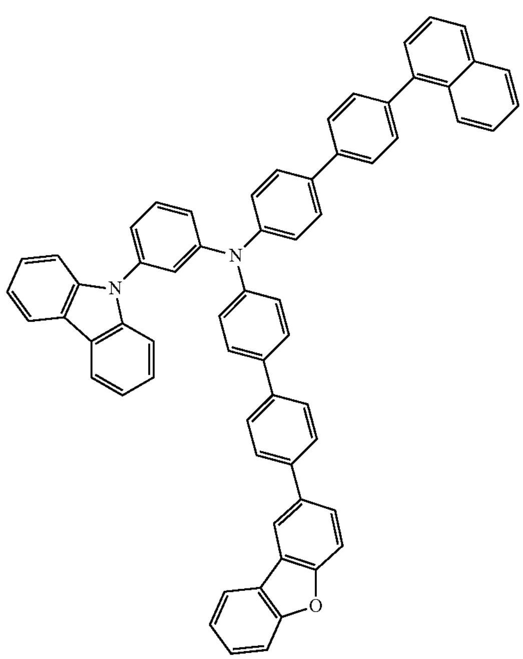
-continued
3-361
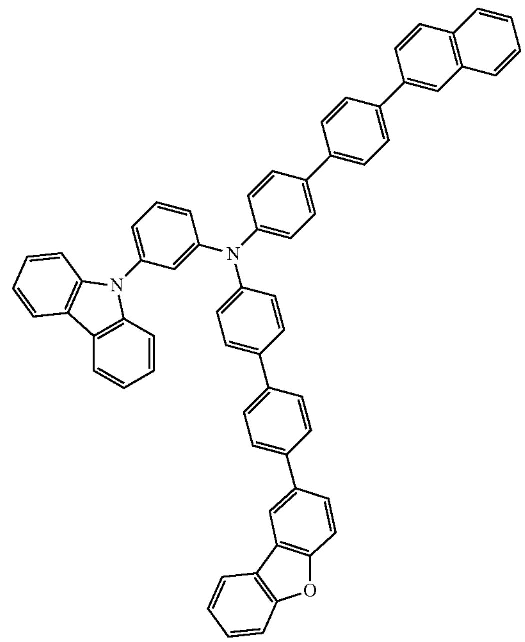
3-362
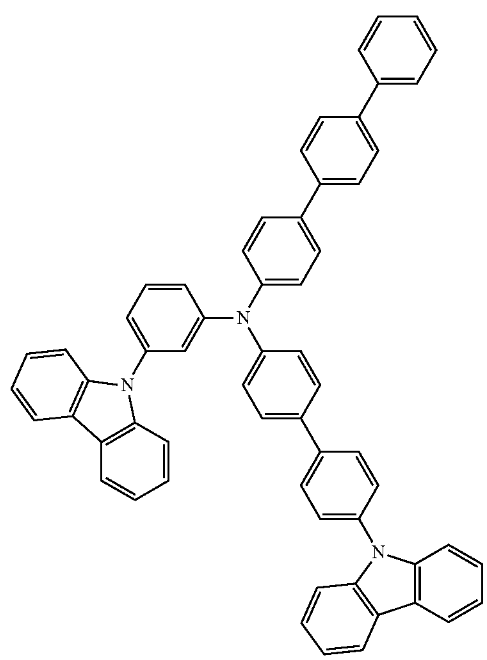

-continued
3-363
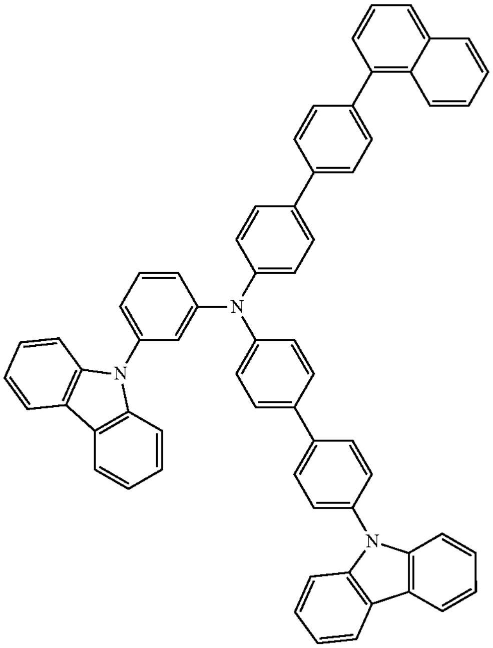
3-364
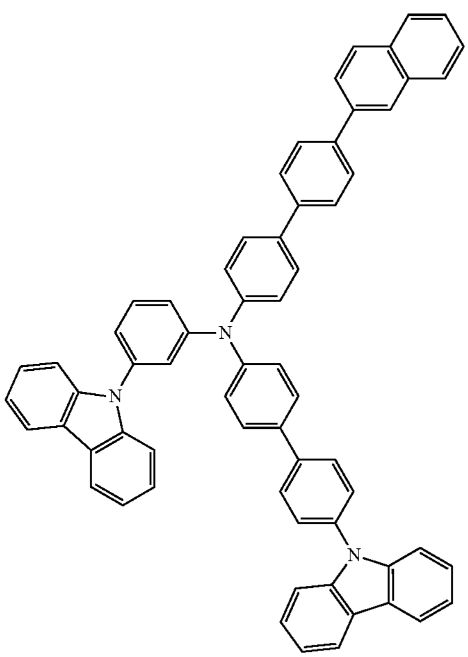
-continued
3-365
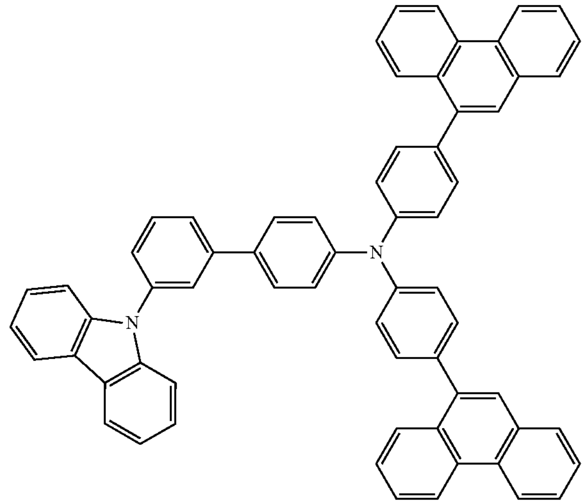
3-366
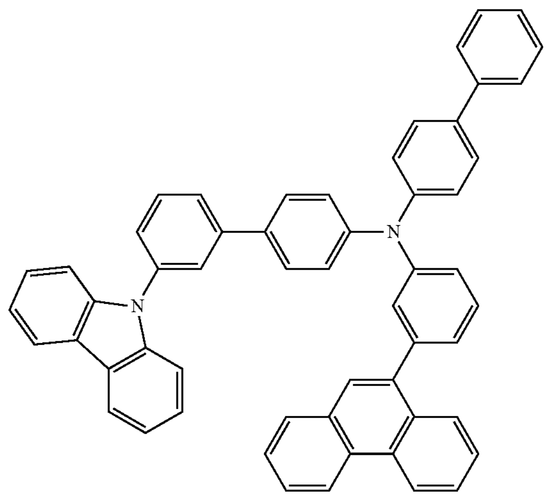
3-367
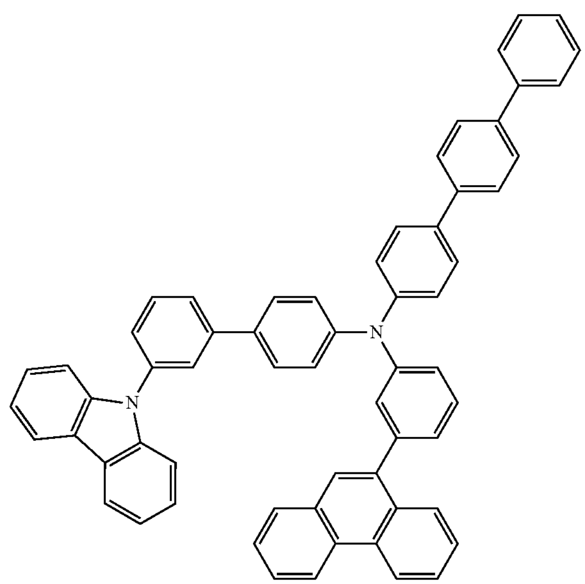

3-368
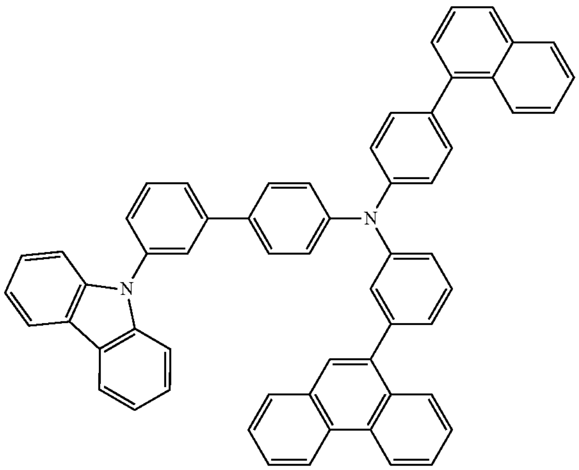
3-369
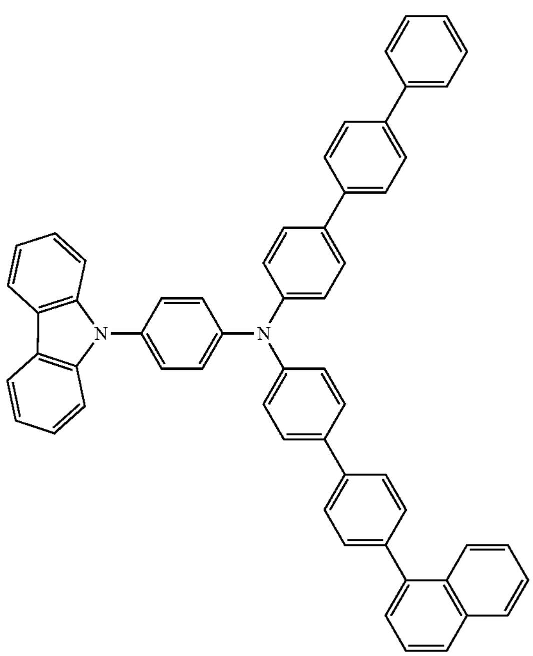
3-370
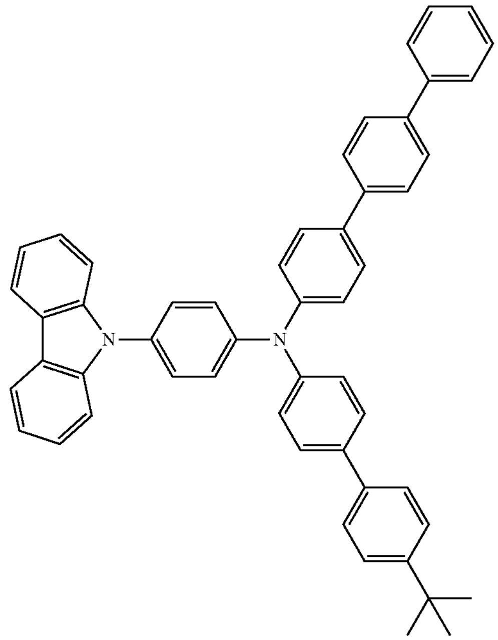
3-371
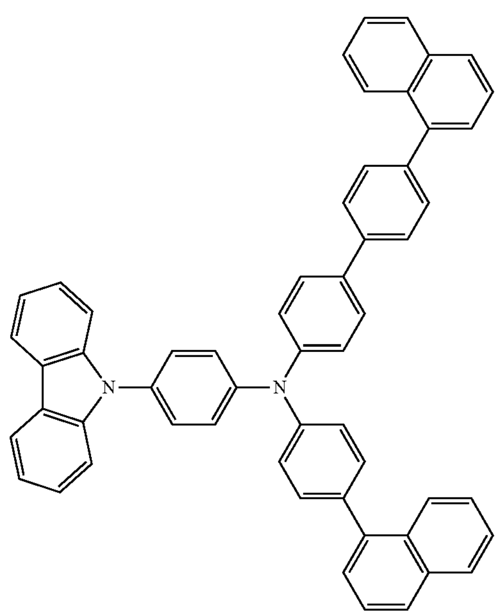

-continued
3-372
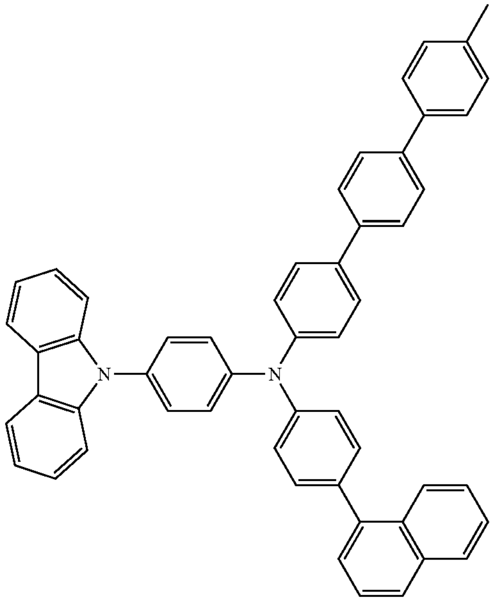
3-373
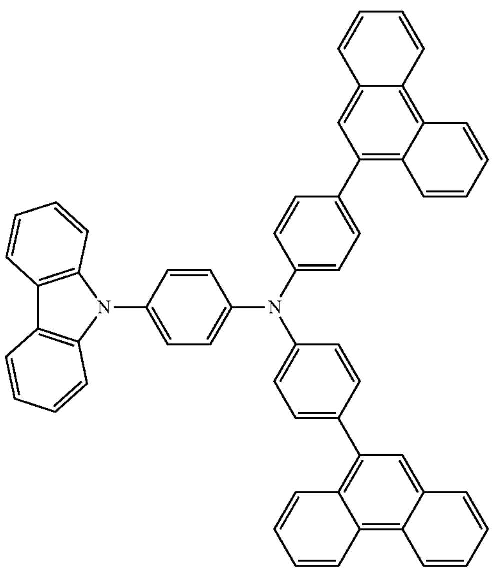
3-374
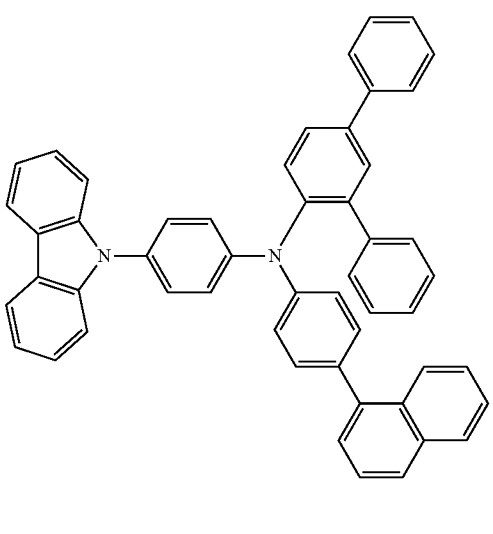
-continued
3-375
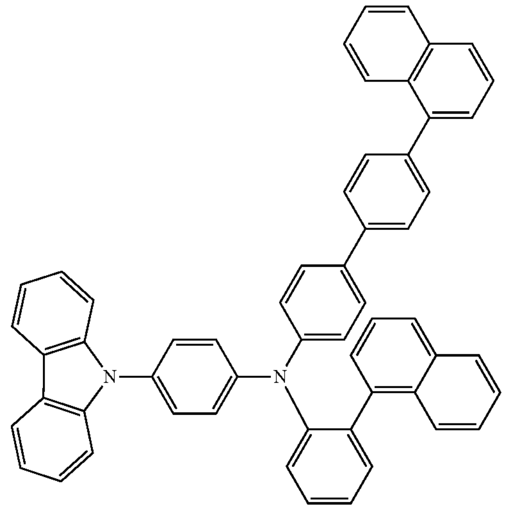
3-376
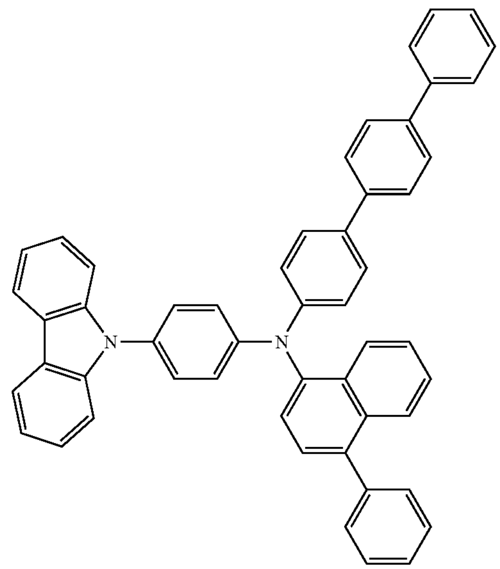
3-377
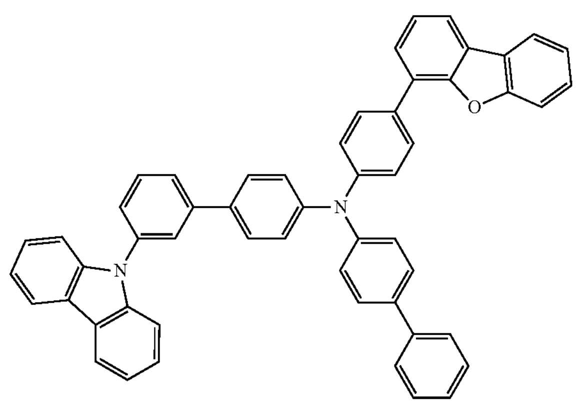
As described above, the organic electroluminescent device may include the first organic layer containing a compound represented by Chemical Formula 2 and the second organic layer containing a compound represented by Chemical Formula 3.

Specifically, each of the first organic layer containing a compound represented by Chemical Formula 2 and the second organic layer containing a compound represented by Chemical Formula 3 may be a hole transport layer or a hole transport auxiliary layer, respectively. In one embodiment, the at least one organic layer may include a hole transport layer or a hole transport auxiliary layer. The hole transport layer or the hole transport auxiliary layer may contain a compound represented by Chemical Formula 2 or a compound represented by Chemical Formula 3.

The at least one organic layer may further include at least one organic layer selected from the group consisting of a hole injection layer, an electron transport auxiliary layer, an electron transport layer, and an electron injection layer, in addition to the organic layer containing a compound represented by Chemical Formula 2 or a compound represented by Chemical Formula 3.

In accordance with embodiments of the present disclosure, the hole transport auxiliary layer may be embodied as a single layer or a stack of a plurality of layers.

In one embodiment, the organic electroluminescent device may include a hole transport layer containing a compound represented by Chemical Formula 2, and a hole transport auxiliary layer containing a compound represented by Chemical Formula 3.

FIG. 1 illustrates an organic electroluminescent device 10 according to one embodiment of the present disclosure. In FIG. 1, the organic electroluminescent device 10 may sequentially include an anode 1, a hole injection layer 2, a hole transport layer 3, a hole transport auxiliary layer 7, a light emitting layer 4, an electron transport layer 5, and a cathode 6.

The anode 1 provides holes into the light emitting layer 4. The anode may include a conductive material having a high work function to easily provide holes. When the organic electroluminescent device is applied to as a bottom emission type organic light emitting display, the anode may be embodied as a transparent electrode made of a transparent conductive material. When the organic electroluminescent device is applied to as a top emission type organic light emitting display, the anode may have a multilayer structure in which a transparent electrode layer made of a transparent conductive material and a reflective layer are stacked vertically.

The cathode 6 provides electrons into the light emitting layer 4. The cathode may include a conductive material having a low work function to easily provide electrons. When the organic electroluminescent device is applied to as a bottom emission type organic light emitting display, the cathode may be embodied as a reflective electrode made of a metal. When the organic electroluminescent device is applied to as a top emission type organic light emitting display, the cathode may be embodied as a transmissive electrode made of a thin metal.

The light emitting layer 4 may emit red (R), green (G), or blue (B) light, and may be made of a phosphor or a fluorescent material.

When the light emitting layer 4 emits red light, the light emitting layer 4 may contain a host material including CBP (carbazole biphenyl) or mCP (1,3-bis(carbazol-9-yl)). The light emitting layer 4 may contain a phosphor dopant including one selected from the group consisting of PIQIr (acac) (bis(1-phenylisoquinoline)acetylacetonate iridium), PQIr(acac) (bis(1-phenylquinoline)acetylacetonate iridium), PQIr (tris(1-phenylquinoline)iridium), PtOEP (octaethylporphyrin platinum), and combinations thereof. Alternatively, the light emitting layer 4 may contain a fluorescent material including PBD:Eu(DBM)3(Phen) or perylene. However, the present disclosure is not limited thereto.

When the light emitting layer 4 emits green light, the light emitting layer 4 may contain a host material including CBP or mCP. The light emitting layer 4 may contain a phosphor dopant including Ir(ppy)3 (fac tris (2-phenylpyridine) iridium). Alternatively, the light emitting layer 4 may contain a fluorescent material including Alq3 (tris (8-hydroxyquinolino) aluminum). However, the present disclosure is not limited thereto.

When the light emitting layer 4 emits blue light, the light emitting layer 4 may contain a host material including CBP or mCP, and may contain a phosphor dopant including (4,6-F2ppy)2Irpic. Alternatively, the light emitting layer 4 may contain a fluorescent material including one selected from the group consisting of spiro-DPVBi, spiro-6P, distilbenzene (DSB), distriarylene (DSA), PFO-based polymer and PPV-based polymer, and combinations thereof. However, the present disclosure is not limited thereto.

The hole injection layer 2 may serve to facilitate the injection of holes.

The hole injection material may include one or more selected from the group consisting of, for example, cupper phthalocyanine (CuPc), poly(3,4)-ethylenedioxythiophene (PEDOT), polyaniline (PANI), N,N-dinaphthyl-N,N'-diphenyl benzidine (NPD), and combinations thereof. However, the present disclosure is not limited thereto.

The hole transport layer 3 may contain a material electrochemically stabilized via cationization (i.e., loss of electrons) as a hole transport material. Alternatively, a material that produces a stable radical cation may be a hole transport material. The hole transport layer 3 may contain a compound represented by Chemical Formula 2. Detailed descriptions of the compound represented by Chemical Formula 2 are described above.

The hole transport layer 3 may further contain an additional hole transport material in addition to the compound represented by Chemical Formula 2.

The additional hole transport material may be a material containing an aromatic amine and thus can be easily cationized. For example, the additional hole transport material may include one selected from the group consisting of NPD (N,N-dinaphthyl-N,N'-diphenylbenzidine), TPD (N,N'-bis-(3-methylphenyl)-N,N'-bis-(phenyl)-benzidine), spiro-TAD (2,2',7,7'-tetrakis(N,N-dimethylamino)-9,9-spirofluorene), MTDATA (4,4',4-Tris(N-3-methylphenyl-N-phenylamino)-triphenylamine), and combinations thereof. However, the present disclosure is not limited thereto.

The hole transport auxiliary layer 7 may contain a compound represented by Chemical Formula 3. Detailed descriptions of the compound represented by Chemical Formula 3 are described above.

The hole transport auxiliary layer 7 may further contain an additional hole transport auxiliary material other than the compound represented by Chemical Formula 3.

The additional hole transport auxiliary material may include one selected from the group consisting of TCTA (tris[4-(diethylamino)phenyl]amine), N-(biphenyl-4-yl)-9,9-dimethyl-N-(4-(9-phenyl-9H-carbazol-3-yl)phenyl)-9H-fluoren-2-amine, tri-p-tolylamine, TAPC (1,1-bis(4-(N,N'-di(ptolyl)amino)phenyl)cyclohexane), MTDATA, mCP, mCBP, CuPC, DNTPD (N,N'-bis[4-[bis(3-methylphenyl)amino]phenyl]-N,N'-diphenyl-[1,1'-biphenyl]-4,4'-diamine), TDAPB, and combinations thereof. However, the present disclosure is not limited thereto.

The electron transport auxiliary layer 8 may be located between the electron transport layer 5 and the light emitting layer 4. The electron transport auxiliary layer 8 may further contain an electron transport auxiliary material.

The electron transport auxiliary material may include one selected from the group consisting of, for example, oxadiazole, triazole, phenanthroline, benzoxazole, benzothiazole, benzimidazole, triazine, and combinations thereof. However, the present disclosure is not limited thereto.

The electron transport layer 5 receives electrons from the cathode 6. The electron transport layer 5 transfers the supplied electrons to the light emitting layer 4. The electron transport layer 5 serves to facilitate the transport of electrons, and the electron transport layer 5 may contain an electron transport material.

The electron transport material may be a material electrochemically stabilized via anionization (that is, via obtaining electrons). Alternatively, a material producing stable radical anions may be an electron transport material. Alternatively, a material including a heterocyclic ring and thus can be easily anionized using a hetero atom may be an electron transport material.

For example, the electron transport material may include one selected from the group consisting of PBD (2-(4-biphenylyl)-5-(4-tert-butylphenyl)-1,3,4oxadiazole), TAZ (3-(4-biphenyl)4-phenyl-5-tert-butylphenyl-1,2,4-triazole), spiro-PBD, TPBi (2,2',2-(1,3,5-benzinetriyl)-tris(1-phenyl-1-H-benzimidazole), oxadiazole, triazole, phenanthroline, benzoxazole, benzthiazole, and combinations thereof. However, the present disclosure is not limited thereto.

For example, the electron transport material may be an organometallic compound. Specifically, the electron transport material may include an organoaluminum compound or organolithium compound such as Alq3 (tris(8-hydroxyquinolino)aluminum), Liq (8-hydroxyquinolinolatolithium), BAlq (bis(2-methyl-8-quinolinolate)-4-(phenylphenolato) aluminium), and SAlq. However, the present disclosure is not limited thereto.

Specifically, the organometallic compound may be an organolithium compound.

More specifically, a ligand bound to lithium of the organolithium compound may be a hydroxyquinoline based ligand.

The organic layer may further include an electron injection layer.

The electron injection layer serves to facilitate the injection of electrons. The electron injection material may include one selected from the group consisting of Alq3 (tris(8-hydroxyquinolino)aluminum), PBD, TAZ, spiro-PBD, BAlq, SAlq, and combinations thereof. However, the present disclosure is not limited thereto. Alternatively, the electron injection layer may be made of a metal compound. The metal compound may include, for example, at least one selected from the group consisting of LiQ, LiF, NaF, KF, RbF, CsF, FrF, $BeF_2$, $MgF_2$, $CaF_2$, $SrF_2$, $BaF_2$ and $RaF_2$. However, the present disclosure is not limited thereto.

The organic layer may further include one selected from the group consisting of a hole injection layer, a hole transport layer, a hole transport auxiliary layer, an electron transport auxiliary layer, an electron injection layer, and combinations thereof in addition to the electron transport layer. Each of the hole injection layer, the hole transport layer, the hole transport auxiliary layer, the electron transport auxiliary layer, the electron transport layer and the electron injection layer may be formed of a single layer or a stack of a plurality of layers.

An organic electroluminescent device according to the present disclosure may be applied to as an organic light emitting display such as a mobile device and TV. For example, FIG. 2 is a schematic cross-sectional view of an organic light emitting display 3000 according to an exemplary embodiment of the present disclosure.

Figure 2:
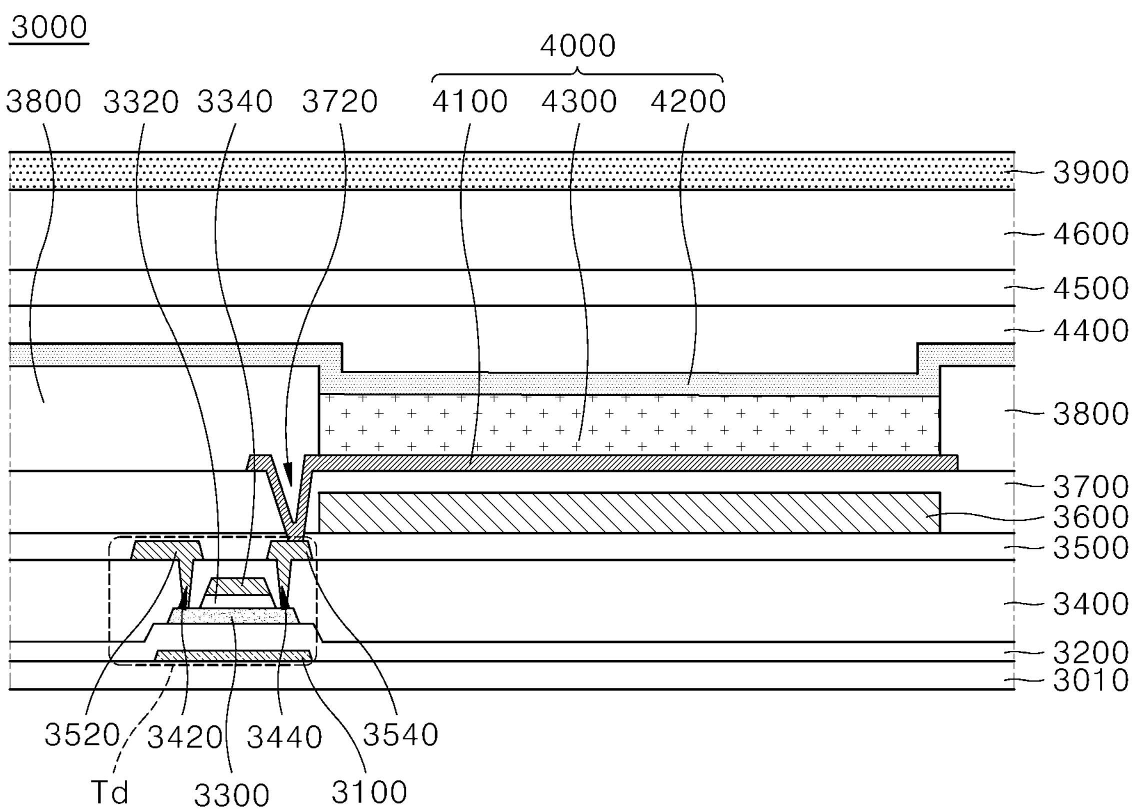
FIG. 2 is a schematic cross-sectional view of an organic light emitting display device including an organic electroluminescent device according to one embodiment of the present disclosure.

As shown in FIG. 2, the organic light emitting display 3000 may include a substrate 3010, an organic electroluminescent device 4000, and an encapsulation film 3900 covering the organic electroluminescent device 4000. A driving thin film transistor Td as a driving element, and the organic electroluminescent device 4000 connected to the driving thin film transistor Td are positioned on the substrate 3010.

Although not shown, following components are disposed on the substrate 3010: a gate line, and a data line crossing each other to define a pixel region, a power line extending in parallel with and spaced from one of the gate line and the data line, a switching thin film transistor connected to the power line and the gate line, and a storage capacitor connected to one electrode of the switching thin film transistor and the power line.

The driving thin film transistor Td is connected to the switching thin film transistor, and includes a semiconductor layer 3100, a gate electrode 3340, a source electrode 3520, and a drain electrode 3540.

The semiconductor layer 3100 is formed on the substrate 3010 and may be made of an oxide semiconductor material, polycrystalline silicon, an alloy of molybdenum titanium (MoTi), or the like. When the semiconductor layer 3100 is made of an oxide semiconductor material, a light blocking pattern (not shown) may be formed below the semiconductor layer 3100. The light blocking pattern prevents light from entering the semiconductor layer 3100 to prevent the semiconductor layer 3100 from being degraded by light. Alternatively, the semiconductor layer 3100 may be made of polycrystalline silicon. In this case, impurities may be doped into both edges of the semiconductor layer 3100.

A buffer layer 3200 made of an insulating material is formed on the semiconductor layer 3100 over an entire face of the substrate 3010. The buffer layer 3200 may be made of an inorganic insulating material such as silicon oxide or silicon nitride.

The active layer 3300 made of a conductive material such as a metal is formed on the buffer layer 3200 in a position corresponding to a center region of the semiconductor layer 3100. The active layer 3300 may be made of an oxide semiconductor material. For example, the active layer 3300 may be made of an amorphous semiconductor of indium, gallium and zinc oxide (IGBO).

The gate electrode 3340 is formed on the active layer 3300 while a gate insulating layer 3320 is interposed therebetween. The gate insulating layer 3320 may be made of, for example, silicon oxide. The gate electrode 3340 formed of, for example, a double metal layer of a Cu film and a MoTi alloy film may be formed on the gate insulating layer 3320.

An interlayer insulating layer 3400 made of an insulating material is formed on the active layer 3300 and the gate electrode 3340 as positioned on the buffer layer 3200 over the entire face of the substrate 3010. The interlayer insulating layer 3400 may be made of an inorganic insulating material such as silicon oxide or silicon nitride, or may be made of an organic insulating material such as benzocyclobutene or photo-acryl.

The interlayer insulating layer 3400 has first and second active layer contact holes 3420 and 3440 defined therein exposing both sides of the active layer 3300 respectively. The first and second active layer contact holes 3420 and 3440 are positioned adjacent to respective sides of the gate electrode 3340 and are spaced apart from the gate electrode 3340.

The source electrode 3520 and the drain electrode 3540 made of a conductive material such as metal are formed on the interlayer insulating layer 3400. The source electrode 3520 and the drain electrode 3540 are spaced apart from each other while the gate electrode 3340 is positioned therebetween. The source electrode 3520 and the drain electrode 3540 contact respective sides of the active layer 3300 via the first and second active layer contact holes 3420 and 3440, respectively. The source electrode 3520 is connected to the power line (not shown).

The semiconductor layer 3100, the active layer 3300, the gate electrode 3340, the source electrode 3520, and the drain electrode 3540 may form the driving thin film transistor Td. The driving thin film transistor Td may have a coplanar structure in which the gate electrode 3340, the source electrode 3520, and the drain electrode 3540 positioned above the semiconductor layer 3100 are coplanar with each other.

Alternatively, the driving thin film transistor Td may have an inverted staggered structure in which the gate electrode is disposed under the semiconductor layer, while the source electrode and the drain electrode are positioned above the semiconductor layer. In this case, the semiconductor layer may be made of amorphous silicon. The switching thin film transistor (not shown) may have a structure substantially the same as that of the driving thin film transistor Td.

An insulating film 3500 having a drain contact hole 3720 defined therein exposing the drain electrode 3540 of the driving thin film transistor Td may be formed to cover the driving thin film transistor Td. The insulating film 3500 may be made of an inorganic insulating material or an organic insulating material.

In some embodiments, the organic light emitting display 3000 may include a color filter 3600 that absorbs light generated from the organic electroluminescent device 4000. For example, the color filter 3600 may absorb red (R), green (G), blue (B), and white (W) light. In this case, red, green, and blue color filter patterns for absorbing light may be formed separately on corresponding pixel areas, respectively. A corresponding color filter pattern may overlap an organic layer 4300 of the organic electroluminescent device 4000 that emits light of a corresponding wavelength band to be absorbed. Adopting the color filter 3600 may allow the organic light emitting display 3000 to implement full color.

For example, when the organic light emitting display 3000 is of a bottom emission type, the color filter 3600 may be disposed above the insulating film 3500 in a corresponding position to the corresponding organic electroluminescent device 4000. In an alternative embodiment, when the organic light emitting display device 3000 is of the top emission type, the color filter 3600 may be positioned above the corresponding organic electroluminescent device 4000, that is, above the second electrode 4200. In some embodiments, the color filter 3600 may be formed to a thickness of about 2 m to about 5 m. In this case, the organic electroluminescent device 4000 may have the structure shown in FIG. 1.

An overcoat layer 3700 is formed to cover the color filter 3600 formed on the insulating film 3500. The overcoat layer 3700 may be made of an organic material such as photoacryl (PAC).

The first electrode 4100 is formed on the overcoat layer 3700. The first electrode 4100 is patterned with a bank layer 3800 to correspond to each pixel region. The first electrode 4100 is connected to the drain electrode 3540 of the driving thin film transistor Td via the drain contact hole 3720 extending through the insulating film 3500 and the overcoat layer 3700. Accordingly, the active layer 3300 of the driving thin film transistor Td is electrically connected to the first electrode 4100.

The first electrode 4100 may be an anode and may be made of a conductive material having a relatively high work function value. For example, the first electrode 410 may be made of a transparent conductive material such as of ITO, IZO or ZnO.

In some embodiments, when the organic light emitting display 3000 is of a top emission type, a reflective electrode or a reflective layer may be further formed below the first electrode 4100. For example, the reflective electrode or the reflective layer may be made of one of aluminum (Al), silver (Ag), nickel (Ni), and aluminum-palladium-copper (APC) alloy.

The bank layer 3800 is formed on the overcoat layer 3700 to cover ends of the first electrode 4100 and the overcoat layer 3700. The bank layer 3800 exposes a central region of the first electrode 4100 corresponding to each pixel region.

The organic layer 4300 is formed on the first electrode 4100.

The second electrode 4200 is formed on the organic layer 4300. The second electrode 4200 may be disposed in the entirety of a display area. The second electrode 4200 may be used as a cathode and may be made of a conductive material having a relatively low work function value. For example, the second electrode 4200 may be made of one of aluminum (Al), magnesium (Mg), and aluminum-magnesium alloy (AlMg).

The first electrode 4100, the organic layer 4300, and the second electrode 4200 form the organic electroluminescent device 4000.

A first passivation layer 4400 and a second passivation layer 4500 are sequentially stacked on the second electrode 4200. As shown in FIG. 2, the first passivation layer 4400 may be formed on an entirety of the second electrode 4200. Then, the second passivation layer 4500 may be formed on the first passivation layer 4400. Thus, moisture, hydrogen, and oxygen may be prevented from penetrating into the organic layer 4300 and the second electrode 4200. That is, the first passivation layer 4400 is formed on the second electrode 4200 to prevent the organic layer 4300 and the second electrode 4200 from being damaged by moisture, oxygen, or the like, or thus from having deteriorated light emission characteristics. For example, the first passivation layer 4400 may be made of an anthracene-based compound, Alq3, or the like.

The first passivation layer 4400 may be deposited on the second electrode 4200 uniformly and evenly. Since the first passivation layer 4400 is uniformly and evenly deposited, the second passivation layer 4500 is also uniformly deposited on the first passivation layer 4400. As such, the first and second passivation layers 4400 and 4500 that are evenly and uniformly formed may prevent penetration of water or oxygen into the organic electroluminescent device 4000, such that the lifetime of the organic electroluminescent device 4000 can be improved.

The second passivation layer 4500 may be formed between the organic electroluminescent device 4000 and an adhesive film 4600 to prevent the organic electroluminescent device 4000 from being damaged by moisture, oxygen, or the like, or from having deteriorated light emission characteristics. The second passivation layer 4500 is formed to be in contact with the adhesive film 4600, thereby preventing moisture, hydrogen, oxygen, and the like from flowing into the organic electroluminescent device 4000. The second passivation layer 4500 may be made of an inorganic insulating layer such as silicon nitride, silicon oxide, or silicon oxynitride.

The adhesive film 4600 may be formed on the second passivation layer 4500. In this configuration, in order to prevent external moisture from penetrating into the organic electroluminescent device 4000, an encapsulation film 3900 may be formed on the adhesive film 4600. That is, the encapsulation film 3900 is formed on the second passivation layer 4500. The encapsulation film 3900 may adhere to the second passivation layer 4500 via the adhesive film 4600.

After the adhesive film 4600 is applied to a front face of the second passivation layer 4500 or a back face of the encapsulation film 3900, the encapsulation film 3900 may adhere to the substrate 3010 on which the organic electroluminescent device 4000 is formed via the adhesive film 4600.

The adhesive film 4600 may be made of, for example, an epoxy adhesive.

The encapsulation film 3900 may be embodied as, for example, a double metal layer of a Fe film and a Ni film. Alternatively, the encapsulation film 3900 may be embodied as a triple layer structure (not shown) in which a first inorganic layer, an organic layer, and a second inorganic layer are sequentially stacked vertically. However, the present disclosure is not limited thereto.

Hereinafter, examples and comparative examples of the present disclosure are described. The examples of the present disclosure are for illustrative purposes only and are not intended to limit the scope of the present disclosure

EXAMPLES

Hereinafter, Compounds used in Examples and Comparative Examples were synthesized as follows.

Synthesis Example 1

Preparation of Compound 1

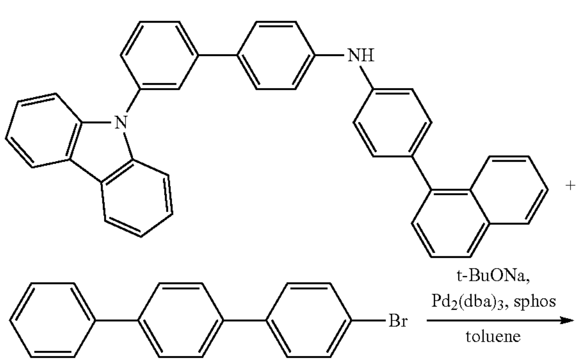

-continued

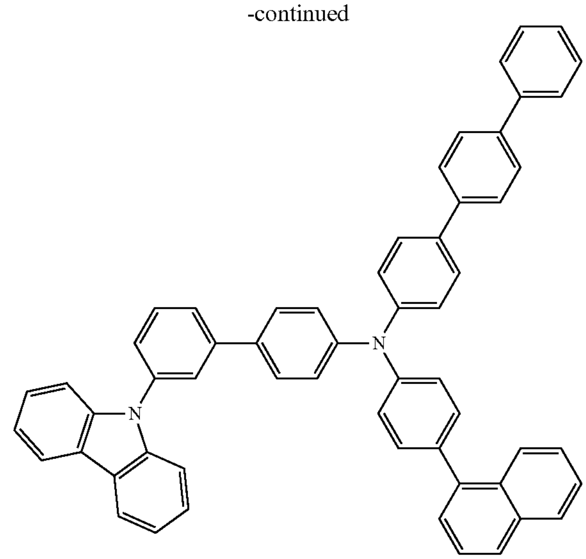

3'-(9H-carbazol-9-yl)-N-(4-(naphthalen-1-yl)phenyl)-[1,1'-biphenyl]-4-amine (8.0 g, 14.91 mmol) and 4-bromo-1,1':4',1"-terphenyl (5.07 g, 16.40 mmol) were mixed with each other in a 250 mL flask under nitrogen stream. Then, sodium tert butoxide (2.62 g, 27.27 mmol), $Pd_2(dba)_3$ (0.25 g, 0.27 mmol), 2-dicyclohexylphosphino-2',6'-dimethoxybiphenyl (0.22 g, 0.54 mmol) were added to the mixture. Then, 100 mL of toluene was added to the mixture which in turn was stirred to reflux.

After completion of the reaction, the toluene layer was extracted using 50 mL of water.

The extracted solution was treated with $MgSO_4$ to remove residual water, concentrated under reduced pressure, and purified using column chromatography. Then, the solvent in the purified solution was evaporated and the resulting solid was recrystallized using dichloromethane/methanol to produce 5.96 g of Compound 1 at 52.3% yield.

Synthesis Example 2

Preparation of Compound 7

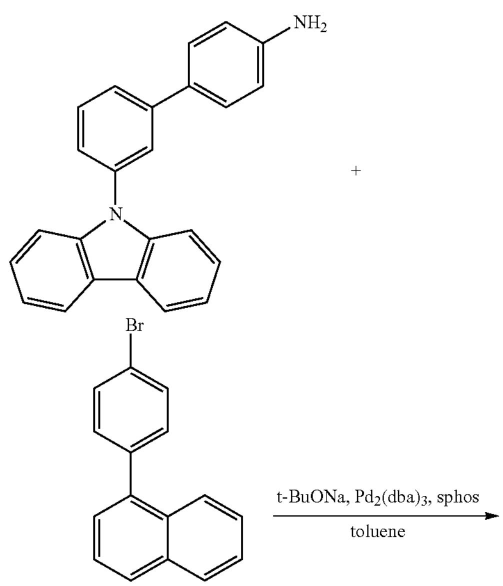

-continued

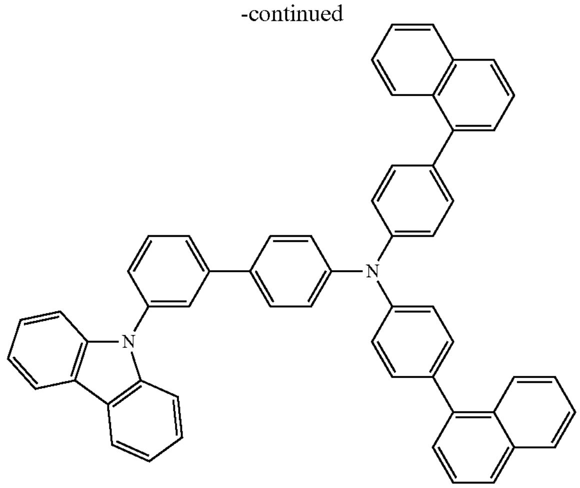

6.03 g of Compound 7 was obtained in a yield of 54.8% using the same method as in Synthesis Example 1 except that 3'-(9H-carbazol-9-yl)-[1,1'-biphenyl]-4-amine (8.0 g, 14.91 mmol) and 1-(4-bromophenyl)naphthalene (9.29 g, 32.79 mmol) were used.

Synthesis Example 3

Preparation of Compound 13

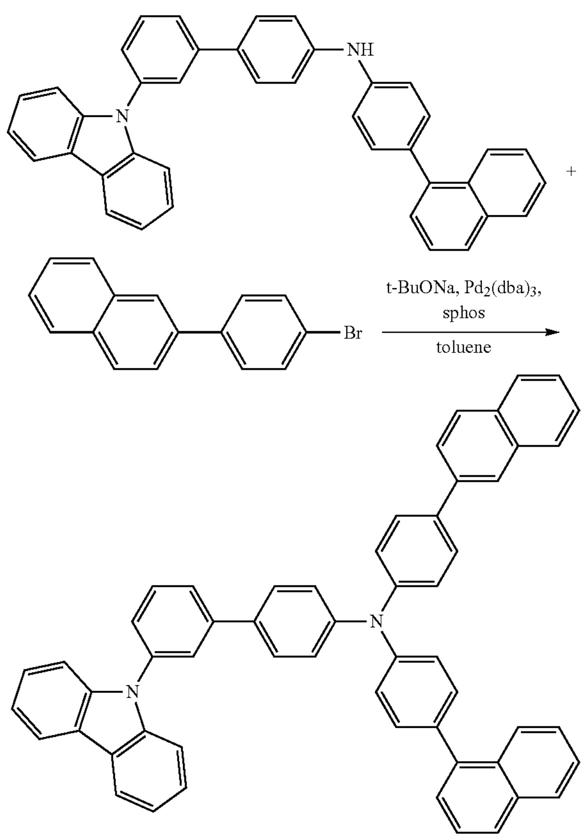

5.47 g of Compound 13 was obtained in a yield of 49.7% using the same method as in Synthesis Example 1 except that 3'-(9H-carbazol-9-yl)-N-(4-(naphthalen-1-yl)phenyl)-[1,1'-biphenyl]-4-amine (8.0 g, 14.91 mmol) and 2-(4-bromophenyl)naphthalene (4.64 g, 16.40 mmol) were used.

Synthesis Example 4

Preparation of Compound 31

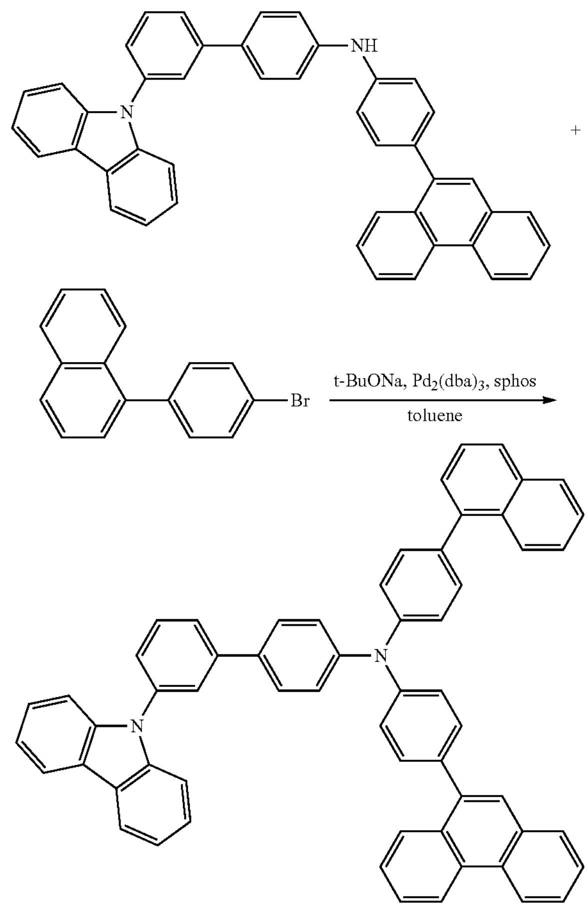

5.2 g of Compound 31 was obtained in 48.3% yield using the same method as in Synthesis Example 1 except that 1-(4-bromophenyl)naphthalene (4.25 g, 15.00 mmol) instead of 4-bromo-1,1'-biphenyl was used.

Synthesis Example 5

Preparation of Compound 32

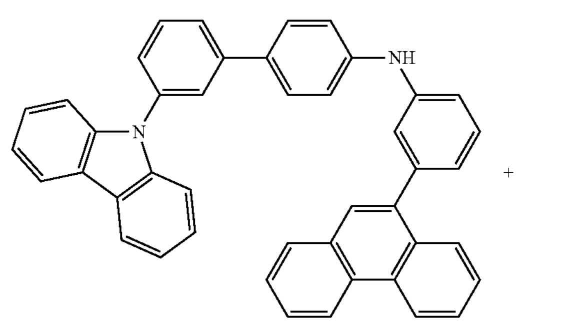

-continued

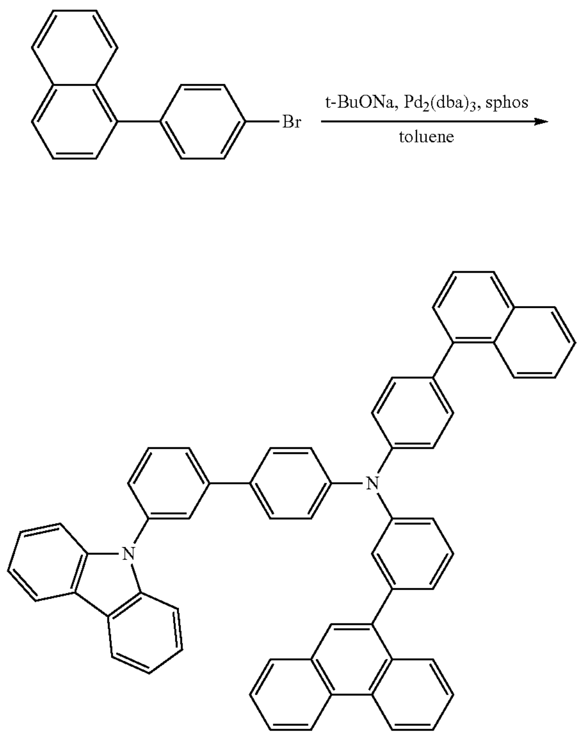

5.1 g of Compound 32 was obtained in a yield of 47.4% in the same method as in Synthesis Example 1 except that 3'-(9H-carbazol-9-yl)-N-(3-(phenanthren-9-yl)phenyl)-[1,1'-biphenyl]-4-amine (8.0 g, 13.63 mmol) and 1-(4-bromophenyl)naphthalene (4.25 g, 15.00 mmol) were used.

Synthesis Example 6

Preparation of Compound 66

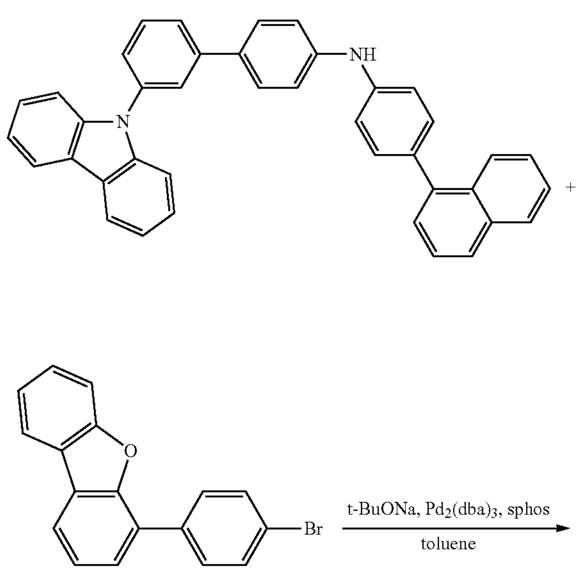

-continued

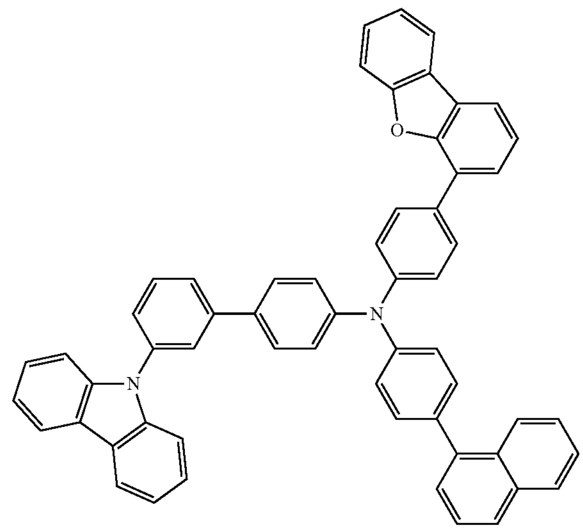

6.11 g of Compound 66 was obtained in 52.6% yield by the same method as in Synthesis Example 1 except that 3'-(9H-carbazol-9-yl)-N-(4-(naphthalen-1-yl)phenyl)-[1,1'-biphenyl]-4-amine (8.0 g, 14.91 mmol) and 4-(4-bromophenyl)dibenzofuran (5.30 g, 16.40 mmol) were used.

Synthesis Example 7

Preparation of Compound 91

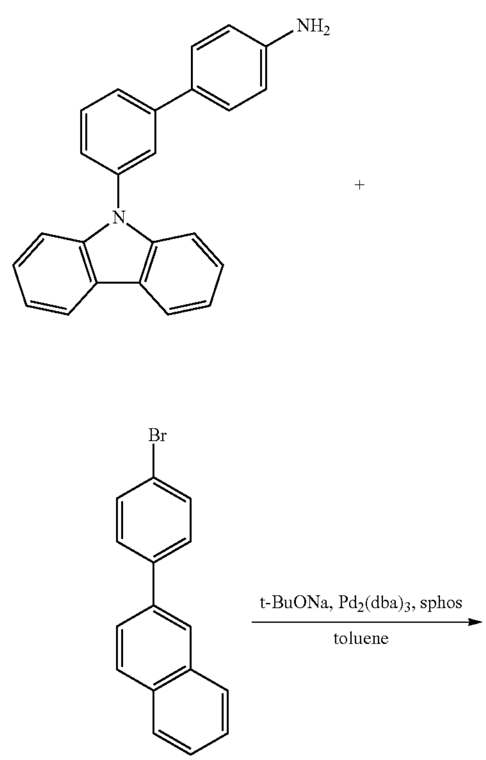

-continued

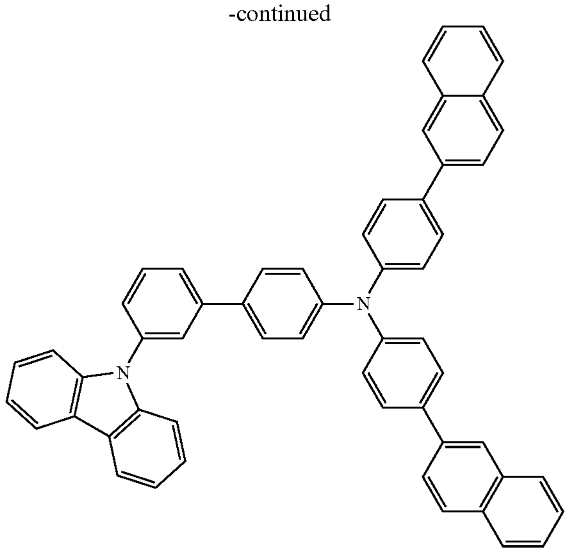

6.12 g of Compound 91 was obtained in 55.6% yield using the same method as in Synthesis Example 1 except that 3'-(9H-carbazol-9-yl)-[1,1'-biphenyl]-4-amine (8.0 g, 14.91 mmol) and 2-(4-bromophenyl)naphthalene (9.29 g, 32.79 mmol) were used.

Synthesis Example 8

Preparation of Compound 109

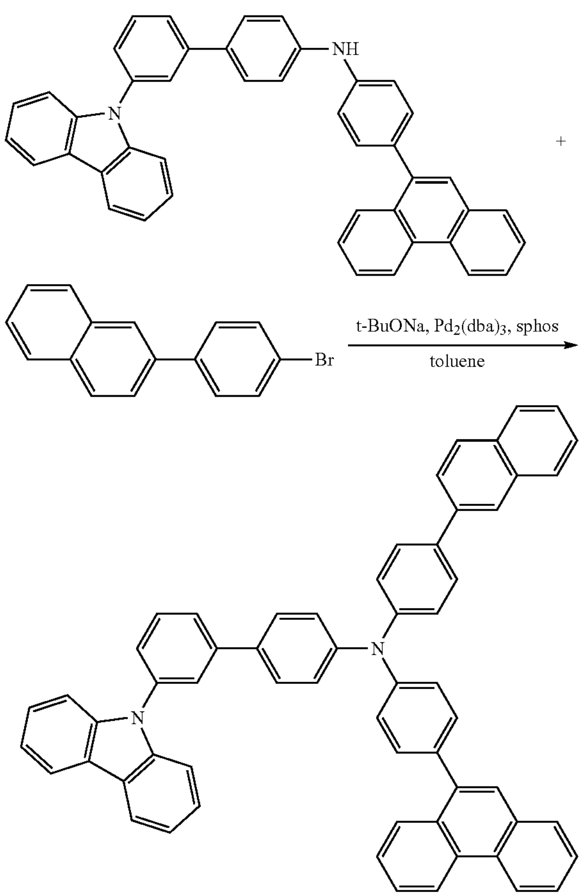

5.5 g of Compound 109 was obtained in 51.1% yield by the same method as in Synthesis Example 1 except for using 2-(4-bromophenyl)naphthalene (4.25 g, 15.00 mmol) instead of 4-bromo-1,1'-biphenyl.

Synthesis Example 9

Preparation of Compound 2-1

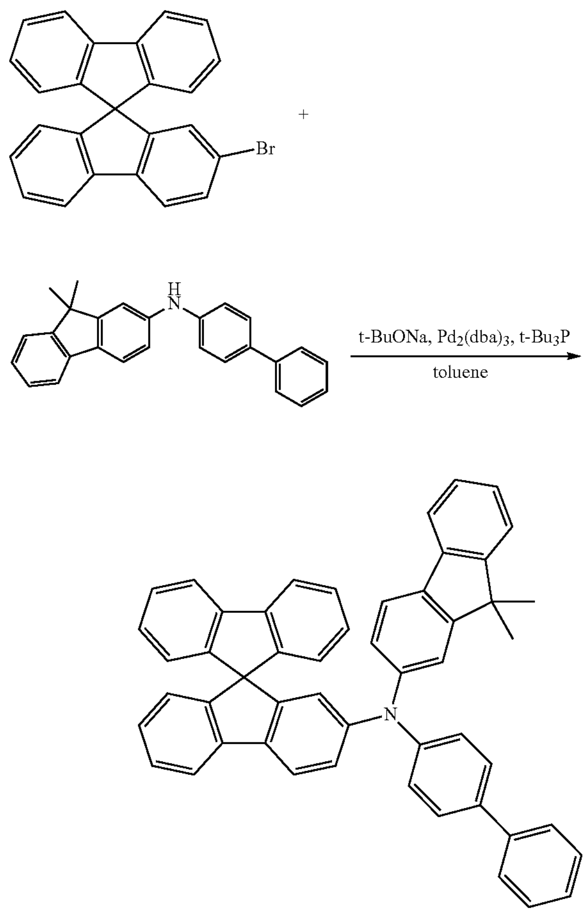

Under nitrogen stream, 2-bromo-9,9'-spirobi[fluorene] (6.01 g, 15.21 mmol), N-([1,1'-biphenyl]-4-yl)-9,9-dimethyl-9H-fluoren-2-amine (5.00 g, 13.83 mmol), sodium tert butoxide (3.99 g, 41.49 mmol), tris(dibenzylideneacetone) dipalladium (0) (0.25 g, 0.28 mmol), 50 wt % tri-tert-butylphosphine (2.55 g, 1.11 mmol), and 100 mL of toluene were added into a 250 mL flask and were stirred therein while being refluxed. After completion of the reaction, the toluene layer was extracted using 100 mL of water. An extracted solution was treated with $MgSO_4$ to remove residual water, and concentrated under reduced pressure, and purified using column chromatography. The resulting solid is subjected to recrystallization using dichloromethane/heptane, thereby obtaining 7.07 g of Compound 2-1 in 75.6% yield.

Synthesis Example 10

Preparation of Compound 2-2

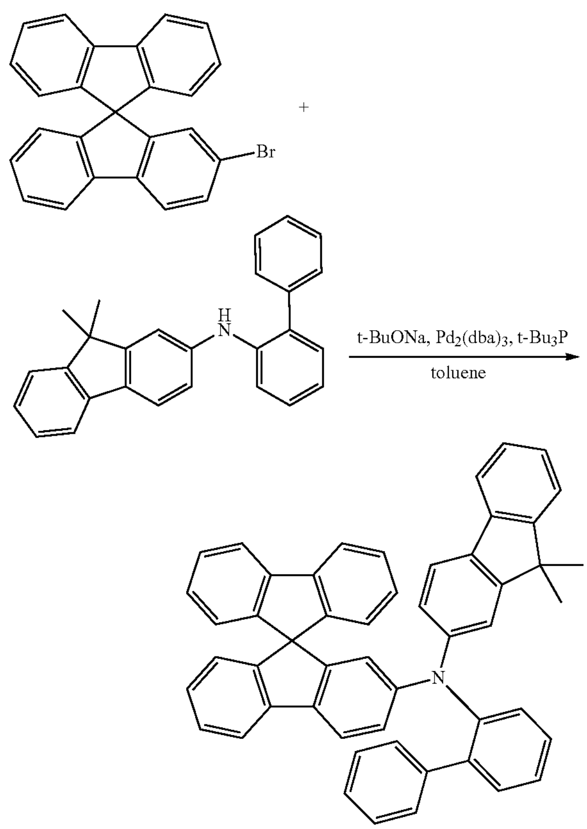

6.15 g of a Compound 2-2 was obtained in 65.8% yield via synthesizing and purifying in the same manner as in the preparation of the Compound 2-1 except that N-([1,1'-biphenyl]-2-yl)-9,9-dimethyl-9H-fluoren-2-amine (5.00 g, 13.83 mmol) was used instead of N-([1,1'-biphenyl]-4-yl)-9,9-dimethyl-9H-fluoren-2-amine.

Synthesis Example 11

Preparation of Compound 2-19

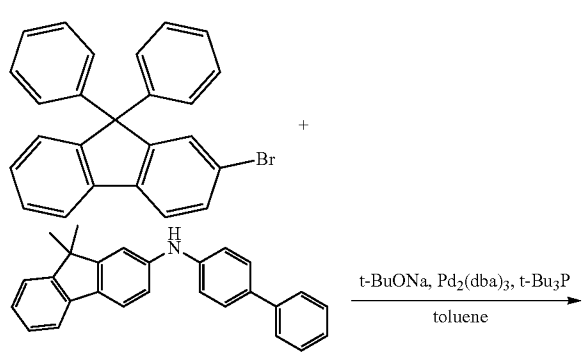

-continued

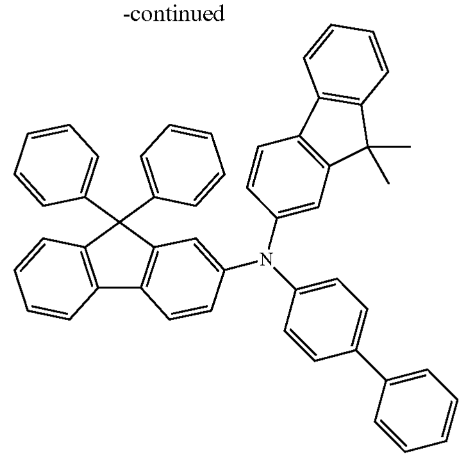

6.59 g of Compound 2-19 was obtained in 70.3% yield via synthesizing and purifying in the same manner as in the preparation of Compound 2-1, except for using 2-bromo-9,9-diphenyl-9H-fluorene (6.05 g, 15.21 mmol) instead of 2-bromo-9,9'-spirobi[fluorene].

Synthesis Example 12

Preparation of Compound 2-20

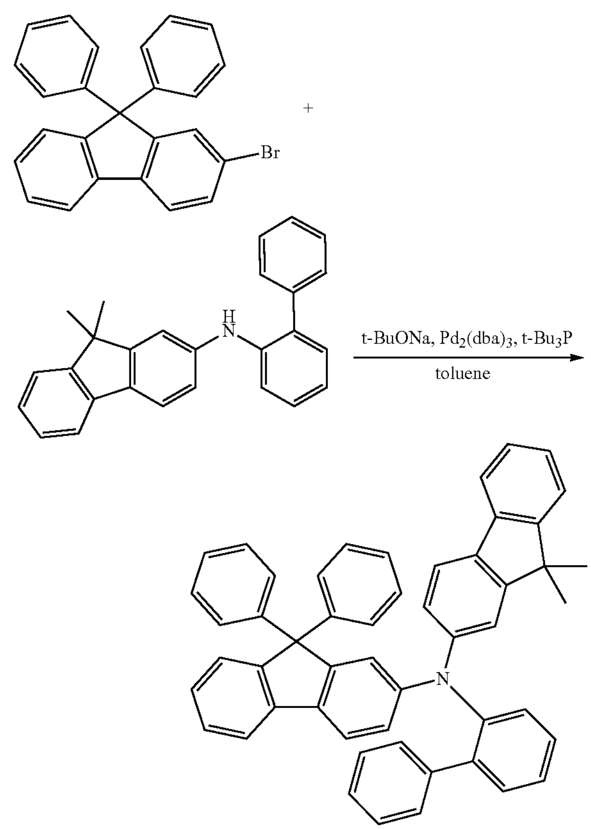

6.29 g of Compound 2-20 was obtained in 67.1% yield via synthesizing and purifying in the same manner as in the preparation of Compound 2-1, except that 2-bromo-9,9- diphenyl-9H-fluorene (6.05 g, 15.21 mmol) and N-([1,1'-biphenyl]-2-yl)-9,9-dimethyl-9H-fluoren-2-amine (5.00 g, 13.83 mmol) were used.

Synthesis Example 13

Preparation of Compound 2-110

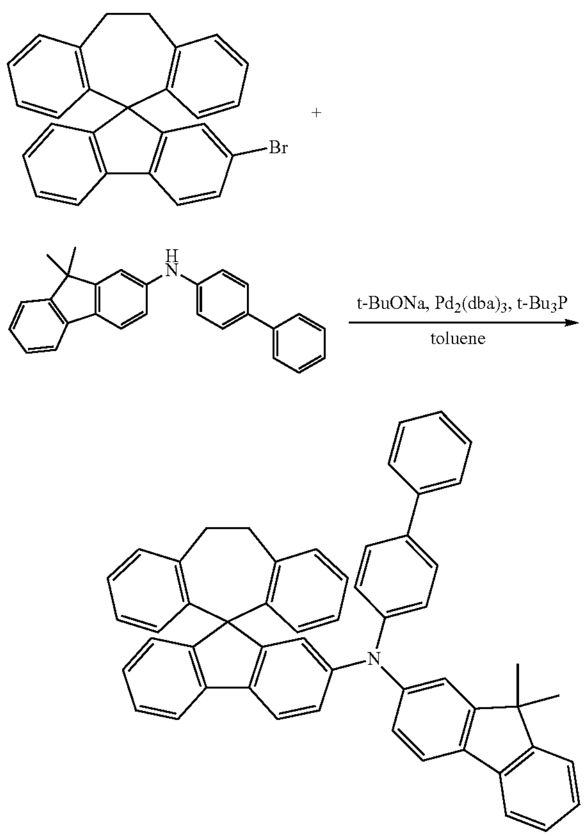

6.22 g of Compound 2-110 was obtained in 63.9% yield via synthesizing and purifying in the same manner as in the preparation of Compound 2-1 except for using 2'-bromo-10,11-dihydrospyro[dibenzo[a, d] [7]anulene-5,9'-fluorene] (6.44 g, 15.21 mmol) instead of 2-bromo-9,9'-spirobi[fluorene].

Synthesis Example 14

Preparation of Compound 2-111

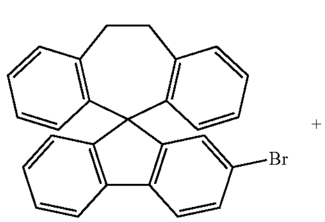

-continued

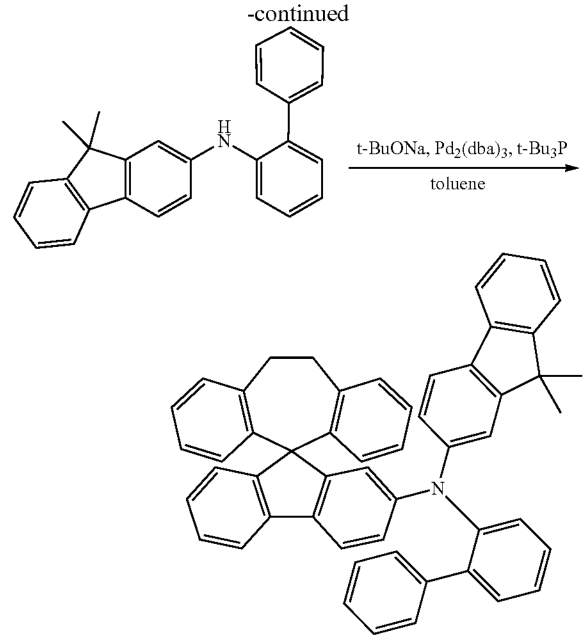

5.82 g of Compound 2-111 was obtained in 59.8% yield via synthesizing and purifying in the same manner as in the preparation of Compound 2-1 except for using 2'-bromo-10,11-dihydrospyro[dibenzo [a, d] [7] anulene-5,9'-fluorene] (6.44 g, 15.21 mmol) and N-([1,1'-biphenyl]-2-yl)-9,9-dimethyl-9H-fluoren-2-amine (5.00 g, 13.83 mmol).

Synthesis Example 15

Preparation of the Compound 2-37

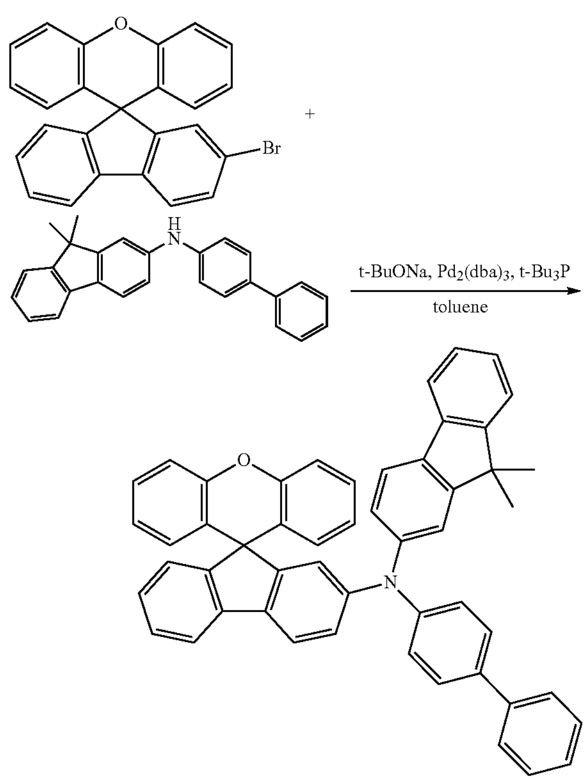

6.07 g of Compound 2-37 was obtained in 63.4% yield via synthesizing and purifying in the same manner as in the preparation of Compound 2-1 except for using 2-bromo-spyro[fluorene-9,9'-xanthene] (6.26 g, 15.21 mmol) instead of 2-bromo-9,9'-spirobi[fluorene].

Synthesis Example 16

Preparation of Compound 2-38

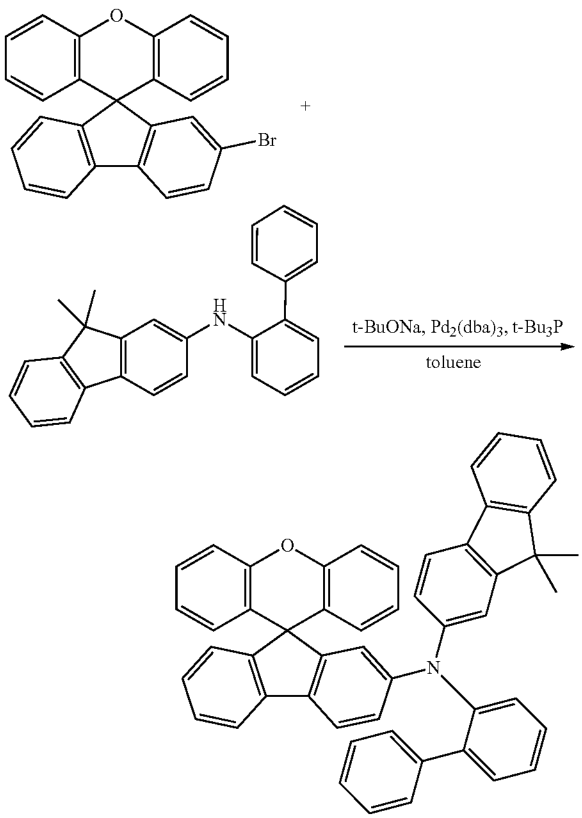

5.62 g of Compound 2-38 was obtained in 58.7% yield via synthesizing and purifying in the same manner as in the preparation of Compound 2-1 except that 2-bromospyro [fluorene-9,9'-xanthene] (6.26 g, 15.21 mmol) and N-([1,1'-biphenyl]-2-yl)-9,9-dimethyl-9H-fluoren-2-amine (5.00 g, 13.83 mmol) were used.

Synthesis Example 17

Preparation of Compound 2-74

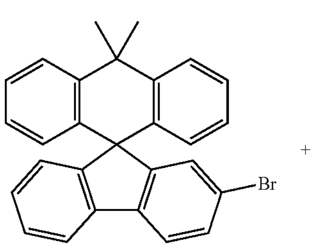

-continued

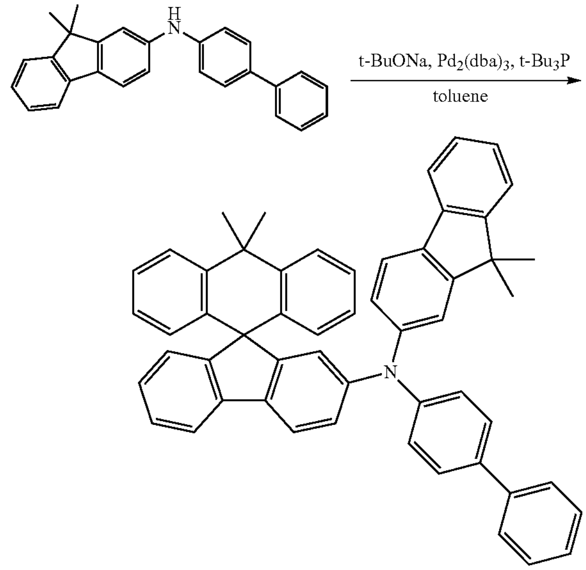

6.01 g of Compound 2-74 was obtained in 60.5% yield via synthesizing and purifying in the same manner as in the preparation of Compound 2-1 except using 2'-bromo-10,10-dimethyl-10H-spiro[anthracene-9,9'-fluorene] (6.65 g, 15.21 mmol) instead of 2-bromo-9,9'-spirobi[fluorene].

Synthesis Example 18

Preparation of Compound 2-75

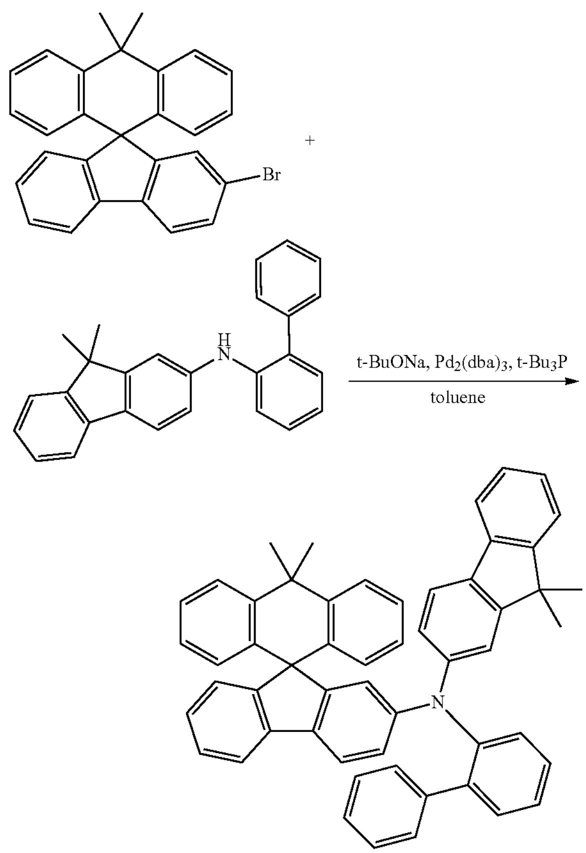

5.69 g of Compound 2-75 was obtained in 57.3% yield via synthesizing and purifying in the same manner as the preparation of Compound 2-1 except that 2'-bromo-10,10-dimethyl-10H-spiro[anthracene-9,9'-fluorene] (6.65 g, 15.21 mmol) and N-([1,1'-biphenyl]-2-yl)-9,9-dimethyl-9H-fluoren-2-amine (5.00 g, 13.83 mmol) were used.

Synthesis Example 19

Preparation of Compound 2-128

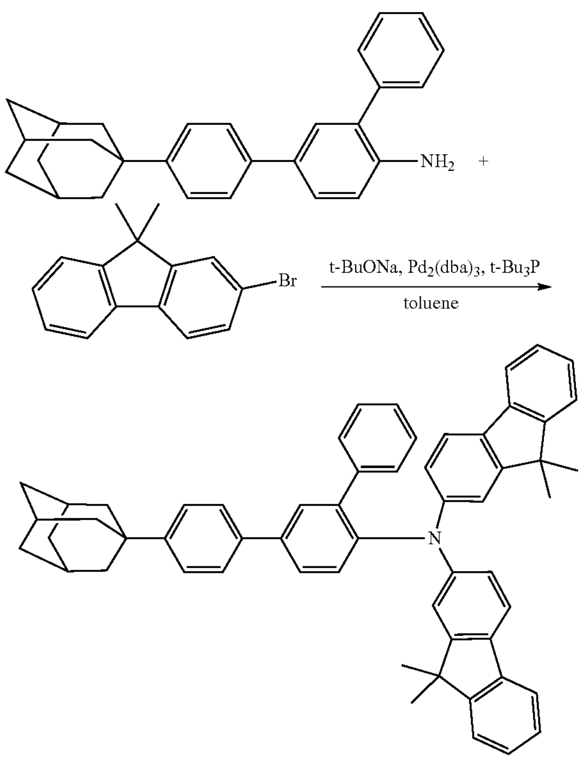

5.60 g of Compound 2-128 was obtained in 55.7% yield via synthesizing and purifying in the same manner as in the preparation of Compound 2-1 except for using 4-((3r, 5r, 7r)-adamantan-1-yl)-[1,1':3',1"-terphenyl]-4'-amine (5.00 g, 13.17 mmol) and 2-bromo-9,9-dimethyl-9H-fluorene (7.92 g, 28.98 mmol).

Synthesis Example 20

Preparation of Compound 2-129

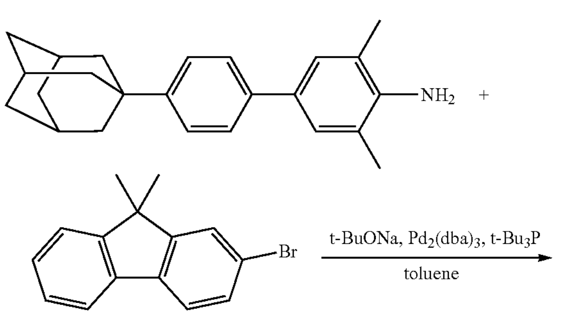

-continued

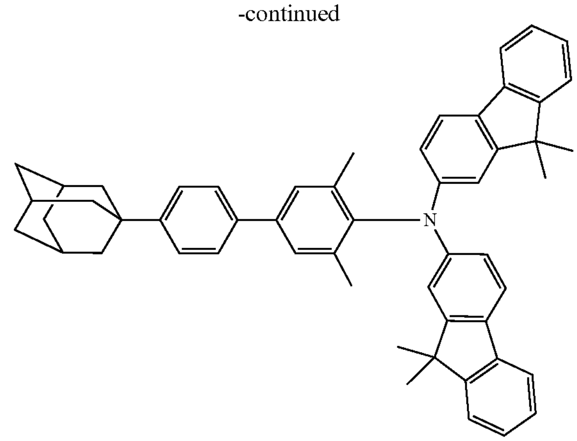

6.29 g of Compound 2-129 was obtained in 58.2% yield via synthesizing and purifying in the same manner as in the preparation of Compound 2-1 except for using 4'-((3r, 5r, 7r)-adamantan-1-yl)-3,5-diphenyl-[1,1'-biphenyl]-4-amine (5.00 g, 15.08 mmol) and 2-bromo-9,9-diphenyl-9H-fluorene (9.06 g, 33.18 mmol).

Synthesis Example 21

Preparation of Compound 2-161

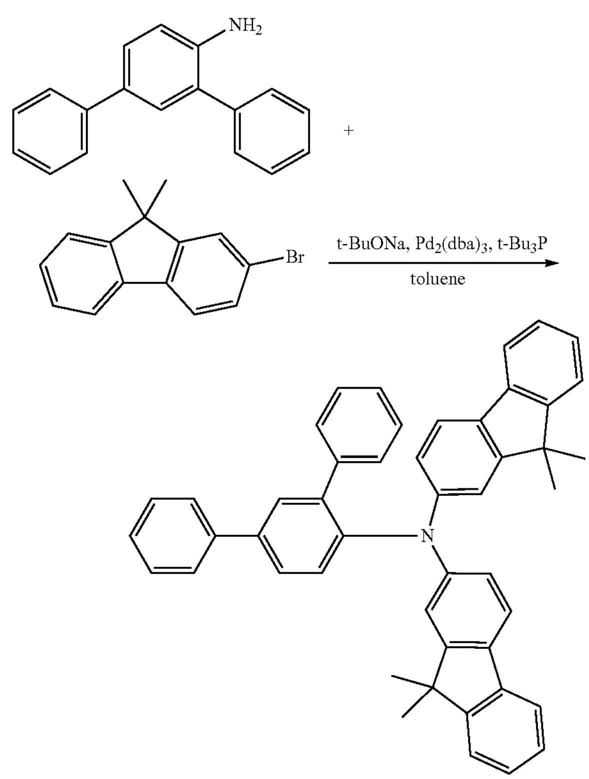

9.02 g of Compound 2-161 was obtained in 50.2% yield via synthesizing and purifying in the same manner as the preparation of Compound 2-1 except for using 1,1': 3',1"-terphenyl-4'-amine (7.0 g, 28.53 mmol), and 2-bromo-9,9-dimethyl-9H-fluorene (18.71 g. 68.48 mmol).

Synthesis Example 22

Preparation of Compound 2-185

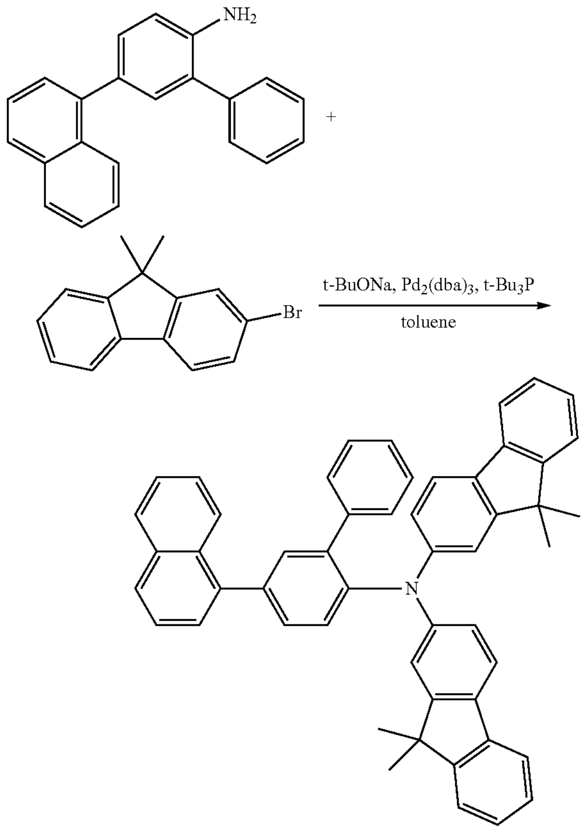

6.60 g of Compound 2-185 was obtained in a yield of 47.8% via synthesizing and purifying in the same manner as the preparation of Compound 2-1 except that 5-naphthalen-1-yl-1,1'-biphenyl-2-amine (6.0 g, 20.31 mmol) and 2-bromo-9,9-dimethyl-9H-fluorene (18.71 g. 68.48 mmol) were used.

Synthesis Example 23

Preparation of Compound 3-197

1. Preparation of Compound 3-197-A

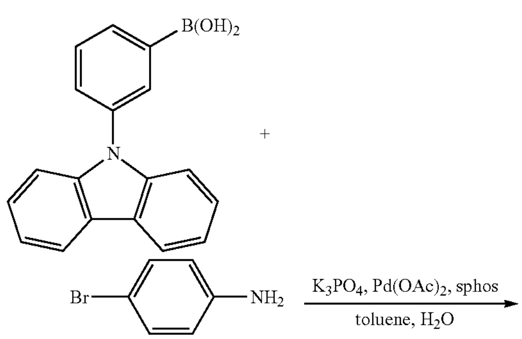

-continued

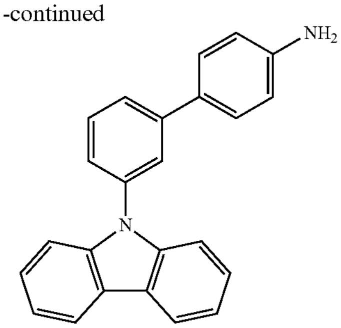

Under nitrogen stream, (3-(9H-carbazol-9-yl)phenyl)boronic acid (50.0 g, 174.1 mmol), 4-bromoaniline (32.95 g, 191.6 mmol), potassium triphosphate (92.41 g, 435.3 mmol), palladium (II) acetate (1.17 g, 5.22 mmol), 2-dicyclohexylphosphino-2', 6'-dimethoxybiphenyl (4.29 g, 10.45 mmol), toluene (500 mL) and $H_2O$ (50 mL) were added into a 1000 mL flask and were stirred therein while being refluxed. After completion of the reaction, the toluene layer was extracted using toluene and water. The extracted solution was treated with $MgSO_4$ to remove residual water, concentrated under reduced pressure, and purified using column chromatography, thereby obtaining 38.49 g of Compound 3-197-A in 66.1% yield.

2. Preparation of Compound 3-197-B

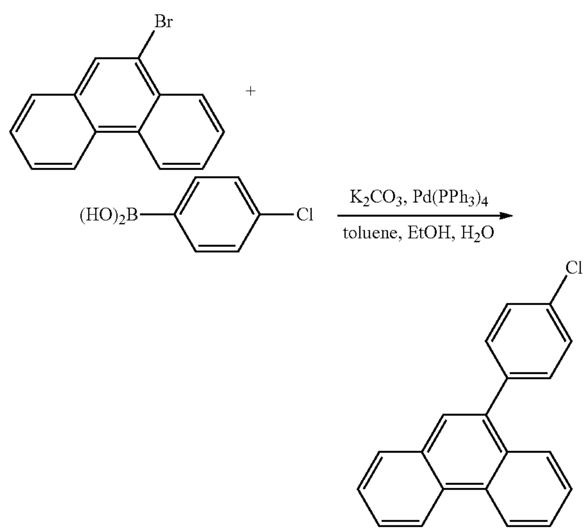

Under nitrogen stream, 9-bromophenanthren (40.0 g, 155.6 mmol), (4-chlorophenyl)boronic acid (26.76 g, 171.1 mmol), potassium carbonate (43.0 g, 311.1 mmol), tetrakis (triphenylphosphine)palladium (0) (5.39 g, 4.67 mmol), toluene (300 mL), EtOH (100 mL) and $H_2O$ (100 mL) were added into a 1000 mL flask and were stirred therein while being refluxed. After completion of the reaction, the toluene layer was extracted using toluene and water. The extracted solution was treated with $MgSO_4$ to remove residual water, concentrated under reduced pressure, and purified using column chromatography, thereby obtaining 38.51 g of Compound 3-197-B in 85.7% yield.

3. Preparation of Compound 3-197-C

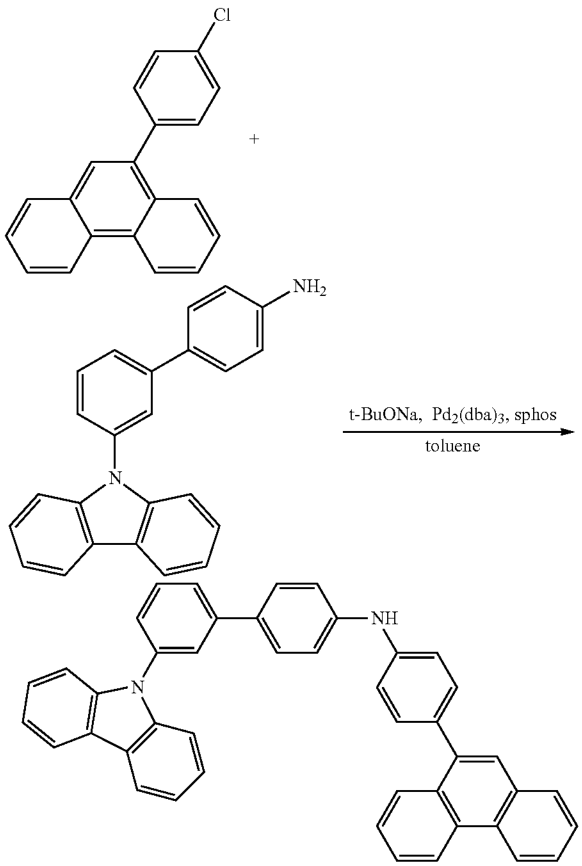

Under nitrogen stream, 9-(4-chlorophenyl)phenanthrene (30.0 g, 103.9 mmol), 3'-(9H-carbazol-9-yl)-[1,1'-biphenyl]-4-amine (38.22 g, 114.3 mmol), sodium tert butoxide (19.97 g, 207.8 mmol), tris(dibenzylideneacetone)dipalladium (0) (1.90 g, 2.08 mmol), 2-dicyclohexylphosphino-2',6'-dimethoxybiphenyl (1.71 g, 4.16 mmol), and 300 mL of toluene were added into a 1000 mL flask and stirred therein under reflux. After completion of the reaction, the toluene layer was extracted using 200 mL of water. The extracted solution was treated with $MgSO_4$ to remove residual water, concentrated under reduced pressure, and purified using column chromatography. The resulting solid is subjected to recrystallization using dichloromethane/methanol, thereby obtaining 43.28 g of Compound 3-197-C in 71.0% yield.

4. Preparation of Compound 3-197

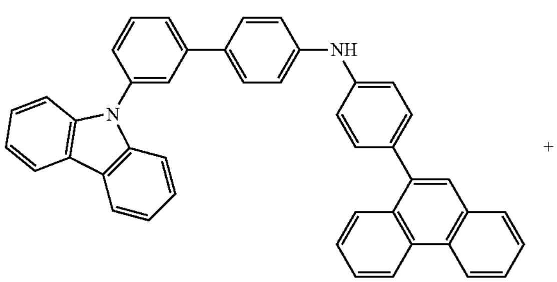

-continued

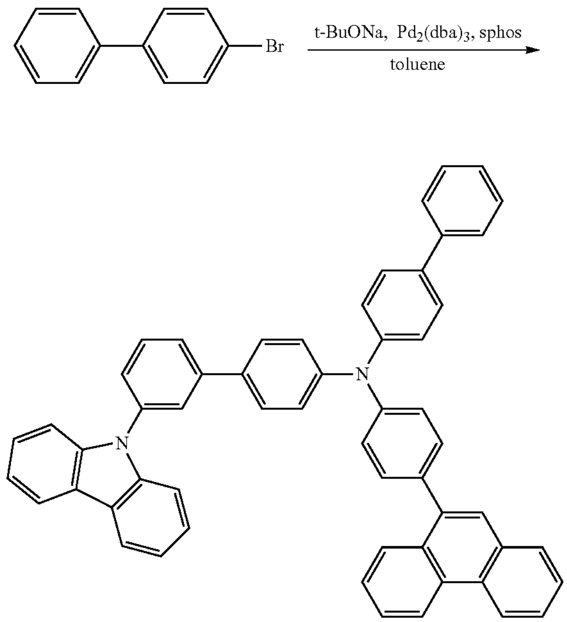

Under nitrogen stream, 3'-(9H-carbazol-9-yl)-N-(4-(phenanthren-9-yl)phenyl)-[1,1'-biphenyl]-4-amine (8.0 g, 13.63 mmol), 4-bromo-1,1'-biphenyl (3.50 g, 15.00 mmol), sodium tert butoxide (2.62 g, 27.27 mmol), tris(dibenzylideneacetone)dipalladium (0) (0.25 g, 0.27 mmol), 2-dicyclohexylphosphino-2',6'-dimethoxybiphenyl (0.22 g, 0.54 mmol), and 100 mL of toluene were added into 250 mL flask and stirred therein under reflux. After completion of the reaction, the toluene layer was extracted using 50 mL of water. The extracted solution was treated with $MgSO_4$ to remove residual water, and concentrated under reduced pressure, and purified using column chromatography. The resulting solid is subjected to recrystallization using dichloromethane/methanol, thereby obtaining 5.60 g of Compound 3-197 in 55.6% yield.

Synthesis Example 24

Preparation of Compound 3-230

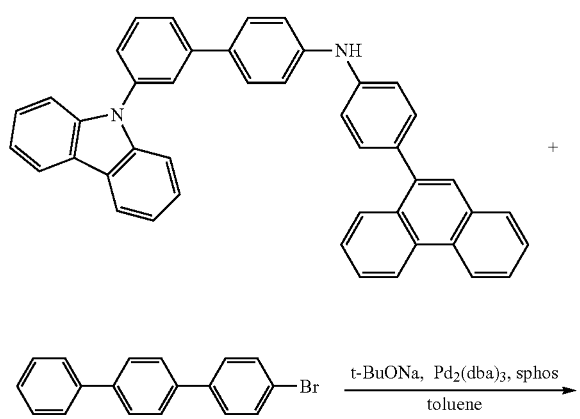

-continued

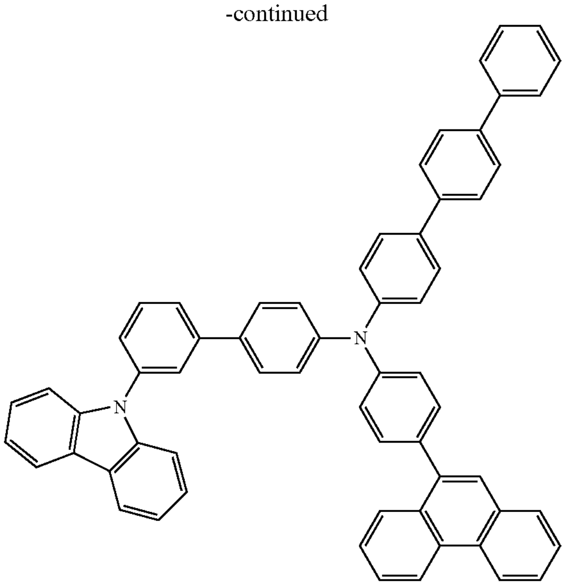

6.10 g (54.9% yield) of Compound 3-230 was obtained via synthesizing and purifying in the same manner as in the preparation of Compound 3-197 except for using 4-bromo-1,1': 4',1"-terphenyl (4.64 g, 15.00 mmol) instead of 4-bromo-1,1'-biphenyl.

Synthesis Example 25

Preparation of Compound 3-198

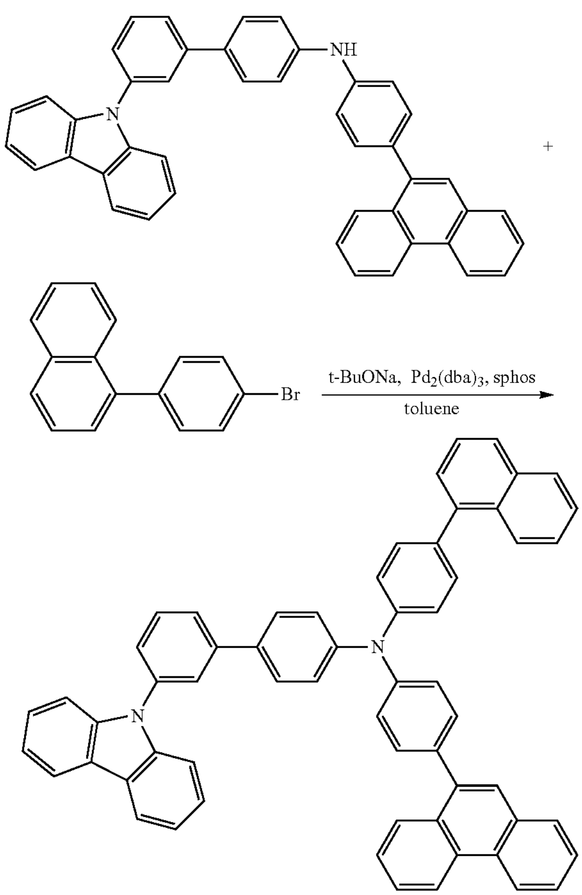

Compound 3-198 (5.19 g, 48.3% yield) was obtained via synthesizing and purifying in the same manner as in the preparation of Compound 3-197 except for using 1-(4-bromophenyl)naphthalene (4.25 g, 15.00 mmol) instead of 4-bromo-1,1'-biphenyl.

Synthesis Example 26

Preparation of Compound 3-199

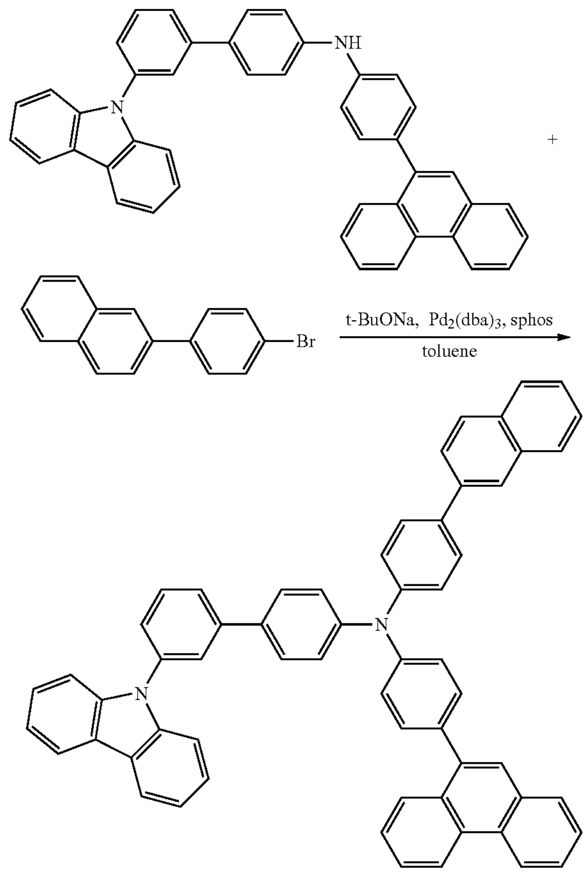

Compound 3-199 (5.50 g, 51.1% yield) was obtained via synthesizing and purifying in the same manner as in the preparation of Compound 3-197 except for using 2-(4-bromophenyl)naphthalene (4.25 g, 15.00 mmol) instead of 4-bromo-1,1'-biphenyl.

Synthesis Example 27

Preparation of Compound 3-365

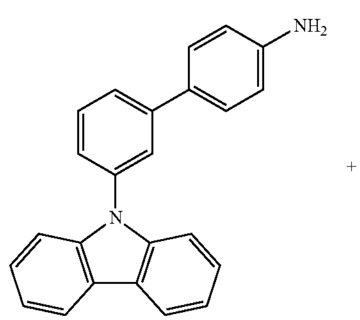

-continued

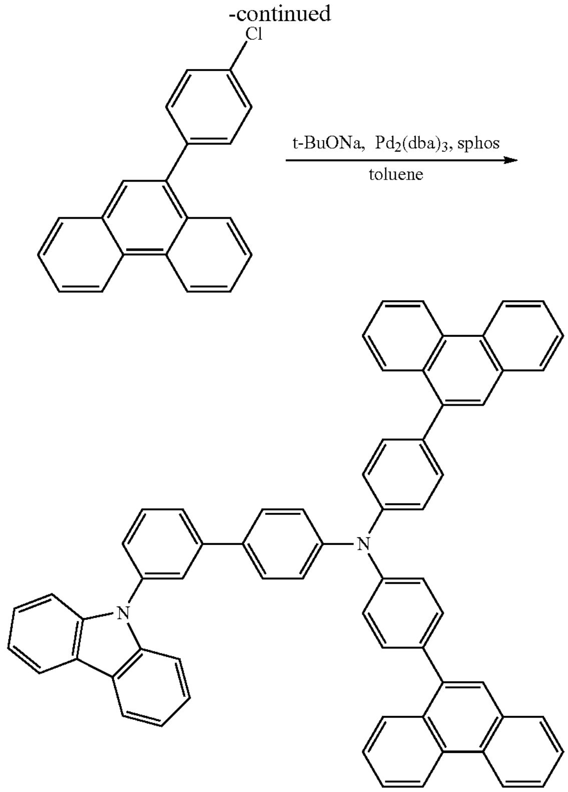

Compound 3-365 (5.91 g, 52.3% yield) was obtained via synthesizing and purifying in the same manner as in the preparation of Compound 3-197 except for using 3'-(9H-carbazol-9-yl)-[1,1'-biphenyl]-4-amine (4.5 g, 13.46 mmol) and 9-(4-chlorophenyl)phenanthrene (8.55 g, 29.60 mmol).

Synthesis Example 28

Preparation of Compound 3-366

1. Preparation of Compound 3-366-A

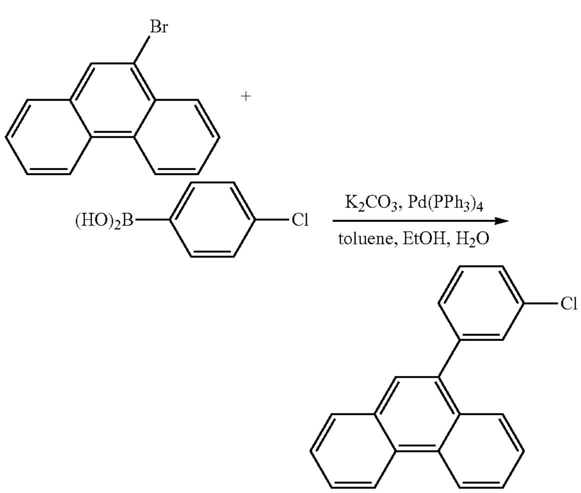

Compound 3-366-A (32.53 g, 72.4% yield) was obtained via synthesizing and purifying in the same manner as in the preparation of Compound 3-197-B except for using (3-chlorophenyl)boronic acid (26.76 g, 171.1 mmol) instead of (4-chlorophenyl)boronic acid.

2. Preparation of Compound 3-366-B

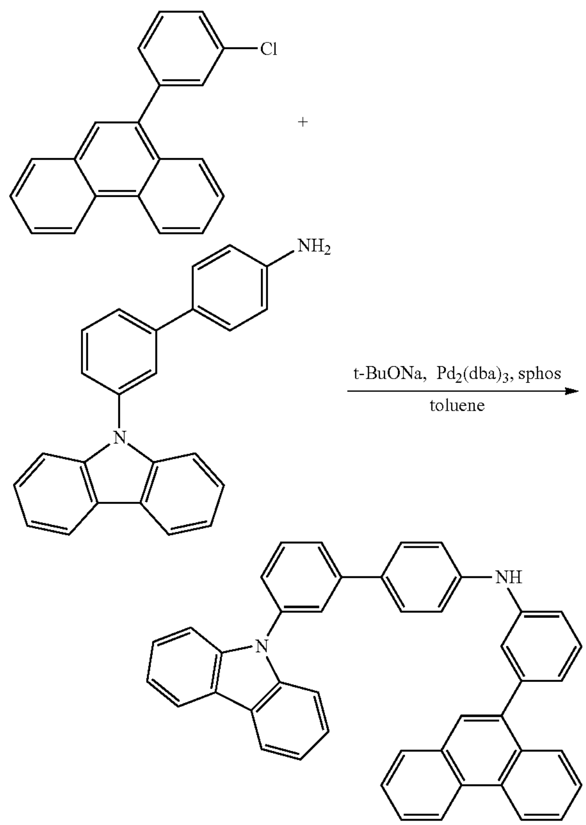

36.82 g of the Compound 3-366-B was obtained in 60.4% yield via synthesizing and purifying in the same manner as in the preparation of Compound 3-197-C except for using 9-(3-chlorophenyl)phenanthrene (30.0 g, 103.9 mmol) instead of 9-(4-chlorophenyl)phenanthrene.

3. Preparation of Compound 3-366

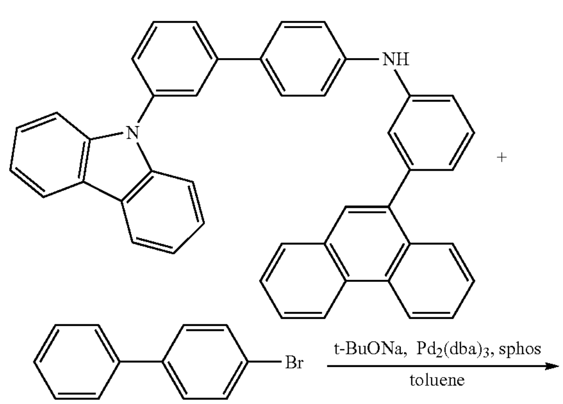

-continued

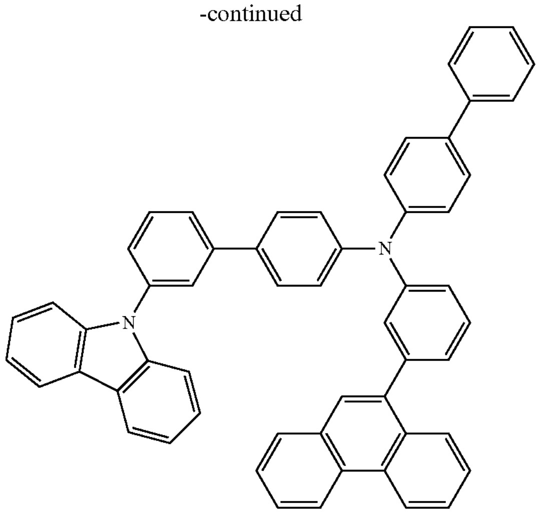

5.10 g of Compound 3-366 was obtained in 50.6% yield via synthesizing and purifying in the same manner as in the preparation of Compound 3-197 except for using 3'-(9H-carbazol-9-yl)-N-(3-(phenanthren-9-yl)phenyl)-[1,1'-biphenyl]-4-amine (8.0 g, 13.63 mmol) instead of 3'-(9H-carbazol-9-yl)-N-(4-(phenanthren-9-yl)phenyl)-[1,1'-biphenyl]-4-amine.

Synthesis Example 29

Preparation of Compound 3-367

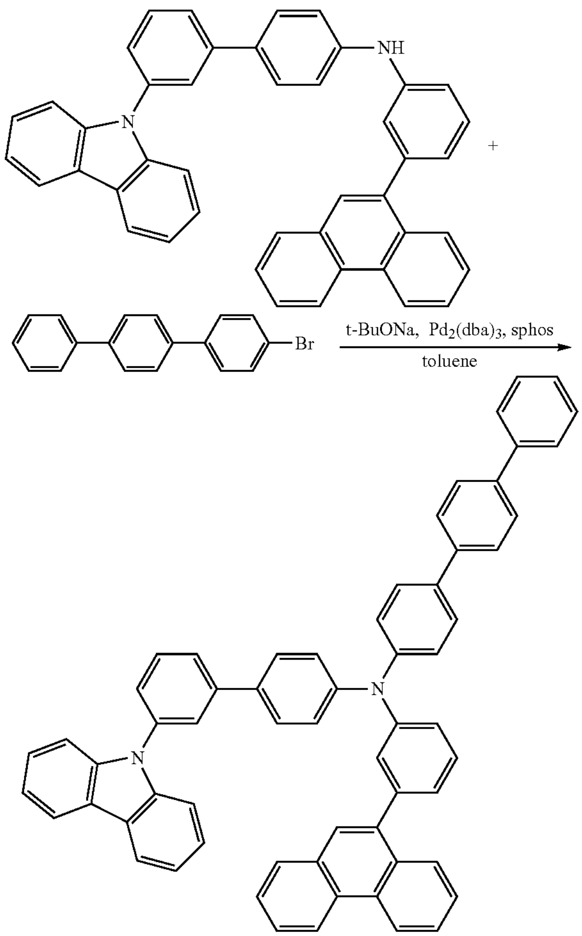

Compound 3-367 (5.50 g, 49.5% yield) was obtained in the same manner as the production of Compound 3-197 except for using 3'-(9H-carbazol-9-yl)-N-(3-(phenanthren-9-yl)phenyl)-[1,1'-biphenyl]-4-amine (8.0 g, 13.63 mmol), and 4-bromo-1,1':4',1"-terphenyl (4.64 g, 15.00 mmol).

Synthesis Example 30

Preparation of Compound 3-368

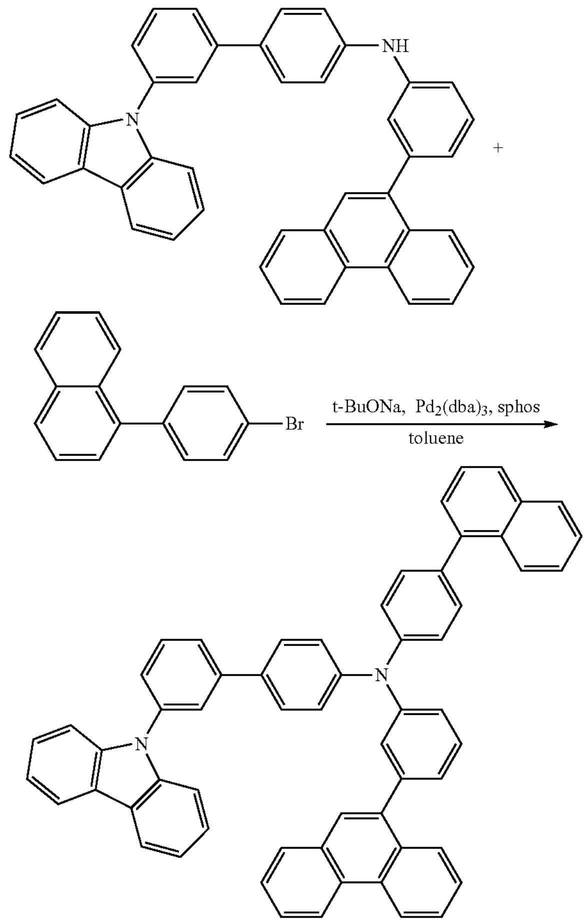

5.10 g of Compound 3-368 was obtained in 47.4% yield via synthesizing and purifying in the same manner as in the preparation of Compound 3-197 except for using 3'-(9H-carbazol-9-yl)-N-(3-(phenanthren-9-yl)phenyl)-[1,1'-biphenyl]-4-amine (8.0 g, 13.63 mmol) and 1-(4-bromophenyl) naphthalene (4.25 g, 15.00 mmol).

Synthesis Example 31

Preparation of Compound 3-38

1. Preparation of Compound 3-38-A

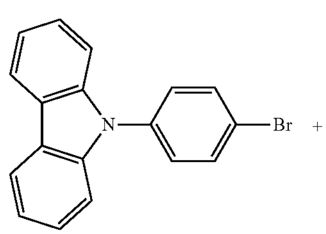

-continued

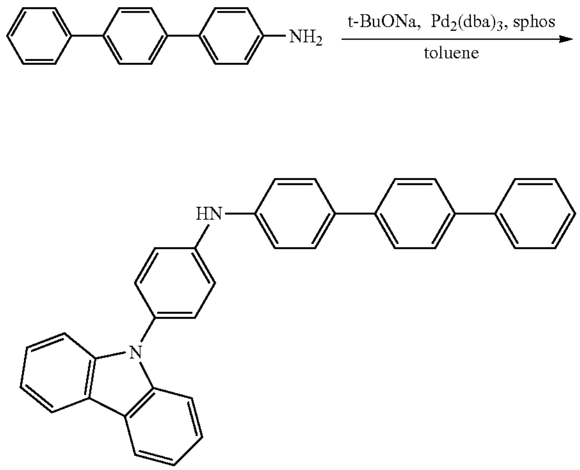

In a 2000 mL flask under nitrogen stream, 9-(4-bromophenyl)-9H-carbazole (50.0 g, 155.2 mmol), [1,1':4',1"-terphenyl]-4-amine (41.88 g, 170.7 mmol), sodium tert butoxide (29.83 g, 310.4 mmol), tris(dibenzylideneacetone) dipalladium (0) (2.84 g, 3.10 mmol), 2-dicyclohexylphosphino-2',6'-dimethoxybiphenyl (2.55 g, 6.21 mmol) and toluene (800 mL) were mixed with each other and then stirred therein under reflux. After completion of the reaction, the toluene layer was extracted using 500 mL of water. The extracted solution was treated with $MgSO_4$ to remove residual water, concentrated under reduced pressure, and purified using column chromatography. The resulting solid is subjected to recrystallization using dichloromethane/heptane, thereby obtaining 57.10 g of Compound 3-38-A in 75.6% yield.

2. Preparation of Compound 3-38

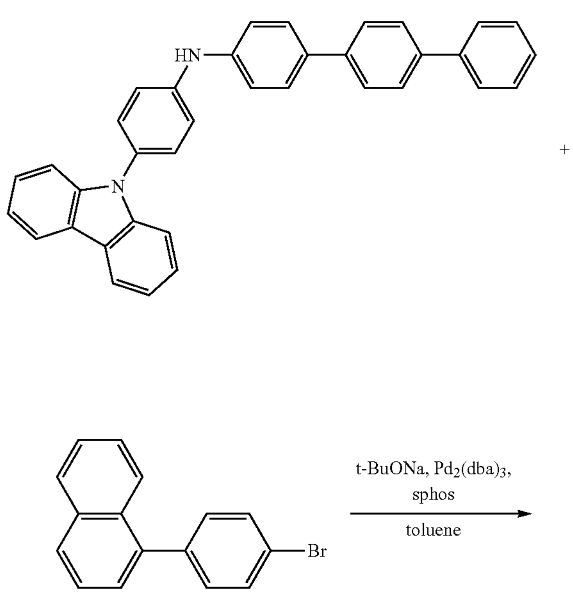

-continued

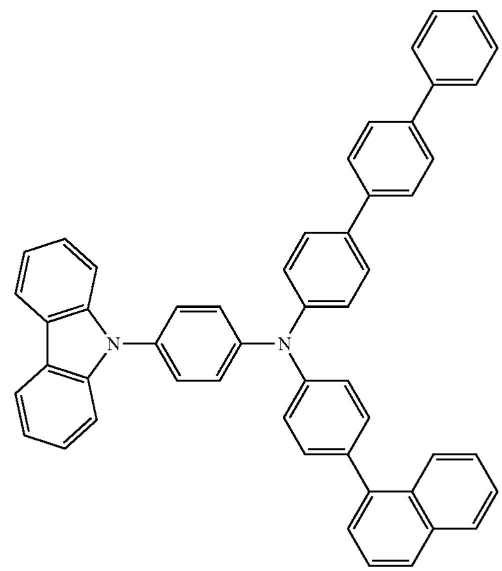

In a 250 mL flask under nitrogen stream, N-(4-(9H-carbazol-9-yl)phenyl)-[1,1': 4',1"-terphenyl]-4-amine (8.0 g, 16.44 mmol), 1-(4-bromophenyl)naphthalene (5.12 g, 18.08 mmol), sodium tert butoxide (3.16 g, 32.88 mmol), tris (dibenzylideneacetone)dipalladium (0) (0.30 g, 0.33 mmol), 2-dicyclohexylphosphino-2',6'-dimethoxybiphenyl (0.27 g, 0.66 mmol) and 100 mL of toluene were added thereto and then stirred therein under reflux. After completion of the reaction, the toluene layer was extracted using 50 mL of water. The extracted solution was treated with $MgSO_4$ to remove residual water, concentrated under reduced pressure, and purified using column chromatography. The resulting solid is subjected to recrystallization using dichloromethane/heptane, thereby obtaining 6.85 g of Compound 3-38 in 60.5% yield.

Synthesis Example 32

Preparation of Compound 3-20

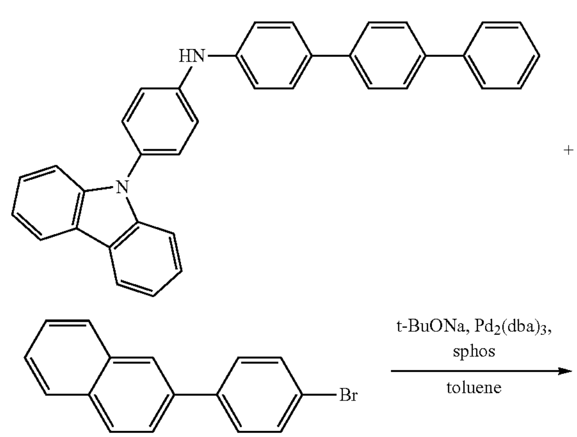

-continued

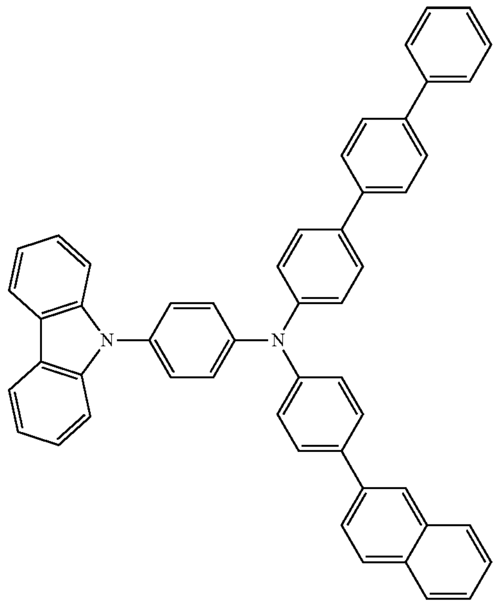

Compound 3-20 (6.07 g, 53.6% yield) was obtained in the same manner as the production of Compound 3-38 except for using 2-(4-bromophenyl)naphthalene (5.12 g, 18.08 mmol) instead of 1-(4-bromophenyl)naphthalene.

Synthesis Example 33

Preparation of Compound 3-29

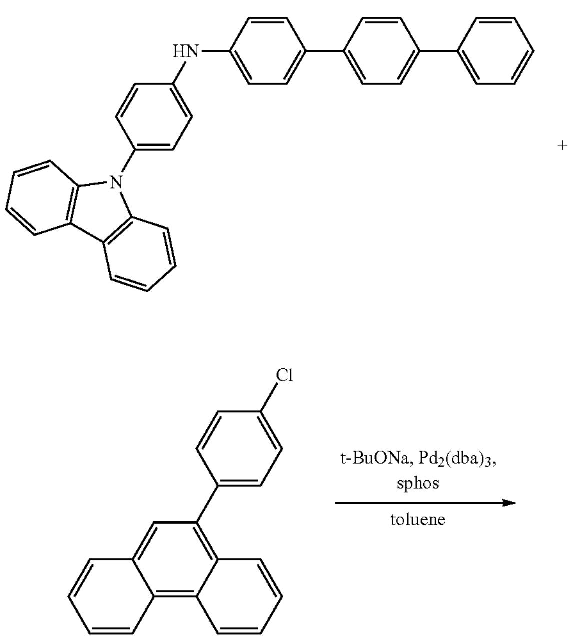

-continued

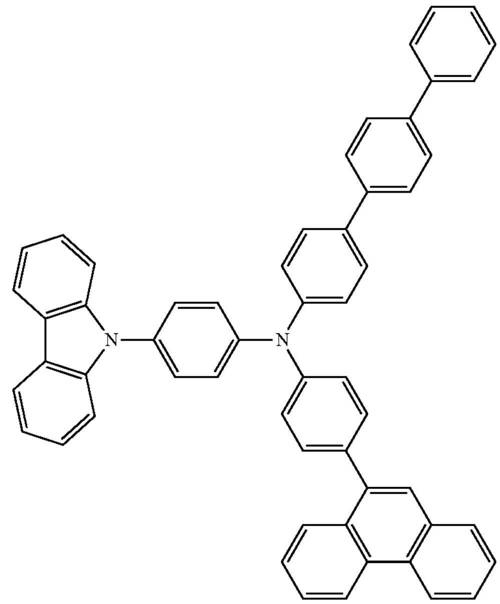

Compound 3-29 (6.37 g, yield 52.4%) was obtained via synthesizing and purifying in the same manner as the production of Compound 3-38, except for using 9-(4-chlorophenyl)phenanthrene (5.22 g, 18.08 mmol) instead of 1-(4-bromophenyl) naphthalene.

Synthesis Example 34

Preparation of Compound 3-369

1. Preparation of Compound 3-369-A

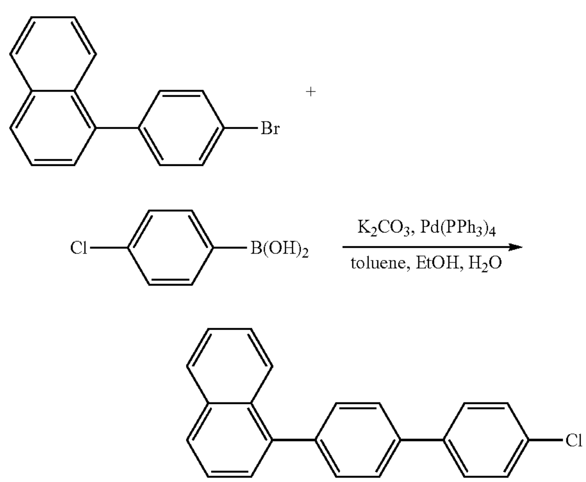

Compound 3-369-A (39.82 g, 81.3% yield) was obtained in the same manner as the production of Compound 3-197-B except for using 1-(4-bromophenyl)naphthalene (44.06 g, 155.6 mmol) instead of 9-bromophenanthrene.

2. Preparation of Compound 3-369

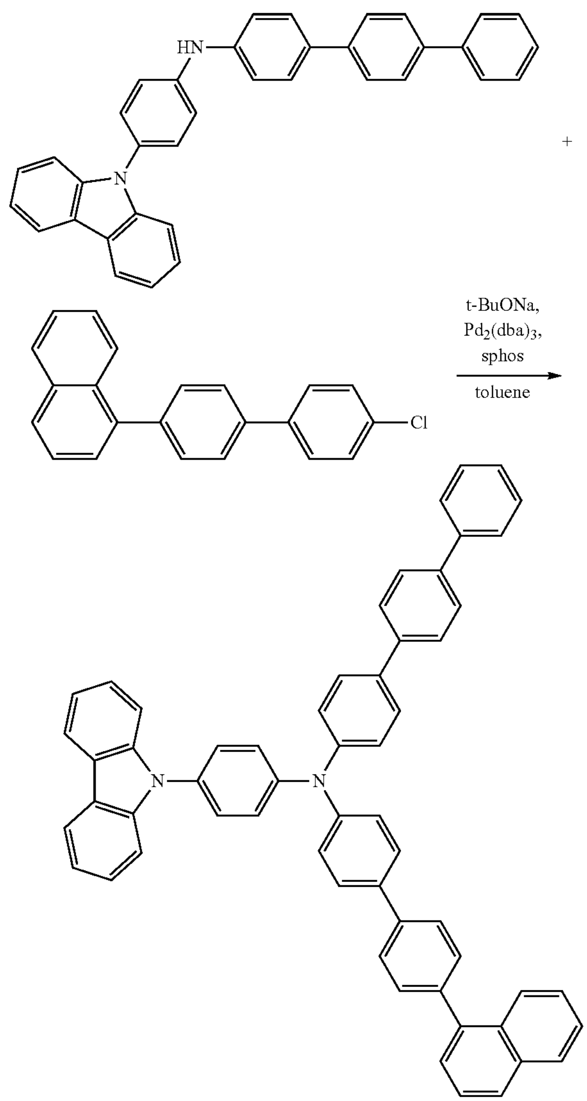

Compound 3-369 (6.79 g, 54.0% yield) was obtained via synthesis and purification in the same manner as obtaining of Compound 3-38 except for using 1-(4'-chloro-[1,1'-biphenyl]-4-yl)naphthalene (5.69 g, 18.08 mmol) instead of 1-(4-bromophenyl)naphthalene.

Synthesis Example 35

Preparation of Compound 3-370

1. Preparation of Compound 3-370-A

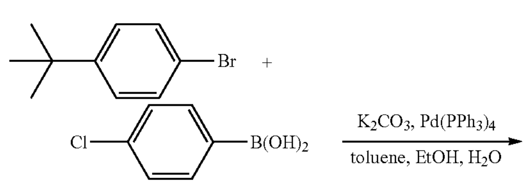

-continued

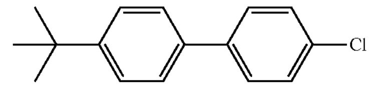

17.64 g of Compound 3-370-A was obtained in 76.8% yield via synthesis and purification in the same manner as obtaining of Compound 3-197-B except for using 1-bromo-4-(tert-butyl)benzene (20.0 g, 93.84 mmol) instead of 9-bromophenanthrene.

2. Preparation of Compound 3-370

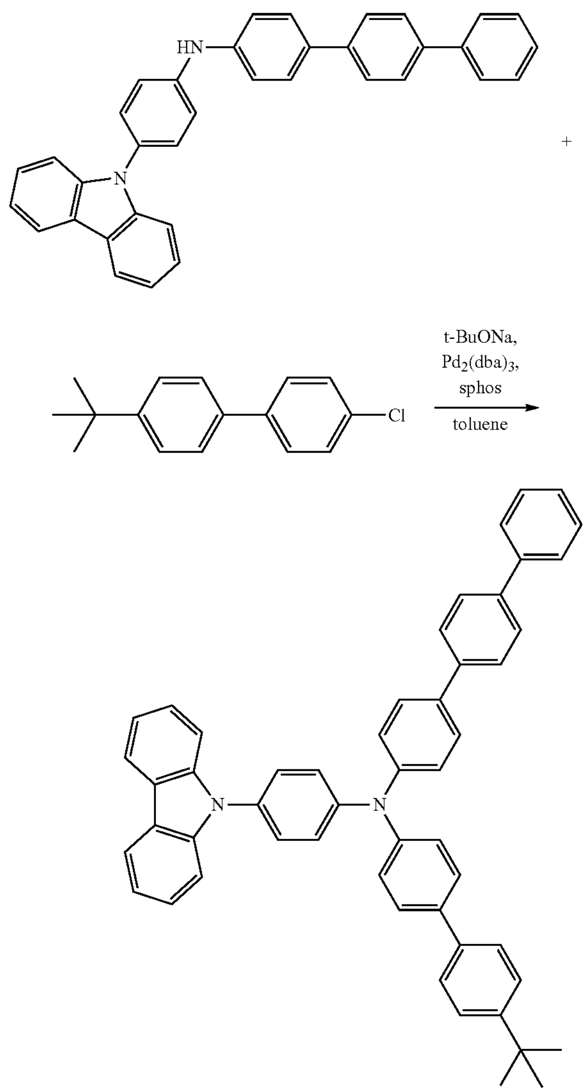

Compound 3-370 (5.65 g, 49.5% yield) was obtained via synthesis and purification in the same manner as obtaining of Compound 3-38 except for using 4-(tert-butyl)-4'-chloro-1,1'-biphenyl (4.43 g, 18.08 mmol) instead of 1-(4-bromophenyl) naphthalene.

Synthesis Example 36

Preparation of Compound 3-371

1. Preparation of Compound 3-371-A

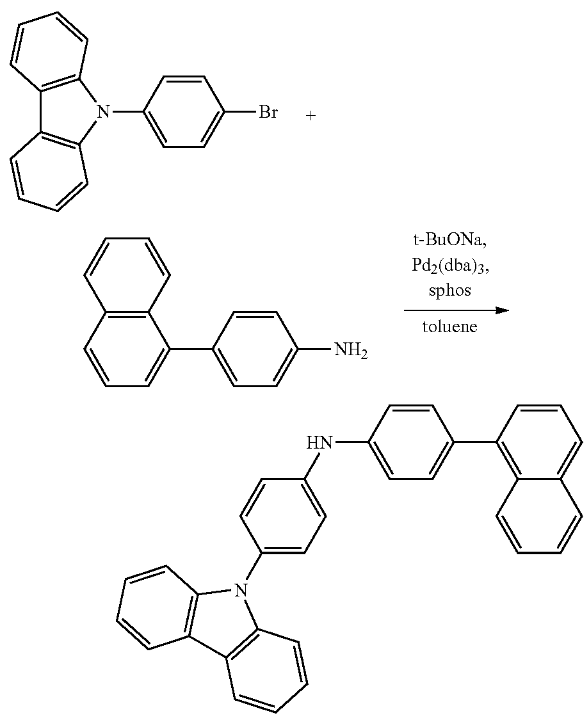

45.11 g of the Compound 3-371-A was obtained in a yield of 63.1% via synthesis and purification in the same manner as obtaining of Compound 3-38-A except for using 4-(naphthalen-1-yl)aniline (37.43 g, 170.7 mmol) instead of [1,1':4',1"-terphenyl]-4-amine.

2. Preparation of Compound 3-371

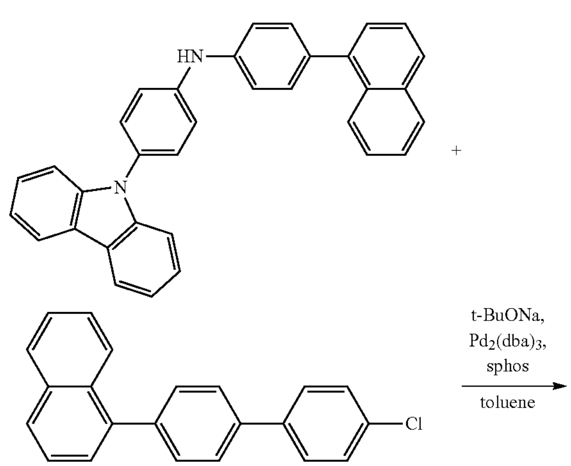

-continued

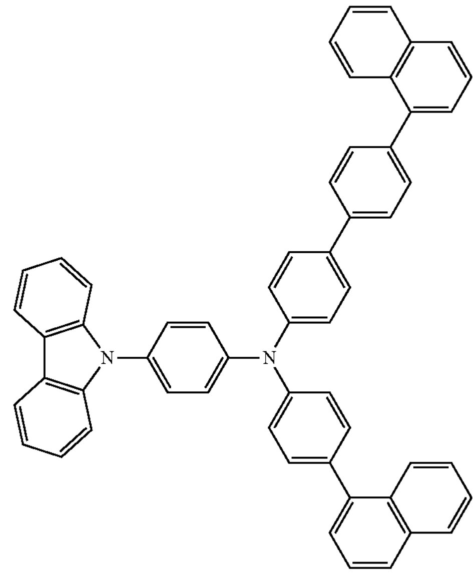

Compound 3-371 was obtained in an amount of 6.21 g and at 55.3% yield via synthesizing and purifying in the same manner as the production of Compound 3-38 except for using N-(4-(9H-carbazol-9-yl)phenyl)-4-(naphthalen-1-yl)aniline (7.0 g, 15.20 mmol) and 1-(4'-chloro-[1,1'-biphenyl]-4-yl)naphthalene (5.26 g, 16.72 mmol).

Synthesis Example 37

Preparation of Compound 3-372

1. Preparation of Compound 3-372-A

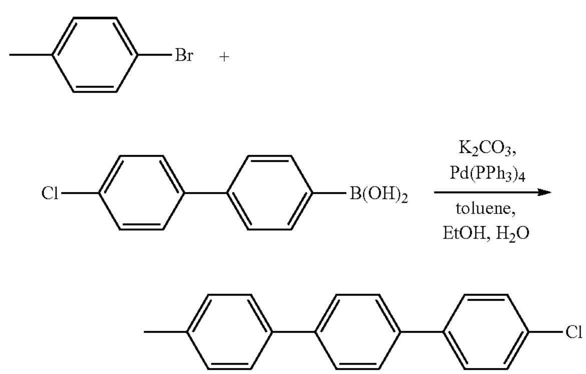

11.85 g of Compound 3-372-A was obtained in 72.7% yield via synthesizing and purifying in the same manner as the production of Compound 3-197-B except for using 1-bromo-4-methylbenzene (10.0 g, 58.47 mmol) and (4'-chloro-[1,1'-biphenyl]-4-yl)boronic acid (14.95 g, 64.31 mmol).

2. Preparation of Compound 3-372

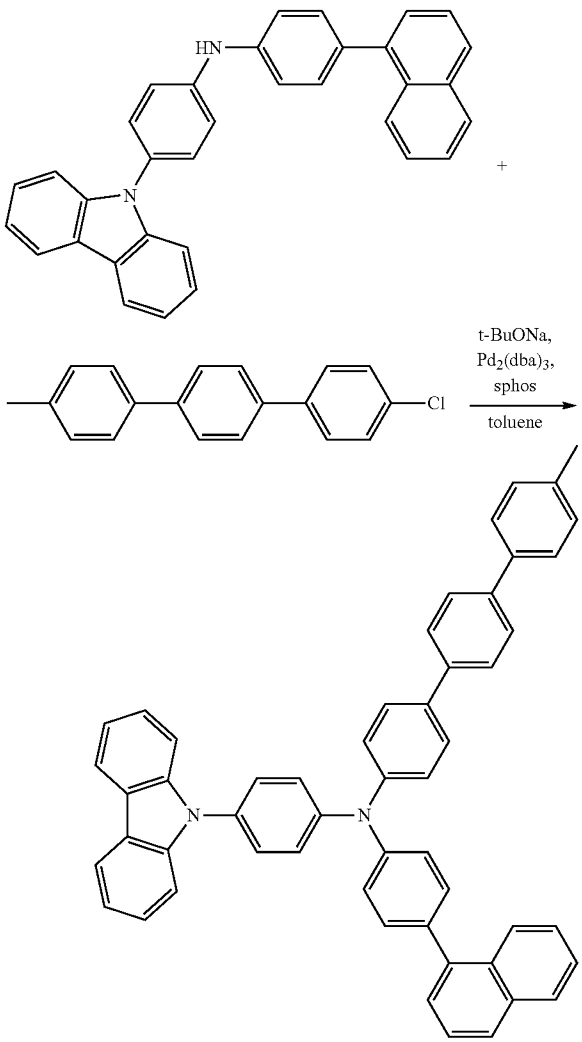

5.44 g of Compound 3-372 was obtained in 50.9% yield via synthesizing and purifying in the same manner as the production of Compound 3-38 except for using N-(4-(9H-carbazol-9-yl)phenyl)-4-(naphthalen-1-yl)aniline (7.0 g, 15.20 mmol) and 4-chloro-4"-methyl-1,1': 4',1"-terphenyl (4.66 g, 16.72 mmol).

Synthesis Example 38

Preparation of Compound 3-26

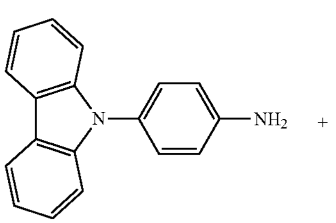

-continued

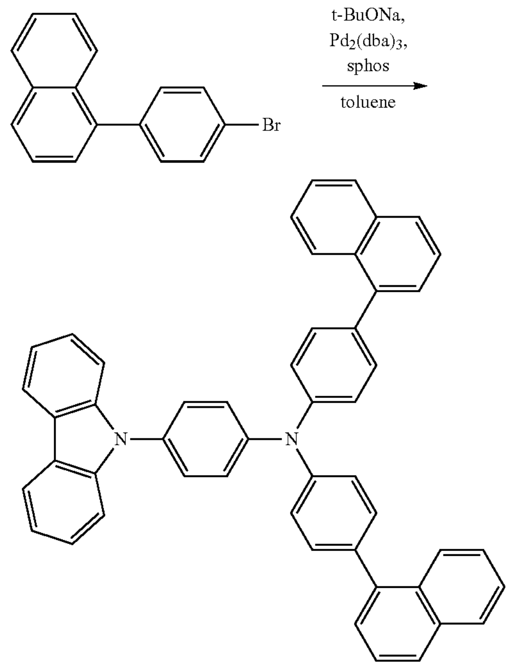

In a 250 mL flask under nitrogen stream, 4-(9H-carbazol-9-yl)aniline (5.0 g, 19.36 mmol), 1-(4-bromophenyl)naphthalene (12.06 g, 42.58 mmol), sodium tert butoxide (7.44 g, 77.42 mmol), tris(dibenzylideneacetone)dipalladium (0) (0.71 g, 0.77 mmol), 2-dicyclohexylphosphino-2',6'-dimethoxybiphenyl (0.64 g, 1.55 mmol) and 120 mL of toluene were mixed with each other and stirred under reflux. After completion of the reaction, the toluene layer was extracted using 80 mL of water. The extracted solution was treated with $MgSO_4$ to remove residual water, concentrated under reduced pressure, and purified using column chromatography. The resulting solid is subjected to recrystallization using dichloromethane/heptane, thereby obtaining 6.94 g of Compound 3-26 in 54.1% yield.

Synthesis Example 39

Preparation of Compound 3-41

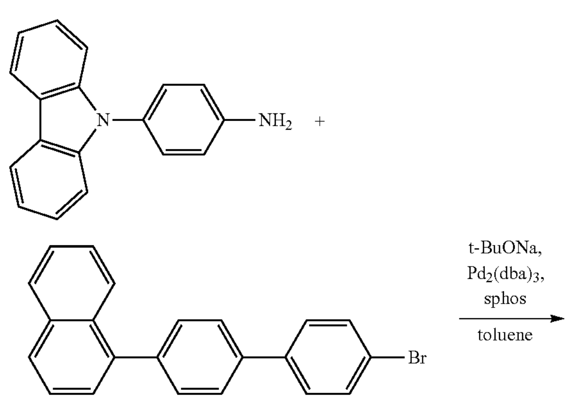

-continued

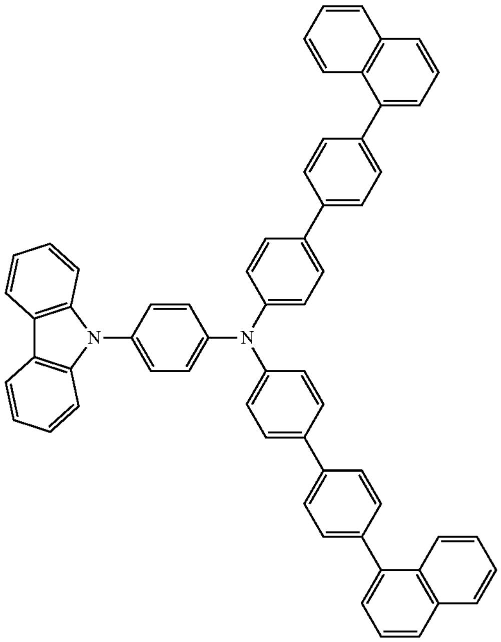

Compound 3-41 was obtained in an amount of 8.25 g and at 52.3% yield via synthesizing and purifying in the same manner as the production of Compound 3-26 except for using 1-(4'-chloro-[1,1'-biphenyl]-4-yl)naphthalene) (13.41 g, 42.58 mmol) instead of 1-(4-bromophenyl)naphthalene.

Synthesis Example 40

Preparation of Compound 3-373

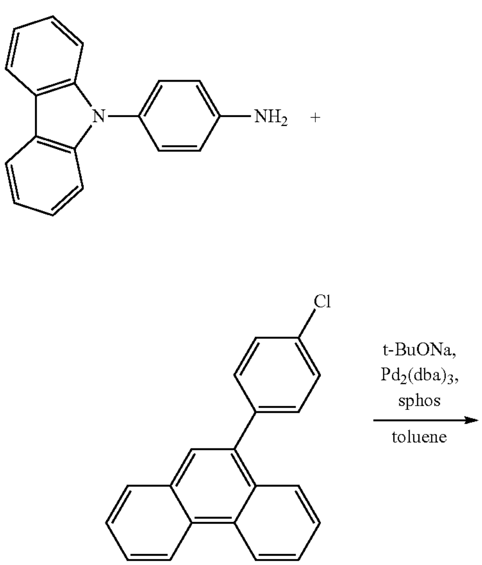

-continued

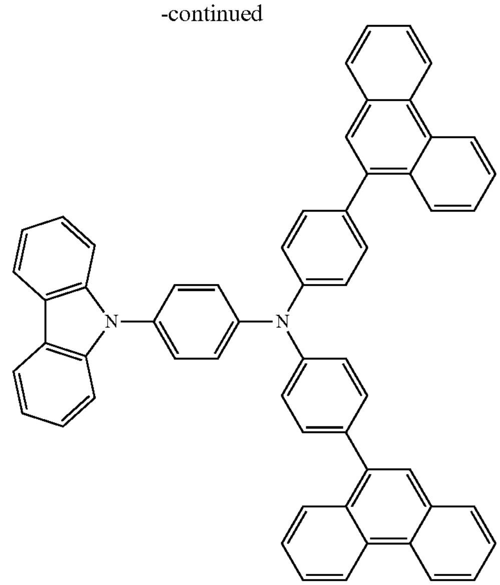

Compound 3-373 (8.08 g, 54.7% yield) was obtained in the same manner as in the production of Compound 3-26 except for using 9-(4-chlorophenyl)phenanthrene (12.30 g, 42.58 mmol) instead of 1-(4-bromophenyl)naphthalene.

Synthesis Example 41

Preparation of Compound 3-374

1. Preparation of Compound 3-374-A

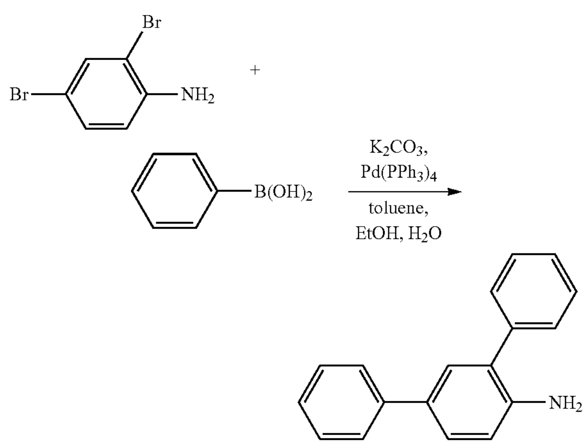

In a 1000 mL flask under nitrogen stream, 2,4-dibromoaniline (30.0 g, 119.6 mmol), phenylboronic acid (34.99 g, 286.9 mmol), potassium carbonate (66.10 g, 478.2 mmol), tetrakis(triphenylphosphine)palladium (0) (8.29 g, 4.67 mmol), toluene (300 mL), EtOH (100 mL) and $H_2O$ (100 mL) were mixed with each other and stirred under reflux. After completion of the reaction, the toluene layer was extracted using toluene and water. The extracted solution was treated with $MgSO_4$ to remove residual water, concentrated under reduced pressure, and purified using column chromatography, thereby obtaining 21.94 g of Compound 3-374-A at 74.8% yield.

2. Preparation of Compound 3-374-B

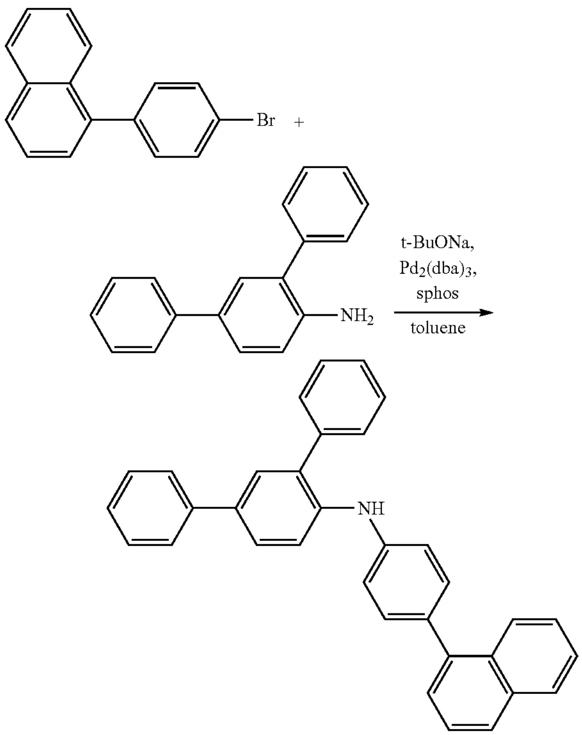

16.55 g of Compound 3-374-B was obtained in 69.8% yield via synthesizing and purifying in the same manner as the production of Compound 3-38-A except for using 1-(4-bromophenyl)naphthalene (15.0 g, 52.97 mmol) and [1,1': 3',1"-terphenyl]-4'-amine (14.30 g, 58.27 mmol).

3. Preparation of Compound 3-374

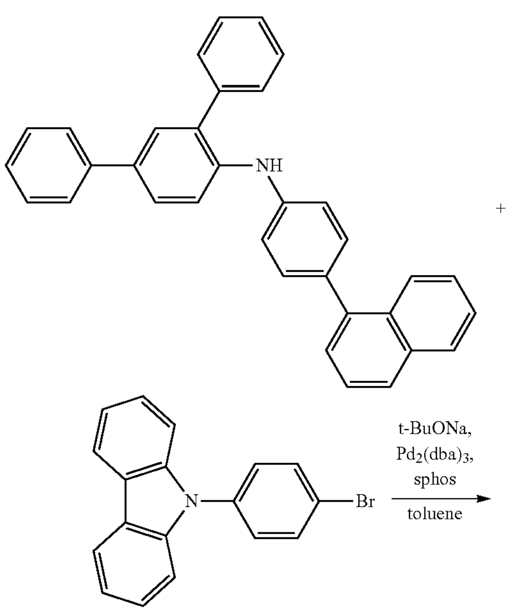

-continued

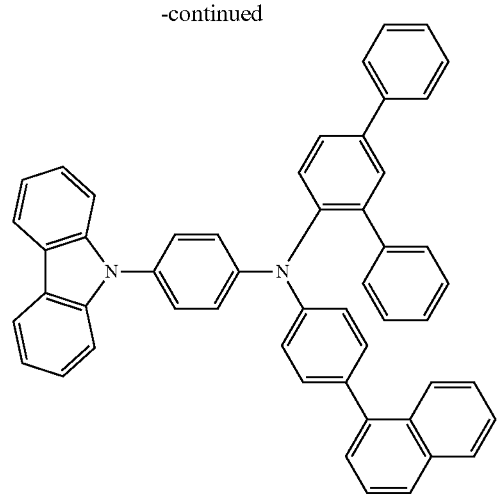

5.42 g of Compound 3-374 was obtained in a yield of 50.3% via synthesizing and purifying in the same manner as the production of Compound 3-38 except for using N-(4-(naphthalen-1-yl)phenyl)-[1,1': 3',1"-terphenyl]-4'-amine (7.0 g, 15.64 mmol) and 9-(4-bromophenyl)-9H-carbazole (5.54 g, 17.20 mmol).

Synthesis Example 42

Preparation of Compound 3-375

1. Preparation of Compound 3-375-A

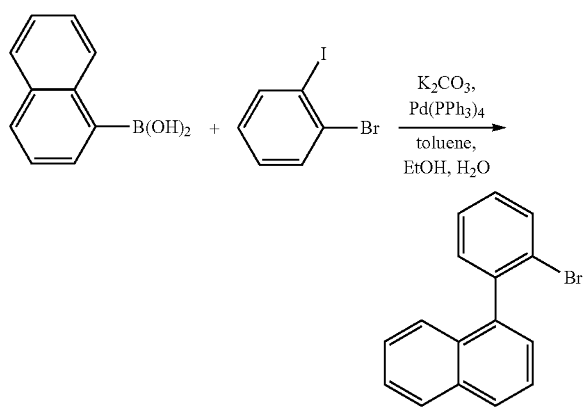

15.31 g of Compound 3-375-A was obtained in 62.0% yield via synthesizing and purifying in the same manner as production of the Compound 3-197-B except for using 1-naphthalene boronic acid (15.0 g, 87.21 mmol) and 1-bromo-2-iodobenzene (27.14 g, 95.94 mmol).

2. Preparation of Compound 3-375-B

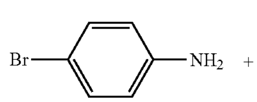

-continued

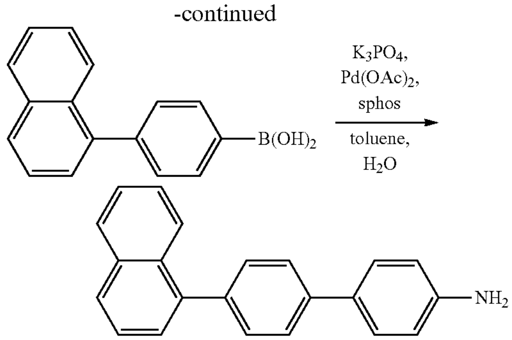

17.90 g of Compound 3-375-B was obtained in 69.5% yield via synthesizing and purifying in the same manner as the production of Compound 3-197-B except for using 4-bromoaniline (15.0 g, 87.19 mmol) and (4-(naphthalen-1-yl)phenyl)boronic acid (27.14 g, 95.91 mmol).

3. Preparation of Compound 3-375-C

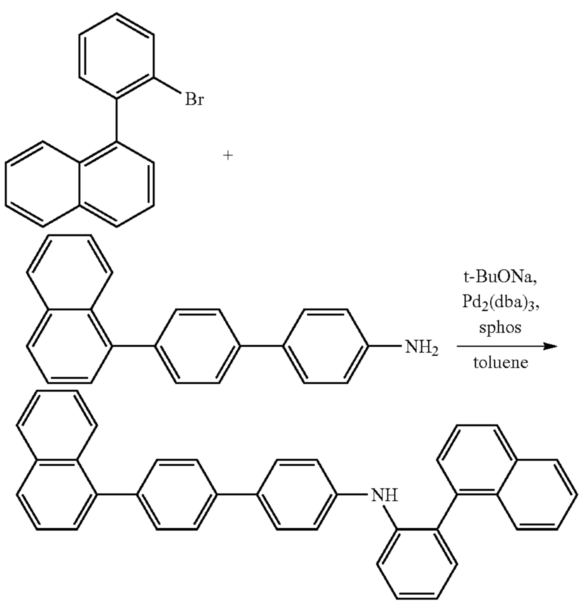

12.58 g of Compound 3-375-C was obtained in 71.6% yield via synthesizing and purifying in the same manner as the production of Compound 3-197-C except for using 1-(2-bromophenyl)naphthalene (10.0 g, 35.31 mmol) and 4'-(naphthalen-1-yl)-[1,1'-biphenyl]-4-amine (11.47 g, 38.85 mmol).

4. Preparation of Compound 3-375

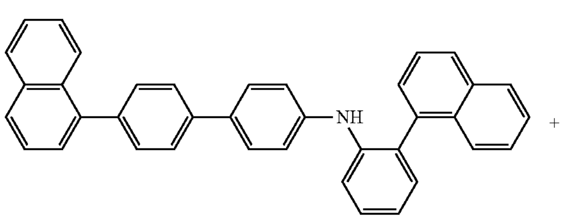

-continued

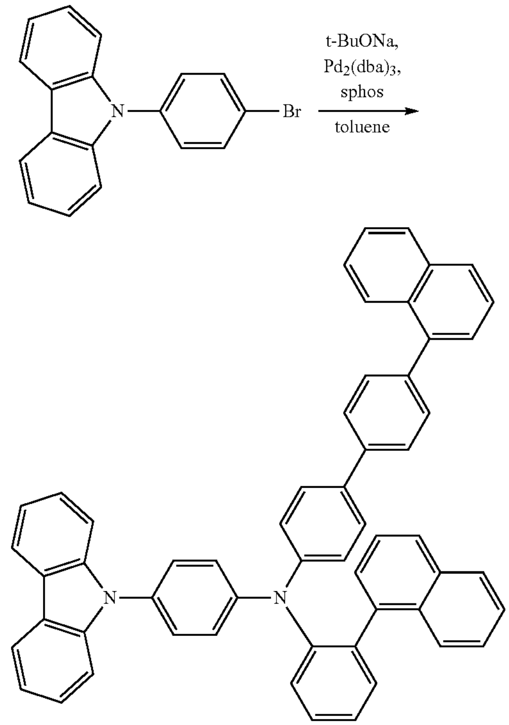

Compound 3-375 was obtained in an amount of 6.25 g and at 52.6% yield via synthesizing and purifying in the same manner as the production of Compound 3-38 except for 4'-(naphthalen-1-yl)-N-(2-(naphthalen-1-yl)phenyl)-[1,1'-biphenyl]-4-amine (8.0 g, 16.08 mmol) and 9-(4-bromophenyl)-9H-carbazole (5.70 g, 17.68 mmol).

Synthesis Example 43

Preparation of Compound 3-376

1. Preparation of Compound 3-376-A

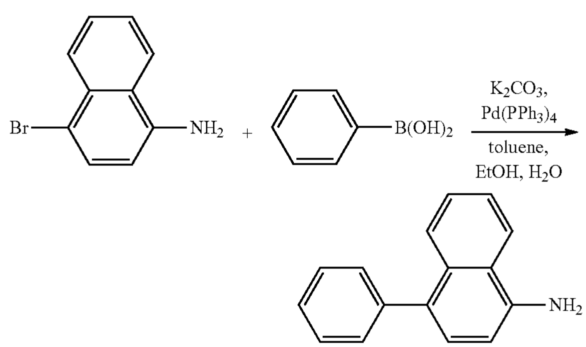

13.35 g of Compound 3-376-A was obtained in 67.6% yield via synthesizing and purifying in the same manner as the production of Compound 3-197-B except for using 4-bromonaphthalen-1-amine (20.0 g, 90.05 mmol) and phenylboronic acid (12.08 g, 99.06 mmol).

2. Preparation of Compound 3-376-B

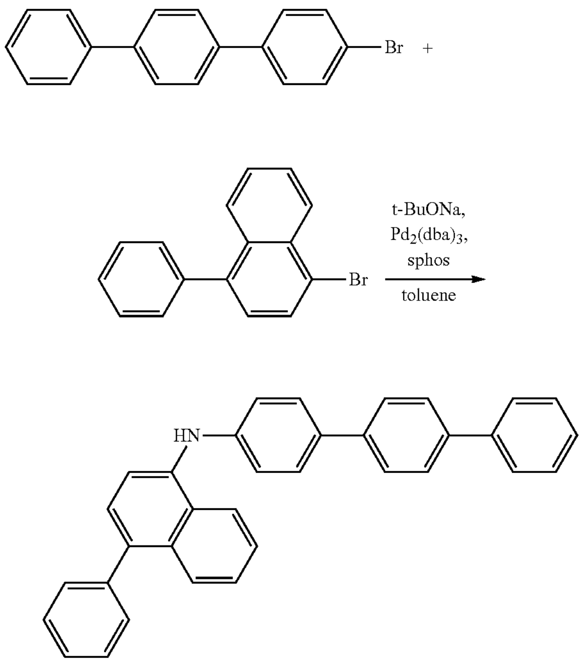

10.16 g of Compound 3-376-B was obtained in 70.2% yield via synthesizing and purifying in the same manner as the production of Compound 3-197-C except for using 4-bromo-1,1': 4',1"-terphenyl (10.0 g, 32.34 mmol) and 4-phenylnaphthalen-1-amine (7.80 g, 35.57 mmol).

3. Preparation of Compound 3-376

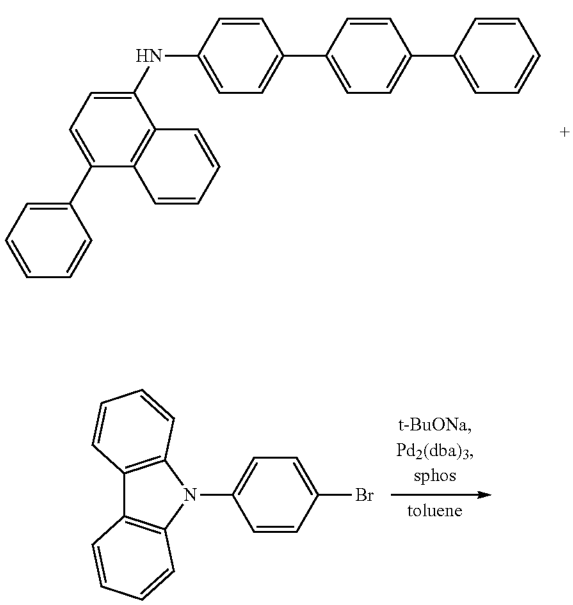

-continued

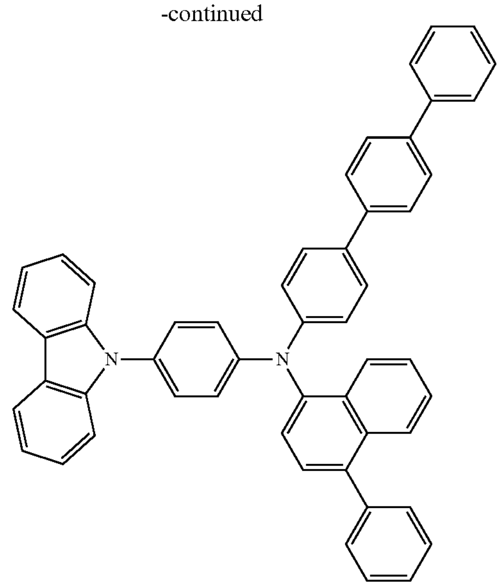

Compound 3-376 (6.01 g, 55.8% yield) was obtained via synthesis and purification in the same manner as the production of Compound 3-38 except that N-([1,1':4',1"-terphenyl]-4-yl)-4-phenyltaphthalen-1-amine (7.0 g, 15.64 mmol) and 9-(4-bromophenyl)-9H-carbazole (5.54 g, 17.20 mmol) were used.

Synthesis Example 44

Preparation of Compound 3-192

1. Preparation of Compound 3-192-A

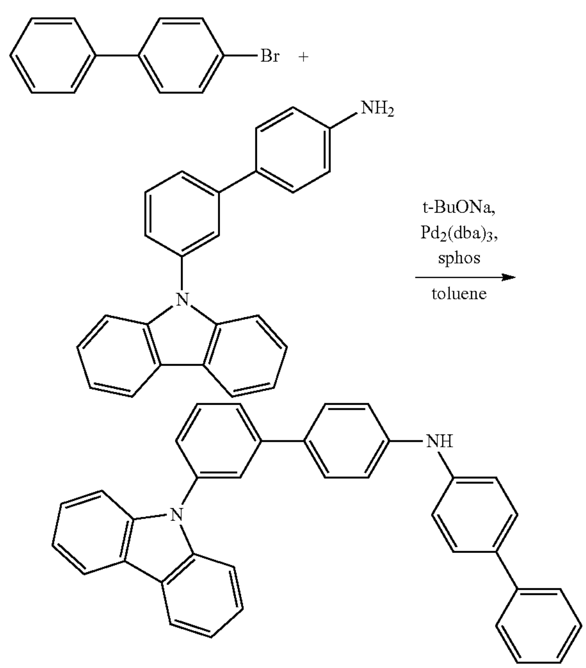

13.43 g of Compound 3-192-A was obtained in 64.4% yield via synthesis and purification in the same manner as the production of Compound 3-197-C except for using 4-bromo-1,1'-biphenyl (10.0 g, 42.90 mmol) instead of 9-(4-chlorophenyl)phenanthrene.

2. Preparation of Compound 3-192

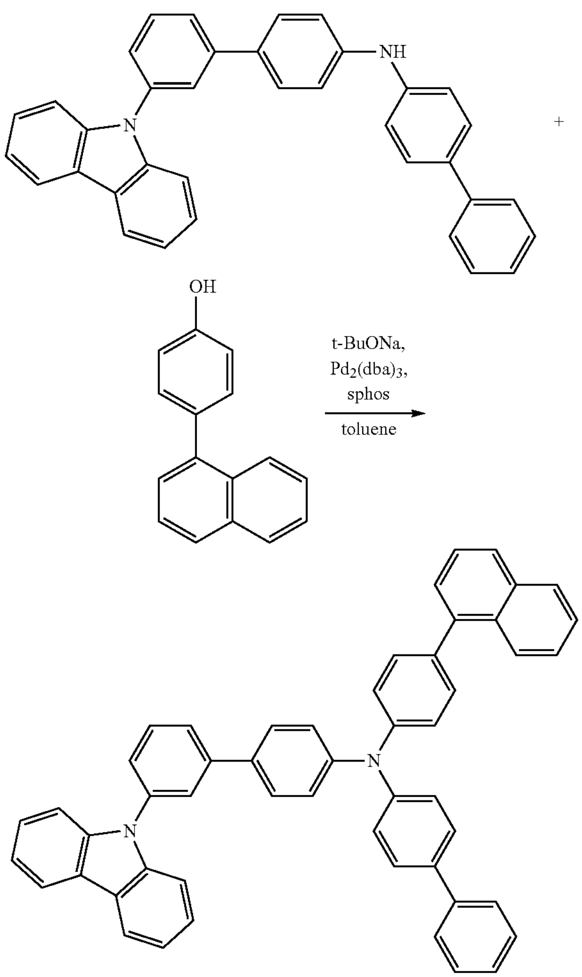

Compound 3-192 (5.61 g, 49.5% yield) was obtained via synthesis and purification in the same manner as the production of Compound 3-38 except for using N-([1,1'-biphenyl]-4-yl)-3'-(9H-carbazol-9-yl)-[1,1'-biphenyl]-4-amine (8.0 g, 16.44 mmol) and 1-(4-bromophenyl)naphthalene (5.12 g, 18.08 mmol).

Synthesis Example 45

Preparation of Compound 3-377

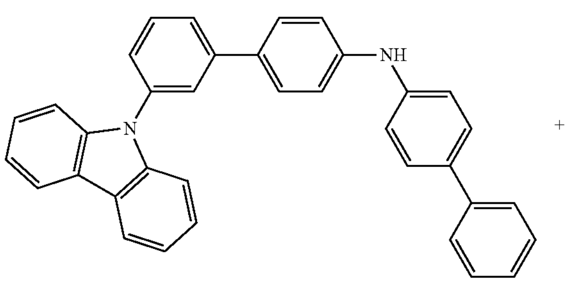

-continued

Compound 3-377 (6.14 g, 51.2% yield) was produced via synthesizing and purifying in the same manner as in the production of Compound 3-38 except that N-([1,1'-biphenyl]-4-yl)-3'-(9H-carbazol-9-yl)-[1,1'-biphenyl]-4-amine (8.0 g, 16.44 mmol) and 4-(4-bromophenyl)dibenzofuran (5.84 g, 18.08 mmol) were used.

Synthesis Example 46

Preparation of Compound 3-74

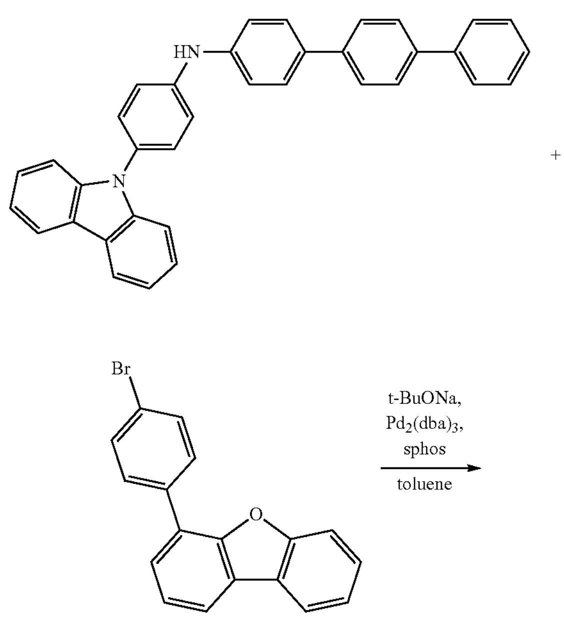

-continued

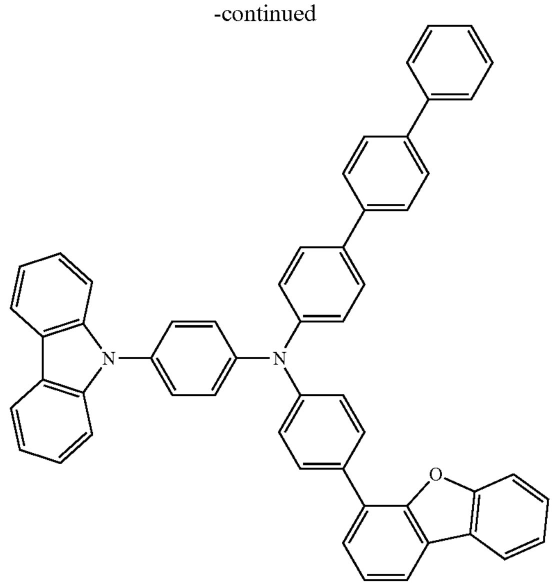

6.64 g of Compound 3-74 was obtained in 55.4% yield via synthesizing and purifying in the same manner as in the production of Compound 3-38 except for using 4-(4-bromophenyl)dibenzofuran (5.84 g, 18.08 mmol) instead of 1-(4-bromophenyl) naphthalene.

Synthesis Example 47

Preparation of the Compound 3-125

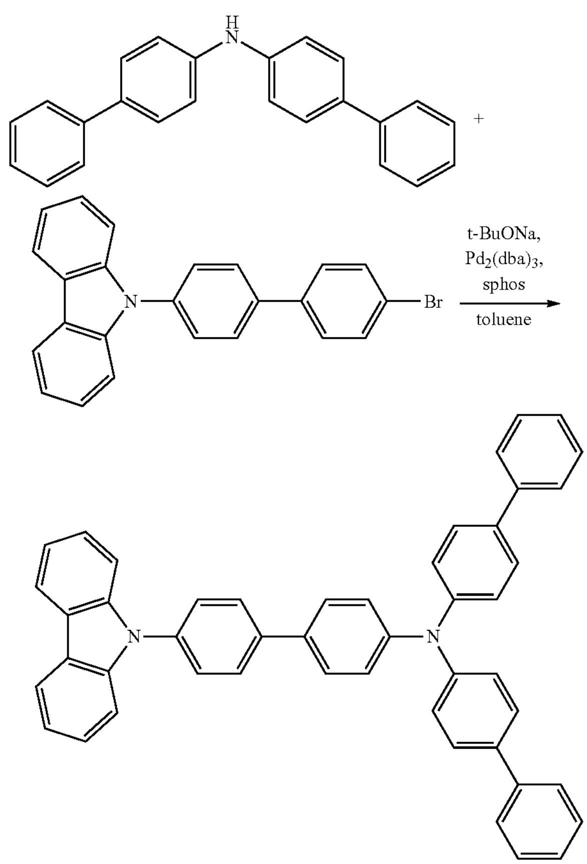

8.46 g of Compound 3-125 was obtained in 60.8% yield via synthesizing and purifying in the same manner as in the production of the Compound 3-38 except for using di([1,1'-biphenyl]-4-yl)amine (7.0 g, 21.78 mmol) and 9-(4'-bromo-[1,1'-biphenyl]-4-yl)-9H-carbazole (9.54 g, 23.96 mmol).

Synthesis Example 48

Preparation of Compound 3-126

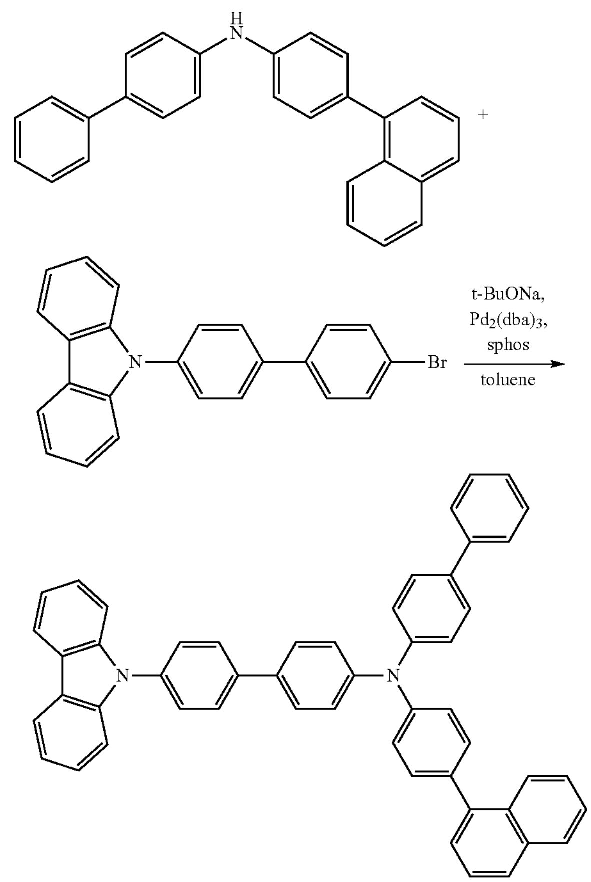

7.50 g of Compound 3-126 was obtained in 57.8% yield via synthesizing and purifying in the same manner as in the production of Compound 3-38 except for using N-(4-naphthalen-1-yl)phenyl)-[1,1'-biphenyl]-4-amine (7.0 g, 18.84 mmol) and 9-(4'-bromo-[1,1'-biphenyl]-4-yl)-9H-carbazole (8.26 g, 20.73 mmol).

Example 1

Organic Electroluminescent Device Preparation

An anode made of ITO was formed on a substrate on which a reflective layer is formed. The anode was subjected to a surface treatment with N2 plasma or UV-ozone. Then, HAT-CN was deposited to a thickness of 10 nm on the anode to form a hole injection layer (HIL). Then, N4,N4,N4',N4'-tetra([1,1'-biphenyl]-4-yl)-[1,1'-biphenyl]-4,4'-diamine was deposited to a thickness of 110 nm on the HIL layer to form a hole transport layer (HTL).

Vacuum depositing of Compound 1 to a thickness of 15 nm on the hole transport layer was executed to form a hole transport auxiliary layer. While depositing 25 nm of 9,10-bis(2-naphthyl)anthraces (ADN) capable of forming a blue EML (light emitting layer) on the hole transport auxiliary layer, about 3 wt % of N1,N1,N6,N6-tetrakis(4-(1-silyl) phenyl)pyrene-1,6-diamine as a dopant was doped thereto.

Anthracene derivative and LiQ were mixed with each other at a mass ratio of 1:1 to form a mixture which in turn was deposited to a thickness of 30 nm on the EML layer to form an electron transport layer (ETL). Then, LiQ was deposited to a thickness of 1 nm on the ETL layer to form an electron injection layer (EIL).

Thereafter, a mixture of magnesium (Mg) and silver (Ag) at a ratio 9:1 was deposited to a thickness of 15 nm on the EIL layer to form a cathode. N4, N4'-bis [4-[bis (3-methylphenyl) amino]phenyl]-N4,N4'-diphenyl-[1,1'-biphenyl]-4,4'-diamine (DNTPD) was deposited to a thickness of 60 nm on the cathode to form a capping layer.

Then, a seal cap containing a moisture absorbent was bonded to the capping layer via an UV-curable adhesive, thereby protecting an organic electroluminescent device from atmospheric 02 or moisture. In this way, the present organic electroluminescent device was prepared.

Examples 2 to 8

Preparation of Organic Electroluminescent Devices

Organic electroluminescent devices were prepared in the same manner as Example 1 except for using Compounds 7, 13, 31, 32, 66, 91 and 109 synthesized in respective Synthesis Examples 2 to 8 in the hole transport auxiliary layer instead of using Compound 1 in the hole transport auxiliary layer in Example 1.

Comparative Examples 1 to 5

Preparation of Organic Electroluminescent Devices

Organic electroluminescent devices were prepared in the same manner as Example 1 except for using the following Compound A to Compound E in the hole transport auxiliary layer instead of using Compound 1 in the hole transport auxiliary layer in Example 1.

Compound A

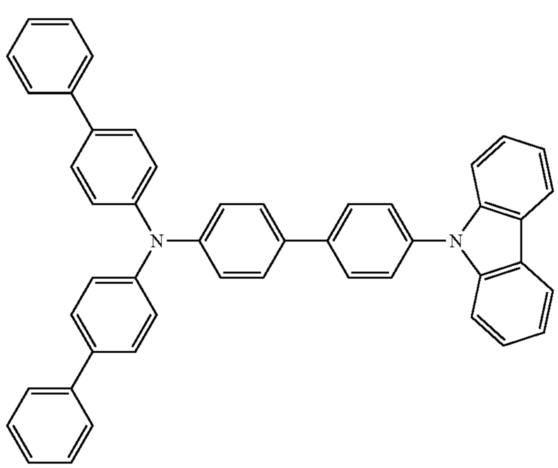

-continued

Compound B

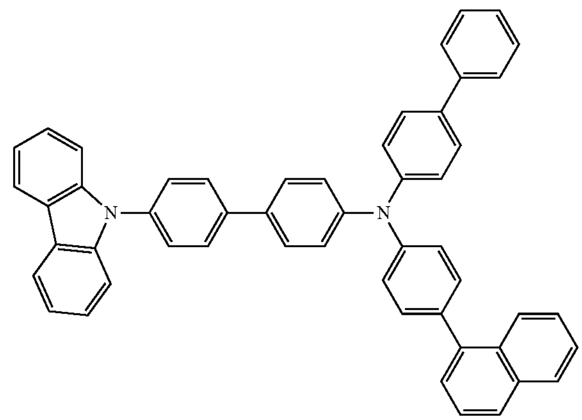

Compound C

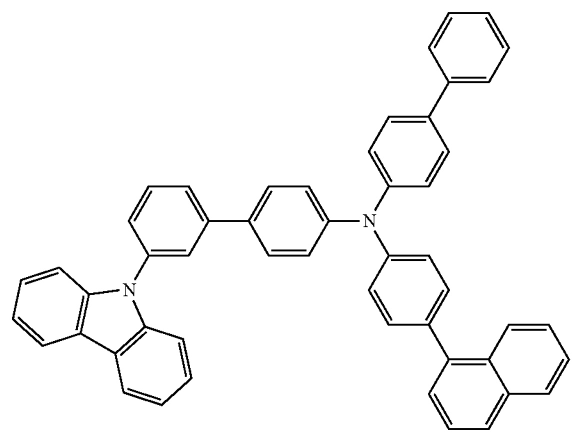

Compound D

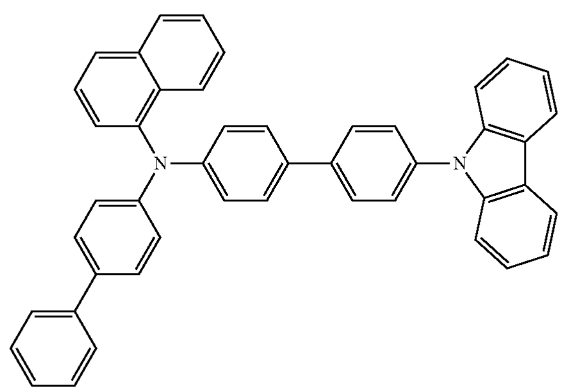

Compound E

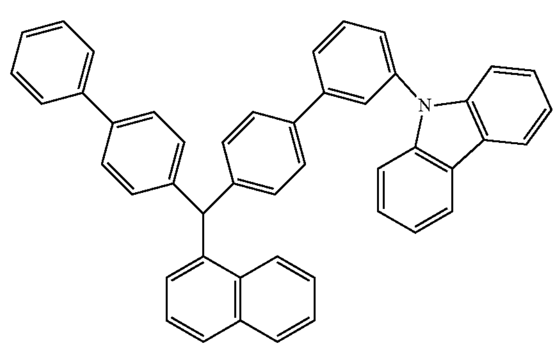

Example 9

Organic Electroluminescent Device Preparation

An anode made of ITO was formed on a substrate on which a reflective layer is formed. Then, the anode was subjected to surface treatment with N2 plasma or UV-ozone. HAT-CN was deposited on the anode to a thickness of 10 nm to form a hole injection layer (HIL). Subsequently, a hole transport layer (HTL) was formed on the HIL by depositing Compound 2-1 in accordance with the present disclosure on the HIL to a thickness of 110 nm.

Vacuum depositing of Compound 3-197 on the hole transport layer to a thickness of 15 nm was performed to form a hole transport auxiliary layer. While depositing 25 nm of 9,10-bis(2-naphthyl)anthraces (ADN) as a blue light emitting layer (EML) on the hole transport auxiliary layer, about 3 wt % of 2,5,8,11-tetra-butyl-perylene (t-Bu-Perylene) as a dopant was doped into the AND.

Then, an anthracene derivative and LiQ were mixed with each other at a mass ratio of 1:1 to form a mixture which in turn was deposited on the EML to a thickness of 30 nm to form an electron transport layer (ETL). Then, LiQ was deposited to a thickness of 1 nm on the ETL to form an electron injection layer (EIL). Thereafter, a mixture of magnesium and silver (Ag) in a mass ratio of 9:1 was deposited on the EIL to a thickness of 15 nm to form a cathode.

Then, N4,N4'-bis[4-[bis(3-methylphenyl)amino]phenyl]-N4,N4'-diphenyl-[1,1'-biphenyl]-4,4'-diamine (DNTPD) as a capping layer was deposited to a thickness of 60 nm on the cathode. Then, a seal cap containing a moisture absorbent was bonded onto the capping layer with a UV curable adhesive to protect the organic electroluminescent device from 02 or moisture in the atmosphere. In this way, the organic electroluminescent device was prepared.

Examples 10 to 35

Preparation of Organic Electroluminescent Devices

Organic electroluminescent devices were prepared in the same manner as in Example 9, except that the hole transport layer compounds and the hole transport auxiliary layer compounds as shown in Table 3 below were used.

TABLE 3

| | Hole transport layer | Hole transport auxiliary layer |
|---|---|---|
| Example 10 | 2-1 | 3-230 |
| Example 11 | 2-1 | 3-198 |
| Example 12 | 2-2 | 3-199 |
| Example 13 | 2-2 | 3-365 |
| Example 14 | 2-19 | 3-366 |
| Example 15 | 2-19 | 3-367 |
| Example 16 | 2-20 | 3-368 |
| Example 17 | 2-20 | 3-38 |
| Example 18 | 2-110 | 3-20 |
| Example 19 | 2-110 | 3-29 |
| Example 20 | 2-111 | 3-369 |
| Example 21 | 2-37 | 3-371 |
| Example 22 | 2-37 | 3-372 |
| Example 23 | 2-38 | 3-26 |
| Example 24 | 2-38 | 3-41 |
| Example 25 | 2-74 | 3-373 |
| Example 26 | 2-74 | 3-374 |
| Example 27 | 2-75 | 3-375 |
| Example 28 | 2-75 | 3-376 |
| Example 29 | 2-128 | 3-192 |
| Example 30 | 2-128 | 3-377 |
| Example 31 | 2-129 | 3-74 |
| Example 32 | 2-129 | 3-125 |
| Example 33 | 2-129 | 3-126 |
| Example 34 | 2-161 | 3-192 |
| Example 35 | 2-185 | 3-38 |

Comparative Examples 6 to 8

Preparation of Organic Electroluminescent Devices

Organic electroluminescent devices were prepared in the same manner as in Example 9, except that the hole transport layer compounds and the hole transport auxiliary layer compounds as shown in Table 4 below were used.

Compound F

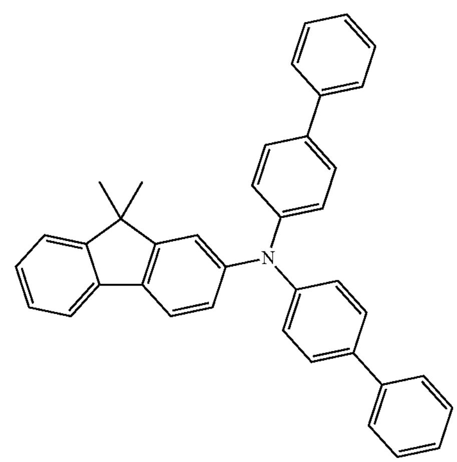

Compound G

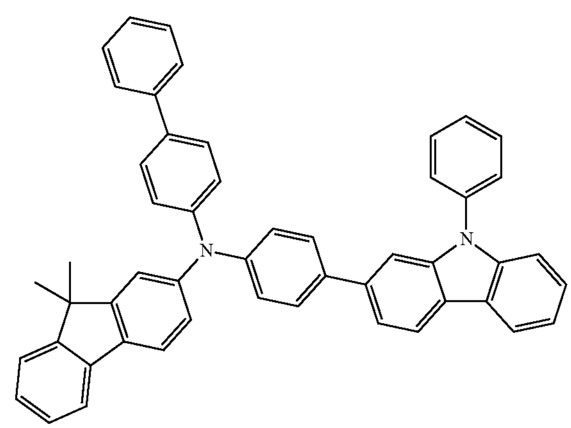

TABLE 4

| | Hole transport layer | Hole transport auxiliary layer |
|---|---|---|
| Comparative Example 6 | Compound F | Compound 3-197 |
| Comparative Example 7 | Compound G | Compound 3-125 |
| Comparative Example 8 | Compound 2-1 | NPB |

Experimental Example 1

Device Performance Analysis

Electric-optical characteristics of the organic electroluminescent devices prepared in Examples 1 to 8 and Comparative Examples 1 to 5 were analyzed under a constant current of 10 mA/cm$^2$. Lifetimes thereof were measured under a driving condition of 20 mA/cm$^2$. The results are shown in Table 5 below.

As shown in Table 5, it can be seen that the organic electroluminescent devices including compounds of Examples 1 to 8 have lowered driving voltages and improved efficiencies and lifespans, compared to the organic electroluminescent devices including compounds of Comparative Examples 1 to 5.

TABLE 5

| Examples | Hole transport auxiliary layer | V | Cd/A | lm/VV | CIEx | CIEy | T95 (hrs) |
|---|---|---|---|---|---|---|---|
| Example 1 | Compound 1 | 3.97 | 6.5 | 5.1 | 0.141 | 0.047 | 300 |
| Example 2 | Compound 7 | 3.93 | 6 | 4.8 | 0.139 | 0.051 | 320 |
| Example 3 | Compound 13 | 3.94 | 6.6 | 5.3 | 0.138 | 0.05 | 315 |
| Example 4 | Compound 31 | 4.12 | 6.2 | 4.7 | 0.139 | 0.052 | 310 |
| Example 5 | Compound 32 | 3.9 | 6 | 4.8 | 0.139 | 0.051 | 280 |
| Example 6 | Compound 66 | 3.92 | 5.8 | 4.6 | 0.14 | 0.045 | 240 |
| Example 7 | Compound 91 | 3.9 | 5.6 | 4.5 | 0.141 | 0.044 | 290 |
| Example 8 | Compound 109 | 3.99 | 5.9 | 4.6 | 0.144 | 0.042 | 210 |
| Comparative Example 1 | Compound A | 3.99 | 5.9 | 4.6 | 0.144 | 0.044 | 120 |
| Comparative Example 2 | Compound B | 3.9 | 5.8 | 4.7 | 0.141 | 0.049 | 135 |
| Comparative Example 3 | Compound C | 4.1 | 6.0 | 4.6 | 0.142 | 0.046 | 150 |
| Comparative Example 4 | Compound D | 3.99 | 5.9 | 4.6 | 0.139 | 0.051 | 115 |
| Comparative Example 5 | Compound E | 4.11 | 5.6 | 4.3 | 0.142 | 0.047 | 120 |

Experimental Example 2

Device Performance Analysis

Electric-optical characteristics of the organic electroluminescent devices prepared in Examples 9 to 35 and Comparative Examples 6 to 8 were analyzed under a constant current of 10 mA/cm$^2$. Lifetimes thereof were measured under a driving condition of 20 mA/cm$^2$. The results are shown in Table 6 below.

TABLE 6

| Examples | Hole transport layer | Hole transport auxiliary layer | V | Cd/A | lm/W | CIEx | CIEy | T95 (hrs) |
|---|---|---|---|---|---|---|---|---|
| Example 9 | Compound 2-1 | Compound 3-197 | 4.00 | 5.8 | 4.6 | 0.14 | 0.049 | 215 |
| Example 10 | Compound 2-1 | Compound 3-230 | 3.80 | 6 | 5.0 | 0.139 | 0.048 | 170 |
| Example 11 | Compound 2-1 | Compound 3-198 | 4.12 | 6.2 | 4.7 | 0.139 | 0.052 | 190 |
| Example 12 | Compound 2-2 | Compound 3-199 | 3.90 | 6.2 | 5.0 | 0.14 | 0.049 | 180 |
| Example 13 | Compound 2-2 | Compound 3-365 | 4.20 | 6.2 | 4.6 | 0.141 | 0.049 | 185 |
| Example 14 | Compound 2-19 | Compound 3-366 | 4.02 | 5.7 | 4.5 | 0.141 | 0.047 | 205 |
| Example 15 | Compound 2-19 | Compound 3-367 | 3.90 | 6 | 4.8 | 0.139 | 0.051 | 260 |
| Example 16 | Compound 2-20 | Compound 3-368 | 3.81 | 6.5 | 5.4 | 0.14 | 0.05 | 195 |
| Example 17 | Compound 2-20 | Compound 3-38 | 3.93 | 6 | 4.8 | 0.139 | 0.052 | 190 |
| Example 18 | Compound 2-110 | Compound 3-20 | 3.85 | 6 | 4.9 | 0.139 | 0.048 | 197 |
| Example 19 | Compound 2-110 | Compound 3-29 | 3.94 | 5.9 | 4.7 | 0.138 | 0.05 | 220 |
| Example 20 | Compound 2-111 | Compound 3-369 | 3.86 | 6 | 4.9 | 0.143 | 0.041 | 160 |
| Example 21 | Compound 2-37 | Compound 3-371 | 3.93 | 6.3 | 5.0 | 0.142 | 0.045 | 185 |

TABLE 6-continued

| Examples | Hole transport layer | Hole transport auxiliary layer | V | Cd/A | lm/W | CIEx | CIEy | T95 (hrs) |
|---|---|---|---|---|---|---|---|---|
| Example 22 | Compound 2-37 | Compound 3-372 | 3.87 | 5.1 | 4.1 | 0.141 | 0.047 | 170 |
| Example 23 | Compound 2-38 | Compound 3-26 | 3.86 | 6 | 4.9 | 0.143 | 0.041 | 185 |
| Example 24 | Compound 2-38 | Compound 3-41 | 3.88 | 5.9 | 4.8 | 0.143 | 0.041 | 170 |
| Example 25 | Compound 2-74 | Compound 3-373 | 3.89 | 6.2 | 5.0 | 0.14 | 0.046 | 180 |
| Example 26 | Compound 2-74 | Compound 3-374 | 3.96 | 6 | 4.8 | 0.141 | 0.044 | 160 |
| Example 27 | Compound 2-75 | Compound 3-375 | 3.85 | 5.9 | 4.8 | 0.141 | 0.047 | 165 |
| Example 28 | Compound 2-75 | Compound 3-376 | 3.81 | 5 | 4.1 | 0.141 | 0.047 | 160 |
| Example 29 | Compound 2-128 | Compound 3-192 | 3.78 | 5.8 | 4.8 | 0.142 | 0.047 | 185 |
| Example 30 | Compound 2-128 | Compound 3-377 | 3.75 | 5.8 | 4.9 | 0.14 | 0.049 | 180 |
| Example 31 | Compound 2-129 | Compound 3-74 | 3.94 | 6.2 | 4.9 | 0.139 | 0.052 | 260 |
| Example 32 | Compound 2-129 | Compound 3-230 | 3.88 | 6.1 | 4.9 | 0.139 | 0.052 | 240 |
| Example 33 | Compound 2-129 | Compound 3-126 | 3.85 | 6.3 | 5.1 | 0.14 | 0.05 | 220 |
| Example 34 | Compound 2-161 | Compound 3-192 | 3.80 | 6 | 5.0 | 0.142 | 0.05 | 230 |
| Example 35 | Compound 2-185 | Compound 3-38 | 3.97 | 6.5 | 5.1 | 0.141 | 0.047 | 210 |
| Comparative Example 6 | compound F | Compound 3-197 | 4.11 | 5.1 | 3.9 | 0.143 | 0.043 | 110 |
| Comparative Example 7 | compound G | Compound 3-125 | 3.99 | 5.2 | 4.1 | 0.144 | 0.044 | 105 |
| Comparative Example 8 | Compound 2-1 | NPB | 4.00 | 5 | 3.9 | 0.139 | 0.05 | 90 |

According to the results of Table 6, it can be seen that when a compound of Chemical Formula 2 in accordance with the present disclosure is used in the HTL layer, and a compound of the Chemical Formula 3 is used in the hole transport auxiliary layer, the luminous efficiency and lifespan of the organic electroluminescent device can be improved comparing to the devices when both are not used at the same time.

In conclusion, using the combination of a compound of Chemical Formula 2 and a compound of Chemical Formula 3 in respective hole transport layer and electron blocking layer may realize an organic electroluminescent device having a low driving voltage, and high luminous efficiency and power efficiency.

As described above, the present disclosure is described with reference to the drawings. However, the present disclosure is not limited by the embodiments and drawings disclosed in the present specification. It will be apparent that various modifications may be made thereto by those skilled in the art within the scope of the present disclosure. Furthermore, although the effect resulting from the features of the present disclosure has not been explicitly described in the description of the embodiments of the present disclosure, it is obvious that a predictable effect resulting from the features of the present disclosure should be recognized.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic electroluminescent device, comprising:

an anode;

a cathode; and at least one organic layer between the anode and the cathode, the at least one organic layer including:

a light emitting layer; and an organic layer disposed between the anode and the light emitting layer and including a compound represented by the following Chemical Formula 1:

Chemical Formula 1

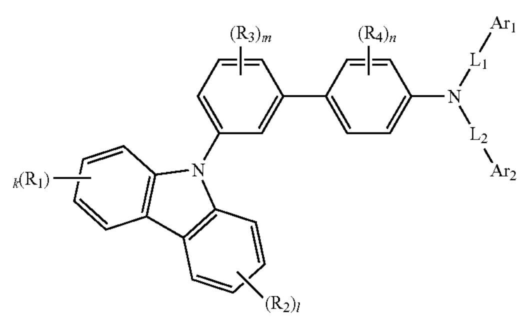

wherein:

each of $L_1$ and $L_2$ is independently selected from the group consisting of a substituted or unsubstituted C6 to C30 arylene group, a substituted or unsubstituted C3 to C30 heteroarylene group, a substituted or unsubstituted C1 to C20 alkylene group, a substituted or unsubstituted C3 to C20 cycloalkylene group, a substituted or unsubstituted C1 to C20 alkenylene group, a substituted or unsubstituted C3 to C20 cycloalkenylene group, a substituted or unsubstituted C1 to C20 heteroalkylene group, a substituted or unsubstituted C3 to C20 heterocycloalkylene group, a substituted or unsubstituted C1 to C20 heteroalkenylene group, and a substituted or unsubstituted C3 to C20 heterocycloalkenylene group, $Ar_1$ has one of the following structures:

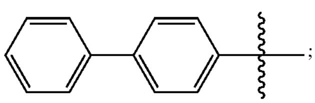
;
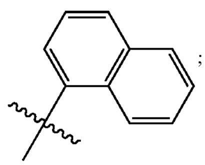
;
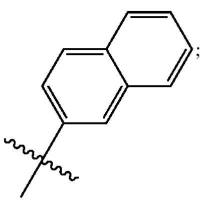
;
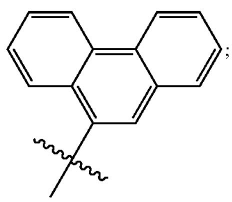
;
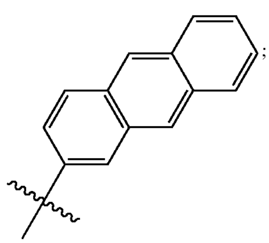
;
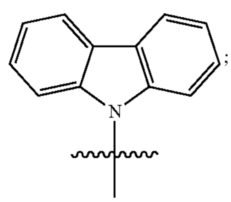
;
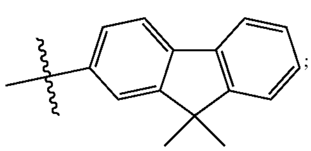
;
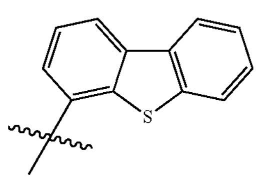
or
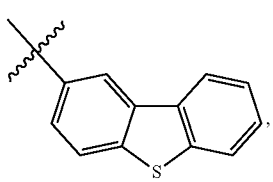
, $Ar_2$ is a substituted or unsubstituted C8 to C30 condensed polycyclic aryl group, wherein the C8 to C30 condensed polycyclic aryl group does not include any heteroatom, and wherein $Ar_2$ is different than $Ar_1$, each of $R_1$, $R_2$, $R_3$ and $R_4$ is independently selected from the group consisting of hydrogen, deuterium, a substituted or unsubstituted C1 to C20 alkyl group, a unsubstituted C3 to C30 cycloalkyl group, a substituted or unsubstituted C1 to C20 alkenyl group, a substituted or unsubstituted C1 to C20 alkynyl group, a substituted or unsubstituted C1 to C20 heteroalkyl group, a substituted or unsubstituted C3 to C20 aralkyl group, a substituted or unsubstituted C6 to C30 aryl group, a substituted or unsubstituted C3 to C30 heteroaryl group, and a substituted or unsubstituted C3 to C20 heteroaralkyl group, and each of k, l, m, and n is independently an integer of 0 to 4.

2. The organic electroluminescent device of claim 1, wherein each of $L_1$ and $L_2$ includes substituted or unsubstituted phenylene.

3. The organic electroluminescent device of claim 1, wherein $Ar_2$ is an unsubstituted naphthyl group when $Ar_1$ is not an unsubstituted naphthyl group.

4. The organic electroluminescent device of claim 1, wherein the organic layer disposed between the anode and the light emitting layer includes a hole transport auxiliary layer.

5. The organic electroluminescent device of claim 4, wherein the at least one organic layer between the anode and the cathode further includes at least one layer selected from the group consisting of a hole injection layer, a hole transport layer, an electron transport auxiliary layer, an electron transport layer and an electron injection layer.

6. The organic electroluminescent device of claim 1, wherein the compound of Chemical Formula 1 has one of the following structures:

1

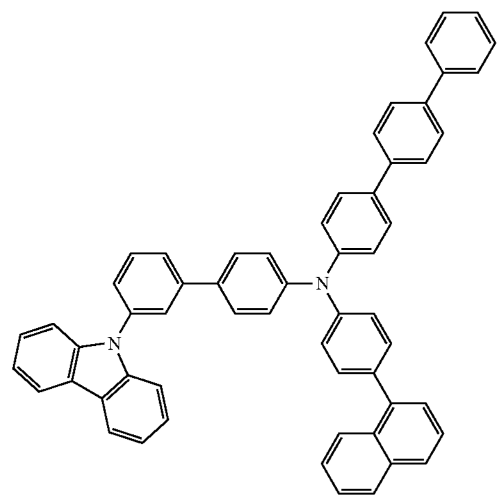
;

-continued
2
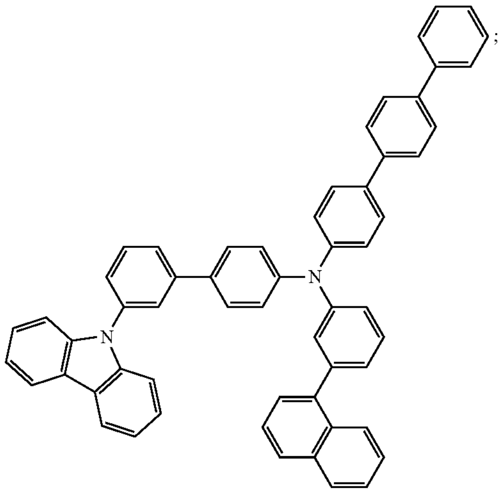
3
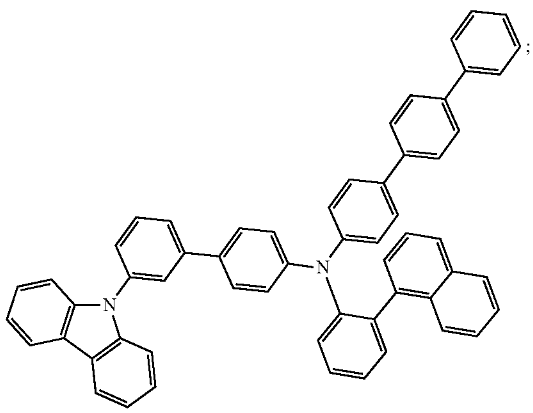
4
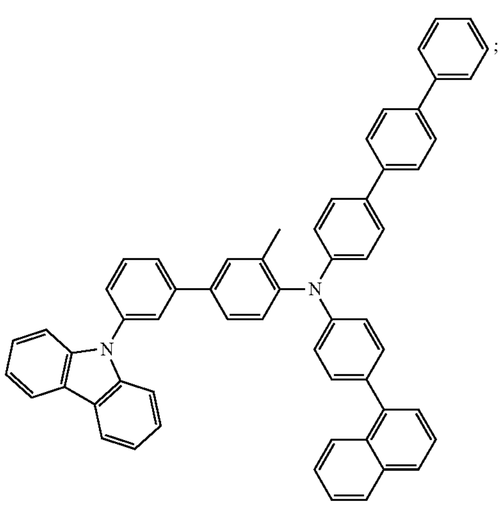
-continued
5
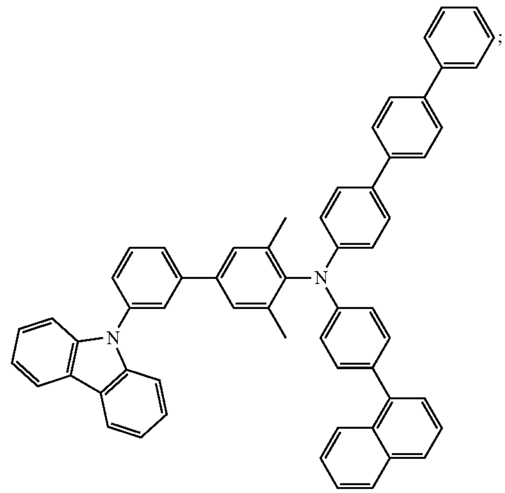
6
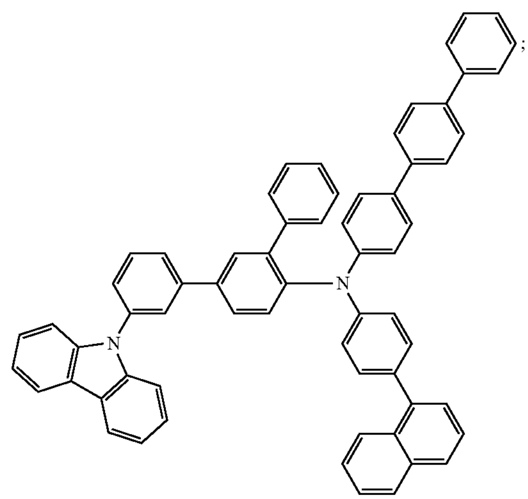
13
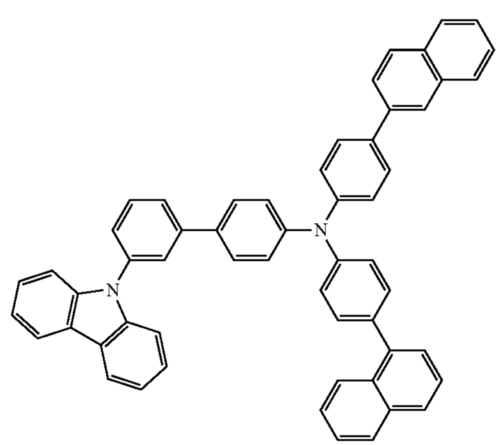

-continued
14
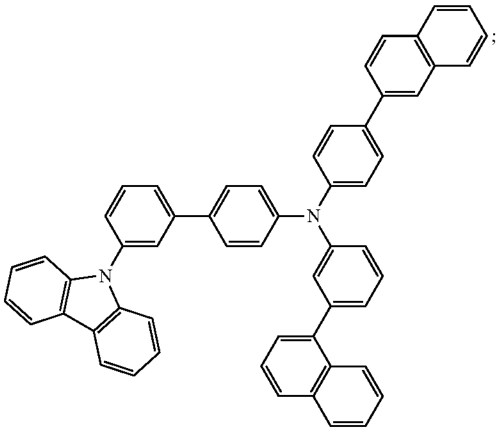
15
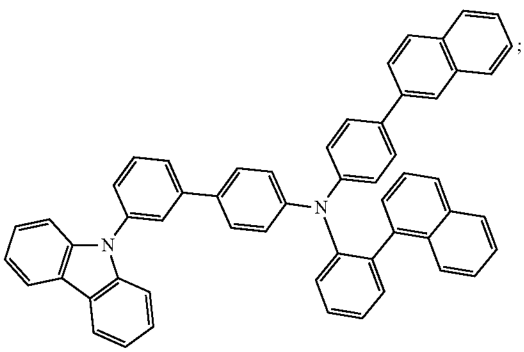
16
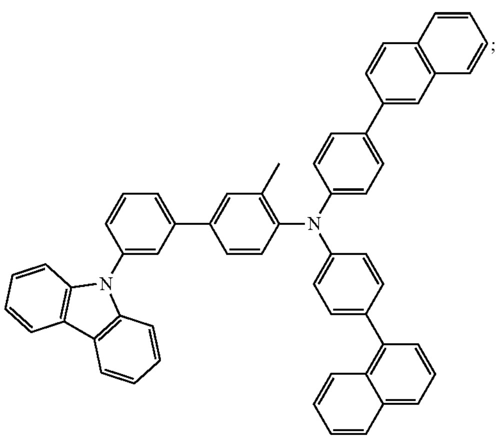
17
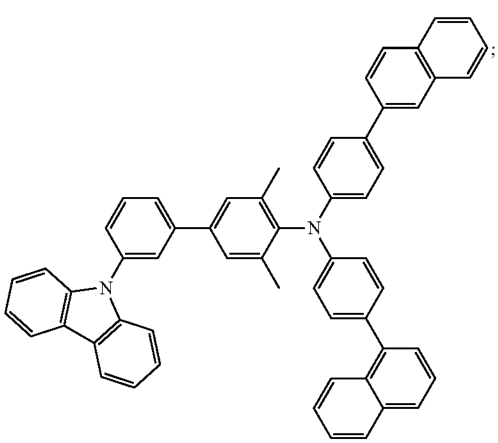
-continued
18
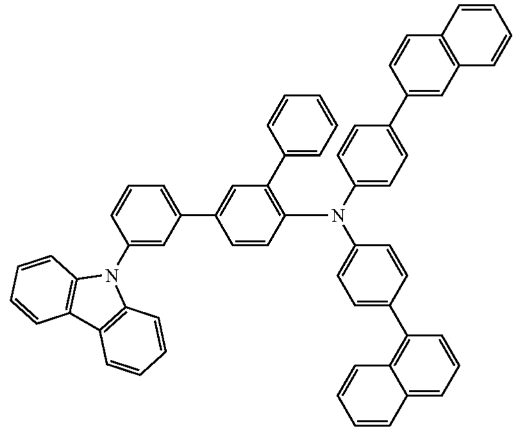
25
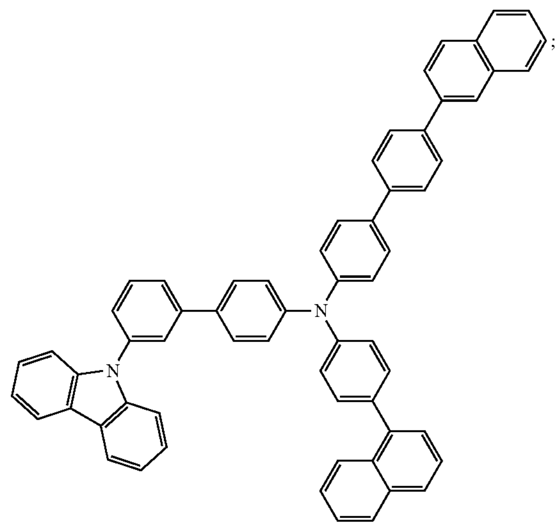
26
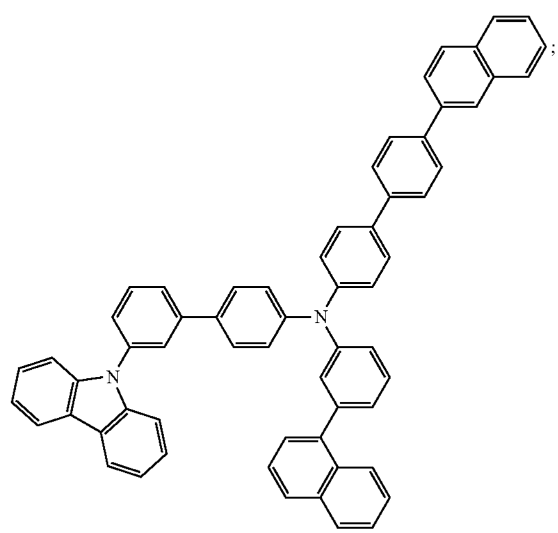

-continued
27
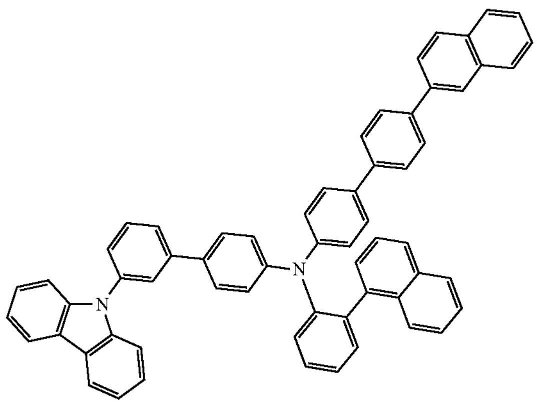
;
28
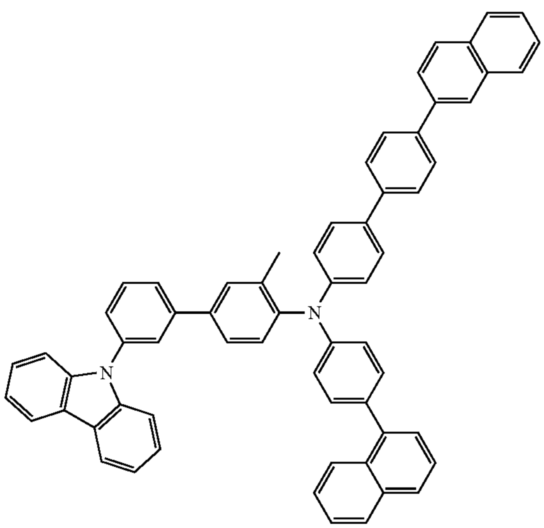
;
29
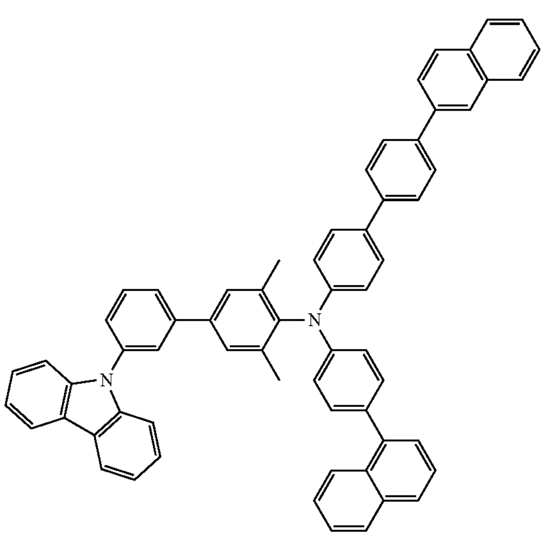
;
-continued
30
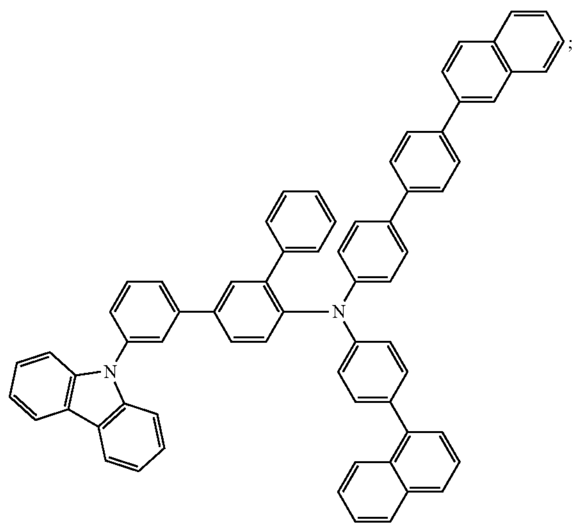
;
31
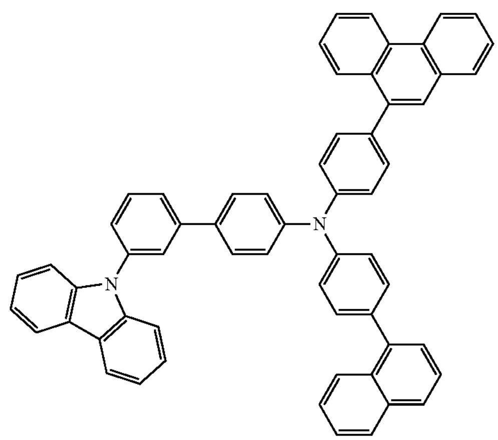
;
32
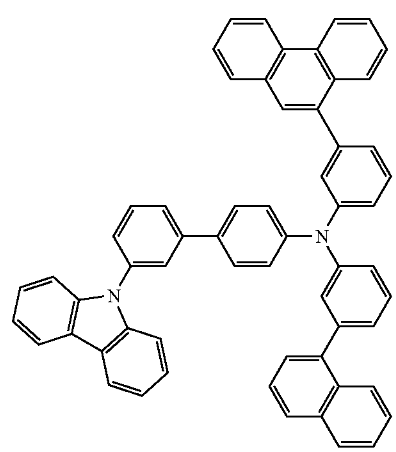
;

-continued
33
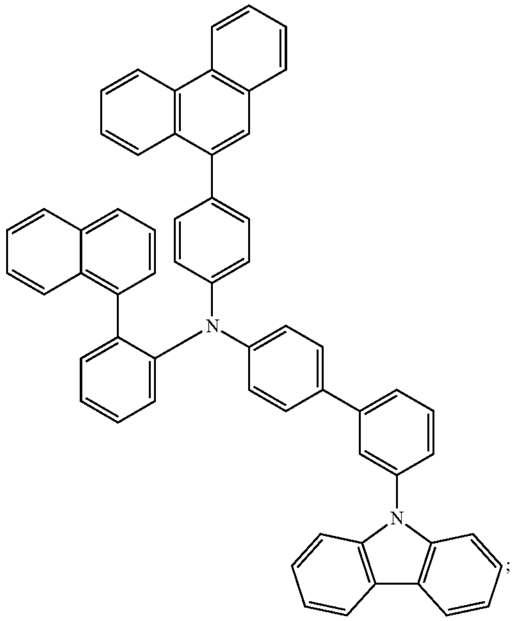
34
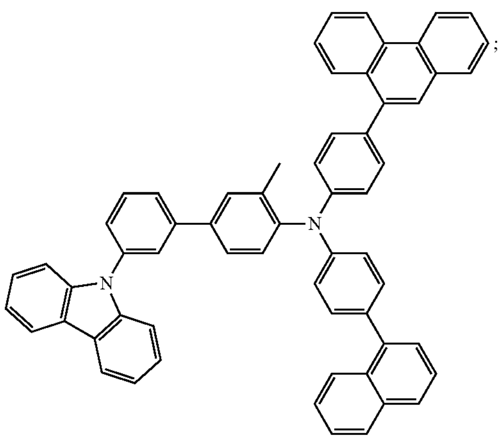
35
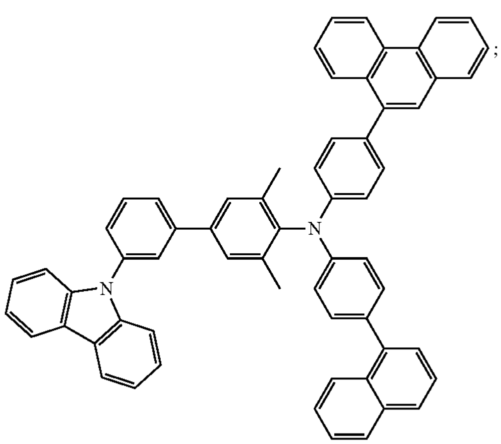
-continued
36
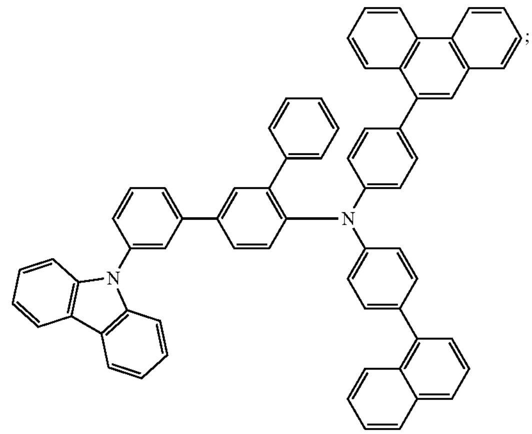
37
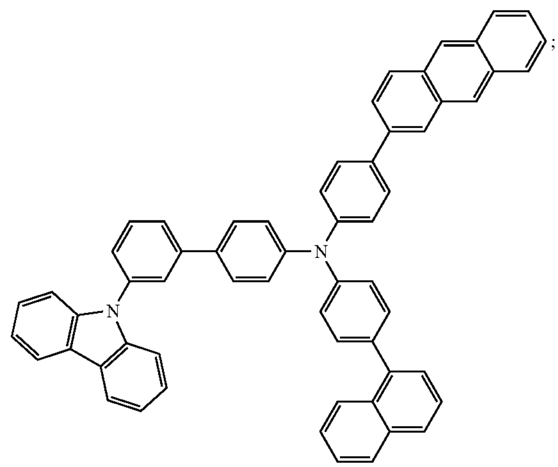
38
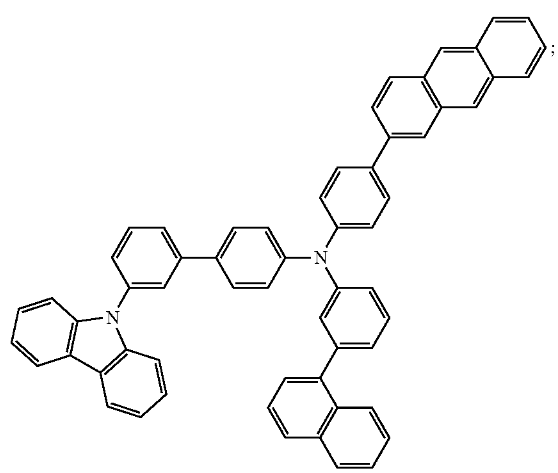

-continued
39
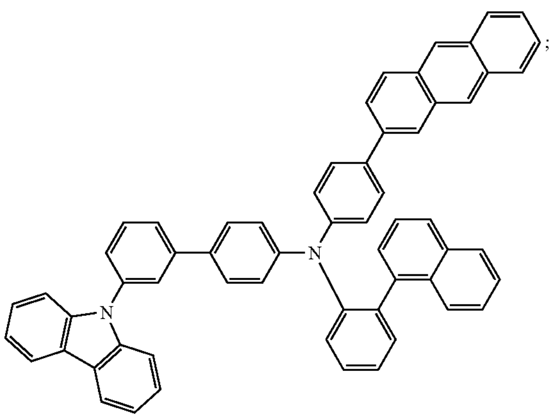
40
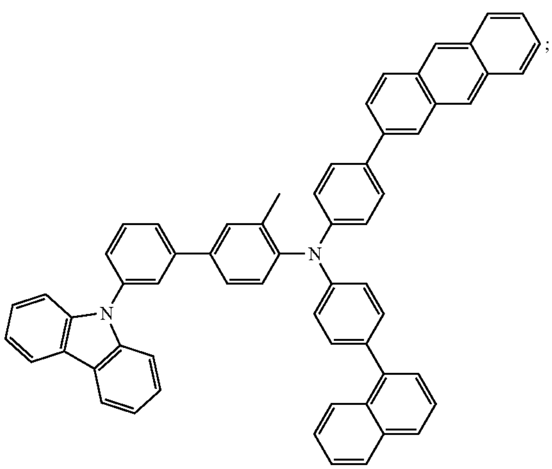
41
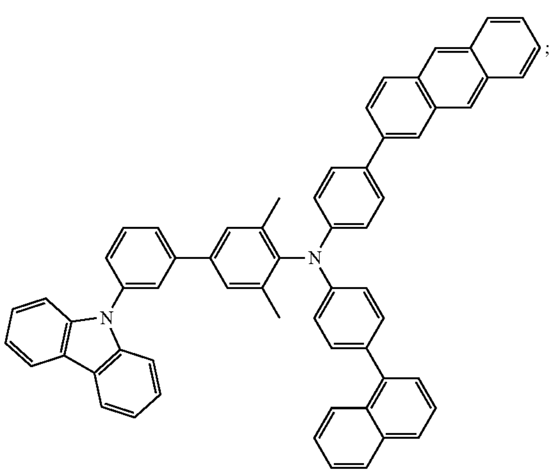
-continued
42
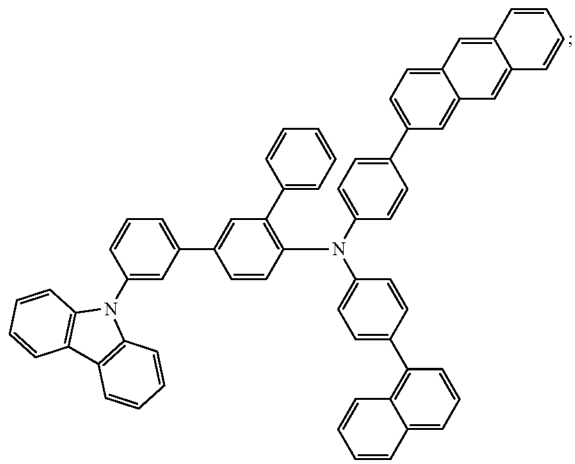
43
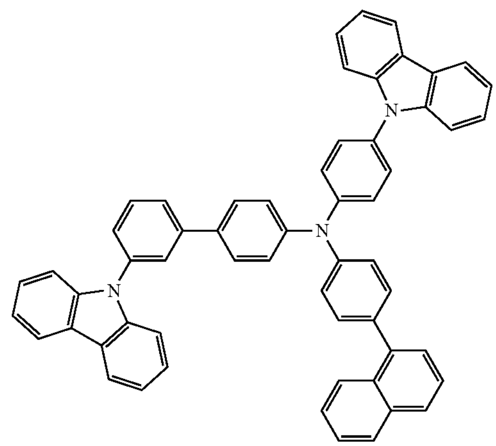
44
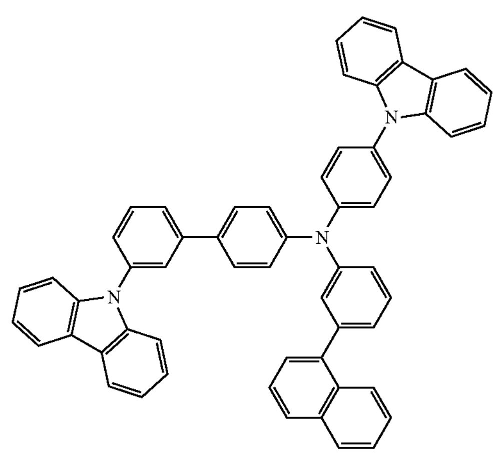

-continued
45
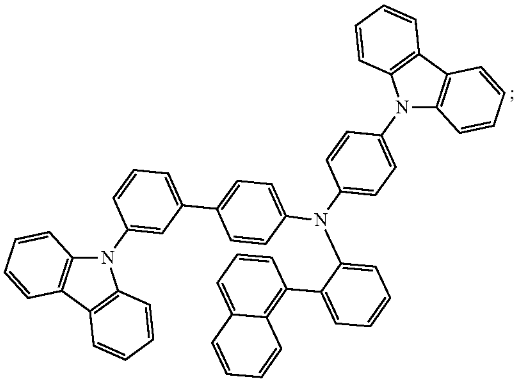
46
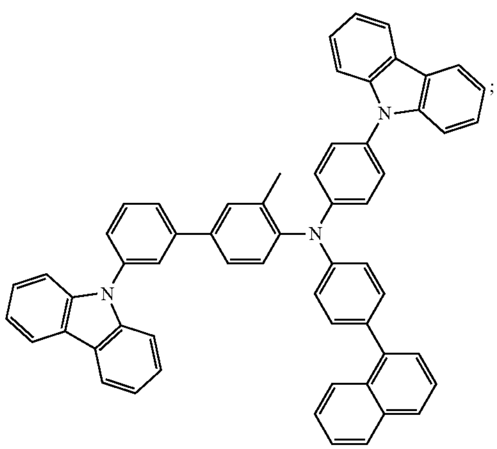
47
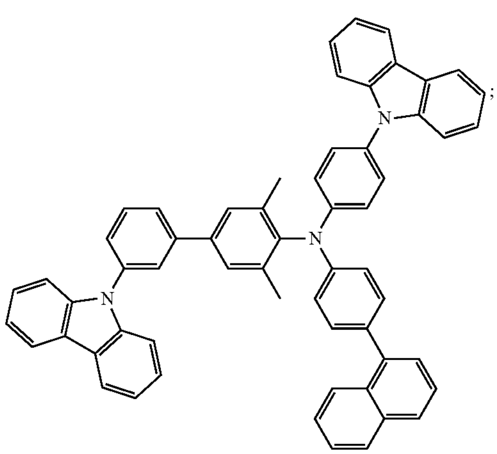
-continued
48
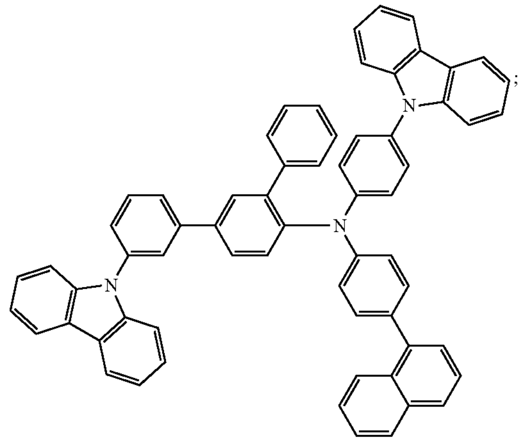
49
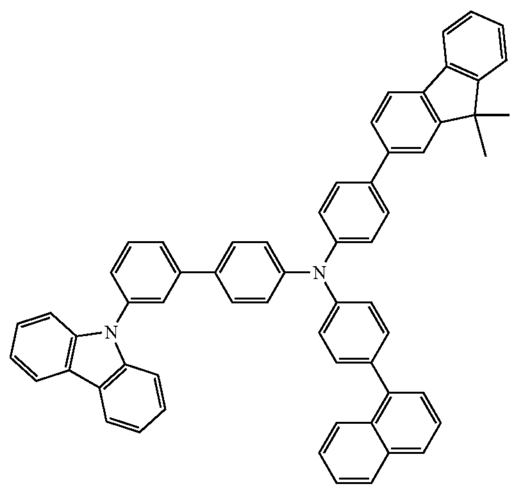
50
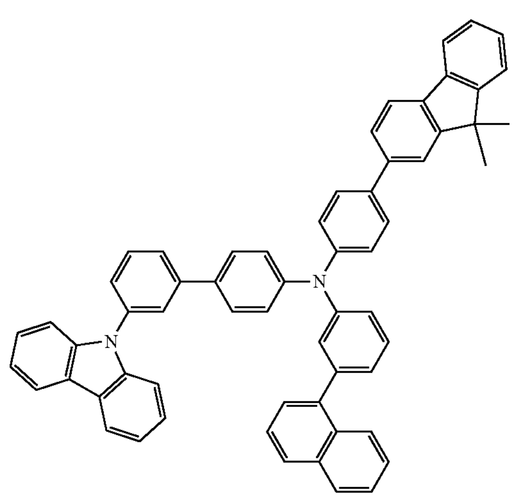

-continued
51
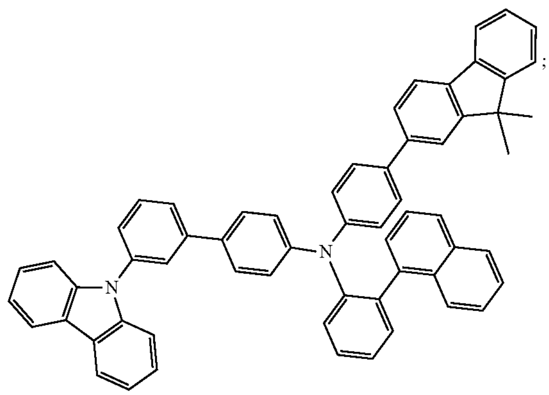
52
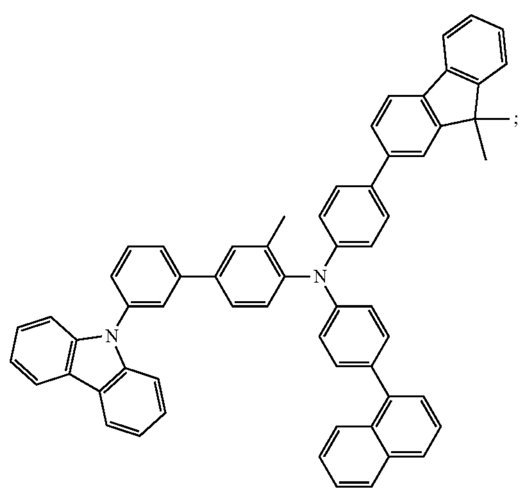
53
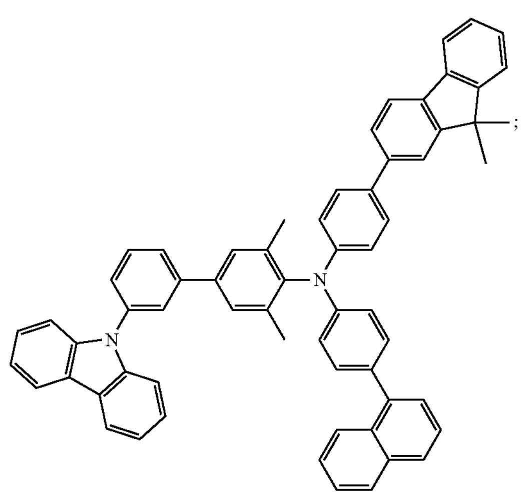
-continued
54
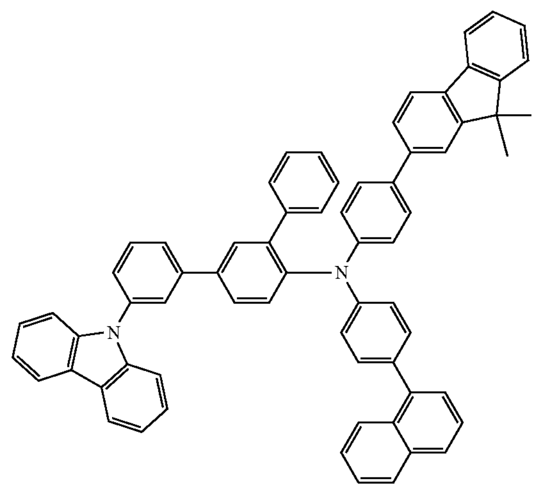
69
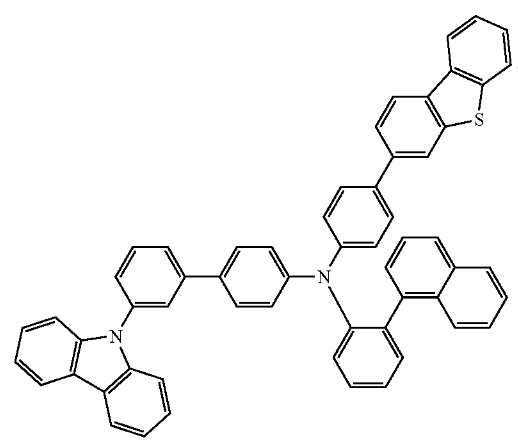
70
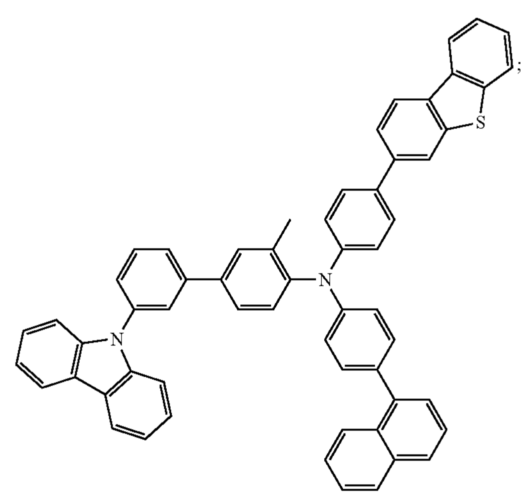

-continued
71
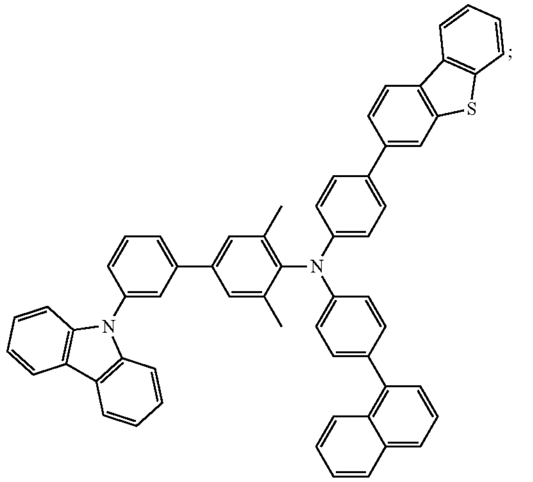
72
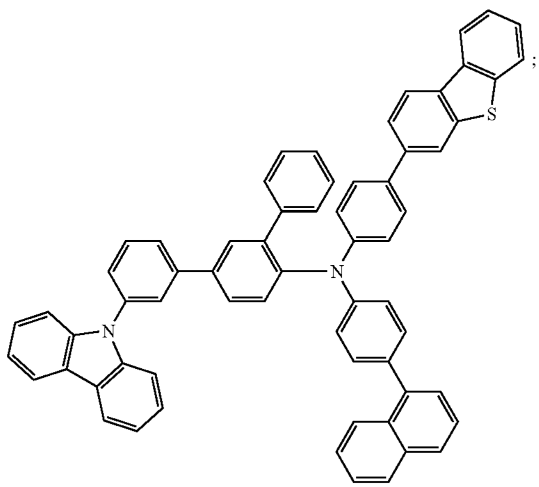
73
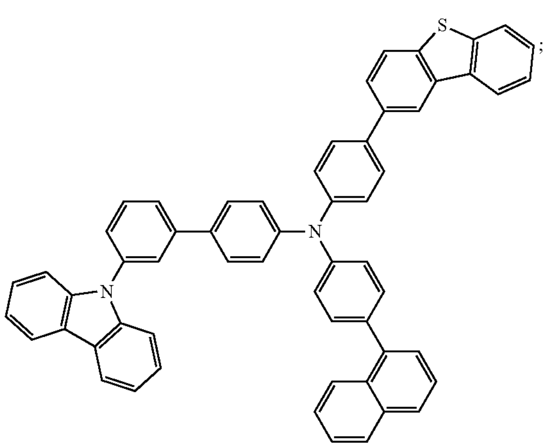
-continued
74
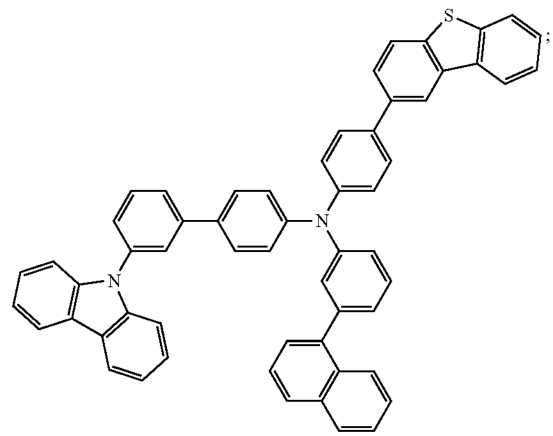
75
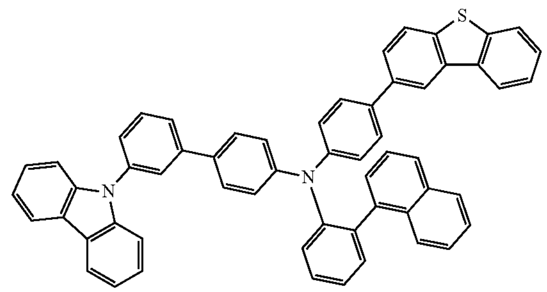
76
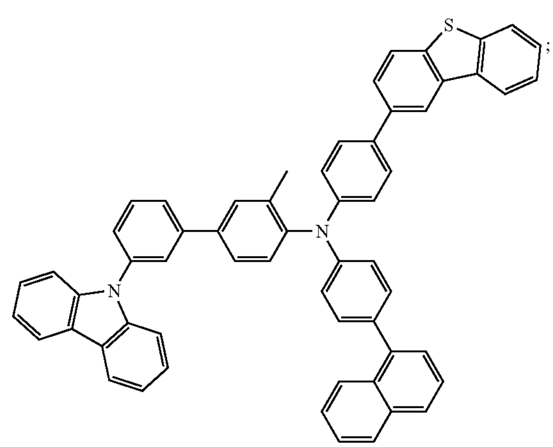

-continued
77
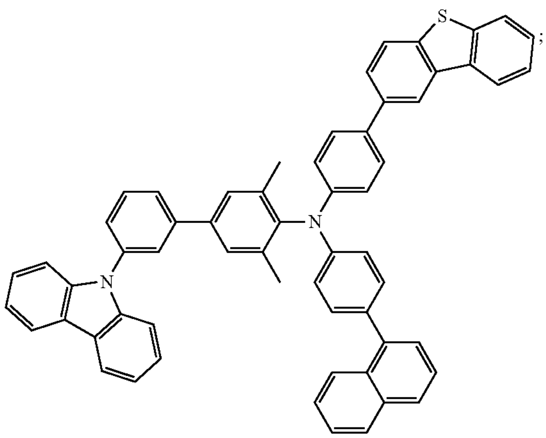
78
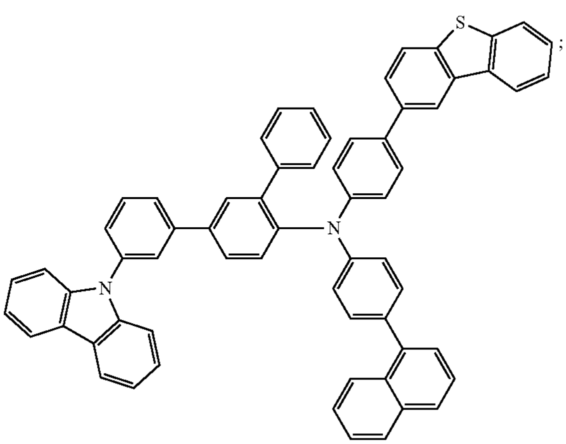
79
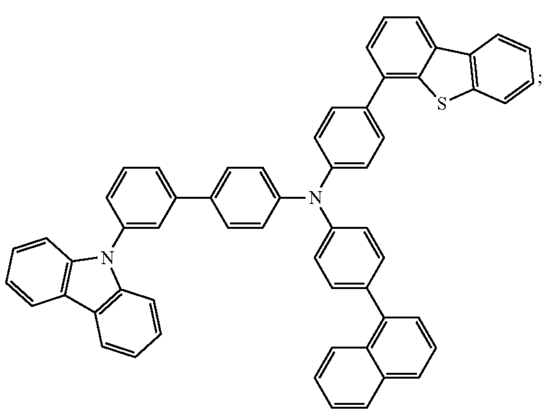
-continued
80
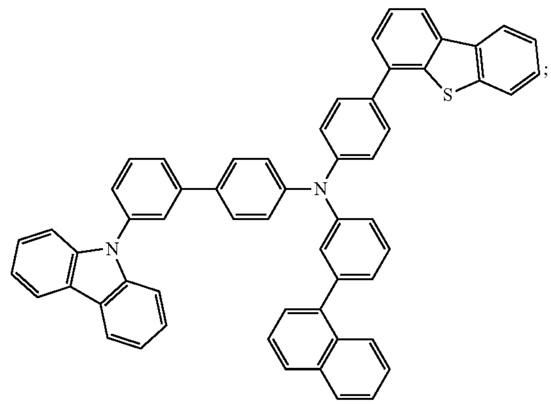
81
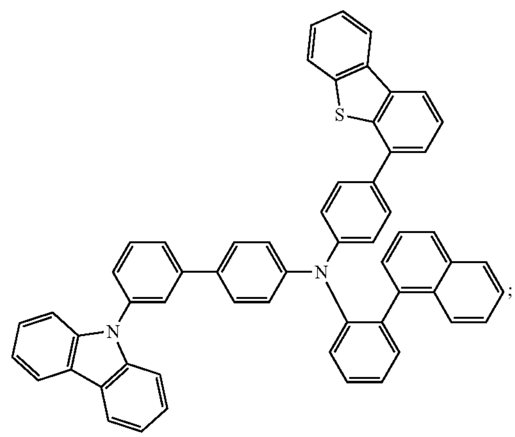
82
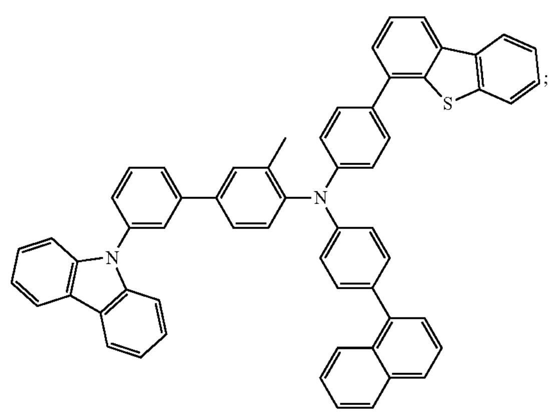

-continued
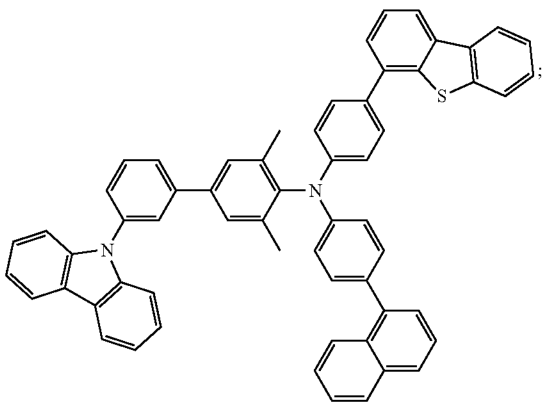
83
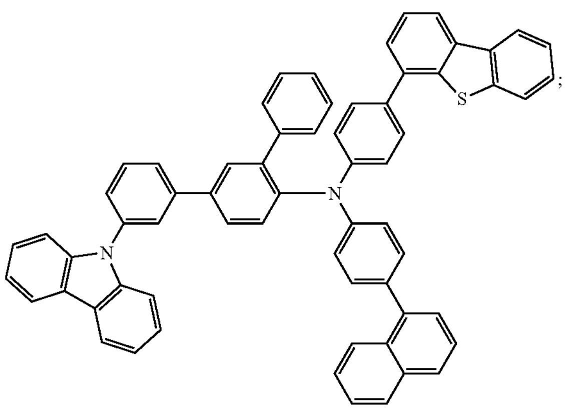
84
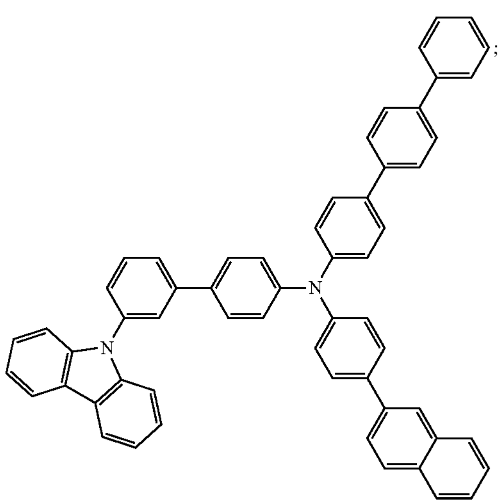
85
-continued
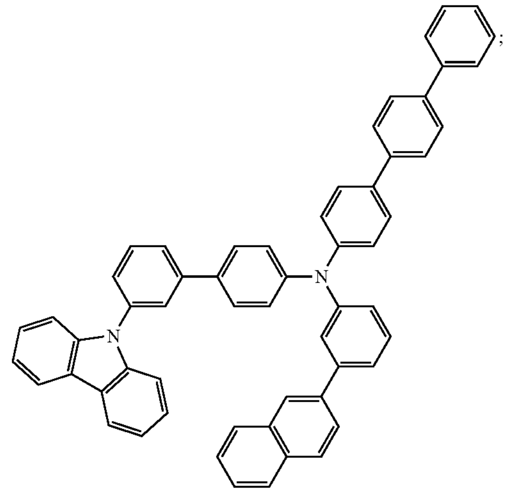
86
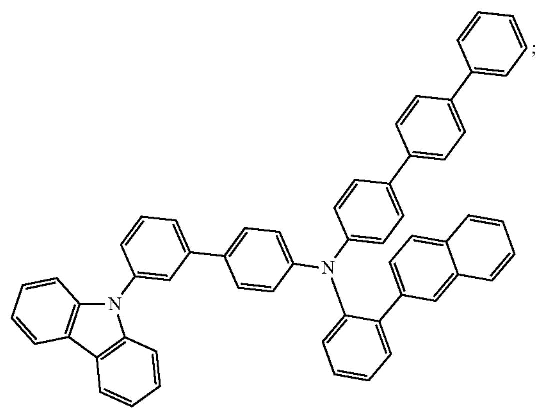
87
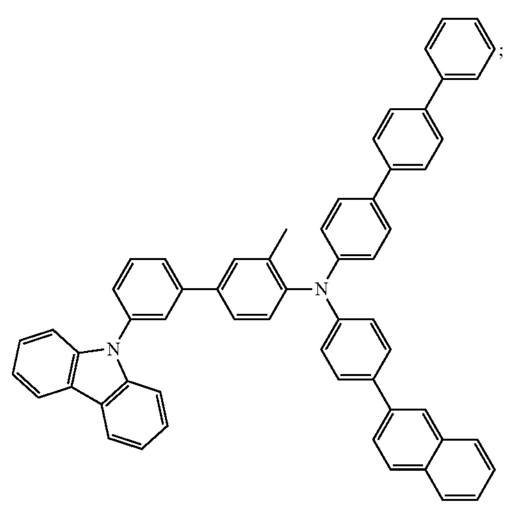
88

-continued
89
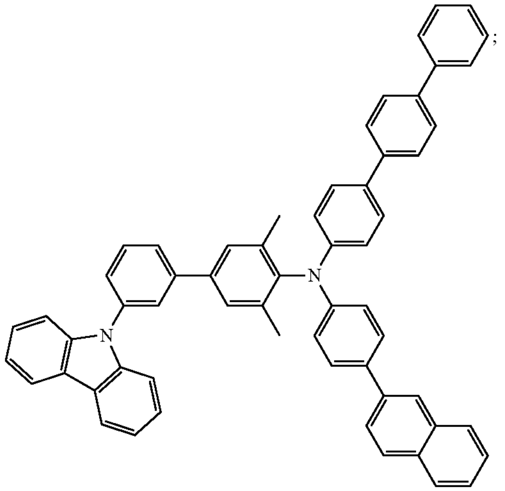
90
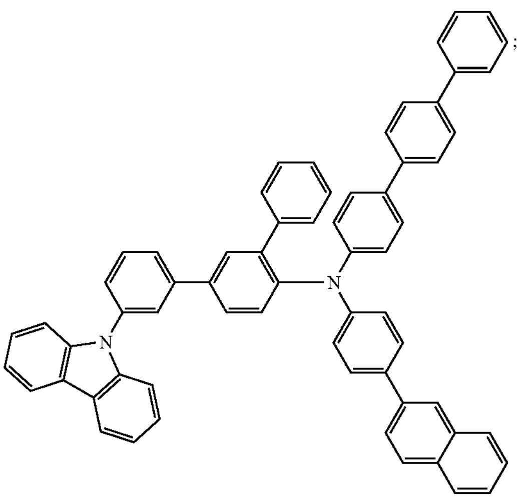
109
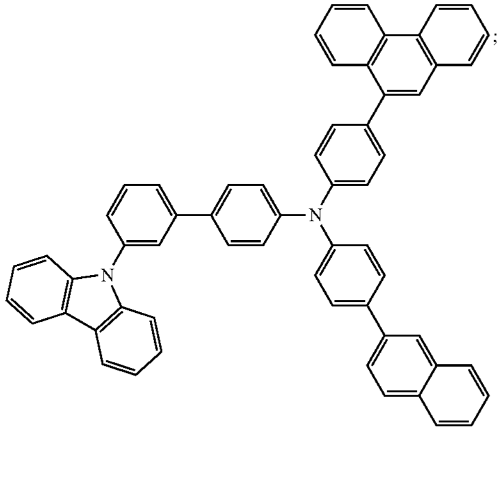
-continued
110
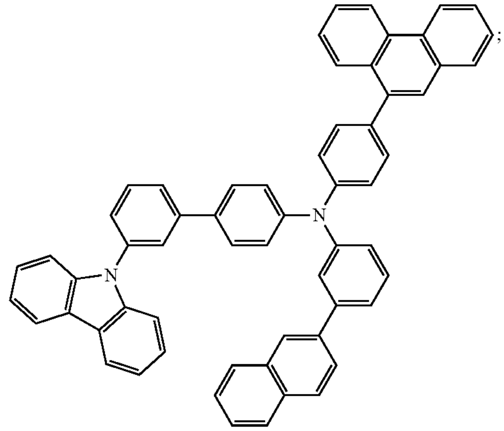
111
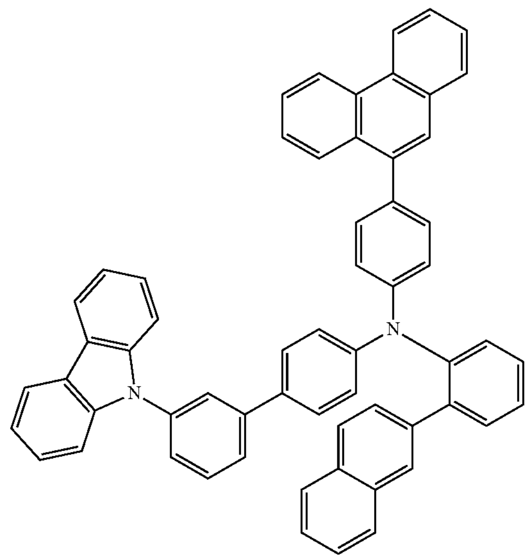
112
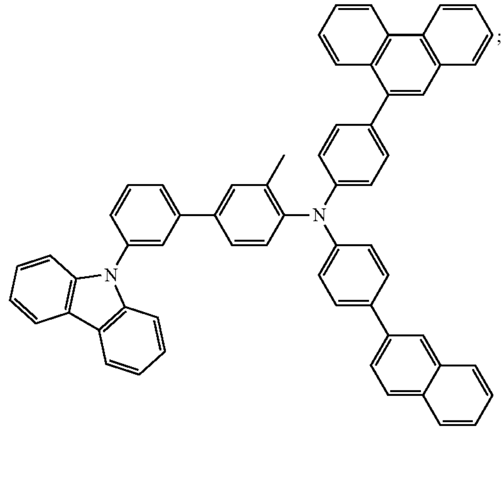

-continued
113
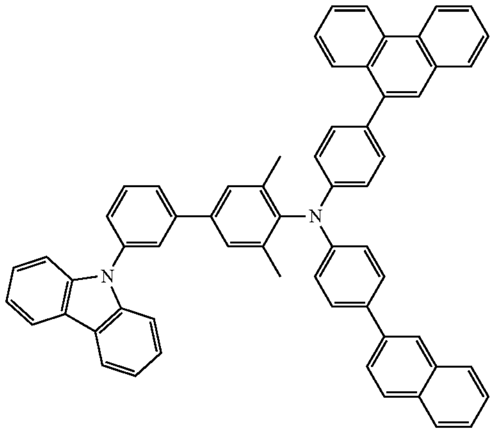
;
114
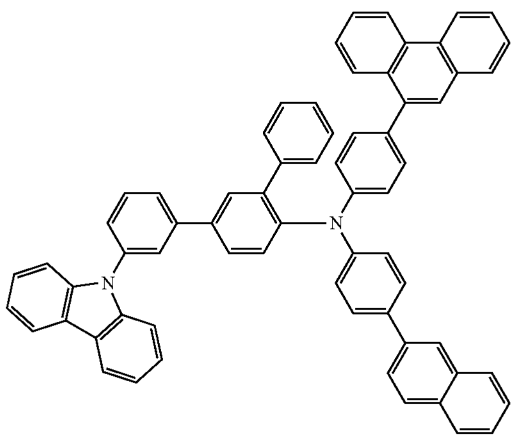
;
115
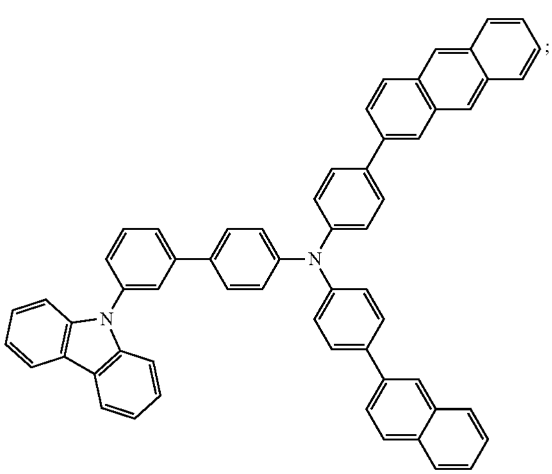
;
-continued
116
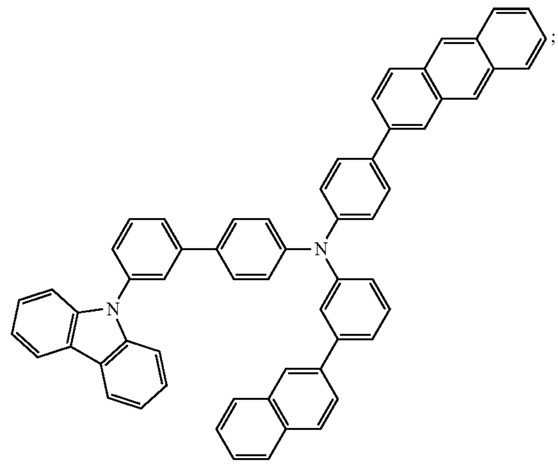
;
117
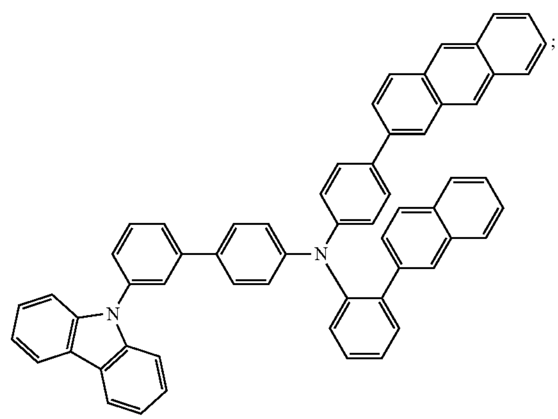
;
118
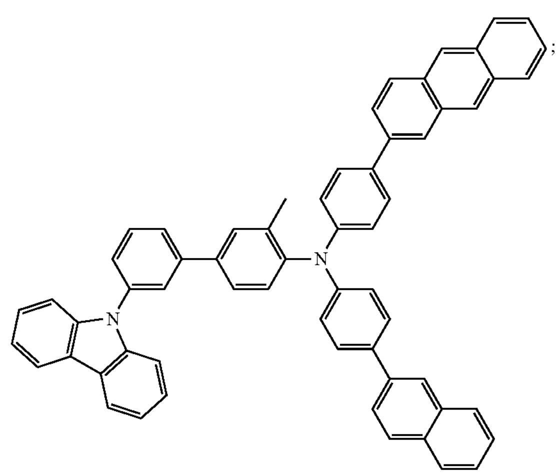
;

-continued
119
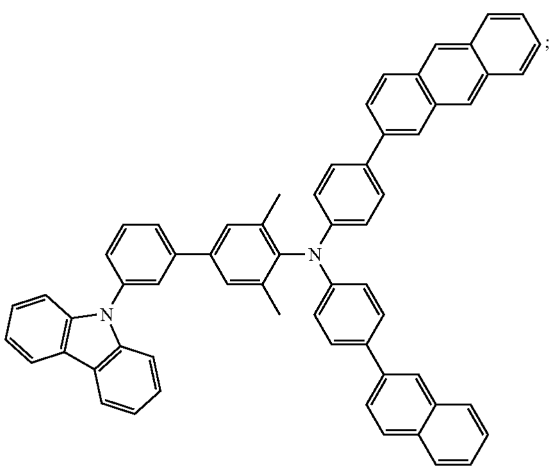
120
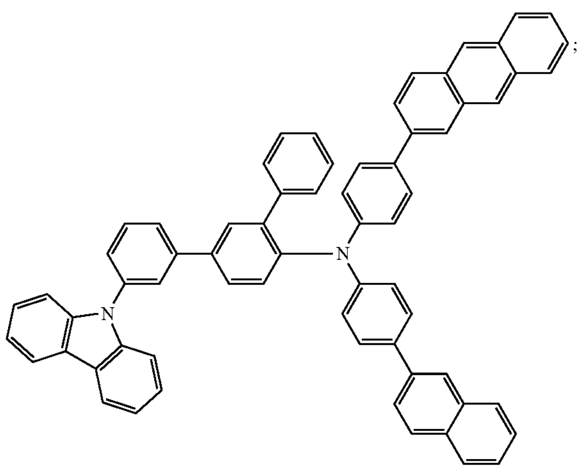
121
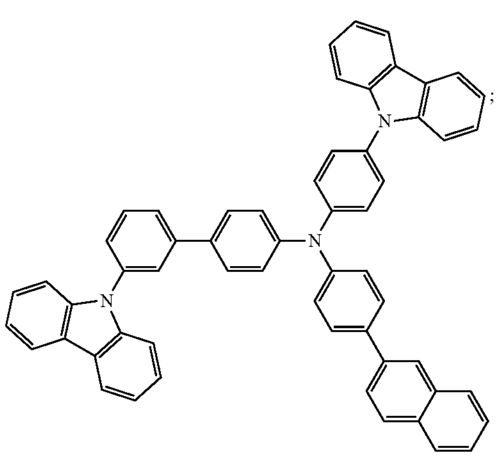
-continued
122
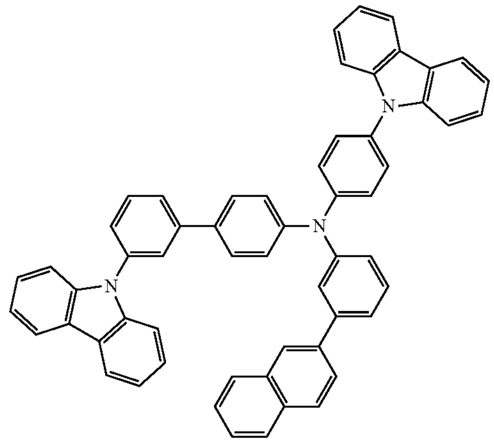
123
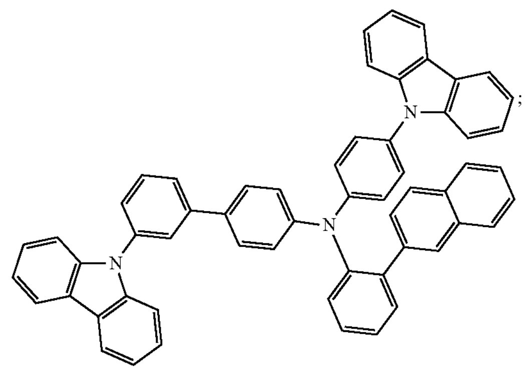
124
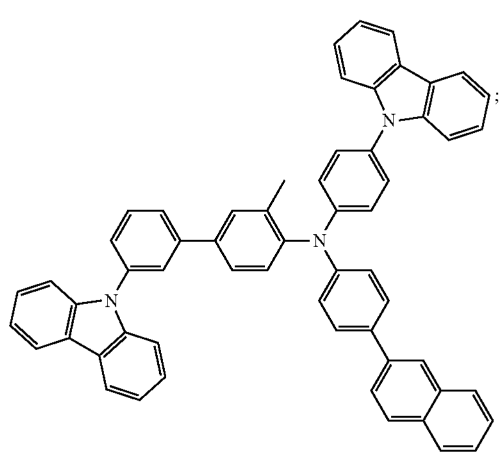

125
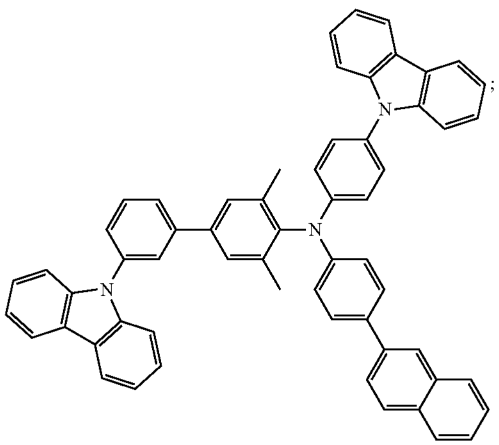
126
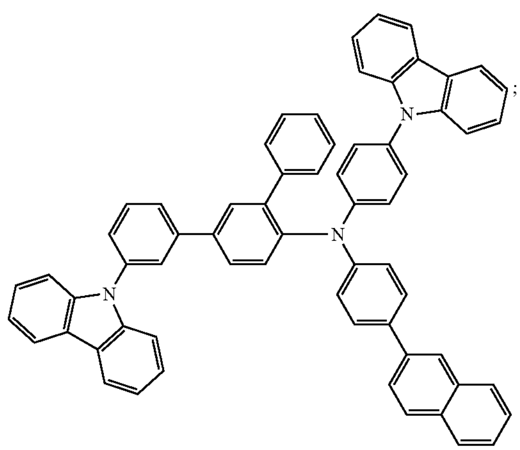
127
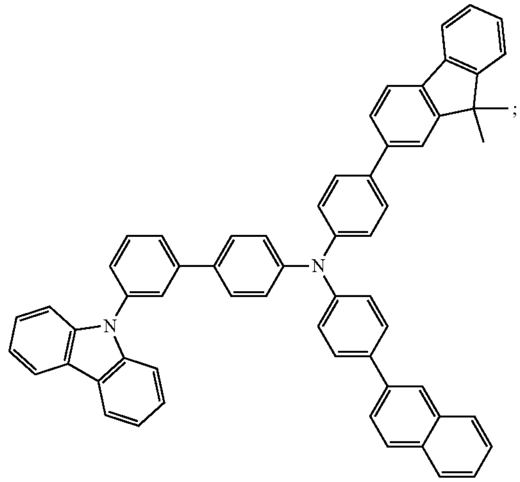
128
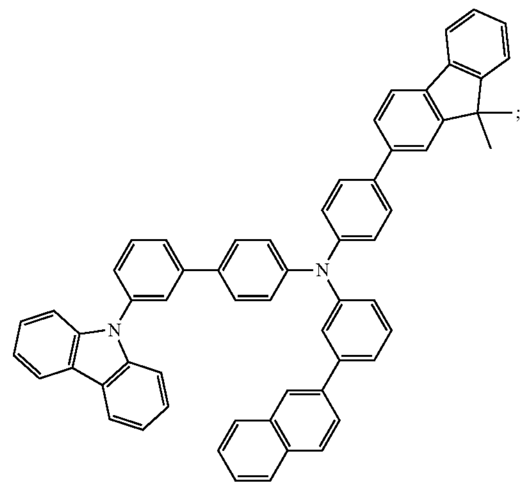
129
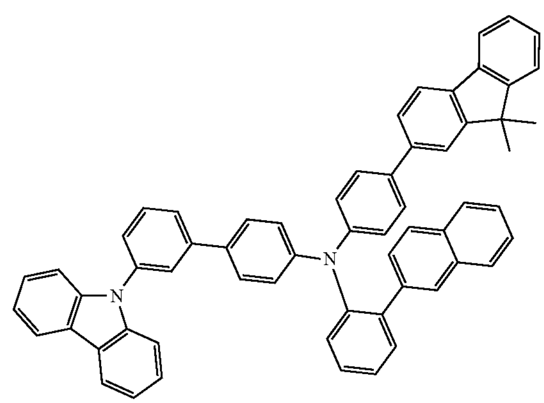
130
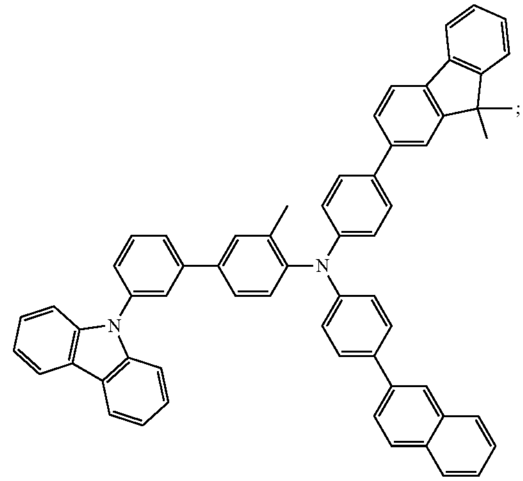

-continued
131
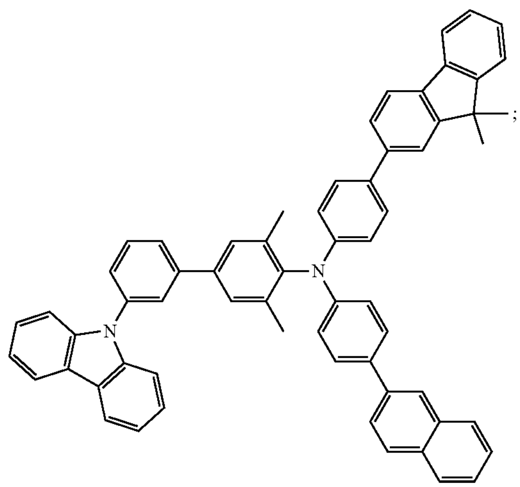
132
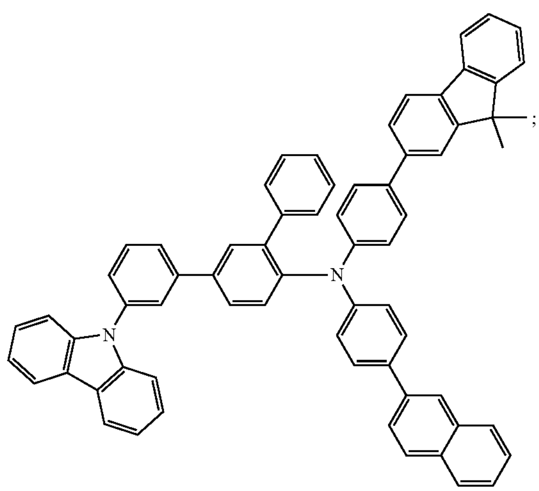
151
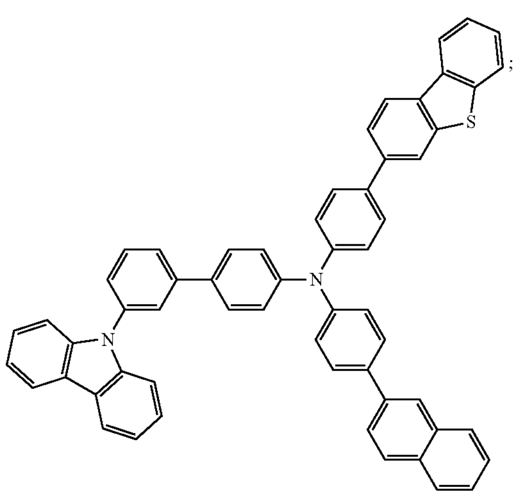
-continued
152
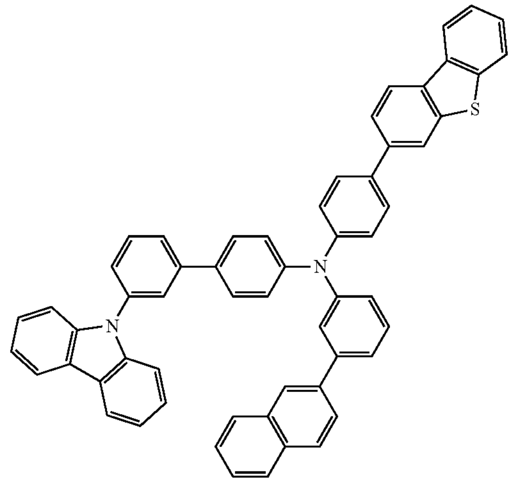
153
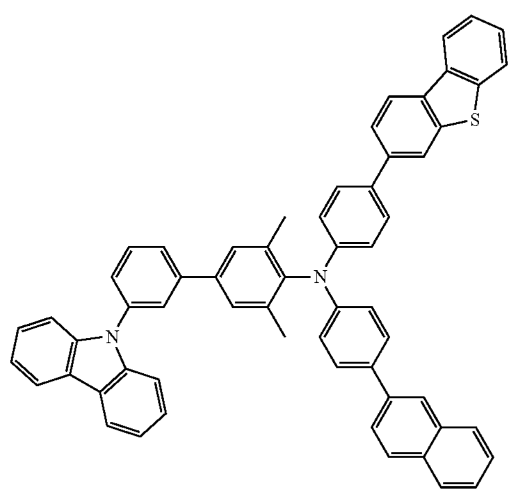
154
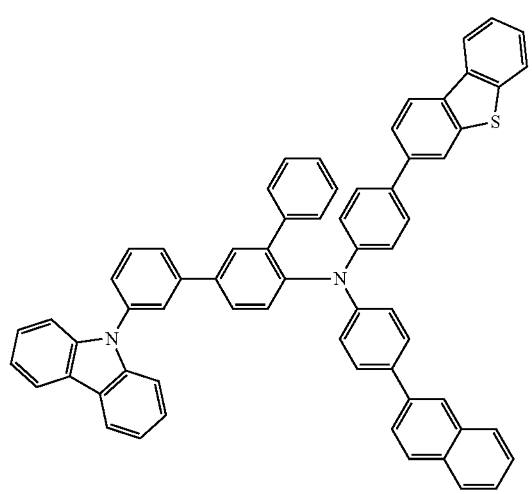

155
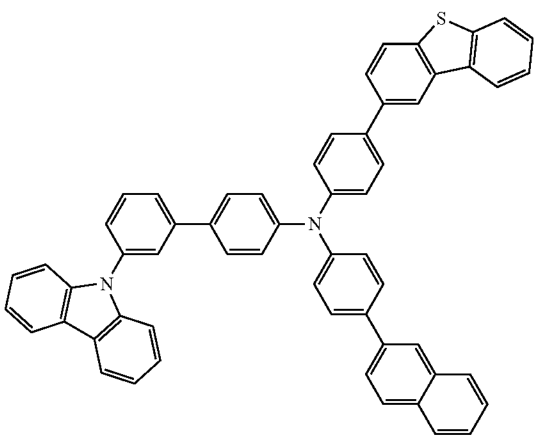
;
156
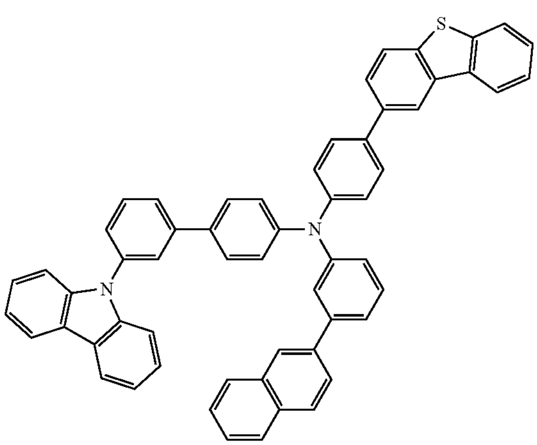
;
157
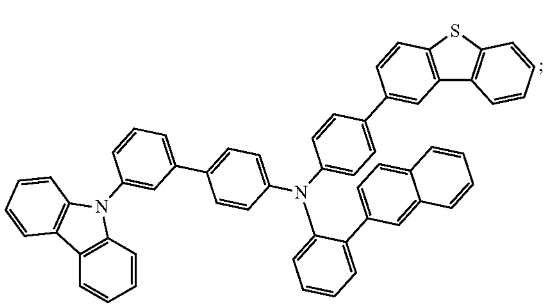
;
158
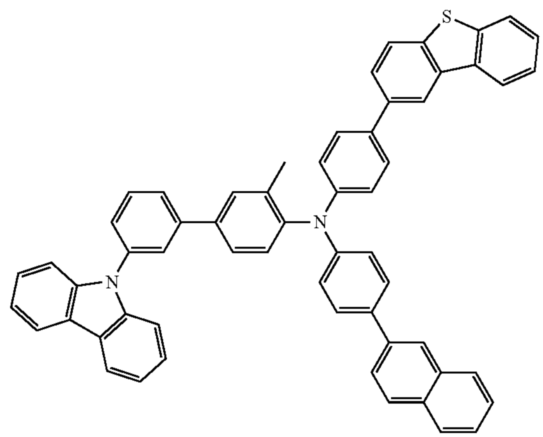
;
159
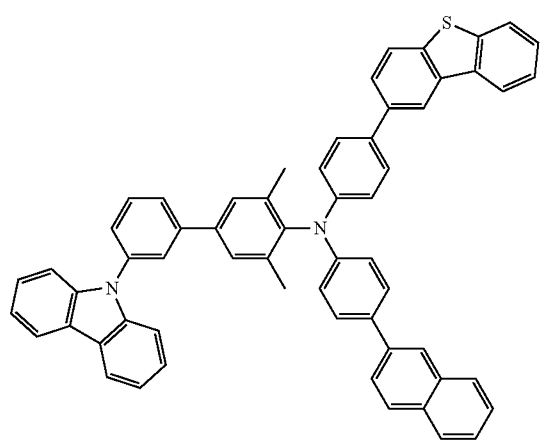
;
160
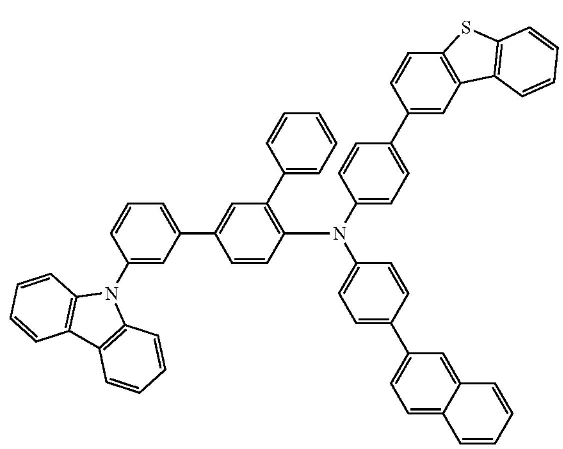
;

-continued

161

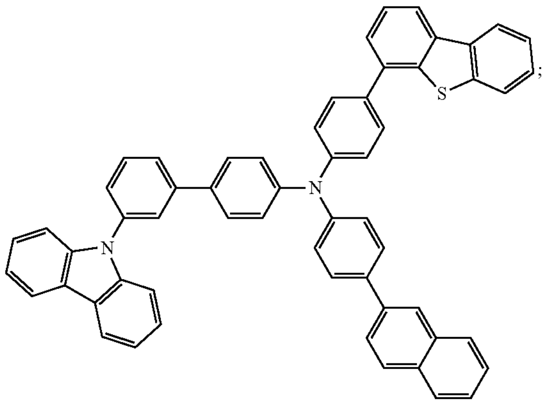

;

162

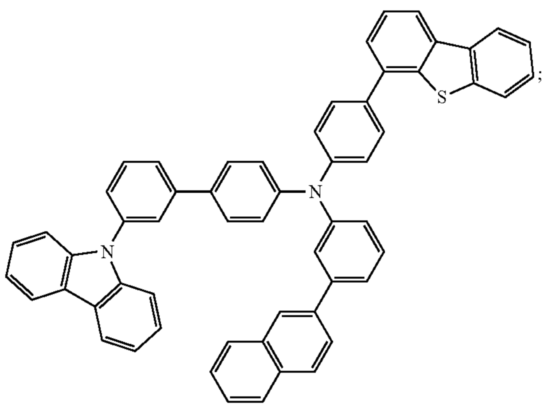

;

163

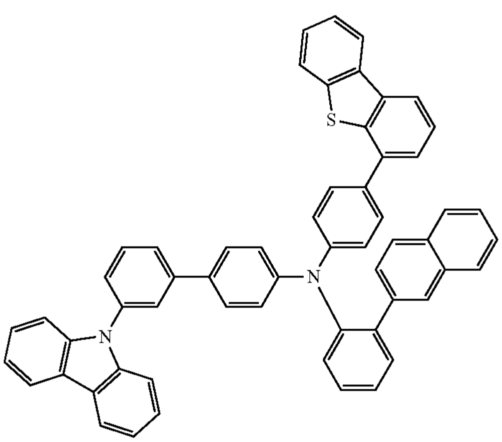

;

-continued

164

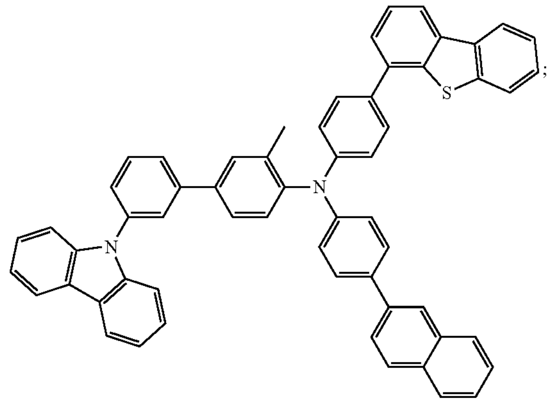

;

165

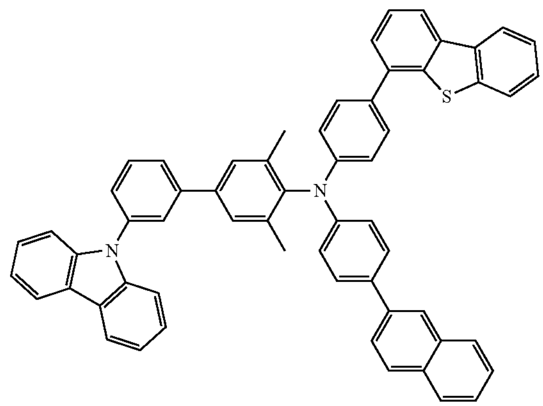

or

166

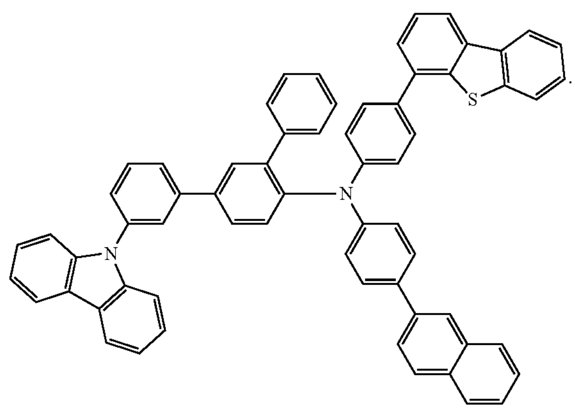

.

7. An organic electroluminescent device, comprising:

a first electrode;

a second electrode opposing the first electrode; and at least one organic layer between the first electrode and the second electrode, the at least one organic layer including:

a light emitting layer;

a first organic layer including a compound represented by the following Chemical Formula 2; and a second organic layer including a compound represented by the following Chemical Formula 3, wherein the first and second organic layers are disposed between the first electrode and the light emitting layer, Chemical Formula 2

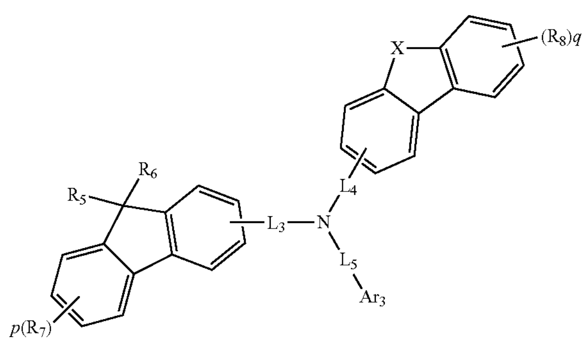

wherein:

each of $L_3$ and $L_4$ is independently selected from the group consisting of a single bond, a substituted or unsubstituted arylene group having 6 to 30 carbon atoms, a substituted or unsubstituted heteroarylene group having 6 to 30 carbon atoms, a substituted or unsubstituted alkylene group having 1 to 10 carbon atoms, a substituted or unsubstituted cycloalkylene group having 3 to 10 carbon atoms, a substituted or unsubstituted alkenylene group having 2 to 10 carbon atoms, a substituted or unsubstituted cycloalkenylene group having 3 to 10 carbon atoms, a substituted or unsubstituted heteroalkylene group having 1 to 10 carbon atoms, a substituted or unsubstituted heterocycloalkylene group having 2 to 10 carbon atoms, a substituted or unsubstituted heteroalkenylene group having 2 to 10 carbon atoms, and a substituted or unsubstituted heterocycloalkenylene group having 2 to 10 carbon atoms, $L_5$ is independently selected from the group consisting of a single bond, a substituted or unsubstituted arylene group having 6 to 30 carbon atoms, a substituted or unsubstituted alkylene group having 1 to 10 carbon atoms, a substituted or unsubstituted cycloalkylene group having 3 to 10 carbon atoms, a substituted or unsubstituted alkenylene group having 2 to 10 carbon atoms, a substituted or unsubstituted cycloalkenylene group having 3 to 10 carbon atoms, a substituted or unsubstituted heteroalkylene group having 1 to 10 carbon atoms, a substituted or unsubstituted heterocycloalkylene group having 2 to 10 carbon atoms, a substituted or unsubstituted heteroalkenylene group having 2 to 10 carbon atoms, and a substituted or unsubstituted heterocycloalkenylene group having 2 to 10 carbon atoms, X is O, S or $CR_9R_{10}$, each of $R_5$ and $R_6$ is independently selected from the group consisting of hydrogen, deuterium, a cyano group, a nitro group, a halogen group, a hydroxy group, a substituted or unsubstituted alkyl group having 1 to 30 carbon atoms, a substituted or unsubstituted cycloalkyl group having 3 to 30 carbon atoms, a substituted or unsubstituted alkenyl group having 2 to 30 carbon atoms, a substituted or unsubstituted cycloalkenyl group having 3 to 30 carbon atoms, a substituted or unsubstituted alkynyl group having 2 to 24 carbon atoms, a substituted or unsubstituted heteroalkyl group having 2 to 30 carbon atoms, a substituted or unsubstituted aralkyl group having 7 to 30 carbon atoms, a substituted or unsubstituted heteroaryl group having 2 to 30 carbon atoms, a substituted or unsubstituted heteroaralkyl group having 3 to 30 carbon atoms, a substituted or unsubstituted alkyl silyl group having 1 to 20 carbon atoms, a substituted or unsubstituted alkoxy silyl group having 1 to 20 carbon atoms, a substituted or unsubstituted cycloalkyl silyl group having 3 to 30 carbon atoms, and a substituted or unsubstituted aryl silyl group having 5 to 30 carbon atoms, or $R_5$ and $R_6$ together with the carbon atom to which they are bonded form a spiro-linked 6 or 7-membered hydrocarbon ring, optionally interrupted by at least one heteroatom selected from the group consisting of N, O, S and Si, each of $R_9$ and $R_{10}$ is independently selected from the group consisting of hydrogen, deuterium, a cyano group, a nitro group, a halogen group, a hydroxy group, a substituted or unsubstituted alkyl group having 1 to 30 carbon atoms, a substituted or unsubstituted cycloalkyl group having 3 to 30 carbon atoms, a substituted or unsubstituted alkenyl group having 2 to 30 carbon atoms, a substituted or unsubstituted cycloalkenyl group having 3 to 30 carbon atoms, a substituted or unsubstituted alkynyl group having 2 to 24 carbon atoms, a substituted or unsubstituted heteroalkyl group having 2 to 30 carbon atoms, a substituted or unsubstituted aralkyl group having 7 to 30 carbon atoms, a substituted or unsubstituted aryl group having 6 to 30 carbon atoms, a substituted or unsubstituted heteroaryl group having 2 to 30 carbon atoms, a substituted or unsubstituted heteroaralkyl group having 3 to 30 carbon atoms, a substituted or unsubstituted alkyl silyl group having 1 to 20 carbon atoms, a substituted or unsubstituted alkoxy silyl group having 1 to 20 carbon atoms, a substituted or unsubstituted cycloalkyl silyl group having 3 to 30 carbon atoms, and a substituted or unsubstituted aryl silyl group having 5 to 30 carbon atoms, provided that when $R_9$ and $R_{10}$ are independently a substituted or unsubstituted aryl group having 6 to 30 carbon atoms, $R_5$ and $R_6$ are not a substituted or unsubstituted alkyl group having 1 to 30 carbon atoms, each of $R_7$ and $R_8$ is independently selected from the group consisting of hydrogen, deuterium, a cyano group, a nitro group, a halogen group, a hydroxy group, a substituted or unsubstituted alkyl group having 1 to 30 carbon atoms, a substituted or unsubstituted cycloalkyl group having 3 to 30 carbon atoms, a substituted or unsubstituted alkenyl group having 2 to 30 carbon atoms, a substituted or unsubstituted cycloalkenyl group having 3 to 30 carbon atoms, a substituted or unsubstituted alkynyl group having 2 to 24 carbon atoms, a substituted or unsubstituted heteroalkyl group having 2 to 30 carbon atoms, a substituted or unsubstituted aralkyl group having 7 to 30 carbon atoms, a substituted or unsubstituted aryl group having 6 to 30 carbon atoms, a substituted or unsubstituted heteroaryl group having 2 to 30 carbon atoms, a substituted or unsubstituted heteroaralkyl group having 3 to 30 carbon atoms, a substituted or unsubstituted alkyl silyl group having 1 to 20 carbon atoms, a substituted or unsubstituted alkoxy silyl group having 1 to 20 carbon atoms, a substituted or unsubstituted cycloalkyl silyl group having 3 to 30 carbon atoms, and a substituted or unsubstituted aryl silyl group having 5 to 30 carbon atoms, or each of $R_7$ and $R_8$ is linked to an adjacent $R_7$ or $R_8$ thereto to form an alicyclic or aromatic, monocyclic or polycyclic, saturated or unsaturated ring, the formed ring optionally including at least one heteroatom selected from the group consisting of N, O, S and Si, $Ar_3$ is a substituted or unsubstituted aryl group having 6 to 30 carbon atoms, wherein the aryl group having 6 to 30 carbon atoms does not include any heteroatom, and with the proviso that the aryl group having 6 to 30 carbon atoms is not substituted with a heteroaryl group, each of p and q is independently an integer of 0 to 4, when p is 2 to 4, a plurality of $R_7$ is the same as or different from each other, and when q is 2 to 4, a plurality of $R_8$ is the same as or different from each other, Chemical Formula 3

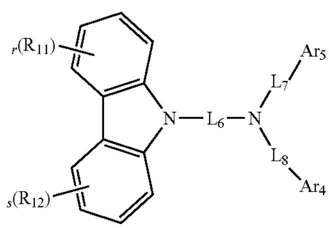

wherein:

each of $R_{11}$ and $R_{12}$ is independently selected from the group consisting of hydrogen, deuterium, a cyano group, a nitro group, a halogen group, a hydroxy group, a substituted or unsubstituted alkyl group having 1 to 30 carbon atoms, a substituted or unsubstituted cycloalkyl group having 3 to 30 carbon atoms, a substituted or unsubstituted alkenyl group having 2 to 30 carbon atoms, a substituted or unsubstituted cycloalkenyl group having 3 to 30 carbon atoms, a substituted or unsubstituted alkynyl group having 2 to 24 carbon atoms, a substituted or unsubstituted heteroalkyl group having 2 to 30 carbon atoms, a substituted or unsubstituted aralkyl group having 7 to 30 carbon atoms, a substituted or unsubstituted aryl group having 6 to 30 carbon atoms, a substituted or unsubstituted heteroaryl group having 2 to 30 carbon atoms, a substituted or unsubstituted heteroaralkyl group having 3 to 30 carbon atoms, a substituted or unsubstituted alkyl silyl group having 1 to 20 carbon atoms, a substituted or unsubstituted alkoxy silyl group having 1 to 20 carbon atoms, a substituted or unsubstituted cycloalkyl silyl group having 3 to 30 carbon atoms, and a substituted or unsubstituted aryl silyl group having 5 to 30 carbon atoms, or each of $R_{11}$ and $R_{12}$ is linked to a substituent adjacent thereto to form an alicyclic or aromatic, monocyclic or polycyclic, saturated or unsaturated ring, the formed ring optionally including at least one heteroatom selected from the group consisting of N, O, S and Si, each of r and s is independently an integer of 0 to 4, when r is 2 to 4, a plurality of $R_{11}$ is the same as or different from each other, and when s is 2 to 4, a plurality of $R_{12}$ is the same as or different from each other, $L_6$ is selected from the group consisting of a substituted or unsubstituted arylene group having 6 to 30 carbon atoms, a substituted or unsubstituted heteroarylene group having 6 to 30 carbon atoms, a substituted or unsubstituted alkylene group having 1 to 10 carbon atoms, a substituted or unsubstituted cycloalkylene group having 3 to 10 carbon atoms, a substituted or unsubstituted alkenylene group having 2 to 10 carbon atoms, a substituted or unsubstituted cycloalkenylene group having 3 to 10 carbon atoms, a substituted or unsubstituted heteroalkylene group having 1 to 10 carbon atoms, a substituted or unsubstituted heterocycloalkylene group having 2 to 10 carbon atoms, a substituted or unsubstituted heteroalkenylene group having 2 to 10 carbon atoms, and a substituted or unsubstituted heterocycloalkenylene group having 2 to 10 carbon atoms, each of $L_7$ and $L_8$ is independently selected from the group consisting of a single bond, a substituted or unsubstituted arylene group having 6 to 30 carbon atoms, a substituted or unsubstituted heteroarylene group having 6 to 30 carbon atoms, a substituted or unsubstituted alkylene group having 1 to 10 carbon atoms, a substituted or unsubstituted cycloalkylene group having 3 to 10 carbon atoms, a substituted or unsubstituted alkenylene group having 2 to 10 carbon atoms, a substituted or unsubstituted cycloalkenylene group having 3 to 10 carbon atoms, a substituted or unsubstituted heteroalkylene group having 1 to 10 carbon atoms, a substituted or unsubstituted heterocycloalkylene group having 2 to 10 carbon atoms, a substituted or unsubstituted heteroalkenylene group having 2 to 10 carbon atoms, and a substituted or unsubstituted heterocycloalkenylene group having 2 to 10 carbon atoms, and each of $Ar_4$ and $Ar_5$ is independently selected from the group consisting of a substituted or unsubstituted aryl having 3 to 30 carbon atoms, a substituted or unsubstituted heteroaryl having 5 to 30 carbon atoms, a substituted or unsubstituted aralkyl group having 7 to 30 carbon atoms, a substituted or unsubstituted heteroaralkyl group having 3 to 30 carbon atoms, and a substituted or unsubstituted aryl amino group.

8. The organic electroluminescent device of claim 7, wherein at least one of $Ar_4$ and $Ar_5$ is substituted or unsubstituted aryl having 7 to 20 carbon atoms, or substituted or unsubstituted heteroaryl having 7 to 20 carbon atoms.

9. The organic electroluminescent device of claim 7, wherein at least one of $Ar_4$ and $Ar_5$ is substituted or unsubstituted condensed aryl having 7 to 20 carbon atoms, or substituted or unsubstituted condensed heteroaryl having 7 to 20 carbon atoms.

10. The organic electroluminescent device of claim 7, wherein the first organic layer includes a hole transport layer.

11. The organic electroluminescent device of claim 7, wherein the second organic layer includes a hole transport auxiliary layer.

12. The organic electroluminescent device of claim 7, wherein the at least one organic layer further includes at least one layer selected from the group consisting of a hole injection layer, an electron transport auxiliary layer, an electron transport layer, and an electron injection layer.

13. The organic electroluminescent device of claim 7, further including a first passivation film formed on the second electrode, and a second passivation film formed on the first passivation film.

14. The organic electroluminescent device of claim 13, wherein the first passivation film is formed over an entirety of the at least one organic layer and the second electrode.

15. The organic electroluminescent device of claim 13, further including an encapsulation film formed on the second passivation film, wherein the encapsulation film is bonded to the second passivation film via an adhesive film.

16. The organic electroluminescent device of claim 7, further including a driving thin film transistor including an active layer electrically connected to the first electrode.

17. The organic electroluminescent device of claim 16, wherein the active layer includes an oxide semiconductor material.

18. The organic electroluminescent device of claim 16, wherein the driving thin film transistor includes:

a gate insulating film formed on the active layer; and a gate electrode formed on the gate insulating film.

19. The organic electroluminescent device of claim 7, wherein the first organic layer includes one of the following compounds:

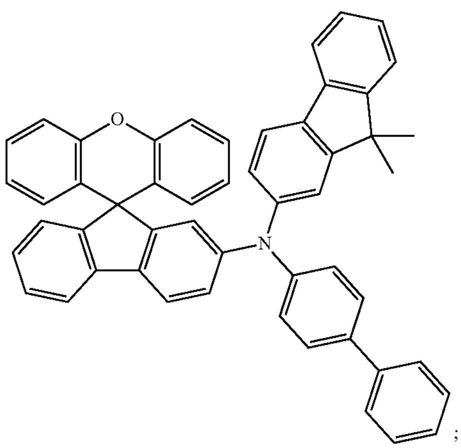

;

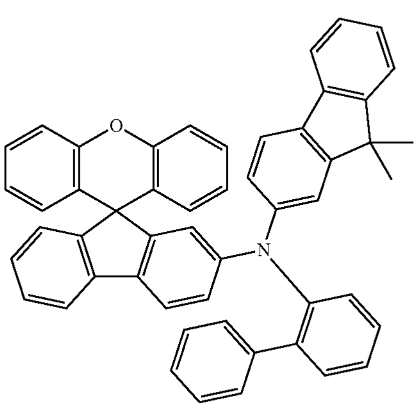

;

-continued

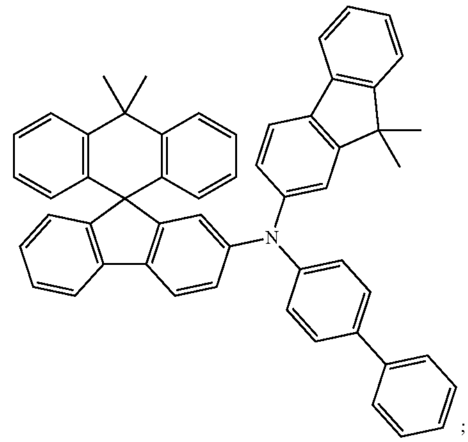

;

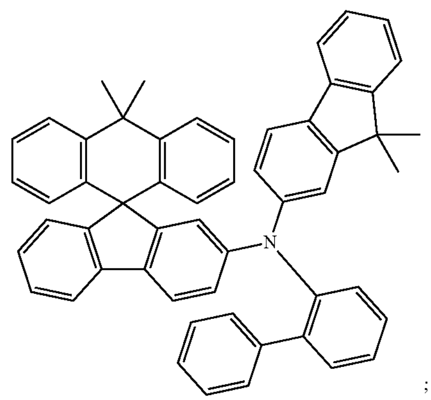

;

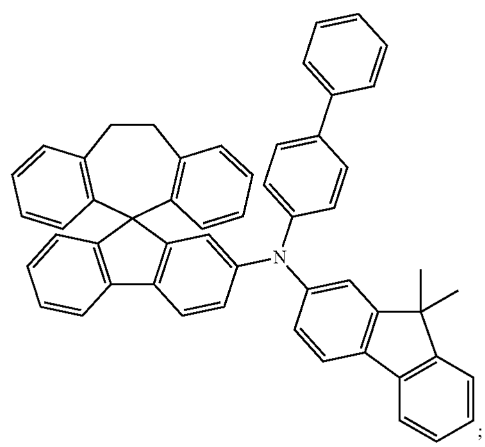

;

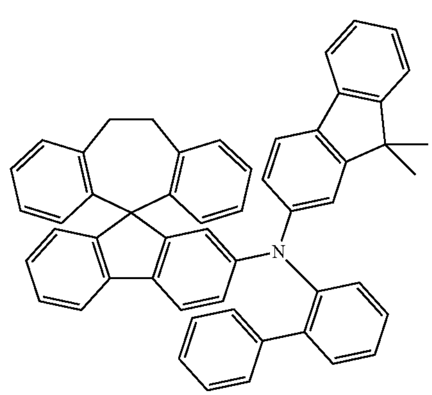

;

-continued
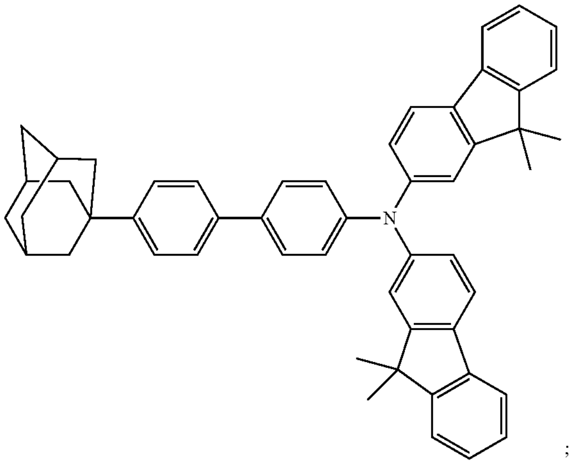
;
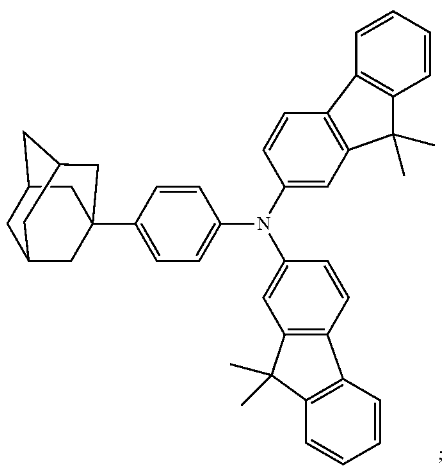
;
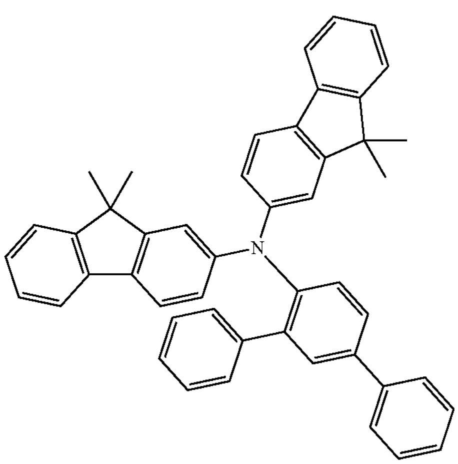
;
-continued
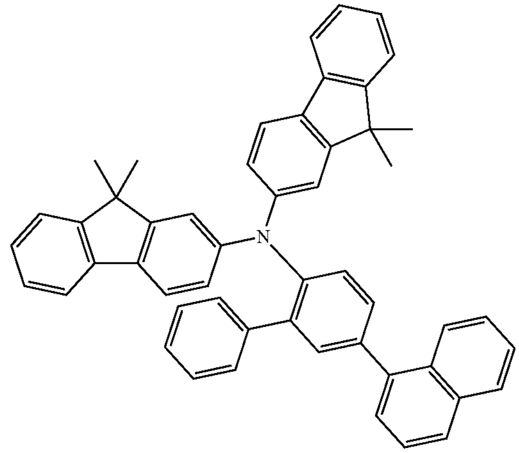
.
20. The organic electroluminescent device of claim 7, wherein the second organic layer includes one of the following compounds:
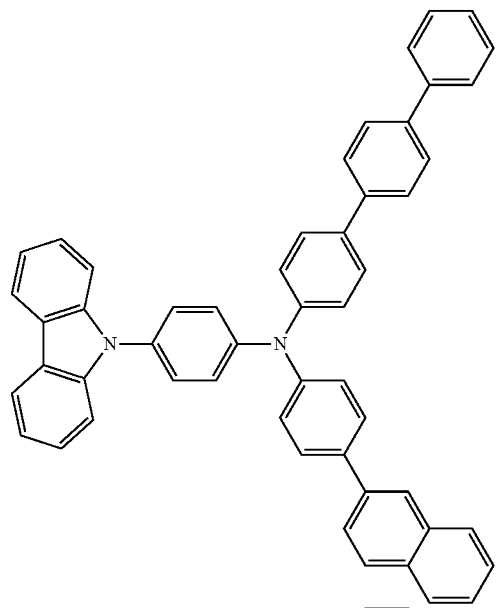
;
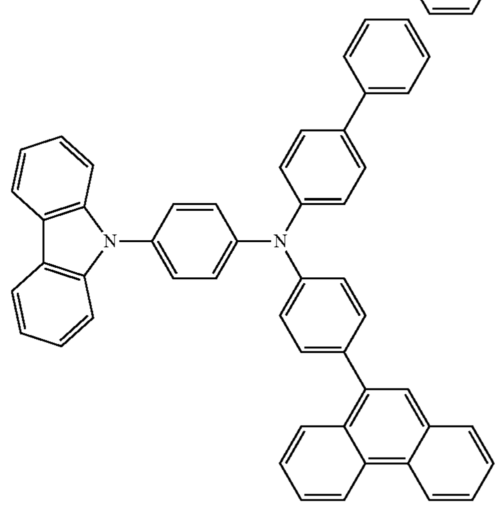
;

-continued
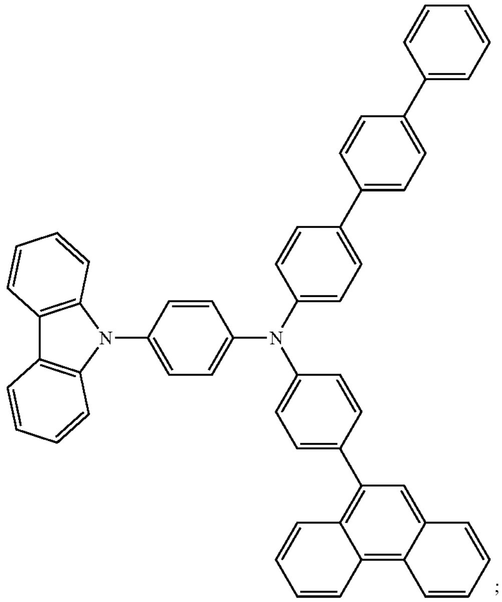
;
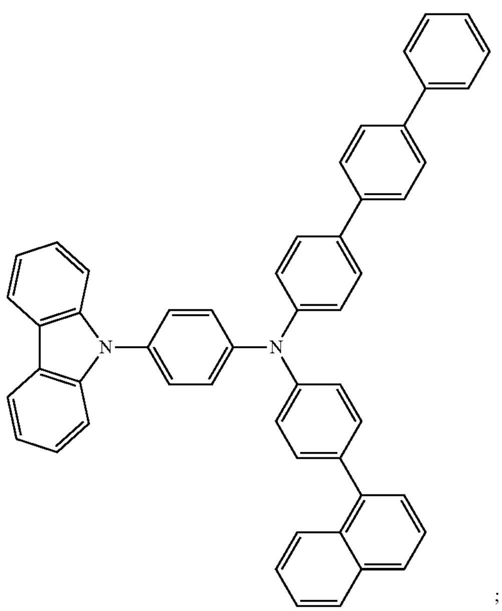
;
-continued
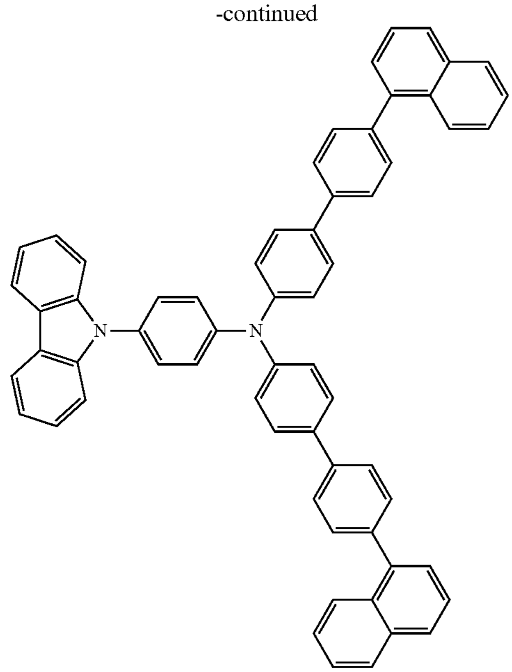
;
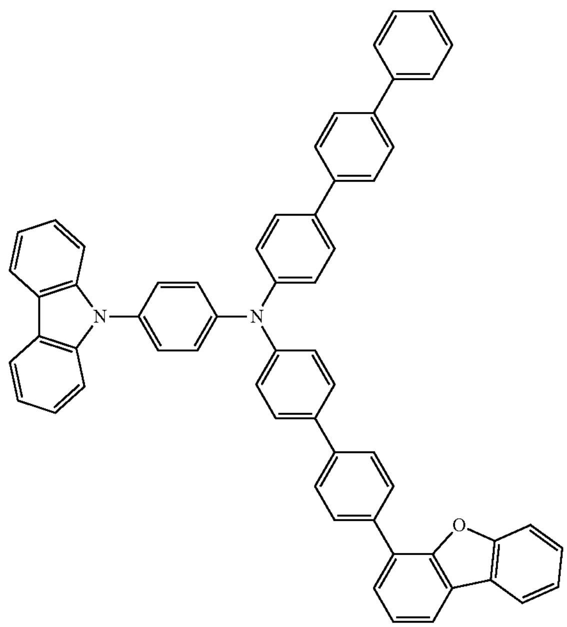
;
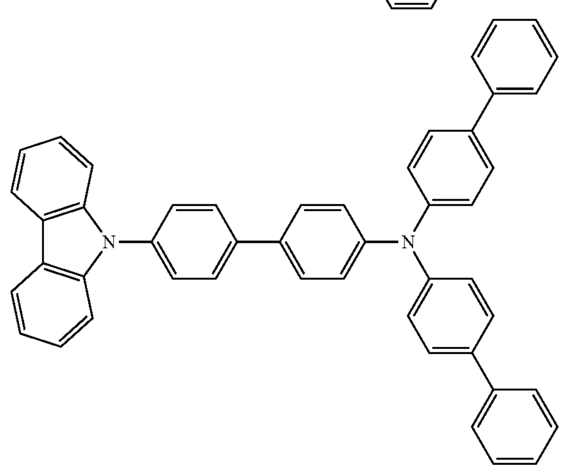
;

-continued
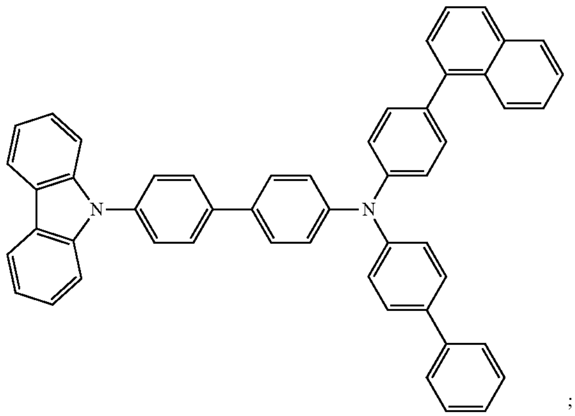
;
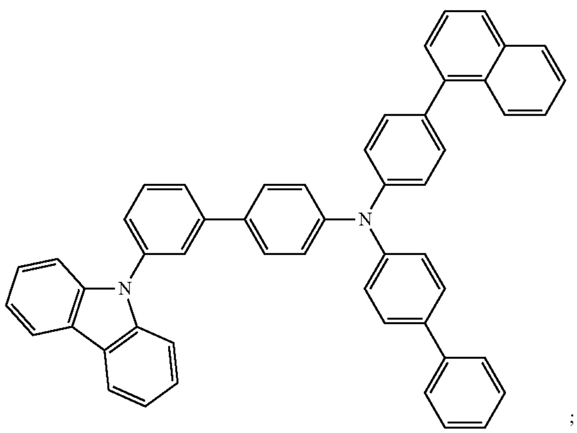
;
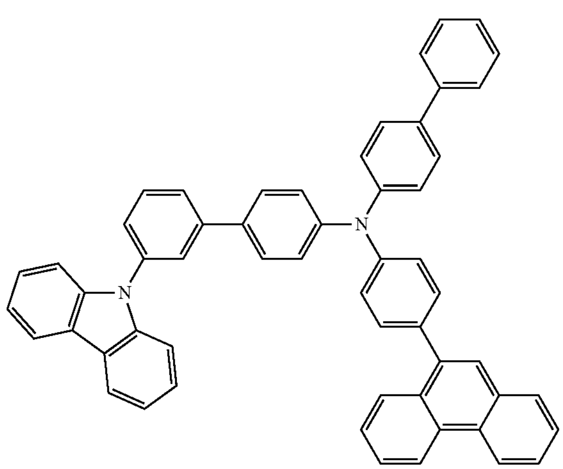
;
-continued
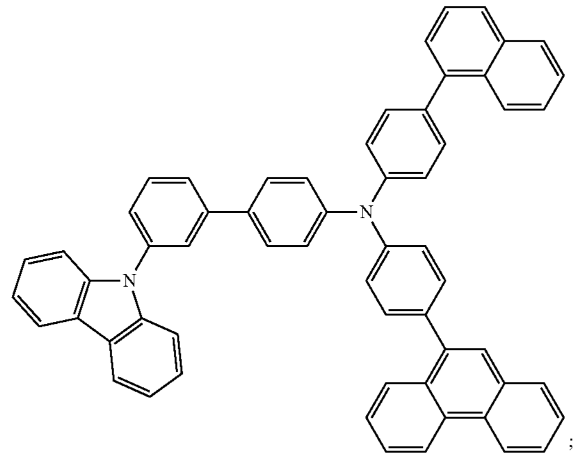
;
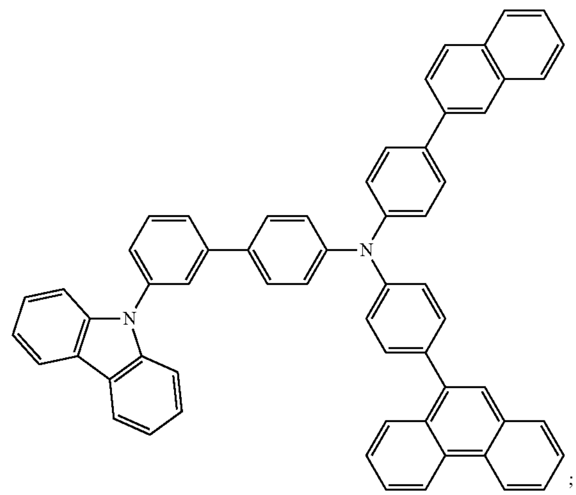
;
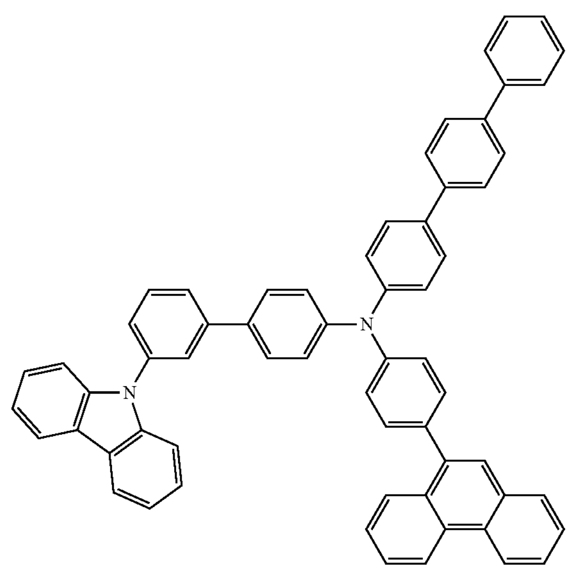
;

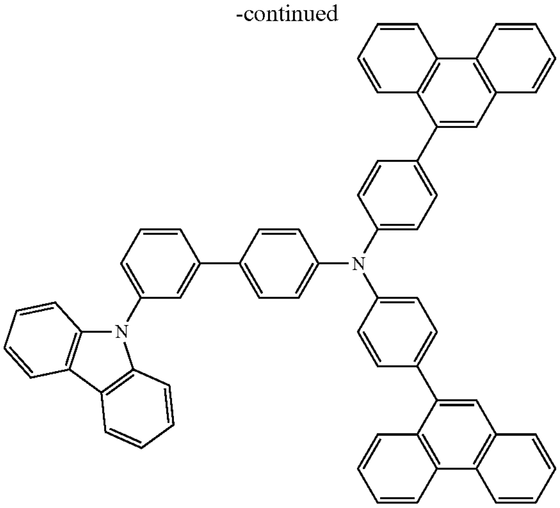
;
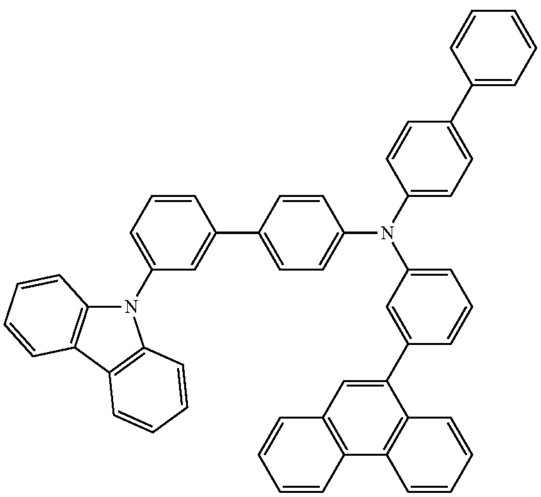
;
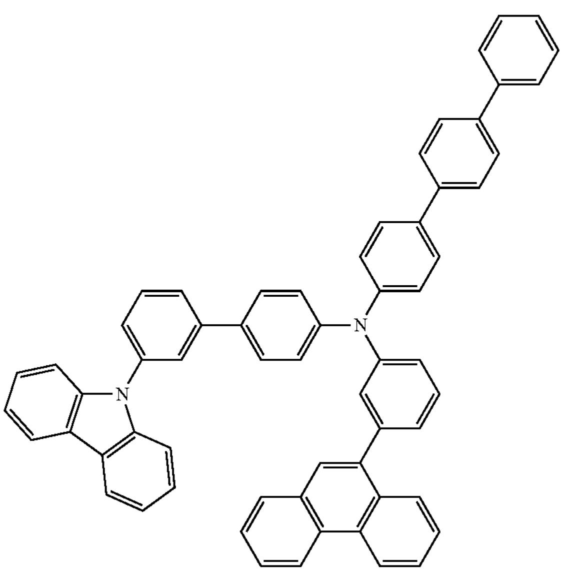
;
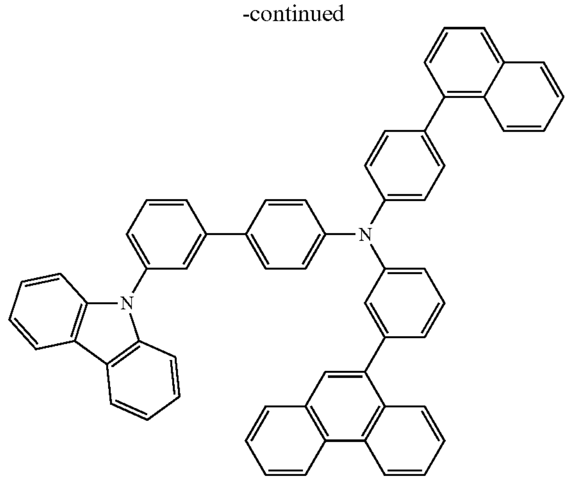
;
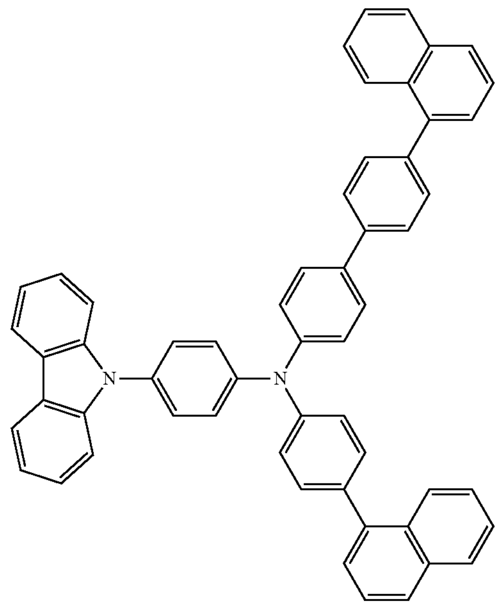
;
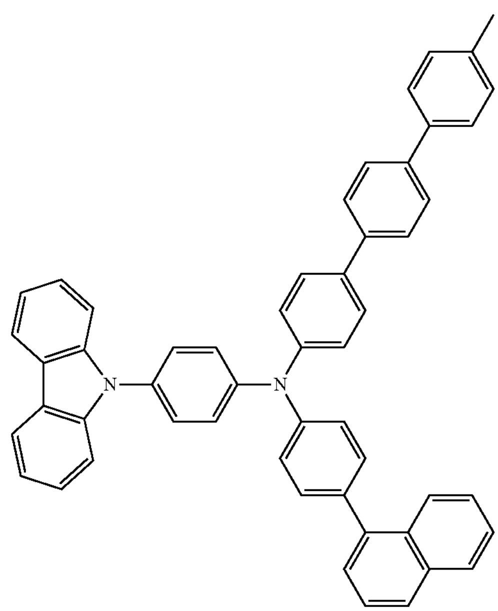
;

-continued
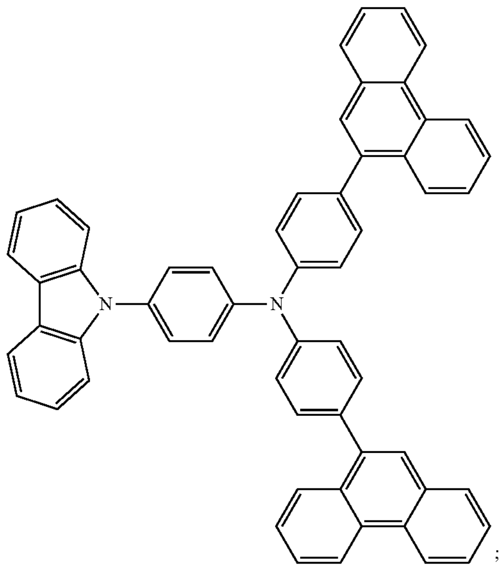
;
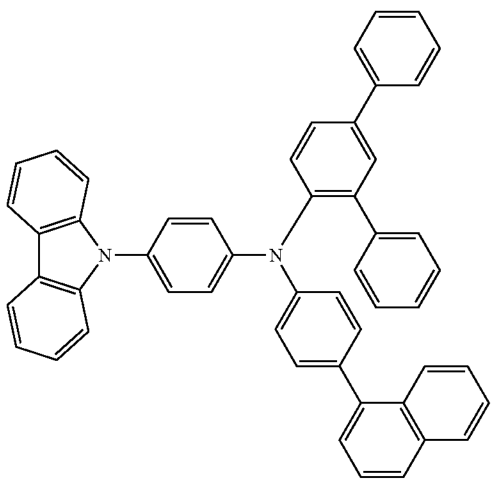
;
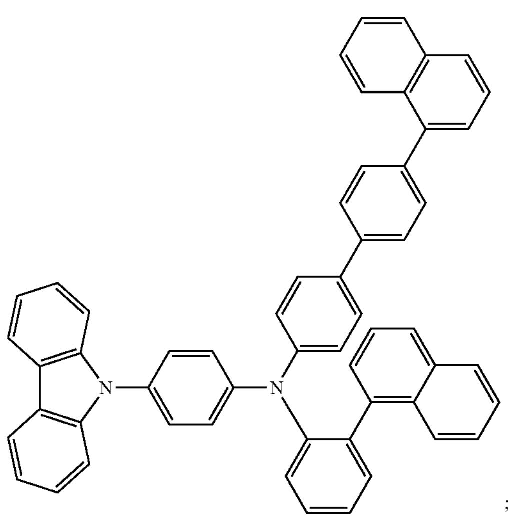
;
-continued
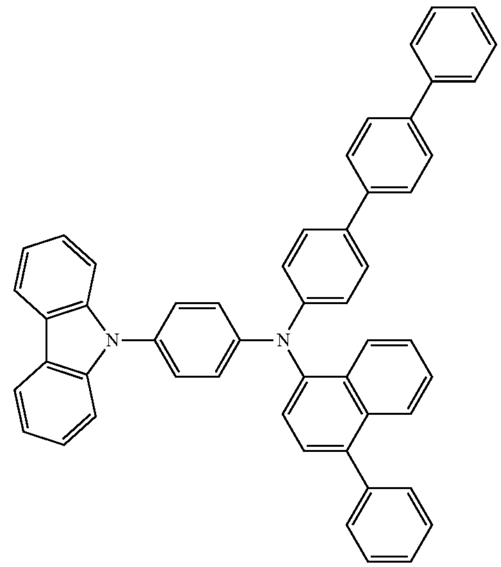
;
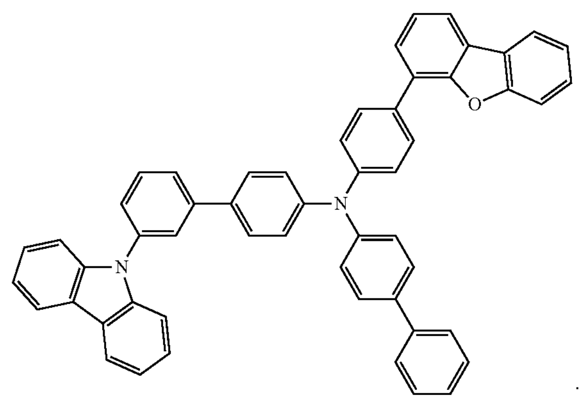
.
21. The organic electroluminescent device of claim 7, wherein the first organic layer includes one of the following compounds:
2-39
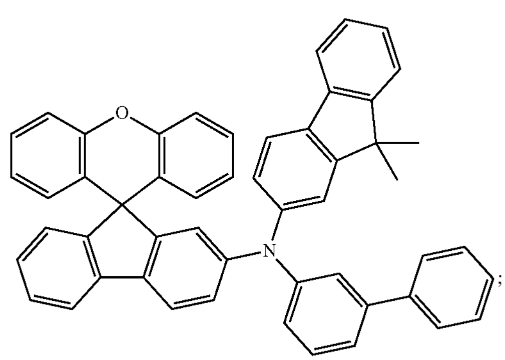
;

-continued
2-40
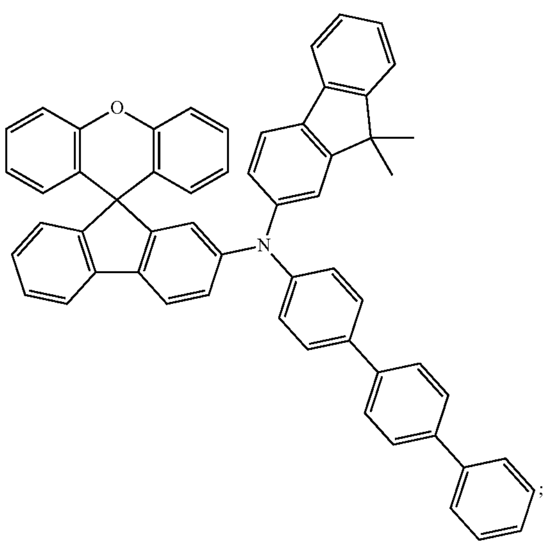
2-41
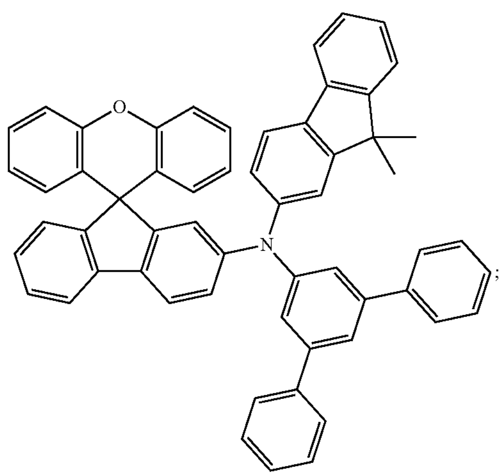
2-43
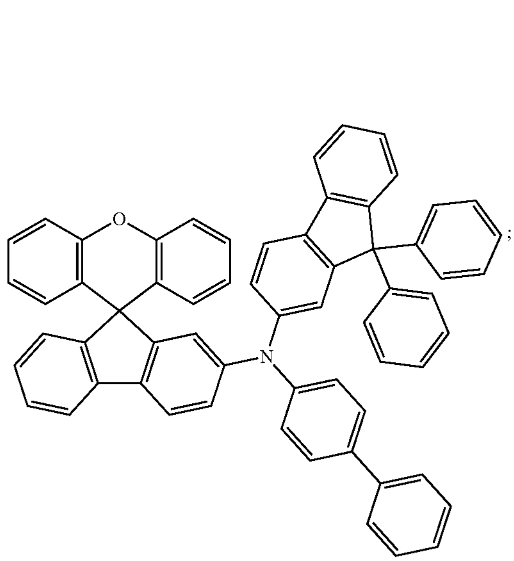
-continued
2-44
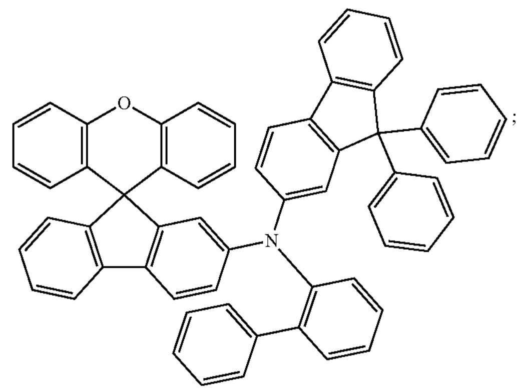
2-46
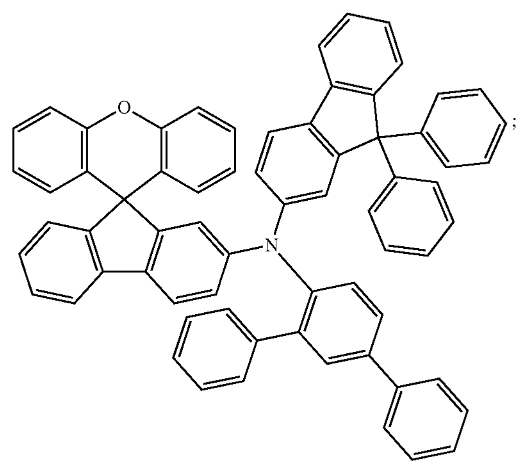
2-47
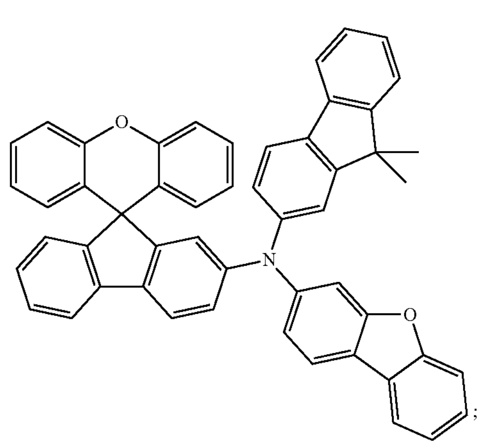

-continued
2-50
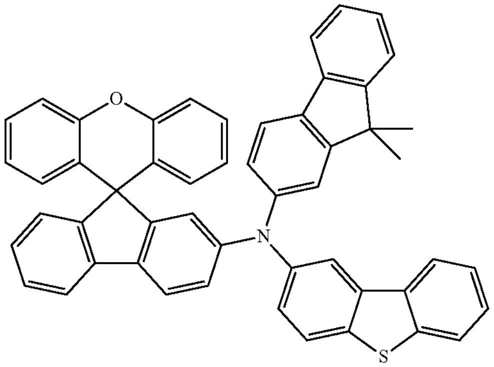
2-52
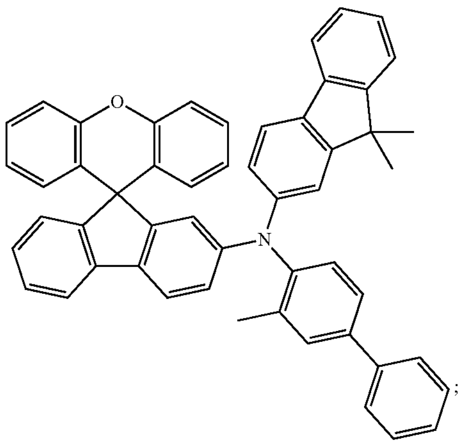
2-53
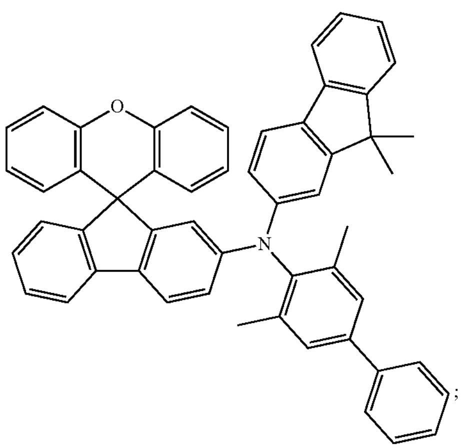
-continued
2-54
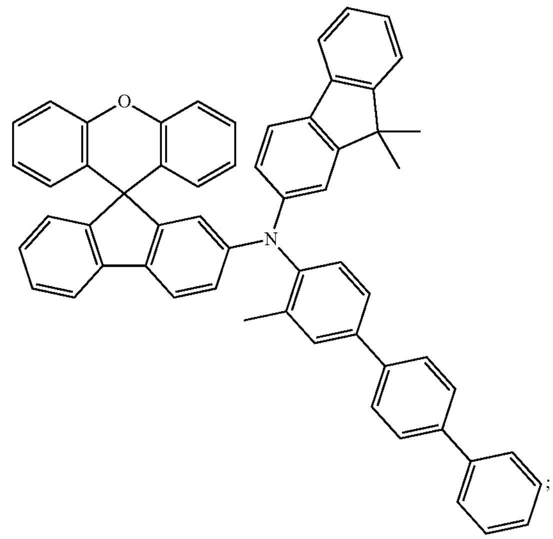
2-55
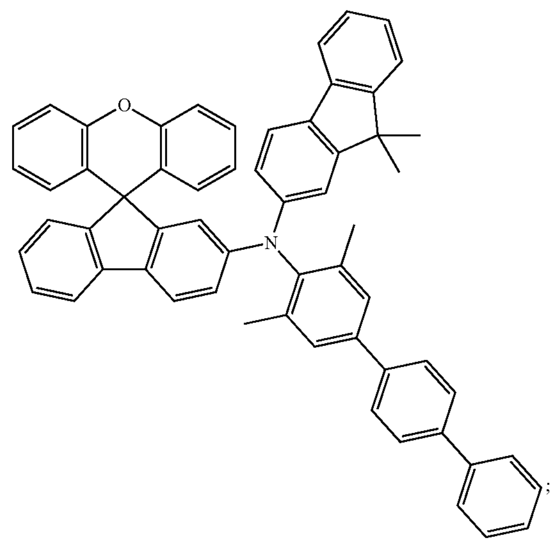
2-56
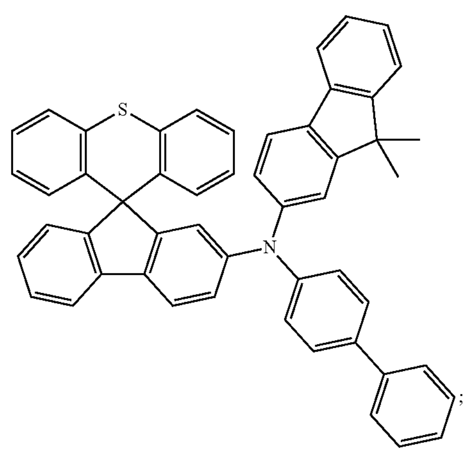

-continued
2-57
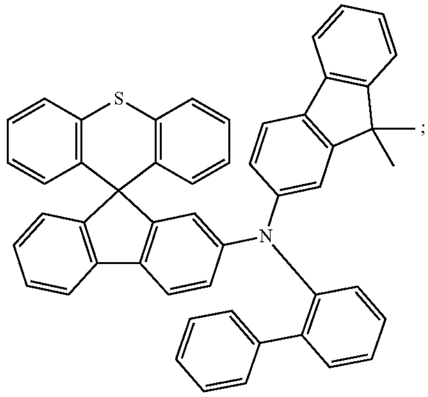
2-60
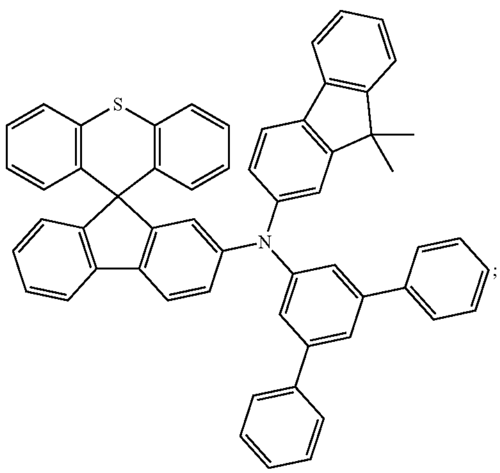
2-59
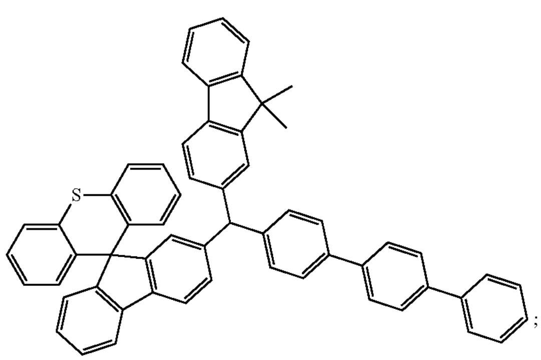
-continued
2-61
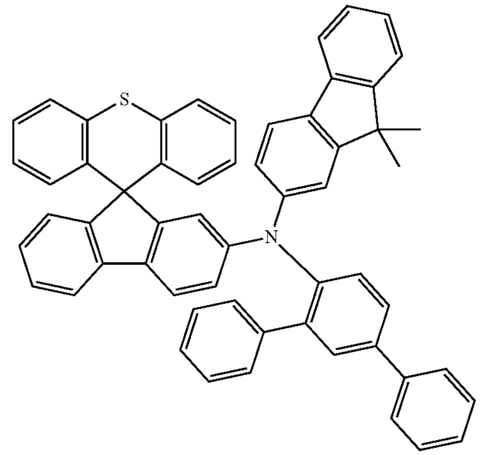
2-62
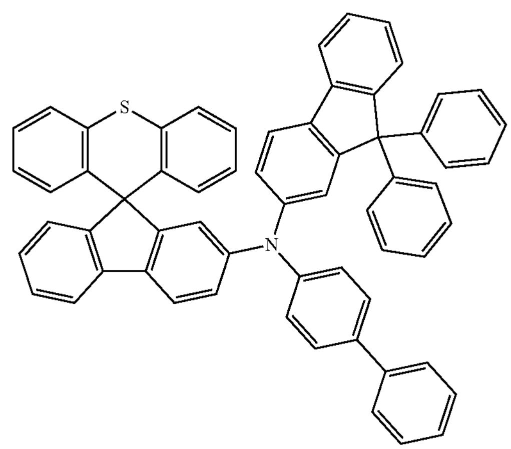
2-63
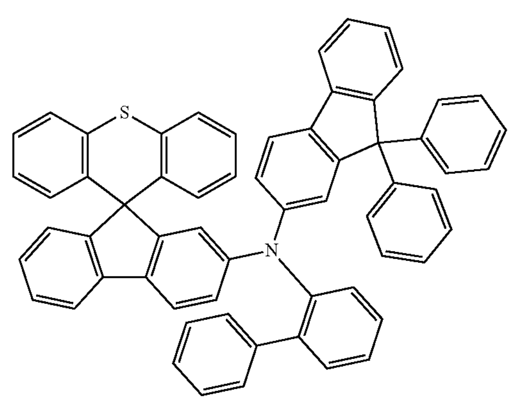

-continued
2-64
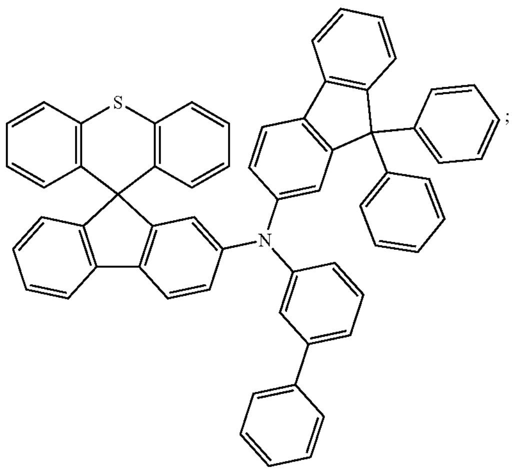
2-65
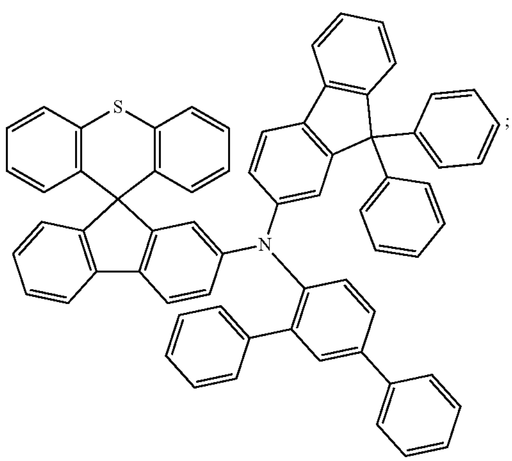
2-66
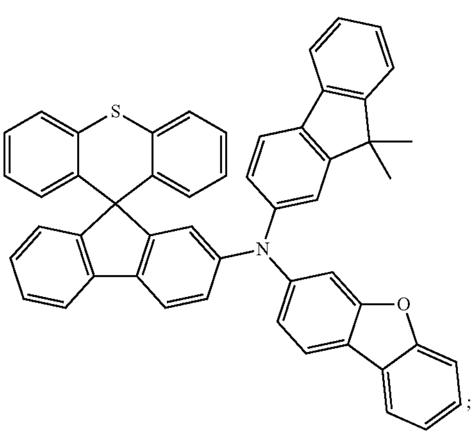
-continued
2-67
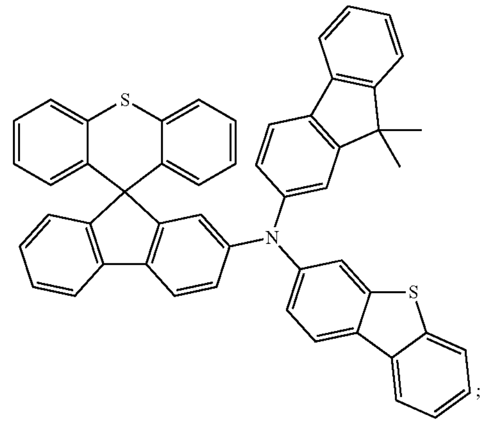
2-68
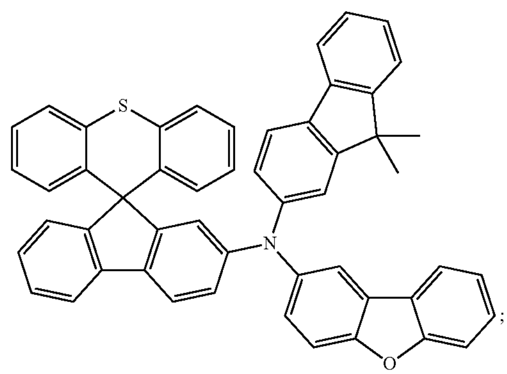
2-70
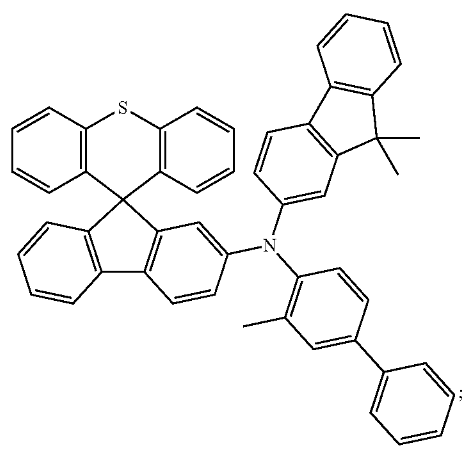
2-69
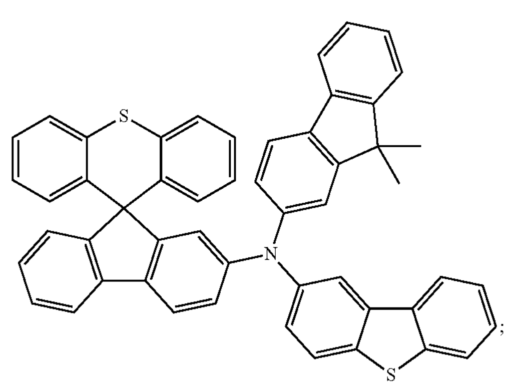

-continued
2-71
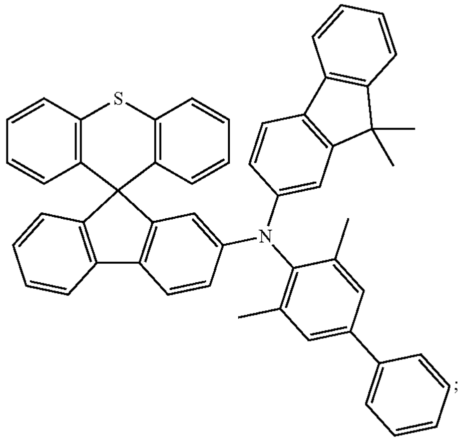
2-73
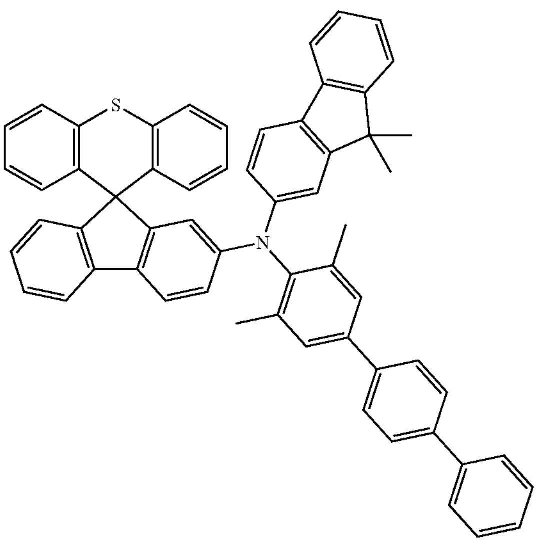
2-72
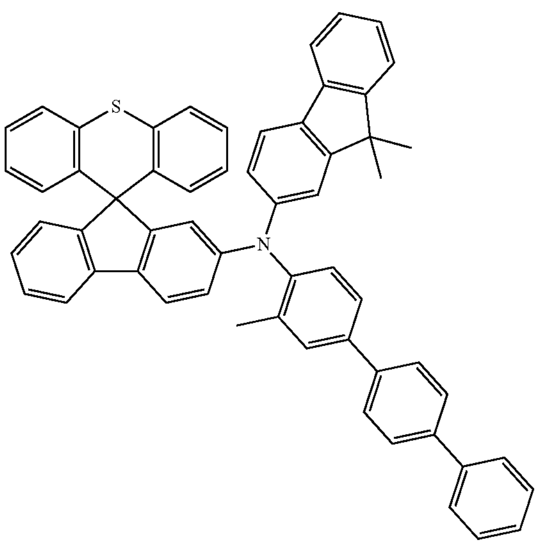
-continued
2-82
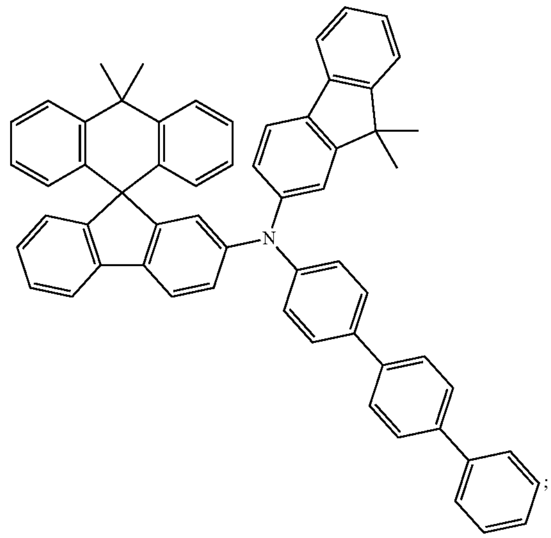
2-99
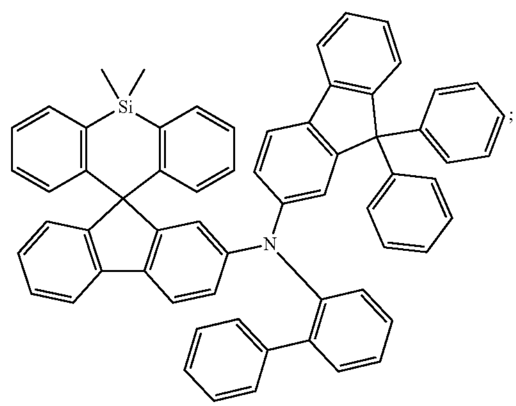
2-76
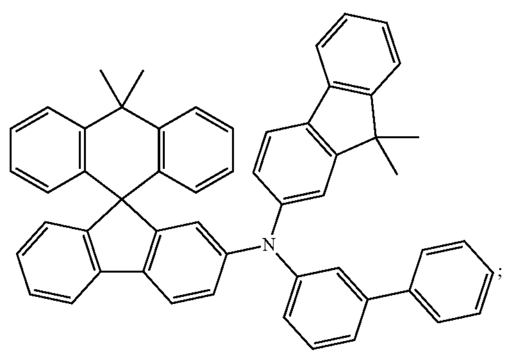

-continued
2-77
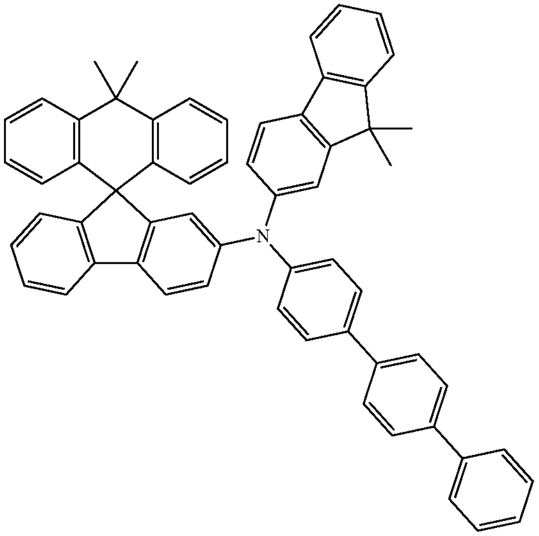
2-78
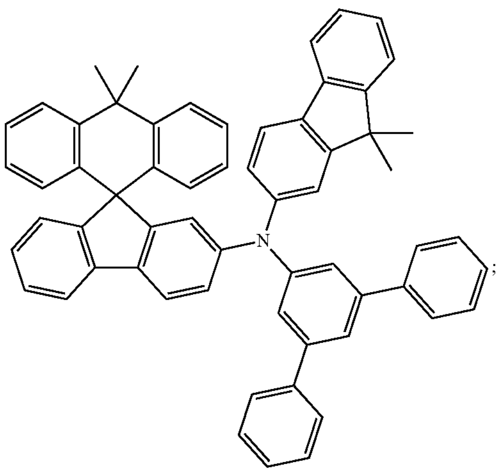
2-79
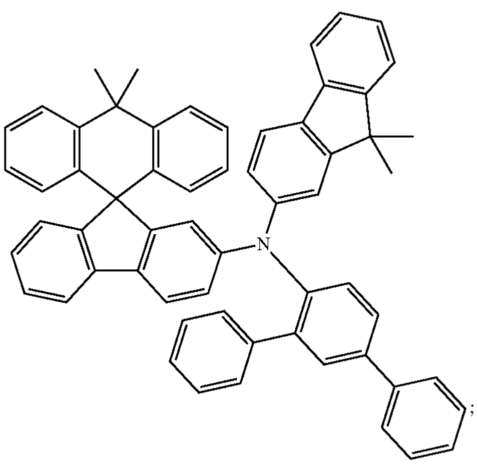
-continued
2-80
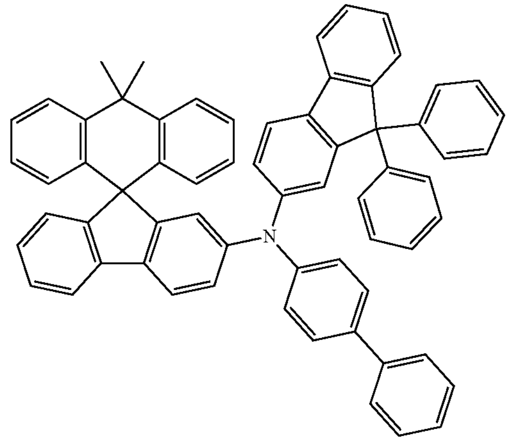
2-81
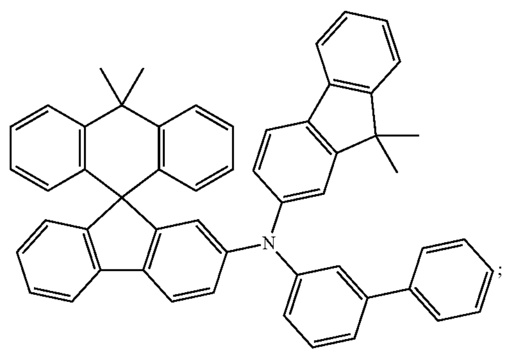
2-83
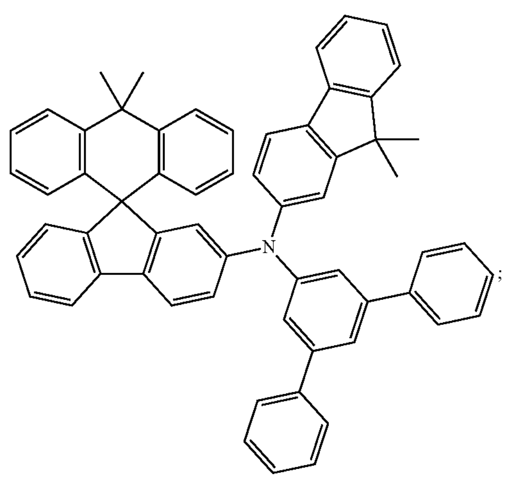

-continued
2-84
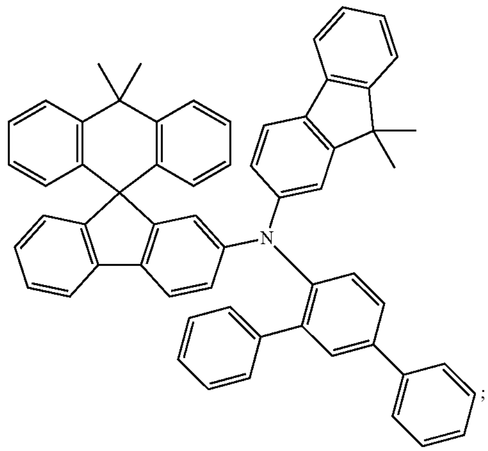
2-85
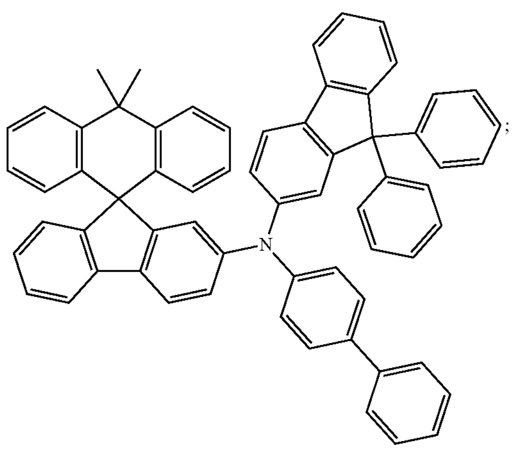
2-86
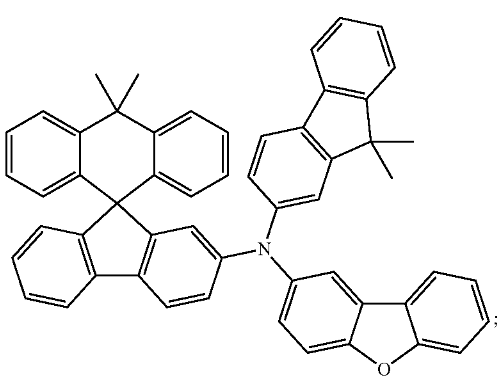
-continued
2-87
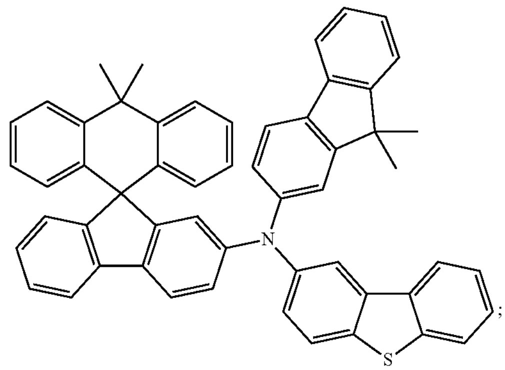
2-88
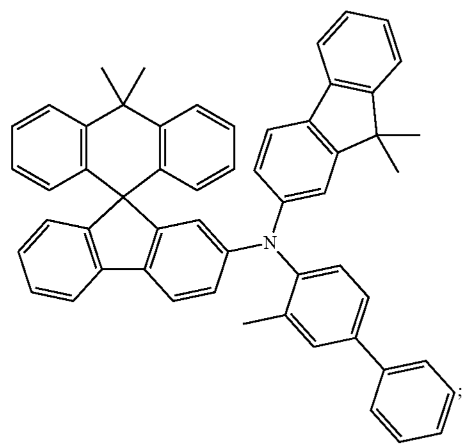
2-89
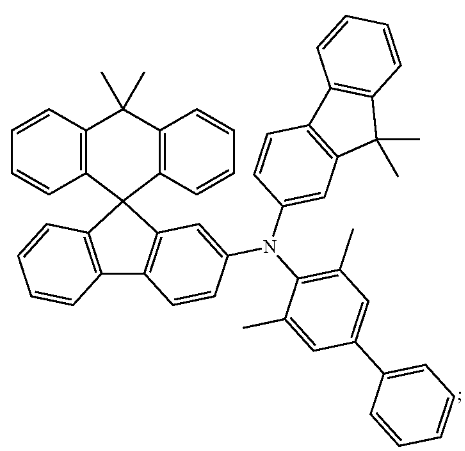

-continued
2-90
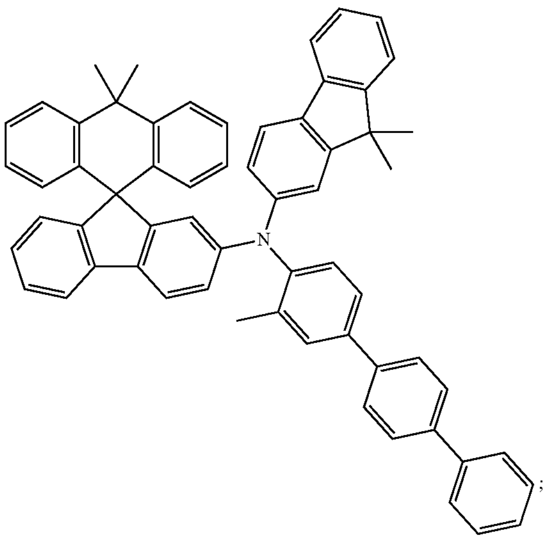
2-91
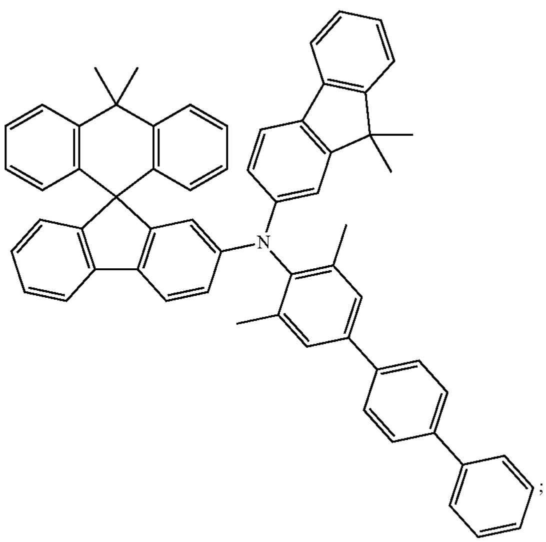
2-92
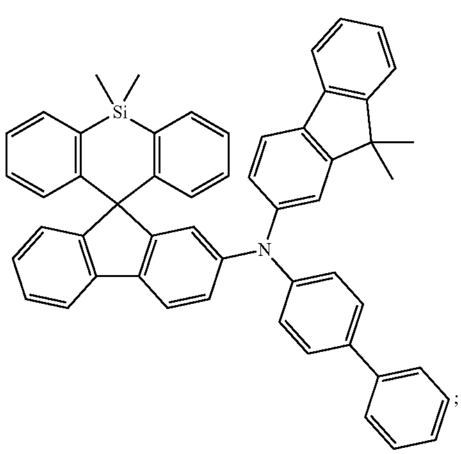
-continued
2-93
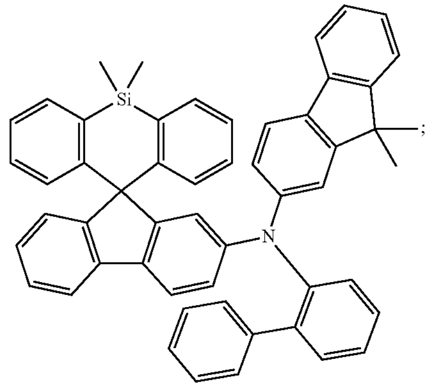
2-94
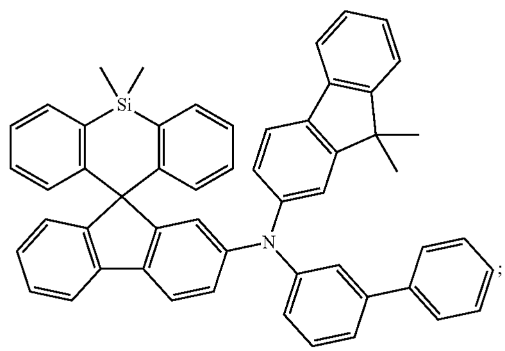
2-95
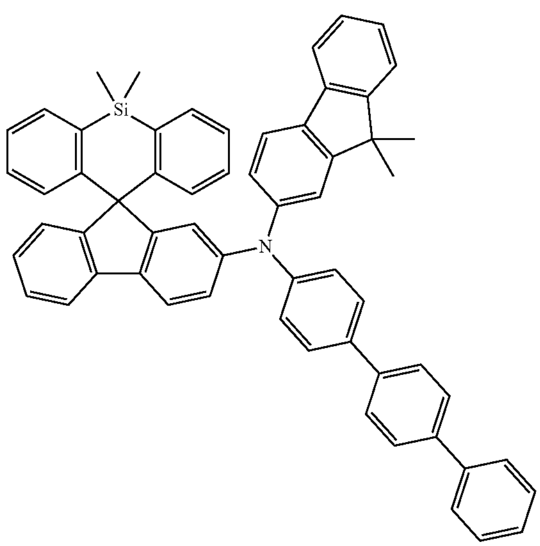

-continued
2-96
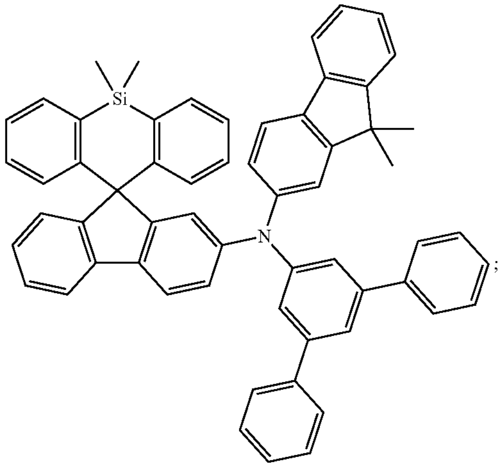
2-97
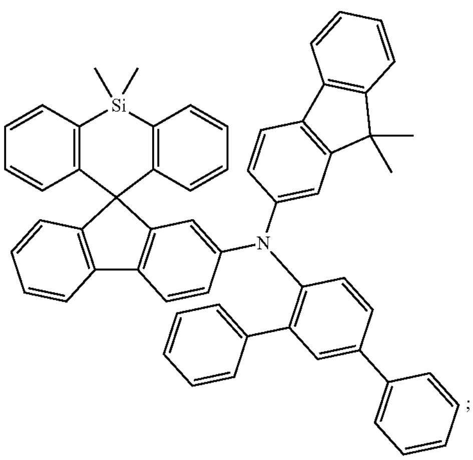
2-98
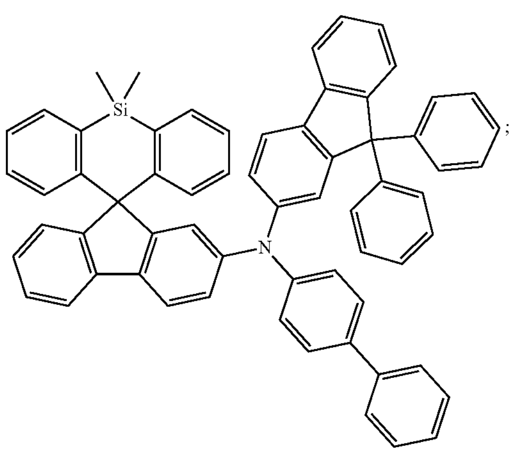
-continued
2-100
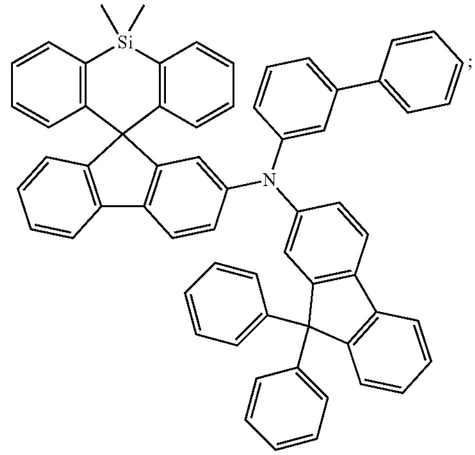
2-101
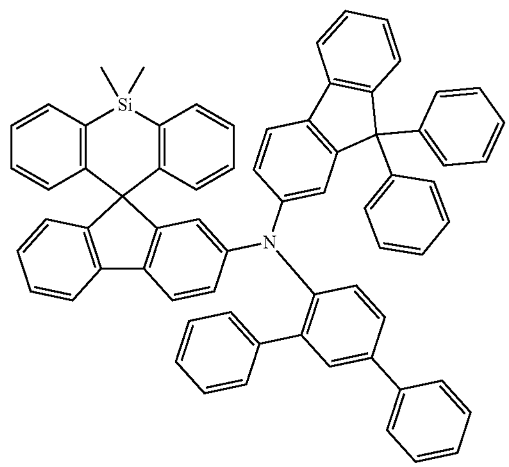
2-102
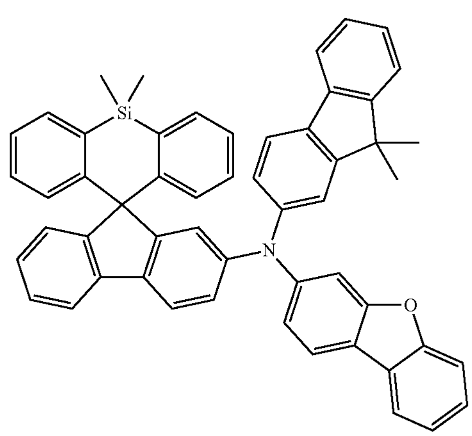

-continued
2-103
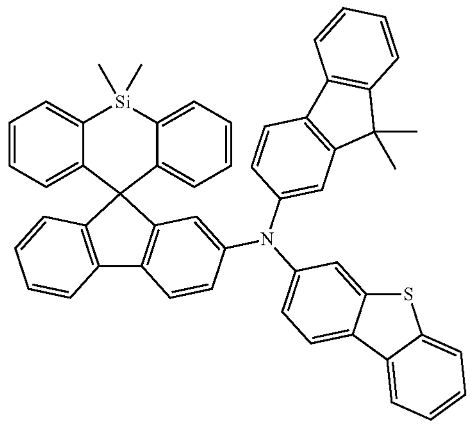
;
2-104
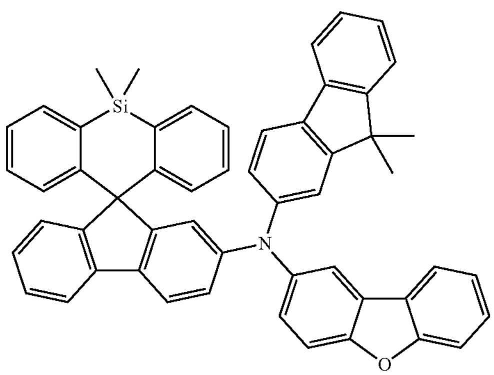
;
2-105
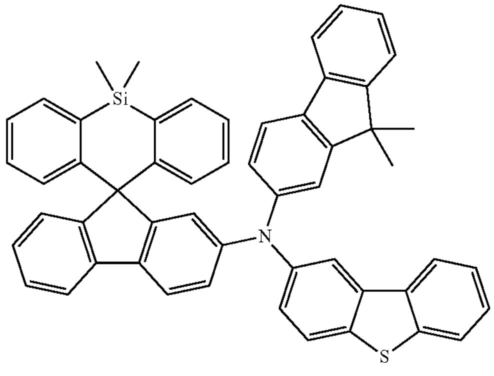
;
-continued
2-106
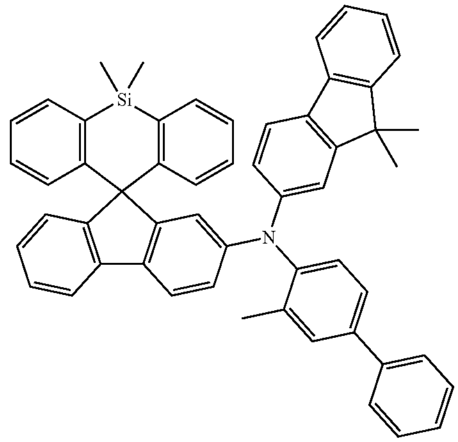
;
2-107
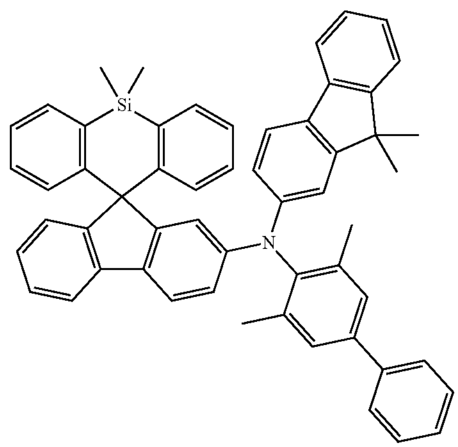
;
2-108
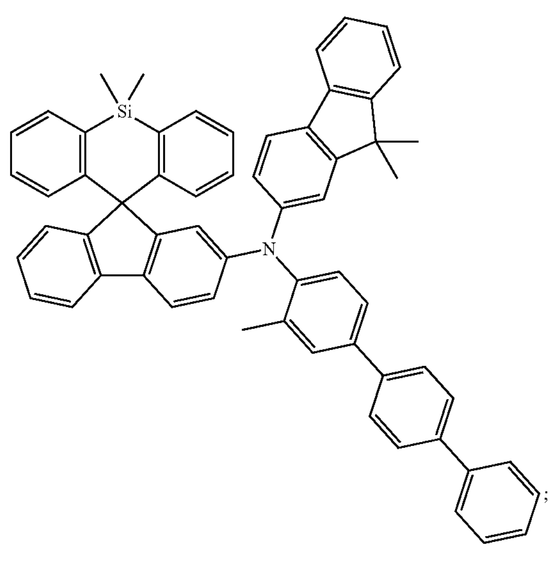
;

-continued
2-109
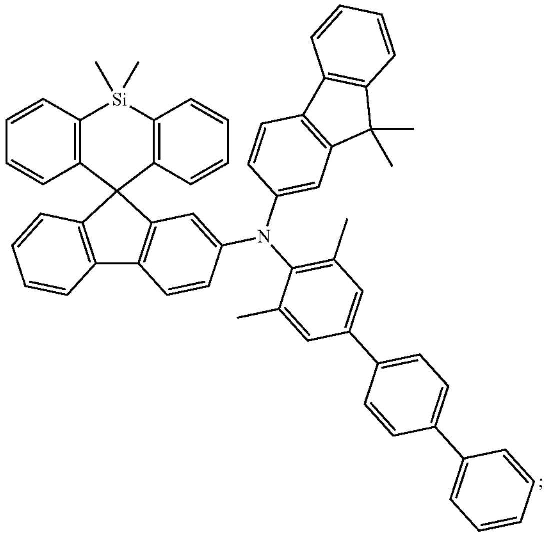
2-112
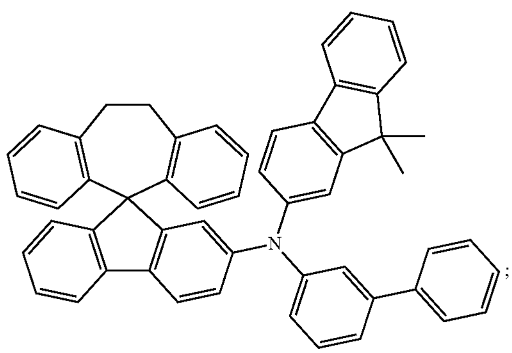
2-113
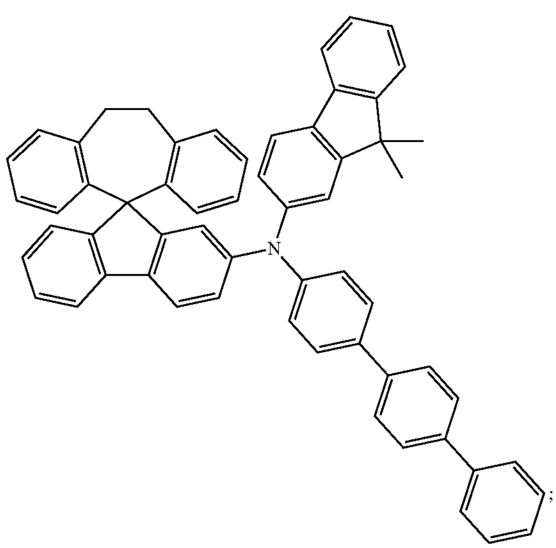
-continued
2-114
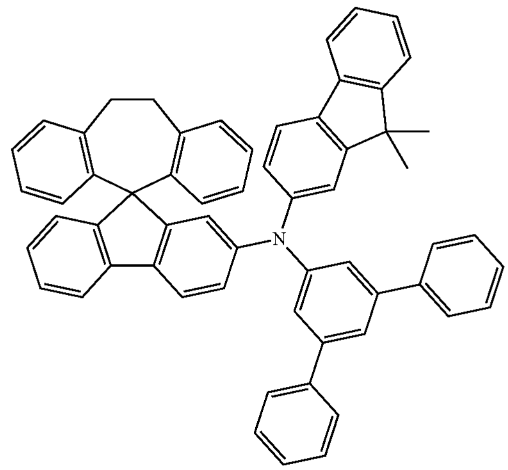
2-115
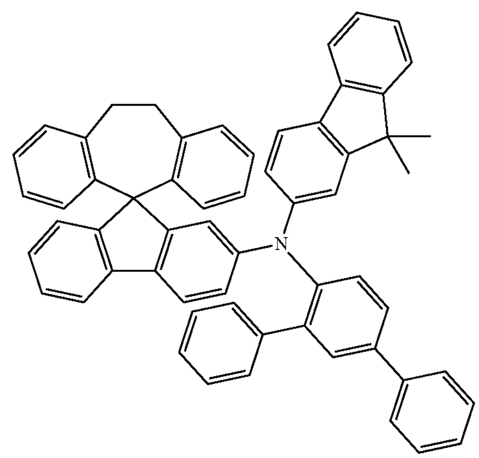
2-116
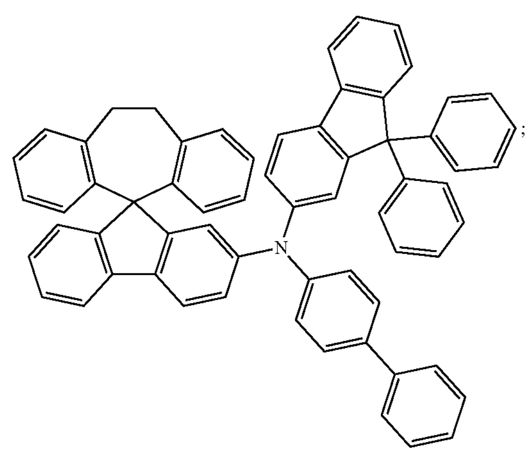

-continued
2-117
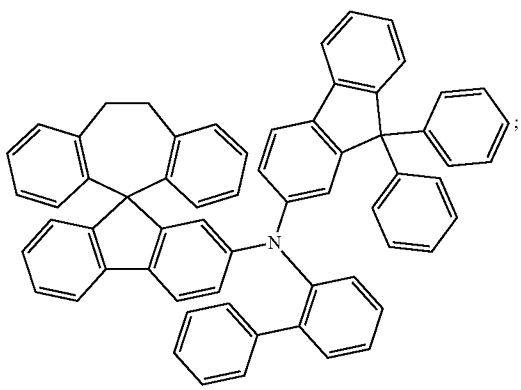
2-118
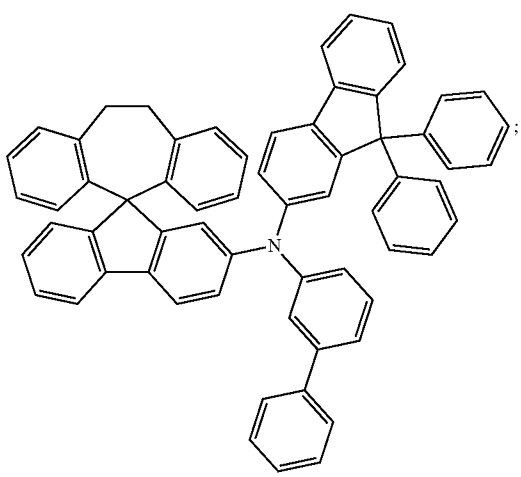
2-119
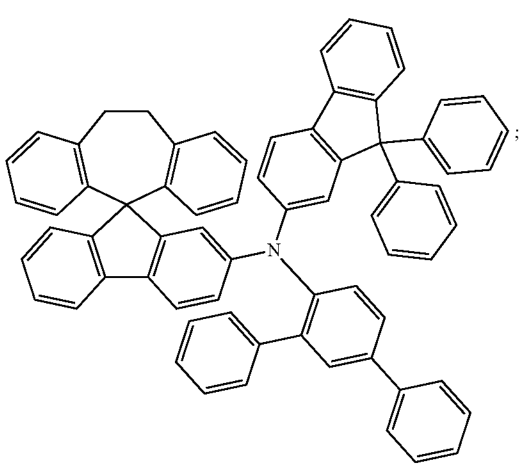
-continued
2-120
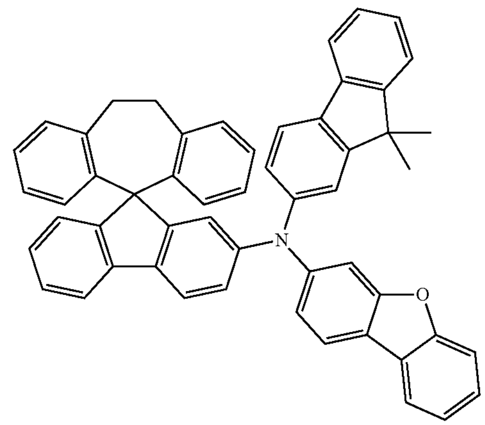
2-121
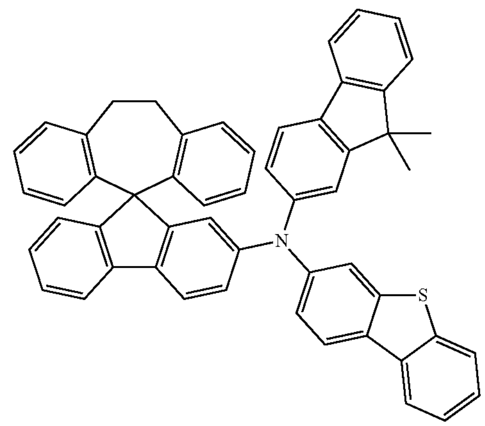
2-122
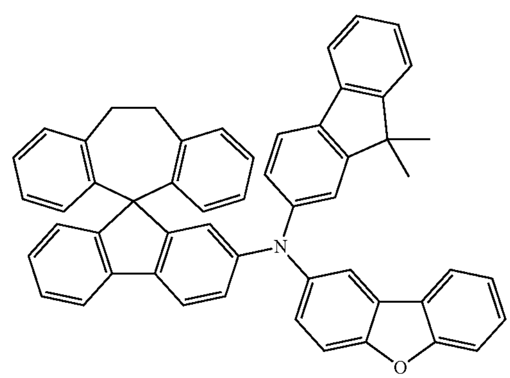
2-123
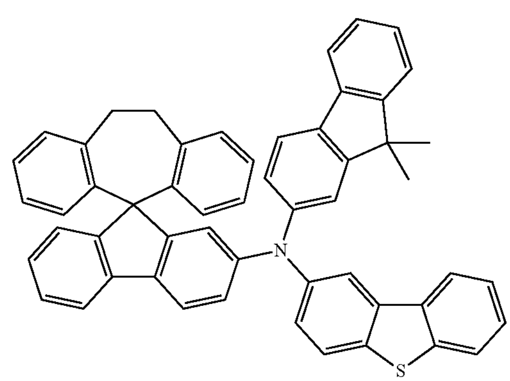

-continued
2-124
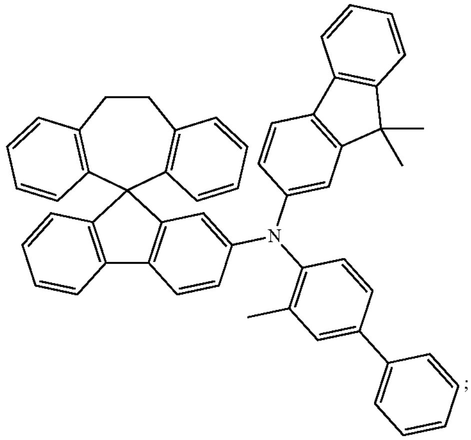
2-125
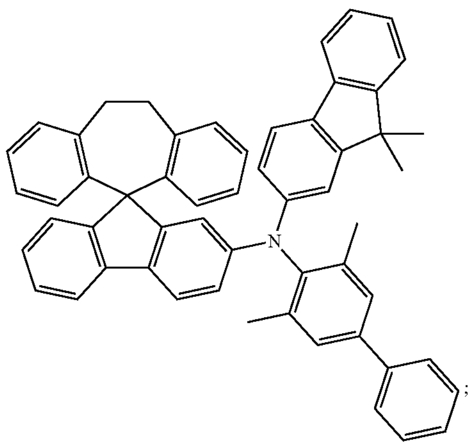
2-126
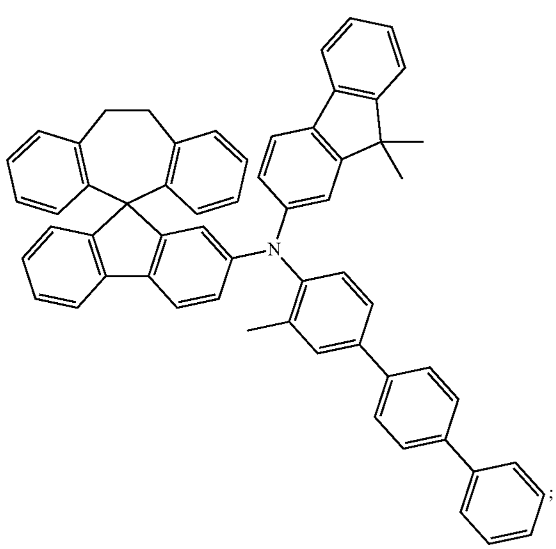
-continued
2-127
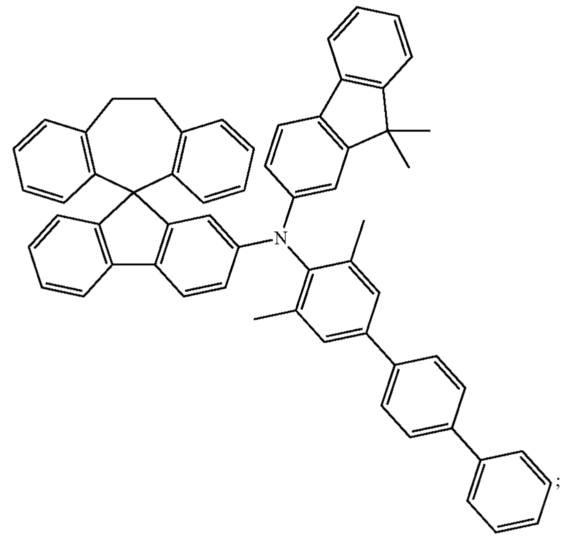
2-130
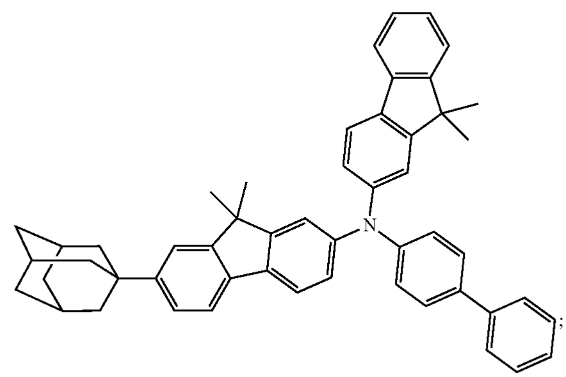
2-131
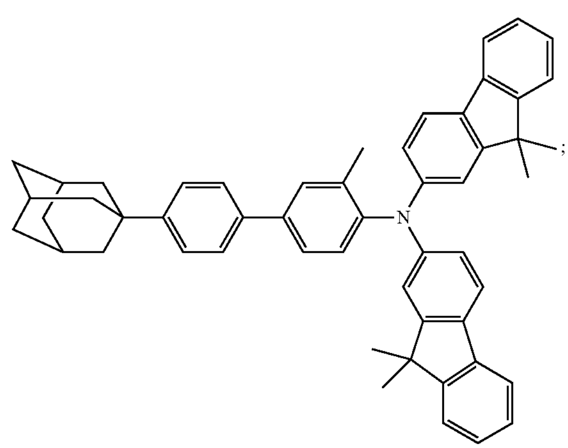

-continued
2-132
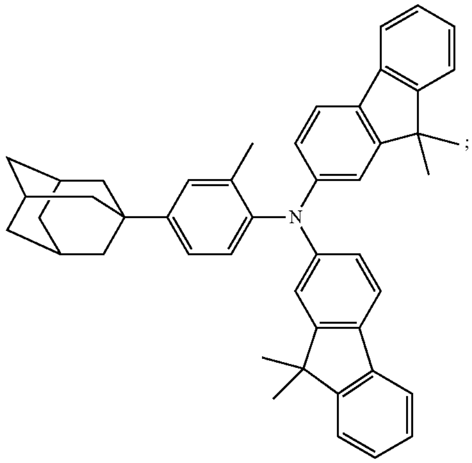
2-133
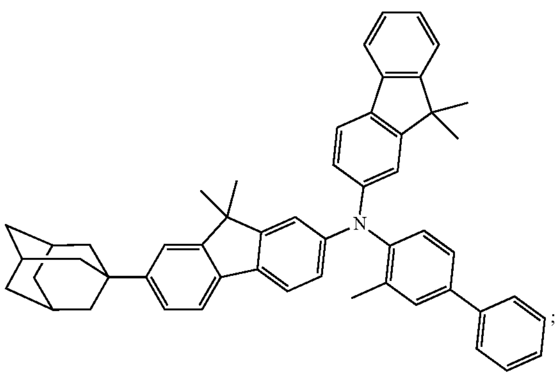
2-134
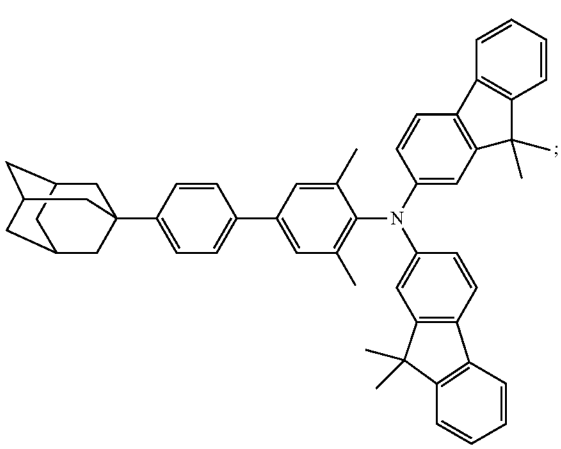
-continued
2-135
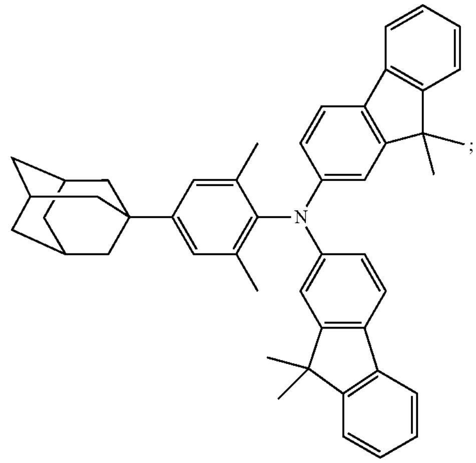
2-136
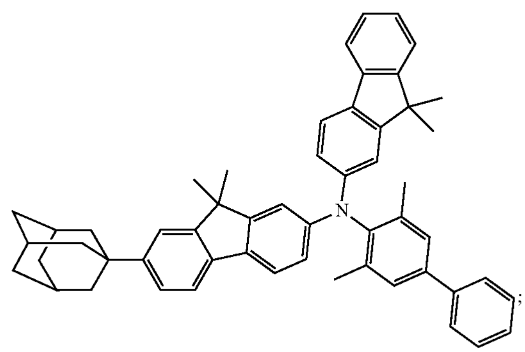
2-137
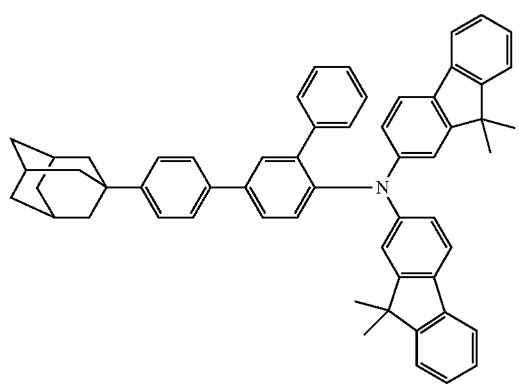

-continued
2-138
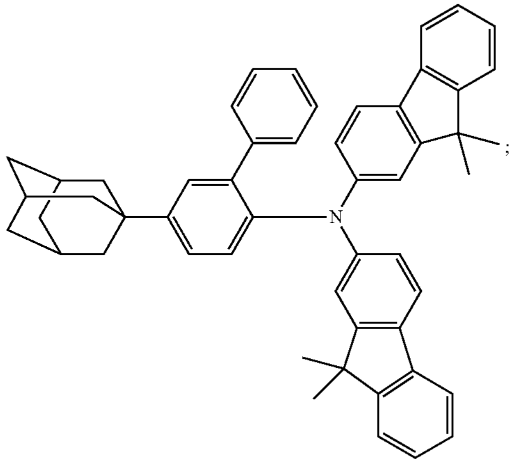
2-139
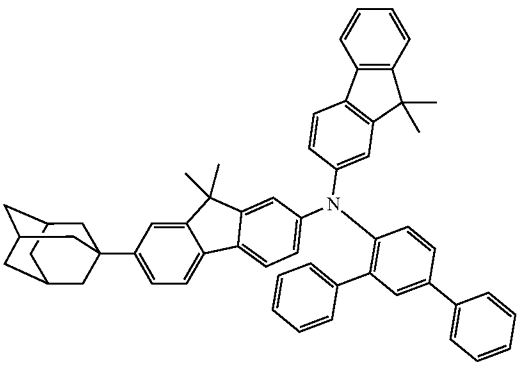
2-140
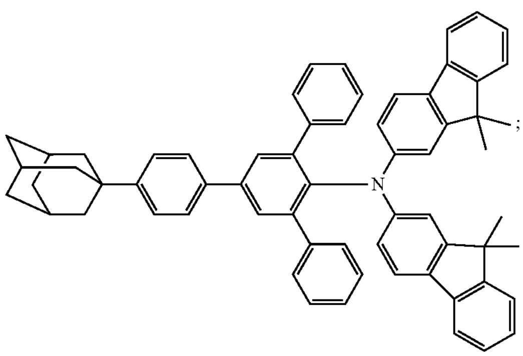
2-141
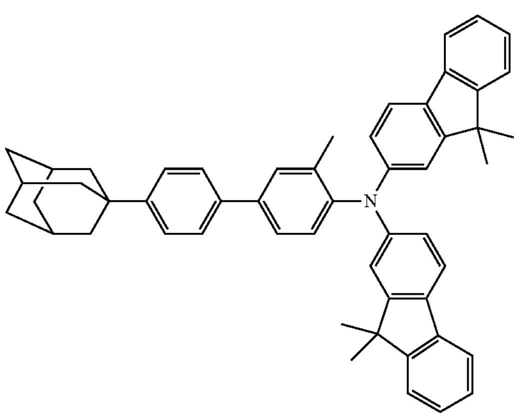
-continued
2-142
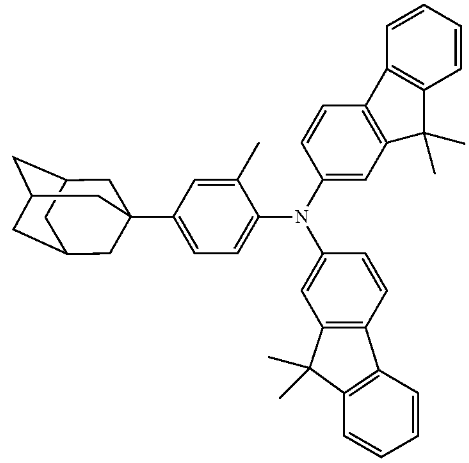
2-143
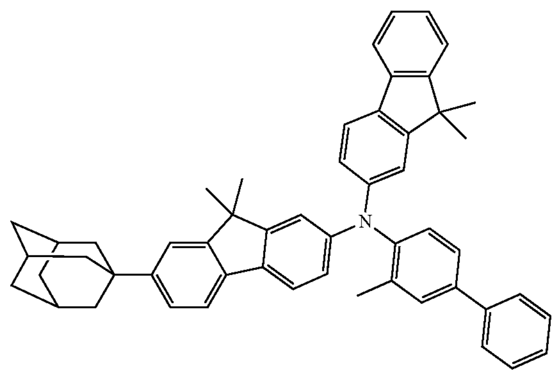
2-144
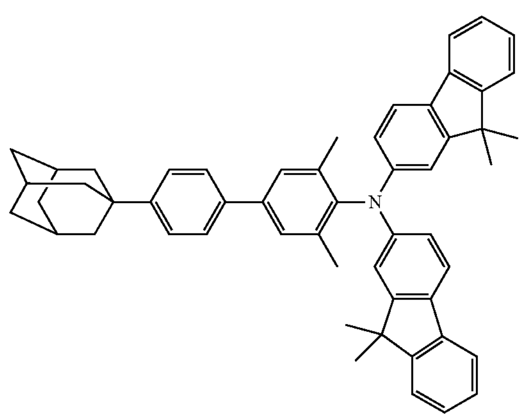

-continued
2-145
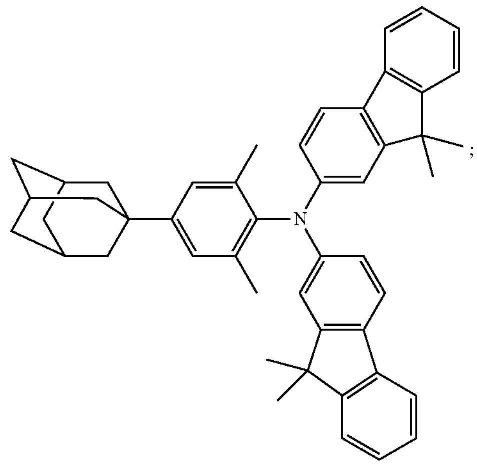
2-146
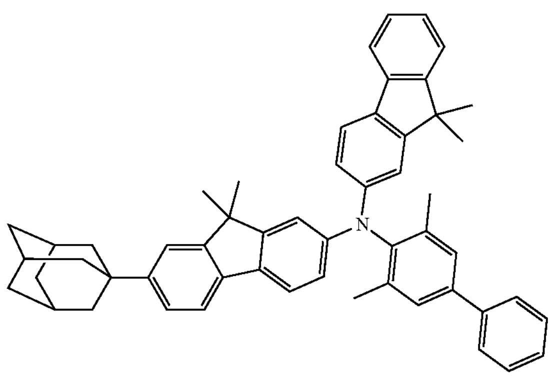
2-147
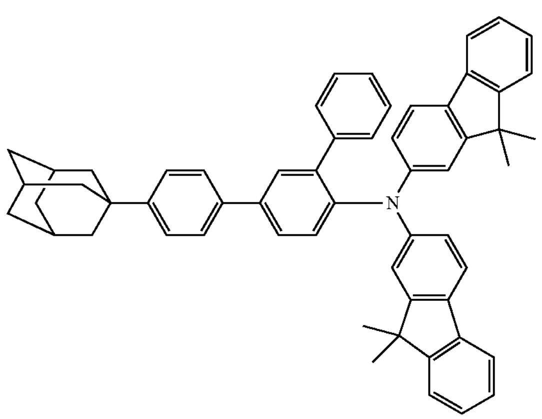
-continued
2-149
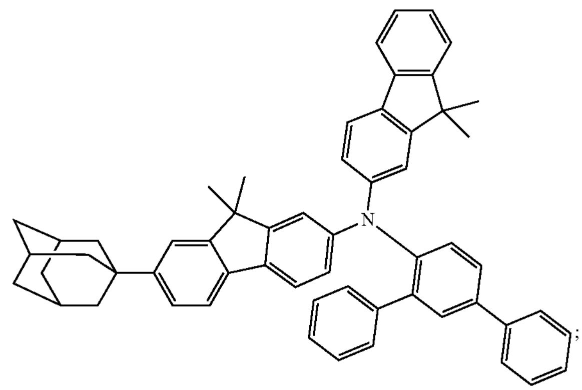
2-150
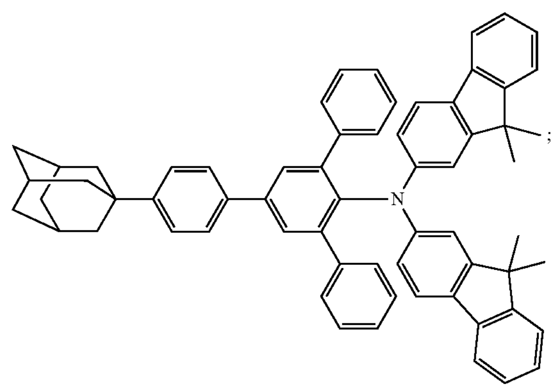
2-148
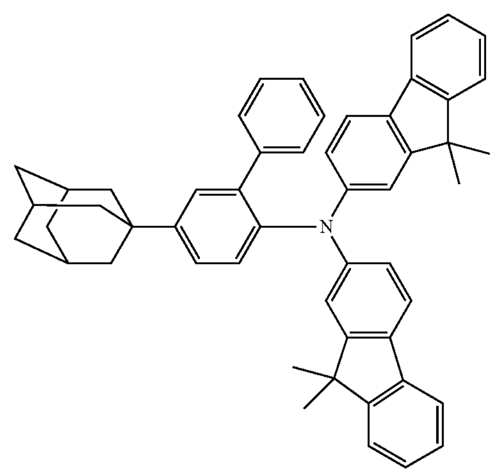

-continued
2-151
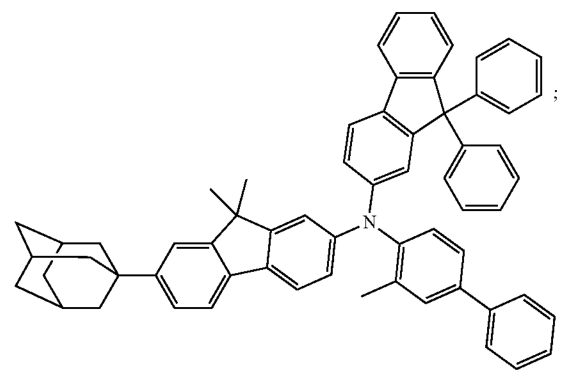
2-152
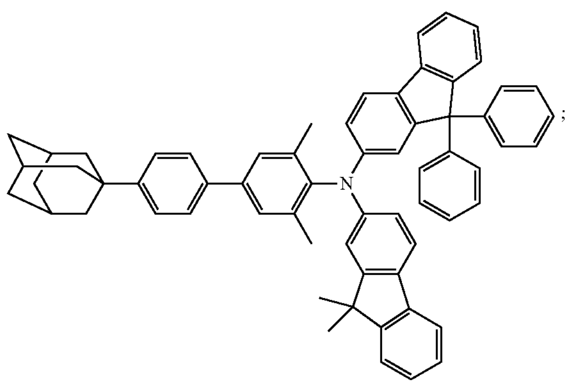
2-153
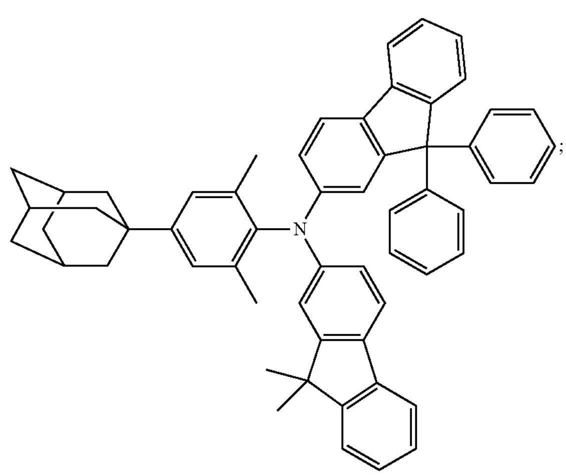
-continued
2-154
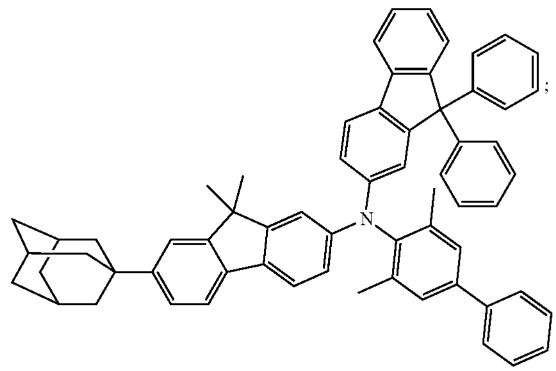
2-155
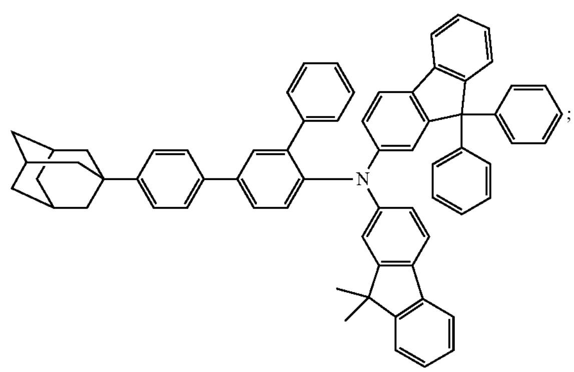
2-156
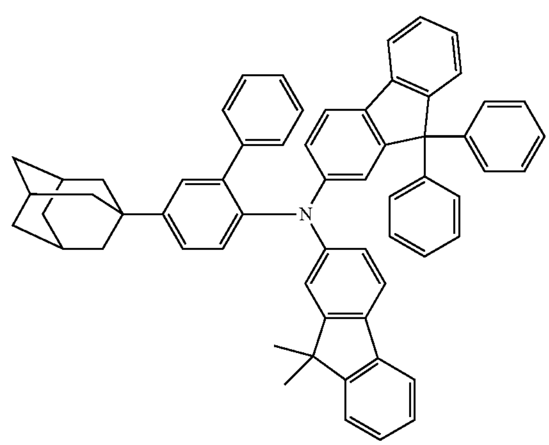

-continued
2-157
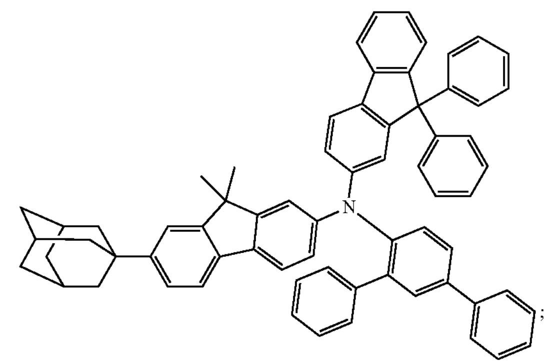
2-158
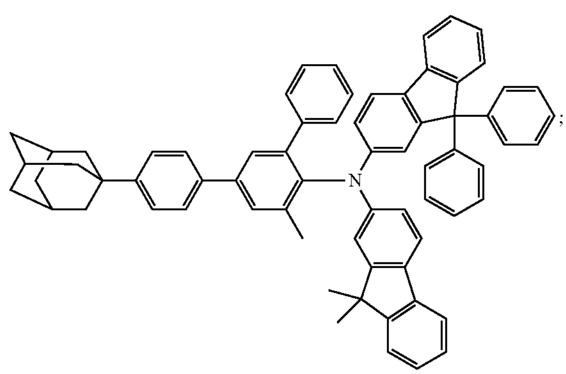
2-159
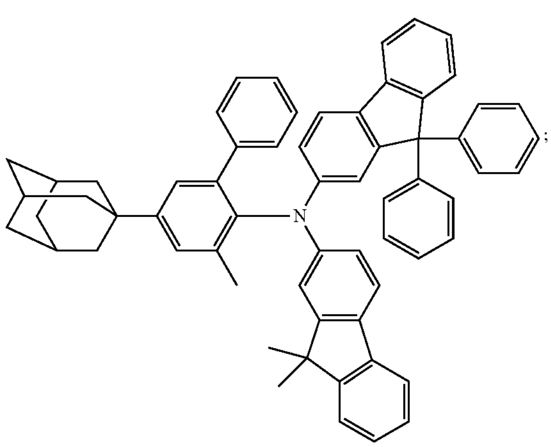
-continued
2-160
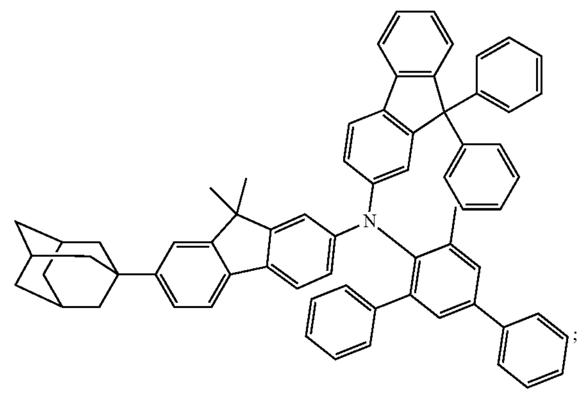
2-162
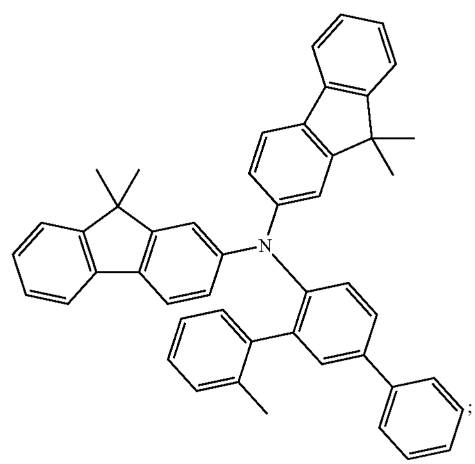
2-163
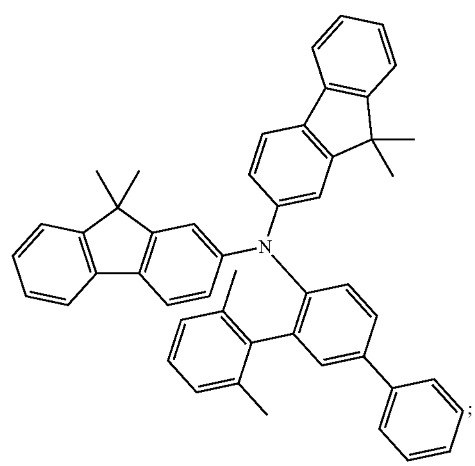

-continued
2-164
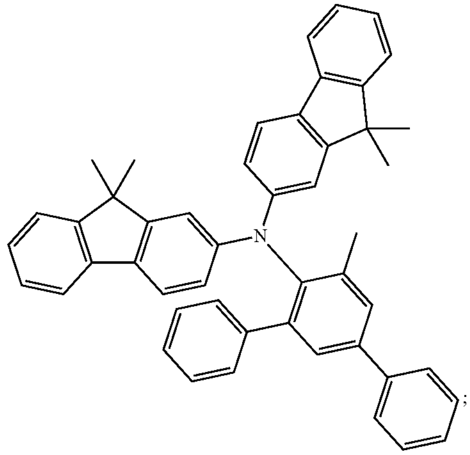
2-165
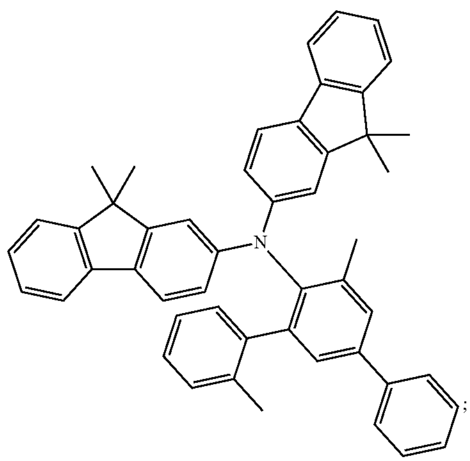
2-166
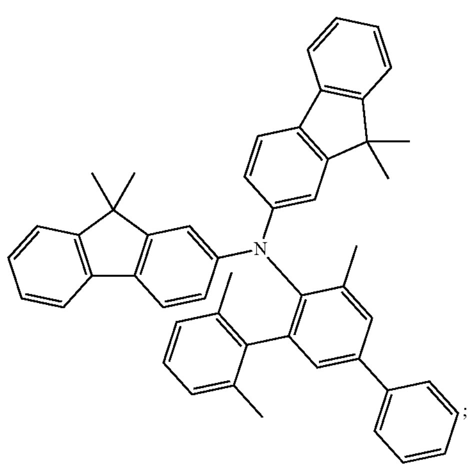
-continued
2-167
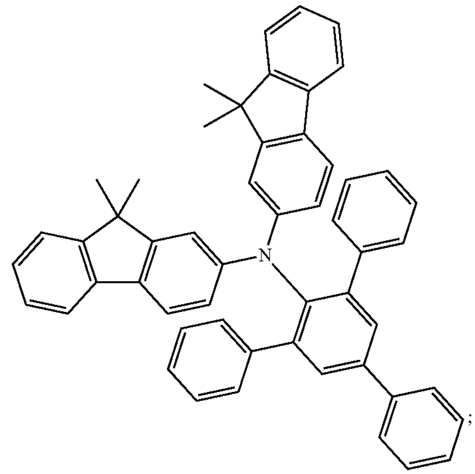
2-168
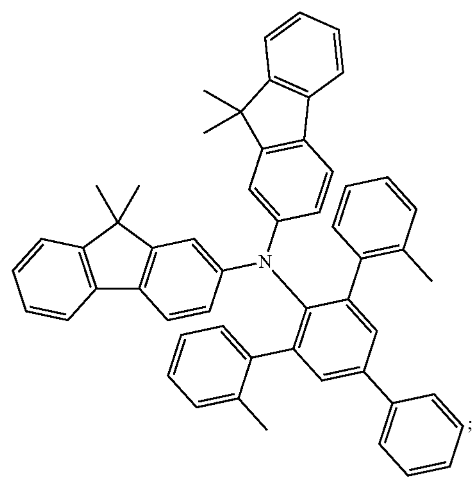
2-169
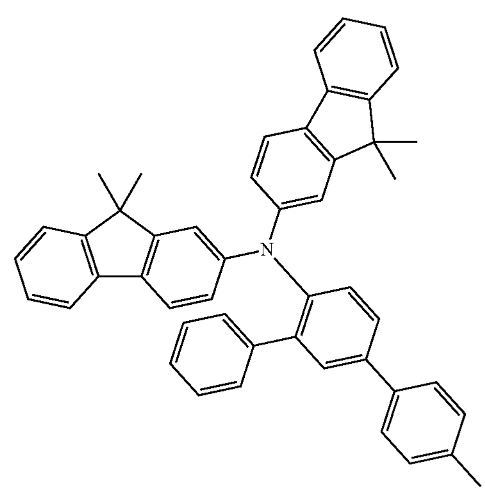

-continued
2-170
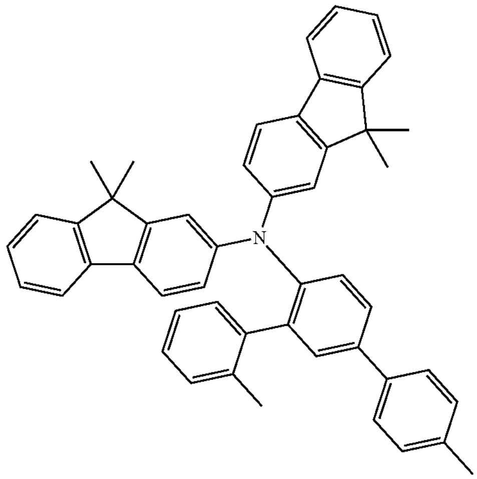
;
2-171
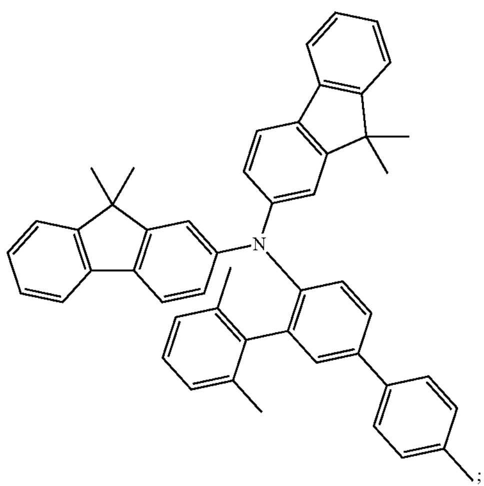
;
2-172
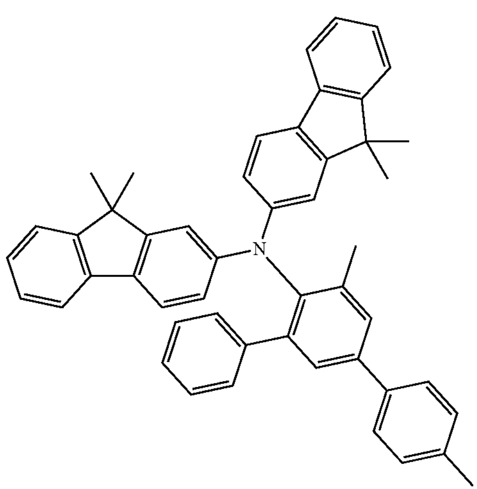
;
-continued
2-173
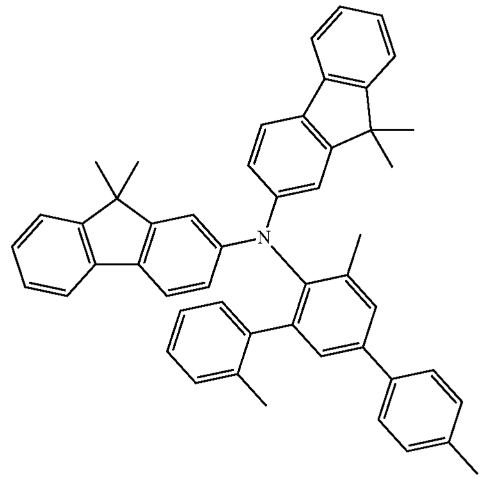
;
2-174
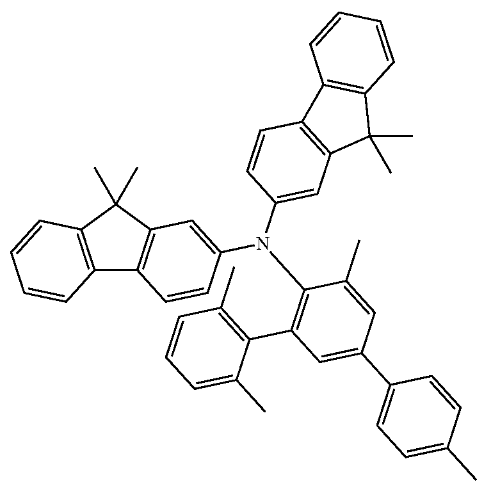
;
2-175
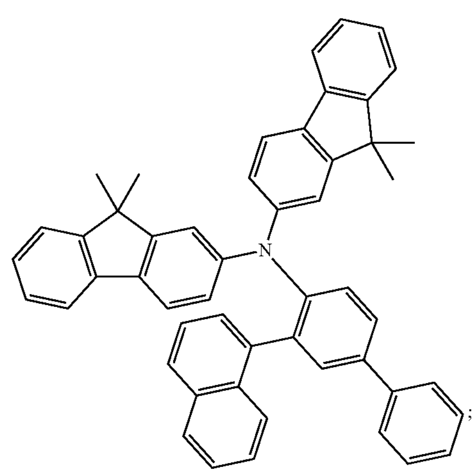
;

-continued
2-176
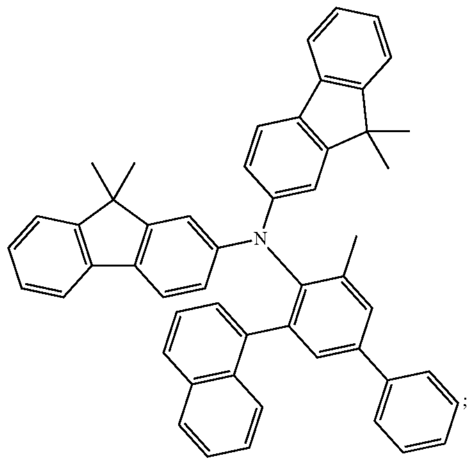
2-177
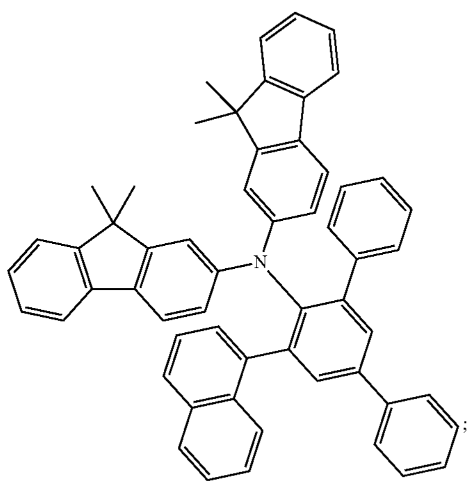
2-178
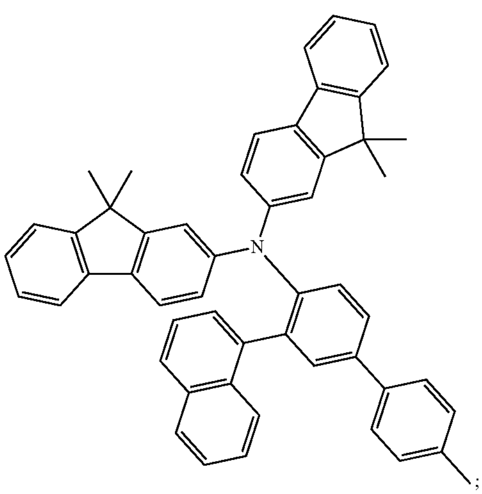
-continued
2-179
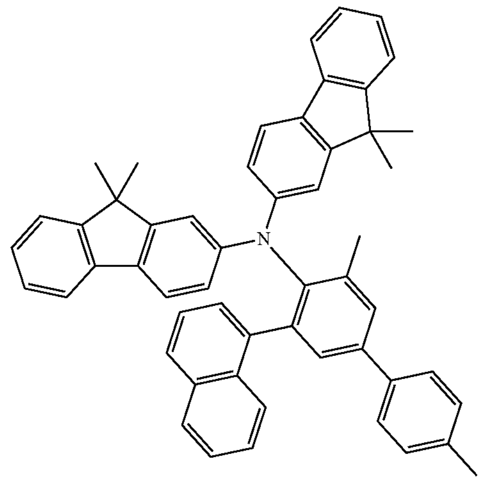
2-180
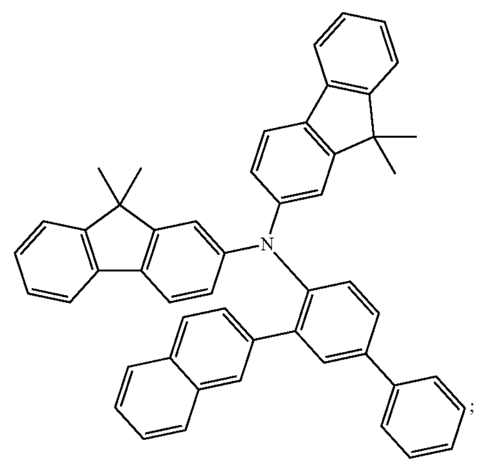
2-181
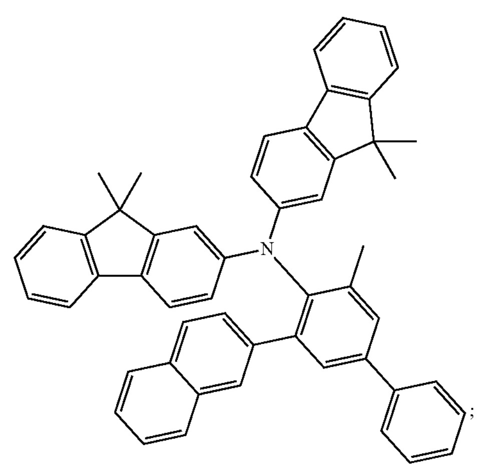

-continued
2-182
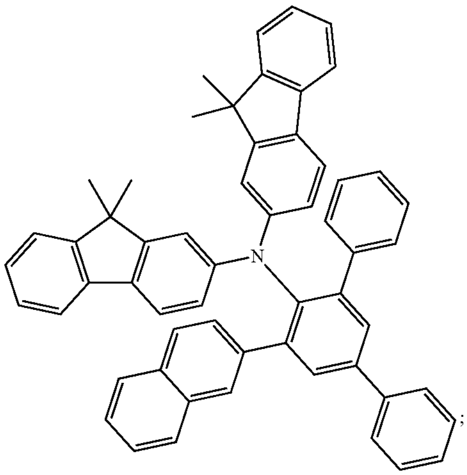
2-183
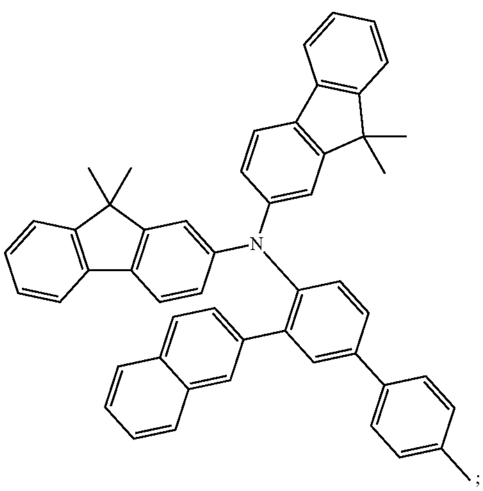
2-184
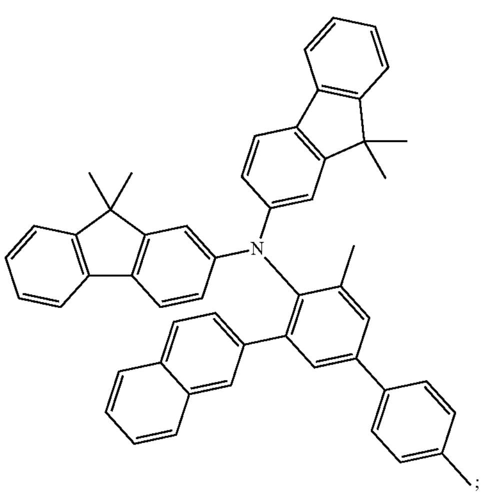
-continued
2-186
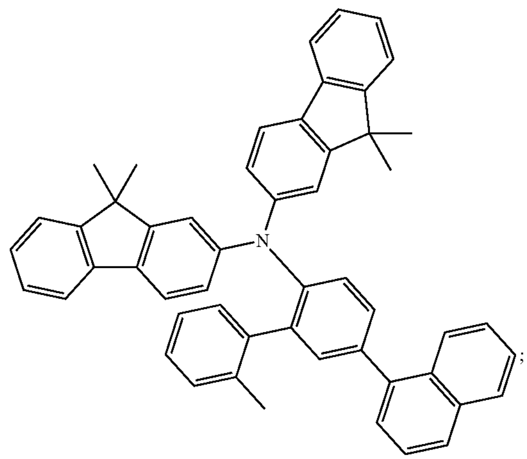
2-187
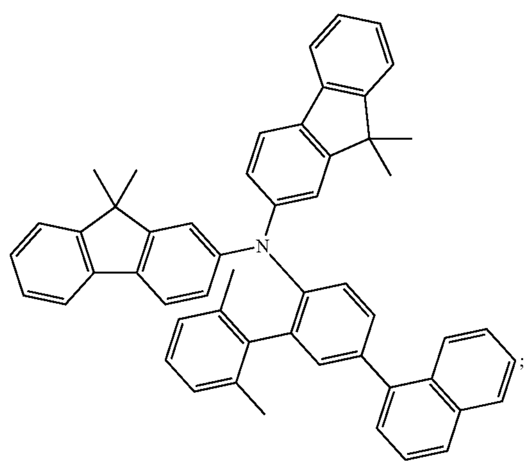
2-188
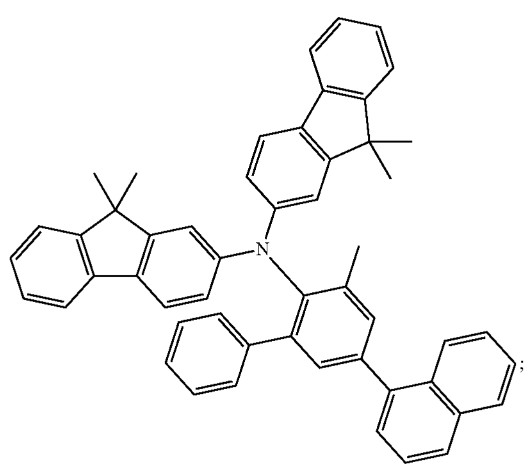

-continued
2-189
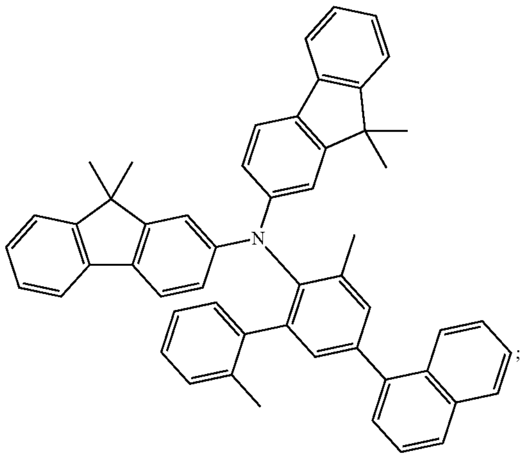
2-190
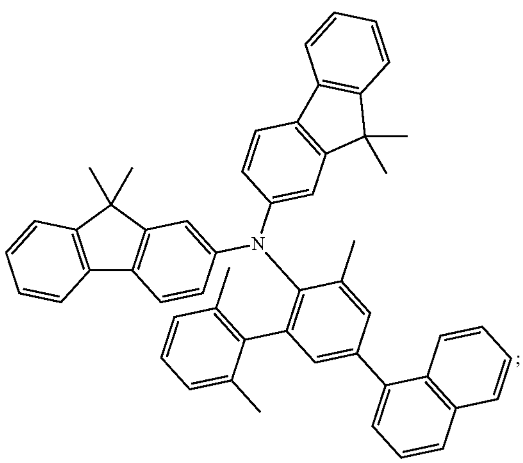
2-191
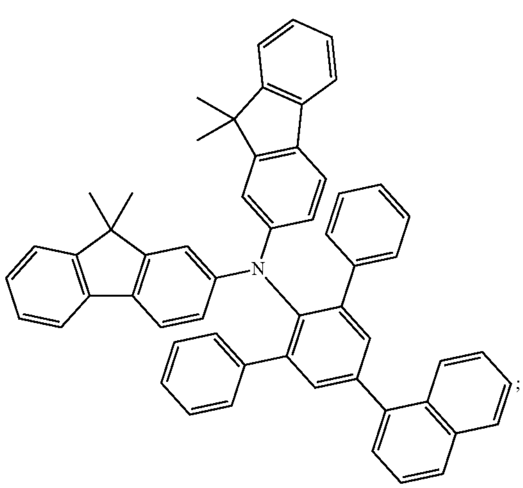
-continued
2-192
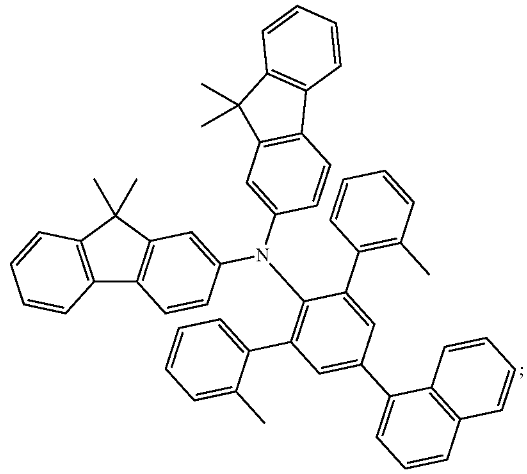
2-193
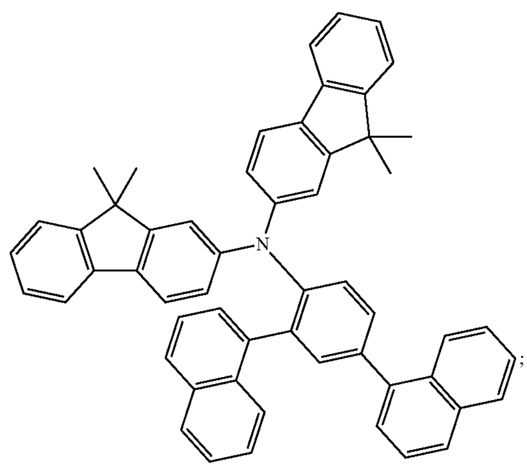
2-194
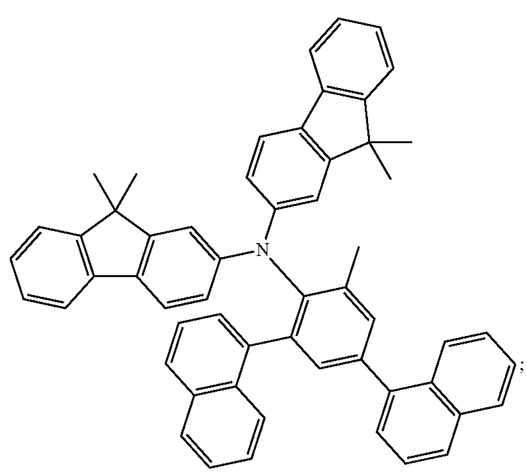

-continued
2-195
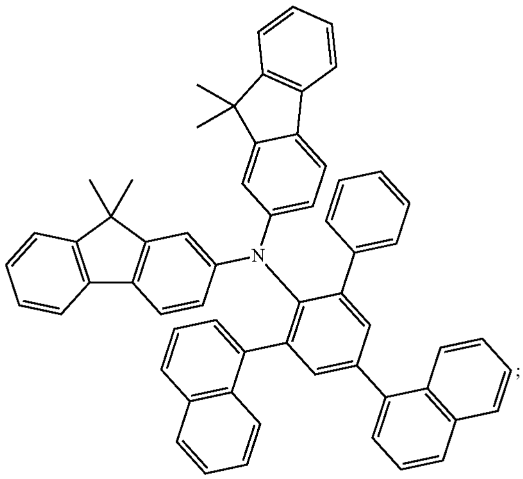
2-196
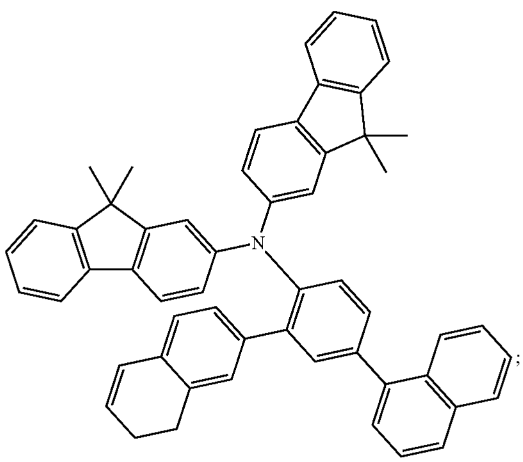
2-197
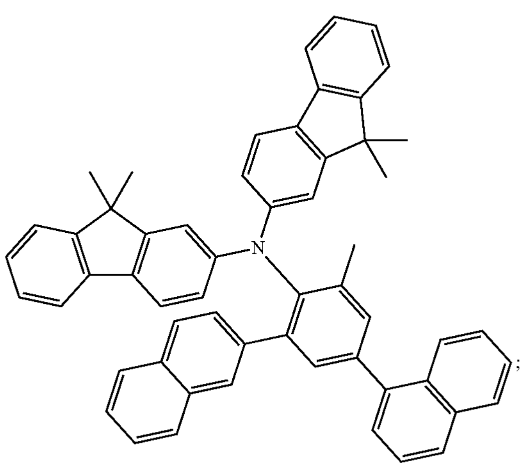
-continued
2-198
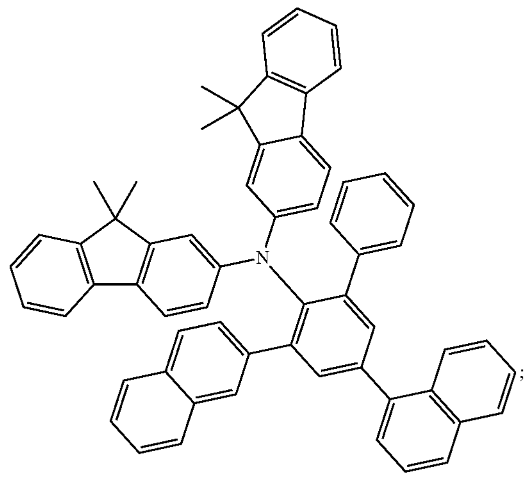
2-199
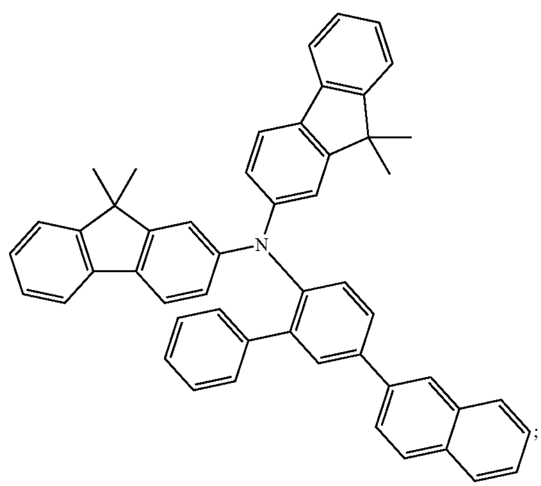
2-200
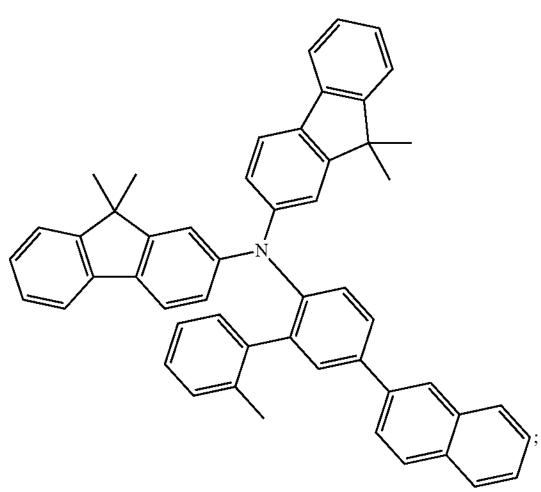

-continued
2-201
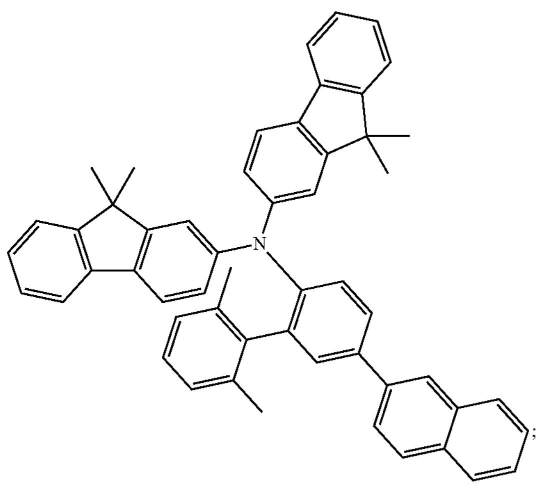
2-202
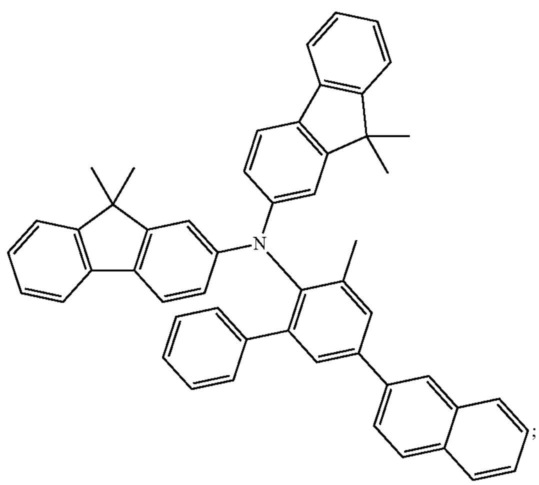
2-203
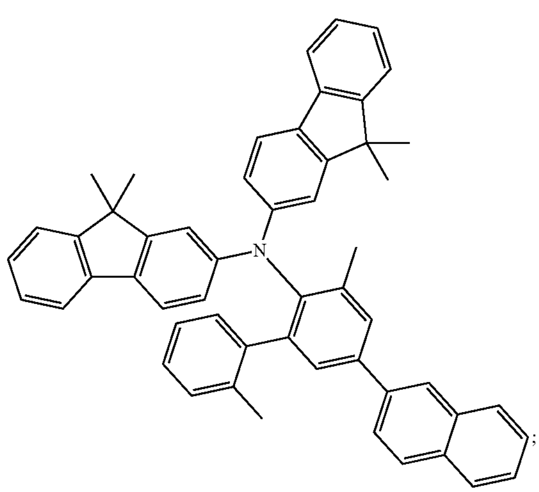
-continued
2-204
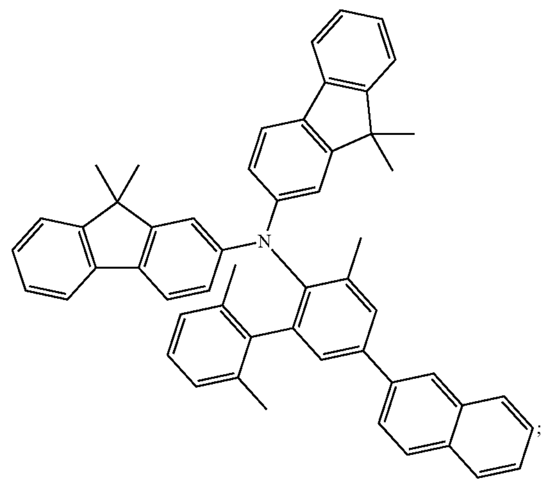
2-205
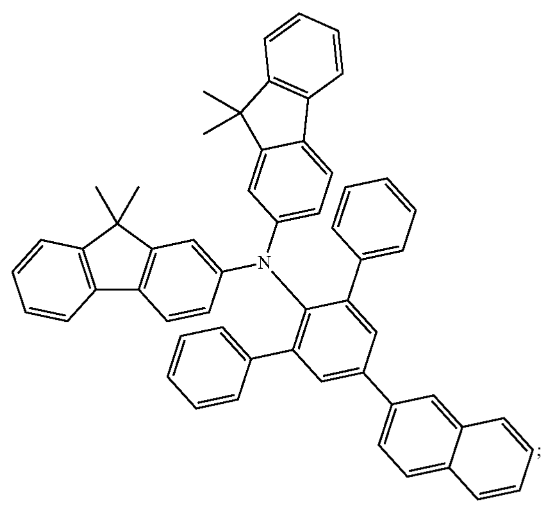
2-206
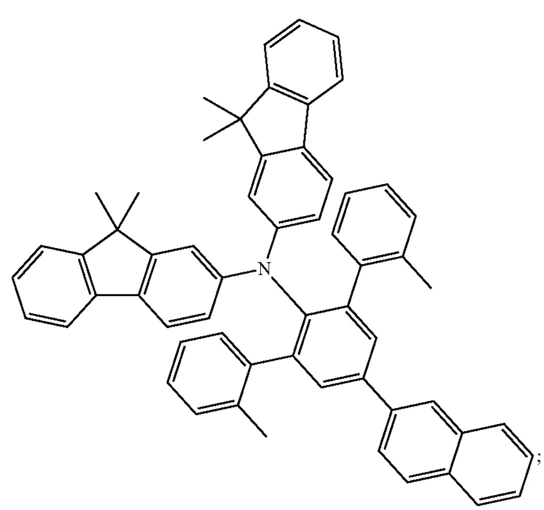

-continued
2-207
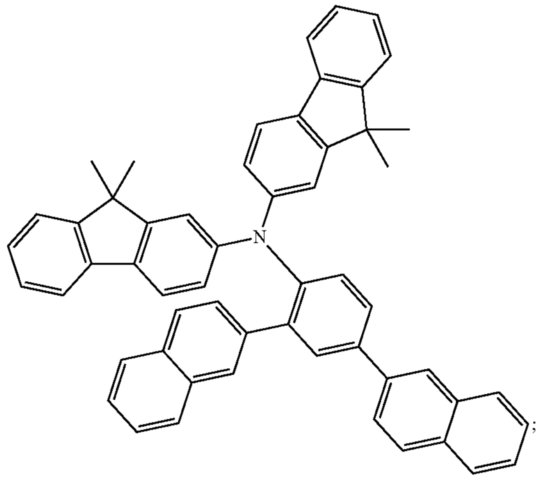
;
2-208
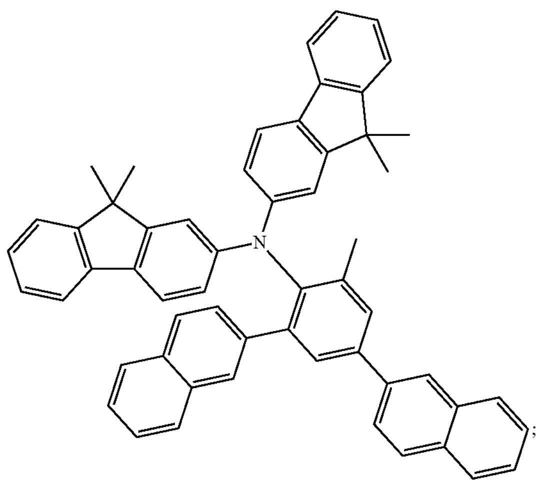
;
2-209
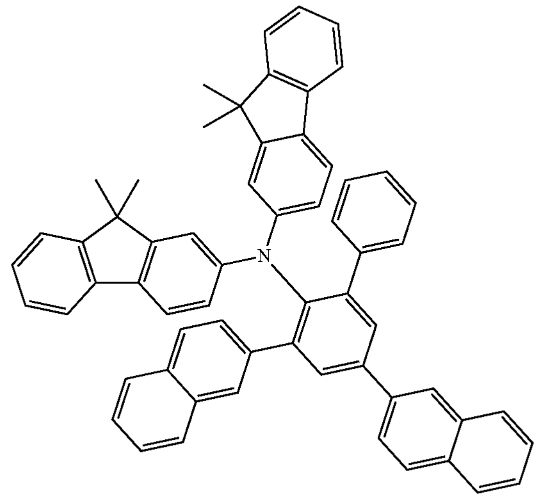
or
2-210
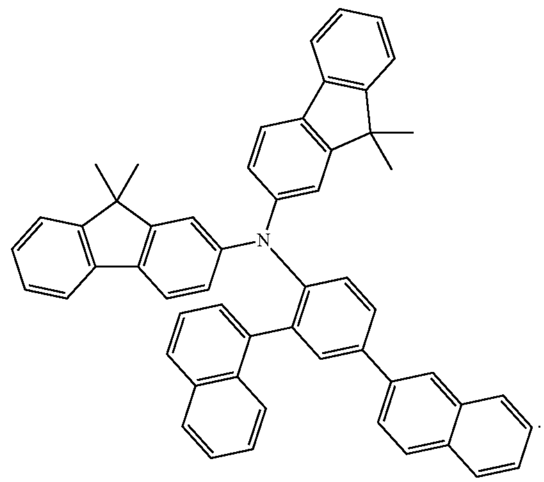
.
* * * * *